(12) United States Patent
Hehmann

(10) Patent No.: US 6,941,973 B2
(45) Date of Patent: Sep. 13, 2005

(54) INDUSTRIAL VAPOR CONVEYANCE AND DEPOSITION

(75) Inventor: Franz Hehmann, Iburger Strasse 151, D-49082 Osnabrueck (DE)

(73) Assignee: Franz Hehmann, Osnabruck (DE)

(*) Notice: Subject to any disclaimer, the term of this patent is extended or adjusted under 35 U.S.C. 154(b) by 632 days.

(21) Appl. No.: 09/766,644

(22) Filed: Jan. 23, 2001

(65) Prior Publication Data

US 2003/0041801 A1 Mar. 6, 2003

Related U.S. Application Data

(62) Division of application No. 08/776,381, filed as application No. PCT/EP95/03076 on Jul. 31, 1995, now Pat. No. 6,248,399.

(30) Foreign Application Priority Data

Aug. 1, 1994 (EP) .............................................. 94111991

(51) Int. Cl.[7] .................................................. F15D 1/02
(52) U.S. Cl. ............................................. 138/42; 138/44
(58) Field of Search .............................. 138/42, 43, 44, 138/45, 46

(56) References Cited

U.S. PATENT DOCUMENTS

| 39,820 A | * | 9/1863 | Lunkenheimer | 138/43 |
|---|---|---|---|---|
| 700,205 A | * | 5/1902 | Keller et al. | 138/43 |
| 2,378,476 A | | 6/1945 | Guellich | 118/726 |
| 3,018,799 A | * | 1/1962 | Volkmann et al. | 138/44 |
| 3,104,178 A | | 9/1963 | Da Silva | 118/726 |
| 3,805,612 A | * | 4/1974 | Shiba | 138/44 |
| 4,383,423 A | * | 5/1983 | Lenglet et al. | 138/45 |
| 4,401,052 A | | 8/1983 | Baron et al. | 118/726 |

(Continued)

FOREIGN PATENT DOCUMENTS

| DE | 36 10 291 | 10/1986 |
|---|---|---|
| DE | 36 10 293 | 10/1986 |
| DE | 36 10 298 | 10/1986 |
| DE | 36 19 284 | 10/1986 |
| DE | 262 551 | 12/1988 |
| JP | 02-125866 | 5/1990 |
| SU | 440 428 | 9/1986 |

OTHER PUBLICATIONS

Hagena et al., "Magnesium cluster–beam deposition on glass and Si(111)," Journal of Vacuum Science and Technology: Part A., vol. 12, No. 2, Mar. 1994, New York, pp. 282–298.

Database WPI, May 20, 1987, Derwent Publications, Ltd., London, GB; AN 87–134058, "Evaporator for printed circuit boards manufacture—has emitting diaphragm in middle part of steam duct with thermal screens on either side of it."

Sax et al., Hawleys' Condensed Chemical Dictionary, 11th Ed., Van Nostrand Reinhold, New York, 1987, p. 630.

*Primary Examiner*—James Hook
(74) *Attorney, Agent, or Firm*—Foley & Lardner

(57) ABSTRACT

A process for deposition and condensation and reaction and separation and distillation employing at least two chambers separated by a diaphragm with at least one separation wall and at least one orifice or flow duct or plurality thereof. The new process includes (i) a condensation-free formation of a reservoir of an uncondensed phase under controlled flow conditions in front of a diaphragm, (ii) local pulse forces in an orifice or flow duct is controlled by local flow speed or local flow density or local flow pressure of said uncondensed phase to provide macroscopic control of an uncondensed intermediary and final phase or material and (iii) controlled conveyance and production rates under conditions of said local control and is independent from gravitational acceleration so orientation of individual modules or units or assembly of a production plant.

24 Claims, 123 Drawing Sheets

U.S. PATENT DOCUMENTS

| | | | | |
|---|---|---|---|---|
| 4,435,199 A | * | 3/1984 | Potkay | 138/44 |
| 4,534,816 A | | 8/1985 | Chen et al. | 156/345 |
| 4,593,446 A | * | 6/1986 | Hayner | 138/42 |
| 4,947,790 A | | 8/1990 | Gartner et al. | 118/726 |
| 5,093,149 A | | 3/1992 | Doehler et al. | 427/38 |
| 5,356,476 A | | 10/1994 | Foster et al. | 118/725 |
| 5,653,806 A | | 8/1997 | Van Buskirk | 118/715 |
| 5,728,222 A | | 3/1998 | Barbee et al. | 118/715 |
| 5,769,388 A | * | 6/1998 | Welker | 138/42 |
| 5,785,089 A | * | 7/1998 | Kuykendal et al. | 138/42 |
| 6,216,741 B1 | * | 4/2001 | Aarntzen | 138/43 |

* cited by examiner

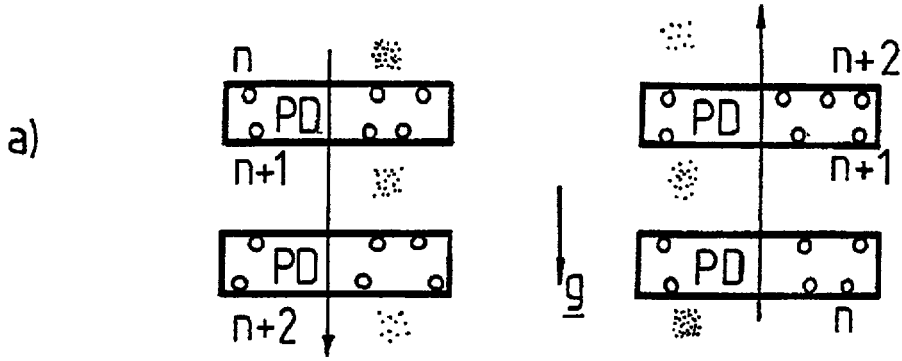
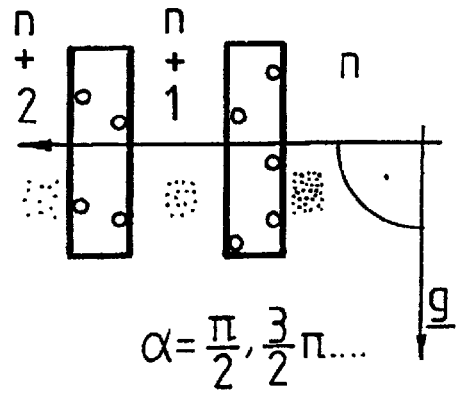
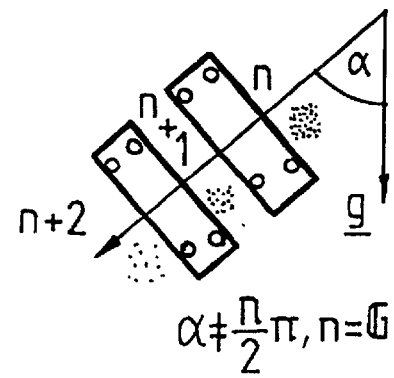
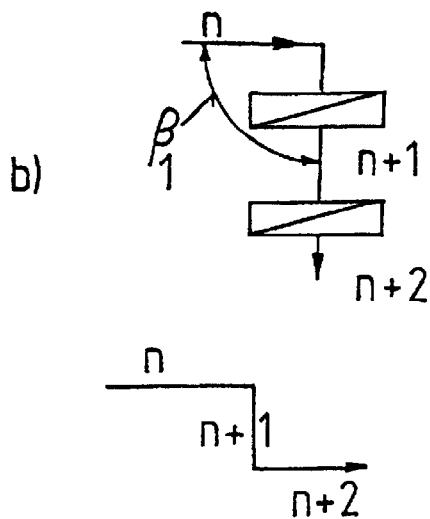
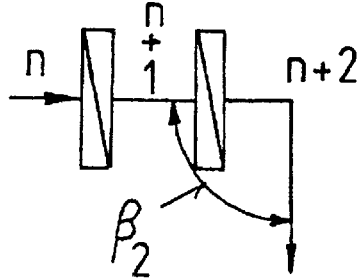
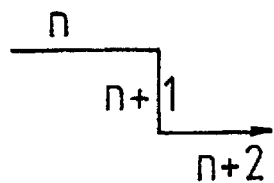
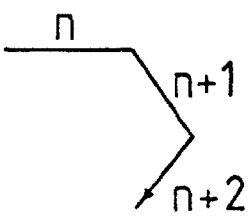
FIG. 8 a,b

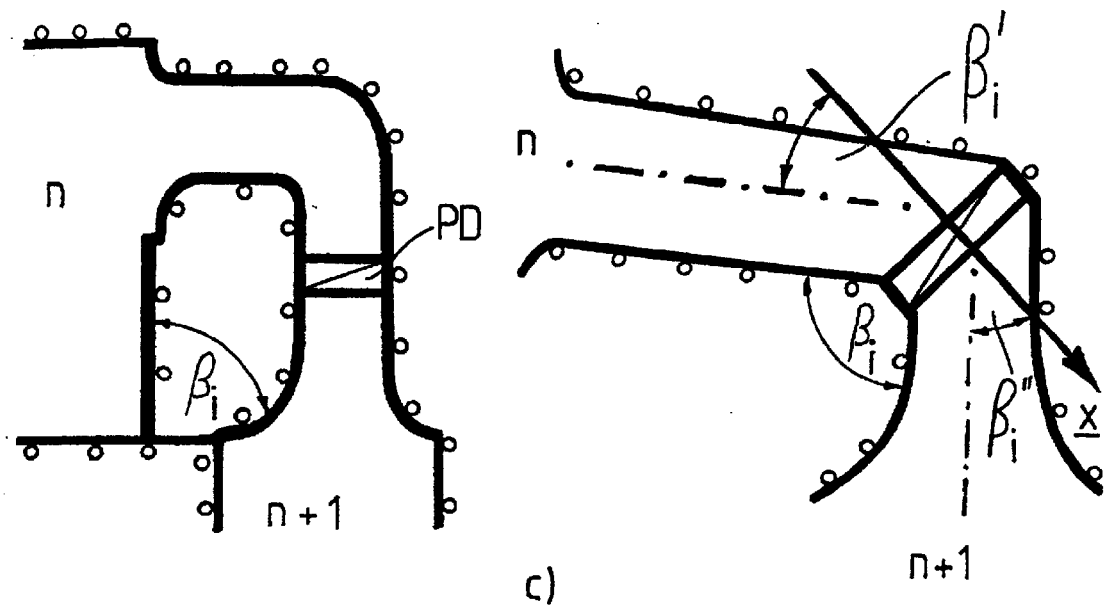
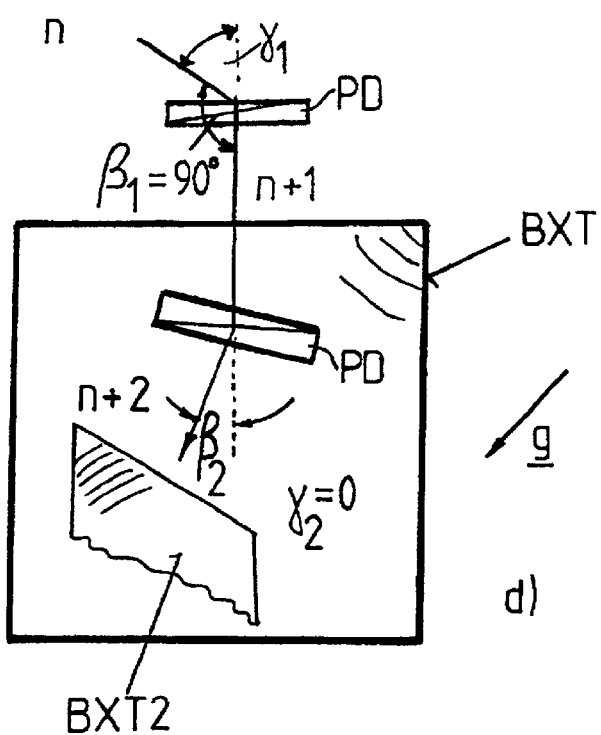
FIG. 8 c,d i.e. $d\Delta T(x) \neq 0$

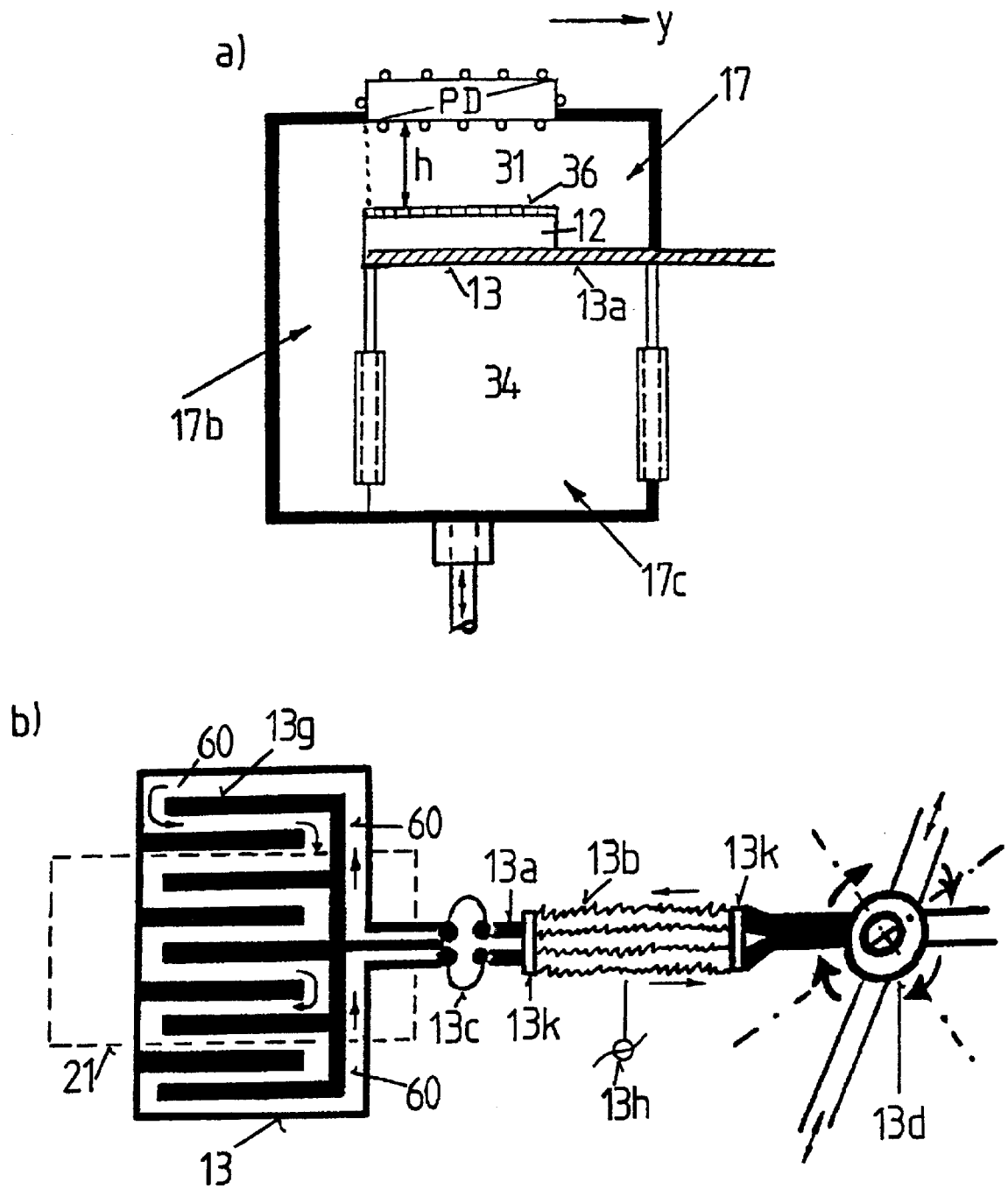
FIG. 12 a,b

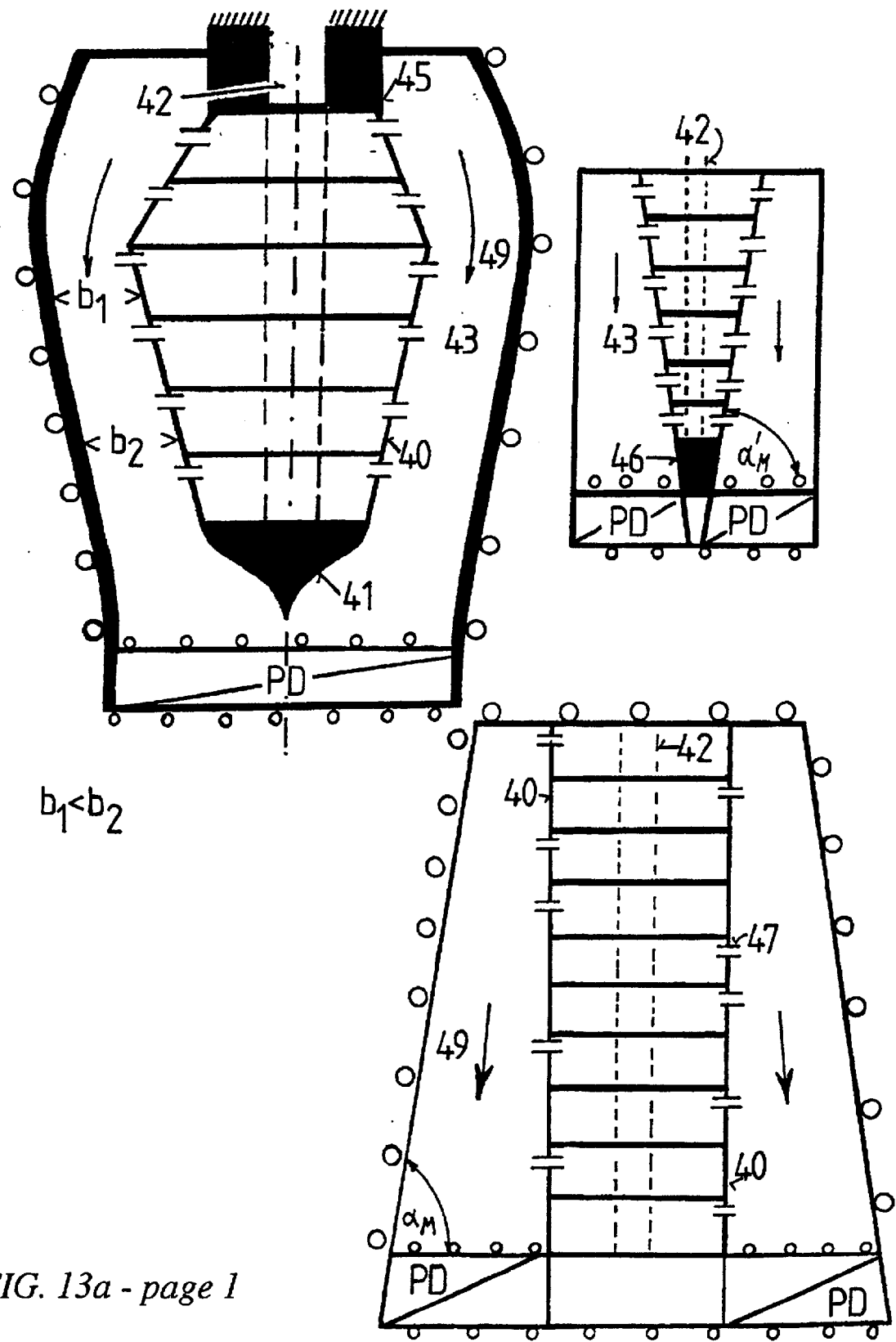
FIG. 13a - page 1

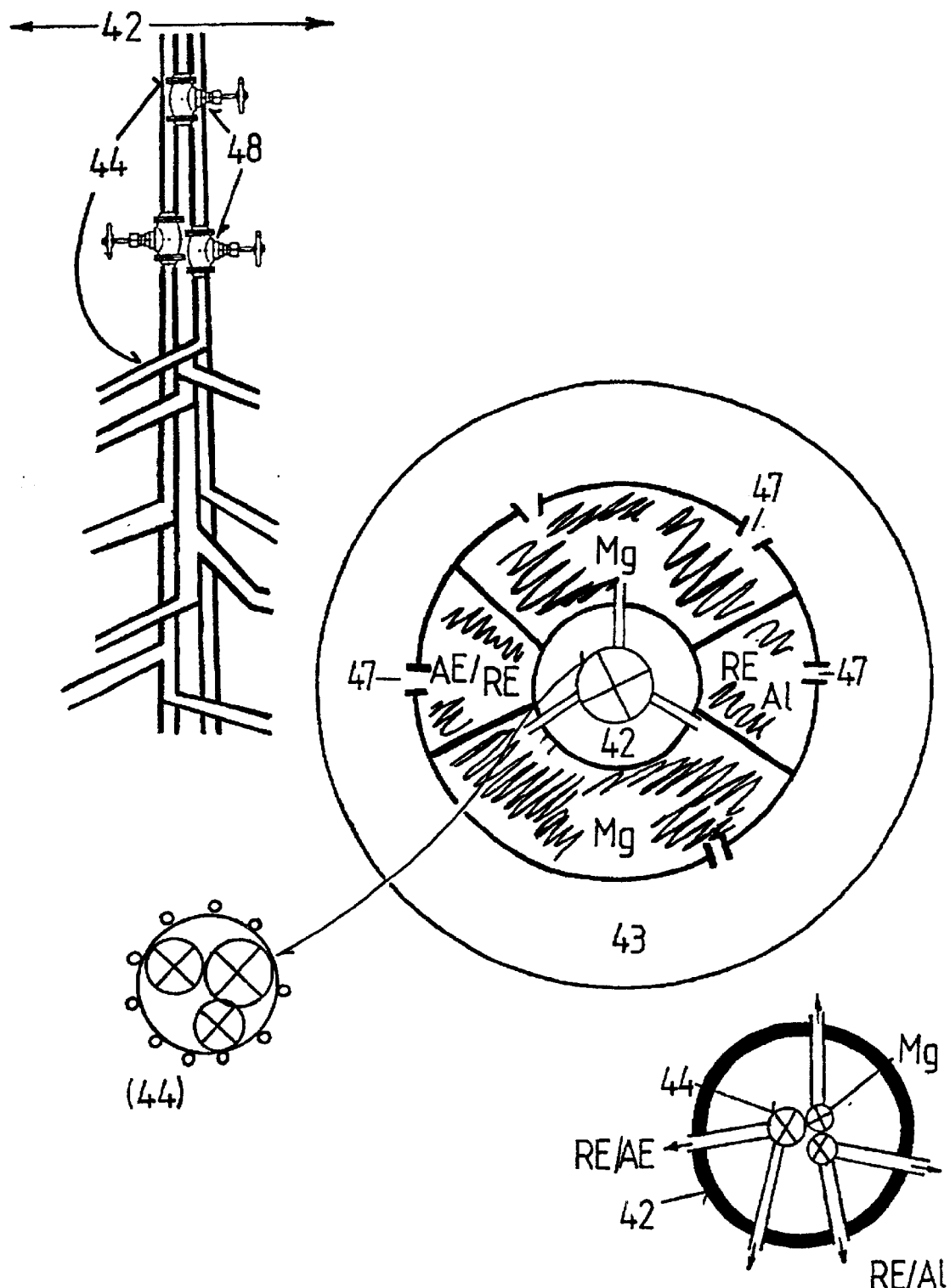
FIG. 13a - page 2

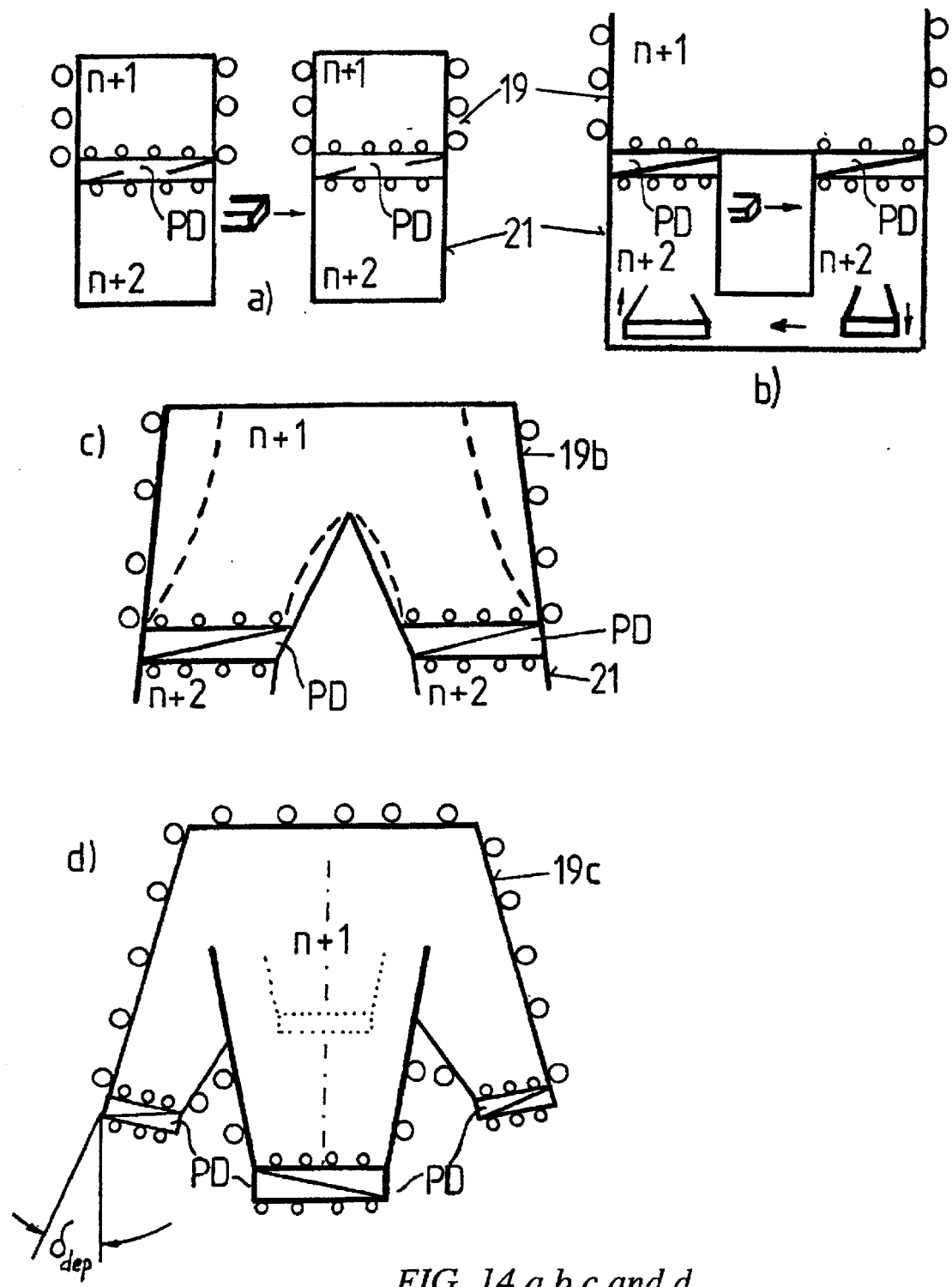
FIG. 14 a,b,c and d

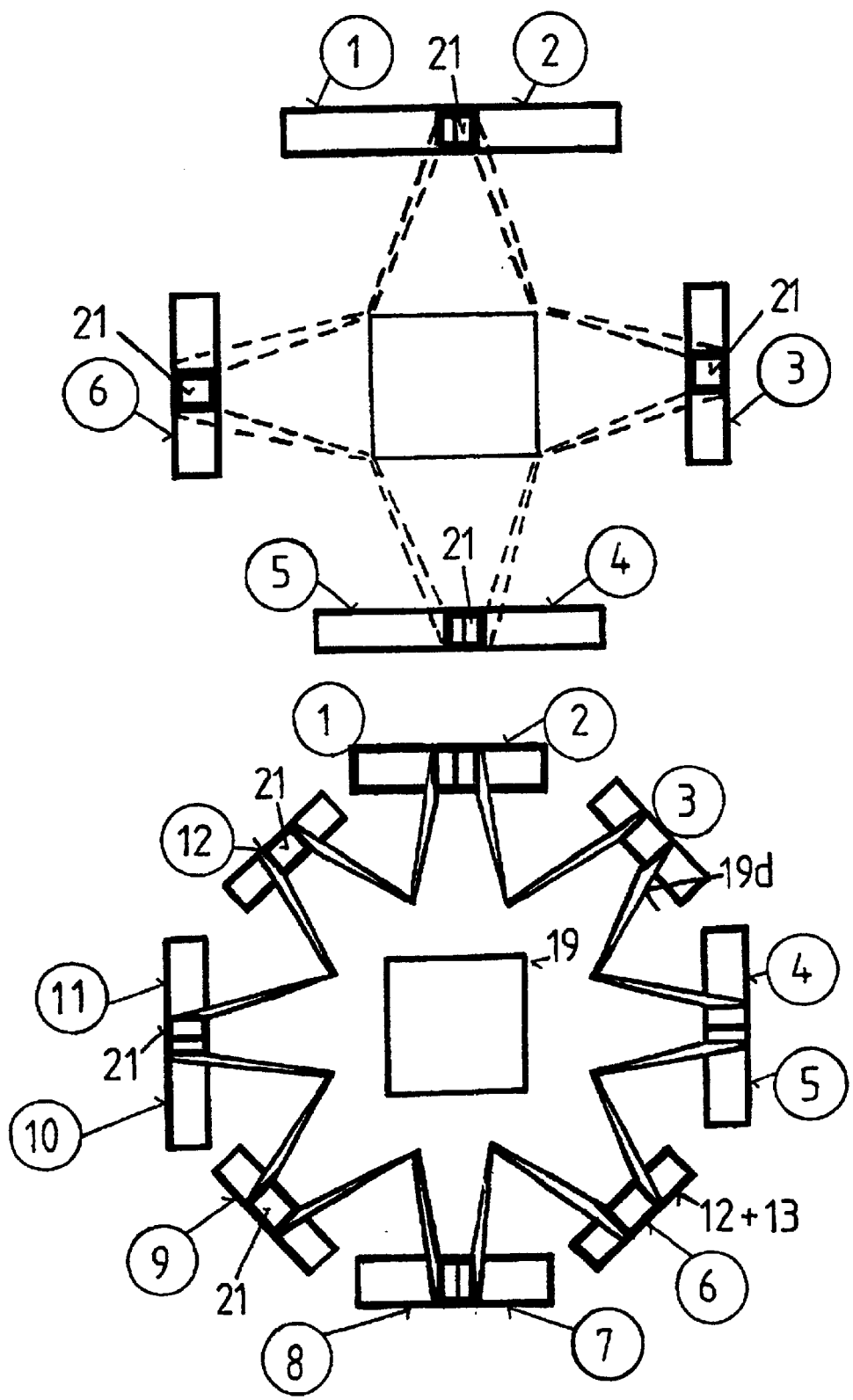
FIG. 14 e and f

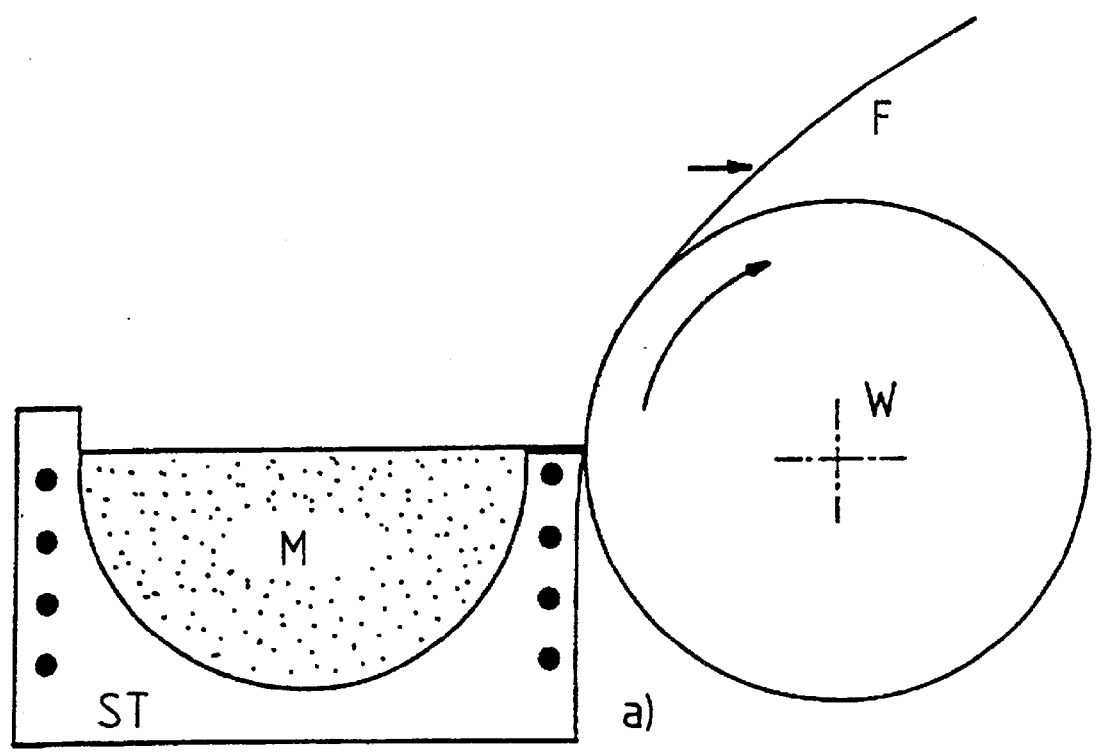
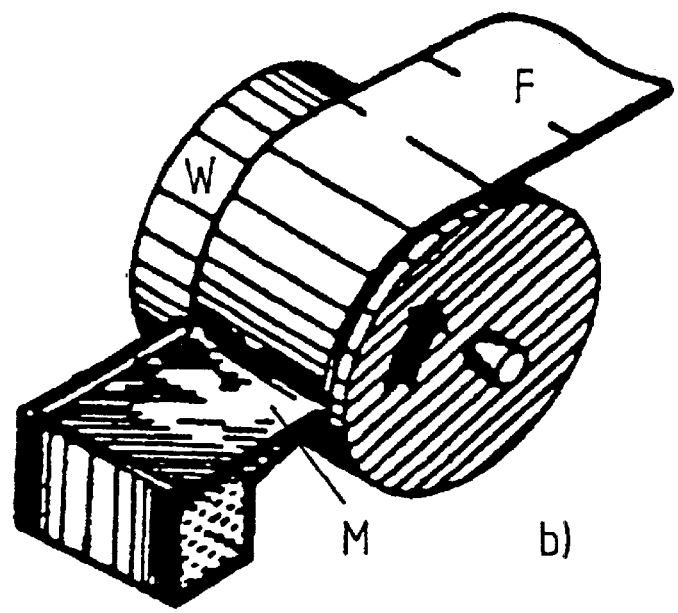
FIG. 16

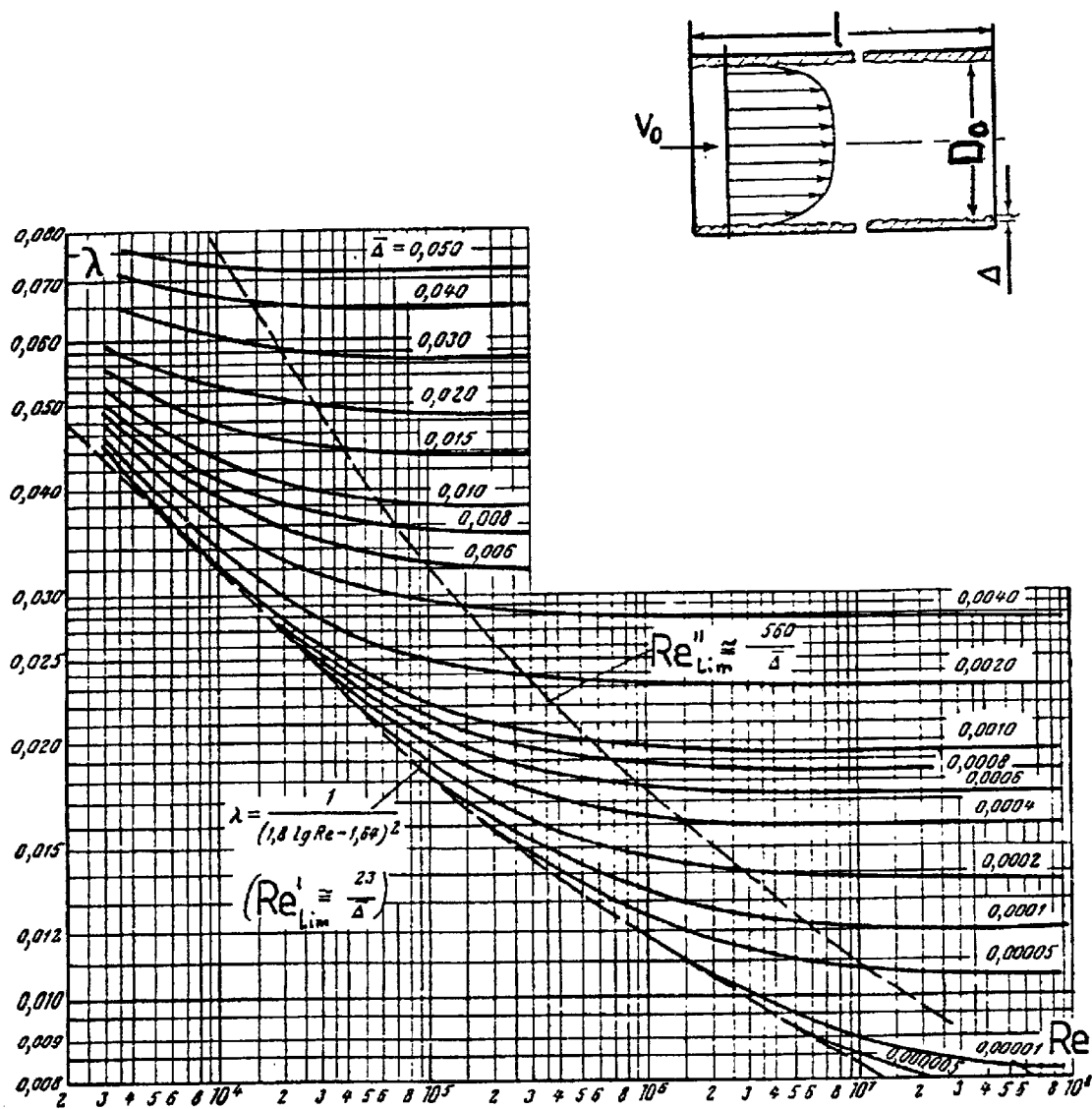
FIG. 18 - page 1

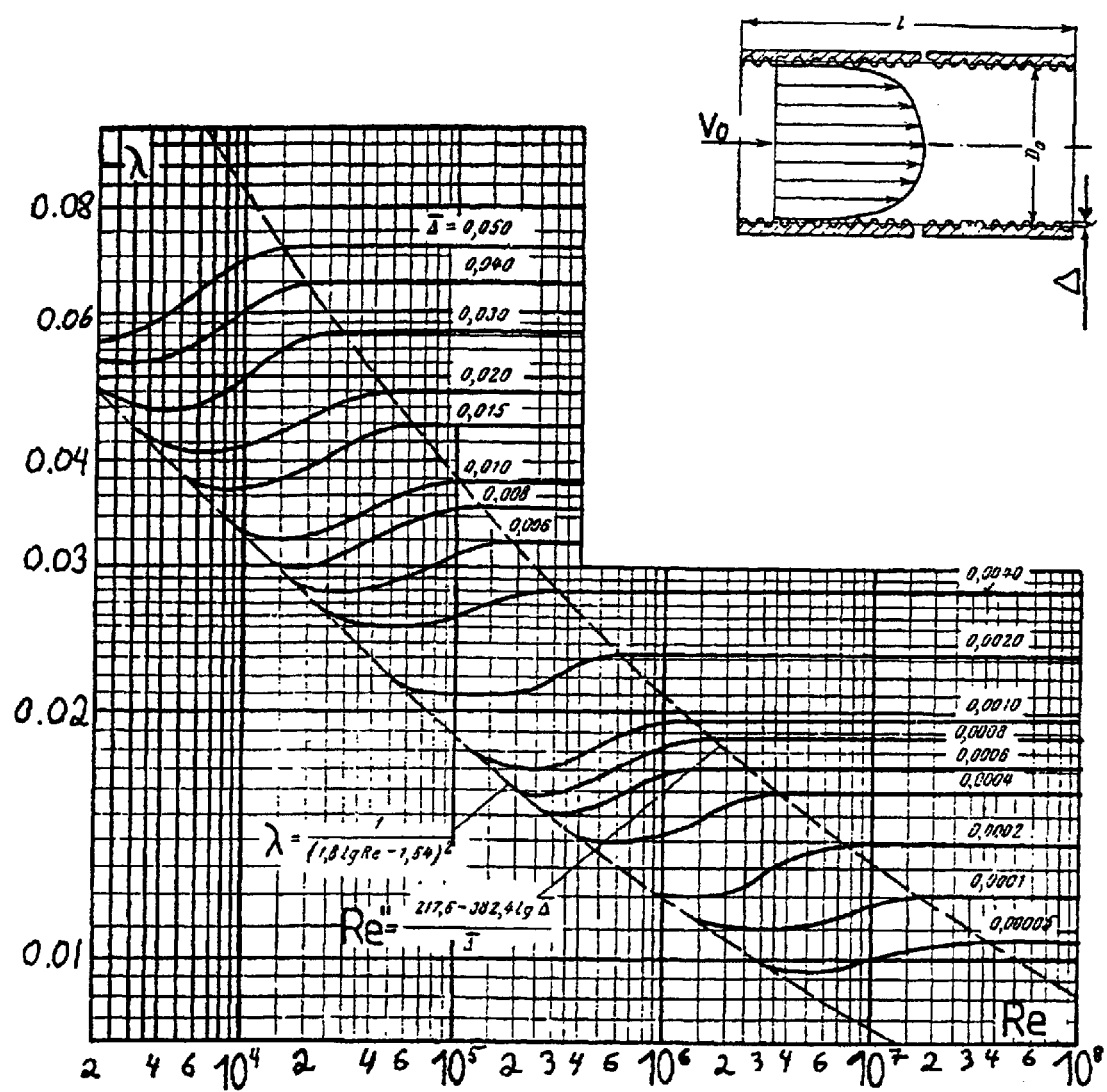
*FIG. 18 - page 2*

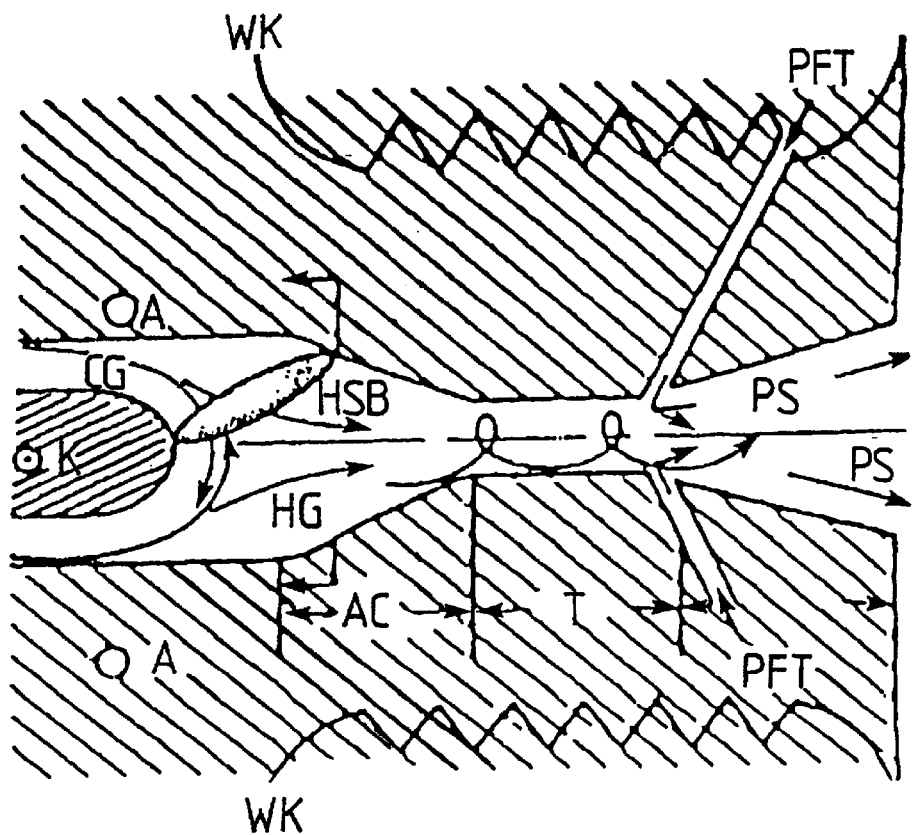
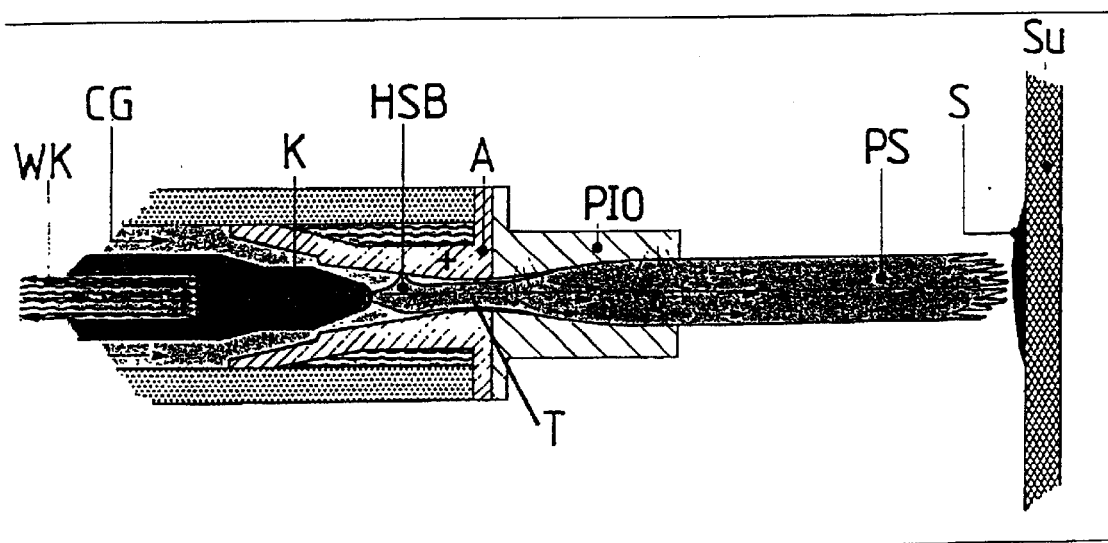
FIG. 22

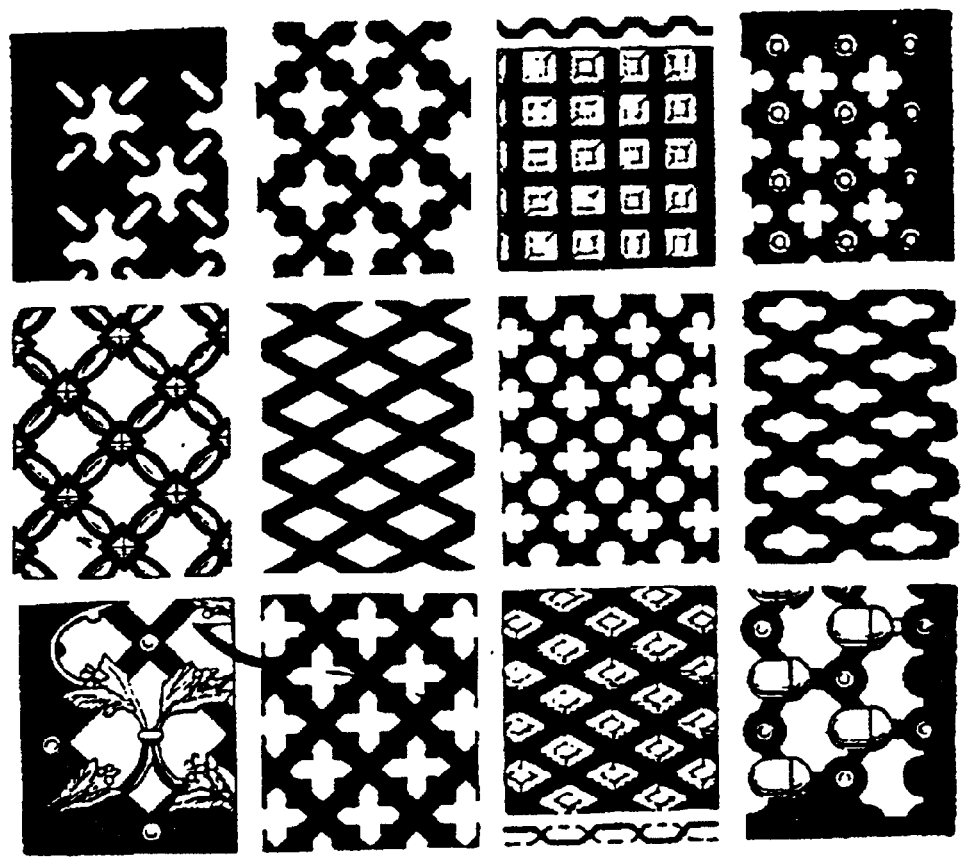
*Fig. 24 a,b*

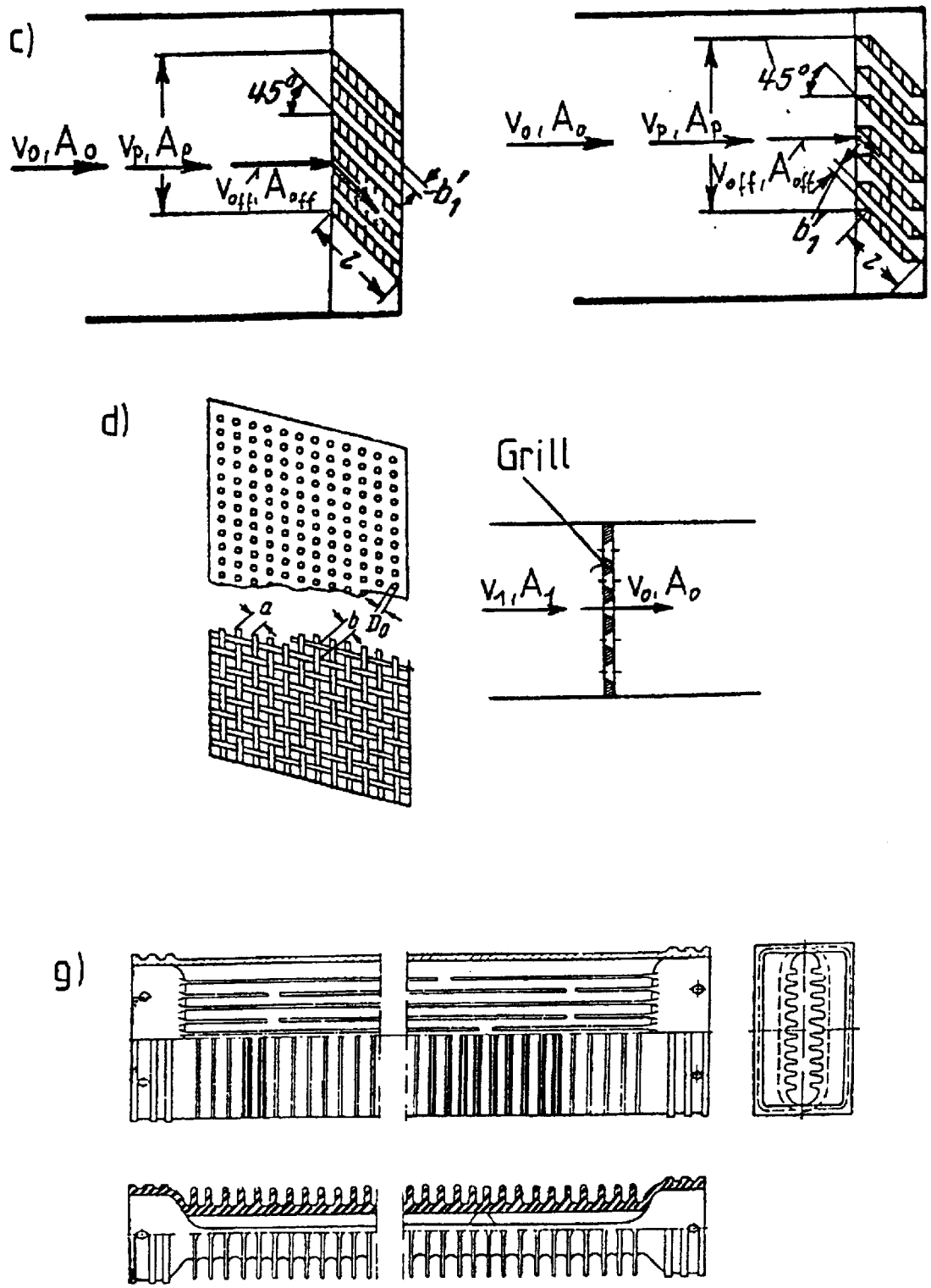
Fig. 24 c,d,g

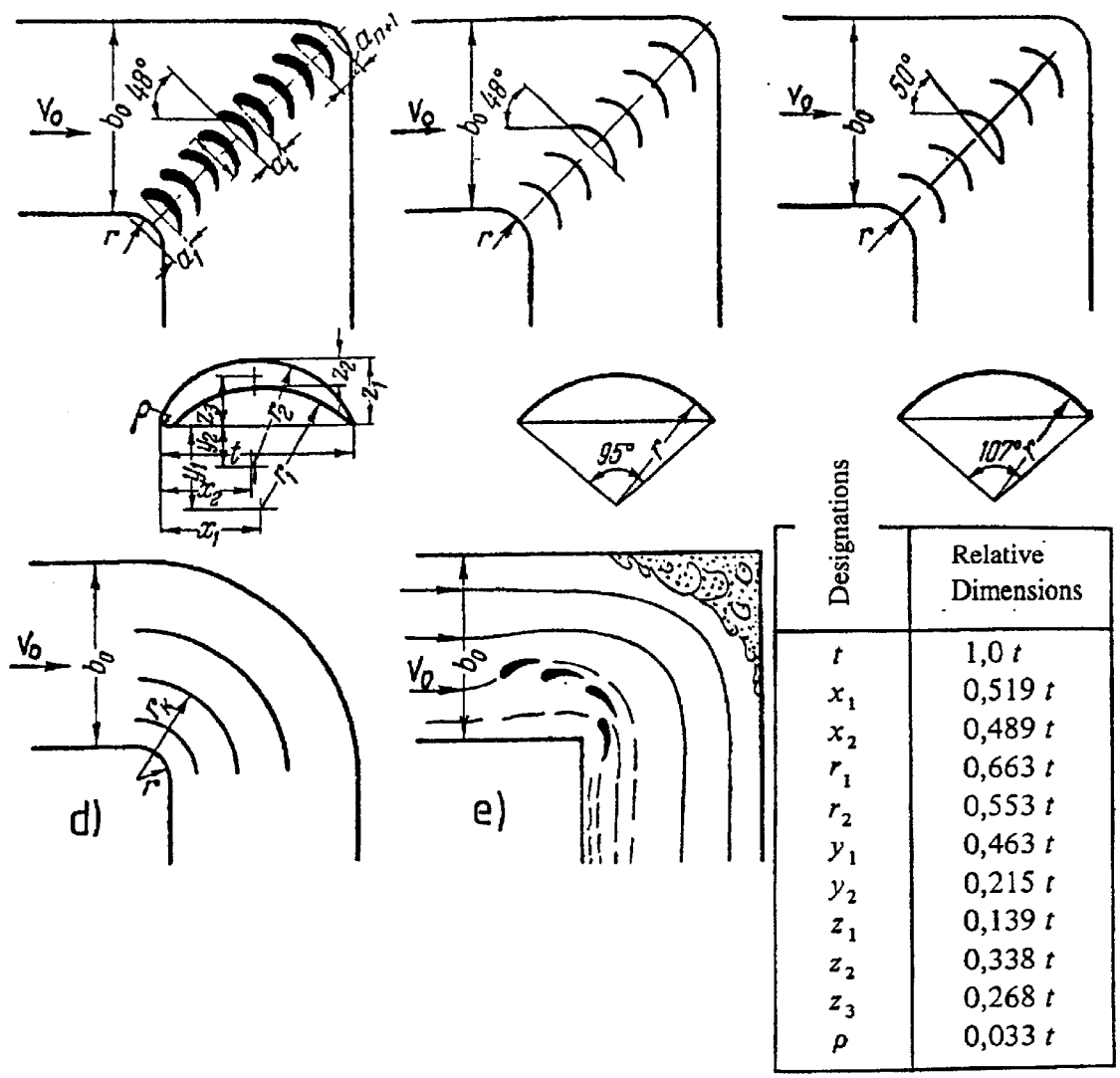
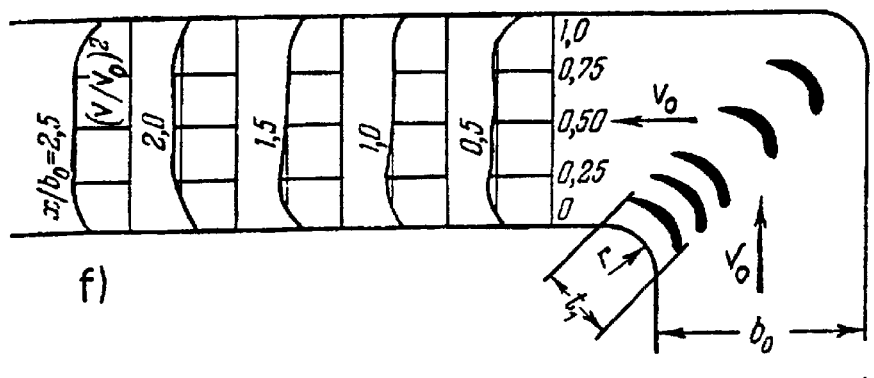
FIG. 26
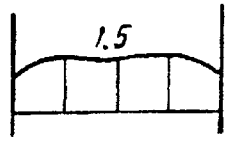

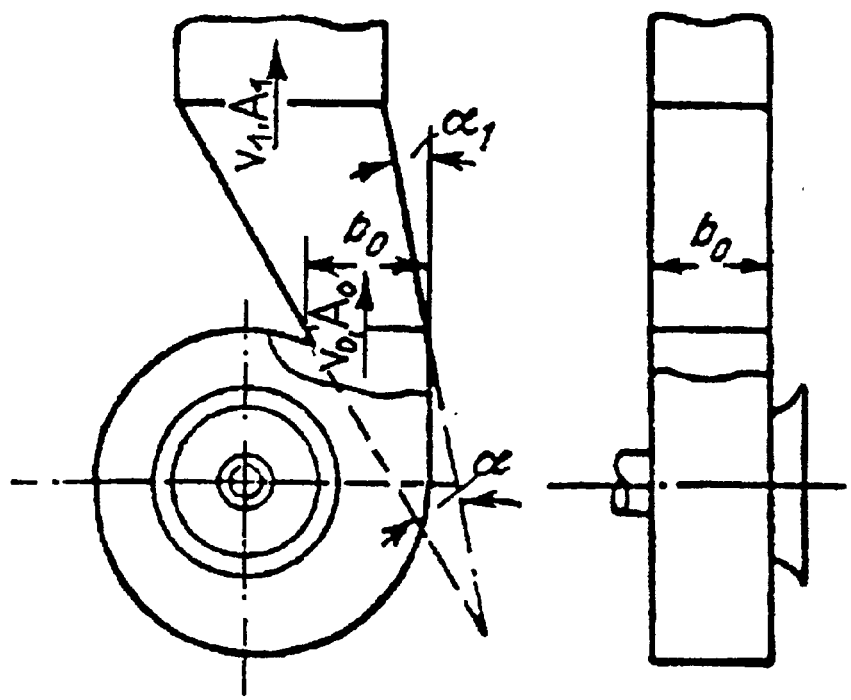
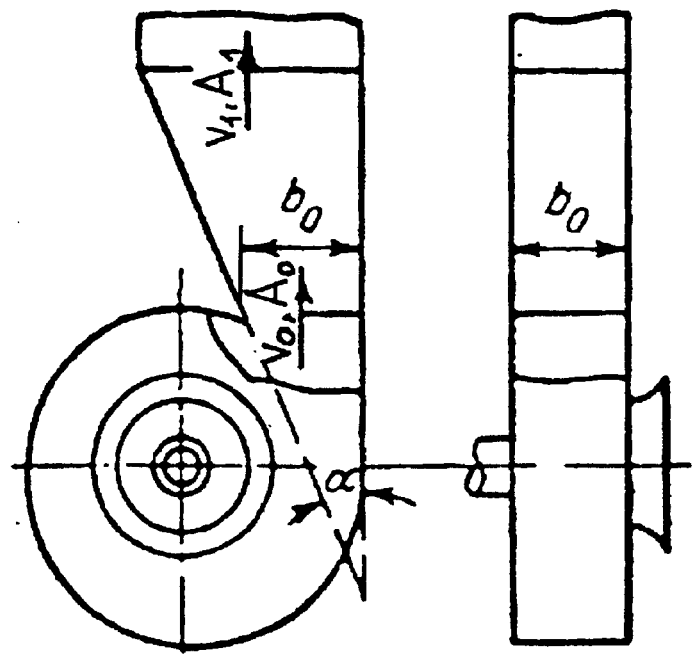
FIG. 30

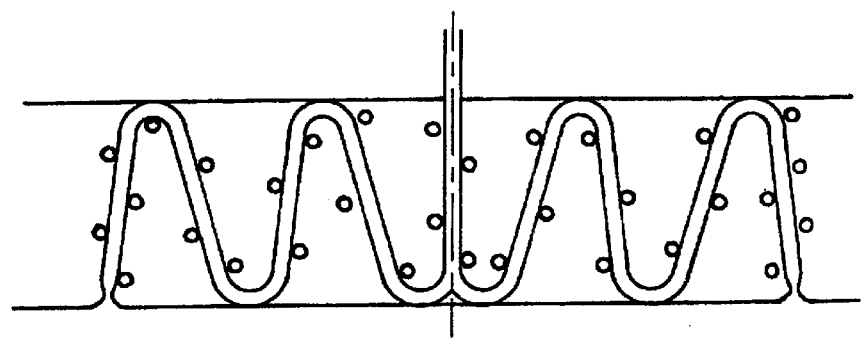
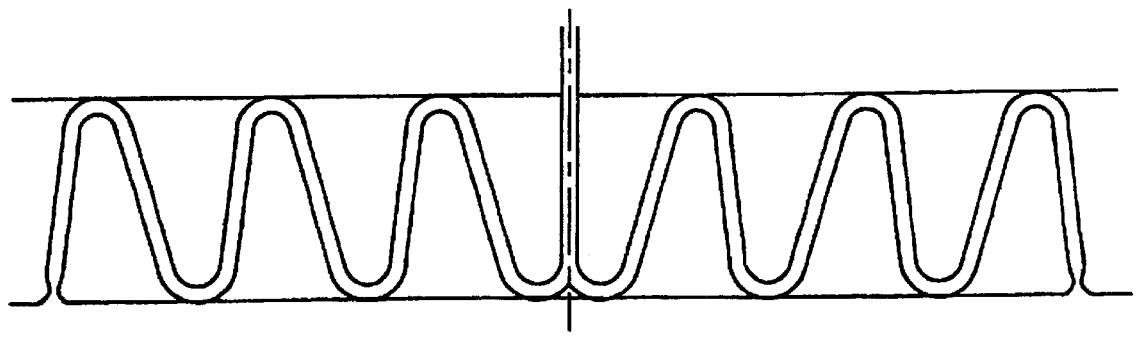
FIG. 36

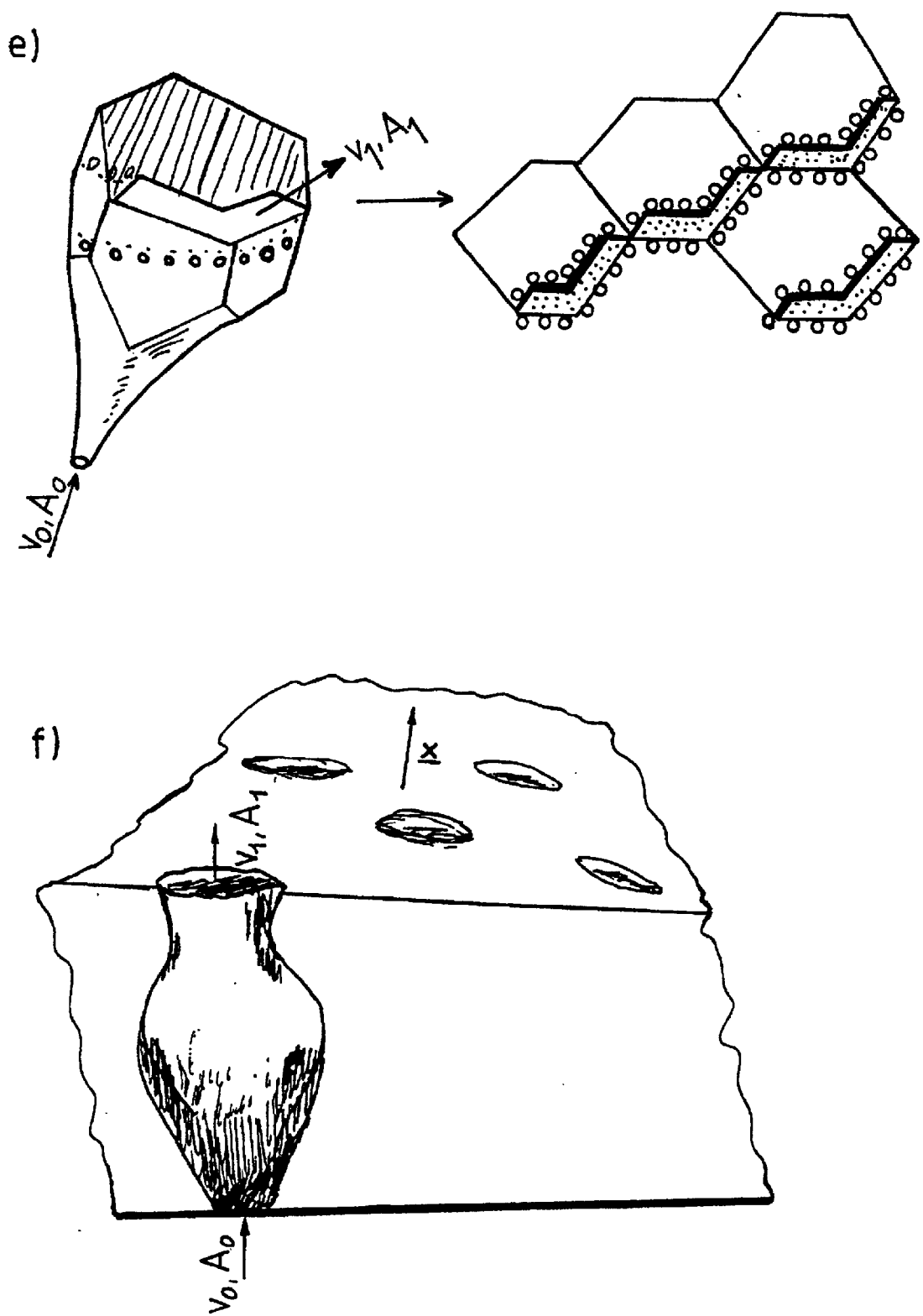
FIG. 39 e,f g1)
g2)
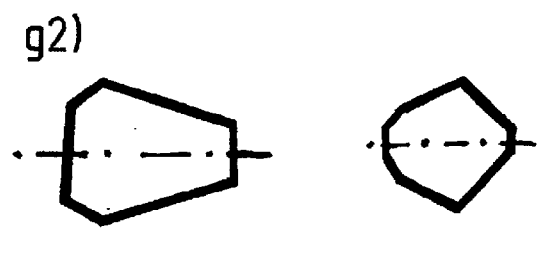
g3)
g4)
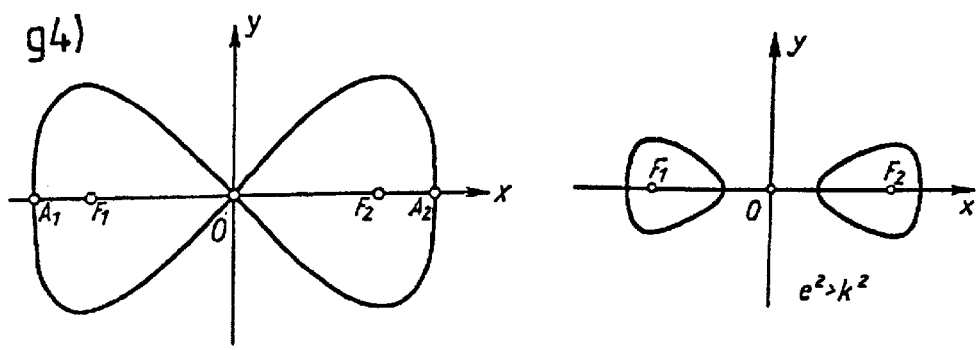
FIG. 40

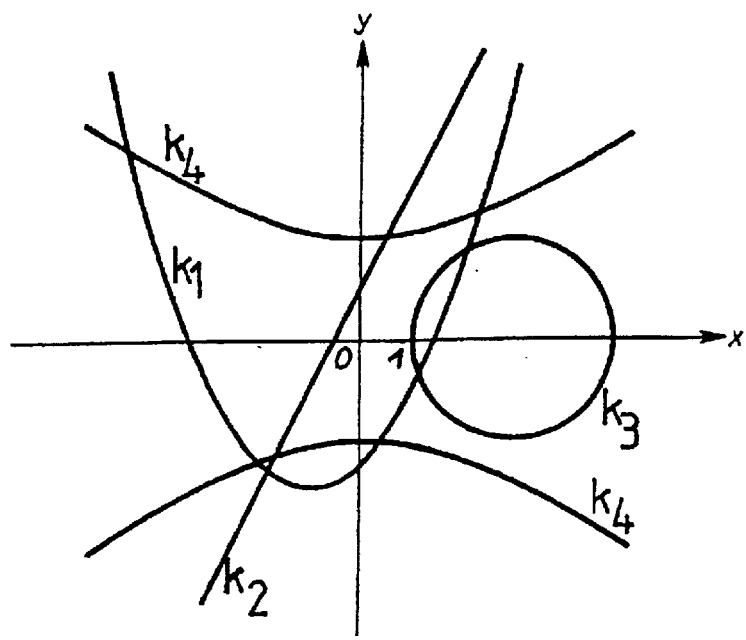
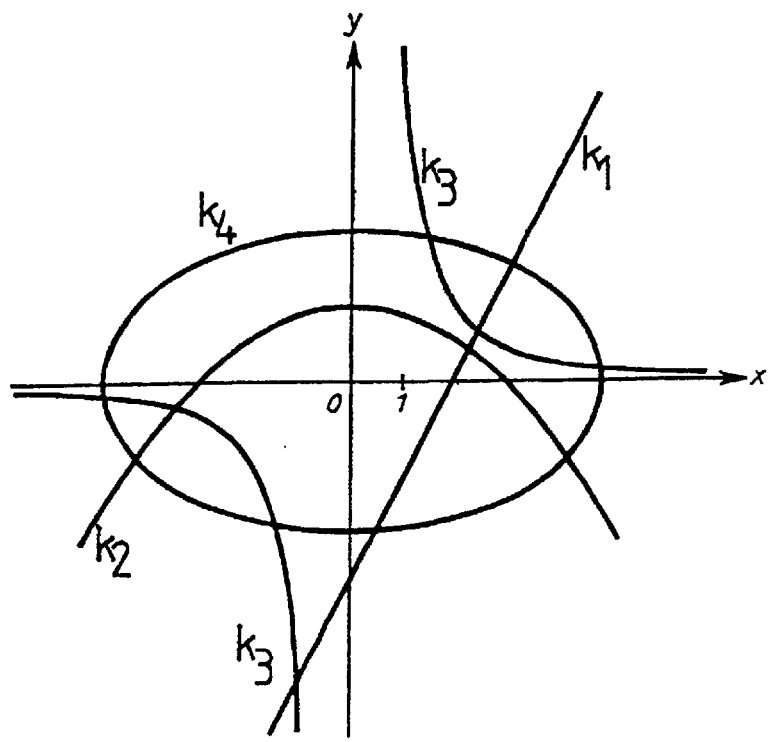
FIG. 40/
first continuation

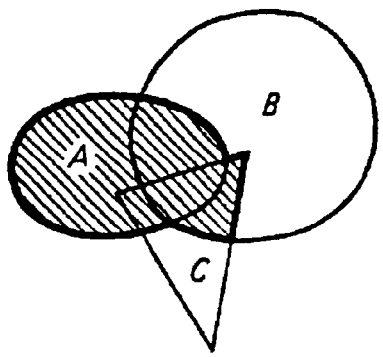
▨ $A \cup (B \cap C) = (A \cup B) \cap (A \cup C)$
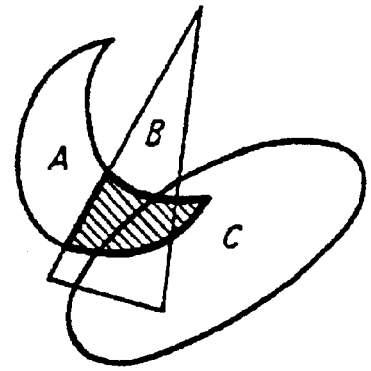
▨ $A \cap (B \cup C) = (A \cap B) \cup (A \cap C)$
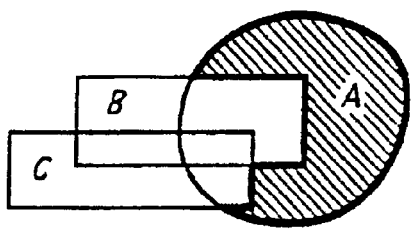
▨ $(A \setminus B) \cap C = A \setminus (B \cup C)$
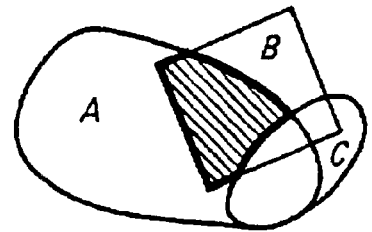
▨ $(A \cap B) \setminus C = A \cap (B \setminus C)$
$= (A \setminus C) \cap B$
*FIG. 40I*
*second continuation*

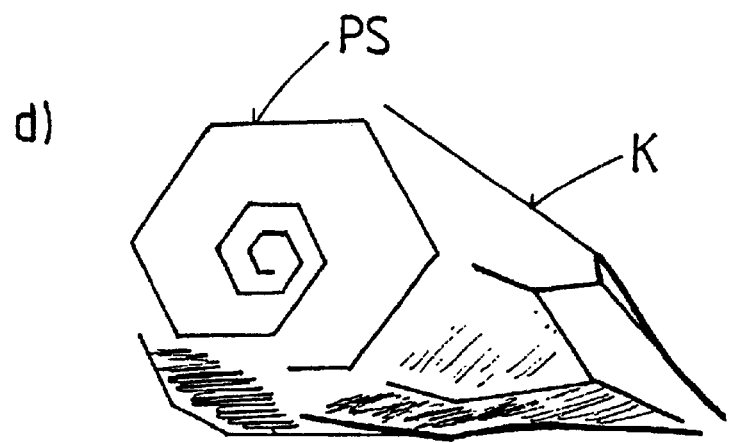
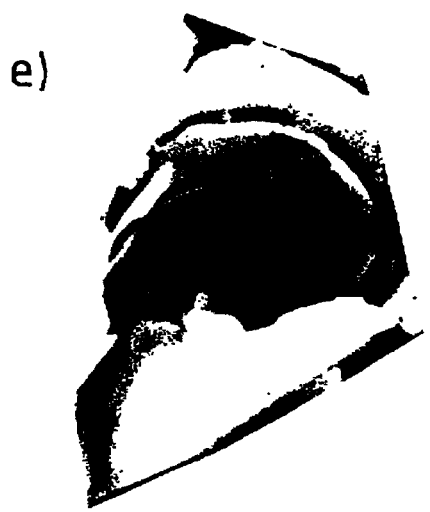
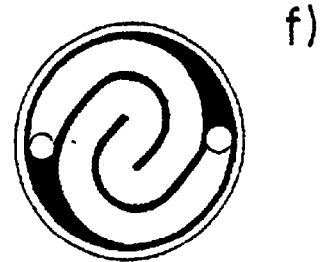
*FIG. 41d,e,f*

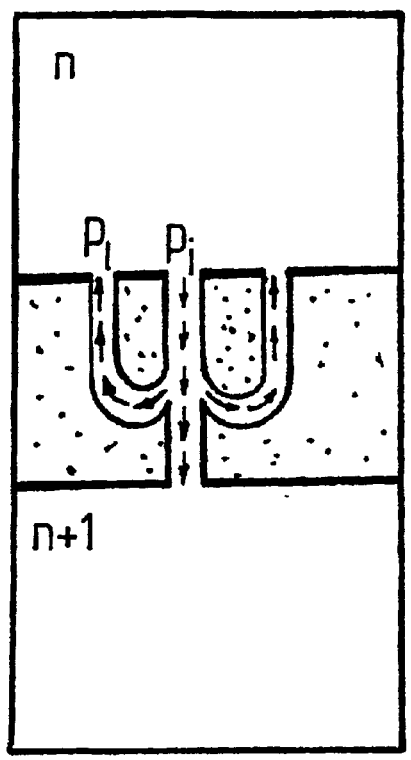
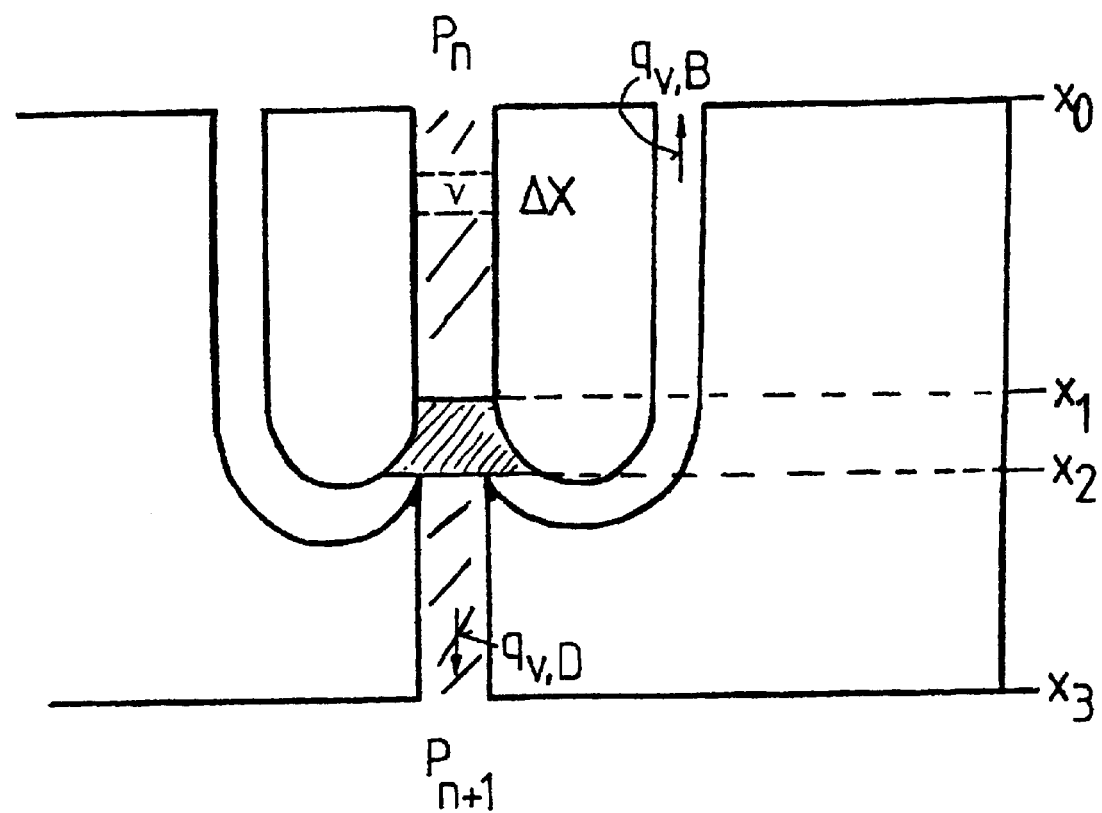
*FIG. 45*

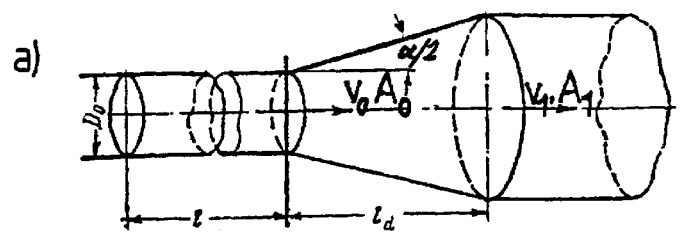
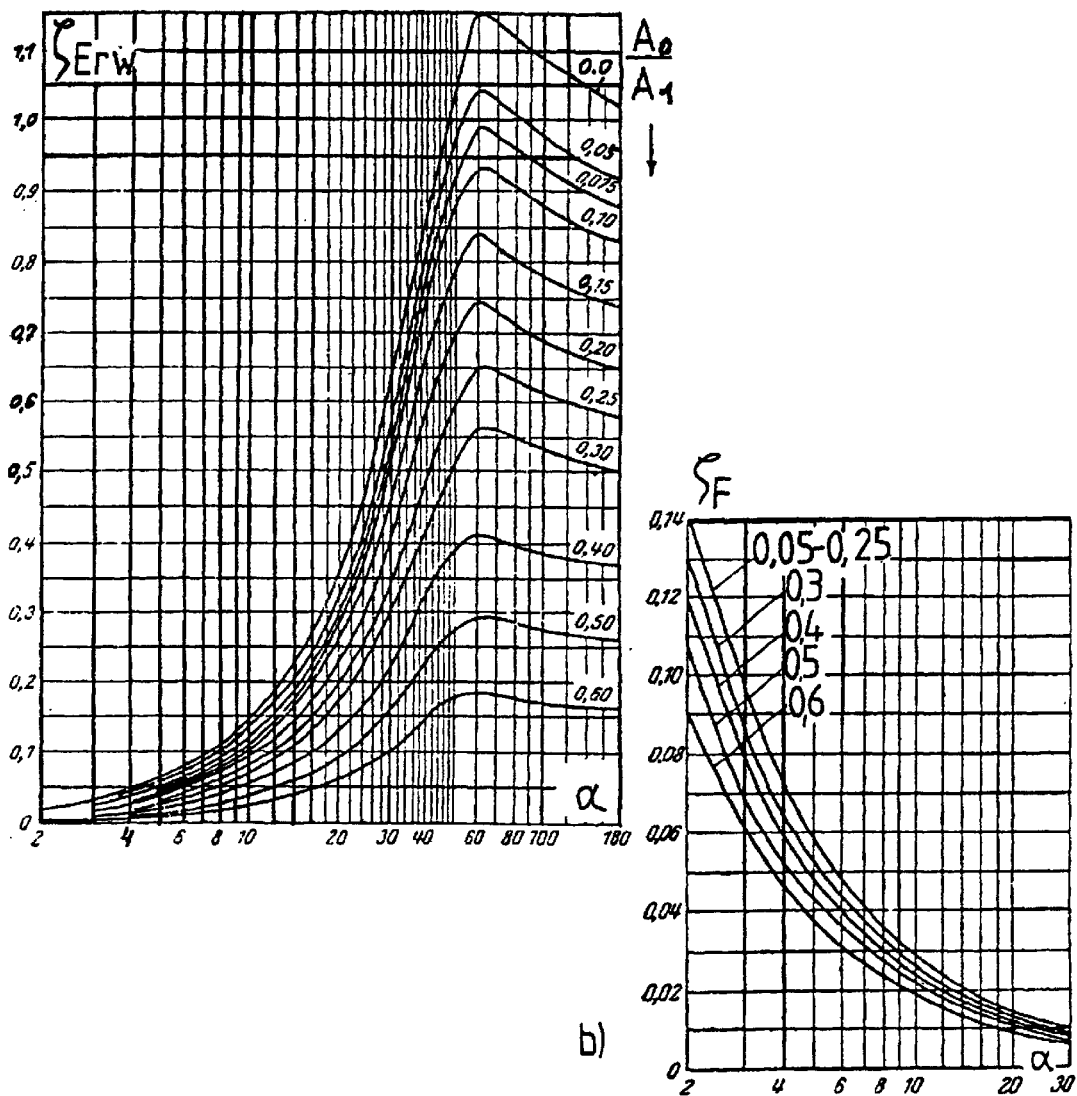
FIG. 49a,b

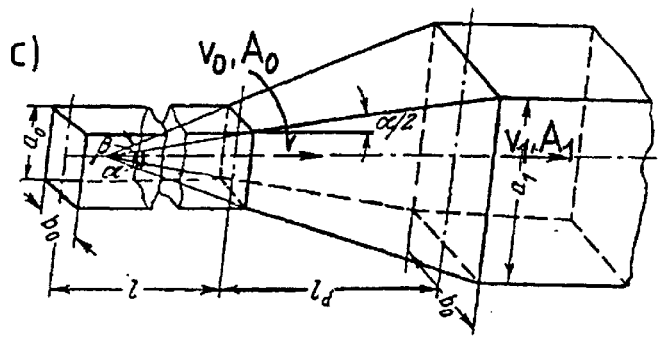
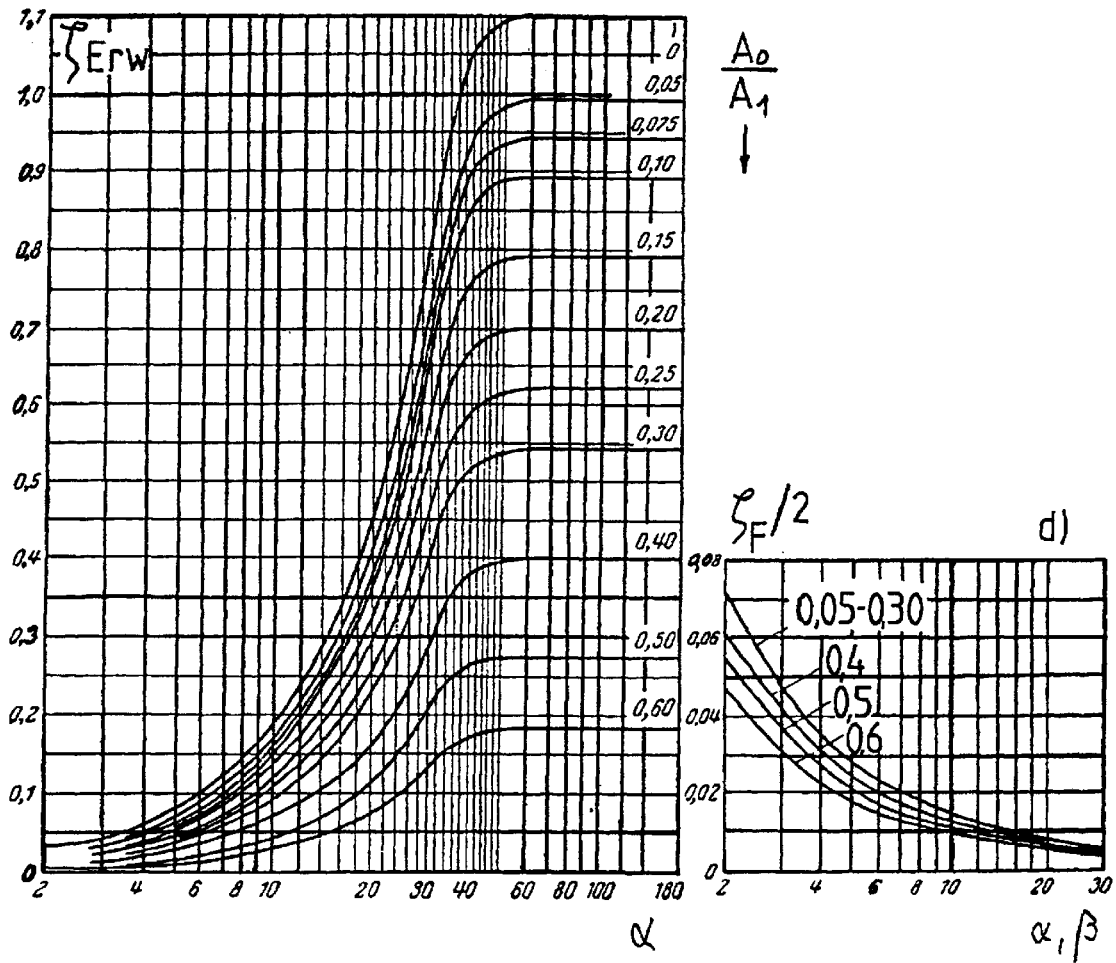
FIG. 49c,d

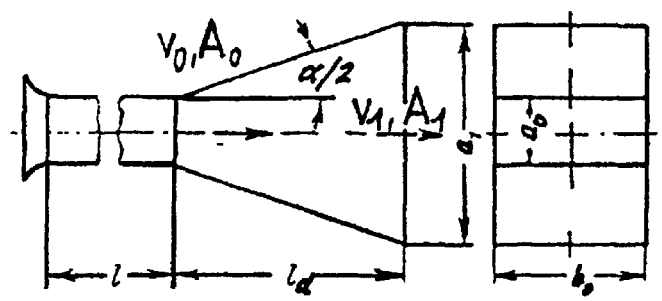
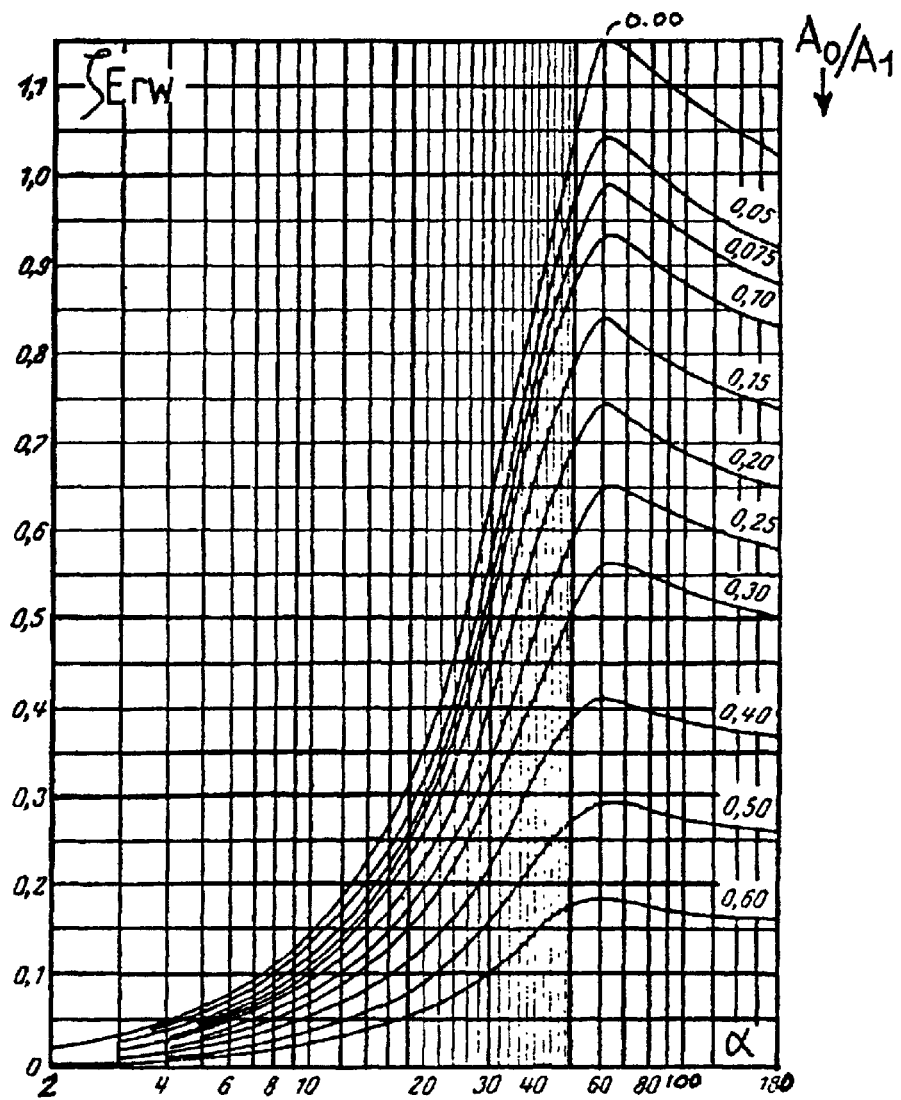
*FIG. 49e*

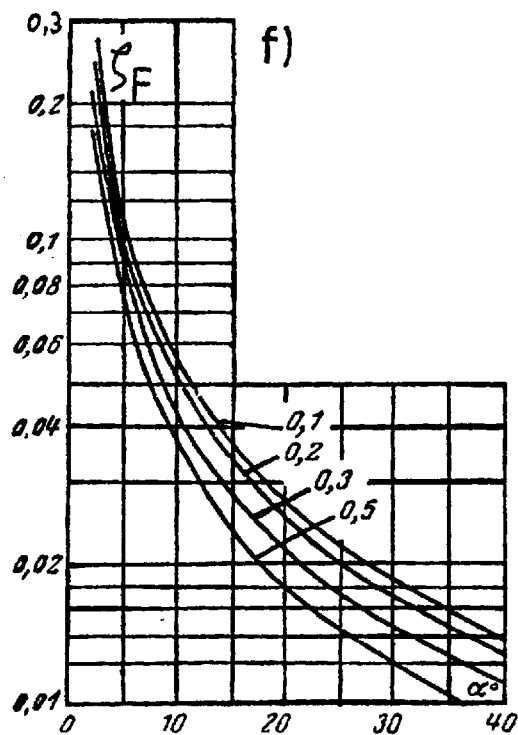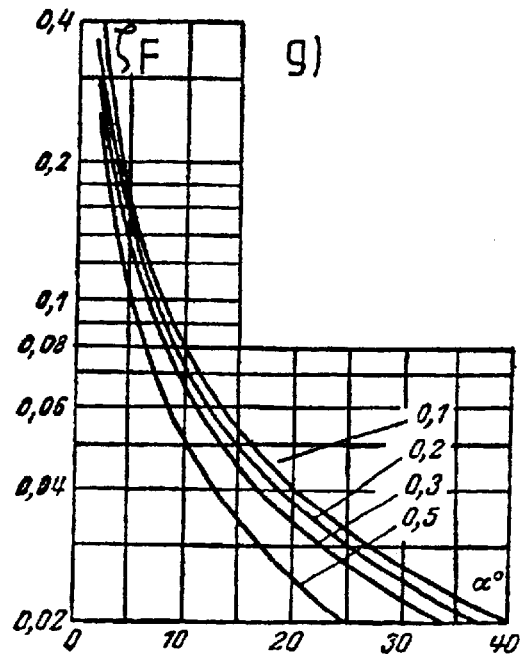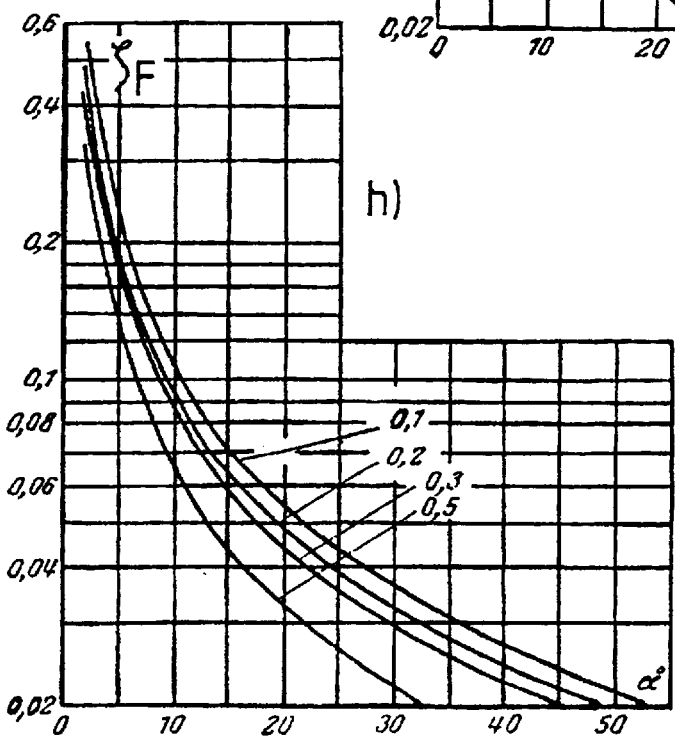
FIG. 49 f,g,h

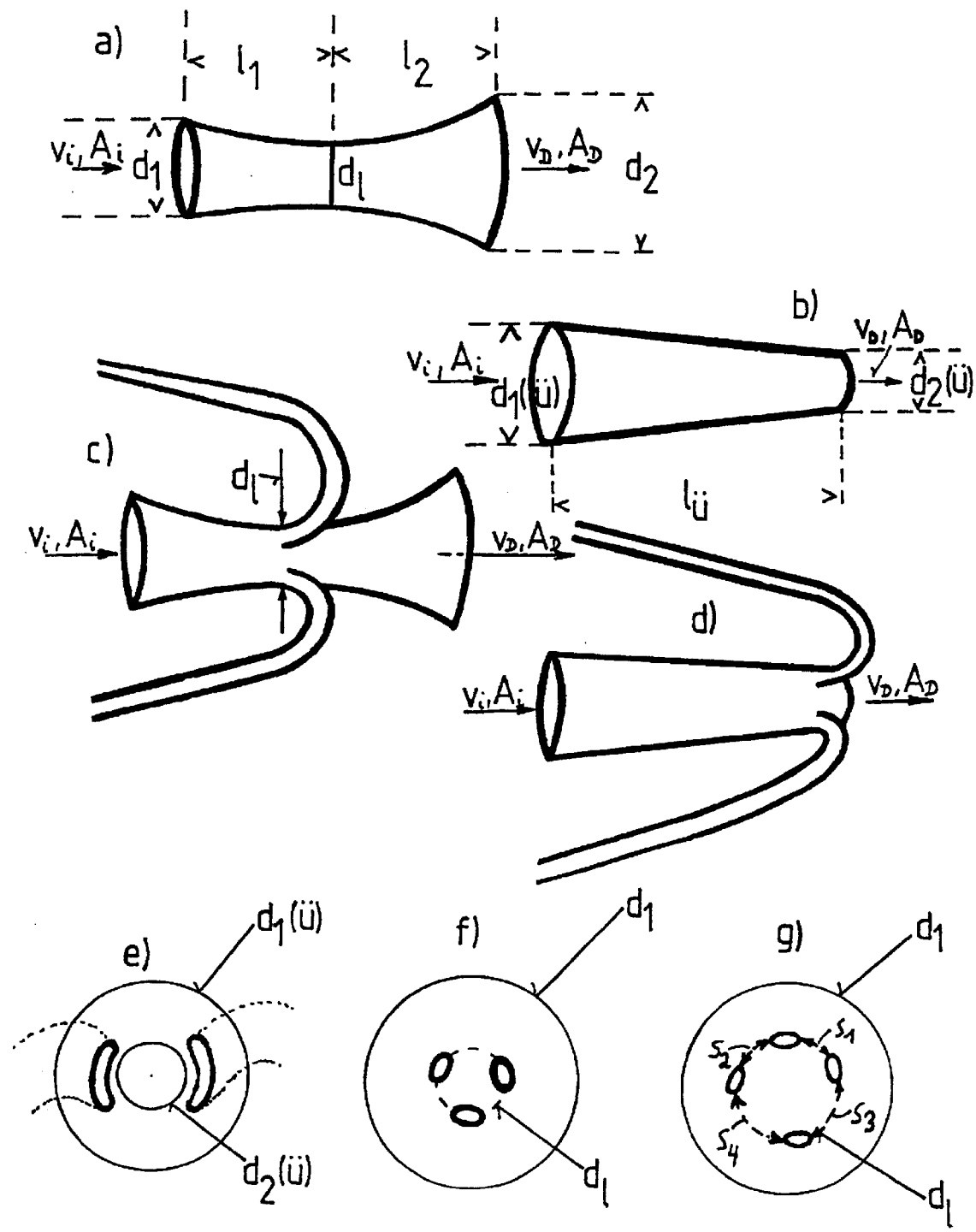
*FIG. 55 a - g*

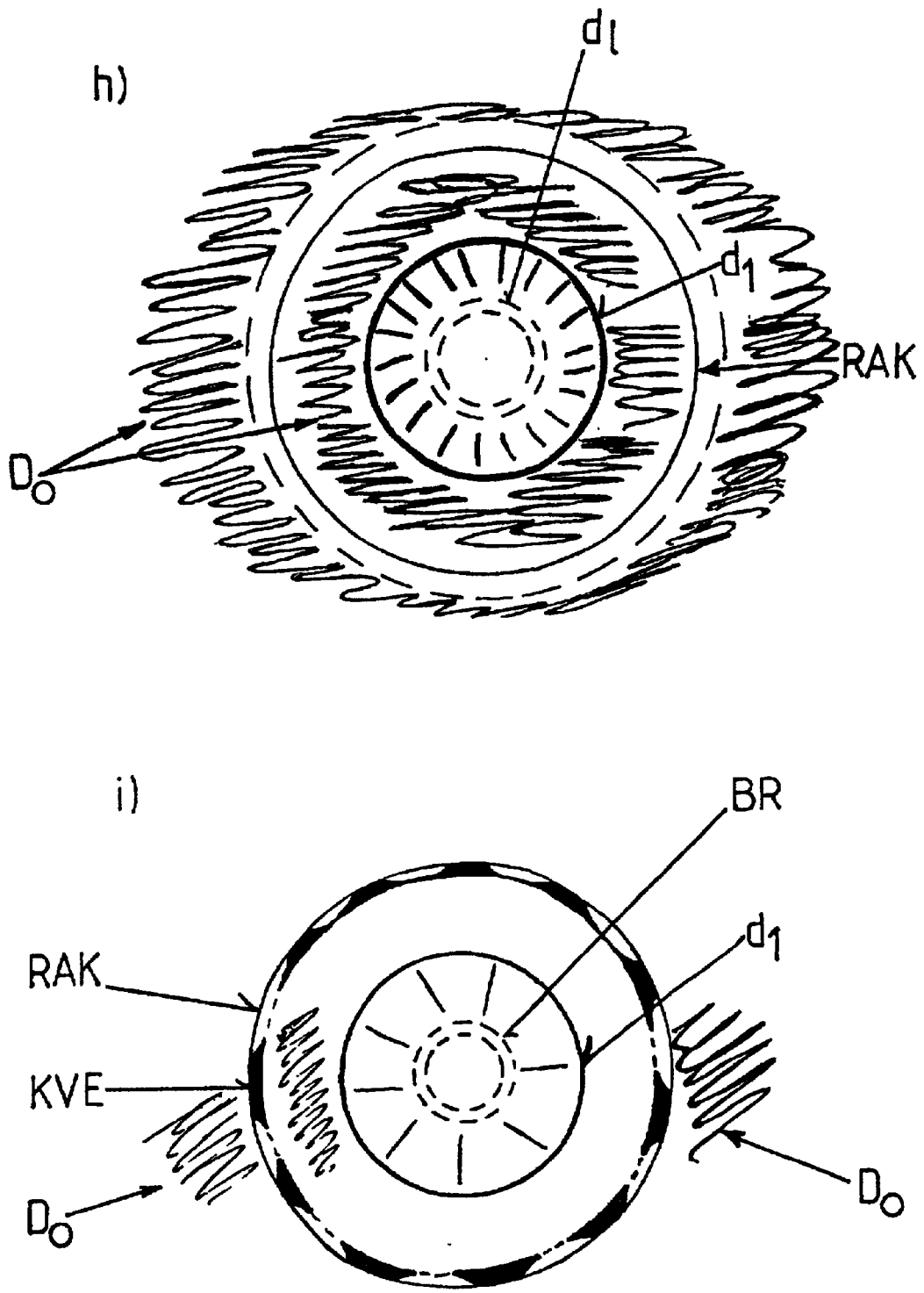
FIG. 55 h,i

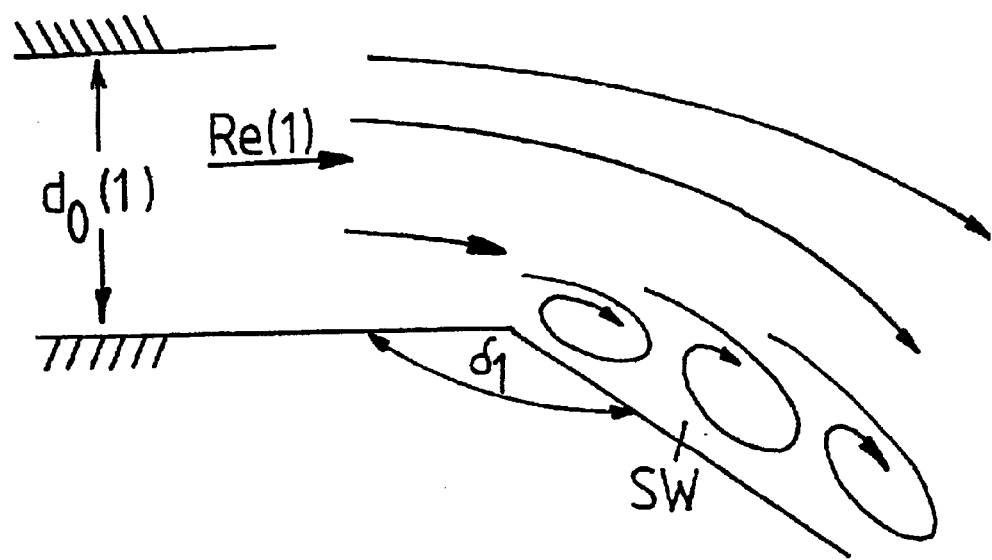
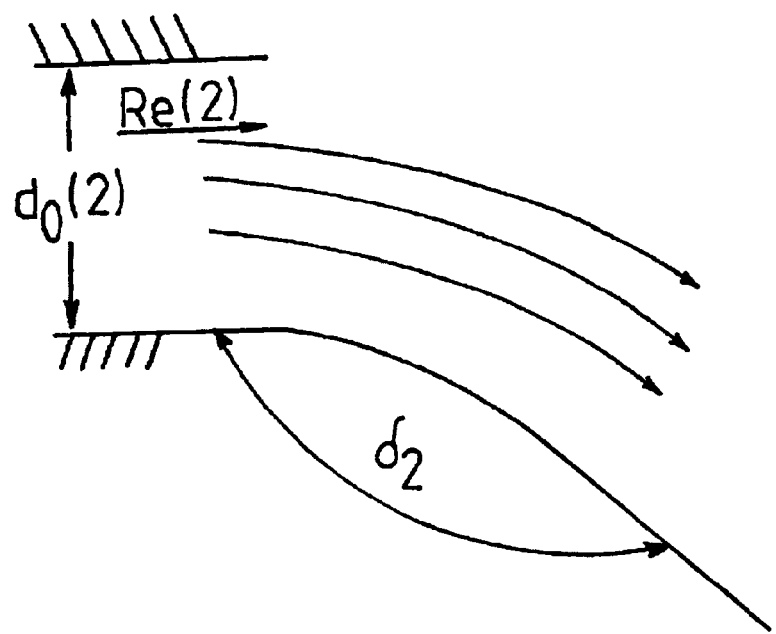
FIG. 56

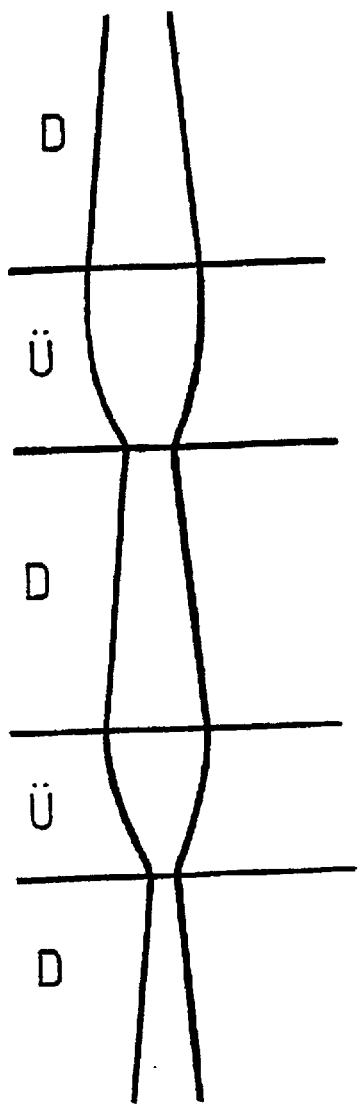
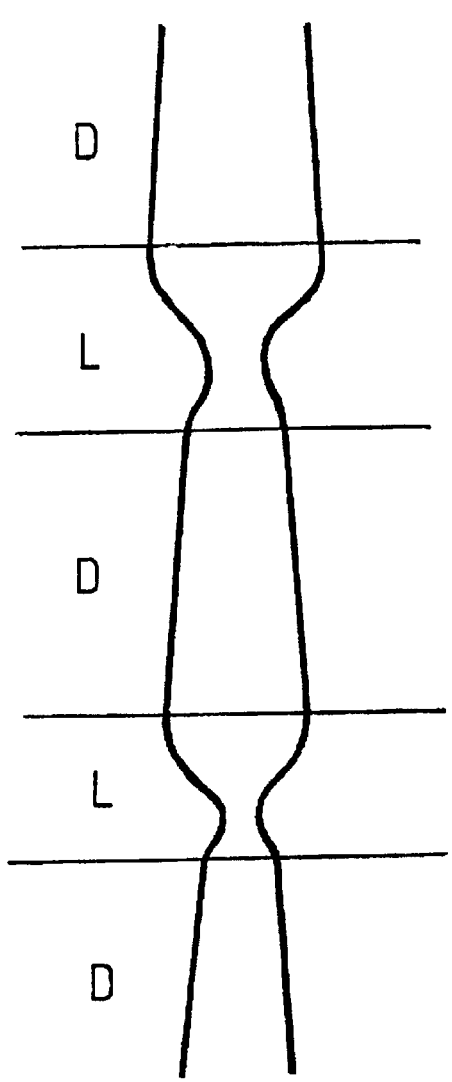
FIG. 57 a)
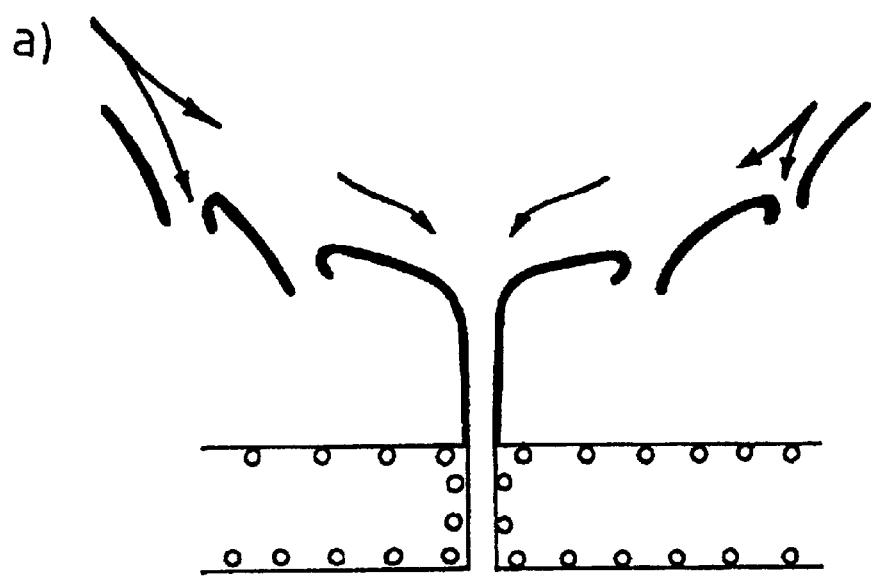
b)
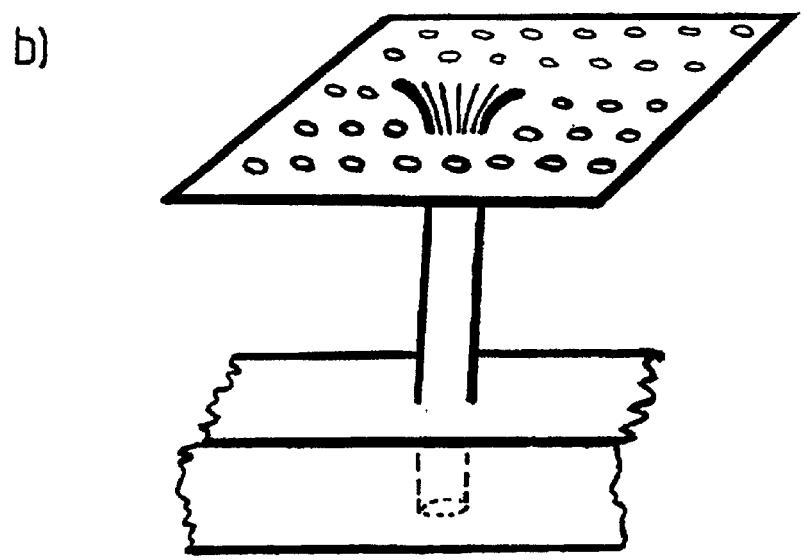
FIG. 60

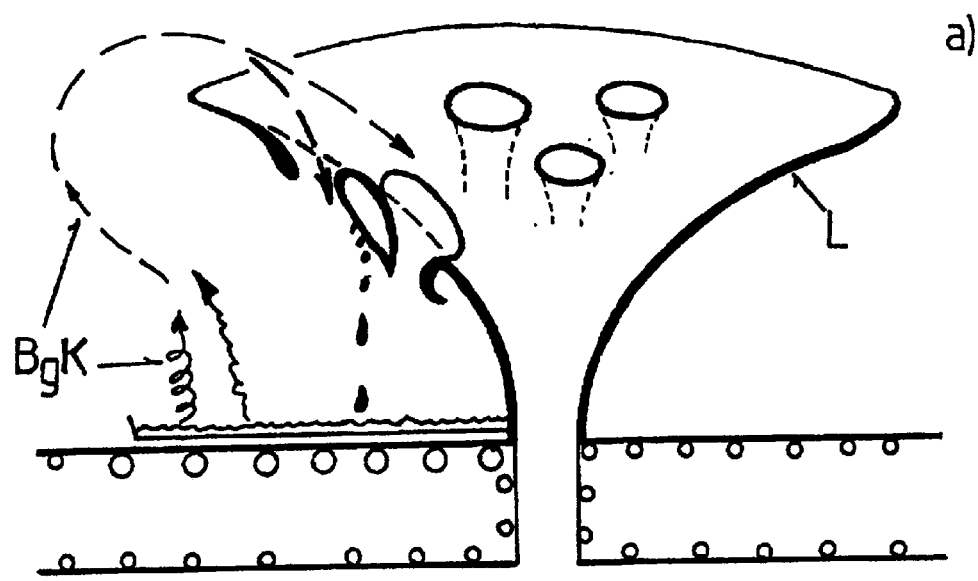
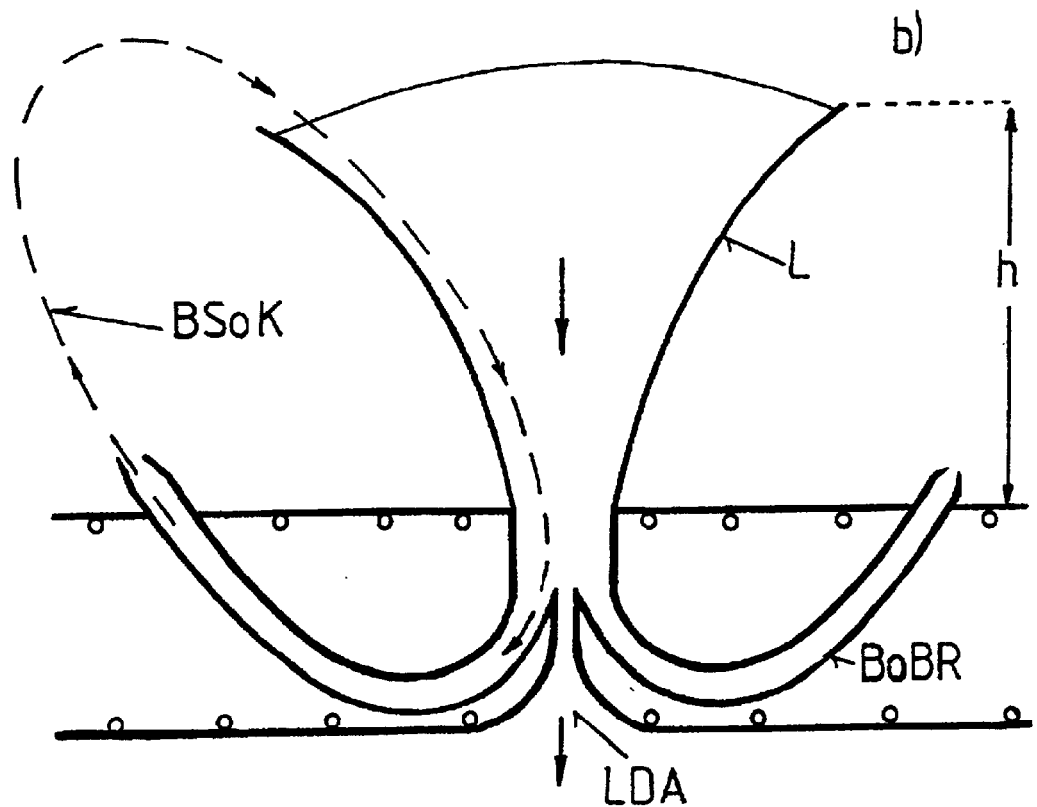
FIG. 61

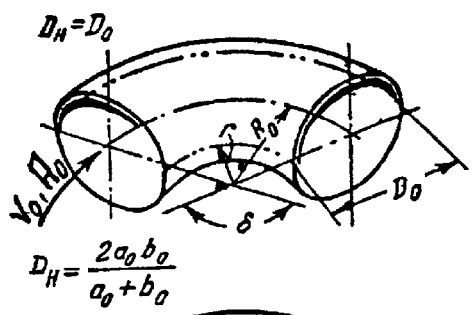
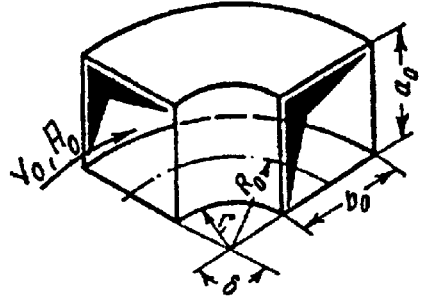
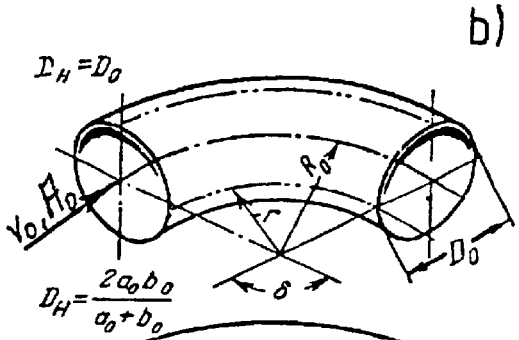
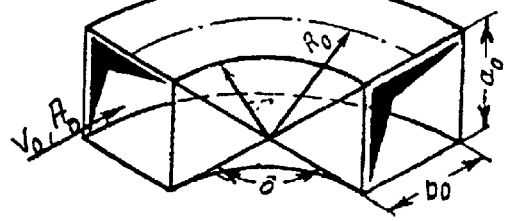
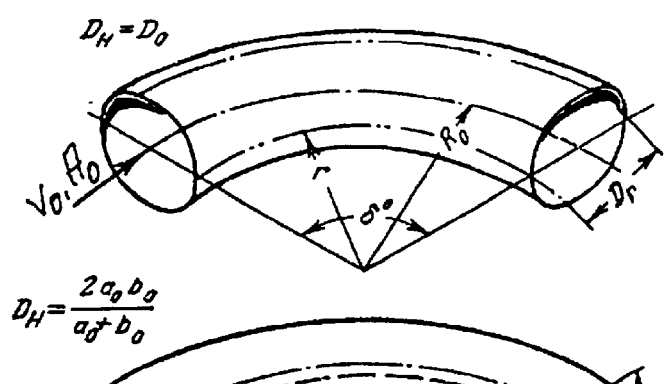
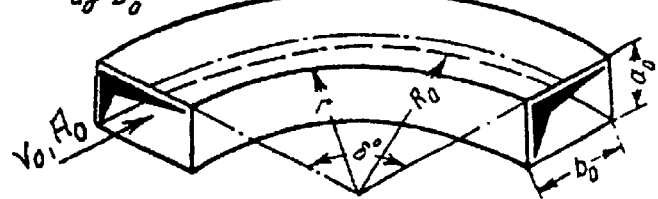
FIG. 74 a,b,d

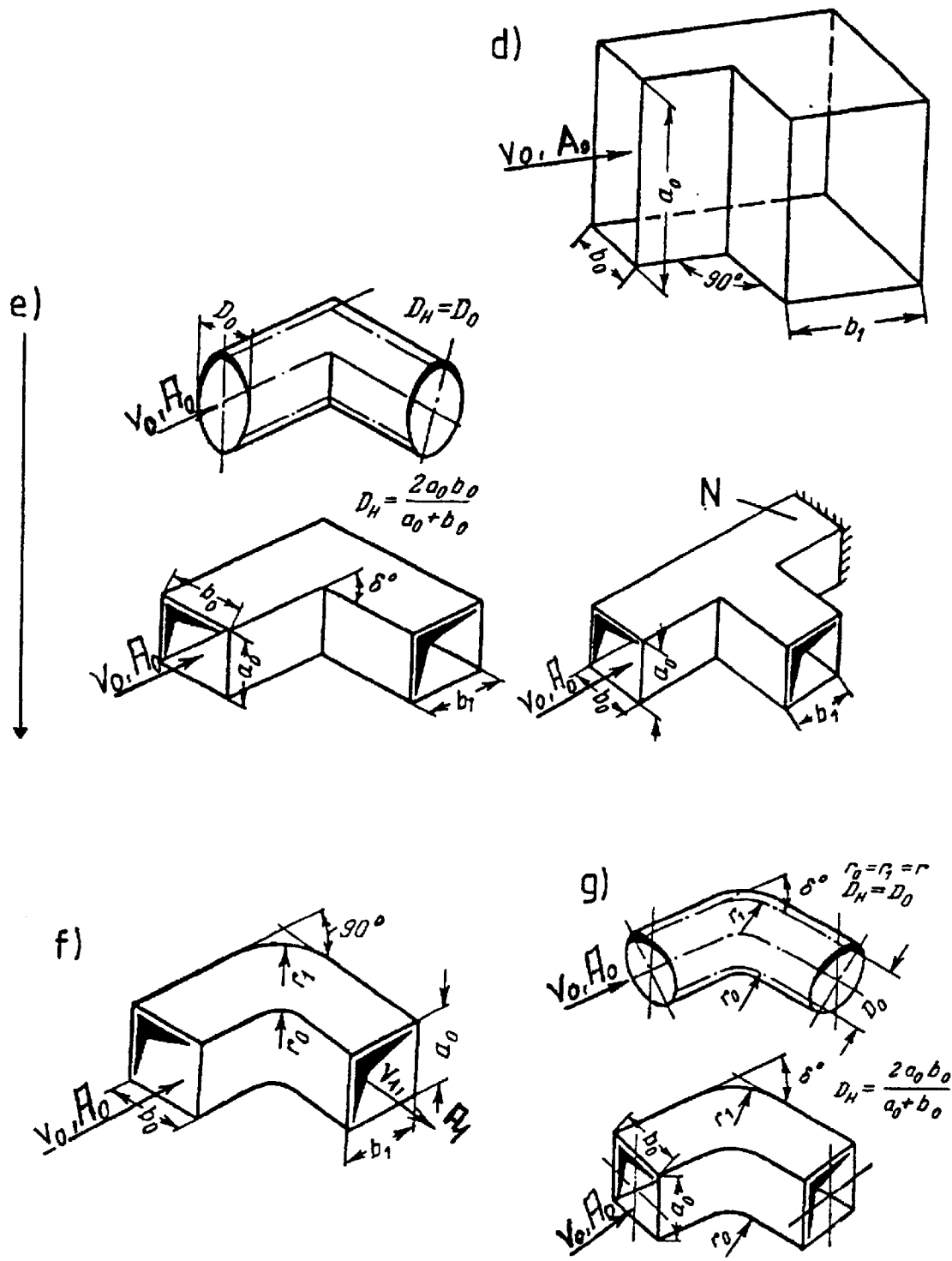
FIG. 74 d,e,f,g

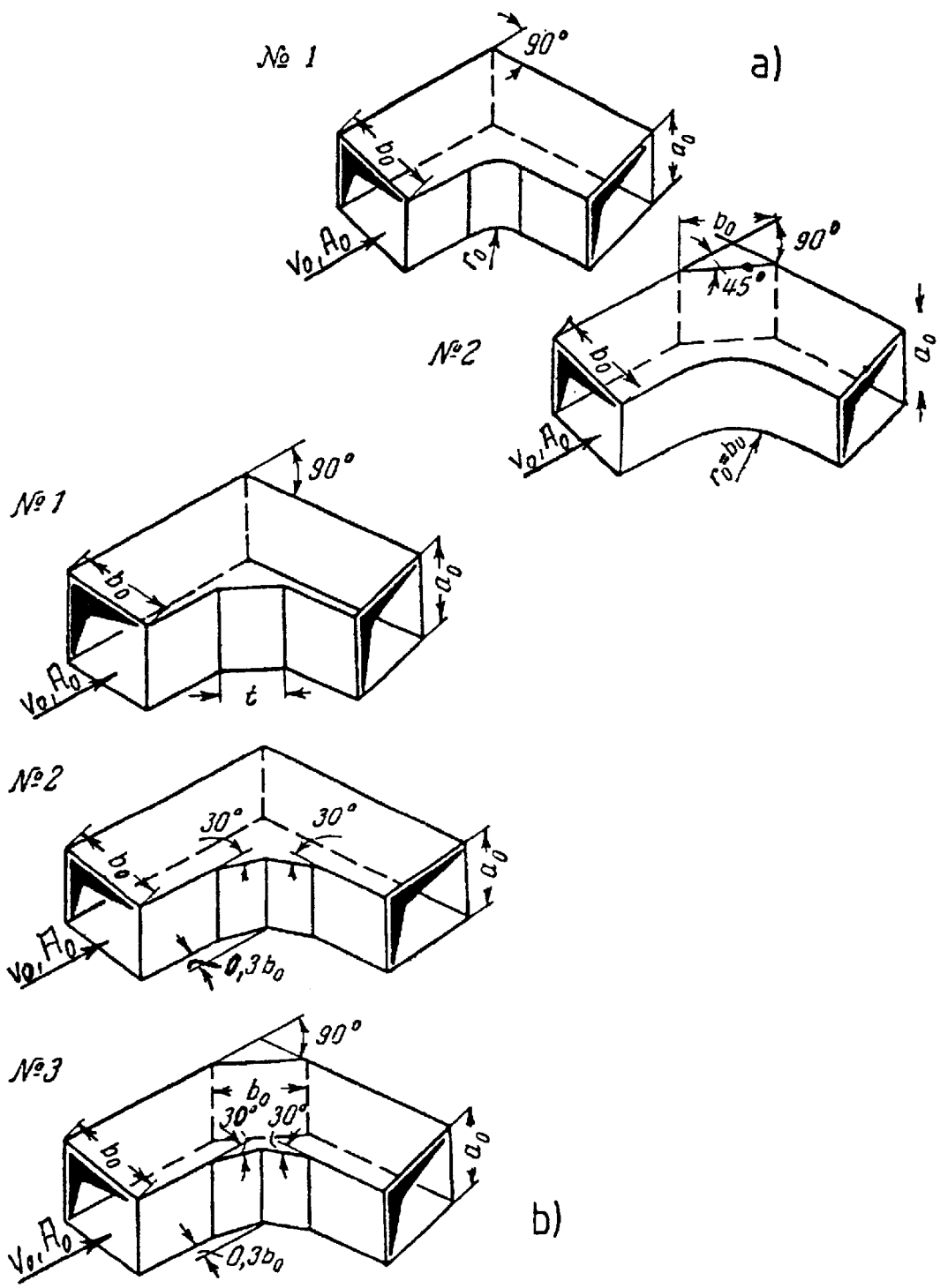
FIG. 75 a,b

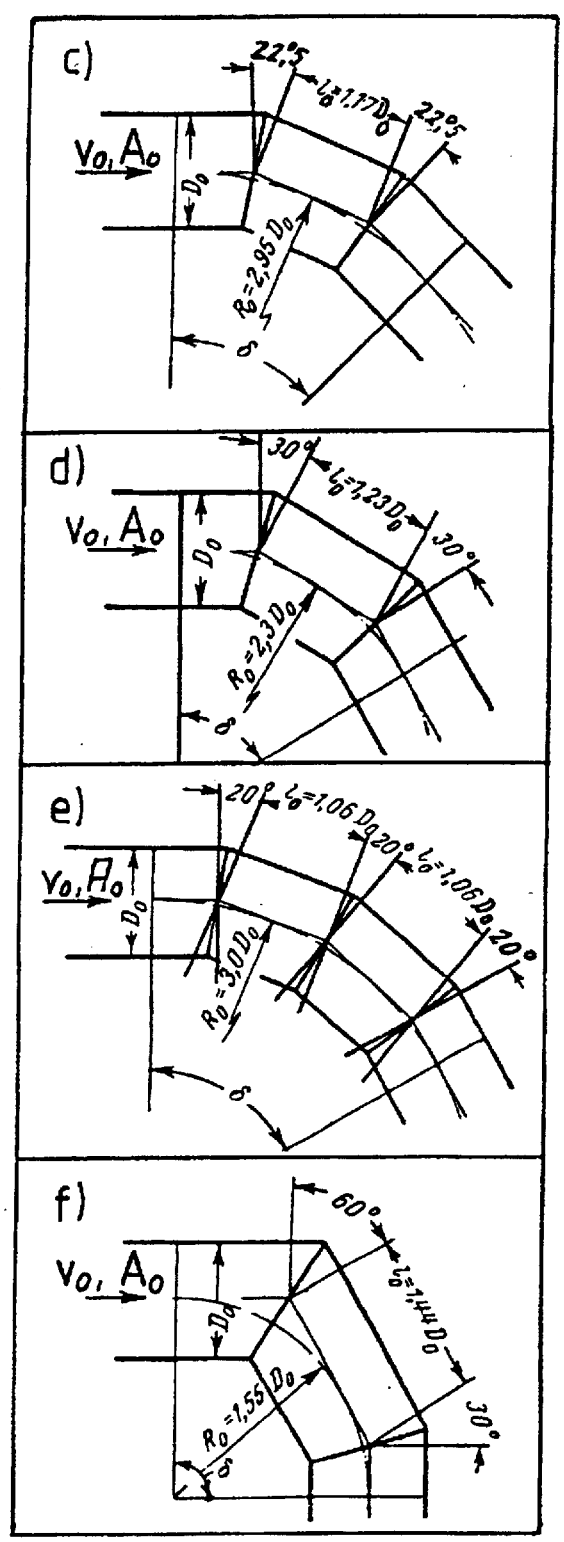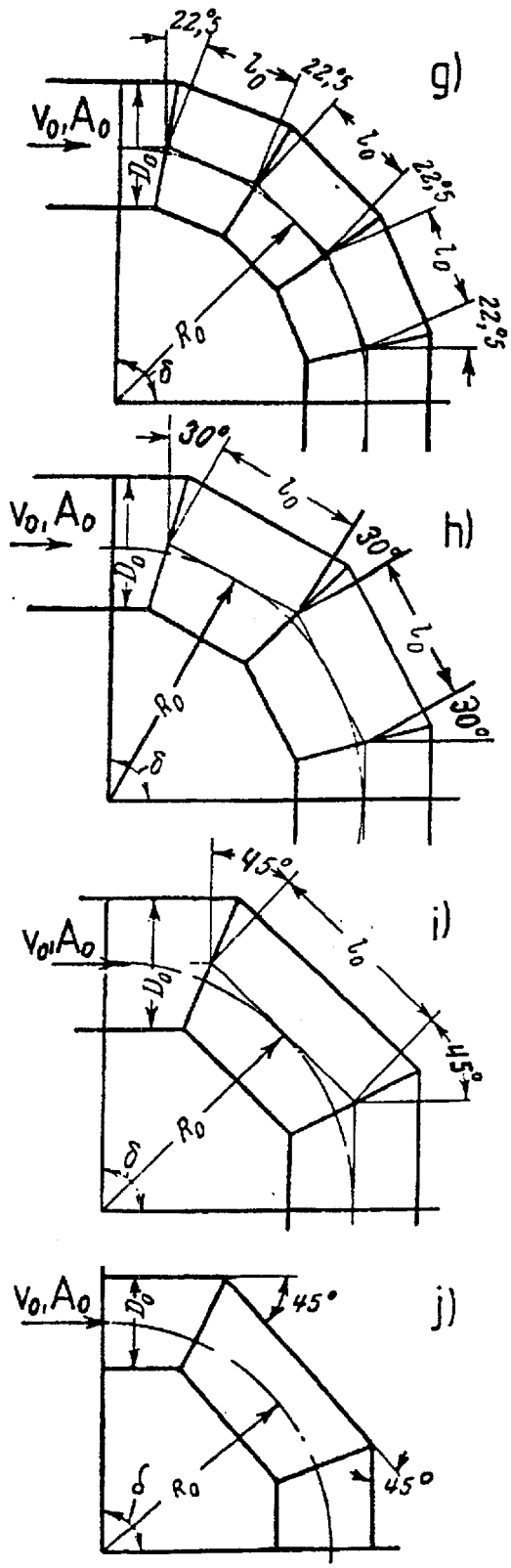
FIG. 75 c - j k) 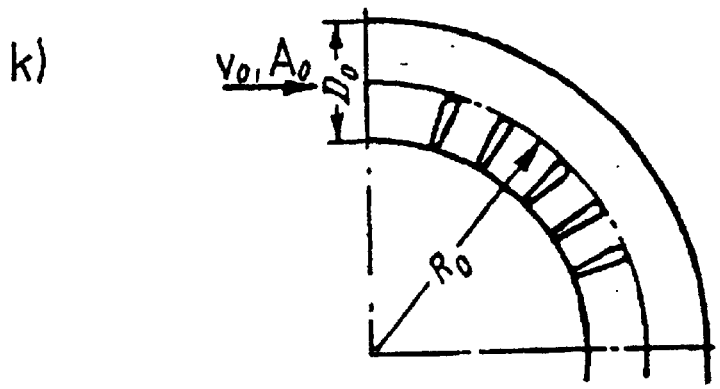
l) 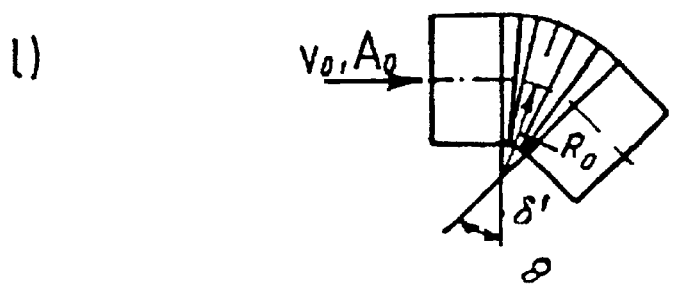
m) 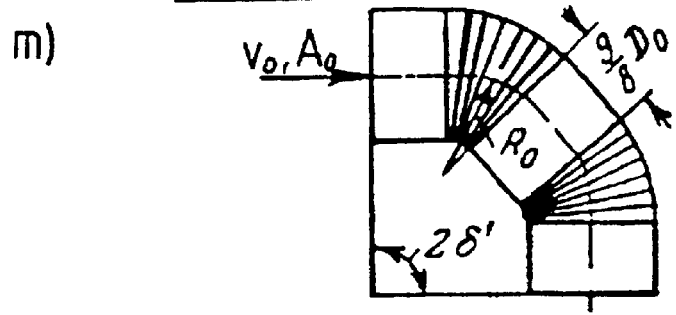
n) 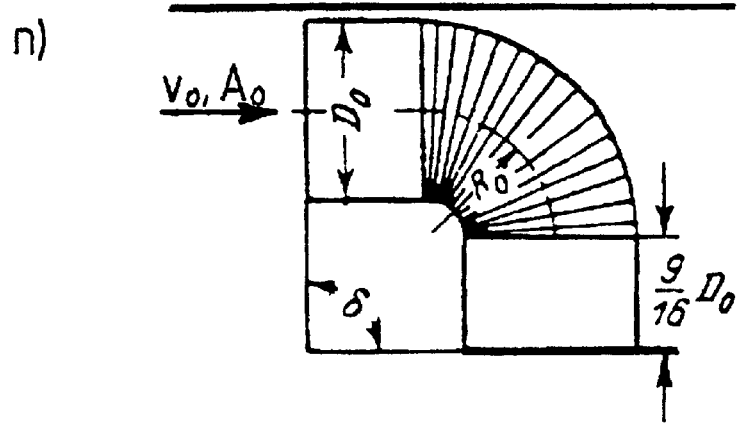
FIG. 75 k - n

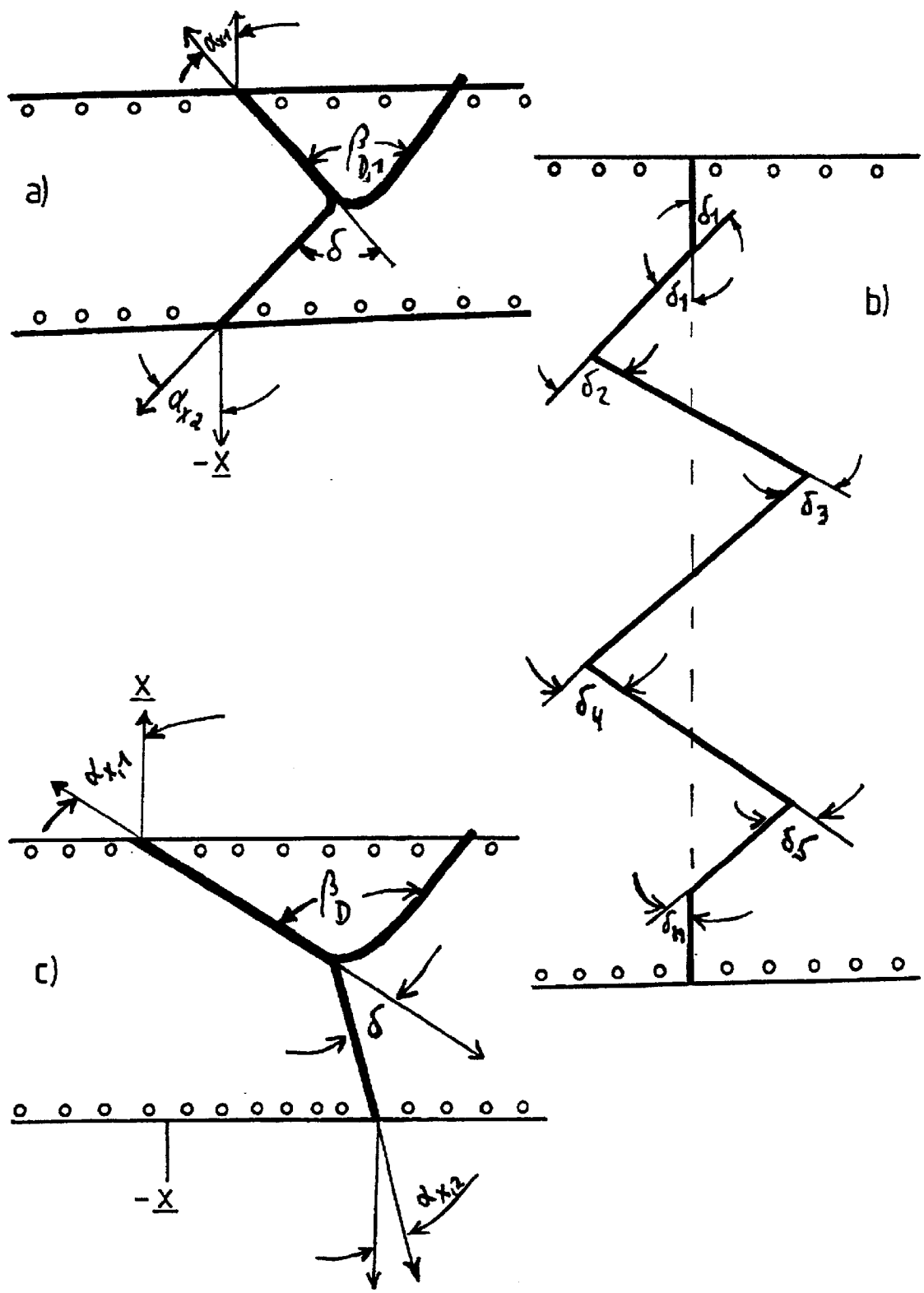
FIG. 77 a,b,c

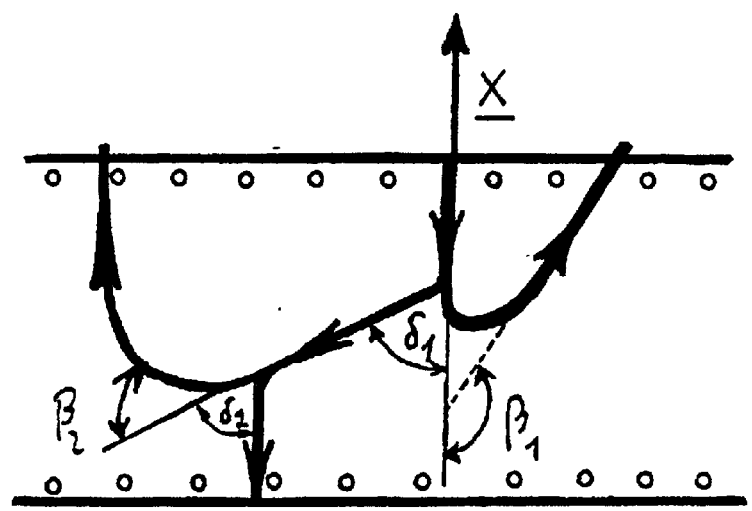
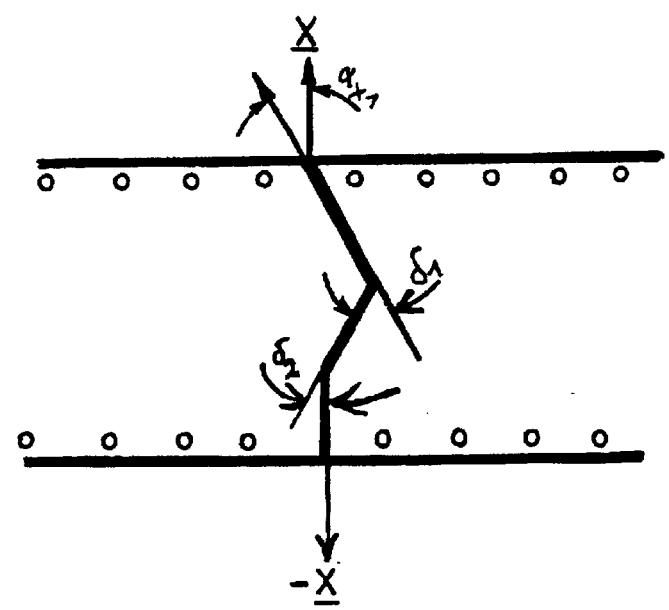
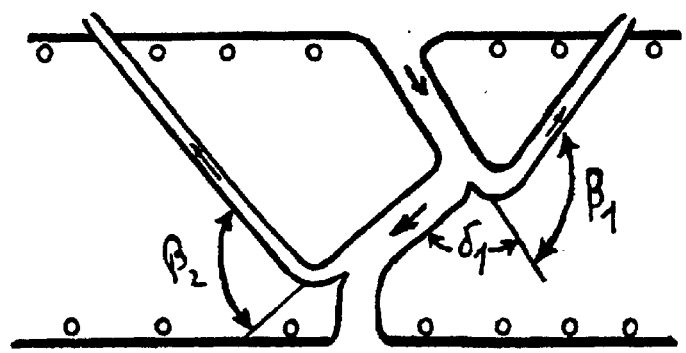
FIG. 77 d,e

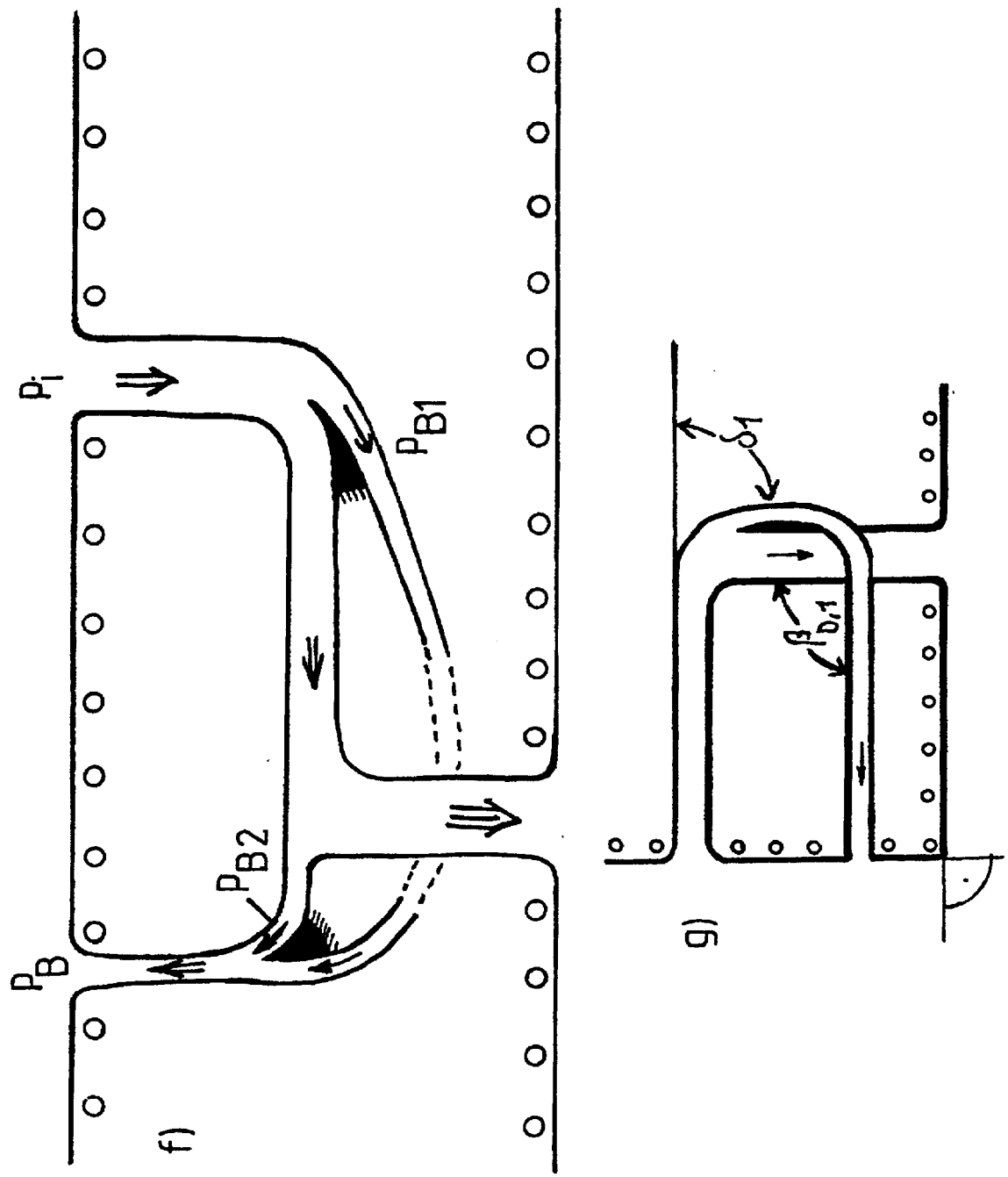
FIG. 77 f, g

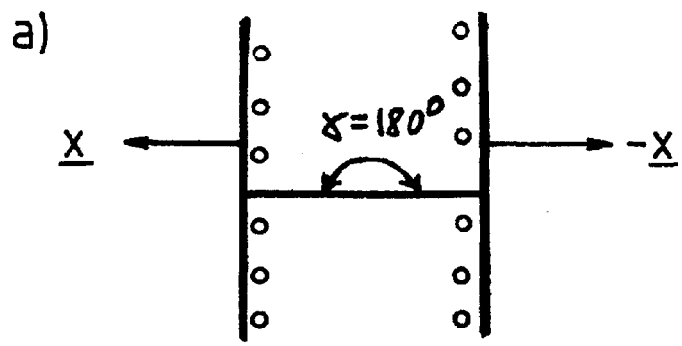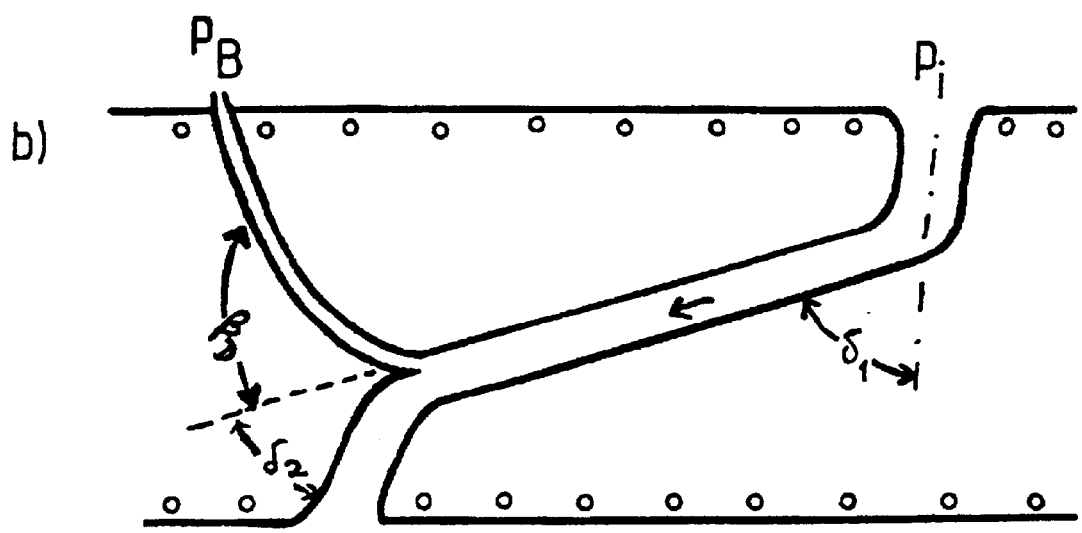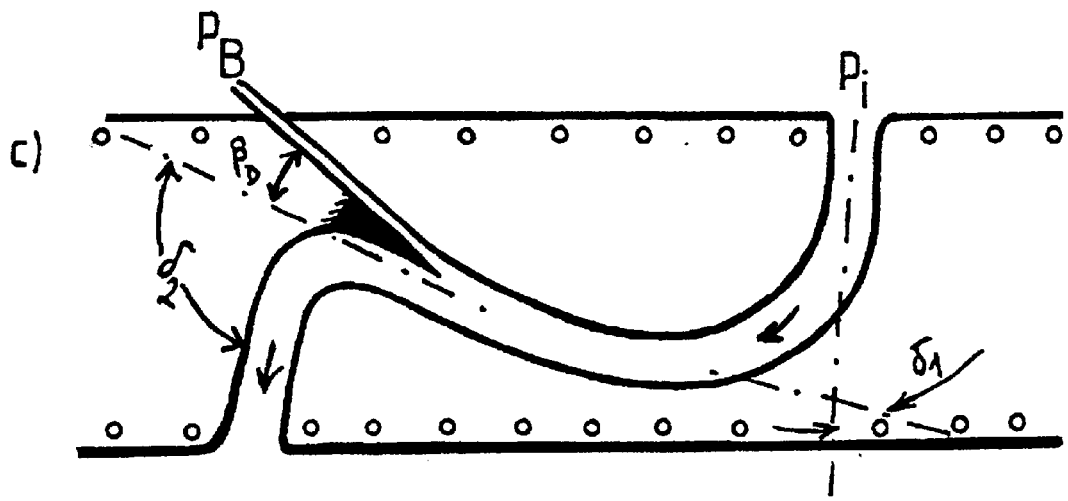
FIG. 78 a,b,c

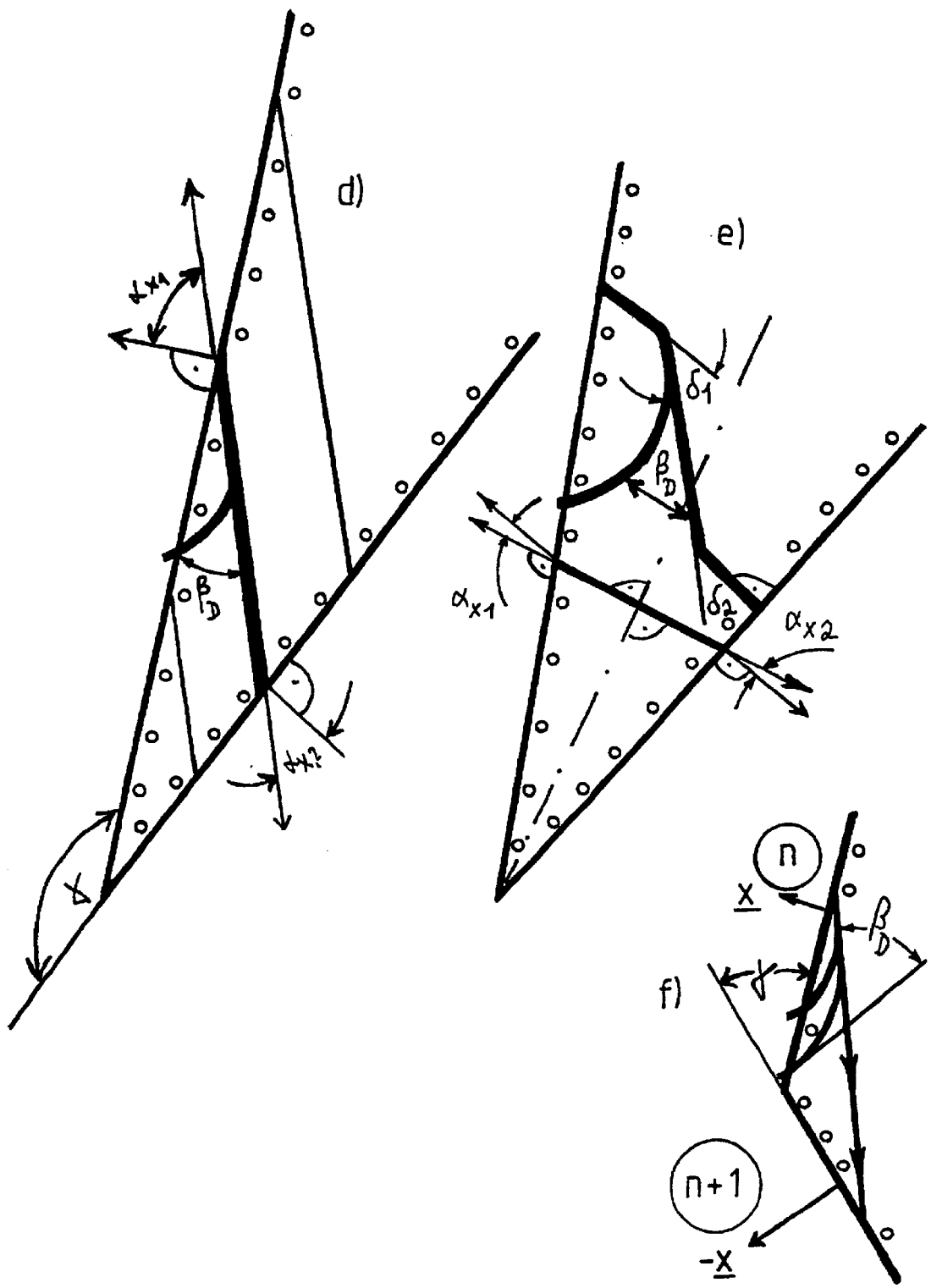
FIG. 78 d,e,f

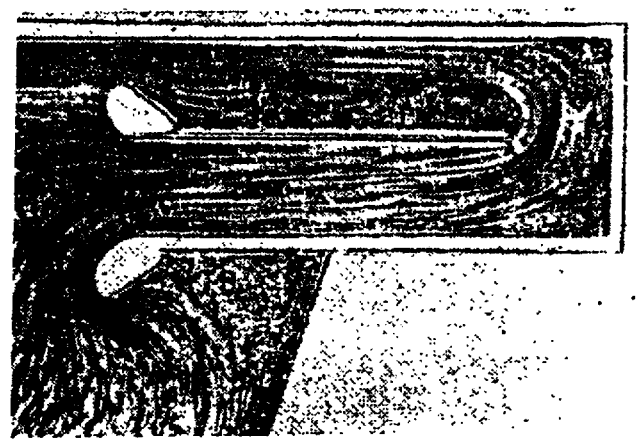
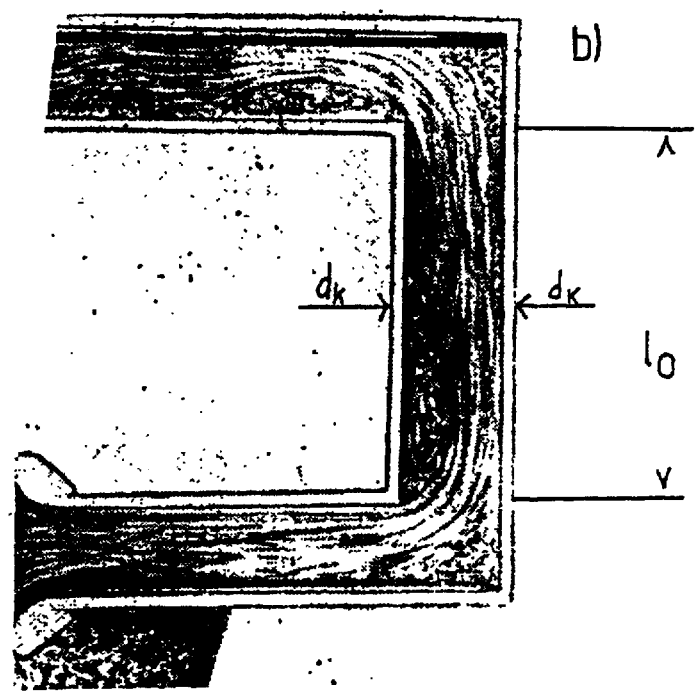
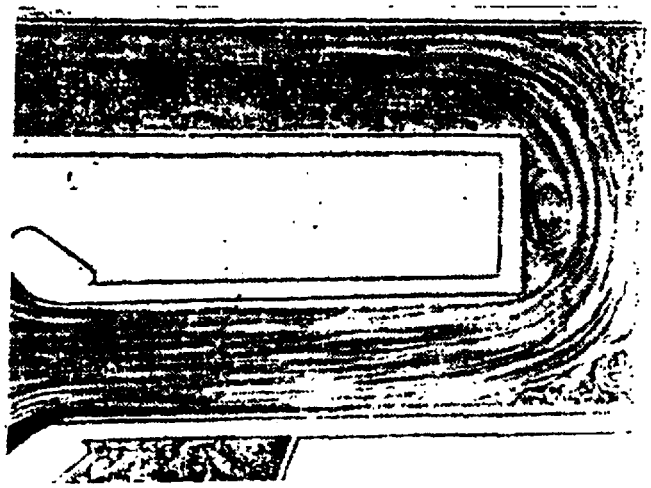
FIG. 80

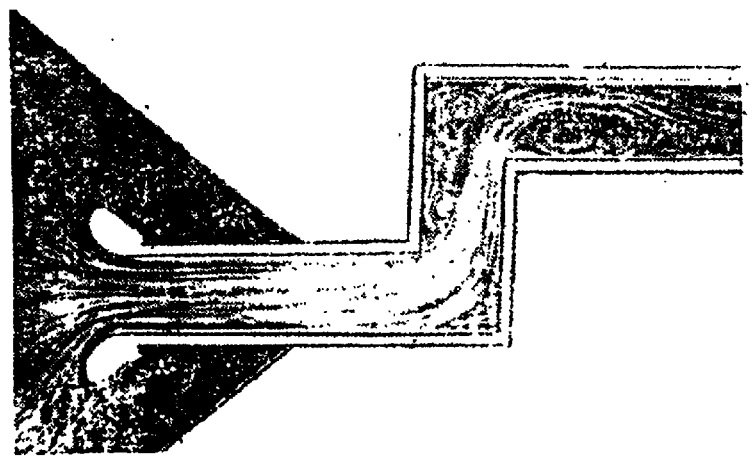
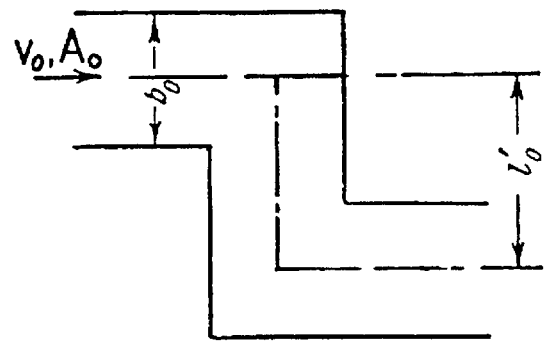
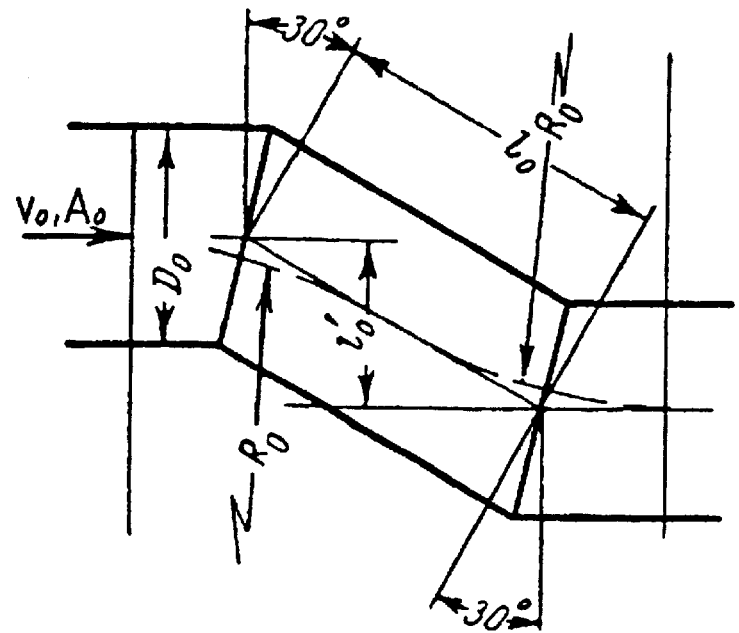
*FIG. 81*

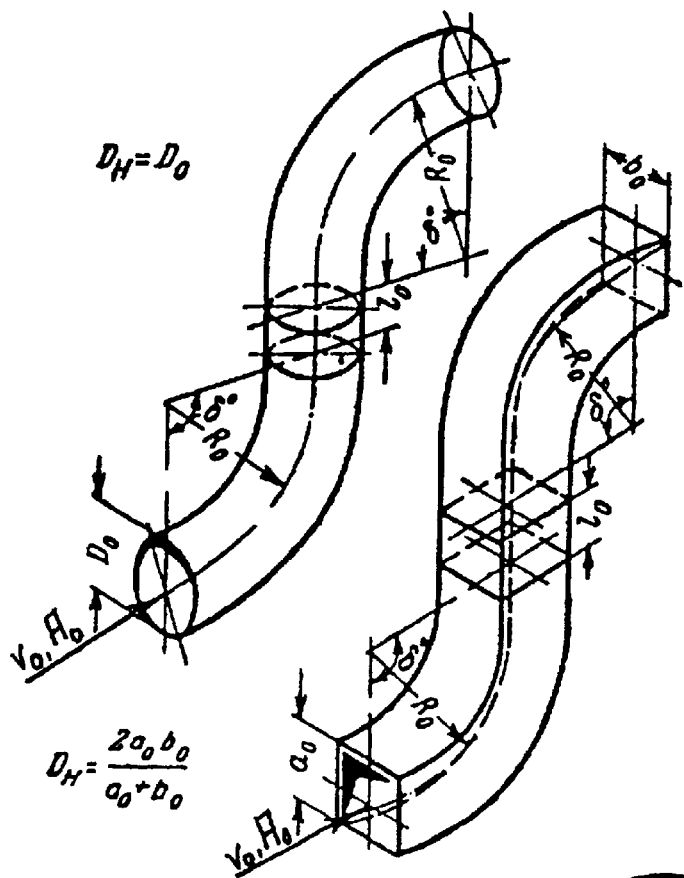
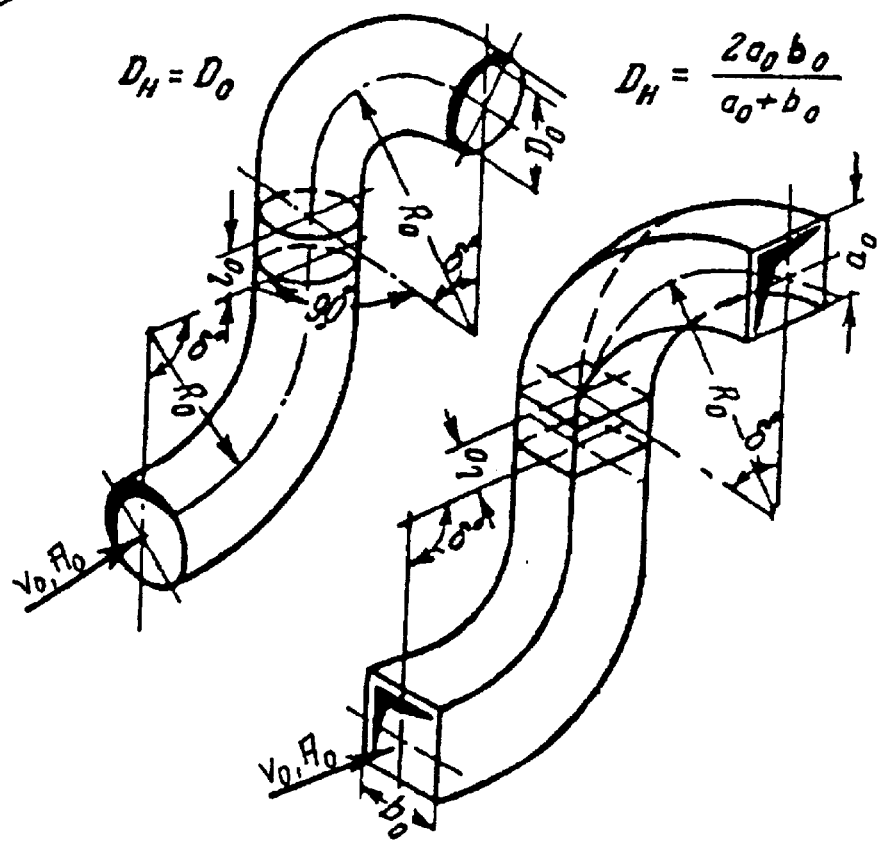
FIG. 84

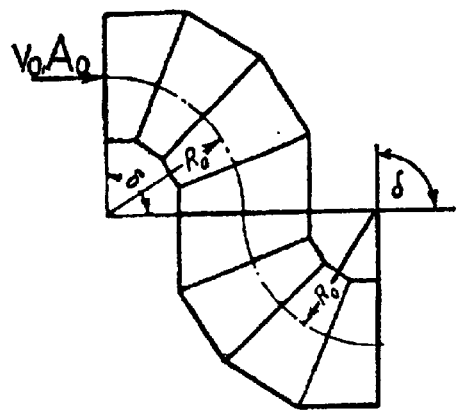
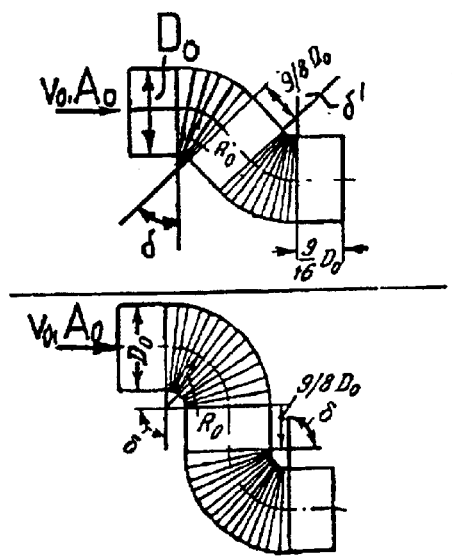
FIG. 88
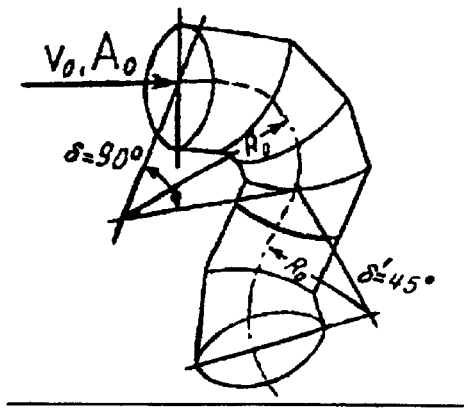
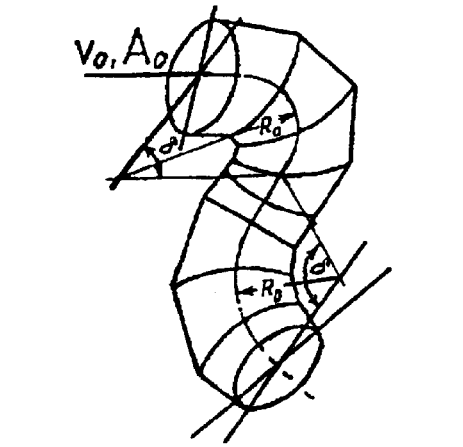
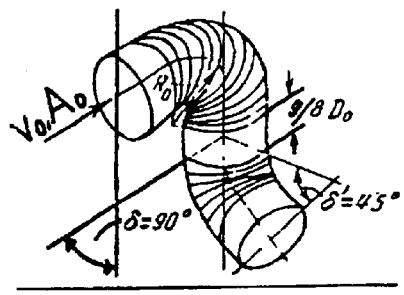
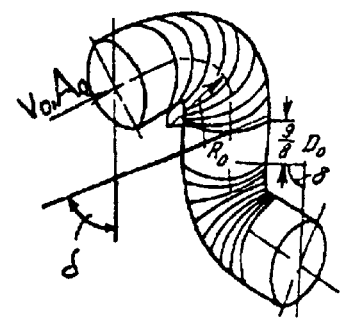
FIG. 89

INDUSTRIAL VAPOR CONVEYANCE AND DEPOSITION

CROSS-REFERENCES TO RELATED APPLICATIONS

This application is a divisional of application U.S. Ser. No. 08/776,381, filed Mar. 3, 1997, now U.S. Pat. No. 6,248,399, which is expressly incorporated by reference in its entirety, and which was the National Stage of International Application No. PCT/EP95/03076, filed Jul. 31, 1995.

BACKGROUND OF THE INVENTION

1. Field of the Invention

This invention relates to the industrial manufacture of new high-performance alloys, functional materials and ultrahigh-purity materials from the vapor phase, including PVD magnesium (PVD: physical vapor deposition), PVD aluminium, PVD titanium, PVD superalloys and PVD intermetallics, (sheets, bars, profiles, forgings, layers and surface films), "Thermal Barriers", VD materials (VD: Vapor Deposition) of semiconductor technology, including elementary and/or porous silicon, and of distillation for extraction (recovery) and refining, i.e. for the production of high-purity elements, such as alkali, alkaline earth and rare earth metals, to production of high-purity and ultra-high-purity (elementary or basic) metals (transition metals, such as Zr, Cr etc.) and products of "clean-room technolgy" as such, to the production of pigments, of reinforcing components, (of alloys with dispersed) carbides, nitides, borides, oxides, silicides, fullerenes, magnets, of optical and electronic products, including the products of microelectronics, to the coating of the reinforcing components of composite materials, for the surface treatment of materials as such, and to the recycling of modern lightweight and functional materials and of lubricants as well as aqueous solutions beyond the vapor phase, the products deposited from the vapor phase assuming solid massive forms and/or solid powder forms, semifinished product forms and/or near-final contour forms in the elementary and/or alloy state, in the thermodynamically metastable or stable state, whether as metal or ceramic or as semiconductor, or being packaged in liquid form or racked off as a gaseous constituent.

In industrializing the manufacture of future products from the vapor phase, relatively long distances for the conveyanve and for the intermixing (for example, during alloying) and segregating (for example, during recycling) of the relevant vapors will have to be covered in an energy-efficient way. The length of the necessary vapor conveyance flow distances is determined, on the one hand, by the size (quantity and dimension) of the initial, intermediate and resulting products and, on the other hand, on the nature and number of the methods and operative process steps of alloying, distillation and conveyance of (in) the vapor phase. However, overcoming long vapor conveyance flow distances still always tended to involve the problem of high conveying capacities Q, indeed entirely irrespective of the thermal loading capacity and chemical reactivity of the plant materials with and in relation to the corresponding vapors. See Th. König et al., H. C. Starck GmbH & Co KG, D38642 Goslar, German Patent DE 4214720, 11.11.1993.

In vacuum technology, a distinction must be made, as regards results, between two pumping capacities: (i) the first pumping capacity must be applied in order to generate the vacuum, the underpressure or overpressure and/or the controlled atmospheric composition in a system which is virtually closed off relative to the environment, the environment having a pressure of one atmosphere under normal conditions; (ii) the second pumping capacity to be basically distinguished is used for producing controlled (suction) flow and (suction) conveyance movements in the vacuum, in the overpressure prevailing relative to the environment and/or in corresponding atmospheres composed in a controlled manner relative to the environment and/or in corresponding atmospheres composed in a controlled manner relative to the environment, said movements being independent of the absolute pressure value of the respective atmosphere in certain regions (particular to a specific pumping system). Just as a pump can generate an air draft under normal conditions, a pump can generate and drive a vapor flow under vacuum conditions, etc., and the pumping capacity can in various ways be uncoupled from the conveying capacity and, by controlling the conveying capacity, can be coupled to this again. The pump-unspecific pumping speed S at the inlet of a given vacuum pump station for a given vacuum chamber is a mechanical propulsion force which must be delimited relative to chemical and physical conveying operations and which is intended for the forced convection of the conveying, alloying or separating and converting operations involved. It is unimportant, in this case, whether the suction effect is produced by underpressure alone or in conjunction with a carrier gas. The pressure flow is that form of propulsion force of material conveyance which corresponds to the (technical) overpressure, whereas, in a vacuum, the suction flow is this particular form. This distinction, trivial per se, has hitherto greatly underestimated inportance in light of the state of vacuvum technology and material production from the vapor phase (see F. Hehmann, F. W. Hugo, F. Müller and M. Raschke, German Patent Application P 44063334, Mar. 1, 1994, made by Leybold Durferrit GmbH, Hanau).

Gaseous suction flows are used (i) in the chemical and petrochemical industry for separating processes for the selection, for example of (for example, organic) solvents in waste air, in which the speed-determining step of diffusion through the diaphragm is controlled according to Fick's law of diffusion. Gaseous suction flows are also used (ii) in chemical vapor deposition processes (CVD), in which a chemical surface reaction and the amount of surface involved determine and limit the productivity of the CVD coating process. In the simplest form, this reaction reads as follows (cf. D. S. Rickerby and A. Matthews, *Advanced Surface Coatings—A Handbook of Surface Engineerings*, Blackie & Son Ltd, Glasgow G64 2NZ, 1991):

$$2AX(g) + H_2 \rightarrow A(s) + 2HX(g) \tag{1}$$

in which AX(g) is the gaseous reactant supplied (for example, fluorides, chlorides, bromides, carbonyls, volatile metallo-organic compounds), A is the material of the resulting surface layer (s), H(H$_2$) is hydrogen as a carrier and HX is the usually toxic and corrosive waste gas. In this case, the suction flow does not determine the speed-determining process step (and productivity limit), but is used primarily for operating safety. It is therefore also not surprising that, in CVD operations with simultaneously occuring and widely differing surface reaction speeds (the term "reaction kinetics" is avoided here, since it often relates to a reaction mechanism, the speed of which can be influenced by mechanism-independent variables), so-called "additives" are added to the reactands, in order to brake (!) the fastest reaction operation and achieve harmonization of all reaction operations on the corresponding surfaces, that is to say a control of the CVD process. It was thereby possible to achieve an accurate control of the composition and nature of the resulting phases by means of CVD processes. The increase in productivity specific to the CVD process was therefore concentrated on the development of suitable compositions of the reactand gases supplied to the reaction (cf. D. C. Boyd, R. T. Haasch, D. R. Mantell, R. K. Schulze, J. F. Evans and W. L. Gladfelter, *Chem. Mater.* 1 (1989), p. 119.) and has consequently hitherto remained independent of the pumping speed S or of the conveying capacity Q which is applied for the waste-gas suction (!) flow.

This is an important reference point in the overall invention designated above: for the purpose of control (of a process), not to accelerate the fastest process step, or even merely to control it, but, above all things, to restrict it! This specific form of process control to increase productivity is the indispensable precondition for the industrialization of an advanced process and allows a better utilization of its inherent advantages. This maxim is pertinent only to those processes which operate in limited areas. Vapor deposition (irrespective of its form (for example, as (reacted) dust, powder, solid blank, etc.) or of its dimension) is such an area, since the fragmentation of matter (which is the decisive criterion for structural and chemical homogeneity controlling the properties of a material) further than down to the individual atom has hitherto also been pojntless for the manufacture (!) of new materials. In complete contrast to this is the rapid solidification, occuring hitherto, which operates in the micrometer fragmentation range and in which the operational fragmentation range is concentrated on the "cross-over" of the fragmentation medium (for example, in gas and water atomization) or, for example, on the "melt puddle" (in "melt-spinning"). In the case of rapid solidification from the melt, the corresponding increase in productivity remains a linear problem and, in actual fact, can be achieved only extensively, that is to say by lining up many "cross-overs", etc., into a "linear" concept (cf. F. W. Baker, R. L. Kozarek and G. J. Hildeman. Proc. *"Second Int. Conf. on Spray Forming"*, Swansea, Sep. 1315, 1993, edt. J. V. Wood, Woodhead Publishing Ltd, Cambridge CB1 6AH, UK, p. 395. and S. K. Das, D. Raybould, R. L. Bye and C. F. Chang, U.S. Pat. No. 4,718,475, January 1988.) with limited efficiency and inventive depth, thus contributing to the current dilemma of this profession.

For, as is known, it is necessary merely to overcome a particular energy barrier, and it needs no great invention to evaporate an infinite quantity of material. Furthermore, in comparison with the CVD and CVR (chemical vapor reaction) processes, physical vapor deposition processes (PVD) also lack a chemical material conversion reaction, and it therefore also cannot control the productivity of a PVD process. Temperature and potential gradients (that is to say, free convection, diffusion) have hitherto remained the predominant propulsion forces of the conveying operations in physical deposition processes (PVD) (cf. D. S. Rickerby and A. Matthews, *Advanced Surface Coatings—A Handbook of Surface Engineerings,* Blackie & Son Ltd, Glasgow G64 2NZ, 1991.). Consequently, the degrees of freedom and potentials for innovation of the PVD processes have hitherto remained unused. The PVD problem is not a genuine productivity problem, although it appears to be such at first sight in laboratory practise and from outside. Like the CVD and CVR problem, the PVD problem is primarily a question of quality arising as a result of the difficulty, in the case of high productivity, of also continuing to control concentration and phase selection as well as the homogeneity of these parameters in the product in an energy-efficient way.

2. Description of the Related Art

F. Hehmann, EP-Application 94111991.9, Aug. 1, 1994, and PCT Application PCT/EP95/02882 of Jul. 19, 1995 claimed for the first time a vapor deposition process which is driven by the pumping speed S and of which the conveying capacity ("throughput") $Q=q*P$ ($q$=e.g. volumetric conveying flow or speed $q_v$ [$m^3$/sec]) is controlled by forced convection, that is to say by a pump system which is external (that is to say, located outside the distance x between the vapor source and vapor deposition level (said distance being the shortest and being dependent on the plant and diaphragm design)), and for a given pumping speed, by the more detailed design of a "mass filter", the porous diaphragm Diaphragm* (PD). The Diaphragm* is the main structural part of a controlled increase in productivity for vapor deposition, which is necessary (i) to initiate industrial manufacture of solid structural and functional materials as well as their resulting structural parts from the vapor phase, but also (ii) in order to refine the industrial manufacture of (thin) layers and (iii) surface treatment by (physical and chemical) vapor deposition. The Diaphragm* is a plant structural part which brakes a vapor suction flow driven by an external pump system (cf. CVD process) physically by reservoir formation and thereby makes it possible to achieve new, purely physical forms of control. It has the function of a diaphragm for controlling condensation in suction flow-driven vapor deposition processes, with the proviso that the appropriate gases or vapors experience a (stepped) lowering of the microscopic (that is to say, directly at the outlet of the flow ducts) and macroscopic static pressure (that is to say, the pressure in the vapor and/or deposition chambers separated by this diaphragm) at the interface between the separated chambers.

The Diaphragm* claimed in F. Hehmann, EP-Application 94111991.9, Aug. 1, 1994, and PCT Application PCT/EP95/02882 of Jul. 19, 1995 relates not only to a completely new diaphragm family (pure porous and tubular diaphragm asymetric in x-translation (that is to say, the surface perpendicular and/or the shortest transdiaphragm distance and having a selectivity $S_k$=1 or near to 1), but to a new diaphragm species as such. All diaphragm families have hitherto been used for the separation (dissociation) of components (i.e. $S_k$ unequal to 1), but then a diaphragm was claimed here which has exactly the opposite purpose: namely, (i) the synthesis of ultrahighly (chemically and also physically) homogeneous alloys and mixtures and (ii) the deposition of ultrahigh-purity materials with maximum homogeneity of grain and phase distribution, purity being brought about by the associated distillation effect during the evaporation operation. Since no chemical separating operations take place in the gas or vapor phase, a different division of the (mono)atomic vapor mass from that of a vapor deposition process without the Diaphragm* occurs. However, herein lies the key to industrial synthesis in the vapor phase. The basic requirement placed on this Diaphragm* is to control sharp overall pressure and temperature gradients over its cross section by component-unspecific mass filtration, that is to say without material separation being carried out, unless expressly identified. Conventional material (and heat transmission) coefficients therefore play no (or only a subordinate) part in characterizing this new diaphragm species.

Since no chemical separating operations occur during transdiaphragm material conveyance, also no conventional osmosis, that is to say chemical potential gradients, can exert a controlling effect on material conveyance. It therefore goes without saying that the conveying operations are governed only by the variables, (under) pressure and temperature, and by a flow force which is imparted to the chamber system of the process as a whole from outside (that is to say, outside the conveying distance between tha vapor source and vapor deposition) and which maintains and controls the underpressure system. "Osmotic pressure" transferred to the new vapor deposition process therefore occurs only in the case of a negative temperature gradient, toward which the vapor flow or gas flow must flow and for which the external pump system procides the propulsion force under the structural conditions of the Diaphragm* solutions. Since the suction flow conveying capacity Q for a given pumping speed S is controlled by the Diaphragm*, thermal convection is subordinatyed to forced mechanical convection as a control variable and is used merely for fine adjustment in the interdiaphragm chamber region. One of the possible means for implementing the process is the bifurcations (cf. the Second part of the invention) which are fitted in front of (screen mode) or in (depth filter mode) the Diaphragm* and which branch off controlled part flows from the evacuation flow in a turbulence- and/or condensation-minimizing, hence mainenance-friendly way and, return them into the original cham ber for the purpose of reservoir formation. In this case, retentivity is expressed by the force of the Diaphragm*, said force being distinguished from the frictional force of a flow resistance which does not allow and/or control any high transdiaphragm state gradients without condensation.

In contrast to this, Sh. Tanaka, Japanese Patent JPA 02,125866, May 14, 1990, claims a throtttle system, namely a type of flow resistance, which is to assist assist in controlling a pressure flow which equalizes the density of the vapor trajectories and which is generated by the relatively high saturation vapor pressures of the relatively highly volatile metals Mg and Zn. The specific advantage of the Japanese patent consequently remains restricted to a plant structural part without great diversification depth and therefore to the vapor deposition of alloy systems of the Mg—Zn (and also Mg—Li) type which, for example, play or will play no primary part in corrosion-resistant Mg alloys. Since the vapor pressure curve of Mg and Zn (or Li) are relatively similar, no plant structural parts of fundamentally differing function are required for controlling the resulting elementary pressure vapors. The Japanese patent therefore also permits no process control by the utilization of a productivity and quality increasing vapor suction flow which becomes necessary particularly when components having widely differing and/or low vapor pressures are to be evaporated and deposited. A further disadvanatge of the Japanese patent is that conventional flow resistances of whatever type convert directional flow into turbulences and may make it very difficult to achieve controlled vapor deposition for the manufacture of products.

It is unnecessary, at this juncture, to deal with the situation, widely discussed in the literature, where, without further control of the vapor trajectories, the (physical) vapor deposition rate decreases in thickness from the center of the deposited material toward its sides, depending on the process conditions adopted. It goes without saying that, in the suction flow-driven vapor deposition process, the Diaphragm* provides an outstanding solution for controlling this geometrical inhomogeneity problem. The depth of innovation of the Patent JP-A 02-125866 is therefore very limited. For what is forgotten in most cases is that the absolute thickness $t_R$ of the deposited material decreases with an increasing distance $s_{DR}$ from the vapor source. This connection follows the relation (cf. D. S. Rickerby and A. Matthews, *Advanced Surface Coatings—A Handbook of Surface Engineerings,* Blackie & Son Ltd, Glasgow G64 2NZ, 1991):

$$t_R = k(s_{DR})^{-n}$$

in which the coefficient k is determinded primarily by the evaporation rate of the material or materials involved and the exponent n is determined by the remaining conditions of the vapor deposition process. Any form of controlled, hence serious "upscalings" of the (industrial) production of materials from the vapor phase therefore cannot avoid causing the coefficient n to tend as far as possible toward zero or (for k values<1) toward negative values and k (for n=0) to become as high as possible. Thus, as the result of a temperature rise from 2200 to 2400 K, a rise in the deposition rate of yttrium by the factor 5.5 was observed, but, at a constant temperature of, for example 2400 K, the maximum deposition rate at the geometrical deposition center in the case of a distance of 50 cm from the vapor source was not even 10% more than that in the case of a distance of 10 cm (see R. Nimmagadda and R. F. Bunshah, *J. Vac. Sci. Technology* 8 (6), 1971, pp. VM86–VM94). If only because of the long distances which the Diaphragm* allows for vapor conveyance, a control of the form of the deposited blank becomes possible, not just by controlling the vapor trajectories directly before deposition (cf. F. Hehmann, EP Application 94111991.9, Aug. 1, 1994, and PCT Application PCT/EP95/02882 of Jul. 19, 1995).

The comparison of EP Application 94111991.9 with conventional CVD practise (cf. D. S. Rickerby and A. Matthews, *Advanced Surface Coatings—A Handbook of Surface Engineerings,* Blackie & Son Ltd, Glasgow G64 2NZ, 1991) is also pertinent: in the EP application, the Diaphragm* is the control medium (structural part) and the suction flow imparts the propulsion force (productivity) for the process, whilst, in conventional CVD and CVR practise, the composition of the reactands is the means for controlling the process, whereas the specific productivity of the CVD process is determined by the diffusion operations in the immediate vicinity of the reaction surface of the boundary layer or by the reaction operations on the respective surface and by its dimensions. In light of this comparison, the productivity claimed by EP Application 94111991.9, that is to say increased a result of the interaction of the suction flow with a porous diaphragm (Diaphragm*), brings about, particularly for a PVD process, an increase in the vapor conveying capacity over unlimited distances and, to that extent, allows a productivity increase in the deposition of the (mechanically) conveyed vapor which, in comparison with the conventional PVD processes, is dominated by (mechanically) directed vapor trajectories, but still does not provide any productivity increase in the specific evaporation conditions themselves.

The Diaphragm* is therefore dedicated to a new philosophy of controlled material conveyance. As a plant structural part, it is distinguished from all previous separating diaphragms, including porous and diffusion diaphragms, but also from the conventional flow resistance. It is associated with a suction flow, since material conveyance must remain undisturbed not only by chemical (that is to say, component) separating operations, but also by physical separating operations, such as in the case of a variation in the physical state (that is to say, condensation, sublimation) before controlled vapor deposition at the deposition level which consists of at least one deposition chamber and/or substrate.

Since, with magnesium, on account of its high vapor pressures p*, it is so easily possible, depending on the evaporation temperature T on the condensed surface, to produce large conveying quantities $q_v$ from the resulting vapor phase and deposit solid parts, it is actually not surprising that the vapor deposition of magnesium and its alloys con-stitutes a potential starting point for a new direction of development in the processing metal, semiconductor and semimetal industry and in the further-processing ceramic industry. On the contrary, the fact that magnesium "lags behind" as a competitive material and experience accumulated in rapid solidification with Mg alloys must rather be seen as proof (of this starting point) (cf. F. Hehmann, EP Application 94111991.9, Aug. 1, 1994, and PCT Application PCT/EP95/02882 of Jul. 19, 1995; F. Hehmann and H. Jones, *Rapid Solidification of Magnesium Alloys: Recent Developments and Future Avenues,* in 'Rapid Solidification Technology', eds. T. S. Sudarshan and T. S. Srivatsan, Technomic Publishing Co., Inc., Lancaster, Basle, 1993, pp. 441–487; G. Neite, K. Kubota, K. Higashi and F. Hehmann, Mg-Based Alloys, in "*Structure and Properties of Nonferrous Alloys*", ed. K. H. Matucha, Vol. 8 of Encyclopedia "Materials Science and Technology", eds. R. W. Cahn, P. Haasen and E. J. Krämer, VCH Weinheim, P.O. Box 10 11 61, D-6940 Weinheim, RFA, to be published in 1995.

Now, in relation to F. Hehmann, EP Application 94111991.9, Aug. 1, 1994, and PCT Application PCT/EP95/02882 of Jul. 19, 1995, further configurations, options and details of a controlled vapor deposition with the Diaphragm* as the main structural part for appropriate "upscaling" are developed and claimed and form the plant modules of a future vapor deposition factory with production conditions adaptable to the respective product requirements. With the increasing diversity of couplable plant modules, the diversity of the corresponding production lines, products and production possibilities increases.

SUMMARY OF THE INVENTION

The invention pertains to a process of diaphragm-controlled physical and chemical vapor conveyance and separation including distillation. The process is universally applicable for deposition or reaction or separation or distillation by using a vapor or gas as an intermediary phase. Condenser and diaphragm technology is applied under a controlled static and flow pressure on either side of the diaphragm, said pressure control being assisted, if required, by temperature control of devices to maintain a stationary operation. Deviations from stationary conditons are regulated. A pump system and additional devices are installed to trap losses of yield and to maintain a continuous operation. The expanded diaphragm technique is also used for flows driven locally by the vapor pressure of elements or mixed substances employed. Novel diaphragm functions and novel process configurations and operational levels allow to control the state of an uncondensed intermediary phase for improved quality, yield and productivity of said processes.

The process enables for novel large-scale operations including the manufacture of so-called "supermaterials". The process achieves its advantages not (only) by extending the operative temperature and pressure range of the process, but primarily by convection imparted to the process including a type of mechanical osmosis. In the process, minimizing the global (that is to say, interdiaphragm and transdiaphragm) loss figure $\zeta$ and the resulting frictional forces $F_F$ and maximizing the product quality and the yield of the conveying suction flow controlled by a porous diaphragm and driven by a vacuum chamber system assume central importance. A condenser system adapted to the specific process conditions is an integral part of the invention. Said condenser system is characterized by a lateral speed, constant (continuous and discontinuous) over the entire vapor deposition surface and varying in a controlled manner, for constant, approximately constant, but at least controlled surface states (T, c, porosity and roughness as a result of the control of the distance h between the porous diaphragm and deposition surface and the resulting control of the thermal accomodation coefficient $\alpha_T$). In the case of non-separation pulse transfer (including the use of an inert gas component), an external cyclone and/or an external vapor separator and/or gas scrubbers can optionally be used in addition to the external pump system following passage through the vapor separation chamber. When a carrier gas is used, the gas is recycled into the gas supply system and reused.

BRIEF DESCRIPTION OF THE DRAWINGS

The nature, advantages and various additional features of the invention will appear more fully upon consideration of the illustrative embodiments to be described further below in connection with the accompanying drawings wherein:

FIGS. 8a–c Architectural freedoms for combining the evaporation and/or mixing and/or deposition chambers of a vapor deposition process being controlled by a diaphragm.

FIGS. 12a–c Vapor deposition and separation proces involving deposition level with intermediate chamber being separated from the lower part of the vacuum chamber by a separating segment to prevent the outflow of fine nondeposited vapor dusts into a chamber in which the blank is compacted and and showing also fan/pump system and vacuum pump set, vapor separator, filter, cyclone, gas purifier (gas scrubber), various valves, powder containers and flame trap.

FIG. 13a Compact designs for a Diaphragm* controlled vapor deposition process involving (top) Collani-like pear-shaped and trapezoidal chambers for evaporation and evaporator tower and flow elements for the reduction of flow vortices, and (bottom) a top view of the evaporator tower with outer shaft and inner shaft e.g. to supply melt via a tube system.

FIGS. 14a–g Diaphragm* controlled vapor deposition process with circular process showing a)–d) side view of the transition from the evaporation and/or mixing region into the deposition level via at least two vapor outlets and deposition chambers in the deposition level for a continuous batch mode with in-series deposition and consolidation chambers and vapor shaft, as seen from the deposition level, and g) deposition level, as seen from the mixing chamber,with at least two oppositely arranged separate deposition chambers being located at the mixing chamber outlet and connected to a central cooling system.

FIG. 16 Principle of the "melt-overflow" process to explain propulsion force for the productivity of the vapor deposition process controlled by a Diaphragm*.

FIG. 18 Loss figures due to friction in the nonbent flow duct, $\lambda$, with (top) homogeneous and (bottom) heterogeneous surface roughness $\Delta$ as a function of the Re number.

FIG. 22-1 Development of the transdiaphragm speed profile of a free flow jet as a result of a pressure drop in a diffuser.

FIG. 24a–g Arbitrary cross-sectional forms/geometries of the heat exchangers and heat exchanger grids for Diaphragms*.

FIG. 26 Guide blades in the flow bend for Diaphragms*.

FIG. 30 Flattened diffusers with outer walls nonsymmetric (to the diffuser axis), following a centrifugal ventilator with a constant (out) flow duct width $b_0$ of arbitrary dimensions.

FIG. 36 As FIG. 35, here with a Laval nozzle inlet and outlet and two different length ratios between the transdiaphragm flow duct (here with $\delta=0°$) and Laval nozzles, ie. $l_{wid}/l_{nar}$.

FIG. 38c Porous diaphragm with symmetrically arranged flow ducts according to FIG. 38a.

FIG. 39/continued e) f Here, a transition from a round to an angular outer cone (including an vase-shaped volume) through which the transdiaphragm flow duct passes.

FIG. 40 Flow duct cross section geometries with Lemniscate and Cassini curves in g4).

FIG. 40/first continuation of g4), here cross sections and segments according to mathematical functions.

FIG. 40/second continuation of g4), here relating to the arbitrariness of flow duct cross section geometries.

FIGS. 41d,e,f Forms of movement of the transdiaphragm flow ducts in the flow cone.

FIG. 44-1 Possibilities for manipulating the fluidic loss figure $\zeta$ of a noncondensing gas jet in front of an unmoved surface.

FIG. 45 Diagrammatic Diaphragm* for deriving the state equation for the transdiaphragm branching-off of a part flow quantity via bifurcations.

FIG. 49 Loss figures $\zeta_{wid}$ and $\zeta_F$ for a), b) conical and c), d) rectangular diffusers and for e), f), g), h) flattened diffusers.

FIG. 55 Nozzle and backflow duct variations for combination with bifurcations used in the vapor deposition process with a) Laval nozzle, b) ultrasonic nozzle, c), d) preferred bifurcation type and e) to i) front views of the inflow sides.

FIG. 56 Effect of the rounding of a flow duct edge on the development of flow vortices (turbulences) for $\delta_1=\delta_2$, $Re_1=Re_2$, $d_0(1)=d_0(2)$, $v_1=v_2$.

FIG. 57 Combination of three diffusers with two a) ultrasonic and b) Laval nozzles as transdiaphragm flow duct variants.

FIG. 60 Alternative "external" bifurcation.

FIG. 61 External Laval nozzle a) with interception device and excess heating for bifurcation-induced condensation products on a Diaphragm* and b) external Laval nozzles with following "internal", i.e. transdiaphragm bifurcations.

FIG. 74 Concentric and right angled bends for $\delta=90°$ and a) $0.5<R_0/D_H\leq1.5$, b) $R_0/D_H>1.5$ and c) $R_0/D_H\gg1.5$ FIG. 74/continued, abrupt bend ($r/D_H=0$) with a reduction or enlargement of the flow cross section, e) as d), but without a variation in cross section, but with a round wall or recess, f) rounded bend of rectangular cross section with a reduced or enlarged flow exit cross section, and g) as f), but without a variation in cross section, but with a round wall.

FIG. 75 90° Bend with a) rounded inner and a tapering outer wall and rectangular flow cross section and b) as a), but the inner wall in strip design.

FIGS. 75c–j Bend in the strip design at various mounting/butting angles, as indicated and with a varying number of intermediate pieces having $n_{ST}=1$ to 3.

FIGS. 75k–n Bend with k) kink on the inner wall, l) wavy parallel wall and m) as l), but a corresponding double bend with an intermediate piece of length $1_0$ and n) as l), but without intermediate piece.

FIG. 77a,b,c Diagrams of controlled arrangements of transdiaphragm flow bends in the Diaphragm* and resulting angle scenarios. FIG. 77/continued d) Flow duct with angles $\delta_1=\delta_2$, e) asymmetric trans-diaphragm flow duct, f) asymmetric central and bifurcation ducts and g) Diaphragm* for $\delta_1=\beta_{D,1}=90°$.

FIG. 78 With a)–c) small $\beta_D$-angles with relatively long bifurcation backflow ducts and/or very small $d_B$-diameters, d) to f) diagrammatically transdiaphragm flow ducts with bifurcations result from $\gamma<180°$ and reduced angle sums/$\Sigma</$.

FIG. 80 Flow spectrum in Π-bend with a) $l_0/d_K$=approx. 0, b) $l_0/d_K=4.5$ and c) $l_0/d_K=1$ where $l_0$=intermediate piece of the two associated individual bends of diameter $d_K$.

FIG. 81 Z-bend with flow spectrum (top), $l'_0/d_K=1.5$ (middle), both variants with $\delta=90°$, ie. $\delta_1=\delta_2=90°$ and with (bottom) $\delta_1=\delta_2=30°$.

FIG. 84 As FIG. 83, but in ∫-shape with a) in one and b) in two flow planes, here $\delta_1=\delta_2=90°$ and $\delta(2)=90°$ after passage through the intermediate piece of length $l_0$.

FIG. 88 S-Bend in a) strip design with $R_0/D_H=1$ and without intermediate piece and b), c) wavy overall walls, all the walls being parallel.

FIG. 89 As FIG. 88, but in two flow planes.

FIG. 90 U-Bend in sinusoidal periodicity, as FIG. 85, but in a design according to FIGS. 88 and 89.

FIG. 4a).

FIG. 77b and e).

Figure 1:
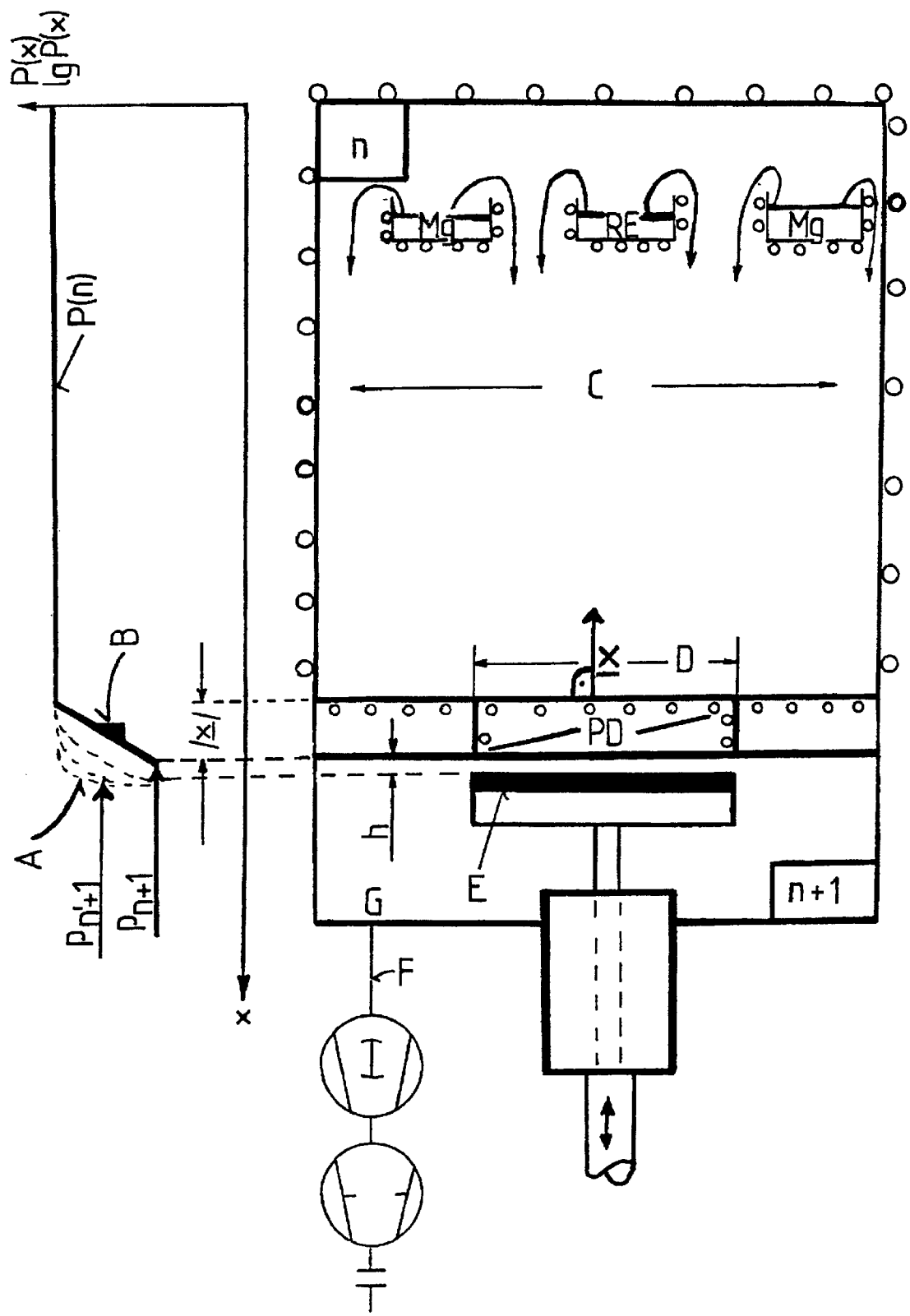
FIG. 1 Process principle $Q(x) \approx S_{req}$ of industrial vapor deposition with diaphragm-controlled (macroscopic) conveying capacity $Q(x)$.

DETAILED DESCRIPTION
First Part: Process Principles and Process Alternatives: Broadening I of the Claims cf. EP Applications 94111991.9
1. Process Principle $Q(x) \approx S_{req}$ FIG. 1 is taken as a basis for extending the process principle $Q(x) \approx s_{req}$ of industrial vapor deposition with diaphragm-controlled (macroscopic) conveying capacity $Q(x)$, where eg. $\underline{x}$ being the perpendicular to the surface of the Diaphragm* inflow side and $/\underline{x}/$ eg. the shortest Diaphragm* cross section (here of width "D"). A given conveying capacity $Q(x)=q(x)*\Delta P=kT(dN/dt)$ (labelled with "C") (with derivative: $(dQ(x)/dx)=q(x)(\delta \Delta P/\delta x)+\Delta P(\delta q(x)/\delta x))$ and deposition capacity $Q(A)=Q(x) * \alpha_A * \alpha_T$ (see "E") is proportional to the pumping speed $S=S_{req}$ [m³/sec] (see "F") at the inlet of the vacuum pump station in the deposition chamber (eg. n+1). Q is eg. in [(m³/sec)*Pa]. Further notations: "A": local pressure gradients in the flow duct (and flight distance "h" before deposition) at $P_{n'+1}$: the actual pressure on the deposition surface at the moment of deposition. "B": macroscopic pressure gradient $dP/dx$. "G": possible loss of material $Q(B)=Q(x)*(1-\alpha_A)*(1-\alpha_T)$.

The suction flow-driven vapor deposition process is characterized by the conveying capacity $Q(x)$ controlled by a porous diaphragm Diaphragm* (PD), $Q(x)$ being either the volumetric or the mass flow conveying capacity, i.e. $Q_v(x)$ or $Q_m(x)$, according to:

$$Q_v(x)=q_v(x)*\Delta P=(q_m(x)/\rho)*\Delta P (in [m^3*Pa/sec]) \quad (2)$$

and $$Q_m(x)\rho*q_v(x)*\Delta P=q_m(x)*\Delta P (in [kg*Pa/sec]) \quad (3)$$

$q_v(x)$ and $q_m(x)$ being the respective (volumetric and mass) conveying flows and $\Delta P$ being the pressure gradient, specifically, here, first the global pressure gradient between the vapor source at any point in (one of the evaporation chambers) of the evaporation level, here n, and the surface of the blank (in the case of an evaporation time t=0 of the substrate) during vapor deposition, and $S_{req}$ being the necessary pumping speed at the pump inlet for generating the vacuum $P_{n+1}$ in the vapor deposition level (or chamber) n+1. EP-Application 94111991.9, Aug. 1, 1994, and PCT Application PCT/EP95/02882 of Jul. 19, 1995 developed the need for a communicating chamber system which is subject to Boyle's laws. For a given pressure p and for a given temperature T in the evaporation chamber n, i.e. for p(n)= const. and for T(n)=const., the conveying capacity $Q(x)$ rises with a falling pressure p at the deposition level, in the simplest case at (n+1), i.e. p(n+1), and thus with a pressure gradient $\Delta P_t=dp/dx$, i.e.

$$(\delta/\delta x)Q(x) = (\delta/\delta x)*(q(x)*\Delta P_t) \quad (4)$$

$$= q(x)*\delta \Delta P_t/\delta x + \Delta P_t*\delta q(x)/\delta x \quad (5)$$

The vacuum of the vapor deposition chamber, which, for a given design, depends on the pumping speed of the corresponding given pump system, therefore forms the propulsion force for the process as a whole. In its most general form, i.e. for a pump station not identified in any more detail (i.e. irrespective of the types of vacuum pump used, their overall size, their modular principle (e.g. in parallel and/or in series), operating ranges or e.g. NPSHA characteristic value etc., the vacuum (or underpressure) actually established in the vapor deposition chamber is dependent on the pump speed S at the pump inlet, here according to $$P_{n+1}=Q_p/S_{req} \quad (6),$$

with $S_{req}$=the pumping speed necessary for obtaining $P_{n+1}$ and $Q_p$=pumping capacity (similar to $Q(x)$), that is to say it is unimportant here how Qp comes about. In view of the conditions $$\Delta P\uparrow \approx (P_n-P_{n+1})\uparrow \approx \Delta P_t \uparrow \approx P_{n+1}\downarrow \approx S_{req}\uparrow \quad (7)$$

$Q(x)$ (cf. above) is directly proportional to $S_{req}$, i.e. $Q(x) \approx S_{req}$. Consequently, for S=const. (in case of constant porous diaphragm conditions), also $\Delta P$=const. and $Q(x)=fn(q(x))$, i.e. the term on the left in equation (5), which is a function of the properties of the pump station, drops out for S=const. The effective conveying capacity Q(x) is then only a function of the term on the right in equation (4), that is to say for a given value S, Q(x) is a function of the PD design only. In other words: the Diaphragm* "uncouples" Q(x) from S (or $S_{req}$) (cf. EP-Application 94111991.9, Aug. 1, 1994, and PCT Application PCT/EP95/02882 of Jul. 19, 1995).

2. Uncoupling Conditions I for Q(x) and S: Transdiaphragm Conveying Flow

The first two overriding technical functions and preconditions which the PD fulfills for the uncoupling of Q(x) and S are (cf. EP-Application 94111991.9, Aug. 1, 1994, and PCT Application PCT/EP95/02882 of Jul. 19, 1995):

1. reservoir formation before transdiaphragm material conveyance, i.e. before flow inlet into the PD, and
2. suppression of turbulent flow (vortices, (macroscopic) turbulences of the order of magnitude of the flow ducts, vortex streets etc.) after transdiaphragm material conveyance by transdiaphragm and hyperdiaphragm pulse control, specifically, in particular, directly before vapor deposition, i.e. after flow outlet from the last PD before the vapor deposition level.

Both technical functions are an integral part of the PD force, yet to be defined in more detail, i.e. $F_D$ (see the second part of the invention), said force representing the functional difference between a porous diaphragm Diaphragm* and the frictional force of the conventional flow resistance, $F_F$, in the abovementioned process. Consequently, for the most efficient possible design of a plant, of which Q(x)=fn(S) is controlled by more than one PD (cf. FIG. 2) it is neceassary, where appropriate, to have two PD types which are basically different in terms of the individual PD modules 1.1–1.5 and 2.1 used (cf. next section and the Second part of the invention).

Figure 2:
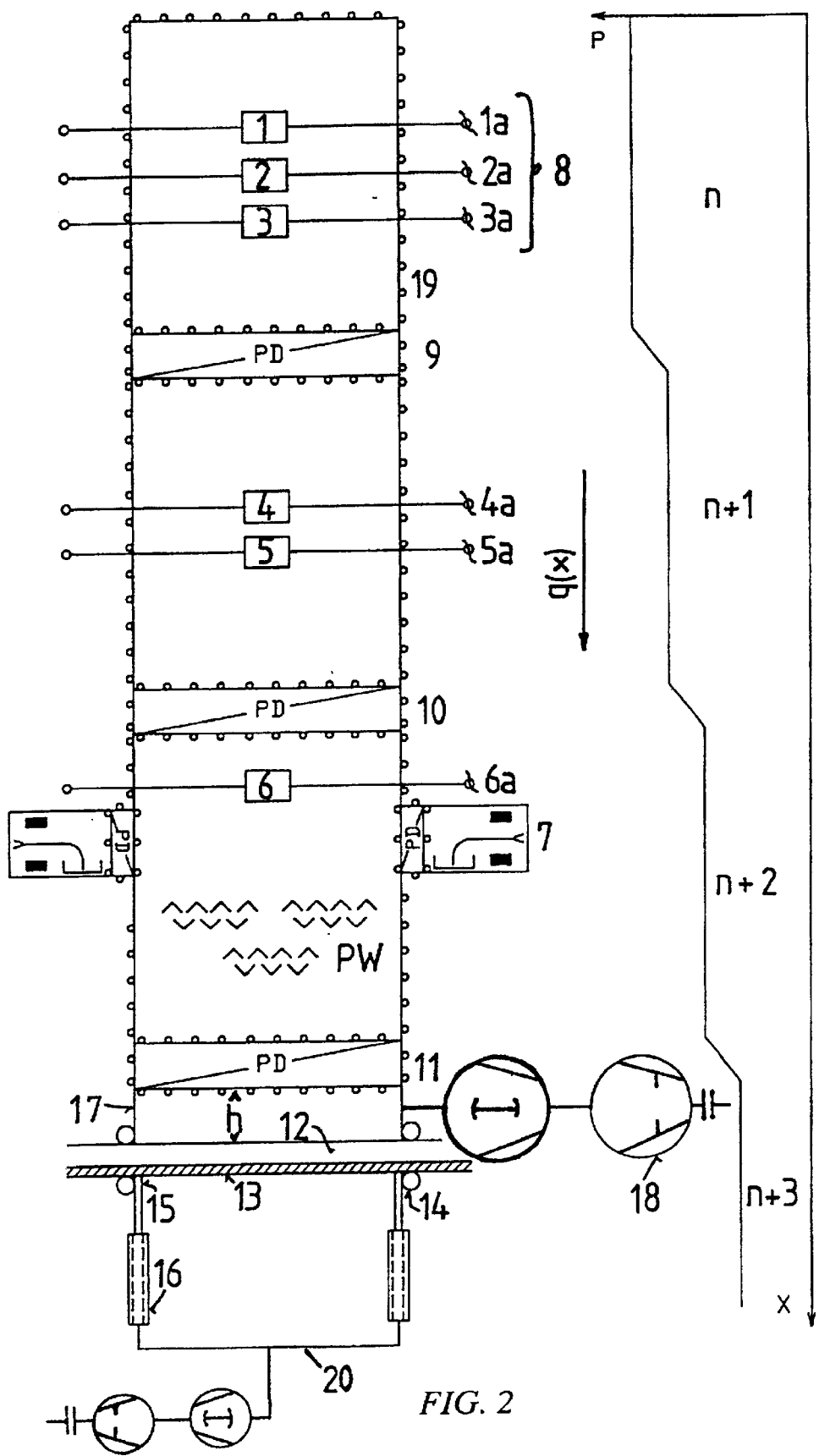
FIG. 2 Vapor deposition process controlled by a diaphragm Diaphragm* (PD) with 3 evaporation chambers mounted in series followed by a vapor deposition chamber with a movable substrate and (micro) rollers (22) and hammer and pressure rams (23) to work the deposit.

FIG. 2 shows a diagram of a vapor deposition process according to EP Application 94111991.9 which is driven by the vacuum generated by suction flow and is controlled by a porous diaphragm Diaphragm* (PD) and which is functionally independent of the gravitational acceleration vector g, here with 3 conventional evaporation chambers (or levels, eg. 19) n, n+1, n+2 mounted in series, which, if appropriate, are to be opened to the side and/or can be drawn off separately as a hood, here the chamber n+2 being equipped with heated baffle walls (21) for the intermixing of the alloy components, and followed by a vapor deposition chamber n+3 with a movable substrate (13) shaped into an elongate plate or band and cooled by a liquid, a so-called (if appropriate, reciprocal) "plank condenser", a part of which being directly exposed to the vapor deposition controlled by a PD, whilst (micro) rollers (22) and (if appropriate, pneumatically moved) hammer and pressure rams (23) compressed the other part of the evaporated-on material outside the vapor deposition region (cf. FIG. 9a), and which is in contact with a pump system (18) which ensures a constant vacuum in the deposition chamber independently of the conveying flow. The reciprocal "plank" condenser is guided back, by means of its guide rollers (14) and pneumatically moved partitions (15), controlling the outlet slit, between the vapor deposition and the compression region via pneumatically movable displacement tubes guided through a corresponding hollow tube (16), at a rate such that the blank (12) grows by evaporation and/or deposition, the growth rate of the blank being monitored by a microsensor/microprocessor system, in order to keep constant and control by a partition (17) the altitude of the deposition level and the distance h between deposition level and the Diaphragm* controlling the vapor deposition, and, if appropriate, varied by means of a displacement wall controlled by a microsensor/ microprocessor system and located i a flat hollow wall (25) (FIG. 9b). It will be noted that a conventional flow resistance or flow throttles, for examples corresponding to the rock in rapids are not (suitable) means for producing the equidistant pressure profile, shown on the right, of this vapor deposition process, (without condensation). The resulting and preferred arrangement of the (alloying) elements is, for example, Mg and alkaline-earth elements in chamber "n", here in crucibles (1)(3), aluminum and rare earths (RE) in chamber n+1 (in crucibles (4) to (5)), and transitional elements and specific metalloids, such as Si and B and also Be, in chamber n+2 (here, in crucible (6) as well as the corresponding junction terminals and/or separate side chambers (7) with eg. an electron-beam system and/or plasma-evaporated components, the latter melted and/or evaporated, eg. via an electron-beam tube, plasma, sputtering etc., and/or with resistance, ie. so that the elements are combined with a similar evaporation pressure in an evaporation chamber and are arranged, with a rising saturation vapor pressure, in evaporation chambers at a decreasing distance in the direction of vapor deposition.

to function 1) The first five basic structural part solutions for reservoir formation are (cf. EP-Application 94111991.9, Aug. 1, 1994, and PCT Application PCT/EP95/02882 of Jul. 19, 1995):

1.1 relatively low area ratios of the (integral) flow duct orifice cross sections to the integral flow resistance and face which, between these orifices, retains the global vapor flow from any other vapor shafts.

1.2 bifurcations (and corresponding bifurcation backflow ducts) which branch off part of the flow from the transdiaphragm flow duct and return it via the bifurcation backflow ducts into the respective evaporation chamber, and, in this case, the bifurcations can branch off the vapor on one side or, in each position δx (e.g. at a particular level as a pair), opposite one another and, per transdiaphragm flow duct, can have, in various positions δx, individual and/or multiple bifurcations mounted in series, each of these solutions being capable of being designed in angular and, for lower loss figures ζ, rounded form and, where appropriate, being combined with a flow duct contraction for the purpose of local pulse reinforcement.

1.3 geometrical (swirl and buildup) elements with high resistance coefficients $c_F$ before flow inlet.

1.4 flow resistances mounted in series (i.e. in a row) per transdiaphragm flow duct with definite orifice-to-resistance area ratios per transdiaphragm resistance.

1.5 heating and/or superheating of the PD, including the PD structural parts 1.1–1.4, preferably by the induction and/or resistance method, in relation to the temperature of the (elementary and/or mixed) vapor flow or vapor flows.

Structural-part solutions 1.1–1.5 are used for PDs for the separation and connection of a communicating vapor and vacuum chamber system with different physical states, the transdiaphragm material conveying capacity Q(x) of which is influenced both by Boyle's laws and by forced convection through a porous diaphragm as a result of the vacuum suction flow and include a type of mechanical osmosis, i.e. a forced convection flow toward negative (i.e. rising) T-gradients (see above). Structural part solutions 1.1–1.5 thus permit transdiaphragm state gradients which are state gradients p and T, differing per unit length x, which are preferably higher and/or orders of magnitude higher than those existing in the adjacent vapor (evaporation), mixing and/or vacuum/vapor deposition chambers. The transdiaphragm pressure gradients resulting from reservoir formation make it possible to generate a wide range of transdiaphragm flow pulses which tend themselves toward high positive transdiaphragm T-gradients and are part of the second overriding technical PD function.

2.1 Local conveying flows q°=fn (dz) for $n_0$=const. Function N° 1 (i.e. reservoir formation) implemented by 1.1 to 1.5 already ensures the control of the effective volumetric and/or mass conveying flow, $q_v(x)$ and $q_m(x)$, and the corresponding resulting conveying capacities (for a given pumping speed S and for given transdiaphragm state gradients dp/dx and dT/dx). In the simple cylindrical flow duct, the volumetric flow having laminar flow (i.e. relatively high pressures, frequent intermolecular (laminar) collisions) amounts, according to Poiseuille, to $$q_{v,lam}(x)° = \pi/128 * p/\eta *(d_z)^4/l = k_{lam}*(d_z)^4/l \quad (8)$$

with the mean flow pressure p (here)=$(p_n+P_{n+1})/2=P_n+\Delta P_t/2$, and with the (correspondingly mean) gas viscosity according to $$\eta_{gas} = f*m*N/V*c*MFP = 2F/\pi a^2 *(mkT/p)^{1/2} \quad (9)$$

which, in contrast to the viscosity of liquids, $\eta_{Liq}$, is independent of the pressure and rises with the temperature, in said equation f=0.499, c=the mean value of Maxwell's speed distribution and MFP=the mean free path length (see below), a=atom or molecule diameter and l=flow duct length. In a simple cylindrical flow duct, the volumetric conveying flow having molecular flow (i.e. relatively low pressures, frequent collisions of the atoms or molecules with the flow duct wall) is, according to Knudsen, $$q_{v,mol}(x)° = \pi/12 * c * (d_z)^3/l = k_{mol}*(d_z)^3/l \quad (10)$$

and is consequently controlled by the mean (i.e. in all 3 directions of translation) molecular speed:

$$c = (3kT/m)^{1/2} = (3RT/M)^{1/2} \quad (11)$$

(n.b. in practice, being approximately only ⅓ of this theoretical value as a result of wall collisions). If $\alpha_{mol}$ is the fraction of molecular flow and $\alpha_{lam}$ the fraction of lamellar flow, and the relation $$\alpha_{mol} + \alpha_{lam} = 1 \quad (12)$$

is true, this results, from equation (4), for S=const., dp/dx=const. and dT/dx=const., in the:

2.2 Diaphragm* conveying flow for S=const, dp/dx=const. and dT/dx=const.

$(\delta/\delta x)$ $Q(x) = \Delta P_t * \delta q(x)/\delta x = \Delta p_t * \delta[n_0 * q(x)°/\delta x]$ and for $n_0$=const. ($n_0$ being the number of transdiaphragm flow ducts) this yields the total differential:

$$(\delta/\delta x)Q(x) = \Delta P_t * n_0 * [\alpha_{lam} * k_{lam} * [(4(d_z)^3/l) * \delta d_z/\delta x - \quad (13)$$
$$((d_z)^4/l^2) * \delta l/\delta x] + (1 - \alpha_{lam}) * k_{mol} *$$
$$[(3(d_z)^2/l) * \delta d_z/\delta x - ((d_z)^3/l^2) * \delta l/\delta x]]$$

in which
$k_{lam} = (\pi^{2.5} \ a^2 p)/(256 \ f(mkT)^{1/2})$=(here) const. since dp/dx=const. and dT/dx=const. and $$k_{mol} = \pi/12(3kT/m)^{1/2}$$

i.e. a lengthening of the flow duct reduces the conveying capacity Q(x) relatively insignificantly, since, under the restrictive condition 1.1, in particular $\delta dz/\delta x$, dz allows high gradients $\delta Q(x)/\delta x$, a secondary flow with rising temperature and falling pressure, i.e., within the process as a whole, molecular flow tends to rise at a decreasing distance from the deposition level and the relative influence of a variation in the flow duct diameter, i.e. $\delta d_z/\delta x$ vs. $\delta l/\delta x$, for PDs before deposition is reduced by an order of magnitude in relation to PDs between the evaporation and/or mixing chanmbers, so that, if appropriate, relatively short flow paths are preferred in PDs before deposition.

to 2) However, what is critical for the (PD before) deposition is not the length of the (corresponding) transdiaphragm flow ducts, but the pulse control of the (mono) atomic or possibly molecule-like vapors over a distance h after exit from the last Diaphragm* as far as the deposition level, in order to prevent a significant deflection from the direction of flow directly before deposition. This deflection occurs, for example, in the form of flow vortices after (vapor) exit from a flow resistance, specifically, in particular, for laminar flow (fractions) with their relatively slow boundary layer flow in the transdiaphragm flow duct. Flow vortices between the flow outlet and deposition plane prevent the undisturbed deposition of the vapor flow and lead to (directional) pulse loss and deflection of the vapors into the chamber (interior) and, where appropriate, into the pump system.

A second necessary precondition for the uncoupling of Q(x) and S is, therefore, pulse control over the flow exit, and this in turn presupposes transdiaphragm pulse control. Presupposing reservoir formation (see above), transdiaphragm pulse control is achieved, inter alia, by means of contractions of the flow duct cross section, although, constructed as a simple (e.g. ultrasonic) nozzle contractions in cross section reduce the suction effect for transdiaphragm material conveyance and therefore pulse control over the flow exit.

2.3 Suppression of turbulent flow

The PD before deposition is therefore characterized at the flow outlet by (cf. EP-Application 94111991.9, Aug. 1, 1994, and PCT Application PCT/EP95/02882 of Jul. 19, 1995:

2.1 geometrical elements with low resistance coefficients $c_F$, in order to ensure the conversion of turbulent flow into directional, i.e. nonturbulent flow (laminar at high pressures and molecular at low pressures).

2.2 combinations of continuous contractions in cross section and (a continuous transition to) continuous widenings in cross section (in the manner of a trumpet or of a Laval nozzle), the length ratios being $l_{nar}/l_{wid}$>1 and $l_{nar}l_{wid}$<1, but preferably $l_{nar}/l_{wid}$>1.

2.3 bifurcations for the (trans) diaphragm branching of a part-flow quantity and, if appropriate, for converting lamellar into molecular transdiaphragm and/or hyperdiaphragm duct flow.

The uncoupling conditions 1. and 2. already distinguish the porous diaphragm Diaphragm* (cf. EP-Application 94111991.9, Aug. 1, 1994, and PCTApplication PCT/EP95/ 02882 of Jul. 19, 1995) fundamentally from a conventional flow resistance (cf. F. Hehmann, F. W. Hugo, F. Müller and M. Raschke, German Patent Application No. P 44063334, Mar. 1, 1994, made by Leybold Durferrit GmbH, Hanau; Sh. Tanaka, Japanese Patent JPA 02,125866, May 14, 1990), in which, after the passage of the vapor through the cross section of the flow resistance, the static pressure increases at the outlet at least locally, where appropriate also macroscopically. Next to the interface with separating diaphragms (i.e. the Diaphragm* as a new species of "synthesis diaphragm" does not make separation possible, but a synthesis of components hitherto often immiscible or immiscible in the appropriate homogeneity), the difference for the flow resistance is critical for the Diaphragm* as a main control structural part for controlling large-scale vapor deposition processes. In essence, by means of the Diaphragm*-controlled process, a pressure lowering, (microscopically and/or macroscopically) hydrostatic in terms of the pump system, is brought about before the Diaphragm*, that is to say after the passage of the vapors through the interface, without a change in concentration, i.e. vacuum-generated material conveyance which, in the case of a flow resistance behind which compression of the moved fluid occurs at least locally, is neither evident nor compulsory and which therefore also does not ensure pulse control.

3. Recapitulation: three porous diaphragm forms for material synthesis

The pulse control operation, which at first seems contradictory for increasing the productivity of a vapor depositon process, by essentially passive, i.e. externally induced reservoir formation, is the basis for making (both physical and chemical) material production from the vapor phase, including vapor deposition processes, capable of being controlled in industrial and large-scale production. The Diaphragm* is a universal structural part for controlling elementary vapors and gases, chemically reacted (cf; reactands, above) and physically mixed (i.e. alloyed) gases and/or vapors with widely varying physically, chemical and kinetic properties. Thus, the vapors guided back via bifurcations of a Diaphragm* (see EP-Application 94111991.9, Aug. 1, 1994, and PCT Application PCT/EP95/02882 of Jul. 19, 1995) on the one hand, allow widely differing state conditions p and T in the adjacent chambers, without very high FF values having to be generated, and, on the other hand, permit the controlled communication of at least two separate evaporation sources or at least one evaporation chamber and one deposition chamber and the accurate control of the concentration of a blank, workpiece or near-final contour structural part or of a structural part by alloying from the vapor phase even when extremely different state conditions prevail. The bifurcations are decisive for the discharge of controlled part-flow quantities of elementary or alloyed gases and/or vapors from an evaporation chamber (with at least one evaporation source) which can be emptied via a Diaphragm* only when supply of vapor from the source is terminated (by closing the PD or the source). Under these conditions, the following states ate established $$p_n = p_{n+1} = p_{n+2} = p_{n+3} \tag{14}$$

and (after the cutoff of the energy supply to the vapor sources and chamber walls, for example in the standard induction and/or resistance mode):

$$T_n = T_{n+1} = T_{n+2} T_{n+3} \tag{15}$$

in which n, n+1, etc. are the levels which communicate with one another successively, i.e. in series, via the Diaphragms* and which each have at least one separate evaporation source and/or mixing region (baffle wall) (see FIG. 2) and, here, "n+3" is the level of the at least one deposition chamber.

In the special case of the manufacture of light metal alloy with the relatively highly volatile component, magnesium (or aluminium), as a base and with relatively low-volatile (main) alloying constituents (in the case of magnesium, virtually all appropriate elements, in the case of aluminium primarily transition metals and, in the case of a titanium-based alloy, magnesium would be the alloying constituent and the size ratios of the corresponding evaporation units would be correspondingly interchanged), the following functions, implemented in EP-Application 94111991.9, Aug. 1, 1994, and PCT Application PCT/EP95/02882 of Jul. 19, 1995, of the suction flow and as well as Diaphragms* two basic Diaphragm* designs (cf. FIG. 10) are obtained.

Figure 10:
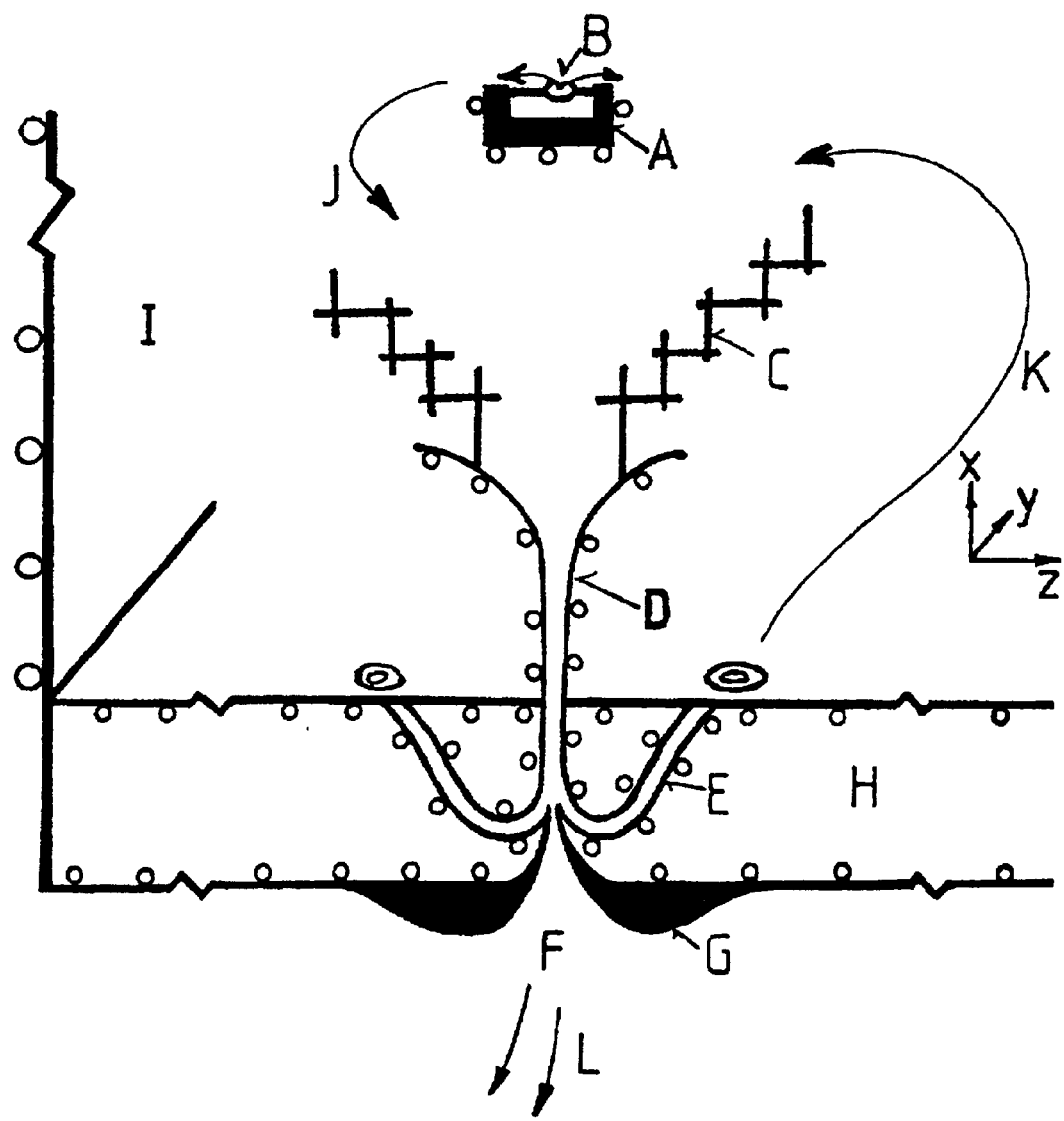
FIG. 10 Details of a Diaphragm* according to EP Application 94111991.9. showing self-organizing vapor reservoir in the conventional evaporation chamber, wthe walls of which being heated by induction and/or resistance heating.

FIG. 10 shows a detail of a porous diaphragm Diaphragm*: H (diaphragm element, cf. EP-Application 94111991.9, Aug. 1, 1994, and PCT Application PCT/EP95/02882 of Jul. 19, 1995) with A=(here inductively) heated evaporation source with orifice B at any position in conventional evaporation chamber with heated wall I, C=filigree grid for generating turbulences of the order of magnitude of the flow duct D and the Laval nozzle-like outflow F, bifurcation backflow duct E and streamline elements G for minimizing turbulences at the flow L, thus contrasting decisively with the trivial flow duct having a rectilinear and/or concentric shape. It may be noted that the length dimensions of the illustrations in the xyztranslation space are selected arbitrarily. In the operating state, the (macroscopic) evacuation flow corresponds to the conveying flow J supplied by the at least one evaporation source A, whilst the bifurcation backflow forms, via the flow K, a quasi-infinite circular flow as part of the self-organizing vapor reservoir in the conventional evaporation chamber with the wall I. o o o: symbol for induction and/or resistance heating, as in the previous figures.

3.1 Diaphragm* type 1 between evaporation levels, e.g. n and n+

1.1 Primary role of the pressure drop across the perpendicular to the cross section (i.e. in the x-translation of the surface perpendicular, cf. EP Application 94111991.9) of the Diaphragm*:

heating and expansion of the relatively volatile component or components 1.2 Primary role of the suction flow:

provision of the propulsion force for overcoming a negative temperature gradient (i.e. rise of the vapor temperature with decreasing distance from the deposition level) : the ΔP-driven suction flow must therefore guarantee the heating and expansion of the gases. This operation corresponds to reverse osmosis in the separating operations controlled via the chemical potential.

Figure 37:
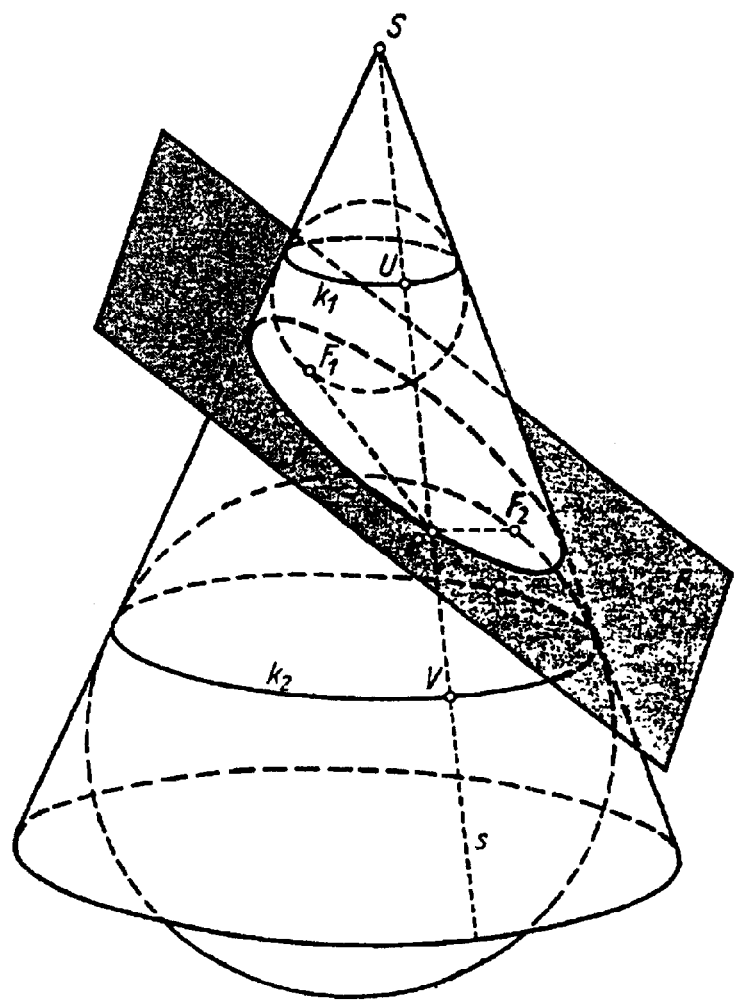
FIG. 37 Arbitrary sectional plane E in a cone, touching two spheres, inscribed in the cone and resulting ellipse within the cone for flow in a spiral passing through the cone.

1.3 Primary form of construction of the Diaphragm*/type 1:

heated flow ducts of all types, including diffusers, diffuser/nozzle transitions and bifurcations with backflow ducts (cf. FIGS. 36, 37 in EP-Application 94111991.9, Aug. 1, 1994, and PCT Application PCT/EP95/02882 of Jul. 19, 1995).

1.4 Primary function of the Diaphragm*:

formation of vapor reservoir and transdiaphragm material conveyance as a function of the speed-determining evaporation and mixing action in the evaporation and mixing chamber n+1. The Diaphragm*/type 1 varies the vapor quantity released into the chamber n+1, depending on the speed-determining process conditions prevailing there.

1.5 Secondary function of the Diaphragm*:

suppression of turbulence at the Diaphram* outlet in the evaporation level n+1.

In contrast to this, the following characteristics emerge for this:

3.2 Diaphragm* -type 2 between evaporation and deposition levels, e.g. n+1 and n+2

2.1 Primary role of the pressure drop across the perpendicular to the cross section of the Diaphragm*:

acceleration of the individual atoms leaving the chamber or (below critical fragmentation, e.g. for metastable growth, in the deposition level) of the atomic agglomerate (e.g. in the case of saturated vapors, the so-called "wet vapors"). This conventional osmosis operation, since the temperature gradient is approximately zero or positive). Conversion of uncontrolled flow (with turbulences) into controlled flow and flow tubes, transdiaphragm accleration (in the case of collective, i.e. laminar movement of the (accelerated) atoms/or molecules in the vapor or gas phase, associated with a transdiaphragm pressure drop, i.e. even before flow exit, and/or conversion into free molecular movement), e.g. by the use of transdiapgram bifurcations.

2.2 Primary role of the suction flow:

provision of the propulsion force for controlled deposition and/or, where appropriate, to overcome the force shocks, exerted (i) by the (translational or rotational) movement of a deposition surface (including depsition products formed thereon) and/or (ii) by the suction flow of the nondeposited atoms and/or components, on the atoms and/or components to be deposited and actually deposited. This aspect is taken into account particularly in the condenser and consolidation unit in the deposition chamber (see below; n.b. the protuberances in the deposition (CVD/CVR: reaction) level which are caused by shading effects (cf. T. Gaspar, L. E. Hadermann, Y. Sahai, W. A. T. Clark and J. V. Wood, Proc. *Symp. J. Mat. Res. Soc.* meeting, Boston, Mass., December 1985) in the case of solid lightweight materials must basically be leveled out by microrollers after a particular layer thickness, where, in some surface processes (e.g. "Thermal Barriers") and some functional materials (e.g. fractal silicon), they are highly desirable (see below)).

2.3 Primary structural parts of the Diaphragm*/type 2:

flow-shaping geometrical elements with $c_F$ values as low as possible at the flow outlet trumpet (i.e. Laval nozzle)-like flow outlets (i.e. diffusers with a curved longitudinal section any contractions and/or widenings of the flow duct cross section bifurcations (see above)

Figure 38A:
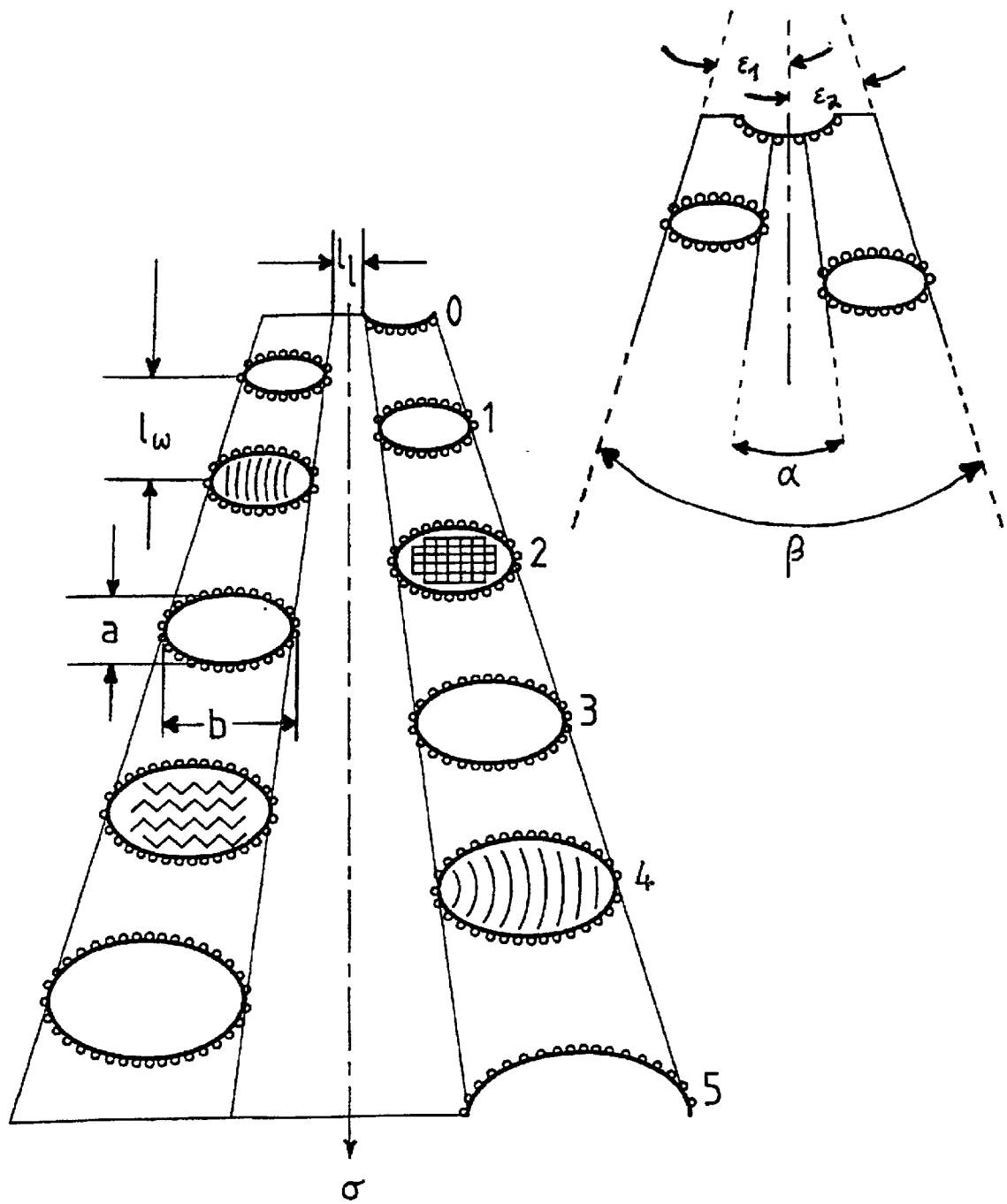
FIG. 38a Flow spiral with a worm-like propagation direction transdiaphragm and 5 full roundings of an elliptic flow duct cross section in the horizontal and, optionally, a centered flow inlet (detail at top right).
Figure 38B:
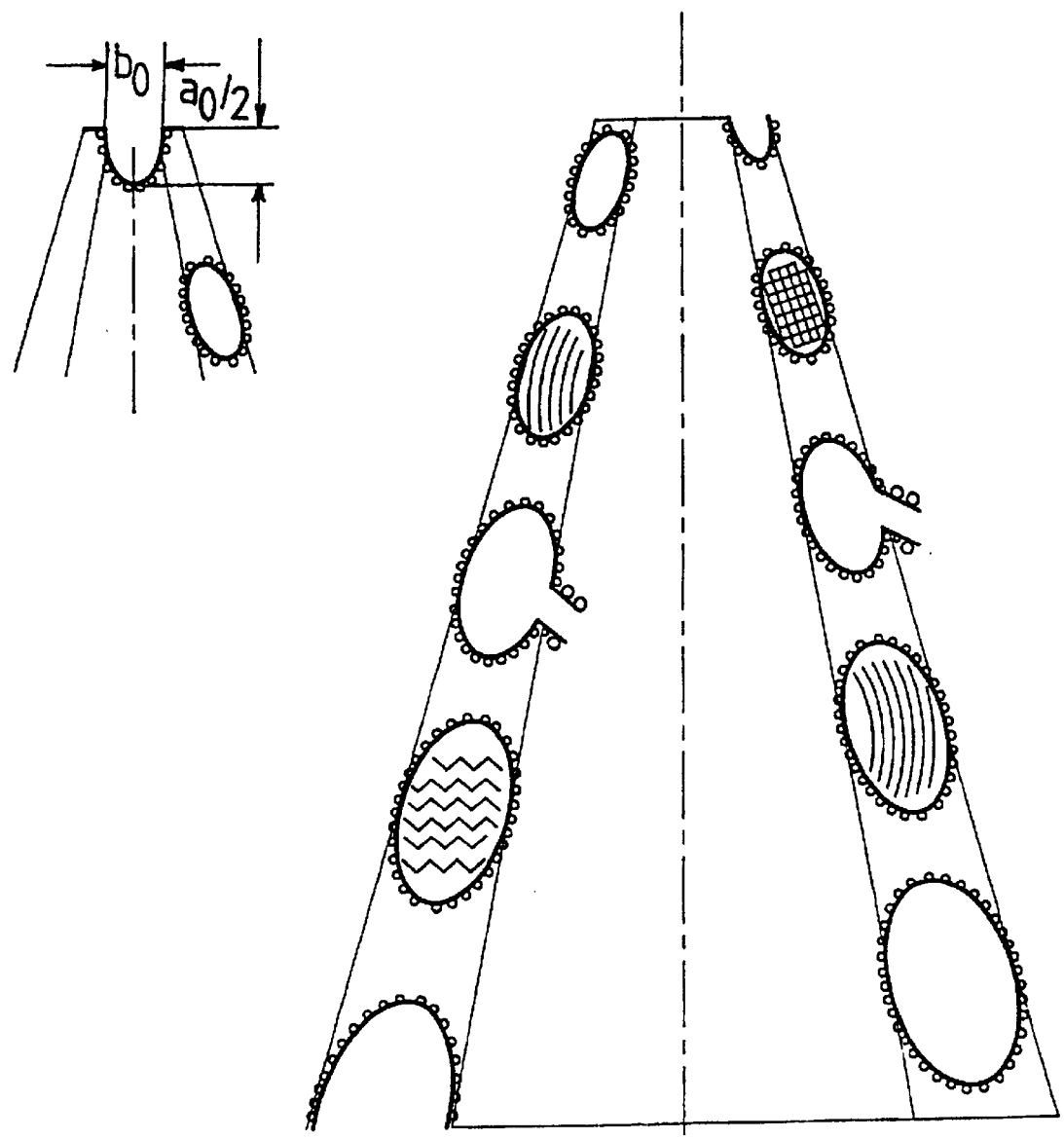
FIG. 38b As FIG. 38a, here with branches (bifurcations) for additional transdiaphragm flow ducts.
Figure 38C:
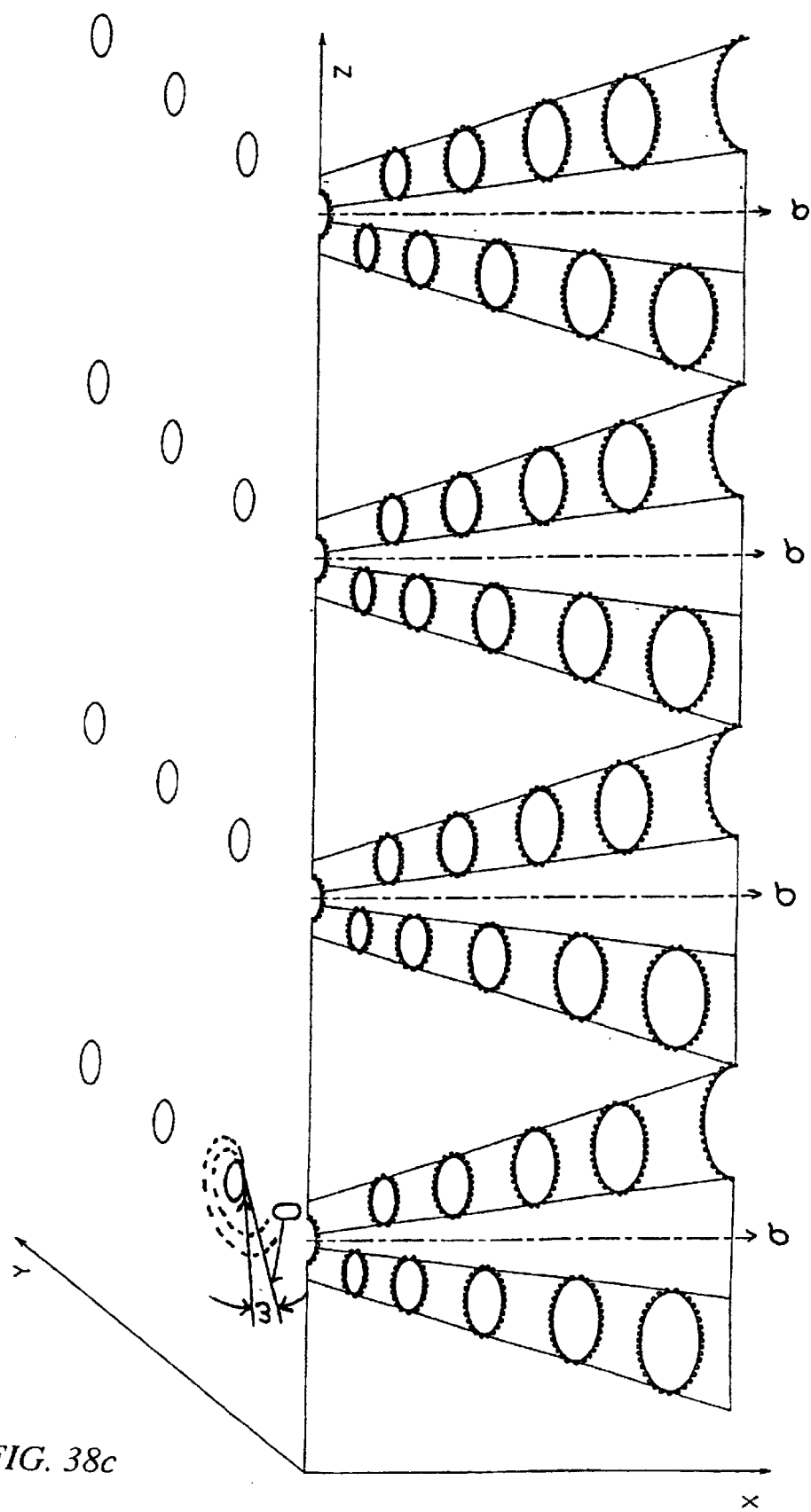
Figure 39:
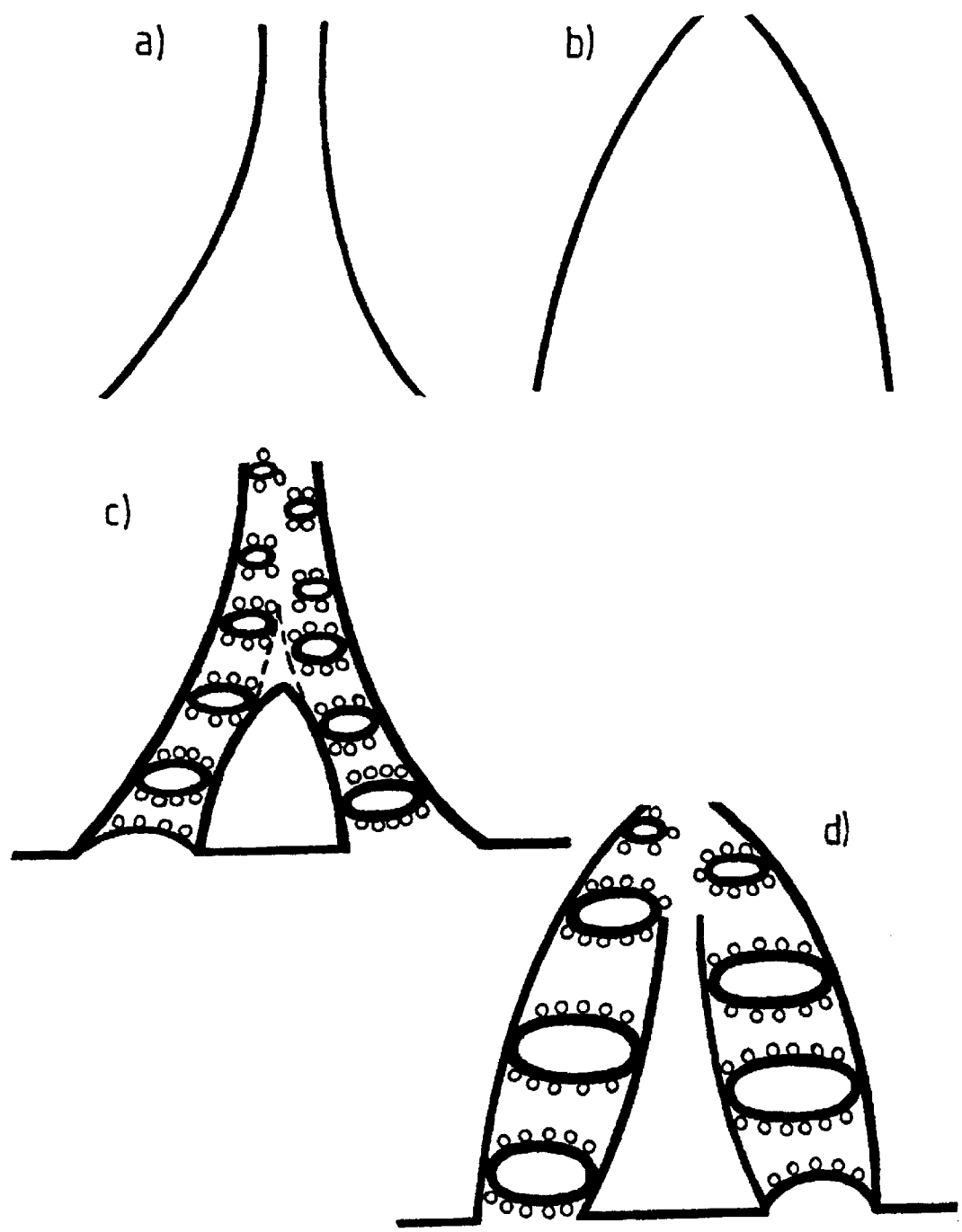
FIG. 39 Various cone widening with two of the possible resulting transdiaphragm (duct) volumes through which a flow spiral passes eg. in the form of a worm.

2.4 Primary function (of the corresponding structural parts) of the Diaphragm*:

transdiaphragm vapor acceleration transdiaphragm vapor acceleration in the case of rising, constant and falling Re-number conversion of turbulent flow (fractions) into directional (laminar and/or molecular) flow fractions (see also FIGS. 38 to 40 in EP-Application 94111991.9, Aug. 1, 1994, and PCT Application PCT/EP95/02882 of Jul. 19, 1995.

suppression and/or control of (local) condensation.

control of high-component-unspecific deposition rates.

2.5 Secondary function of the Diaphragm*:

ensuring a minimum mixing action for the uniform distribution of all the components at the plant level preceding the deposition level (e.g., in FIG. 1, the plant level is level "n") by reservoir formation and convection.

3.3 Combinations of 3.1 and 3.2

The main factors in the design of the Diaphragms* for a Pvd production process for high-performance (HL) magnesium, HL alumium, HL titanium, HL superalloys, etc. do accordingly sometimes vary widely. The major advantages of PVD technology are, for aluminium, the highest ever achieved strength (>800 MPa) and rigidity (>95 GPa) combinations in the case of ductility values of up to 10% and the highest resistance to corrosion and plastic high-temperature deformation, and the advantages of PVD technology for titanium and superalloys are, in particular, their purity and the resulting gamage tolerance. Magnesium as a potential workhorse for the industrialization of VD technology makes the invention extremely attractive.

4. PD and plant materials and material development spiral

Like the linings of the vapor reservoir of the plant as a whole, the Diaphragm* elements are also heated preferably inductively or by the resistance method (cf. FIGS. 2, 9, 10). The PD and plant materials are partially exposed to very hign temperatures ( up to 3000° C.) and, where appropiate priate, to reactive and/or corrosive and/or chemically aggressive vapors and/or gases. Material selection therefore playsw an important part. High-melting refractory metals (W, Ta, Nb, etc.), their alloys, steels, intermetallics (e.g. aluminides (FeAl)) and superalloys, either uncoated and/or as a core with ceramic layer or with ceramic as uncoated or coated core, are used. Consideration as further core and (e.g. CVD and/or PVD) laminated materials is given to oxides (e.g. MgO, ZrO, $CrO_2$, BeO, $Al_2O_3$, SiO, $TiO_2$, yttria etc.) carbides (e.g. $W_xC_y$, (e.g. WC, $W_2C$), $Ta_xC_y$, (e.g. $Ta_2C$, TaC), SiC, VC, $B_4C$, $Cr_3C_2$, TiC, ZrC, NbC, $V_2C$, $Cr_{23}C_6$, $Cr_7C_3$, $Mo_2C$, MoC, $Mn_3C$, $Fe_3C$, etc.), nitrides (e.g BN, TiN, AlN, $Si_3Ni_4$), borides (e.g. $CrB_2$, $TiB_2$, $Ni_xB_y$), silicides, Be, graphite and/or C—C (i.e. carbon) composite materials, and commercial hard materials, such as "Syalon" (90% $Si_3N_4$), sintered corundum (99.7% $Al_2O_3$), commercial tungsten carbides (96% WC+3% Co), hardened Cr steel, stainless Cr—Ni steels, nitrated Fe—Al alloys and/or other nitrated steels and/or stainless steels (see above), Teflon with steel core and/or cveramic materials with a plurality of components, such as $SiC_xN_y$, $Cu_{1-x}$-$Ta_x$ alloys, (nanocrystalline) oxides, as above, but also $SrTiO_3$, $KNbO_3$, TiCN, TiC—MgO composite materials, SiAlON and/or Cr-based and/or -containing, Nb-based and/or -containing and/or Ta-based and/or -containing, Ti-based and/or -containing, Zr-based and/or -containing and/or W-based alloys and/or corresponding intermetallic and/or alloys and/or related refractory materials are used, including, in particular, BN—, TiN— and/or $W_xC_y$ (e.g. WC, $W_2C$) and/or $Ta_xC_y$ (e.g. $Ta_2C$, TaC)-layers evaporated onto the linings and/or diaphragm parts by PVD and/or CVD methods. Also used are materials which are preferably suitable for high transdiaphragm T-gradients and high T-gradients within transdiaphragm boundary layers (e.g. between supporting material and flow duct surface). Gradient materials having at least one of the abovementioned materials are therefore used for the porous Diaphragm*. Exceptional dimensional tailorability of new materials and material structures, which can be achieved from the vapor phase, make it possible, by means of new developments for high-temperature materials, to achieve higher operating temperatures for the abovementioned vapor deposition process. This self-sustaining inherent material development spiral is not so compelling in any of the other so-called progressive material production processes (such as, for example, in mechanical alloying) and is a direct consequence of mechanical osmosis, i.e. of pump speed-dependent vapor convection brought about even in the case of negative T-gradients, as a key to an increase in productivity, specifically, in this context, as a key to appropriate variants of the process itself. Thus, the abovementioned process can be employed for the accelerated conveyance of the materials occuring by reaction in the vapor phase and of the reactands required for them (see below).

5. Uncoupling conditions II for Q(x) and S: isolated PD back surfaces before the AO (subclass of the 2nd PD class)

For a condenser system with a given, i.e. limited cooling capacity for the discharge of the heat introduced into a blank and/or substrate or substrates from (i) polytropic vapor cooling, routed with positive T-gradients in the direction of a substrate, of the (individual) vapor atoms and molecules in the state adsorbed in the deposition surface and from (ii) isothermal transition of the adsorbed and cooled vapor into the solid state, the maximum recordable deposition rate or deposition capacity Q(A)max falls, with rising heat transfer by heat radiation $\Delta H_{Radiation}$ from the backside of the last PD, before deposition on the deposition surface (AO), according to:

$$\Delta H_{condensation}(const.) = \Delta H_{Q(A)} + \Delta H_{Radiation} \quad (15)$$

$$= [\Delta H_{cool,ad} + \Delta H_{conduction}] + \Delta H_{Radiation}$$

This consideration ignores the cooling of the vapor by radiation before adsorption on the deposition surface (AO) and also a potential heat transfer from PD to the deposition surface by heat conduction and/or diffusion in a first approximation. The requirement for optimized proces efficiency and control by the uncoupling of Q(x) and Q(A) on one side and of S on the other side therefore results in the general requirement for maximized uncoupling of heat transfer by radiation from the at least one PD backside to the (at least one) AO. The condition for radiated PD radiation capacity, i.e.

$$\Delta H_{Radiation} = \epsilon_{PD}\sigma A P_{PD}(T_{PD}-T_{AO})^4 = \epsilon_{PD}\sigma A P_{PD}(\Delta T_h)^4 \quad (16)$$

where:
$\epsilon_{PD}$=emissivity=absorbency ($0_{(white)} < \epsilon < 1_{(black)}$) of the PD backside;
$\sigma$=Stefan-Boltzmann constant=$5.669*10^{-8}$ W/m²K⁴;
$A_{PD}$=total PD area (on the backside vs. AO);
$T_{PD}$=PD temperature on the backside vs. AO;
$T_{AO}$=temperature on the AO;
yields, in the first place, the 3rd overriding technical function of the PD which fulfills the general requirement for as low $\epsilon_{PD}$ and $A_{PD}$ absolute values as possible, since=$T_{PD}-T_{AO}$ is fixed by the product and process conditions. In fact, $\Delta H_{Radiation}$ is still reduced in the most efficient way by introducing an insulated and insulating, if appropriate cooled PD part surface $A_{cold}$ at the temperature $T_{cold}$ (between the unavoidable part surface of the flow outlets having a bordering tolerance surface $A_{hot}$ at $T_{hot}$), since this reduces the exponential term in equation (16) according to:

$$\Delta H_{Radiation} = \sigma^*[\epsilon_{hot} A_{hot} \Delta T_{hot}^4 + \epsilon_{cold} A_{cold} \Delta T_{cold}^4] \quad (17)$$

(see FIG. 4a), in which $A_{PD}=A_{hot}+A_{cold}$, $\Delta T_{hot}=T_{hot}-T_{AO}$ and $\Delta T_{cold}=T_{cold}-T_{AO}$, and the differential equation for low radiation PD design before deposition becomes:

$$\delta \Delta H_{Radiation}/\delta x =$$

$$\sigma^*[\delta^2 A_{hot}(\delta y \delta z)^* \Delta T_{hot}^4 \ ^*\epsilon_{hot} + \delta^2 A_{cold}(\delta y \delta z) \ ^*\Delta T_{cold}^4 \ ^*\epsilon_{cold} +$$

$$[\delta^2 \Delta T_{cold}^4/(\delta y \delta z) \ ^* \epsilon_{cold} \ ^* A_{cold} + \delta^2 \epsilon_{cold}/(\delta y \delta z) ^* A_{cold} ^* \Delta T_{cold}^4] \quad (18)$$

Figure 4A:
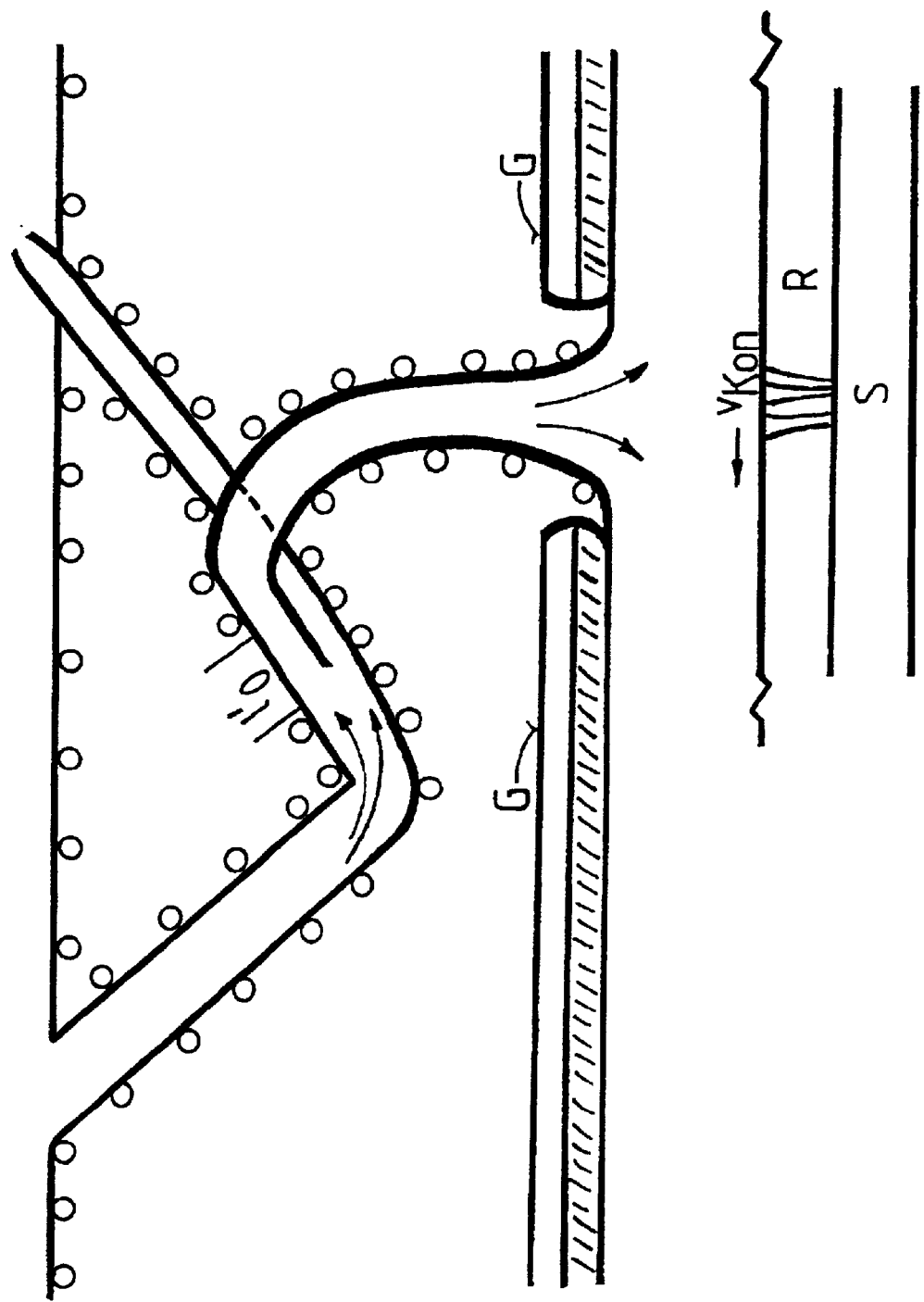
FIG. 4a Asymmetric one-sided bifurcation backflow duct with a bifurcation location in the intermediate piece $l'_0$ of a Z-bend upstream of the diffuser outlet, bordered by a gradient material layer and/or cooling on the PD backside.

FIG. 4a shows a solution to reduce the radiation capacity of the "hottest" PD before vapor deposition, here an asymmetric one-sided bifurcation backflow duct with a bifurcation location in the intermediate piece l'₀ of a Z-bend upstream of the diffuser outlet, bordered by a gradient material layer and/or cooling (hatched are a) on the PD backside (see SECOND PART of the invention).

6. Uncoupling conditions III for Q(x) and S:
The $\Delta h_{eff}(F_0)$ regime

As the fourth overriding technical function and precondition for the uncoupling of Q(x) and S,
4. allowing for the fact that reservoir formation and the transdiaphragm pulse control also depending on this are limited for a given Q(x), the vapor flow, after exiting from the PD, must also actually reach the deposition surface of the (for t=0) substrate and/or blank and/or (consolidated) workpiece and, at the same time, overcome with as little disturbance as possible distance h between the PD exit orifice and the depositon surface (cf. FIG. 1), i.e. the degree of uncoupling of Q(x) and S depends, on the one hand, on the break in volume of the transdiaphragm vapor flow which reaches the deposition surface and, on the other hand, on the degree of pulse preservation or pulse loss of the hyperdiaphragm vapor flow over the distance h.

Since the process is governed by the premise of optimizing the conveying capacity (i.e. minimizing the loss figures $\zeta$ for a given conveying and/or mass flow and consequently maximizing the conveying and/or mass flow under given process (state) conditions), the pulse force balance over the hyperdiaphragm distance h is also dependent on the diameter $d_z$ (cf. equation (13)) of the transdiaphragm (straight cylindrical, cf. above) flow duct, whilst the further control variables of the distance $h_{eff}$ (lateral speed and surface conditions) are subordinate to the pulse control of the PD, that is to say, for abovementioned processes, $h_{eff}$ must be defined as a function of $d_z$ as long as the specific PD pulse control is undefined. Under given state conditions in the evaporation chamber (e.g. n) and in the vacuum deposition chamber (level, e.g. n+1, cf. FIG. 1), the operative control variables of the transdiaphragm flow state (i.e. p, r and v as well as the resulting nature of the turbulence-free flow, i.e. laminar or molecular) depend in the simplest case on the diameter of the straight cylindrical flow duct, dz.

Figure 4B:
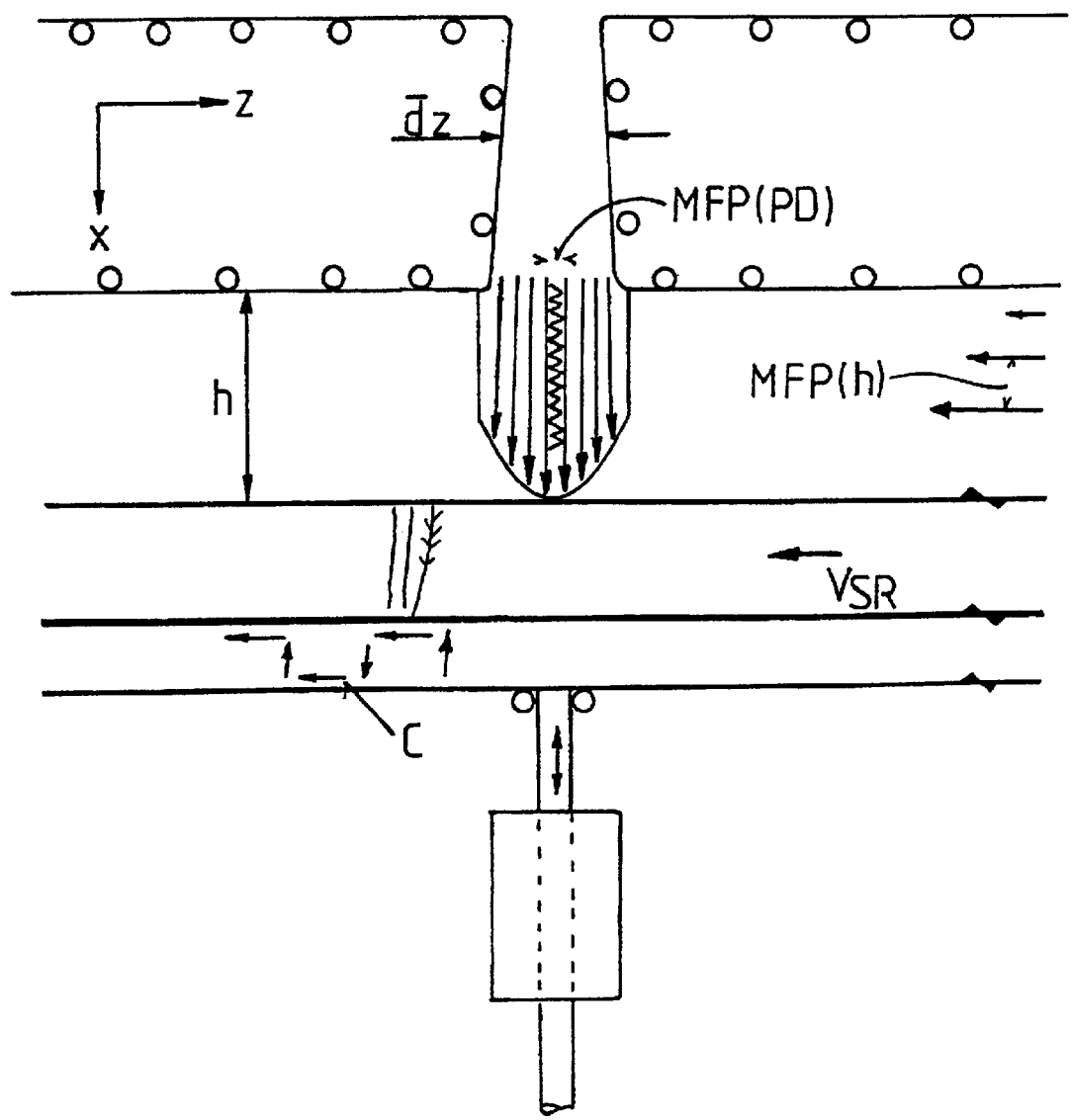
FIG. 4b Length ratios between the hyperdiaphragm distance h, flow duct diameter $d_z$ and mean free path length in the case of a laminar transdiaphragm flow.
Figure 4C:
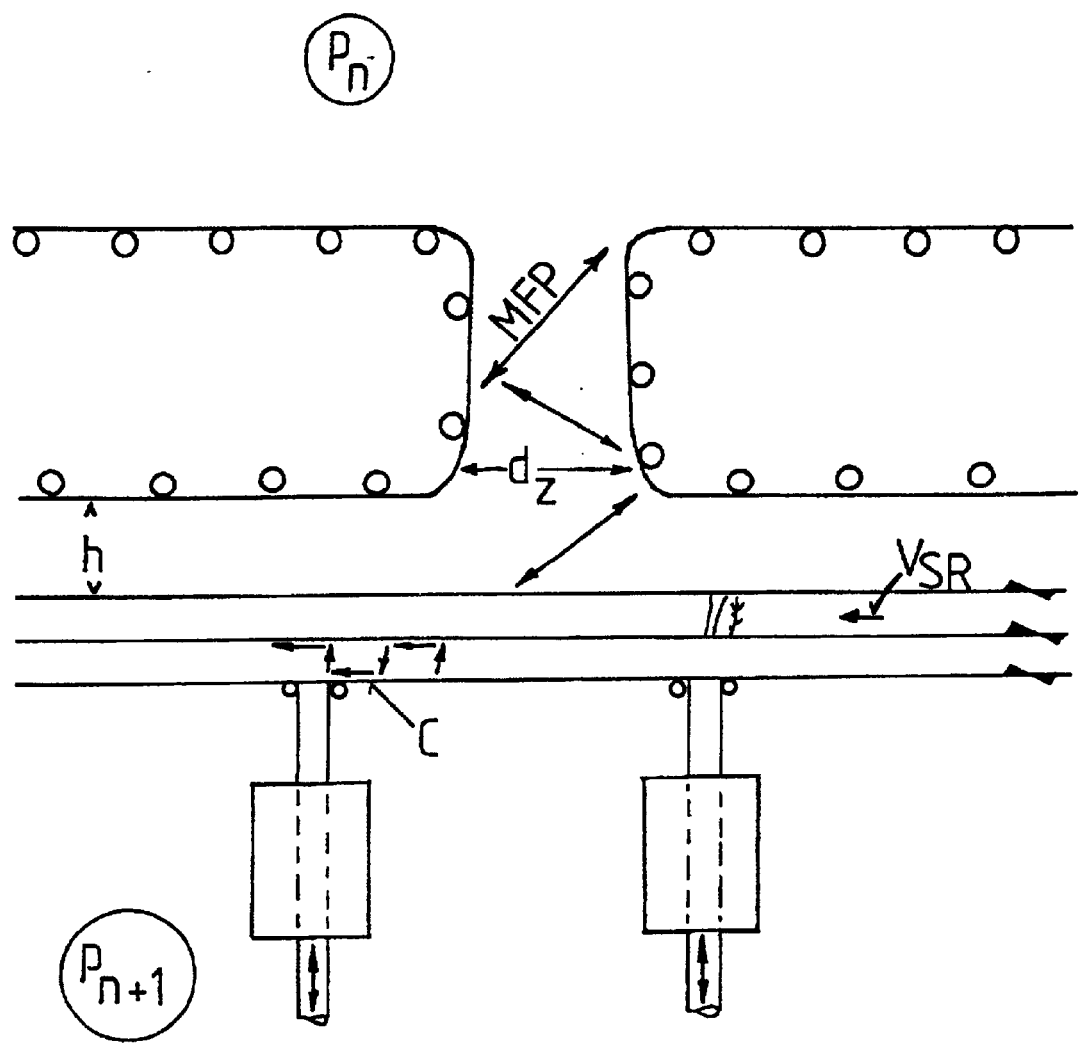
FIG. 4c Molecular transdiaphragm flow with frequent collisions of the (vaporous) elementary particles with the wall of the transdiaphragm flow duct.

FIG. 4b shows length ratios between the hyperdiaphragm distance h, flow duct diameter $d_z$ (here, for example, at the diffuser outlet) and mean free path length MFP(PD) in the case of a laminar, viscous transdiaphragm flow (ie. frequent intermolecular/interatomic layer collisions, collective particle movement with the exception of the boundary layer, speed gradient between the layers and transmission of the tangential force $F_{tg}$=h(dv/dz) by momentum transfer (cf. $V_{SR}$=velocity of substrate or condenser (with "C"=cooling system)), as occurs at high pressure. FIG. 4c shows molecular transdiaphragm flow with frequent collisions of the (vaporous) elementary particles with the wall of the transdiaphragm flow duct (as in FIG. 4b). Whilst for laminar flow h>>MFP, for molecular flow h=approx. MFP (MFP: mean free path length).

The condition for laminar flow (cf. FIG. 4b) is $$\left(\frac{d_z}{2*MFP}\right) >> 1 \quad (19)$$

that for molecular flow (cf. FIG. 4c)

$$(d_z/2)*MFP << 1 \quad (20)$$

and that for the transitional regime is accordingly $$0.1 </=(d_z/2)*MFP </= 10 \quad (21)$$

in which MFP (cf. equation (8))

$$MFP = kT/(2^{0.5} \, \pi a^2 P) \quad (22)$$

with P=total pressure, a=atom or molecule diameter, T=temperature, here in the flow. It is evident from the relations (19) and (20) that (as orientation values) $h_{max}$ (and therefore the control of the uncoupling of Q(x) and $S_{req}$) is a function of $d_z$ in the case of a laminar flow, a function of the MFP of the vapor flow (see FIG. 4c) in the case of molecular flow and, in the case of a mixed flow state, the function of a dimensionless quantity which may vary by 2 orders of magnitude.

Figure 44:
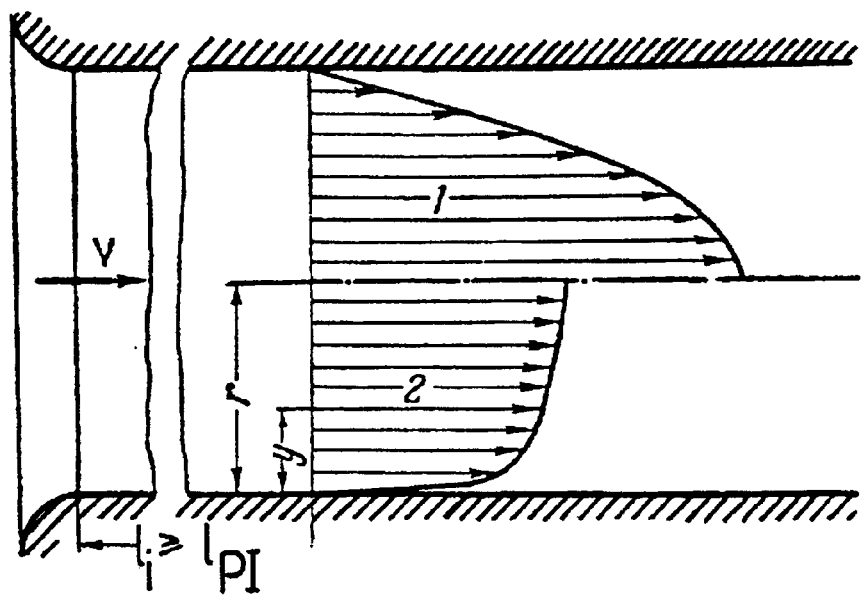
FIG. 44 Stabilized speed distribution over the transverse cross section of a cylindrical flow duct with (1) laminar and (2) molecular flow of a compressible gas.
Figures 1, 44:
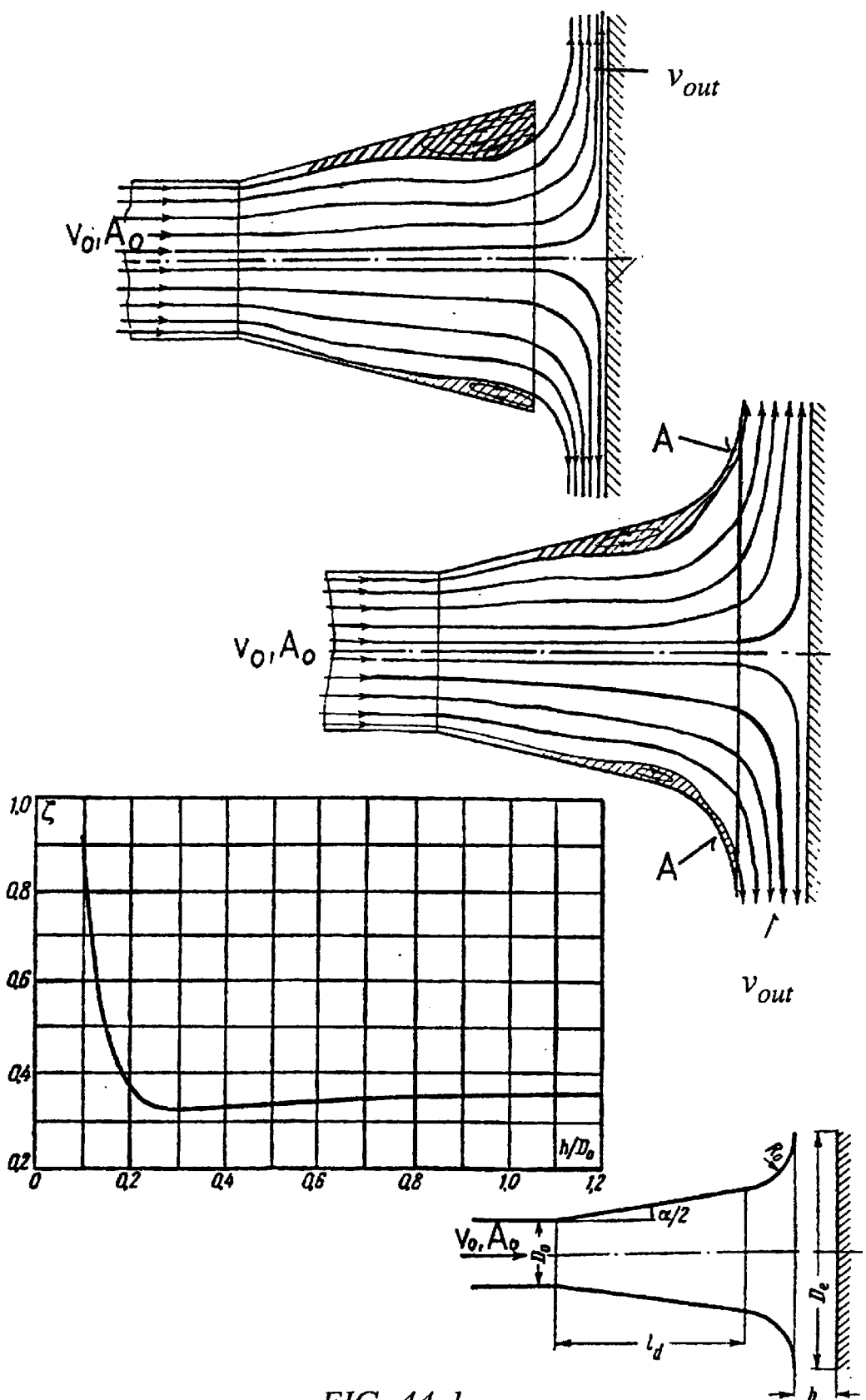

On the precondition that suitable geometric elements and/or flow duct exit orifices with low $c_F$ values (cf. EP-Application 94111991.9, Aug. 1, 1994, and PCT Application PCT/EP95/02882 of Jul. 19, 1995) prevent flow vortices over the distance h (cf. uncoupling condition No. 2), the vapor jet is deflected laterally by the vacuum in the vapor deposition chamber and, if appropriate, competes with laterally acting pulse forces having y and/or z components, i.e. with force shocks caused by atoms and/or molecules which, where appropriate, are influenced and, where appropriate, reinforced by the movement of the substrate and/or blank and the corresponding surface quality as a result of tangential (i.e. laminar) pulse transfer. The higher the pressure in the vacuum chamber of the condensers and the shorter the distance h, the higher the lateral deflection force. On the other hand, the number of lateral force shocks decreases with increasing vacuum on account of the mean free path length which consequently increases (cf. FIG. 44-1 showing possibilities for manipulating the fluidic loss figure $\zeta$ of a noncondensing gas jet in front of an unmoved surface with (top) roundings on the diffuser outlet and (bottom) variations of the distance h; A=rounding; $V_{Out}$=outflow velocity).

to 3) For a given pressure in the vapor deposition level (e.g. $P_{n+1}$)

Figure 3:
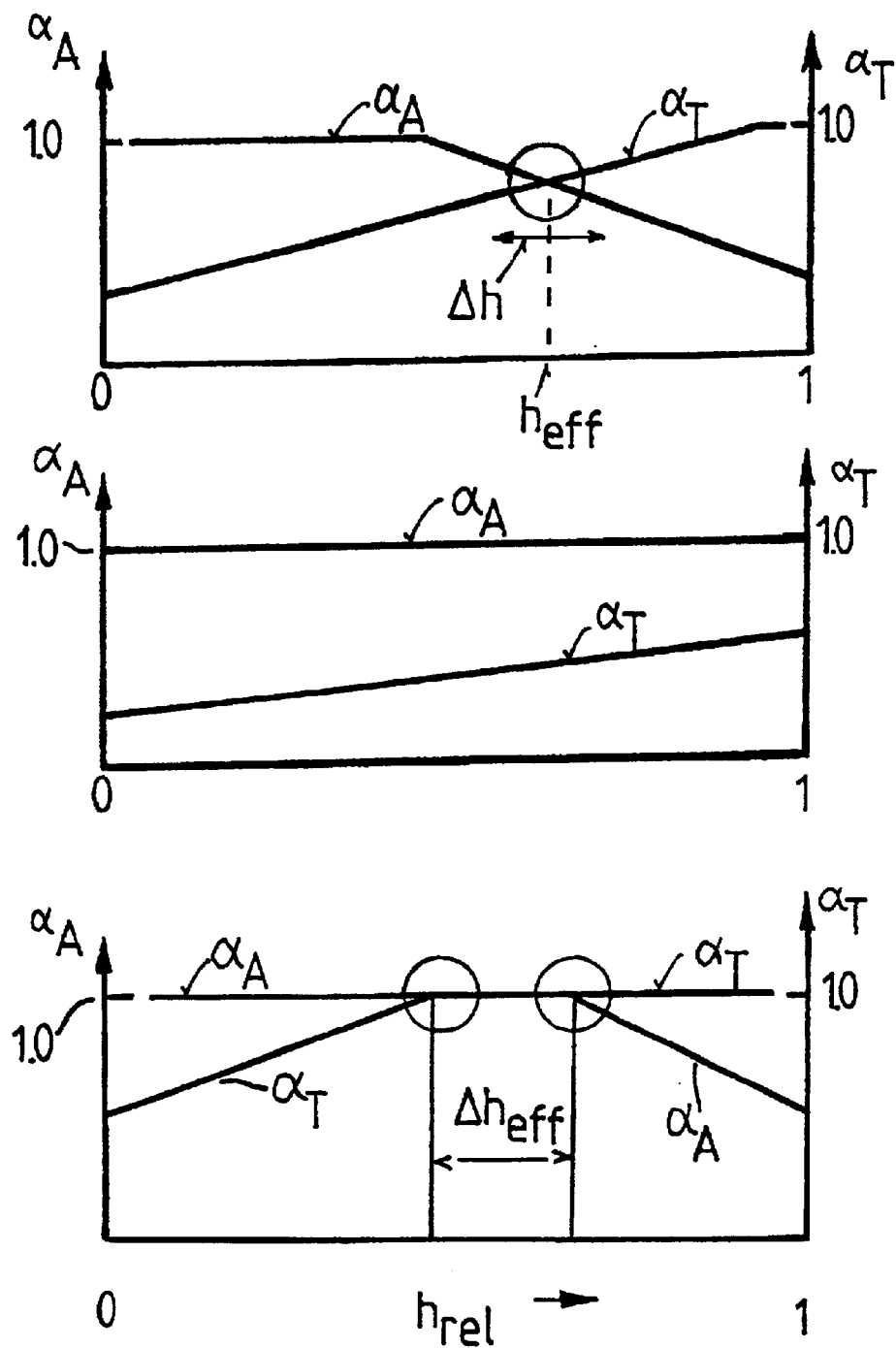
FIG. 3 Thermal accommodation coefficient $\alpha_T$ as a function of the hyperdiaphragm distance h between the diaphragm before deposition and the deposition surface as well as the conveying capacity fraction $\alpha_A$ as a function of h.

3.1 the distance h between the PD exit orifice and the deposition surface therefore should not exceed a value $h_{max}(\alpha_{A,crit})$, i.e.

$$h < h_{max}(\alpha_{A,crit}) \quad (23)$$

in which $h_{max}(\alpha_{A,crit})$ is a vertical distance from the PD backside which depends on the balance of the pulse forces over h (including the pulse force of the vapor flow $\underline{F}_0 = dI_0/dt$, cf. Second part of the invention) and of which the lateral force shocks) still allows a critical fraction $\alpha_{A,crit}$ of the vapor flow to impinge on the deposition surface, and, under the condition (23), i.e. the condition $\alpha_{A,eff} > \alpha_{A,crit}$, h becoming $h_{eff}$ and consequently controlling the fraction of the vapor flow $\alpha_{A,eff}$ which reaches the deposition surface (cf. FIG. 3).

3.2 the difference $\Delta h(\underline{F}_0) = h_{max}(\alpha_{A,crit}) - h_{eff}(\underline{F}_0)$ determines the operative thermal accomodation coefficient $\alpha_T$, i.e.

$$\alpha_T = (E_v - E_r)/(E_{84} - E) = (T_v - T_r)/(T_v - T) \quad (24)$$

in which:

$E_v$=kinetic energy of the atom arriving on the substrate surface, said kinetic energy also depending on the conditions on the deposition surface (roughness, lateral speed $v_{kon}$, see PCT/EP95/02882 of Jul. 19, 1995), $E_r$=energy of the desorbed atom before equilibrium with the lower layer is established, E=energy of the desorbed atom after equilibrium with the lower layer is established, since the effective pulse forces on the deposition surface and consequently the kinetic energy of that fraction of the vapor flow $\alpha_{A,eff}$ which arrives at the deposition surface are dependent on $\Delta h$. The kinetic energy of the melt droplets is a calculated constituent of the energy balance of spray compacting (from the melt). In vapor deposition, the kinetic energy of a particle of the vapor or gas phase which impinges on the surface should not exceed a critical value. the corresponding balance is represented by the thermal accomodation coefficient. In the event of the reflection or rebound of an atom from the deposition surface, the following applies $$\alpha_T < 1 \quad (25)$$

FIG. 3 shows the thermal accommodation coefficient $\alpha_T$ as a function of the hyperdiaphragm distance h between the porous diaphragm before deposition and the deposition surface as well as the conveying capacity fraction $\alpha_A$ as a function of h. In the upper example, there is no $\Delta h_{eff}$ range with $\alpha_T = \alpha_A = 1$, since, for example, too high a lateral speed of the condensers and a relatively high pressure in the deposition chamber deflects part of the vapor jet before it reaches the deposition surface, but the rest has too high an impact speed, so that $\alpha_T < 1$. A reduction in the condenser speed may increase the fraction $\alpha_A$ to 1.0 for the same distance h, but, due to the increased impact of the vapor flow, cannot bring about any improvement in the yield, since $\alpha_T$ decreases correspondingly (the example in the middle). Only adaption of transdiaphragm flow speed by the choice of the Diaphragm* or by the choice of the pressure gradient dP/dx, which likewise depends on the choice of the Diaphragm*, makes it possible to have a $\Delta h_{eff}$ range with $\alpha_T = \alpha_A = 1$ (example at the bottom). Under these circumstances, Q(x) and the lateral condenser speed can be increased until this $\Delta h_{eff}$ range disappears again. In the example at the top, the lateral speed of the condensers continues to determine the rate for the deposition capacity Q(A).

The relative accomodation coefficient $\alpha_T \div (\alpha_A)$, i.e. the accomodation coefficient related to a given $\alpha_A$ value, falls with falling $h_{eff}$ values and with rising $\Delta h$ an $\alpha_A$ values and, for $\alpha_A = 1$, is directly proportional to $h_{eff}$. Consequently, should not fall below a value $h_{min}(\alpha_{T,crit})$, at which there is a fall below a critical value $\alpha_{T,crit}$ (cf. FIG. 3), i.e.

$$h_{min}(\alpha_{T,crit}) < h_{eff}(F_0) < h_{max}(\alpha_{A,crit}) \quad (26)$$

Whilst, on the precondition (15), the distance $h_{eff}(\underline{F}_0)$ controls the fraction of the vapor flow $\alpha_A$ which reaches the deposition surface, the differential length $\Delta h(F_0)$ determines the fraction $\alpha_T$, adsorbed by the deposition surface, of that fraction of the vapor flow $\alpha_A$ which arrives at the deposition surface, and consequently the effective deposition fraction in the total conveying capacity Q(x). $h_{eff}$ is therefore dependent on the optimization of the ratio of the $\alpha_A$ values to the $\alpha_T$ values as a function of the hyperdiaphragm distance h between the PD flow exit and the deposition surface. The ratio of the $\alpha_A(h)$ and $\alpha_T(h)$functions to one another is dependent on the transdiaphragm state gradient, the force of the porous diaphragm Diaphragm* (see next chapter, i.e. the local manipulation of the pulse per flow duct), the lateral speed and the nature (roughness) and temperature of the deposition surface.

Optimization is carried out in such a way that, for as wide a range $\Delta h_{heff}$ as possible, $$\alpha_A(h) = \alpha_T(h) = 1$$

Figure 12C:
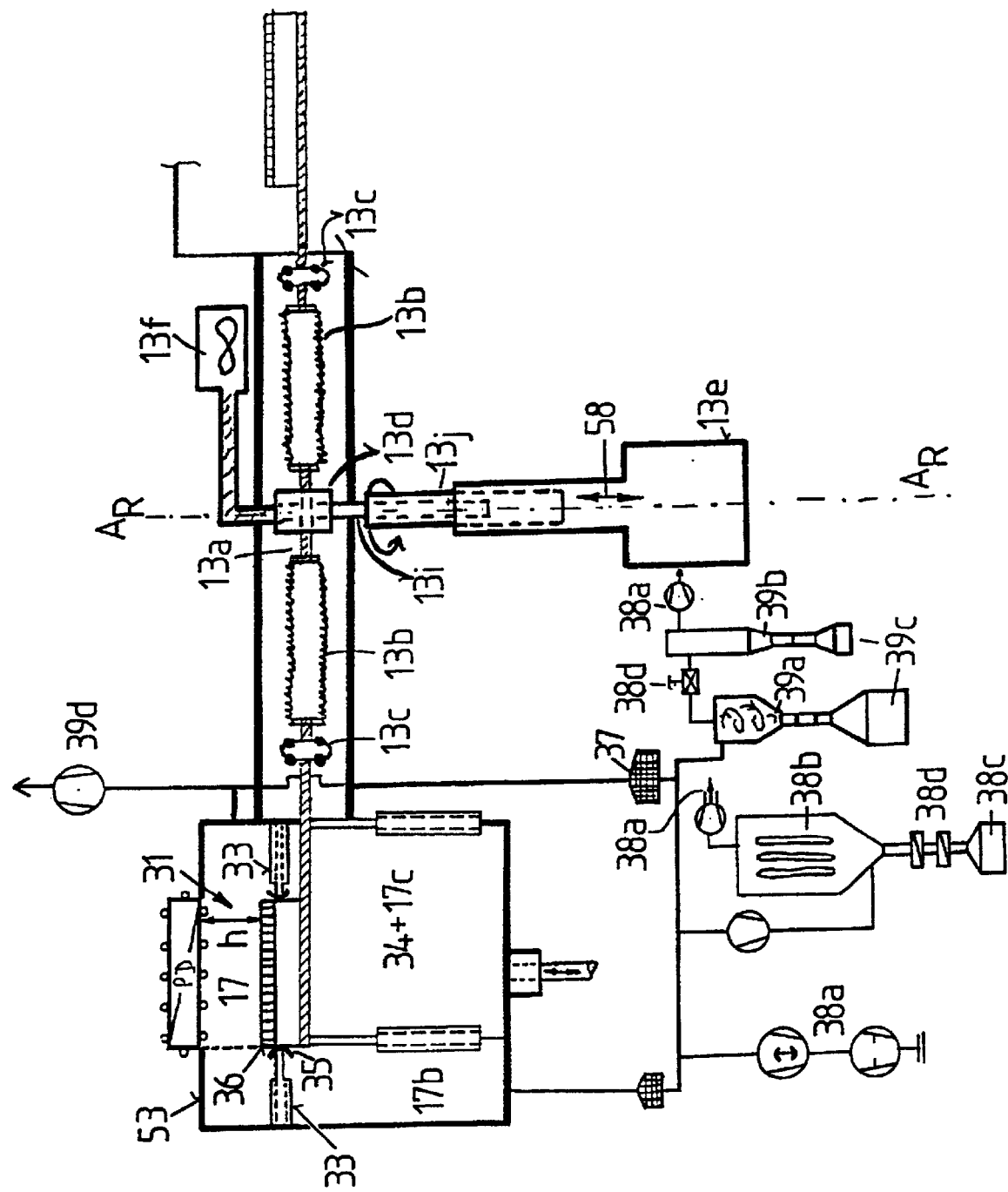

Under these conditions, sufficient preconditions are provided for complete, approximately complete, but at least controlled deposition of the volumetric flow, i.e. a controlled yield Q(A) of the volumetric vapor flow Q(x), under the conditions of the abovementioned vapor deposition process (principle), and therefore for controlled uncoupling between $Q_v(x)$, on the one hand, and $S_{req}$, on the other hand. In a similar way to equation (4), $$Q(A)=\Delta P_l*q(x)*\alpha_A*\alpha_T \qquad (27)$$

and the corresponding differential $$(\delta/\delta x')*Q(A)=\Delta P_l*q(x)*[(\delta\alpha_A/\delta x')*\alpha_T+\alpha_A*(\delta\alpha_T/\delta x')] \qquad (28)$$

are obtained, δx' being the transdiaphragm cross-section length δx plus the hyperdiaphragm distance $h_{eff}(E_0)$ between the PD flow exit and the deposition surface, and therefore $$Q(B)=Q(x)-Q(A)=\Delta P_l*q(x)*(1-\alpha_A)*(1-\alpha_t) \qquad (29)$$

is the non-deposited, otherwise utilized vapor conveying capacity (cf. description of FIG. 12.).

Figure 9A:
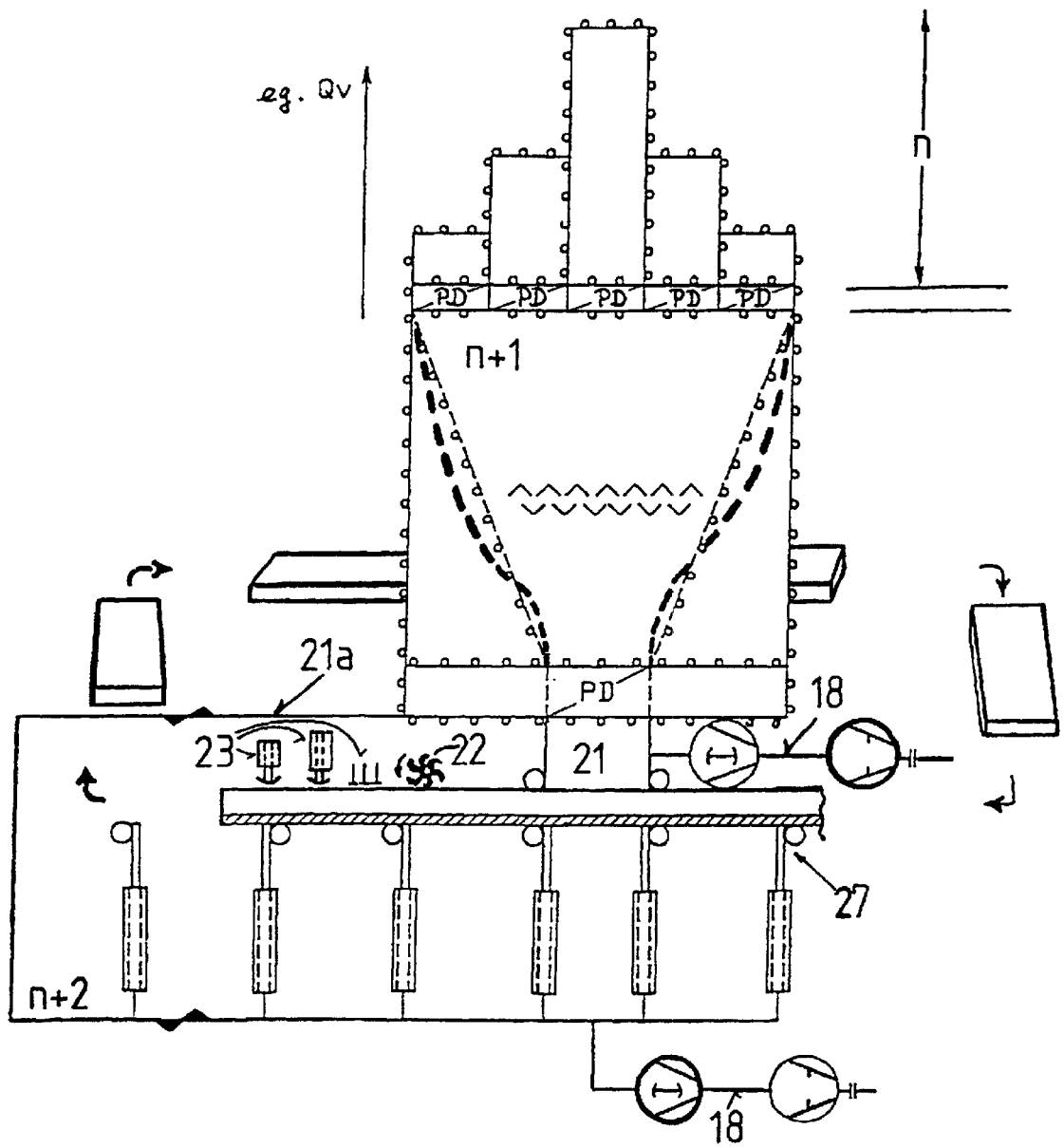
FIG. 9a Evaporation chambers arranged in parallel, the height of individual evaporation chambers being proportional to corresponding conveying flow controlled by the respective Diaphragm* followed by a mixing chamber.
Figure 9B:
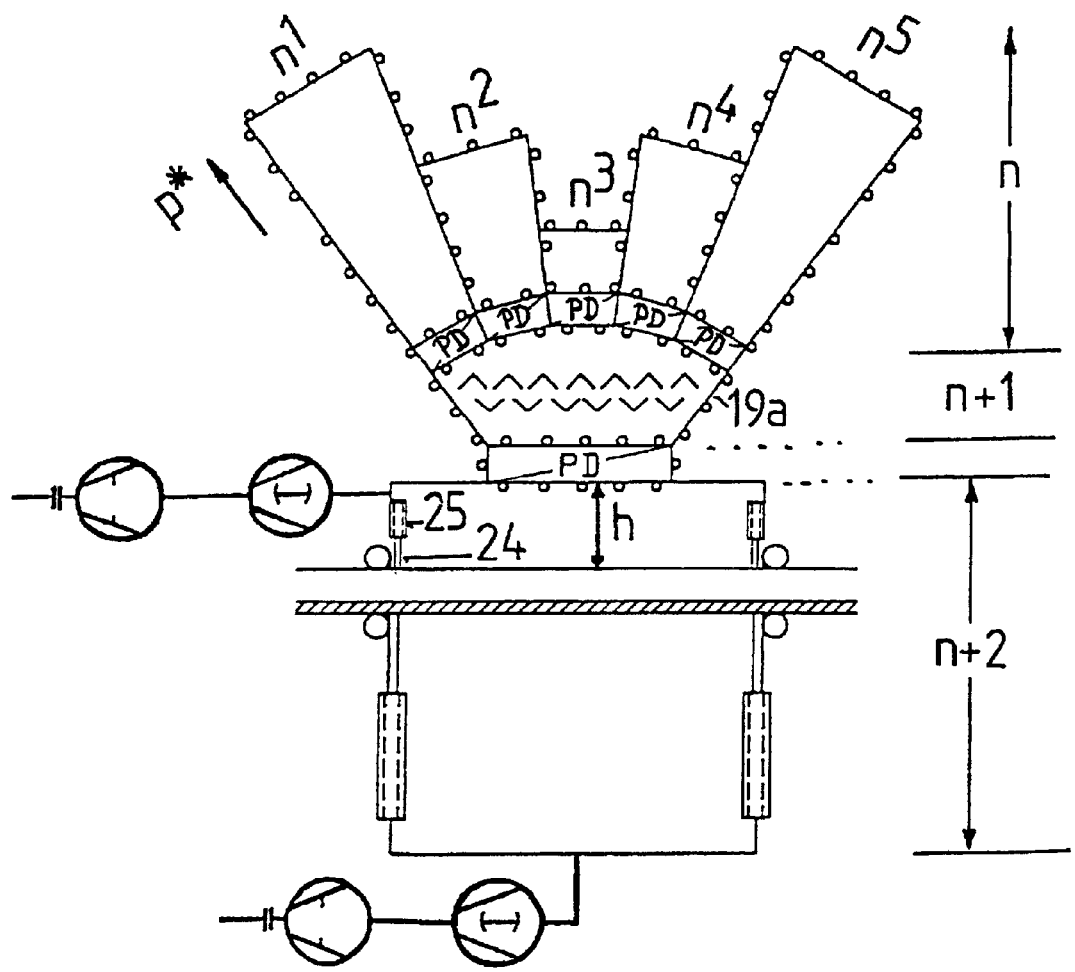
FIG. 9b Evaporation chambers in the n-level being arranged (semi)circularly (ie. in an arc) around the periphery of the mixing chamber, the height of the individual evaporation sources in the n-level being proportional to the corresponding saturation vapor pressure of the elements used.

FIG. 12 shows in a) and c) a cross section of a vapor deposition chamber, as in FIGS. 2, 9a, 9b with a)–c) reciprocally and/or (if appropriate, in the batch mode) unidirectionally moved "plank" condenser in the PD controlled vapor deposition process operated by suction flow, in a) the top part (31) with the height h and a lower part (34) of the vapor deposition chamber being without a partition (33) and therefore connected, whilst in c) the deposition level consists of two chambers, specifically the intermediate chamber (31) with the height h, the intermediate chamber (31) being separated in this case from the lower part of the vacuum chamber (34) by an (if appropriate, movably guided) separating segment (33) (and its extension height being controlled, where appropriate, by means of a microprocessor, in such a way that it brushes along the already compacted part of the deposited blank (12), if appropriate with a (rounded) scraper (35) cf. uncompacted blank layer (36), see ||||||||||) and at least significantly reduces and/or completely prevents the outflow of fine nondeposited vapor dusts into the lower part (34) and thereby provides two finely adjusted partial pressure regions in the deposition level, as well as the partitions (17: fixed or movable, 17b: fixed, 17c: movable, cf. FIGS. 2, 9a, 9b) which prevent the outflow of nondeposited vapors into that part of the deposition level/deposition chamber in which the blank is compacted ("in situ"), the two regions (31) and (34) of the vacuum chamber which are connected by means of a fan/pump system (39d) and/or vacuum pump set (if appropriate with a "Roots booster", 38c), are optionally additionally connected to a vapor separator and/or filter (38b) and/or a system consisting of a cyclone (39a) and gas purifier (gas scrubber) (39b), if appropriate for the deposition of any residual vapors, 38b operating at temperatures of, where appropriate, >1000° C., 38d: various valves, 38c: and 39c: powder containers, the region (38) and (39) is protected, if appropriate, by a flame trap (37), and/or, in the case of the use of a carrier gas, this, after passing through the cyclone, is, where appropriate, returned to the system again via a pump system (39d); part b) shows a longitudinal section of the cooling substrate for deposition, with an (if appropriate, meander-like) cooling coil for the cooling liquid (flowing in the direction of the arrow), with 13a: connecting line between the substrate (13) and cooling assembly (13f), furthermore connected to a hose joint (13c), a lengthenable and shortenable (i.e. retractable and extendable) metal stretch hose (13b), inserted in a flange (13k) for supplying the substrates with the cooling liquid (13a), and a rotating distributor and collector dish (13d) for suppling the cooling liquid to a vapor deposition process operating in batch mode, the combination of 13a, 13b, 13c and 13d both keeping the cooled condenser in a constant y position when it passes through the deposition chambers 21, 31 and 34 and swinging it into the y position and thereby executing, if appropriate, a meander-like motion, the y position, like the height h already, is controlled, monitored and, if appropriate, changed in the y direction (cf. FIG. 14) if appropriate by a microsensor-microprocessor (cf. connection 13h), the height of the cooling substrate (13) is adjustable by an (if appropriate doubly extendable) supporting tube (13i) in corresponding supporting struts (13j) and the cooling system is turned by a motor (13e), while (34b) represents a supporting strut and a hollow tube for guiding the condenser outside the vapor deposition chamber in the region of the in-situ consolidation chamber with a vacuum of the same order of magnitude as that in the deposition chamber.

It goes without saying that the distance $h_{eff}$ between the Diaphragm*, which separates the last evaporation level (e.g. n+2 in FIG. 2) or the a least one $B_l$ unit from the surface of the deposited blank at the deposition level e.g. (n+3, in EP-Application 94111991.9, Aug. 1, 1994, and PCT Application PCT/EP95/02882 of Jul. 19, 1995 n+2) or the at least one $C_k$ unit (cf. FIGS. 2, 9, 11–15), should exceed the mean free path length (MFP) in the hydrostatic state of rest by an amount which is proportional to the amount by which the flow speed exceeds corresponding x-component of Maxwell's spectrum. By contrast, the primary overall and more relevant question is by what PD structural parts and PD design parameters can the PD control not only the nature of the flow state (laminar or molecular), but, above all, the (local) pulse in the flow duct, without reducing it. Only forms and elements of a Diaphragm* with loss figures (e.g. transdiaphragm bifurcations) reduced in relation to comparable flow resistances were claimed in EP-Application 94111991.9, Aug. 1, 1994, and PCT Application PCT/EP95/02882 of Jul. 19, 1995. Further PD structural parts and PD structural part parameters are discussed in the SECOND PART of the invention together with the special advantages for the abovementioned process.

8. CVD and CVR Diaphragms*

The Diapragm* makes it possible, in order to control the vapor flow directions, the macroscopic and local vapor speeds and process variables p, T, etc., to achieve further manipulations and optimizations of a suction flow driven by an external pump system, which are put forward and explained in the following SECOND PART of this patent specification. They afford a solution to the diversity of requirements in material production from the vapor phase, in this solution the production of alloyed workpieces and surfaces being only two of the potentially highly diverse examples of use. They cover borderline cases in the problems of vapor deposition, including those with locally very high flow speeds (cf. SECOND PART of the invention) along with very diverse plant volumes and vapor source and deposition surfaces. The Diaphragm* is therefore a universal structural part in small-scale and large-scale versions and is also used for increasing the productivity of CVD and CVR processes (CVD: chemical vapor deposition, CVR: chemival vapor reaction). Thus, it affords an advance particularly for CVD processes in which different surface reactions require a fine state control of the individual constituents of the overall reactand gas and/or of the overall reactand gas itself in the reactor space (FIG. 5).

Figure 5:
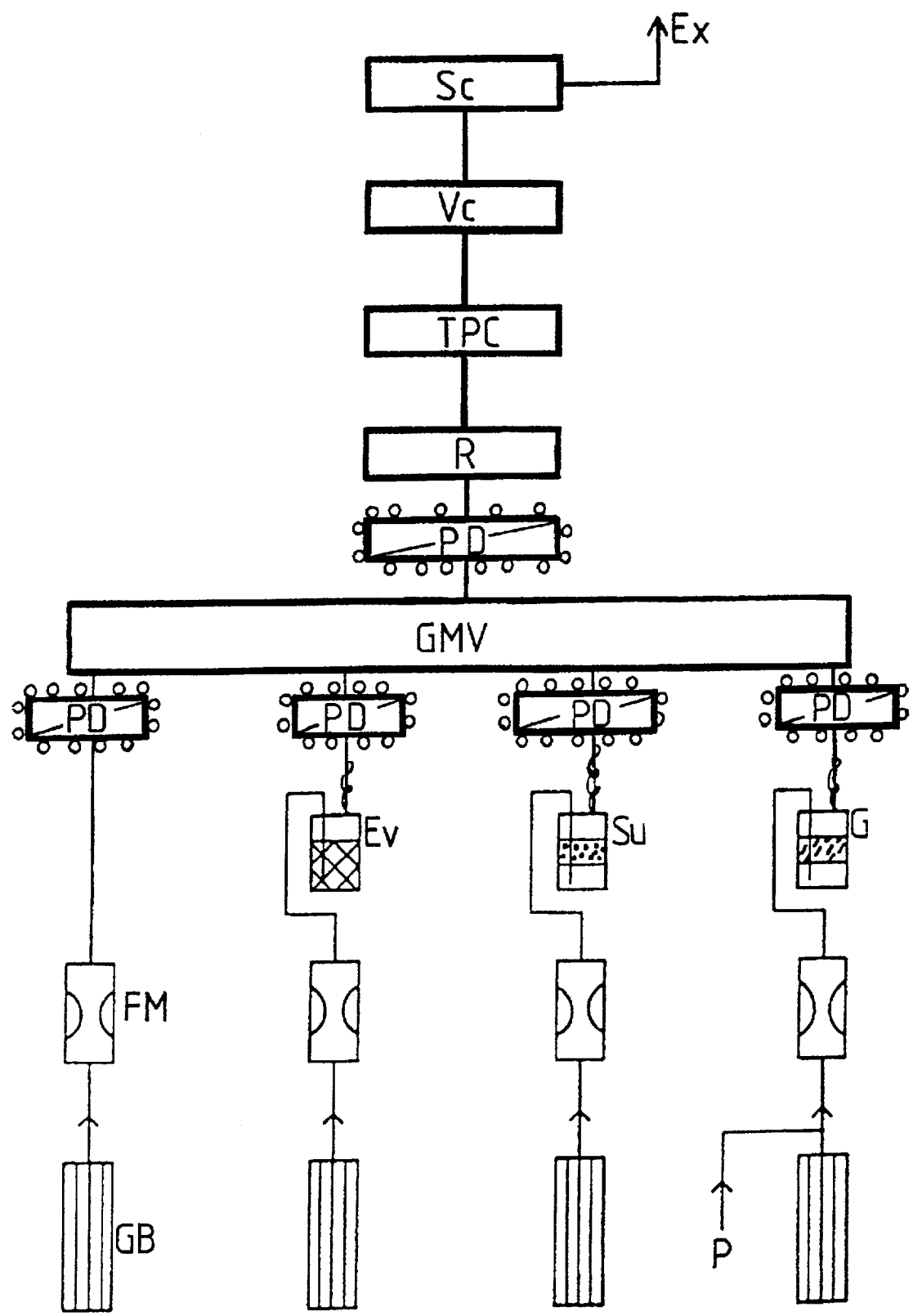
FIG. 5 Diagram of a CVD process controlled by a Diaphragm*.
Figure 6:
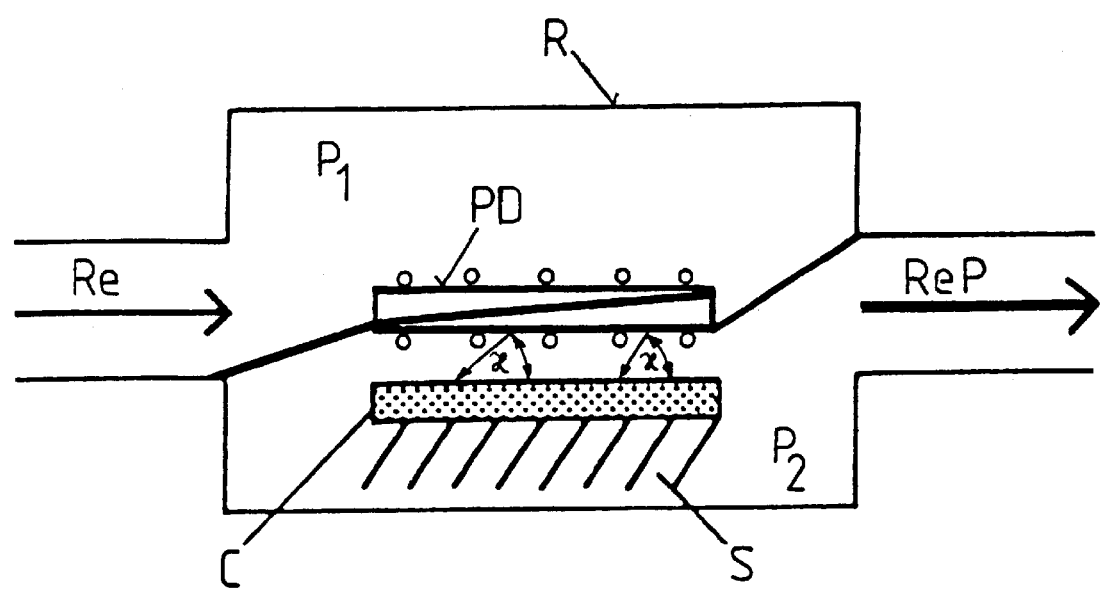
FIG. 6 Diaphragm* for controlling the activity or reactions on CVD surfaces by surface bombardment.

FIG. 5 shows a diagram of a CVD process operated by vacuum, with a conveying flow $Q_v$ controlled by a porous diaphragm Diaphragm*, here with Ex=exhaust, Sc=scrubber, Vc=vacuum pump, TPC=total pressure control, R=reactor, GMV=gas mixing vessel, FM=flow meter, GB=gas bottle, Ev=evaporator, Su=sublimator, G=generator, P=purge. Furthermore, the porous diaphragm Diaphragm* is used for controlled surface bombardment (FIG. 6). FIG. 6 shows a porous diaphragm Diaphragm* for controlling the activity and/or reactions on CVD surfaces by surface bombardment, produced by vacuum, with an angle of impact κ, relative to the suction effect of the reaction product flow, here with Re=reactants, r=reactor, c=coating, S=substrate and ReP=reaction product.

Figure 7A:
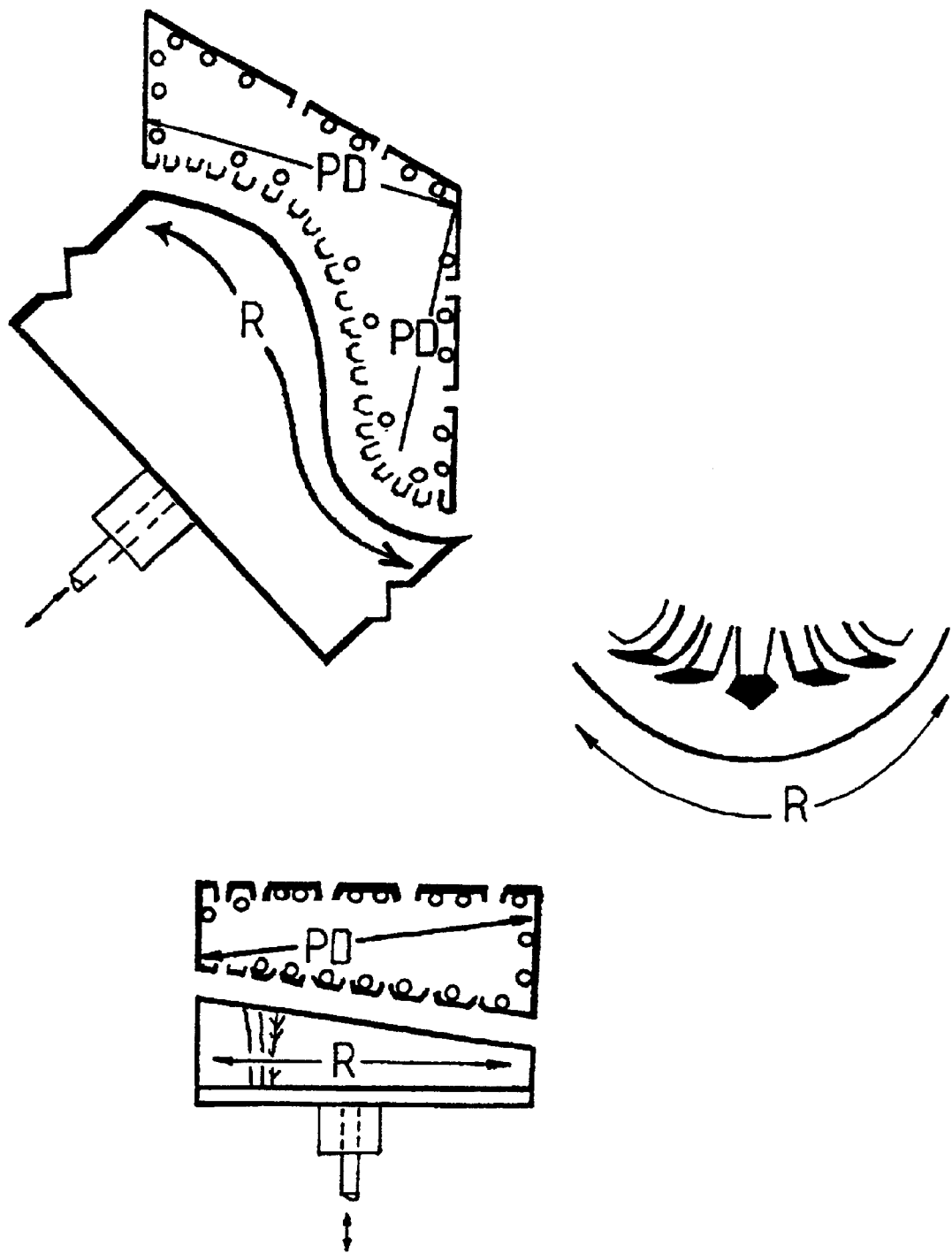
FIG. 7a Diaphragm* for the controlled shaping of the blank during vapor deposition.

The main advantages of Diaphragm*-controlled interactive (intercommunicative) gas and vapor routing in indirect and/or direct proximity to the reactive zone include:
1. flexibility with regard to the operative temperature gradients over the cross section of the Diaphragm* and, to that extent, as regards composition of the vapor mixtures to be generated (i.e. a positive, a negative and a "zero" T-gradient is possible).
2. flexibility with regard to control of the transdiaphragm pressure drop between two chambers (very small and very large pressure drops are possible).
3. dependence of the conveying flow (or vapor mass flow, i.e. the material conveyance of all components), not vice versa, and therefore high flexibility in the operative productivity and product selection of a given plant type (cf. FIG. 5).
4. flexibility with regard to vapor/gas conveying and/or mass flow allowed through a Diaphragm* at a given pumping speed S.
5. flexibility in the transdiaphragm heating of the gases/vapors per flow duct.
6. flexibility with regard to transdiaphram flow speeds and acceleration.
7. flexibility in transdiaphragm gas/vapor flow routing (e.g. via a system of "ramified" flow ducts) for controlled shaping at the outlet of the last Diaphragm* before deposition, in conjunction with flow shapers having very low resistance coefficients $c_W$ ($c_F$) at the outlet of the flow ducts (cf. EP-Application 94111991.9, Aug. 1, 1994, and PCTApplication PCT/EP95/02882 of Jul. 19, 1995 and FIG. 7), consequently high flexibility in the control of (i) the shape and size of the vapor deposited as a blank and/or semifinished product (cf. FIG. 7a) and of (ii) the resulting local speed and pulse control shortly before deposition.
8. flexibility in the control of undesirable condensation on the in conjunction with 1.–7.

Figure 7B:
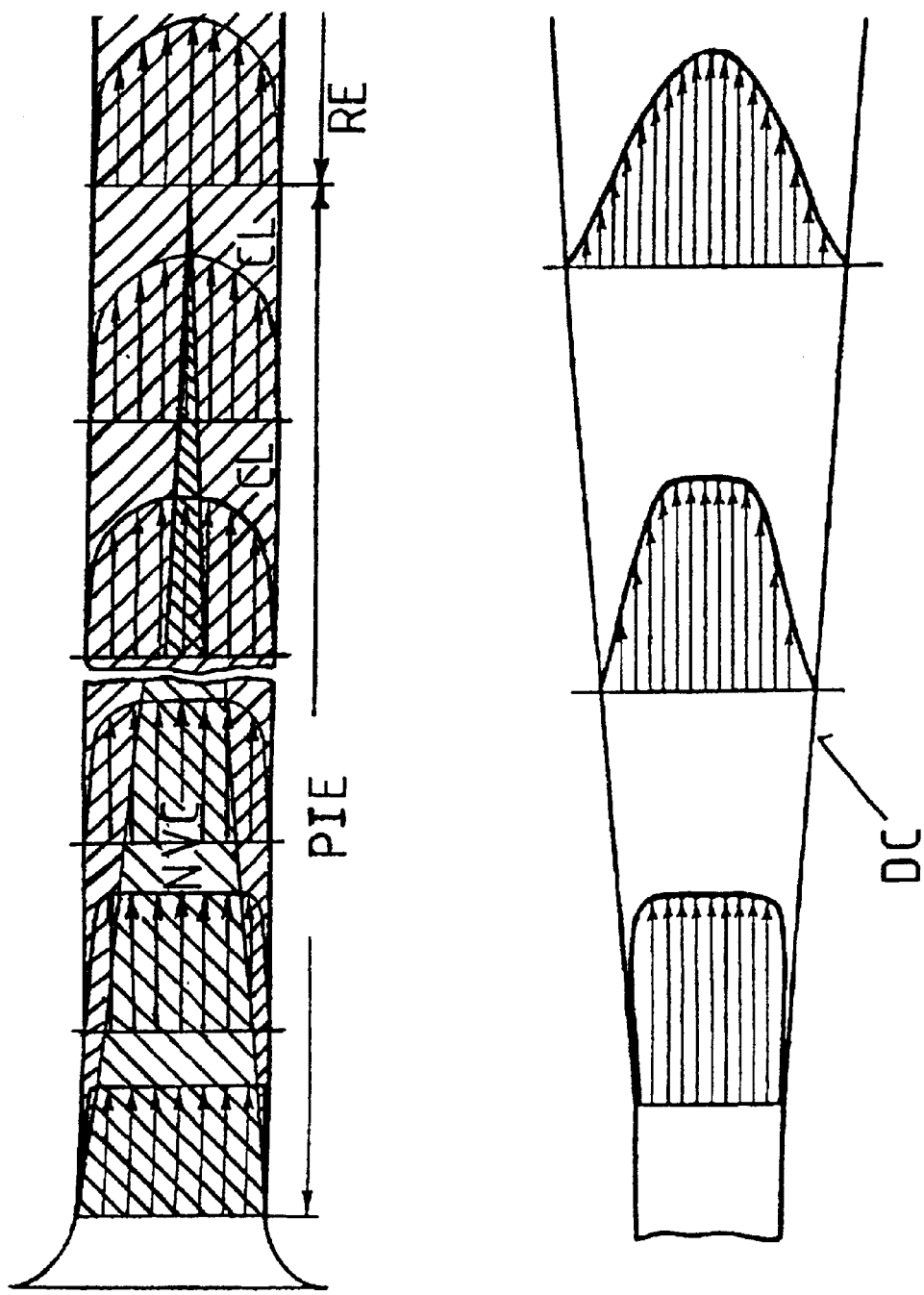
FIG. 7b Shortened transition from a uniform to an exponential distribution of the flow speed for flow duct outlets with opening angle $\delta$ ranging from $0° \leq \delta \leq 30°$.
Figures 1, 22:
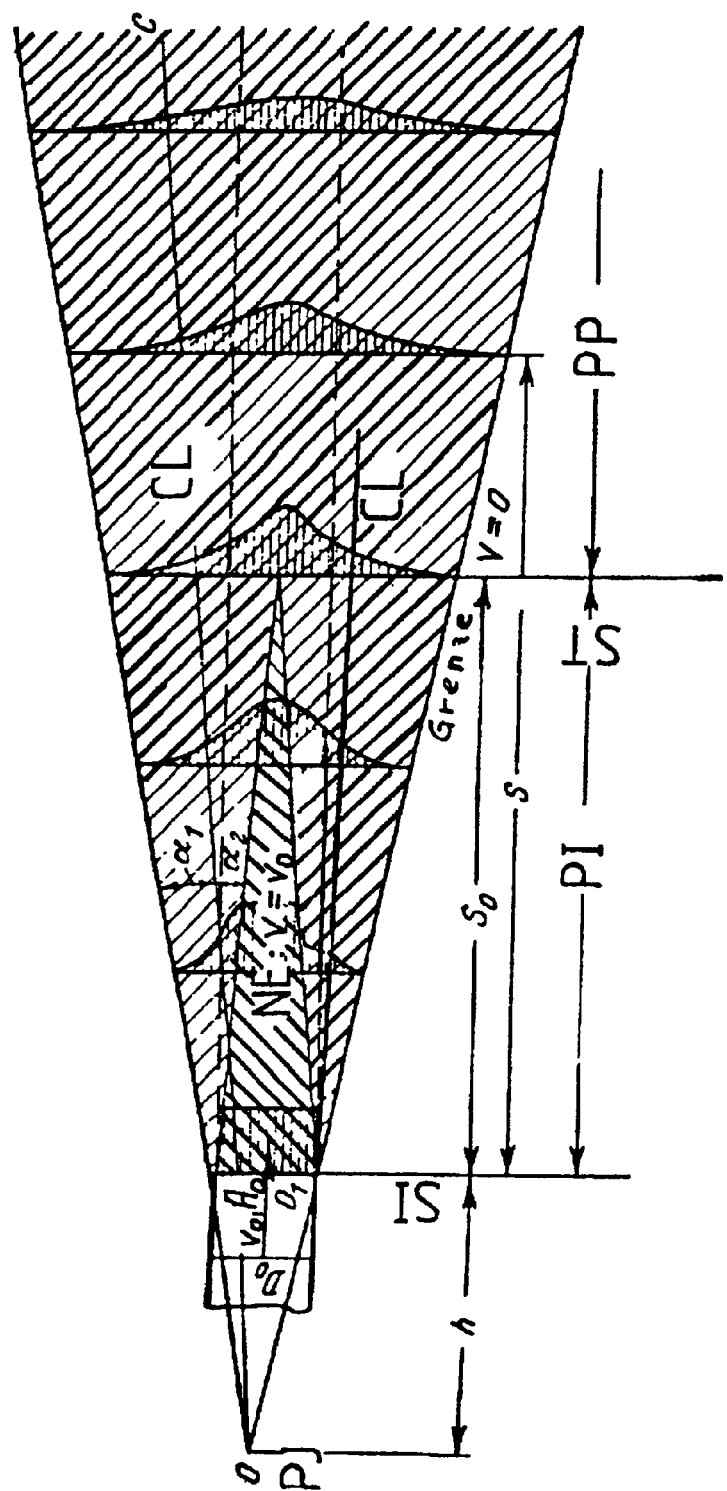
FIG. 22 Diagrams of the cross section of two plasma guns with (top) a diffuser outlet and (bottom) a Laval nozzle outlet for the resulting ultrasonic plasma jet.

FIG. 7a shows variants of the porous diaphragm Diaphragm* before deposition for the controlled shaping of the blank during vapor deposition, including controlled deviations from a uniform blank thickness, here as a function of a) the bend of the porous diaphragm backside in the case of a constant outflow duct density, b) the outflow duct bend and c) the density of the outflow ducts on the porous diaphragm backside. FIG. 7b illustrates a controlled blank and/or layer and/or film formation by means of a porous diaphragm Diaphragm* before deposition, here a shortened transition from a uniform (PIE) to an exponential distribution (RE) of the flow speed by the use of trumpet-like (ie. diffuser-like) shaped flow duct outlets. A suitable choice of the opening angle δ in the range of $0°≦δ≦30°$, preferably $0°≦δ≦15°$, results, in the abovementioned process, in a significant shortening of the flow duct for the purpose of stabilizing the profile of the flow speed, allowing control of the accommodation coefficient $α_T(α_A)$ and consequently a controlled deposition capacity Q(A). DC=continuous diffuser (α=80° to 10°). FIG. 22-1 shows the development of the transdiaphragm speed profile of a free flow jet as a result of a pressure drop in a diffuser with PP=main part, NE=core and CL=layer limit.

The suction flow upstream of the deposition (CVD/CVR:reaction) level is, in the process as a whole, the critical suction flow in terms of the productivity and quality of the product to be produced. Its conveying quantityt is dependent on the evaporation (and, if appropriate, the alloying) behaviour of the a) low (very low)-volatility (or high-temperature (HT)) component or components (whether unalloyed or in conjunction with more highly volatile components and/or mixed alloy systems) and b) the reproducibility of the concentration, the (chemical) homogeneity of the concentration, the phase formation (stable or metastable, including the degree of deviation from the thermodynamic equilibrium, since a plurality of metastable phases are often possible for a given concentration, particularly in the case of higher alloy contents), the resulting (physical) homogeneity of the resulting phases (identical initial concentration), the grain size and grain size distribution, the degree of porosity and the distribution of porosity before and, if appropriate, after microcompacting (microconsolidation, e.g. by microrollers, microhammers, etc.), and the dimensions (e.g. wall thickness) of the blank and/or workpiece. Since the suction flow through the porous diaphragm Diaphragm* is controlled, these quality features are also controlled by the porous diaphragm. This is new.

The Diaphragm* allows novel flow routings and flow ratios for improving flow dynamics in the CVD/CVR reactor space (cf. FIG. 5) and consequently a) an extension of the (T-/p-)existence range of the CVD-processes controlled by surface kinetics in comparison with competitive mechanism (homogeneous reaction in the gas phase, conveyance to and beyond the speed- (v), concentration- (c) and/or temperature -boundary layers) and b) coupling between process parameters and the material-specific parameters which are the decisive factors in operations controlled by surface kinetics, so that improved control of surface-kinetically controlled CVD/CVR processes at a high productivity level (e.g. cf. "low-pressure" CVD) is achieved.

By contrast, the increase in the production rate of conventional CVD processes is usually at the expense of an increase in the turbulent flow upstream of the reaction front, which may greatly increase the costs of the CVD process (e.g. on account of ineffective utilization of the reactand). The structural parts with high $c_F$ values at a mean distance from the flow inlet of the Diaphragm* (including baffle walls, cf. FIGS. 2, 9a, 9b and 10 and the low $c_F$ values directly at the outlet, cf. EP-Application 94111991.9, Aug. 1, 1994, and PCT Application PCT/EP95/02882 of Jul. 19, 1995) result in a) more effective in situ intermixing of individual reactand and carrier gases and b) reduced turbulences and/or controlled transition from turbulent to directional (laminar and/or molecular flow with minimized loss figures ζ, cf. FIG. 7b), and as a consequence:
1. Purely directional laminar and/or molecular reactand flow directly in front of the respective boundary layers and, where appropriate (cf. points 3. and 4.), directly at the reaction zone or reaction front, thus resulting in a reduction in the operating costs along with uniform product quality.
2. Increased production rates without additional and/or excessive turbulences (along with uniform product quality). When a plurality of reactands are used, the necessary mixing operations are brought very close to the reaction front by means of a Diaphragm*, without the surface bombardement being impaired. Together with its heatability to very high temperatures (cf. EP-Application 94111991.9, Aug. 1, 1994, and PCT Application PCT/EP95/02882 of Jul. 19, 1995), the Diaphragm* therefore improves the nucleation and/or quality control of a CVD and/or CVR process and, for the individual product unit, allows in particular:

3. Improved T-control of the reactands (reactand mixture) and of the resulting CVR and CVD process at a high productivity level. This improved T-control allows:

3.1 Restriction and, if appropriate, elimination of the function of the homogeneous gas reaction to form necessary preliminary phase ("precursor") constituents (e.g. $H_2O$ (g)) in the reactand gas as a speed determining, i.e. controlling CVD/CVR process step in favor of other mechanisms (e.g.conveyance and surface control without additional and/or excessive turbulences being generated).

3.2 Improved control of the structure and bonding of the CVD layer on the substrate material/solid structural part.

4. Restriction and, if appropriate, elimination of the respective T-, c- and v-boundary layers upstream of the reaction front, thus resulting in restriction and, where appropriate, elimination of the function of mass conveyance not only toward the interfaces (cf. points 1. and 2.) but also as far as the reaction surface, as a speed-determining process step, i.e. one which controls the maximum deposition rate by surface kinetics. This transition is promoted essentially by two methods by means of the Diaphragm*:

4.1 Increase in the partial vapor pressure of the critical reactand component or reactand components directly at the reaction front as a result of the transdiaphragm pressure gradient by utilizing the resulting pulse, i.e. by overrunning the T-/c-boundary layer without critically influencing the v-boundary layer (insofar as it still exists in PD-controlled CVR and CVD processes, i.e. improved thermodynamic control at high production rates). The vacuum in the reactor space (and not diffusion!) is thus utilized to lead the reactand into the reaction zone (e.g. onto the reaction surface).

4.2 Utilization of the transdiaphragm pressure gradient and the resulting kinetic energy/pulse of the reactand for overrunning the boundary layer: the causes atoms and/or molecules of the at least one reactand to impinge on the reaction surface, but only the reaction product is discharged. Here, the kinetic energy of the flow is utilized to over come the kinetic reaction barrier on the surface, the impact angle κ (FIG. 6) between the perpendicular to the substrate surface and the direction of flow of the carrier gas being a control variable for controlling the quantity of carrier and/or reactand gas.

The increase in reactivity of (on) the surface (and its bonding to the lower layer/solid structural part) which results from 4.1 and 4.2 by the use of a CVR and/or CVD Diaphragm* leads to improved uniformity in the deposition rate at a high productivity level, in which uniformity of the surface kinetics (surface diffusion etc.) and not conveyance onto the surface dictates the deposition rate, and has major importance for endothermic CVD(/CVR) reactions which make up about 90% of all CVD operations. The kinetic energy provided by the (if appropriate, laminar) "impingement flux" improves:

a) the compromise between a reduced v-, T- and c-boundary layer on one side and optimized $\alpha_T$ values on the otehr side.

b) surface diffusion and therefore the quality of the resulting CVD surface even in the case of curved surfaces (cf. FIG. 7a).

c) control of the microstructure of the surface layer, including refinement of the structure, without or with the reduced use of additives (possibly contaminating the structure) which are used for grain refining by the absorption of irregularities (e.g. steps, "kinks", etc.) of the surface and which may possibly exert adverse influences on the suraface properties.

The use of a CVR/CVD Diaphragm* therefore improves the control of the nucleation and/or surface properties by means of process parameters.

As a result of the improved control possibilities according to 3.1, 3.2, 4.1 and 4.2, the selection possibilities for the "precursor" gases or their constituents are increased. The diversity of design possibilities for a Diaphragm* (cf. VD solutions in EP-Application 94111991.9, Aug. 1, 1994, and PCT Application PCT/EP95/02882 of Jul. 19, 1995 and in the following chapters) results, for CVD/CVR processes too, in more flexible controllability (acceleration, orientation, cf. FIGS. 5–7), of the trajectories of the respective (gas and carrier gas) components. The kinetic energy of the atoms/molecules impinging against or on the reaction surface is controlled both by the transdiaphragm pressure gardient and by the flow speed of the vapors or gases after passing through the Diaphragm* cross section, with turbulences being minimized or suppressed completely. Flow without turbulences, which occur, for example, downstream of a flow resistance, is of great importance for the shaping of a product deposited from the vapor phase in solid form by PVD, but also for the layer properties resulting from PVD and CVD.

The Diaphragm* therefore makes it possible to use thermodynamically more stable "precursor" gases at lower (and medium) temperatures or with higher rates at higher temperatures (cf. "low-pressure CVD"). Possible examples comprise (i) the substitution (synthesis) of complicated molecular chains (cf. D. C. Boyd, R. T. Haasch, D. R. Mantell, R. K. Schulze, J. F. Evans and W. L. Gladfelter, Chem. Mater. 1 (1989), p. 119.) for the control of phase and concentration of a CVD surface layer and (ii) cheaper and environmentally more friendly and/or less explosive additives (e.g. $SiCl_4$ instead of $SiH_4$) to the entire reactand gas at at comparatively lower temperatures or with higher production rates at comparatively high temperatures. The overriding waste gas suction flow is a control variable for leading the individual constituents of the entire reactand into the reaction region of the reactor (e.g. onto the reaction surface and depends on the pumping and resulting flight speed of the gaseous components and on the Diaphragm* design, i.e. its design adapted specifically to the set object, cf. EP-Application 94111991.9, Aug. 1, 1994, and PCT Application PCT/EP95/02882 of Jul. 19, 1995 and following chapters). If a plurality of different gases are simultaneously sucked into a CVD/CVR reaction space (or in a PVD mixing chamber) by a pumping system working at a given pumping speed (cf. FIG. 5), the individual Diaphragm* design (cf. points 1. to 5. of the abovelisted Diaphragm*—types 1 and 2) decides on the conveying quantity and speed of the individually supplied reactands, gases or vapors, on the transdiaphragm temperature gradient as the control variable for the temperature gradient between the gas/vapor source and reaction/deposition front (nb., in previous processes, in the region of thermal evaporation (with the exception of the process claimed in EP Application 94111991.9) the T-gradient between the vapor source and substrate supplies the propulsion force for material conveyance and, in previous CVD/CVR processes, the temperature remains one of the most important factors in controlling the reaction speed of the chemical reaction on the surface)

In the case of Diaphragm*-controlled mixing of different reactants, it is expedient for the gas supplied to the reaction space to be in the form of a "parallel connection" of a number of gas or evaporation sources corresponding to the number of gases and/or vapors. The gas/vapor sources of the Diaphragm*-controlled CVD processes must therefore preferably be designed in parallel form (cf. FIG. 5), the plant modules for components of differing volatility at an evaporation level assuming an arrangement having as short suction flow paths as possible for the low-volatility component or components and deflection angles, conducive to the suction effect, between the axis of symmetry of the last Diaphragm* before the deposition level (cf. FIG. 9).

As already in PVD processes, the Diaphragms* for CVD/CVR processes can, of course, have positive, negative or zero temperature gradients and possess corresponding heating and insulating precautions. Directly before deposition, a positive T-gradient is employed, if appropriate, in CVD/CVR processes, in order to prevent the transdiaphragm pulse and acceleration of the possibly heated reactants from being reduced during transdiaphragm material conveyance or, in the event of a reduction, to ensure that this remains controlled.

9. Extrinsic control forms I for the recoupling of the pumping speed S to the conveying capacity Q Under the conditions of controlled uncoupling of Q(x) and S, there arises the question of the reduction of the loss figures $\zeta$ both with regard to the macroscopic vapor flow, taking into account the products and their production conditions and production possibilities, and as regards the microscopic (i.e. transdiaphragm) vapor flow in the necessary porous diaphragms themselves. In contrast to previous material production processes, the combination of a suction flow (forced convection) and the specific porous diaphragm species Diaphragm* for mass separation without any change in the composition in the material flows affords universal freedom in the extrinsic (externally visible) design of the abovementioned vapor deposition process, i.e. the orientation of the (main) evaporation and deposition levels relative to one another. Extrinsic plant design therefore controls both the overall direction of the (macroscopic) vapor flow (i.e. the sum of the part flows, fed from the individual vapor sources, of the elementary and/or prealloyed vapors for the deposited blank, workpiece and/or structural part) and plays a decisive part in optimizing and reducing the overall interdiaphragm loss figures $\zeta$. The transdiaphragm state gradients in the PD-controlled vapor deposition process according to EP-Application 94111991.9, Aug. 1, 1994, and PCT Application PCT/EP95/02882 of Jul. 19, 1995 are therefore selected in such a way that the conveying capacity is preferably independent of the orientation in relation to gravitational acceleration (vector g). x is the direction of the shortest distance between the evaporation source and vapor deposition level and, unless otherwise characterized, the perpendicular to the surface of a Diaphragm*. This perpendicular can include all polar angles $0°<\alpha<360°$ and all azimuth angles $0°<\Phi<360°$ relative to the gravitational acceleration vector g (FIG. 8a), and condensation before deposition, for example in the form of a "graft flow" is preferably avoided in the regular process design, insofar as it is not referred to expressly, since a "graft flow" greatly diminishes the efficiency of the process and necessitates additional precautions and special designs (cf. EP-Application 94111991.9, Aug. 1, 1994, and PCT Application PCT/EP95/02882 of Jul. 19, 1995).

FIG. 8 shows Architectural freedoms for combining the evaporation and/or mixing and/or deposition units (deposition chambers) of a vapor deposition process according to EP-Application 94111991.9, Aug. 1, 1994, and PCT Application PCT/EP95/02882 of Jul. 19, 1995 which is operated and driven in the suction flow, i.e. by a vacuum, and which is controlled by means of a porous diaphragm, here altogether three plant units being combined, ie. n, n+1 and n+2, and n+2 representing the deposition level (one or more deposition chambers). a): unidirectional; b): bidirectional and multidirectional; c): as b), but $\beta_i=\beta_i'+\beta_i''$ and/or $\beta_i\neq\beta_i$; d) As b) and/or c) but $x_1\neq0$ and/or $x_2\neq0$ with BXT= any xyz-translation plane and BXT2=any xyz-translation plane, here coplaner with $\underline{n}$.

In light of the functional independence from gravitational acceleration g, achieved by means of the suction flow, a near-orbit production state (i.e. a production state corresponding to space station conditions), with strategic significance for the question of "vacuum and weightlessness?" or "vacuum alone?", is created, which not only lays stress on new factors in material production, but would also seem to make extraterrestrial mission activity substantially more efficient.

The designation n, (n+1) and (n+2) in EP-Application 94111991.9, Aug. 1, 1994, and PCT Application PCT/EP95/02882 of Jul. 19, 1995 made it clear that the porous diaphragm-controlled vapor deposition process makes it possible, in principle, to have a quasi-infinite lining-up (i.e. "series connection") of evaporation units+Diaphragm* which fulfill the main criteria of discontinuously falling hydrostatic pressures over a vacuum chamber system with a corresponding "series profile" and, at the same time, generate a (macroscopic) total resistance for the overall suction flow, said resistance being relatively high for the plant as a whole. However, one of the fundamental requirements for the abovementioned vapor deposition process is that the retentivity of a Diaphragm* $F_D$ should become as high as possible in relation to a flow resistance $F_F$, i.e.:

$$F_D > F_F \tag{30}$$

(cf. EP-Application 94111991.9, Aug. 1, 1994, and PCT Application PCT/EP95/02882 of Jul. 19, 1995). It goes without saying that the reproducible intermixing of widely differing components, such as, for example, magnesium and chromium, in the vapor phase necessitates very significant dp/dx gradients locally at the diaphragm transition for Mg and productivity, along with corresponding quality, is dictated by the reservoir or retentivity of the respective Diaphragm*, $F_D$.

Since, in principle, series connections increase the flow resistance to a greater extend than a parallel connection of the same resistances, in practise a Diaphragm*-controlled vapor deposition process driven by the pumping speed S and having purely "series"-designed main levels n, (n+1), (n+2), etc. is not only a) limited in productivity, but is also, above all, b) inferior to a parallel connection of the main levels of the process. Consequently, the main, i.e. series-designed levels of the abovementioned vapor deposition process comprise corresponding subunits $A_i$ (for evaporation at relatively low temepratures), $B_k$ (at relatively high temperatures) and $C_k$ (for vapor deposition) which are also designed in "parallel" within a level n, (n+1) and (n+2) and are hereby claimed (n.b., EP-Application 94111991.9, Aug. 1, 1994, and PCT Application PCT/EP95/02882 of Jul. 19, 1995, only "series-connected" evaporation chambers separated by a Diaphragm* are explicitly claimed). For example, a plant of type (n+4) consists of an Mg alloy with 3 alloy components, but requires relatively high pumping capacity in the case of the same vapor conveying quantity as a parallel connection, as shown in FIG. 9. In that case, for example, the n-level and the (n+1)-level consist in each case of 2 chambers, i.e. i=2 and j=2, but it is also possible that i=4 and j=1, in this case mixing operations taking place only in the B-unit and the component having the lowest saturation vapor pressure preferably being located, irrespective of the Diaphragm* form, in the middle, i.e. in the central axis of the n-level, if the suction effect from the following plant unit having a corresponding pore design can thereby be optimized.

FIG. 9a is as FIG. 2, here showing an alternative architectural arrangement, ie. 5 evaporation chambers in parallel in the n-plane, here the height of the individual evaporation chambers being proportional to the corresponding conveying flow controlled by the respective porous diaphragm Diaphragm*, which is the case, for example, for 5 elements with a similar saturation vapor pressure, followed by a mixing chamber which, if appropriate, is shaped into a Laval nozzle inlet (or the like), so that the cross section of the resulting Diaphragm* is reduced to a part (of the projection) of the maximum cross section of the evaporation chamber, promotes the conveying flow mechanics (eg. by eliminating turbulences of the order of magnitude of the flow ducts in the PD) and the central conveying flow (cf. FIG. 9b) and provides for relative freedoms in the form of movement of elongate and/or rectangular condensers in the deposition level, including the deposition space (21) having the height h, here with a discontinuous circular movement for eg. a "plank" condenser in the continuous batch mode, 24 denoting a sliding stamp, 25 a sliding jaw, 26 a (pull) gripper and 27 a roller table.

FIG. 9b is as for FIG. 9a, here showing the evaporation chambers in the n-level being arranged (semi) circularly (i.e. in an arc) around the periphery of the mixing chamber (19a), here without a vapor source, and the height of the individual evaporation sources in the n-level being proportional to the corresponding saturation vapor pressure of the corresponding elements, so that, where appropriate, a superproportional suction effect on the centrally arranged evaporation chamber of the n-level is achieved, but the parallel connection has, as possibly also in FIG. 9a, partially very different dT/dx gradients per individual PD in the case of (obviously and approximately) the same temperature in the mixing level (chamber) n+1. (24): displaceable partition, (25): flat hollow wall for receiving the movable partition.

The diameters $d_z$ used for the flow ducts of a porous diaphragm Diaphragm* (PD) extend over a wide range and depend primarily on the coneying flow necessary for writing off an entire plant and/or on the transdiaphragm state gradients. The $d_z$ range and the current $d_z$ value are therefore MFP-independent dimensions, MFP being the mean free path length in the suction flow having different components (see above). In the case of a molecular duct flow, however, the minimum $d_z$ value (e.g. for relatively minor variants of this Diaphragm* species) is dependent on the chamber arrangement in a similar way to the cosine law for the emission of molecules and atoms from an infinitesimally small (point) vapor source having the area $dA_v$. As mentioned above, in practise, the $q_{v,mol}(x)°$ values are greatly influenced by actual conditions (cf. 1st chapter, SECOND PART of the invention). According to the cosine law, evaporation is assisted in the direction perpendicular to $dA_v$ for those impingement angles θ for which cos θ=1 or the emission angle Θ is as near as possible to zero. Knudsen proved the validity of the cosine law for pore diameters of $$d_{Av}=(4\ dA_v/\pi)^{1/2}<MFP/10 \tag{31}$$

In the abovementioned process, the pumping speed S and the resulting vacuum and suction flow are the propulsion force for mass conveyance, not a pressure flow controlled by the temperature-limited (saturation) vapor pressure p* of the elements. On account of the PD designs, the overall suction flow control remains effective even when a) the p*-values of the components of a multicomponent alloy differ widely, b) transdiaphragm material transport is controlled regionally, i.e. for an individual evaporation chamber, by p* and c) a parallel mode (e.g. with i=4 and j=1) is selected (cf. FIGS. 9a and 9b). It follows from the reversal of the cosine law that, particularly in the case of molecular flow, for the PDs of vapor sources arranged in parallel:

a) the suction effect is most effective when the evaporation surface and/or the x-perpendicular of the PD of the chamber arranged with the component having the lowest vapor pressure p*(T) is arranged, preferably at a deflection suction angle Θ=0°, but at least at a very small angle Θ to the perpendicular of the next following Diaphragm* (e.g. before the deposition unit n+2 or e.g. $C_k$ and/or to the perpendicular to the surface of a plane-deposited blank, cf. FIGS. 9a and 9b), and if the evaporation chambers of the components having high p*(t) values (such as, for example, Mg) are arranged at the sides of the n-level and therefore with relatively high suction effect deflection Θ relative to the x-perpendicular of the (last) Diaphragm* before the deposition unit (e.g. n+2 or e.g. $C_k$) and/or to the perpendicular to the surface of a plane-deposited blank (cf. FIGS. 9a and 9b), and b) the critical limit of the Θ-independent pore diameter of the Diaphragms*

$$d_z^{min,mol}=MFP/10 \tag{32}$$

is preferably $d_z^{min,mol}>MFP/10$, in order to transfer efficient suction effects to the sum of the comonents of an alloy system in the suction flow mode of the abovementioned vapor deposition process from one plant unit to the next in a similar way to the cosine law.

With an increase of T, p* rises and therefore MFP falls, so that $d_z^{min}$ falls and the degrees of freedom for $d_z$ of a given Diaphragm* rise. For given $d_z$ values, the transdiaphragm pressure difference dp/dx depends on the suction flow q(x,S) and is controlled by means of the respective Diaphragm* design (selection and dimensioning of the structural elements) and not by the vapor pressur p*. The saturation pressures p*(T) are used, via regulating members (see below), only for the fine control of the conveying flow q(x,S) and for safety during the operation of the plant. Consequently, in the case of $d_z^{min,mol} \leq MFP/10$, for a given Diaphragm* and a given saturation vapor pressure p*(T), dp/dx also becomes higher, the higher Θ is. Consequently, in the evaporation chamber for Mg, on account of the relatively high p*(T,Mg) values the buildup of the corresponding retentivity $F_D$(Mg) can be assisted by relatively large angles Θ(Mg). Consequently, the Diaphragm* for components with high saturation vapor pressures (e.g. Mg) is characterized, in comparison with the Diaphragm* for components with relatively low saturation pressures, by a relative arrangement having:

relatively high Θ(Mg) values and/or relatively small pore diameters $d_z^{eff}$(Mg) and/or a relatively small number of corresponding flow ducts $N_D^{eff}$(Mg).

By contrast, for a component, such as titanium, in view of the relatively low p*(T,Ti) values, as high a suction flow as possible must come into effect in the Ti evaporatiuon chamber, and the corresponding Q(Ti) values are as low as possible and the $d_z^{eff}$(Ti) and $N_D^{eff}$(Ti) values relatively high.

Since the conveying capacity (Q(x,S), which is discharged from the evaporation chamber of one component to the next plant unit by a Diaphragm* at a given pumping speed S, depends on:

$$Q(x,S) = fn(d_z^{eff}, N_D^{eff}, \Theta) \qquad (33)$$

in which $d_z^{eff}$ represents, in the suction mode, preferably a Laval nozzle cross section (cf. SECOND PART of the invention), the specifically best coupling effect between S and Q(x,S) is achieved for $\Theta = 0°$ and necessitates a combination of a parallel and series arrangement of the plant units. The plant specification must take into account the mixing action between the source of the evaporating components (e.g. in n) and the deposition level (e.g. n+2) in (n+1) and FD=fn (diaphragm design, number and type of bifurcations, p*(T), etc.). Coupling is optimized when the suction flow converts the molecular movement of the gas into a collective=military movement (laminar flow) gradually to completey.

Figure 13B:
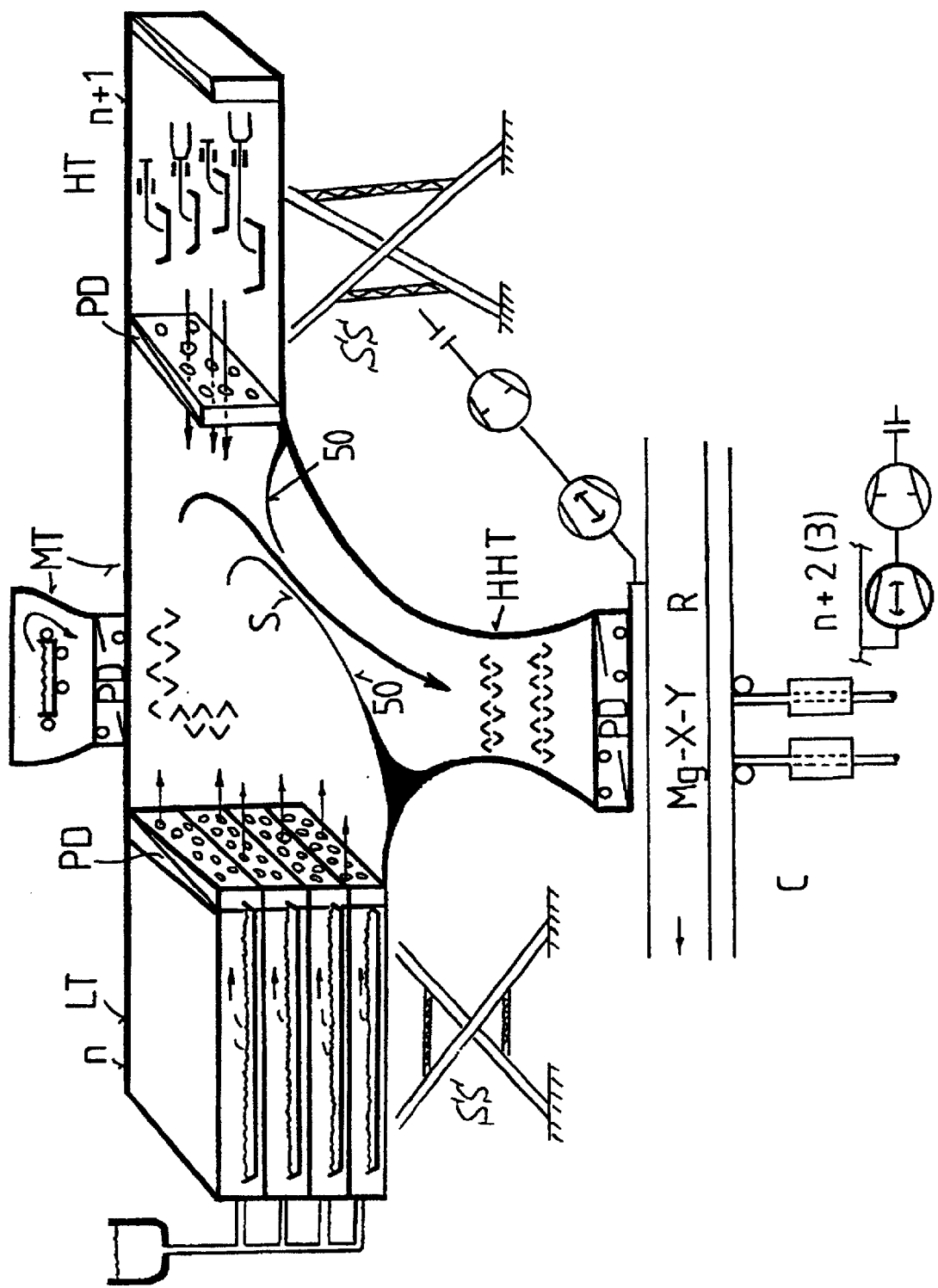
FIG. 13b Laval nozzle-like mixing chamber and quasi-parallel arrangement of the evaporation levels n and n+2 with vapor guide plates for hydrodynamic pressure control fine-adjusting the arrangement of the main levels in the fluidic hierarchy of the vapor deposition process.

The optimized architectural (extrinsic) design of the units of the vapor deposition process therefore includes mixing chambers which themselves consist of macroscopic Laval nozzles or related macroscopic contractions in cross section and have a baffle wall in the region of the corresponding Laval cross section (see FIG. 13b showing continuation in front of FIG. 13a, here with a Laval nozzle-like mixing chamber and quasi-parallel arrangement of the evaporation levels n and n+2, guide plates (50) for hydrodynamic (dynamic) pressure control fine-adjusting the arrangement of the main levels in the fluidic hierarchy of the abovementioned vapor deposition process (ie. n, n+1, n+2, etc.) and MT=mean temperature, SS=supporting struts and S=flow routing).

Furthermore, the individual evaporation and deposition levels form with one another any polar angle $0° < \beta_1 < 360°$ and $0° < \beta_2 < 360°$ and any azimuth angle $0° < \gamma_1 < 360°$ and $0° < \gamma_2 < 360°$, some basic forms of which are represented in FIGS. 8b–d. Insofar as the axis (of symmetry or central axis) of the evaporation units A and B) form with one another a polar angle $\beta_1$ or an azimuth angle $\gamma_1$ unequal to 180° or the corresponding evaporation and deposition level and/or chambers form with one another and angle $\beta_2$ or $\gamma_2$ unequal to 180°, these are connected to one another via a Diaphragm* in such a way that the central axis or axis of symmetry x (i.e. the perpendicular to the Diaphragm* surface) of the Diaphragm* forms correspondingly smaller angles with the central axes and axes of symmetry of the adjacent evaporation and/or deposition and/or deposition units (cf. FIGS. 8c, 8d and 9b).

At the same time, (macroscopic) vapor-deflecting suction pipes and bends are used before and after the vapors have passed through the Diaphragm*, such as are knowxn from ventilator technology fir suction flow and/or from axial turbomachines (cf. microscopic solutions for transdiaphragm fluid mecanics, SECOND PART of the invention). They comprise (here, of course, heated) delivery-side suction boxes and inflow nozzles, with and without a curved piece/curved shapes, and suction-side diffusers (see FIG. 8c). It therefore also goes without saying that all the walls for guiding the vapor flows in the evaporation units and vapor shafts are heated for the purpose of suppressing the condensation of individual components and therefore of maximizing the yield, specifically preferably in the resistance mode and/or in the induction mode, like the Diaphragms* themselves (cf. EP-Application 94111991.9, Aug. 1, 1994, and PCT Application PCT/EP95/02882 of Jul. 19, 1995).

The independence of the extrinsic plant design from gravitational acceleration allows complex and efficient architectural combinations of the "low-temperature" evaporation level n (or unit $A_i$ in parallel connection with $B_j$) with the "high-temperature" evaporation level (e.g. n+1 or evaporation unit $B_j$ in the case of a parallel connection with the deposition level (e.g. n+2 or $C_k$ in a parallel connection of with the "low-temperature" evaporation level Ai) and with the deposition level (e.g. n+2 or $C_k$ in a parallel connection of a plurality of deposition units with one another) in 3-dimensional translation space and, particularly for large-scale industrial production according to the claimed vapor deposition process, permits efficient space utilization with numerous optimization possibilities for the intrinsic design (i.e. the type) of the basic functional and production units A, B and C and their number i, j and k.

The degrees of freedom in the 3-dimensional translation design of the abovementioned vapor deposition process, which emerge, on the one hand (i), from the hierarchy of the propulsion forces, pumpin speed (pumping capacity) →suction flow control→pressure gradient per (main) Diaphragm* and the resulting overall p/T-gradients der Diaphragm* and, on the other hand (ii), from the discrete intrinsic design of the basic functional levels, (e.g. n, n+1, n+2), allow extremely high efficiency in the overall arrangement of the evaporation and deposition units for production and processing on an industrial-scale ladder which, depending on the object and product, is achieved a) not only by extensive optimization of the 3-dimensional configuration and, for example, of the number i, j, k of units A, B, C, but also b) by intensive optimization of the $\Sigma A_v / \Sigma V_p$ ratio of each individual unit i, j, k, in which $A_v$ is the surface of the condensed material to be evaporated and $V_p$ is the volume of the respective production unit of type A (low-temperature evaporator), B (high-temperature evaporator) and C (deposition unit) (cf. FIGS. 11–15).

Figure 11:
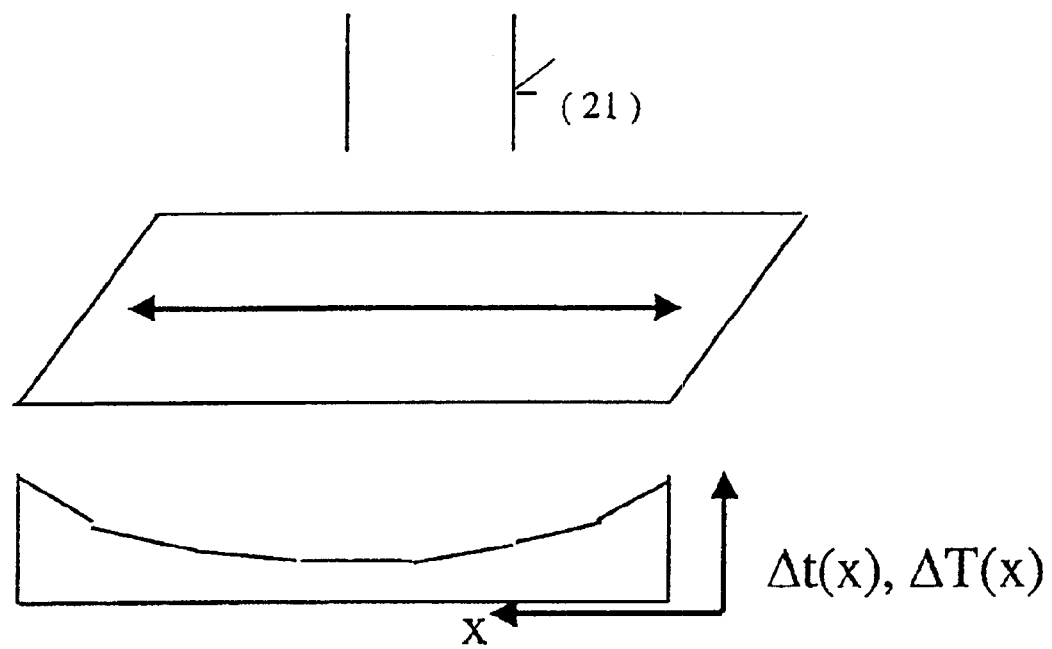
FIG. 11 Discontinuous temperature intervals $\Delta T = T_{max} - T_{min}$ of reciprocally moved flat-plate condenser where $T_{max}$= temperature during vapor deposition and $T_{trans}$=temperature during transformation of respective metastable phase and $\delta\Delta T(x)$=temperature irregularity inherent to this process and $\Delta t$=relative time interval for $\Delta T(x)$ to occur.

FIG. 11 shows compact designs for a PD-controlled vapor deposition process I operated by suction flow, here conventional evaporation chambers with a high surface-to-volume ratio and diverse form adapted to a desired fluid mechanics e.g. for 0.1–1.0 mbar at 400–1700° C., ensuring and controlling the condensation-free vapor conveyance to the next plant unit of the abovementioned vapor deposition process in the case of a minimized loss figure $\zeta$, (first page) Collani-like pear-shaped and trapezoidal designs, including the evaporator tower (40) and flow elements (41) for the reduction of flow vortices, and (second page) a top view of the overall evaporator tower (40) (center of page) and longitudinal section with an inner shaft (42) and outer shaft (43), the peripheral outer shaft, on account of its greater freedoms in dimensioning, preferably for macroscopic suction flow routing and control, eg. via angles of inclination $\alpha_M$ and/or $\alpha'_M$ for (dis)continuous increase in cross section and/orconveying flow, the central inner shaft preferably for supplying the tiers of the evaporator tower with melt via a tube system (44) which is heated (preferably inductively and/or by the resistance method), 45: evaporator tower suspension, 46: evaporator tower pillar, 47: (if appropriate, allround) evaporation slit (vapor outlet) with regulating member, 48: valves, 49: suction flow direction, AE: alkaline earth metals (Ca, Sr, Ba), RE: rare earth metals (including mixed metals and heavy rare earths (Gd to Lu).

10. Intrinsic control forms for the recoupling of the pumping speed S and the conveying capacity Q The vapor deposition process claimed in EP 94111991.9 is, where appropriate, a system which organizes itself via the Diaphragm* design. The transdiaphragm pressure gradients dp/dx between the evaporation chambers and between the at least one evaporation and/or mixing chamber and the at least one deposition chamber build up either after the opening of the vapor sources by means of the part flows guided via the bifurcations (FIG. 10) and supplying a significant part of the necessary vapor quantities which are retained by the Diaphragm* and/or after the opening/closing of the apertures and valves introduced in the flow duct. In addition to the bifurcations and their design possibilities, the geometric elements having a high $C_W$ (English $c_F$) value at the flow inlet define the retentivity or force of the diaphragm, $F_D$ (EP-Application 94111991.9, Aug. 1, 1994, and PCT Application PCT/EP95/02882 of Jul. 19, 1995). Their influences on the retentivity are exerted due to the fact that the vapor flows through the bifurcations and round the geometric elements.

The flow resistances $F_F$ are, in total, preferably lower than $F_D$, in order to optimize the functioning of the Diaphragm*-controlled vapor deposition process. The vapor quantity effectively released per evaporation and/or mixing chamber is uncoupled from the absolute value of the pumping speed S, although any variation in the pumping speed by varying the absolute pressure in the deposition chamber, which is codetermined by factors, such as leaks, gas escape from the vacuum chamber walls, sealing materials, including the O-rings used, etc., is one of the control variables for the vapor quantity actually released per evaporation chamber.

The other method which couple the suction flow as propulsion force (which, for example, controls the maximum production rate) and the Diaphragm* (as the structural part which controls the current conveying capacity, e.g.

$$Q_v = p^* V/T \quad (34)$$

(unit e.g. [torr*lite/sec])) include:
(i) Conventional evaporation chambers: regulating members for varying the respective vapor exit cross section of at least one of the vapor sources in at least one of the vapor sources in at least one of the conventional evaporation chambers n, (n+1), etc. $A_i$, $B_j$. The regulating members are controlled selectively by a microprocessor (indicated in FIG. 2 by electric junction terminals 1a–6a) in accordance with in situ analytic and desired values, the locations of the analyses of the coneying flow preferably being directly in front of a Diaphragm* (in the direction of flow). In conventional evaporation chambers, a plurality of vapor sources (eg. 1–6 in FIG. 2) can be arranged in a tower-like manner in the vapor shaft. The individual vapor sources can be regulated to different temperatures and allow the simultaneous evapo ration of different components in one chamber, the vapor pressure curves of the respective components not being too far apart and the control of the evaporation mode of a chamber being improved, if appropriate, by insulating the individual evaporators thermally from one another.
(ii) Freedom of form of the evaporation chambers/external: The particular advantage of a vapor deposition process operated by suction flow is not only freedom in orientation between individual plant units (see above), but also the form of the individual evaporation, mixing and deposition chambers themselves, since the suction flow also draws the vapor out of vapor sources in remote corners of an evaporation chamber. In practise, in the vapor deposition process operated by suction flow, anything which is not prohibited is allowed (for example, condensation during material conveyance from the vapor source to the deposition level is just about the worst which can happen, since it possibly accumulates and actually undermines a control of the proces (cf. EP Application 94111991.9 , Aug. 1, 1994, and PCT Application PCT/EP95/02882 of Jul. 19, 1995 vs. German Patent Application No. P 44063334, Mar. 1, 1994, made by Leybold Durferrit GmbH, Hanau.

The (external) walls of the evaporation chambers are, where appropriate, shaped as rectangular, trapezoidal, cylindrical and/or (Laval) nozzle-shaped vapor shafts for improving their fluid mechanics, in order to achieve a flow form promoting the aerodynamics of evaporation (FIG. 13a). This is advantageous particularly when the necessary reservoir formation is relatively small and/or a plurality of Diaphragms* are used for the transdiaphragm evacuation or supply of a conventional evaporation and/or mixing chamber, said chambers being capable of forming the angles $0° < \alpha_2 < 180°$ and $0° < \Phi_2 < 180°$ with one another. FIG. 13a shows a pear-like form of an evaporation chamber. A flow form which fundamentally improves the aerodynamics is achieved by a variation (increase and decrease) in the diameters of the evaporation shaft in front of/in the region of a baffle wall and thereafter and in the diameters of the evaporation sources and, where appropriate, an increase in vapor flow cross section is obtained at a decreasing distance from the Diaphragm*. It goes without saying that, to avoid condensation, the walls of the evaporation and/or mixing chambers are also heated, specifically preferable inductively or by the resistance method.
(iii) Internal forms of the evaporation chambers: Since the components of conventional evaporation chambers are, as a rule, liquid, in evaporation shafts the vapor is guided past the Diaphragm* on the periphery of the evaporation sources (arranged, if appropriate, in a tower-like manner) in parallel with the gravitational acceleration vector g but also at angles $0° \leq \alpha_g \leq 180°$ ($\alpha_g$ being the angle between the liquid surface and gravitational acceleration vector g). In the event of $30° < \alpha_g < 150°$, the fluid mechanics can be assisted by a centric flow duct in the tower-like arrangement of the evaporation sources (FIG. 13a). In each of the possible instances of orientation (see above), central shafts can be utilized for supplying the crucibles with melt (FIG. 13a), and the evaporator crucibles of a conventional evaporation chamber are capable of receiving alloy scrap which contains a preferably volatile component, and, in a continuous evaporation mode, this is used either a) for the pure component and/or b) for in situ alloying directly into a new product.

For appropriate recycling, it is possible to use Mg alloys, products with alkaline-earth metals (Ca, Sr, Ba), rare-earth metals (e.g. magnetites and magnetic materials), but also Al—Li alloys and other Li-containing products. The crucible are likewise designed in such a way that large quantities of elementary raw materials can be received and these is/are processed via evaporation into ultrahigh-purity material. Particularly during recycling and/or processing to form a pure material, the fluid mechanics within conventional evaporation chambers are improved for very high conveying flows without condensation before deposition. This involves continuous variations in cross section for adapting the flow speed and (macroscopic, i.e. in contrast to transdiaphragm-microscopic) geometric elements with very low resistance coefficients $c_W$ (FIG. 13a), as are already used in the Diaphragm* itself (cf. EP Application 94111991.9). In the conventional evaporation chamber, they prevent the formation of pronounced vortices which may occur, for example, due to shadings of the suction effect and/or of the conveying flow by discontinuities on the chamber and/or crucible walls and which represent an increase in the loss figure and a risk of premature condensation. Also, to reduce the loss figure ζ, etc., the crucibles themselves are beveled and/or are complemented by the use of flow elements (FIG. 13a).

(iv) Balancing of the main Diaphragm* relative to one another, i.e. the relative influence of S on the individual conveying flows $q_v$ flowing through the diaphragms and the resulting quantity ratios $q_v(n)/q_v(n+1)$, etc. $q_v(A_i)/q_v(B_j)$, etc. The necessary hydrostatic pressure $P_{req}$ in an evaporation unit, etc. emerges from the plant design (cf. extrinsic control forms . . . ) and from the product form in the deposition chamber. $P_{req}$ is universal, since the materials and material combinations to be processed are universal, and is therefore not tied to specific stipulations (cf. German Patent Application No. P 44063334, Mar. 1 1994, made by Leybold Durferrit GmbH, Hanau). The following pressure values preferably apply to the case without an "external" carrier gas circuit for "trapping" by nondeposition (see point (vi) below). In the at least one evaporation chamber (e.g. n) or Ai for components having relatively high evaporation pressures and relatively low evaporation temperatures, such as Mg, Al, P, S, Ca, Sr, Ba,Ce, La, Pr, Nd, Sm, Gd, heavy rare-earth metals, such as Tb, Dy, Ho, Er, Tm and for the preferred misch metals (cf. EP-Application94111991.9, Aug. 1, 1994, and PCT Application PCT/EP95/02882 of Jul. 19, 1995), temperatures of between 300° and 2300° C., with a hydrostatic pressure range $\Delta p_{req}$ of 1 to 1000 mbar, are set. The preferred pressure ratios are governed by the precise plant design (see above), including a possible use of physical transport reactors (PTRs), e.g. in n and/or (n+1) (see below).

In the at least one evaporation chamber (e.g. n+1) or $B_j$ for components having relatively low evaporation pressures and relatively high evaporation temperatures, including the corresponding PTRs (sse below), such as Be, B, Al, Si, Ti, V, Cr, Mn, Zr, Fe, Co, Ni,Cu, Y, Nb, Hf, Sm, Gd, but also for the heavy rare earth metals, such as Tb, Dy, Ho, Er, Tm, Yb and for the preferred mischmetals (cf. EP-Application 94111991.9, Aug. 1, 1994,and PCT Application PCT/EP95/ 02882 of Jul. 19, 1995), temperatures of between 1200° and 3000° C., with a hydrostatic pressure range $\Delta p_{req}$ of 0.01 to 100 mbar, are set. Here, too, the preferred pressure ratios are governed by the precise design of the plant as a whole, including a possible use of physical transport reactors (see point (vi) below).

(v) State conditions in the deposition chamber and condensation surface: Finally, at the condenser level (e.g. (n+2)), a constant or approximately constant surface temperature of between −200° and 300° C., preferably between −50° and 250° C., is set on the surface of the blank or workpiece at the moment of vapor deposition (different from the moment of in situ consolidation, see the next section of this chapter), taking into account its thermal conductivity, in that the cooling capacity (for condensing the vapor from the above-mentioned evaporation and/or mixing units on the condensation surface) and the distance of the condenser are increased and/or, where appropriate, adapted to the increasing thickness of the blank or workpiece, for a given alloy or a given high-purity material this temperature, where appropriate, being varied in a controlled manner according to the product requirements and not exceeding a temperature tolerance of +/−40° C., but preferably of +/−5° C., the distance between the Diaphragm* and condenser, which increases with increasing growth of the blank or workpiece, being coarsely and finely controlled by a microprocessor. Furthermore, the hydrostatic pressure range $\Delta p_{req}$ in the deposition chamber (21) (see FIGS. 1, 2, 9a, 9b, 14, 15a, 15b) and/or in the entire deposition level is set at 500–0.1 mbar, its exact value depending very closely on the precise design of the condenser level and of the process as a whole (see below).

Figure 14G:
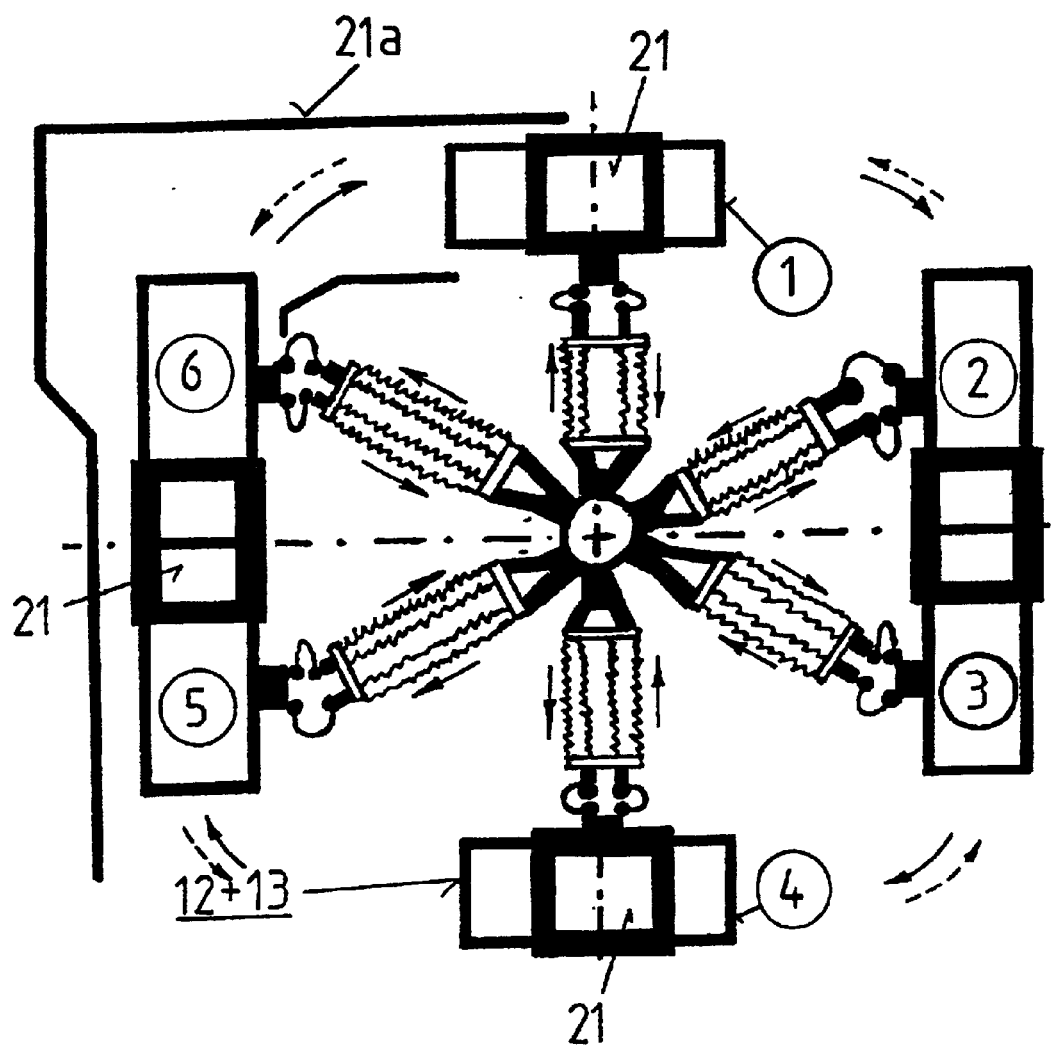

FIG. 14 shows compact designs of PD-controlled vapor deposition process II operated by suction flow, here (derivation for the compact) circular process I (ie. $d\Delta T_A=0$, with $T_A$=temperature on the (deposition-side) deposition surface of the blank), with a)–d) side view of the transition from the evaporation and/or mixing region (and/or chamber) before deposition, with the variants (19b) and (19c), into the deposition level, the mixing chamber being followed by at least two, if appropriate>two vapor outlets and deposition chambers in the deposition level for a continuous batch mode, the "plank" or any other condenser "batch" mode within the deposition level with in-series deposition (21) and (in situ) consolidation chambers (21a) with a high surface-to-volume ratio, the number of condensers (13) (cf. ringed numbering) for ensuring continuous operation resulting preferably in symmetrical condenser routing according to the formula $$n^*(21)>/=3/2^*n^*(12),$$

and e) and f) vapor shaft, as seen from the deposition level, and g) deposition level, as seen from the mixing chamber, and the height position of the roller guide, which is arranged around the and/or below/above/laterally offset evaporator tower and by means of which and on which the "plank" condenser is moved, being controlled by a system of supporting tubes which are located in hollow tubes and, if appropriate, are moved pneumatically and are controlled by a microsensor-microprocessor (cf. FIG. 12), and, where appropriate, at least two, preferably four or eight oppositely arranged separate deposition chambers according to FIGS. 2, 9A, 9b and 12 being located at the mixing chamber outlet independent of the g-orientation, the condenser/condensers being connected, between the (discontinuous) rotations about and/or below/above/laterally offset evaporator part, to a central cooling system, and the temperature of the cooling liquid being controlled and being regulated to constant values variable in a controlled manner, depending on the product.

(vi) Use of physical tranport reactors (PTRs), which significantly increase the evaporation rate of at least one production rate speed-determining component by utilizing controlled flow ratios and by the use of linearized and non-linearized vapor sources with and without the use of regional (in the PTR) and global (relating to the process as a whole) flow circuits, and also without an excessive temperature increase in comparison with hydrostatic pressure ratios (HSR) and, at the same time, obtain the flow propulsion force from the associated Diaphragm* (e.g. between n and (n+1)). The use of PTRs is decisive for the final overall design of the evaporation plant. For the evaporation rate of a PTR, the arrangement of the evaporation sources in relation to one another and their surface as well as the ratio of this arrangement to the suction flow play an important part in determining the productivity $Q_{max}(S)$ of an entire plant operating the abovementioned vapor deposition process.

11. Extrinsic control forms II, here the condenser level

Various processes propose, for vapor deposition, reciprocal condenser movements and/or deposition to form blanks curved in at least one direction of translation. A PVD blank, the surface temperature (surface temperature intervals) of which is to be kept as constant and/or as low as possible and which is to be processed, without preforming, in an extruder, etc., requires a continuous batch mode in a lateral form of movement (e.g. in a, where appropriate, horizontal plane). A continuous batch mode in a lateral form of movement with blanks, the surface temperature (surface temperature intervals) of which is independent of this lateral form of movement, however, requires a circular or circle-like movement of the condsensers for as efficient a space utilization as possible and resulting vacuum control.

11.1 Restriction to reciprocal condenser movement

During vapor deposition, that part of the blank which is exposed to the vapor heats up, whilst the unexposed part cools again. The disadvantage of the reciprocal plank condenser in comparison with the circular process is that the resulting temperature intervals $\Delta T=T_{max}-T_{min}$ at the ends of the reciprocally moved plank collector increase with the length of the condenser and blank in comparison with DT in the middle of the condenser, i.e. $d\Delta T=k*l_{con}$, and the value $d\Delta T$ increases particularly for high conveying flows (cf. FIG. 11). However, for as nonporous a production as possible of solid cross sections of metastable phases (cf. EP-Application 94111991.9, Aug. 1, 1994,and PCT Application PCT/EP95/02882 of Jul. 19, 1995) with as low a degree of conversion as possible in the direction of an equilibrium structure, the resulting temperature interval $\Delta T$ must be kept as small as possible.

FIG. 11 shows a discontinuous temperature intervals $\Delta T$ on the blank surface as the fundamental disadvantage of the to and fro (ie. reciprocally) moved "plank" condenser (or "plank" collector, ie. the individual flat-plate condenser). This disadvantage is the background for the motivation to use rotating collectors in VD processes, but these have hitherto been considered only as rotating cylinders with a curved blank surface and along with the need for an exsitu forming operation before conventional further processing.

The need for a uniform $\Delta T=T_{max}-T_{min}$=const., ie. $d\Delta T(x)=0$, arises from the requirement for a compromise between the following points 1. and 2.:

1. The maximum surface temperature $T_{max}$ during vapor deposition should not exceed the transformation temperature $T_{trans}$ of the respective metastable phase (supersaturated mixed crystal, etc.), eg. in the desired end product. In proportion as $T_{trans}$ (eg. as a consequence of the choice of alloy) rises, the expected time $t_{exp}$, in which the surface can be exposed to the (hot) vapor, also increases. However, the relative time interval, in which the material is not exposed to the vapor, ie. $\Delta t \rightarrow \Delta t_{max}$, in the case of the to and fro (ie. reciprocally) moved "plank" condenser remains uninfluenced as a universal consequence of this. The temperature irregularity $d\Delta T(x)$ inherent in this process must therefore be eliminated by other means.

2. The minimum surface temperature $T_{min}$ must allow a minimal movement of the surface atoms, in order to eliminate stresses, microstresses and porosity occurring as a result of shadings, before, during and after the insitu consolidation operation (and the associated cooling).

The identification of the $T_{opt}<T_{transf}$, at which porosity no longer occurs, and (ii) the use of alloys with high $\Delta T=T_{transf}-T_{opt}$ as a consequence of the corresponding alloy constitution, (iii) the process solution of this quality problem lies in constant and as many as possible, but constant, vapor deposition operations during the circular movement (cf. FIGS. 12, 14 and 15). The limitations in the rotational speed and rotational diameter of a rotating condenser due to the resulting turbulences on the deposition surface make it necessary to have as many deposition chambers (21) as possible in the (g-independent)deposition level (cf. FIG. 9a) per complete circuit (eg. πD), this making it necessary, due to the process-specific suction flow routing to have vacuum chambers which are as flat as possible at an optimized, but constant distance h=fn (MFP).

By contrast, the inherent advantage of condensers moved in a circle is constant $\Delta T$ intervals over the entire condenser length $l_{con}$, i.e. $d\Delta T=0$, so that, with condenser surfaces moved in a circle, but at least in a plane, the surface temperature interval $\Delta T$ can be better homogenized and minimized. Appropriate g-independent circular processes constitute a basic condition for large-scale vapor deposition processes, for which the suction flow mode is indispensable (in a similar way to diecasting for casting processes). Logically, therefore, the batch mode operated in a circle or in another form of movement as vacuum-efficient as possible, if appropriate horizontal, is also indispensable for a vapor deposition process operated by suction flow.

11.2 Restriction to bent and/or curved/dis-shaped blank surfaces

A fundamental disadvantage of blanks evaporated on cylinders (i.e. with a bent surface) and/or on disks and/or of resulting workpieces (after in-situ consolidation) in comparison with blanks evaporated on flat-rectangular or virtually rectangular condensers (substrates) is the necessary preforming and/or machining operation before conventional further processing (rolling, extrusion, etc.). An "ex-situ" processing (including macroscopic consolidation, such as HIP) without preceding microscopic consolidation (e.g. microrolling, see below) and/or without air contact of non-compacted pores, is virtually impossible in the case of blanks which are bent over a significant proportion (to a great extent). The corresponding preforming/forming operation not only increases the operating costs, but, in the case of materials defects, also puts the blank, etc., itself at risk. In comparison with condensers having (sharply) bent (e.g. cylindrical) surfaces, the flat collector affords further advantages:

vacuum chamber and vacuum lock volumes to be evacuated which are relatively small in relation to the deposition surface unit, which signifies, particularly for vapor deposition processes operated by suction flow, a relief of the pump system and of the vacuum system cleaning work which may be necessary.

relatively little influence of the "background pressure" on the chamber dimensioning, i.e. relatively efficient possibilities for increasing the tonnage in terms of the necessary vacuum chamber technology (i.e. high (deposition) surface to (vacuum chamber) volume ratios).

constant impingement angles and/or impingement angle ranges of the corresponding vapor trajectories, hence relatively constant accomodation coefficients (ranges) (see below) and therefore the possibility of deposition rates and vapor deposition yields which are high per unit area (i.e. specific) as well as better control of porosity, thus resulting in lower requirements placed on/easier microconsolidation.

easily designed possibilities for the assembly and exchange of in situ consolidation plants outside the actual deposition region (21) (cf. FIG. 9a).

multiple deposition, relatively easily implemented in design terms, via (21) in one deposition level (e.g. n+2) cf. FIG. 12), thus resulting in relatively high deposition rates at relatively low (rotational) speeds of the condenser feed mode, and relatively low impact forces acting on the pulse of the vapor trajectories, along with a high possibility of control for avoiding the formation of a second oxide monolayer between the deposition intervals.

"Near-net shape" production of metal sheets (as a possibly primary large-volume product within the ductile materials).

Adaption of appropriate deposition system prototypes to mass production, without the need for a substantial variation in plant construction.

11.3 Flat (if appropriate, horizontal) batch mode and/or flat disks

Weighing up the advantages and disadvantages of previous vapor deposition solutions favors a continuous, where appropriate circular batch mode of flat condensers. The restrictions mentioned result in the batch mode, routed in one direction of movement, with a flat "Plank" condenser, preferably having rectangular side dimensions, with vapor deposition, repeated as often as possible and in a number optimized in relation to the spatial dimensions of the process, as the optimum condenser solution for the vapor deposition level in large-scale vapor depositon processes operated by suction flow (cf. FIG. 12).

Figure 15A:
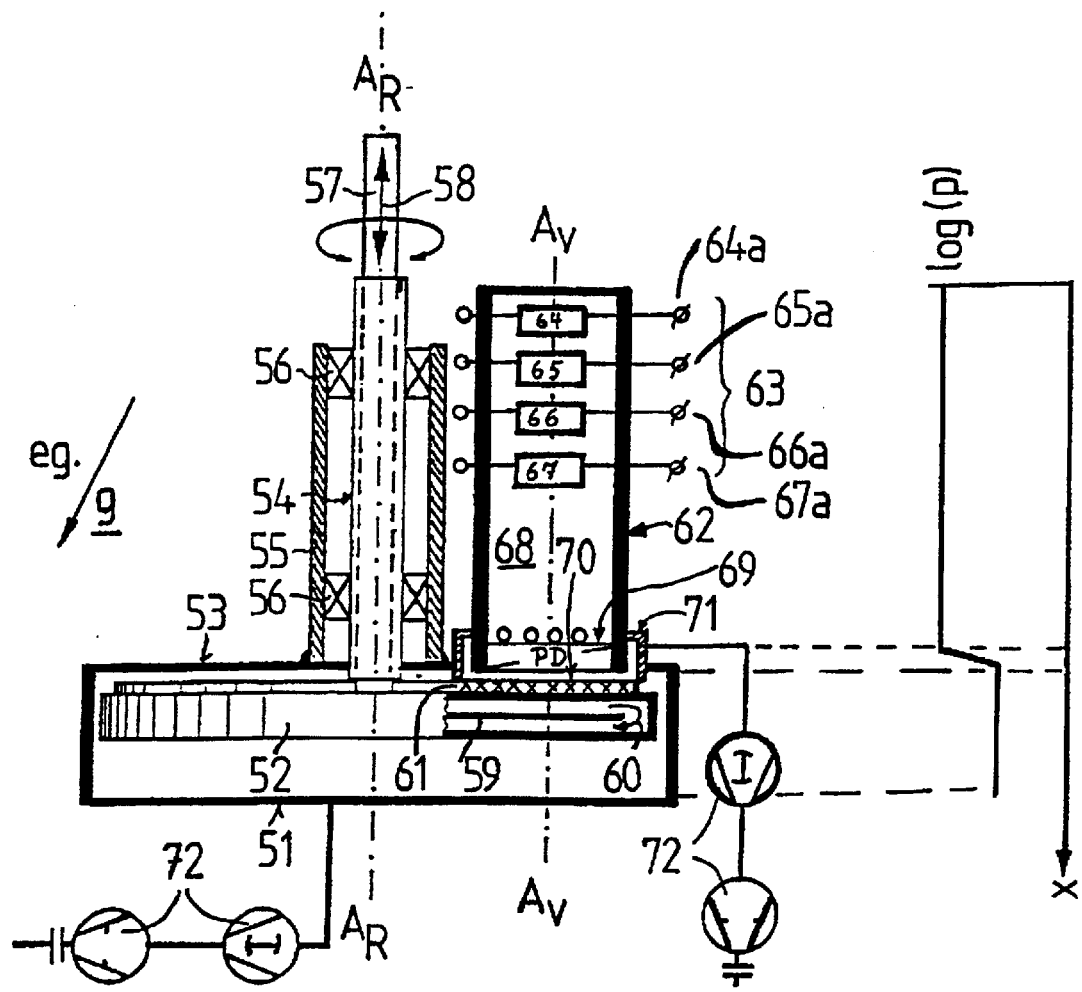
FIG. 15a Vapor deposition process operated by a single condenser in the form of a cooled disk in the vacuum chamber for relatively small pilot plants.
Figure 15B:
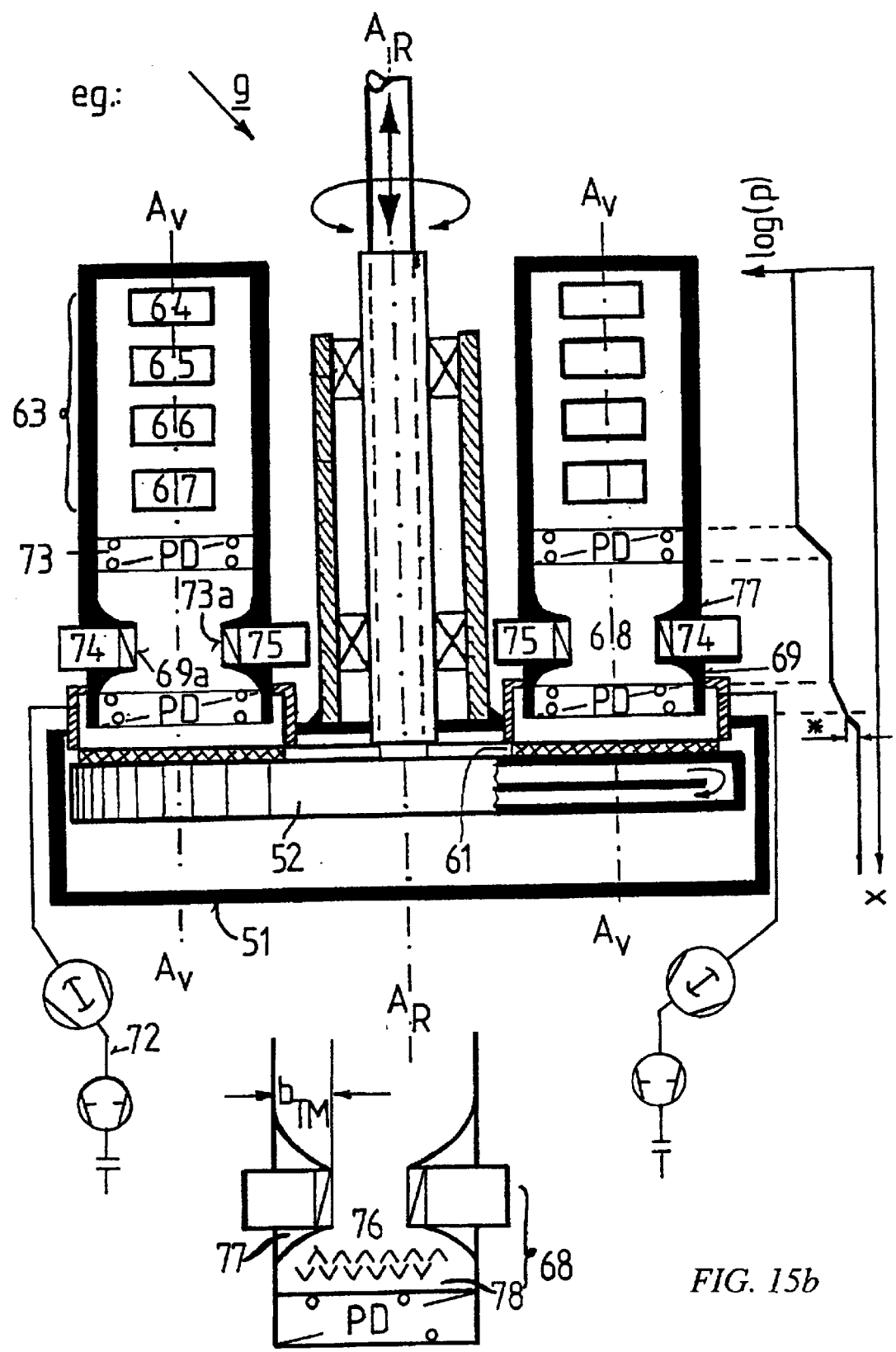
FIG. 15b As for FIG. 15a, here qualitative pressure difference as a result of separating segments between the intermediate chamber and the vacuum chamber for the blank.

The technical details are given in the description of FIG. 12 and of FIGS. 14 and 15. FIG. 15a shows compact designs of a PD-controlled and g-independent vapor deposition process II operated by suction flow, here circular process II (ie. $D\Delta T_A=0$, $T_A$ being the temperature on the (deposition-side) deposition surface of the blank), here a single condenser in the form of a cooled disk (52) in the vacuum chamber (51) for relatively small pilot plants, (53) bottom of the vacuum chamber, (54) hollow shaft, (55) tubular connection piece, (56) rolling bearing, (57) drive shaft, (58) displacement directions of the drive shaft, (59) guide plate, (60) controlled routing of a coolant flow according to the arrow 60, (61) alloyed blank, (62 and 62a) vapor shafts, (63) evaporation zone, (64)–(67) evaporators, (68) mixing zone, (69 and 69a and 73 and 73a) PDs, (70) condensation surface, (71) intermediate chamber, (72) pumping set, (73) evaporation zone, (74) and (75) further evaporators, (76) baffle wall and (77) flow elements for suppressing dead flows and for reducing the loss figure $\zeta$ and resulting $F_F$, (78) region of turbulent flow before entry into the PD before deposition (cf. FIGS. 9a and 9b), and width $b_{TM}$ in the range of $0 \leq b_{TM} < 0.45\ b_D$, and a) preferably eg. for pure materials, high evaporation rates and rotational speeds, whilst b) preferably eg. for alloys, relatively low conveying flows and rotational speeds of the cooling disk. FIG. 15b is as for FIG. 15a, here showing qualitative pressure difference as a result of separating segments between the intermediate chamber and the vacuum chamber for the blank.

In the batch mode accordingding to FIG. 12 and FIG. 14, the condensers are surrounded by a vacuum chamber which has the regions (31) and (34) and which arranged annularly or polygonally around a coaxial hollow shaft (13j). Located in the hollow shaft is a driveshaft (13i) for transporting the collector system which is assisted by sliding rams (24), sliding jaws (25), grippers (26) and roller tables (27) (cf. FIG. 9a). The hollow shafts are, if appropriate, rotatably mounted in a coaxial tubular connection piece (55), by means of two or more rolling bearings (56) (cf. FIGS. 15a,b). The driveshaft (13i) is rotatable about a g-independent axis of rotation $A_R$ and is directly connected to the condensers by means of coolant conduits for a preferably liquid cooling medium, said conduits being shown here in any more detail. In the batch system, the cooling medium is led further via a rotating distributor (andcollector) (13d) into the condensers and is led back to the cooling assembly (13f). The condensers possess cooling ducts which, if appropriate, are designed in meander form (FIG. 12, part b) or, via circular guide plate (59), allow controlled guidance of the coolant flow within the condenser ("Plank" and/or circular disk) (FIGS. 15a,b). The bottom (53) of the vacuum chambers in the deposition level is adapted to the shape of the vapor shafts, their transitions from the evaporation and/or mixing region (cf. 19, 19b and 19c in FIG. 14) to the Diaphragm* before deposition and the form of the latter. (Smaller, where appropriate pilot) plants with circular-disk-shaped condensers possess a concentric orifice in the vacuum chamber (51) for leading through the corresponding hollow shaft (54). By contrast, for the batch mode, the vacuum-tight guide rail, not shown in any more detail here, in which the coolant supply conduits rotate. Alternatively, the entire coolant distribution system, including (12a), (13b), (13c), (13d) and (13i), is accomodated in a vacuum chamber (13o) which, on the one hand, necessitates an enlargement of the total vacuum chamber volume and, on the other hand, dispenses with the guide rail. Furthermore, the two solutions are combined in such a way that the vacuum chamber system in the deposition level is composed of a plurality of vacuum chambers and a multiple chamber system with partial vacuums changing in steps is obtained: 1) the vapor deposition region (21) (side view (31)), which is separated by the (if appropriate, movable) partition (17) from 2) the region of in situ consolidation (21a) and by (is appropriate, movable) separating segments (33) from 3) the chamber lower part (34), and 4) the vacuum chamber (13o) which receives the coolant routing with as low a chamber height as possible and, at the same time, either connects the lower parts (34) or is additionally separated from them.

The great advantage of this condenser batch mode is the constant lateral speed vcon of the deposition suface in comparison with the sharply varying surface speeds ocon of a circular condenser. This results in constant $h_{\mathit{eff}}(F_0)$ values, wider $\Delta h_{\mathit{eff}}$ ranges for $\alpha_A = \alpha_T = 1$ and correspondingly better controlable conveying and deposition capacities Q(x) and Q(A) (see above). However, by means of the following alternatives for Diaphragm* structural parts, high vapor deposition efficiency is possible even for circular condensers and condensers having randomly differing surface speeds. The diaphragm structural parts for controlling the conveying capacity are an elementary precondition of the deposition capacity, finely adjusted, inter alia, by means of $v_{Con}$ and $\omega_{Con}$, and of the pressure gradients maintained by said deposition capacity as well as of the continuous operation of the abovementioned process, said continuous opera tion being made possible by the controlled deposition capacity. The abovementioned vapor deposition process therefore resembles the "melt-extraction" process and its further-developed variant most recently derived from it, namely the "melt overflow" process. FIG. 16 shows the principle of the "melt-overflow" process: whilst the propulsion force for the productivity of the "melt-overflow" process is proportional to the quantity of the melt supplied to the melt crucible (ST) and is acquired via the head and consequently via the head pressure of the melt at the overflow (gap), the rotational speed of the (if appropriate) cooled drum determines the quality features of the resulting band and/or foil, such as the thickness, the resulting structure and the properties. In the abovementioned process, the ratios are true to the maxim that vapor deposition represents a reversed event in the series of possible processing technologies. In an exact reversal: the speed of the condensers, the resulting accommodation coefficient and the vacuum=suction of the vacuum chamber of the condensation level determine the rate for the yield and therefore productivity of a conveying capacity Q controlled by a Diaphragm*. W=wheel; M=melt; F=filament.

In "melt extraction", by means of a roller (drum), if appropriate notched, which travels over the melt surface, this melt layers are "drawn" onto the drum surface and corresponding, sometimes very wide-band films are produced by subsequent rapid solidification (cf. R. E. Maringer and C. E. Molby, J. Vac. Sci. Technol. 11, 1974, pp. 10671071, U.S. Pat. Nos. 3,522,836 (1970) and 3,605,852 (1971). The "melt overflow" process is a further development of "melt extraction", the propulsion force for film production was still purely the rotational speed of the drum, in the "melt overflow" process the rotational speed determines essentially the quality of the resulting films, whilst the propulsion force for film production is supplied by the follow-up of the melt and the resulting height/level of the melt surface.

Figure 17:
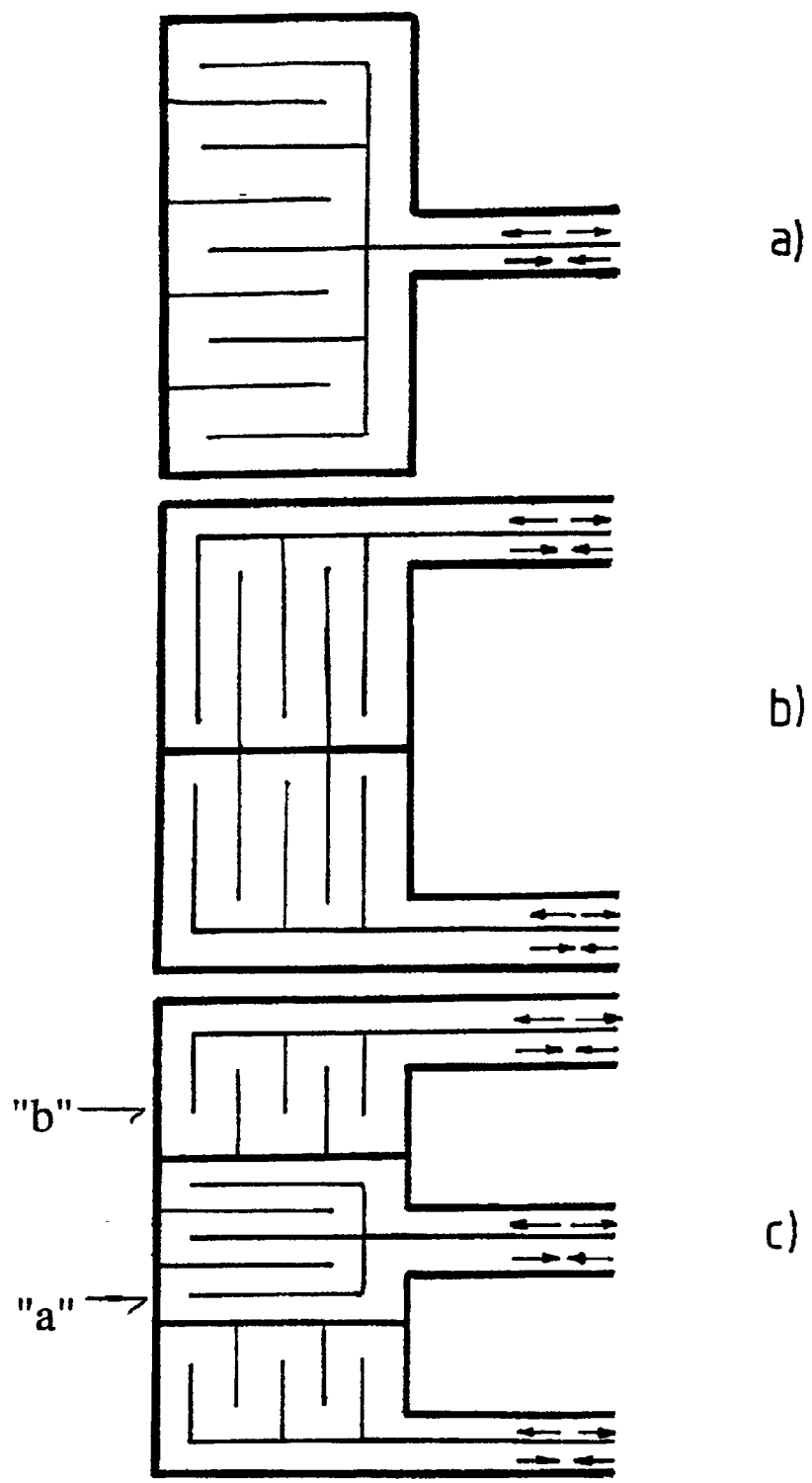
FIG. 17 Principle of the increase in efficiency of the cooling capacity of a given condenser surface in the case of a given cooling system with a given cooling medium.

In a similar way, in the abovementioned vapor deposition process, the condenser allows a kind of "vapor extraction" from the mixing chamber or the (last) vapor chamber, the difference being that the PD controls the conveying capacity and, in interaction with the state of the surface of the deposited blank (speed, roughness, temperature, etc.), the accomodation coefficient and the resulting deposition capacity. Contrary to the follow-up and consequently the height pressure of the melt, the vacuum chamber, dependent on the pumping speed, now ensures the propulsion force for the material conveyance (not the speed, etc. of the substrate surface, although it is, of course, achieved indirectly via the resulting accomodation coefficient), whilst the state of the substrate surface, including its speed, allows the quality of the deposited product and a continuous layer buildup which makes (pre)compacting (of corresponding "flakes" of thin films, etc. chopped small, and produced from the melt) unnecessary in further processing. At the same time, the meander shape of the at least one internal cooling duct incorporated in the condenser ensures the efficient utilization of a given cooling capacity per unit of a deposition surface of a given cooling system as well as a homogenous metastable material-structure and/or phase profile in the y-/z-transition of the deposited blank (see FIG. 17 showing principle of the increase in efficiency of the cooling capacity of a given "plank" condenser surface in the case of a given cooling system with a given cooling medium: a) 1 meander duct, b) 2 meander ducts and c) 3 meander ducts, ie. 1 times type "a" and 2 times type "b"; arrows: alternatives for the direction of the coolant flow).

The suction flow as the characterizing propulsion force for the entire material conveyance in the abovementioned process is the basis for its versatile applicability, including the recycling of structural materials via the vapor phase (distilation) such as magnesium and/or Al—Li alloys and, in particular, those alloys which are produced by means of this process itself (cf. PCT Application PCT/EP/02882 of Jul. 19, 1995). Whereas, in conventional vapor deposition processes, material conveyance is driven by the pressure flow which leads locally to overpressures and therefore to locally more frequent collisions of the elementary particles in the vapor phase, in comparison with the average value of a corresponding vacuum chamber, and consequently to an increased risk of condensation, the suction flow ensures the opposite: local, regional and controllable underpressures and optimum control of the process-specific condensation risks. Whereas, in the vapor deposition process driven by pressures flow, the element having the lowest (saturation) vapor pressure is speed-determining for productivity and the rest (depreciation, attractiveness, etc.), in the abovementioned process these factors are dependent primarily on the operative accomodation coefficients $\alpha_T(\alpha_A)$ and their process-specific control and depend only indirectly, via the vapor conveying capacity, on the saturation vapor pressure of the composition involved, hence being primarily a question of the functioning capacity of Diaphragms*. The functioning capacity of the Diaphragms* then also governs the control of the influence of pump-specific irregularities, such as underpressure oscillations, caused by the pumping frequency. The abovementioned process provides, for the first time, a vapor deposition process which is coherent in its functioning as a whole.

SECOND PART of the invention: Diaphragm principles and diaphragm alternatives, broadened (main) Diaphragm* design (I)

The process claimed in EP Application 94111991.9 and broadened here contains, where appropriate, at least one vacuum chamber with a mixing region for the chemical (i.e. via partial vapor pressure) and physical (density) equalization of the at least one component in the vapor flow, which component, due to the basic forms of construction claimed for the necessary porous Diaphragms*, ensures not only operationally friendly, but also accurate control of the concentration of the vapor being deposited, from the point of view of the relatuvely high specific deposition rates at high deposition temperatures of at least one of the components (such as, for example, of magnesium) and widely differing evaporation pressures and/or evaporation temperatures of the components. This qspect ensures extremely high homogeneity (i.e. inhomogeneities <0.2% by weight per $mm^2$ for simple alloys, but at least <1% by weight per $mm^2$ even for very complex alloys) and is highly relevant particularly with regard to the resulting mechanical properties, since these are highly concentration dependent and the users demand (where appropriate, accurate) specifications. This SECOND PART of the invention therefore relates to further options for optimizing the control of concentration and therefore the resulting chemical homogeneity (distribution of the alloy constituents) and physical homogeneity (distribution of the resulting phases and lattice defects) in the product.

The Diaphragm* claimed in EP Application 94111991.9 consists of bifurcations, geometric elements having high and low resistance coefficients $c_F$ (german: $c_W$) at specific locations, of flow series resistances with and without a transdiaphragm differential volume, which occur as a result of flow branches (and bifurcations), and of apertures. Furthermore, combinations of diffusers and nozzles in front of bifurcations as claimed. In the following part, these Diaphragm* elements are further specified and new Diaphragm* elements are added, adapting the porous diaphragm technology of the abovementioned vapor deposition process to the variety of combinations of the components which are alloyed with one another and/or intermixed via the vapor phases The question which must first be addressed is: "How operationally friendly and maintenance-friendly is the functioning of the process?" (cf. EP Application 94111991.9 and FIRST PART of the invention). The functions of the porous diaphragm Diaphragm* (PD) include:

1. Reservoir formation
2. Local change of state (in particular, PD type 1) for the purpose of controlling the macroscopic change of state within the gas phase between the plant units.

3. High conveying flow in light of 1. and 2. It becomes evident, precisely here, that a flow resistance offers no solution, since, although allowing high conveying flows, possibly even reservoir formation, it does not permit local changes of state dT/dx, dp/dx and/or dV/dx, particularly with regard to controlled deposition capacities (see above).

4. Co-control of vapor deposition, with refernce to 1. to 3., i.e. local changes of state for the purpose of controlling the macroscopic change of state, including change of assembly (in particular, PD type 2), and at the same time interaction between the conveying capacity and lateral speed of the collector system.

The fact that active T/p control and resulting pro cess control are taken over by the PD diaphragm creates a dynamic equilibrium which is dictated, on the one hand, by Boyle's law conditions and, on the other hand, by the required vapor deposition productivity. Without active T/p control by the PD, either only a high conveying capacity without local T/p control is possible, or vice versa. In the case of a vapor deposition process with controlled synthesis, i.e. alloying in the vapor phase, however, optimization of the evaporation rate of the speed-determining component or components (e.g. with a drag effect; see chapter 10, point (vi) in FIRST PART and chapter 2 in SECOND PART of the invention) is secondary, as long as the solution for diaphragm technology controlling the suction flow does not ensure sufficiently maintenance-friendly and operationally friendly as well as reliable control of retentivity (reservoir formation) and transdiaphragm change of state, i.e. $F_D$.

Control of Reservoir Formation and Transdiaphragm State Gradient

According to the principle of momentum, the change in the flow pulse I=m*v (m=flow mass, v=flow speed) in the flow duct (with index 0) is equal to the force acting from outside, i.e.

$$\underline{F}_0 = dI_0/dt = d(m_0 v_0)/dt \tag{35}$$

and taking into account the conventional flow resistance for flowing media this yields:

$$\begin{aligned} \Sigma\underline{F}_0 &= \underline{F}_p - \underline{F}_F \qquad (36)\\ &= (dq_{m,0})(\underline{v}_2 - \underline{v}_1)_{m,T}\\ &= (dm_0/dt)(\underline{v}_2 - \underline{v}_1)_{m,T}\\ &= (d(q_{v,0}\rho_0)/dt)(\underline{v}_2 - \underline{v}_1)_{m,T}\\ &= (d(A_0 v_0 \rho_0)/dt)(\underline{v}_2 - \underline{v}_1)_{m,T} \end{aligned}$$

i.e. only the difference in the speed of the medium flowing in (e.g. at position 1) and of the medium flowing out (e.g. at position 2) is important for the environment outside the corresponding flow resistance. Near the flow resistance, the mass $m_1$ and temperature $T_1$ and, in a first approximation, also the density $\rho_1$ (n.b. the compressibility of a gas in the flow duct does not signify any restriction of the following statements) of the conveying flow q flowing in per unit time in a conventional flow resistance are identical (i.e. constant) to the mass $m_2$, temperature $T_2$ and density $\rho_2$ of the medium flowing out of the flow resistance per unit of time. Consequently, the stationary flow state in a flow resistance is dictated by (i) the local flow cross section $A_0$ and (ii) the (local) surface quality and (iii) the (local) form of the flow resistance. In the stationary flow state, the sum $\Sigma F_0$ of the forces operative in the flow state, the sum $\Sigma F_0$ of the forces operative in the flow resistance, i.e. $\underline{F}_P$=fn(A) and $\underline{F}_F$=fn(ii and iii) is not only a vector sum of the amount of the difference in pulse forces on exit (e.g. at speed $\underline{v}_2$) and on entry (e.g. at speed $\underline{v}_1$) in a specific region of a throughflow cross section $A_0$, i.e. $A_0$ ($p_2$–$\underline{p}_1$), but they also presuppose one another, i.e. $\underline{F}_P$ and $\underline{F}_F$ are defined by themselves and, if appropriate, also cancel each other out again.

By contrast, with the porous diaphragm Diaphragm*, the transdiaphragm flow pulse is operationalized and the relation between $F_P$ and $F_F$ uncoupled in plant terms by the force $F_D$ at the porous diaphragm. In contrast to the conventional flow resistance, transdiaphragm material conveyance in the Diaphragm*-controlled vapor deposition process is associated not only with a change in the transdiaphragm flow speed v, but, if appropriate, also with a variation in the transdiaphragm flow temperature T and/or a reduction in the transdiaphragm conveying mass m and/or the density ρ of the transdiaphragm vapor flow from one plant unit to the next of the vapor deposition process. According to EP-Application 94111991.9, Aug. 1, 1994, and PCT Application PCT/EP95/02882 of Jul. 19, 1995 $F_D$ is composed of:

$$F_D = F_P - F_F \tag{37}$$

i.e. the difference between $F_P$ (that is to say, the external (pressure) forces which act on the flowing gas or the flowing vapor) and the conventional (internal) flow resistance, $F_F$, although (apart from exceptions, i.e. for $F_D<F_S$ and $F_D$=approx. $F_S$; see chapter 10, point (vi) in FIRST PART and chapter 2 in SECOND PART of the invention) $F_D>F_F$ is preferred. $F_F$ consists of the flow resistance which occurs as a result of (external) friction between the flow and the surface or surfaces of the transdiaphragm pipe inner wall and due to turbulences and the resulting hydrodynamic pressure losses (corresponding to the hydrostatic pressure increases).

By contrast, $F_D$ increases the pressure gradient, without increasing $F_F$, and is therefore the difference between $F_P$ and $F_F$. For a given $F_P$, $F_D$ rises in the mass in proportion as $F_F$ falls, and vice versa. In order to increase the specific coneying capacity Q(S), (i.e. $Q_v(S)$ and $Q_m(S)$, see below), therefore, the transdiaphragm loss figures z of the porous diaphragm Diaphragm* are minimized. Thus, the friction between the flow and flow duct inner wall under the conditions of a laminar gas flow through the Diaphragm* can be ignored in the first approximation (cf. EP Application 94111991.9). Consequently, $F_D$ also contains those fractions which, without the measures for the buildup of $F_D$ (cf. chapter on bifurcations), would necessarily increase $F_F$ only (e.g. transdiaphragm bends, transdiphragm (not directly at the outlet!) flow duct constractions etc.).

Def.→: In contrast to the frictional resistances $F_F$ of the conventional flow resistance, the force of the Diaphragm* $F_D$ is an additional force for building up retentivity with a resulting vapor reservoir in an (e.g. conventional) evaporation chamber, without frictional losses and without causing material separation, said force being used, inter alia, for assisting and/or controlling the resulting macroscopic state gradient over the corresponding interface during transdiaphragm material conveyance (also depending on the reservoir state) (cf. EP Application 94111991.9), including controlled vapor deposition.

The vapor reservoir is in a state of communication with other reservoirs, said state being imparted by the pumping speed via the vacuum, the vapor discharged by the porous diaphragm being expanded and/or accelerated in comparison with the vapor flowing into the same porous diaphragm. $F_P$ also includes a pressure gradient dp/dx brought about by the suction force, i.e. $F_P$=fn (dp/dx), and the resulting suction force at the suction force at the flow outlet of the respective flow duct and all local propulsion force changes during transdiaphragm material conveyance (i.e. $F_P$=fn ($F_{Suction}$), in which $F_{suction}$=fn (dp/dx); n.b. local propulsion force changes in the flow duct from pressure to suction are particularly important for the design of the physical transport reactors (see chapter 10, point (vi) in FIRST PART and chapter 2 in SECOND PART of the invention).

The stationary flow state in the porous diaphragm Diaphragm* has superposed on it, where appropriate, a nonstationary flow state $$\delta q_v/\delta t = \delta q_v/\delta x * \delta x/\delta t \qquad (38)$$

(n.b. $q_v$=conveying flow) which is induced by $F_D$. Thus, the use, for example, of transdiaphragm bifurcations leads to a permanent difference between the conveying flow $q_v$ flowing into the porous diaphragm from one chamber and the conveying flow $q'_v$ flowing out into the following chamber. The circular flow results in a nonstationary flow state especueially when the vapor flow is heated during transdiaphragm passage, before being separated via a bifurcation.

Furthermore, the speed variation of the diaphragm flows, which is induced by a variation or variations of T, m and/or ρ, also contains a nonstationary fraction as a result of the interaction of unstable flow states which occur in bent flow and/or bifurcation regions as a consequence of directed flow routings and which are comparable to the oscillations during growth on a dendrite tip. These include the breakaway and transition of unstable vortices into the stable flow and the breakaway and transition of unstable flow boundary layers into stable vortex zones (dead flows). To explain: in the present vapor deposition process a distinction is made between turbulent flow (e.g. with a logarithmic or exponential transverse flow profile, the size of the (micro) turbulences being<<the flow duct diameter $d_z$ or (for a bend)<<$d_k$) and turbulences (including vortex streets) and (turbulent) dead flows, the dimensions of which are in order of magnitude in the range of $d_z$. The resulting local variations in the transdiaphragm flow speeds are superposed and, where appropriate, dominate a change of state in the case of a flow through a comparable conventional flow resistance and, consequently, also isolated plant measures in and on a (transdiaphragm) flow duct according to (i)–(iii) (see above).

The transdiaphragm T-, m- and/or ρ-variations of the (transdiaphragm) flow which are achieved by the abovementioned invention control the transdiaphragm changes of state, including the speed, conveying flow and/or mass flow, and their stationary and nonstationary variations, whereas, isolated measures under conventional conditions according to (i)–(iii) afford no significant advantage for the vapor deposition process. The quasi-nonstationary permanent state of the transdiaphragm T- and/or m- and/or p-variations becomes an operating state set by the product. Nonstationary states deliberately taken into account are restricted to fully intermixed vapors, i.e. to porous diaphragms for controlling the conveying flow of the alloy components and the conveying flow for the vapor deposition of pure components, whilst, in the case of porous diaphragms for controlling the main components of alloys, said states are as far as possibly eliminated.

Control Variables for Controlling the Transdiaphragm Flow Pulse

1. Surface quality (roughness Δ)

A given plant design for the abovementioned vapor deposition process controlled by a porous diaphragm, with (product-) predetermined requirements based on the transdiaphragm state gradients (dp/dx, dT/dx by the correponding components) and on reservoir formation ($F_D$, e.g. by concentration and conveying flow) makes it necessary, for several reasons, to have a (locally) high transdiaphragm flow speed $v_0$, including:

1. maximization of the (overall) conveying flow $q_v$ (or $q_m$, which is proportional to the Re number $Re=v_0{}^*D_H/\nu$, see below) in the case of limitations placed by the requirements of dp/dx, dT/dx and $F_D$ on the maximum hydraulic diameter on entry into the porous diaphragm, i.e. $D_{H,I}$ (max) of the corresponding transdiaphragm flow ducts.
2. optimization of the transdiaphragm (i.e. regional) heat transfer (i.e. of the Nusselt number, cf. next chapter) from the superheated porous diaphragm to the relatively "cold" vapor flow before entry into he mixing chamber.
3. Maximization of the pressure ratio between the flow on entry into the porous diaphragm, $p_I$, and the vapor pressure in the corresponding evaporation unit, $p_{int}$, when bifurcations are used for building up a bifurcation backflow with $p_B$ on return entry into the corresponding chamber, so that $$P_I>P_B>P_{int} \quad (39),$$

i.e. maximization of the local pulse at bifurcations (cf. next chpater but one).

4. maximization of the (regional) yield during deposition (i.e. undisturbed deposition over a controlled distance downstream of the last Diaphragm* as far as the condensation surface, i.e. minimization of the deposition losses and of contamination of the deposition chamber and of the pump system, including the load on, if appropriate, preceding gas scrubbers, vapor depositors, cyclones, etc. (see further below)).

For the efficient stepup of a given pumping capacity of a given pumping system to transdiaphragm flow speed, therefore, a minimization of the frictional losses between the transdiaphragm flow and transdiaphragm flow routings (and/or walls, including nonbent and bent flow ducts, tubes, pores, heat exchangers, diffusers, nozzles, (separating and converging) bifurcations, bends, valves, etc.) is indispensable. The effective loss figure per unit length of a nonbent flow duct, $\lambda_{eff}$, is, for Re numbers <2000, dependent only on the Re number (cf. FIG. 18). FIG. 18 shows loss figures due to friction in the nonbent flow duct, λ, with (top) homogeneous and (bottom) heterogeneous surface roughness Δ as a function of the Re number. For Re >2000 (in the case of a homogeneous roughness approximately in the region of Re>4000), $\lambda_{eff}$ is also dependent on the relative roughness $$\underline{\Delta}=\Delta/D_H \quad (40)$$

and consequently on the mean height of an individual unevenness, Δ, and the hydraulic diameter $D_H$, in which equation, for example, for the circular cross section $D_H=D_0$
for the rectangular cross section $D_H=2\ (a_0{}^*b_0/a_0+b_0)$)
for the annular cross section $D_H=D_{ext}-D_{int}$
and for an arbitrary cross section $D_H=4^*A_0/U$
with $D_0$=diameter, $a_0$=height and $b_0$=width and $D_{ext}$=external diameter and $D_{int}$=internal diameter and $A_0$=flow cross section area and U=circumference of the respective flow duct. Above an Re number range of $$Re>560^*\Delta/D_H \quad (41)$$

(in the case of a homogeneous roughness of $Re>D_H{}^*(217.6-382.2\ \log(\Delta/D_H))/\Delta$), $\lambda_{eff}$ is dependent only on the relative roughness $\underline{\Delta}$. On account of the limitation in $D_H$, i.e. for given $D_{H,1}(max)$, Re is also limited toward higher values and $\underline{\Delta}$ toward lower values by the absolute value $\Delta$. It therefore goes without saying that, for high conveying flows, etc., not only high transdiaphragm flow speeds are indispensable, but also $\Delta$ values which are as low as possible. A basic precondition for transdiaphragm material conveyance in the case of high Re numbers is therefore a smooth (as possible) pipe inner wall or many (as many as possible) smooth pipe inner regions.

Technical Solutions (in Connection With the Abovementioned Process)

The methods for achieving a very smooth but at least controlled surface (surface quality) of transdiaphragm duct inner walls, i.e. with $\Delta$ values which are as low as possible, include 1. polishing of the (core) materials (e.g. steels., superalloys, intermetallics, etc.) and of the (e.g. refractory) covering layers, the inner wall roughnesses of metallic flow ducts, including those with a (refractory (metal) or ceramic, etc.) protective layer against abrasion, corrosion, etc., being, specifically during commissioning, preferably in the range of 0.1–10 µm, but at most not above a range of 5 µm<$\Delta$<300 µm, and/or 2. protection against moisture and corrosion outside operation, which is achieved, where appropriate, by sealing the plant under a vacuum and/or protective gas ($N_2$, Ar, etc.), a very smooth surface of the pipe wall being very important particularly in the region of the bifurcations (i.e. part flow quantity branches, cf. EP-Application 94111991.9, Aug. 1, 1994,and PCT Application PCT/EP95/02882 of Jul. 19, 1995) for pulse preservation during backflow via bifurcation backflow ducts (see above) and/or for Diaphragms* upstream of the deposition level (type 2 of the Diaphragms*, see PART ONE of the invention), including the geometric elements for flow routing at corresponding flow outlets and/or at series resistances, with or without a transdiaphragm vapor reservoir, and the number of welds, beads, sealing joints, etc. being minimized particularly in these regions and also, in general, in the transdiaphragm flow ducts, and/or 3. the use of diaphragm materials made from (unpolished) ceramics, stone, concrete, cement, wood, etc. and/or corresponding (unpolished) layers, the corresponding $\Delta$ values at commissioning being preferably in the range of 0.001–0.8 mm, but at most not above a range of 0.3<$\Delta$<9.5 mm, and the relatively rough diaphragm walls being used, irrespective of the diaphragm material, in regions in which a high flow resistance and/or boundary layers with high heat exchange are required locally, for example for producing high transdiaphragm dT/dx gradients (cf. EP-Application 94111991.9, Aug. 1, 1994, and PCT Application PCT/EP95/02882 of Jul. 19, 1995):

a) In the case of geometric elements at a mean distance "h" before inflow into the Diaphragm* for the maximization of intermixing operations and/or local turbulences.

b) Diaphragms* of type 1, i.e. in the region of transdiaphragm, (i.e. partial (vapor) reservoir formation in the Diaphragm* itself, and/or in the case of the local use of heat exchangers in which a turbulent flow is preferred (cf. nect chapter). Turbulent flow occurs from $v > v_{lim}$, $v_{lim}$ being in the case of heterogeneous roughness (at $v = \eta/\rho$, cf. equation (94)):

$$v_{lim} = 26.9 * v/\Delta \qquad (42),$$

and $\Delta$ being locally an important design variable for increasing the Nu number. The most important difference between the geometric elements and the flow ducts and/or flow duct constituents is that the flow flows round the geometric elements, whereas it flows through the latter. Intended turbulences (e.g. upstream of the flow inlet and supprssion of the turbulences, inter alia, at the flow outlet) are therefore dependent primarily on further details of the porous diaphragm (cf. next chapter).

2. Transdiaphragm flow ducts with (i) heat exchangers and (ii) $D_H$ widenings (diffusers) and/or (iii) transdiaphragm plasma guns In comparison with conventional vapor deposition processes, the stepped vacuum chamber system of the abovementioned vapor deposition process achieves a global (macroscopic) orientation of all the vapor trajectories in the direction of the deposition level, irrespective of the extent to which deflection of the global flow (global trajectories) occurs (regionally) in individual sections of the process, for example as a result of crucibles, baffle plates in the mixing chamber, etc. Furthermore, trumpet-like and/or diffuser (-like) and/or Laval nozzle (-like) flow duct outlets, including geometrical elements having low resistance coefficients, just before deposition minimize the turbulent fractions in the boundary layer and consequently the frictional losses, in order to exercise better control over the pulse of the vapor flow over the distance to the moved vapor deposition level (cf. EP-Application 94111991.9, Aug. 1, 1994,and PCT Application PCT/EP95/02882 of Jul. 19, 1995). In both instances, more efficient vapor deposition is carried out by control over the macroscopic and microscopic movement of the vapor atoms and/or molecules, in comparison with a movement which is achieved in a conventional vapor deposition process, i.e. in a chamber system without (transdiaphragm) pressure gradients controlled by a porous diaphragm.

To (i) by contrast, for heating large conveying quantities at a high flow speed over as short a distance as possible before entry into the "hot zone"=mixing chamber, a molecular flow, i.e. a turbulent boundary layer with $$v = (3kT/m)^{0.5} = (3RT/M)^{0.5}$$

Figure 19:
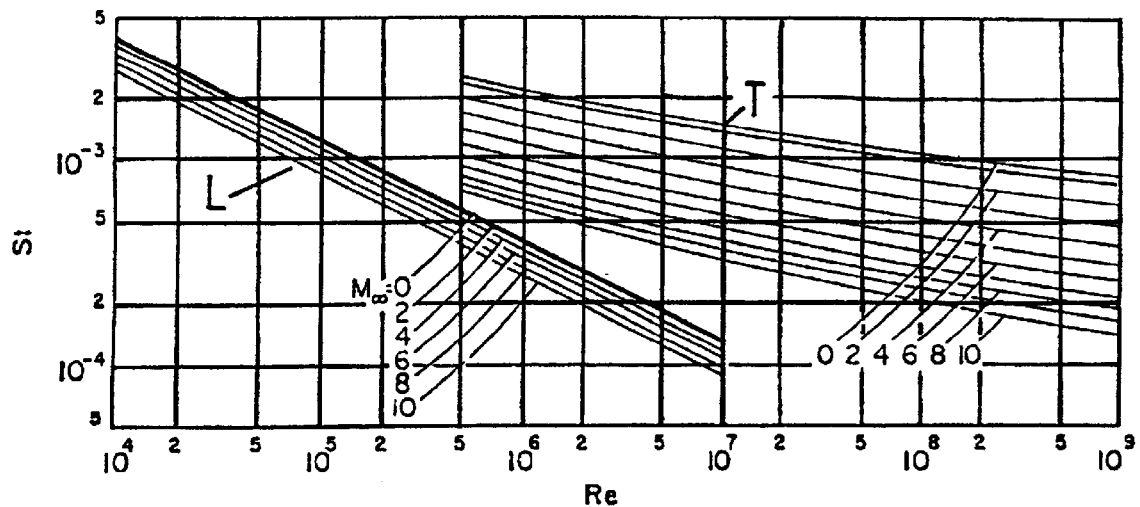
FIG. 19 Theoretical Stanton number St=Nu/(Re*Pr) of a gas as a function of Re number and Mach number as derived from the locally effective heat transfer coefficient h.

(n.b. m=molecular weight, M=molar weight) is advantageous (cf. FIG. 19 showing theoretical Stanton number St=Nu/(Re*Pr) of a gas as a function of the Re number and the Mach number, derived from the locally effective heat transfer coefficient h), in practise $v_{eff}$ seldom exceeding one third of the theoretical value. Frictional losses due to molecular boundary layer movements and/or flows are, (within certain limits), a contribution to a more efficient heating and, in comparison with a homogeneous surface quality, can be induced by a) heterogeneous roughness of equal quality, b) greater absolute roughness and c) a reduced inflow cross section $D_{H,1}$ (cf. preceding chapter). Furthermore, for a given speed and roughness, heating by d) the amount of contact area between heat exchanger and flow increases.

Figure 23:
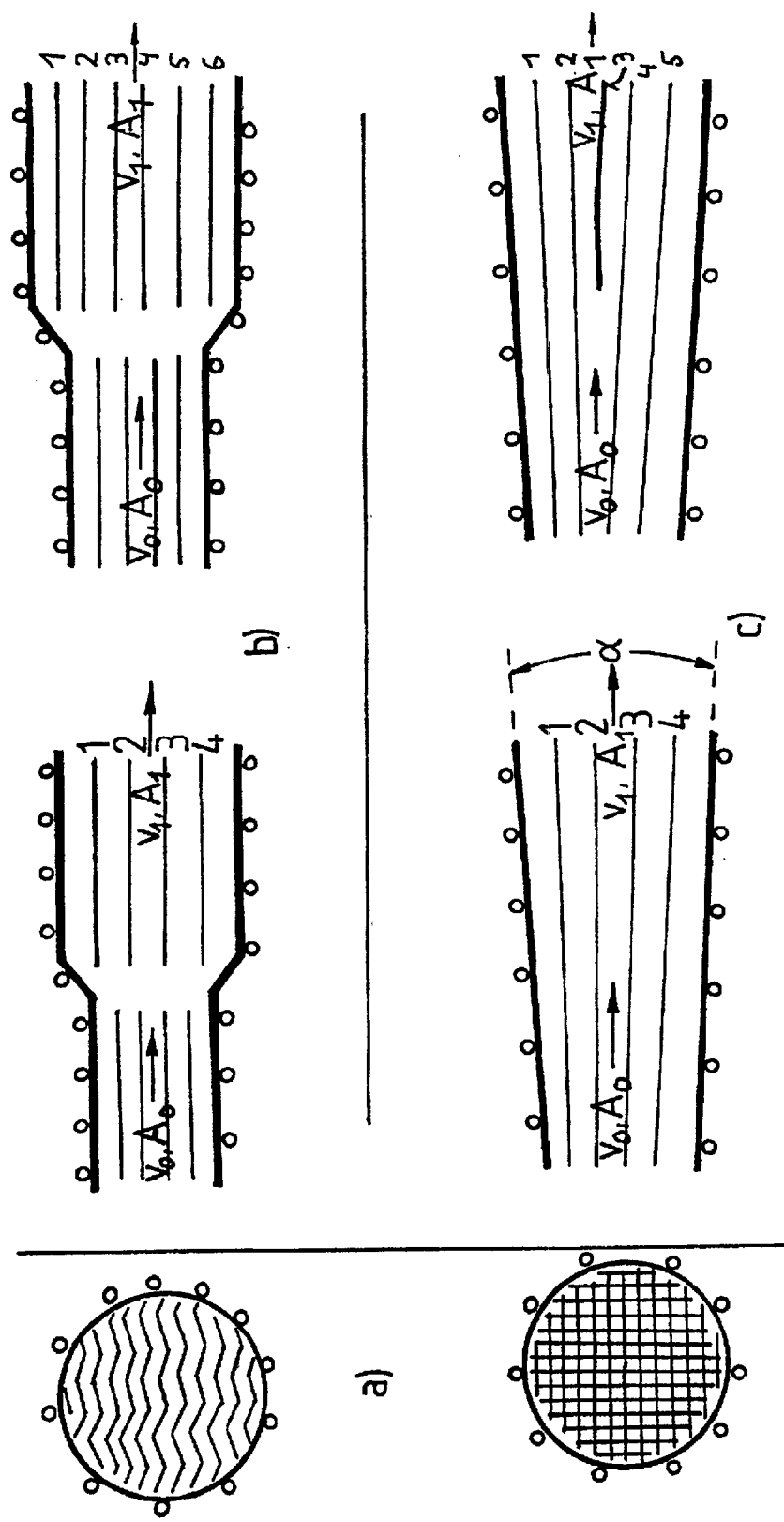
FIG. 23 Flow ducts with heating ribs of heat exchanger.

To heat a gas or vapor during transition from the evaporation chamber at temperature $T_1$ into an evaporation chamber at temperature $T_1$ into an evaporation or mixing chamber at $T_2$, where $T_2 > T_1$, if appropriate $T_2 >> T_1$, therefore, a superheated fine-mesh lattice is inserted into the flow duct, the mesh size being selected in such a way that the pumping speed per unit area of the mesh cross section, i.e. S/A with $$A = q/v = q*(M/3RT)^{0.5}$$

does not exceed a value of 10 l/($cm^2$*sec) and is preferably in the range of 0.01 to 5 l/($cm^2$*sec). Compact heat exchange surfaces are achieved by means of thin platelets which are arranged in a honeycomb-like manner and/or are nested crosswise one in the other and through which the gas or vapor flows in parallel during transdiaphragm material conveyance. FIG. 23 shows flow ducts with heat exchanger, a) cross section with a honeycomb, and latticed arrangement of the transduct heating ribs and b), c) longitudinal section with b) discontinuous (step-shaped or staircase-like, $\alpha$=approx. 80°) and c)continuous duct widening (diffuser) and $\alpha$=10° and (on the left) equidistant widening of the ribs and (on the right) proportional increase in the number of heating ribs as indicated by the numbers in FIG. 23.

Figure 20:
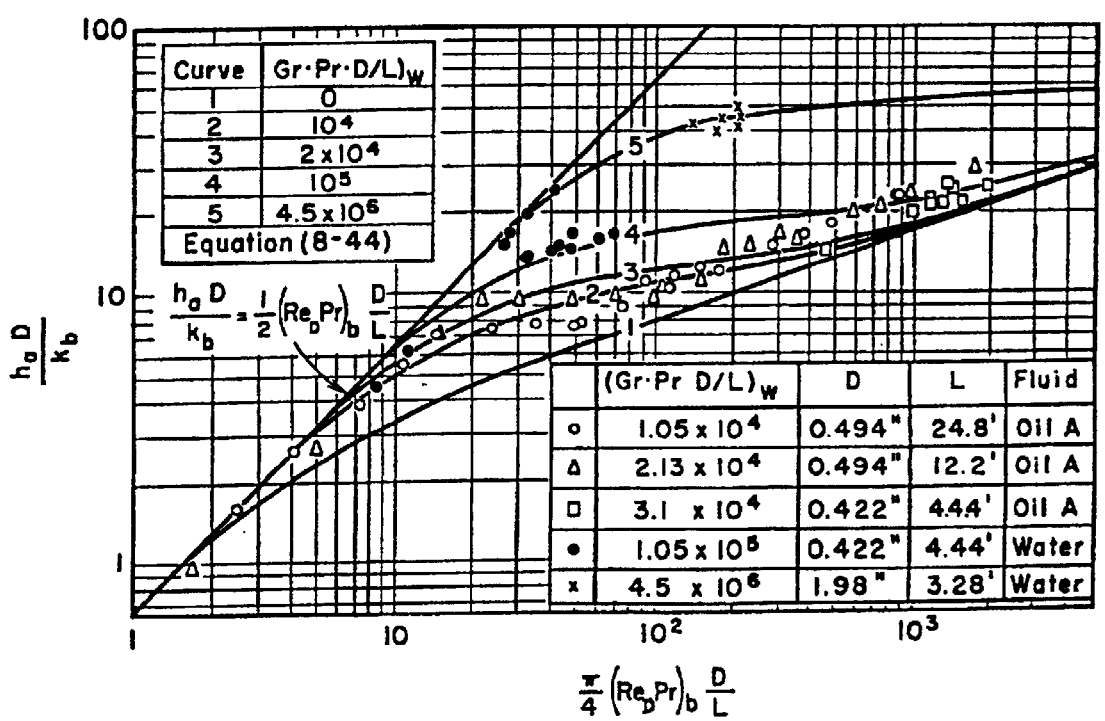
FIG. 20 Free and forced convection in vertical tubes.

To (ii) with increasing heating, the flow speed and the heat transfer to the gas/vapor rise, until the increase in the Nusselt number enters a saturation curve Nu=fn ($Re^{1/Y}*Pr^{1/X}$) in which Pr=Prandtl number and Y>1 and X>Y (cf. FIG. 20, showing free and forced convection in vertical tubes). Heat transfer with a further increase in the turbulent flow (i.e. speed) becomes inefficient here. This saturation is attained, where appropriate, before reaching the target temperature of the transdiaphragm vapor/gas flow which is required in order to discharge large conveying flows into the mixing chamber, since, where appropriate, achieving very high dT/dx gradients and an increase in the contact area by a further reduction in size of the lattice meshes of the heat exchanger would entail loss figures $\lambda_{eff}$ which are too high. Instead of a lengthening of the flow duct having an equal cross section (or $D_H$), the widening of the flow duct first ensures a (local) slowing of the flow speed and an increase in the dNu/dRe gradient, but local repetition of transdiaphragm heat transfer and acceleration at increased temperature and with increased heat exchange surfaces subsequently ensures more efficient heat transfer to the gas flow. This increase in efficiency is carried out discontinuously cf. (diffuser staircase in "Technical Solutions") or continuously.

Since, in the range of high flow speeds and Re numbers (i.e. in regime III, cf. FIG. 18), for a given surface quality $\Delta$ and for Re=const. the loss figure $\lambda$ is lowered only by enlarging $D_H$ and the pressure losses amount to $$F_{F,0}=fn(\lambda^* 1^* v_0^2/D_H)=fn(\Delta^* 1^* v_0^2/D_H^2) \quad (43),$$

with a progressive (i.e. stepped and/or continuous) widening of the transdiaphragm flow duct the stepped vacuum chamber system of the abovementioned vapor deposition plant, guaranteed by a given pump system, is, moreover, utilized more efficiently. For, without a widening of the transdiaphragm flow duct, the flow speed increase achieved by heating leads, under given vacuum conditions, only to a reduction in the effective flow speed at the inlet of the transdiaphragm flow ducts with $D_{H,i}$(max) and consequently to a limitation of the conveying flow, in spite of high exit speeds from a corresponding porous diaphragm which exit speeds from corresponding porous diaphragm which, however, are not required on entry into the mixing chamber.

Figure 21:
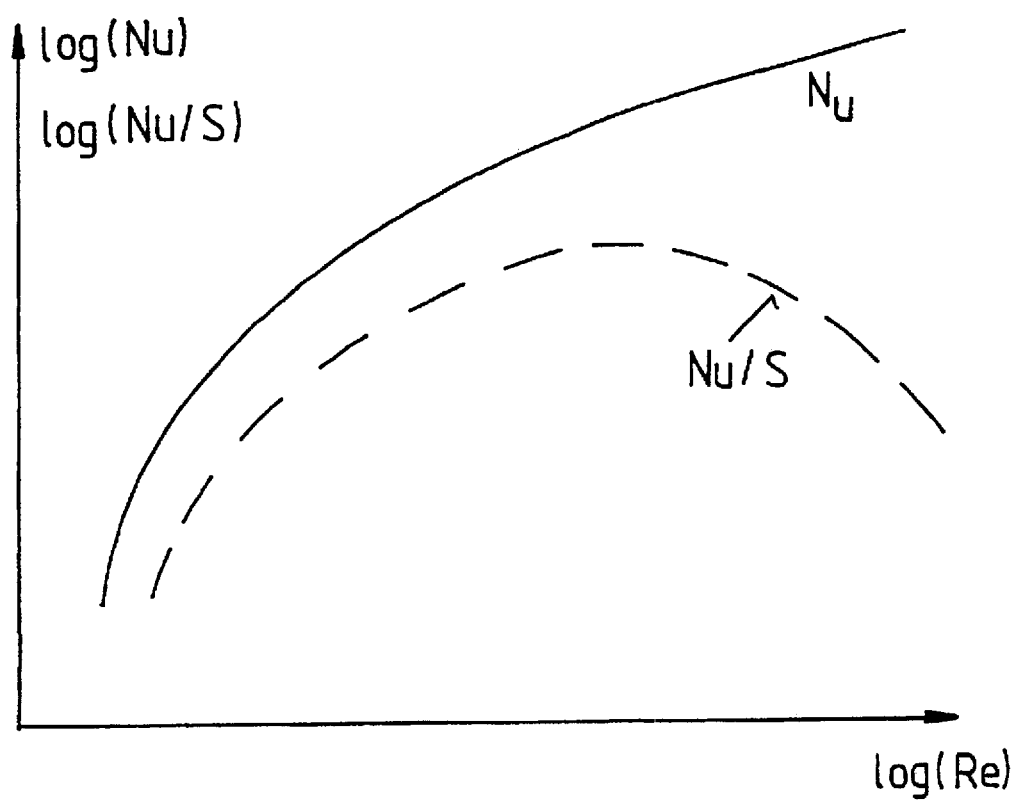
FIG. 21 Diagrammatic representation of heat transfer (Nu, where Nu=Nusselt number) and heat transfer efficiency (Nu/S, S=pump speed of pump system) in a Diaphragm* for the control of a vapor deposition process.

FIG. 21 is a diagrammatic representation of heat transfer (Nu) and heat transfer efficiency (Nu/S) as a function of Reynold nimber in a porous diaphragm for the control of a vapor deposition process. Nu=Nusselt number, S=vacuum-controlling pump speed of any pump system. FIG. 21 shows qualitatively that the efficiency curve Nu/S falls again above a critical flow speed, although the heat transfer Nu=fn ($Re^{1/Y}$) rises further. Consequently, due to the reduction in gas density $\rho$, achieved by heating, and to the increase in the flow speed v (as a result of pulse preservation), it is expedient, in the case of large conveying flows, to use diffusers and/or diffuser-like flow ducts for transdiaphragm heating. In addition to the compromise between rapid heating and reduced pressure losses of transdiaphragm flow at high flow speeds, a widening of the transdiaphragm flow duct cross section (i.e. $D_H$ via diffusers and/or cross section (i.e. $D_H$ via diffusers and/or diffuser-like flow ducts) increases the suction effect (cf. state equations (49)) through (55)) on account of the enlargement of the outflow area (in the case of given gradients dp/dx). Furthermore, widening the transdiaphragm flow duct cross section reduces the risk of compression shocks (at Mach numbers $\geq 1$) or the risks which stem from them. Widening of the transdiaphragm flow duct cross section is therefore a further step for optimizing the transdiaphragm heating of large conveying flows.

To (iii) an alternative "short cut" solution is the plasma heating of the transdiaphragm metal vapor flow which, as a rule, is employed for vacuum plasma spraying (VPS) with the use of an inert gas mixture (e.g. Ar plus $H_2$) (cf. FIG. 22 which shows diagrams of the cross section of two plasma guns with (top) a diffuser outlet and (bottom) a Laval nozzle outlet for the resulting ultrasonic plasma jet; WK=water cooling; PFT=powder feed tube (i.e. laval nozzle with integrated powder injection orifices); PS=(supersonic) gas jet; T=throat; AC=arc chamber; K=cathode; A=anode; HSB=high current arc; HG=heated gas; CG=plasma gas; PIO=plasma jet; S=layer; SU=substrate). The established VPS process is suitable only for depositing liquid phases, since, despite the relatively high temperatures in the plasma (up to 10000K), the time for evaporating the solids added in powder form is not, as a rule, sufficient for their evaporation in the plasma jet. The transdiaphragm plasma gun is therefore reserved for the admixing of at least one HT component directly before deposition in a separate technical solution, in which the plasma jet, by virtue of its high speed, generates a vacuum over the surface of an evaporation source which is arranged in the manner of a water jet pump (FIG. 23). In that case, however, vapor conveyance is no longer driven by a suction flow, but is driven by the pressures generated by the plasma gun and is characterized by a controlled transdiaphragm change in concentration as a result of the alloying addition of an HT component of the transition metals, such as Ti or Ta. By contrast, a more simple configuration is made possible by the transdiaphragm plasma shock for the purpose of local heating of the components having higher vapor pressures, such as Mg and/or Al and/or rare-earth and alcaline-earth metal vapors/vapor mixtures, e.g. before inlet into a mixing chamber upstream of the deposition chamber level. In this case, the entire process is driven by suction flow and only materials conveyance operated by transdiaphragm plasma shock is "regional", that is to say locally "pressure"-operated for the relevant evaporation chamber.

In all three cases, the state equation of the transdiaphragm vapor state emerges as follows:

Differential Equation for Stationary Material Conveyance With Transdiaphragm Heat Transfer According to equation (11), the variation in the pulse of a flowing medium is $$\Sigma F_0 = (\delta I_0/\delta t) = m\delta v/\delta t + v\delta m/\delta t \quad (44)$$

In all nonbranched flow ducts, including a diffuser or a flow duct with a diffuser, $\delta m=0$ and the second term on the right-hand side in equation (44) drops out. Logically, non-branched flow ducts play a subordinate part in a pulse increase within the PD before deposition in the process operated by suction flow. The differential equation for transdiaphragm material conveyance with heat transfer and with a mass flow $q_m$ as a dependent variable is governed by the initial conditions for the flow speed:

$$v = q_m/A^*\rho \quad (45)$$

and $$v = \delta x / \delta t \quad (46)$$

in which $q_m$=dm/dt, i.e. the mass flow (e.g. in [kg/s]). To derive the state equation of a vapor flow in the heated flow flow duct having a varying flow cross section, the first term on the right-hand side of the differential equation (44) yields:

$$m\delta v/\delta t = m * \delta v / \delta x * \delta x / \delta t \quad (47)$$
$$= m[\delta(q_m/A*\rho)/\delta x]v$$
$$= m[(1/A*\rho)*(\delta q_m/\delta x) - (q_m/\rho*A^2)*(\delta A/\delta x) -$$
$$(q_m/\rho^2 *A)*(\delta\rho/\delta x)]v$$

With $m=\rho*V$ and $v=A*\Delta x$ after substitution with equation (44) from equation (47), the following is obtained:

$$m\delta v/\delta t = [(q_m/A*\rho)*(\delta q_m/\delta x) - (q_m^2/\rho*A^2)*(\delta A/\delta x) - (q_m^2/\rho^2*A)*(\delta\rho/\delta x)]*\Delta x \quad (48)$$

The corresponding operative forces result from the difference between the forces which act on the inflowing vapor quantity, minus the forces which act on the outflowing vapor quantity, i.e.

$$\Sigma F_0 = -(F_{x+\Delta x} - F_x) \quad (49)$$

With F=p*A, the left-hand side of equations (44) and (49) becomes:

$$\Sigma F_0 = -(P_{x+\Delta x} * A_{x+\Delta x} - P_x * A_x) \quad (50)$$
$$= -(P_x + (\delta P/\delta x)*\Delta x)*(A_x + (\delta A/\delta x)*\Delta x) + P_x * A_x$$

Since $\Delta x^2$ being very small, the term $(\delta P dA/\delta^2 x)*\Delta x^2$ is ignored, and, finally, the following is obtained for the left-hand side of the state equation:

$$\Sigma F_0 = -(A*\delta P/\delta x + P*\delta A/\delta x)\Delta x \quad (51)$$

The differential equation for the vapor or gas flow in the stationary state in a superheated flow duct having varying cross sections therefore reads:

$$-(P*\delta A/\delta x + A*\delta P/\delta x) = (q_m/A*\rho)*(\delta q_m/\delta x) - \quad (52)$$
$$(q_m^2/\rho*A^2)*(\delta A/\delta x) -$$
$$(q_m^2/\rho^2*A)*(\delta\rho/\delta x)$$
$$= (q_m/A*\rho)[(\delta q_m/\delta x) -$$
$$[(q_m/A)*(\delta A/\delta x) +$$
$$(q_m/\rho)*(\delta\rho/\delta x)]]$$

Whilst, for an unheated flow duct without a variation in cross section (e.g. cylinder), the following applies to the pulse:

$$\Sigma F_0 = F_P - F_F \quad (53)$$
$$= \int_{xin}^{xout} [q_m/A*\rho)*(\delta q_m/\delta x)]dx$$

in the abovementioned Diaphragm*:

$$\Sigma F_0 = F_P - F_F - F_D \quad (54)$$
$$= \int_{xin}^{xout} [(q_m/A*\rho)*(\delta Q_m/\delta x) - (q_m^2/\rho*A^2)*$$
$$(\delta A/\delta x) - (q_m^2/\rho^2*A)*(\delta\rho/\delta x)]dx$$

The contribution to the transdiaphragm change in state of the flow duct of the abovementioned porous diaphragm (i.e. to the state adaption to the conditions of the following process unit) by (i) temperature change, resulting acceleration under heating, expansion and density reduction as well as by (ii) a widening in cross section for resulting frictional losses and increase in suction force (with simultaneous heating according to (i)) emerges from the difference between the equations (53) and (54), i.e.

$$F_D(A_T, \rho_T) = \int_{xin}^{xout} [(q_m^2/\rho*A^2)*(\delta A/\delta x) - \quad (55)$$
$$(q_m^2/\rho^2*A)*(\delta\rho/\delta x)]dx$$

In this, $F_D(A_T,\rho_T)$ changes in proportion to the square of the vapor throughput and absolutely to the extent to which $F_F$ is reduced, for a given $F_P$, in comparison with a flow resistance having unheated flow ducts and without variations in cross section $\delta A/\delta x$ (e.g. with cylinders or tubes having rectilinear outer walls). $F_D(A_T,\rho_T)$ is the thermal contribution to the force of the Diaphragm*, $F_D$, and must be distinguished from the athermal contribution to $F_D$ made by mass separation (cf. chapter on bifurcations). $F_D(A_T,\rho_T)$ does not contain the contribution made by contractions (nozzles) in the flow duct, this being summarized further below. Transdiaphragm contractions in cross section give rise, on the one hand, to local acceleration of the transdiaphragm flow and, on the other hand, to a reduction of $F_D$, insofar as they do not promote a) reservoir formation, e.g. via bifurcations, and b) product formation via (acceleration= change of state and) deposition, and can consequently be better utilized locally for the purposes of the process than a concentric flow duct.

Both effects of $\delta A/\delta x$, i.e. widening of cross section and reduction of cross section, are required in order, on balance, to increase the force of the Diaphragm*, $F_D$. Moreover, intelligent combinations of structural parts and their experimental evaluation govern the extent to which a reduction of cross section $-(\delta A/\delta x)$ overcompensates for the correspondingly reduced suction effect and can be added as a positive amount (i.e. quantitatively as an amount $/-(\delta A/\delta x)/$) to $F_D$. The premise of athermal diaphragm acceleration is: first minimize frictional losses, then accelerate, and is summarized in the (next) chapter "nozzles". By contrast, the premise of thermal diaphragm acceleration, summarized here, consists of: first accelerate, then reduce frictional losses, but preferably both and continuously.

Technical Solutions

Figure 24E:
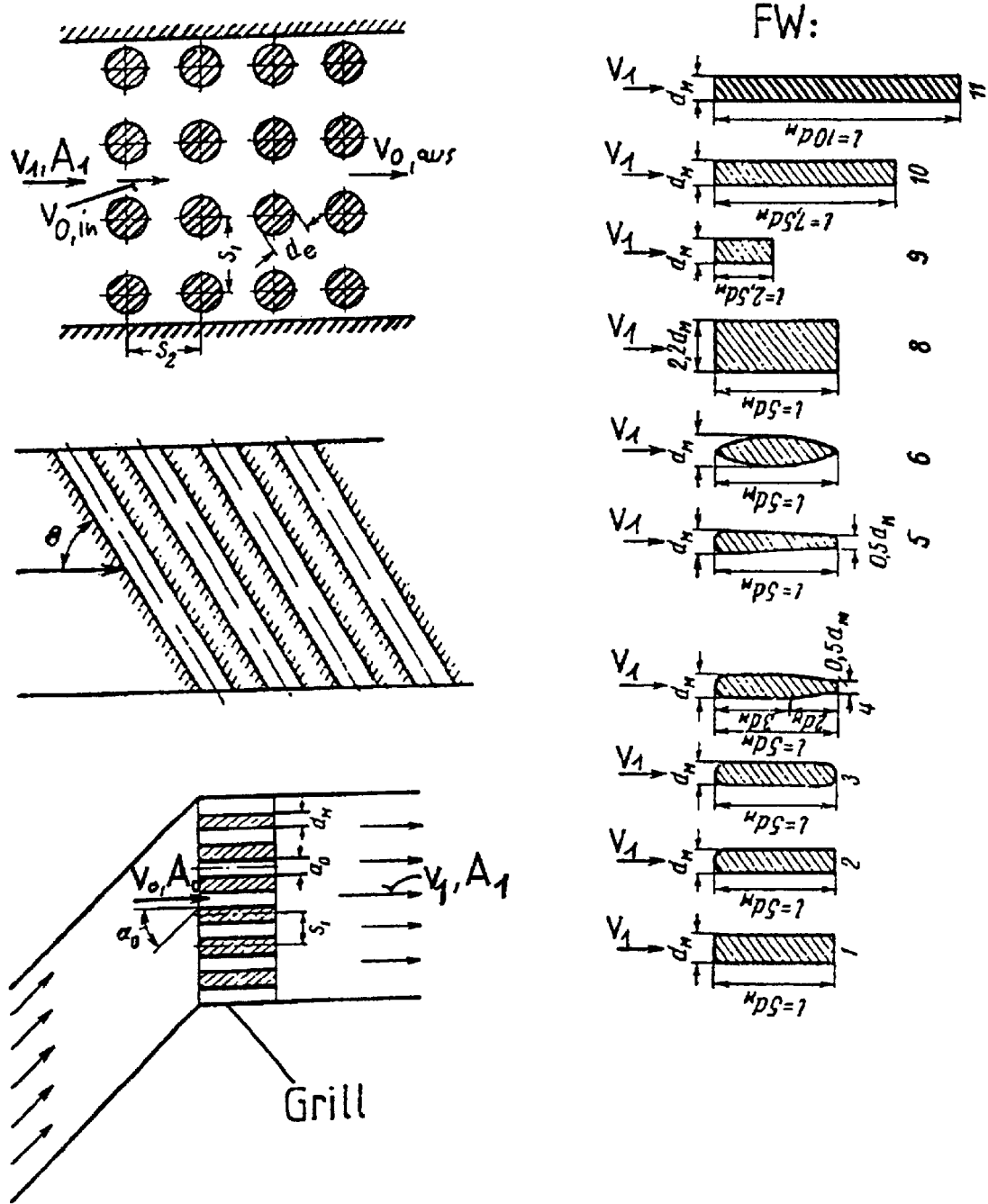
Figure 24F:
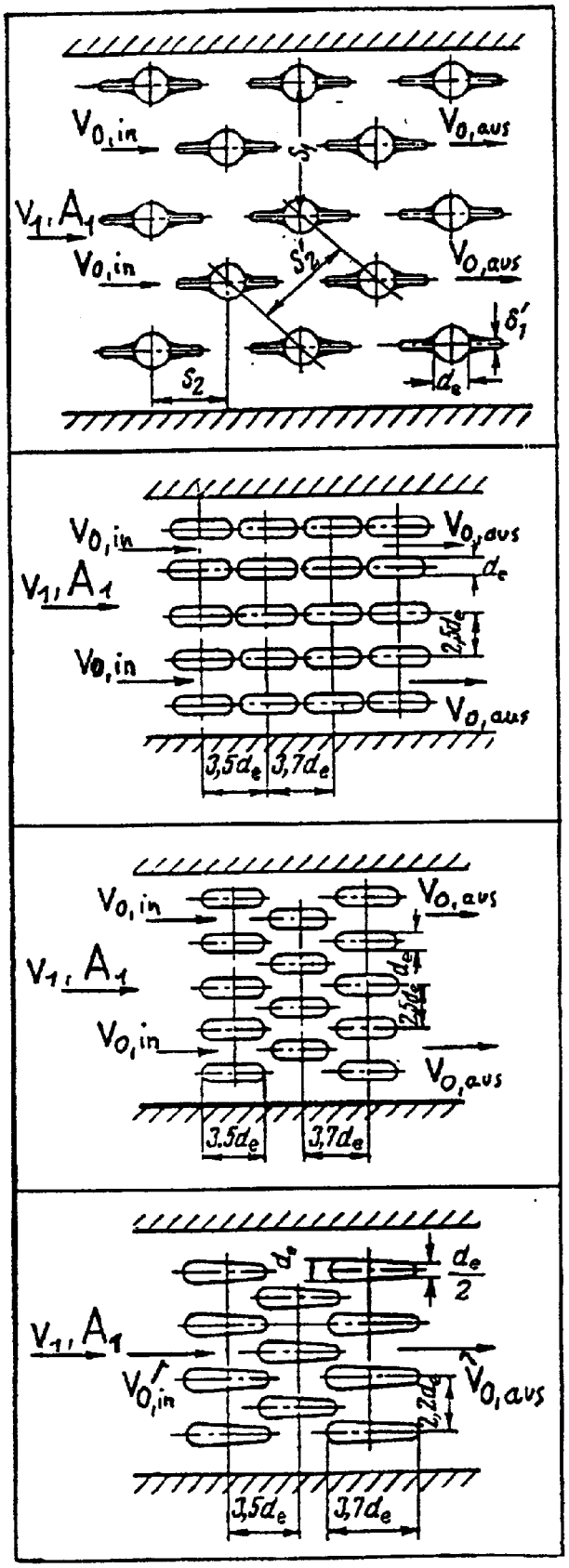
Figure 25:
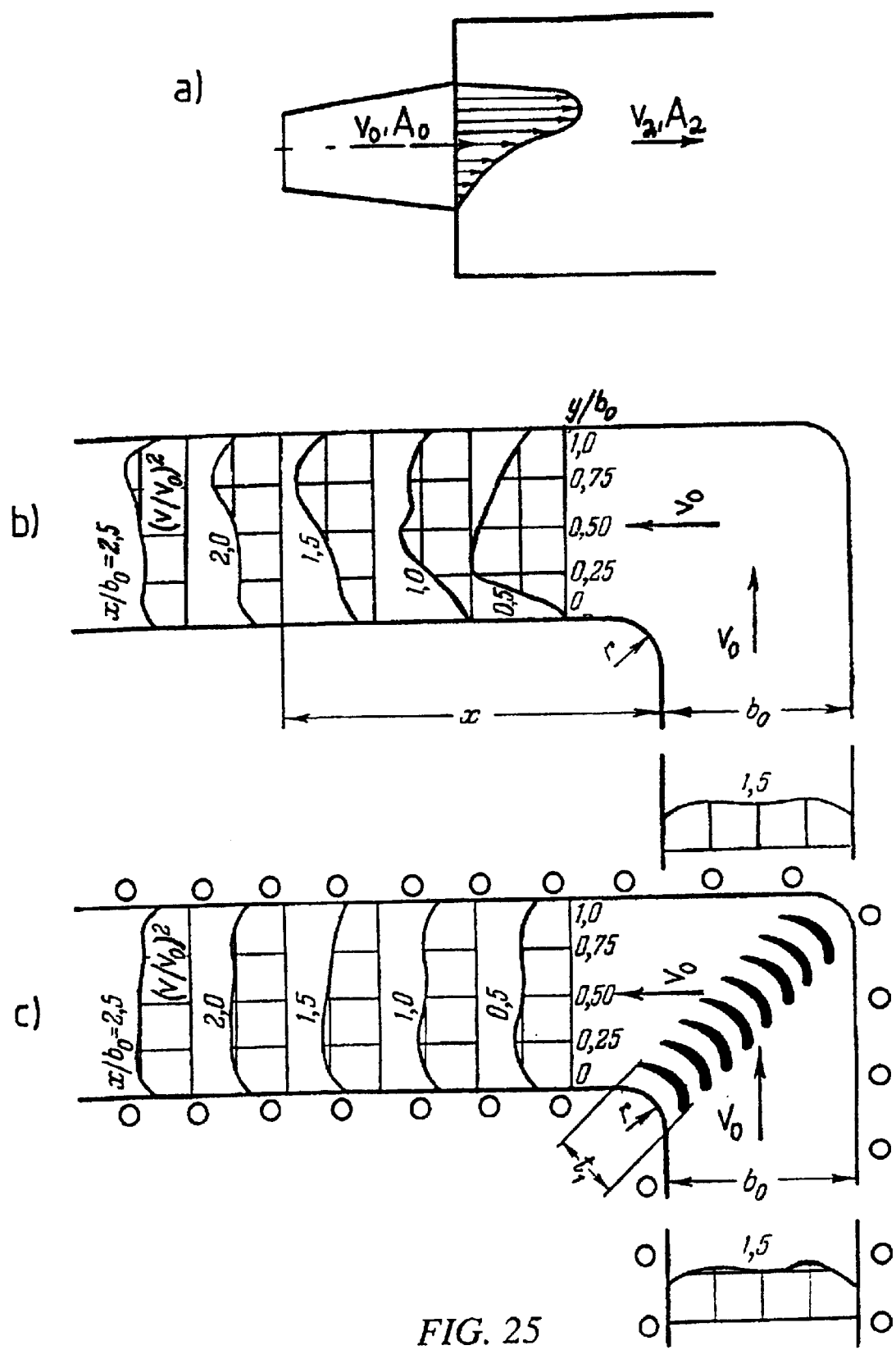
FIG. 25 Nonhomogeneous and asymmetric profile of transverse speed distribution in the flow bend for Diaphragms*.

What is carried out here in connection with the abovementioned vapor conveyance and deposition process is:
1. the use of flow ducts which are superheated (in relation to the temperature of the vapor flow), with and/or without heat exchangers and/or with a temperature which is constant and/or increasing in the direction of flow and/or
2. As 1., the transduct heat exchange walls
   2.1 are oriented longitudinally relative to the flow duct and are arranged in the form of a honeycomb and/or lattice and/or grid and/or any framework in the flow cross section (FIGS. 24a,b showing arbitrariness of cross-sectional forms/geometries of the heat exchangers and heat exchanger grids for diaphragms of type 1 (cf. 1st part of the invention), here as a model for simulation, in particular for the transdiaphragm heating of large vapor quantities, such as are required in industrial vapor deposition processes, for example for Mg alloys) and/or 2.2 in rib form according to FIG. 24c and/or 2.3 consist of correspondingly (arbitrarily) perforated successive plates (FIG. 24d with grid) and/or 2.4 form transverse-throughflow wire latticeworks, lathworks and tube assemblies according to FIG. 24e (with grid and forms of the heat exchanger bars), 2.4.1 individual tubes, etc. assuming the cross-sectional forms illustrated in FIG. 24f and/or 2.4.2 being inserted in regular rows or in zigzag-arranged rows in the longtitudinal section of the respective flow duct (cf. FIG. 24f) and/or 2.4.3 being arranged in the form of a blind, i.e. at any tilt angle (FIG. 24g) and/or 3. As 1. and/or 2., but with the use of (i) at least one locally limited diffuser, so as to result in a discontinuous widening in cross section of the flow duct and/or (ii) flow ducts with a continuous widening in cross section of the entire duct length, but at least over a substantial part of the porous diaphragm cross section dx or cos $\alpha_x$ * dx ($\alpha_x$ being the tilt angle of the transdiaphram flow duct) and/or part of the entire length of the transdiaphragm flow duct, along with the heat exchangers (cf. FIG. 24a):

3.1 with constant dimensions in the at least two flow ducts separated by the at least one diffuser and having constant dimensions $D_0$, $D_H$, $A_0$ and/or U and/or 3.2 with a continuous widening of the (duct) dimensions within the heat exchanger itself, which continuously and/or approximately continuously fill the additional space provided by the diffuser in the flow duct and/or 3.3 As 3.1, but with a constant or vaying contact area of the heat exchangers in the flow in the flow duct regions separated by the at least one diffuser and/or 3.4 As 3.2, but with a constant or vaying contract area of the heat exchangers in the flow duct regions separated by the at least one diffuser and/or 4. As 1.–3., but with the use of guide blades (guide turbines, conduit inner walls and/or conduit profiles) in front of and/or in the diffuser (in)let for the suppression of inhomogeneous (in) flow speeds (FIG. 25 showing nonhomogeneous and asymmetric profile of transverse speed distribution a) before abrupt flow duct enlargement (cf. FIG. 28e) and b) downstream of a flow bend and equalization of the inhomogeneous and asymmetric flow by c) the use of guide blades, here in the flow bend), such as occur, for example, after a bent flow duct(portion) (FIGS. 25a,b), so that a (more) homogeneous, flat (flatter), symmetrical or approximately symmetrical distribution (profile) of the flow speeds before inlet into the heat exchanger is guaranteed (cf. FIGS. 25a–c), even when the central axis of the heat exchanger, etc. forms an angle with the perpendicular to the end face of the porous diaphragm Diaphragm* and, where appropriate, necessitates the use of flow bends and/or bent flow ducts and/or 5. As 4., but the guide blades (etc.) consist of the following types, forms and arrangements:

5.1 profiled guide blades (FIG. 26a showing guide blades in the flow bend: a) profiled with projected length t at the angle 48° to the inflow direction and further typical relative dimensions in the box (on the right)) and/or 5.2 rounded (thin) guide blades corresponding to the outer walls of the bent flow duct region (FIGS. 26b and c showing thin guide blades in the flow bend with an arc describing an angle of b) 950 and c) 170°) and/or 5.3 As 5.1 and 5.2, at the same time forming a bend angle $\delta_L = \delta + /-50\%$, in which $\delta$=the angle of the flow deflection without guide blades (i.e. the angle of the bent flow duct region) and/or 5.4 As 5.1–5.3, but with identical and/or different guide blade sizes and/or guide blade lengths and/or 5.5 Guide blades which are concentric (with the flow duct wall) (FIG. 26d showing concentric guide blades) and/or 5.6 As 5.1–5.5, but with a concentration of the guide blades on the inner bend of the bent flow duct, as in FIG. 26e showing guide blades concentrated on the inner wall and/or with a corresponding reduction in the number of guide blades in comparison with a regular grid arrangement (cf. FIGS. 26f vs. 26a, 26f showing guide blades in the flow bend concentrated toward the inner wall so that there is a reduced number of guide blades for 26e and 26f in comparison with 26a) and/or 5.7 As 5.1–5.6, but with a (maximum) number $n_L$ of guide blades, of which the projected length (perpendicular to $\delta/2$, cf. FIGS. 25b, 26a) amounts to the value $t_1=2^{0.5}$, in which the number is $$n_L = 2.13(r/D_H)^{-1} - 1 = (2.13/2^{0.5})*(t_1/D_H)^{-1} - 1$$

per bend and r=inner bend and/or 5.8 As 5.1–5.6, but with a number $n_L$ of guide blades in the range of $$0.8 *(r/D_H)^{-1} < n_L < 1.5*(r/D_H)^{-1} \text{ and/or}$$

5.9 As 5.1–5.6, but with $0.15\ D_H < t_1 < 0.6\ D_H$ and $$n_L = (3D_H/t_1) - 1 \text{and/or}$$

$$2.1*D_H/t_1 < n_L < 2.1*D_H/t_1$$

Figure 27:
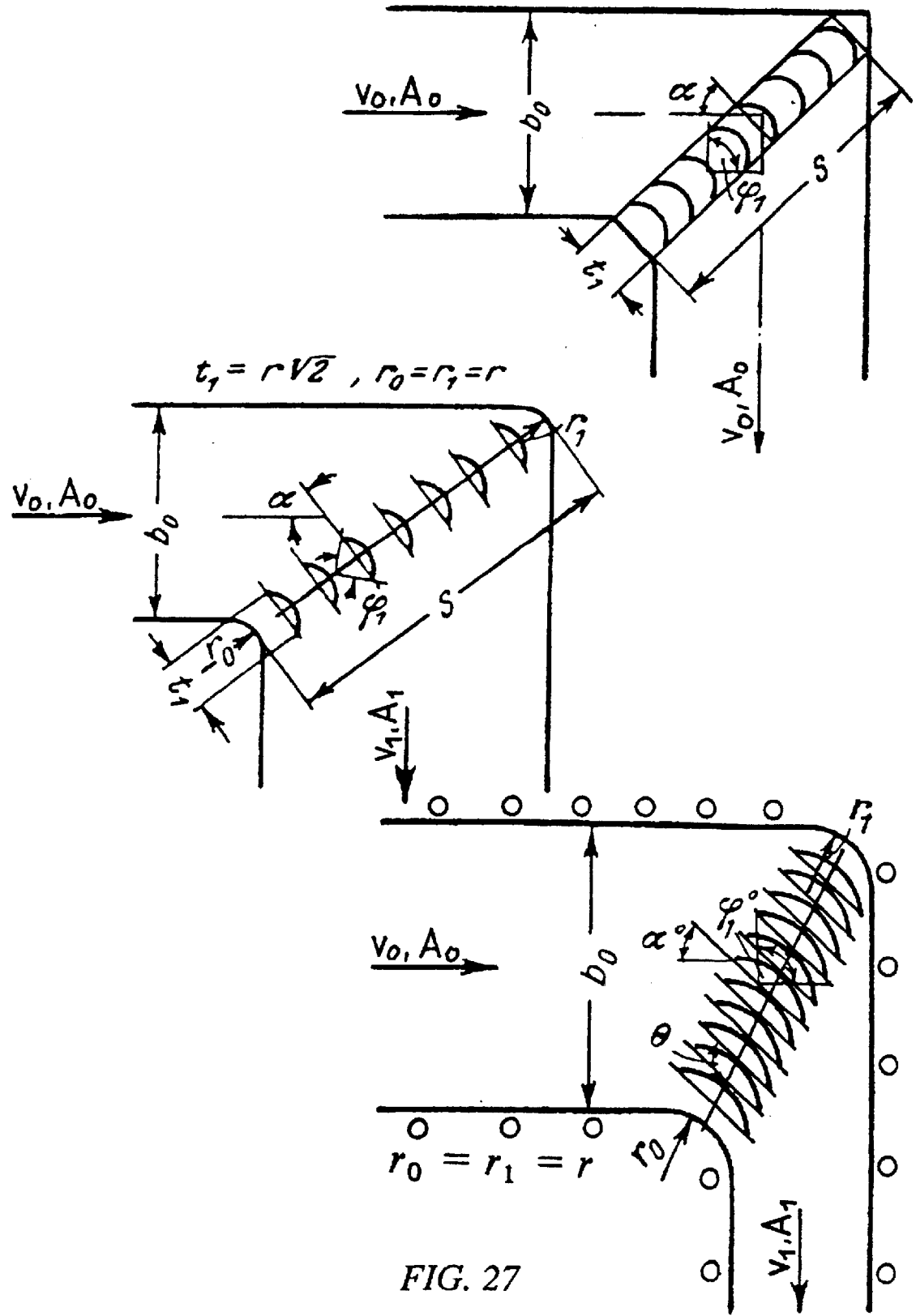
FIG. 27 Thin guide blades in the bend for Diaphragms*.
Figure 28:
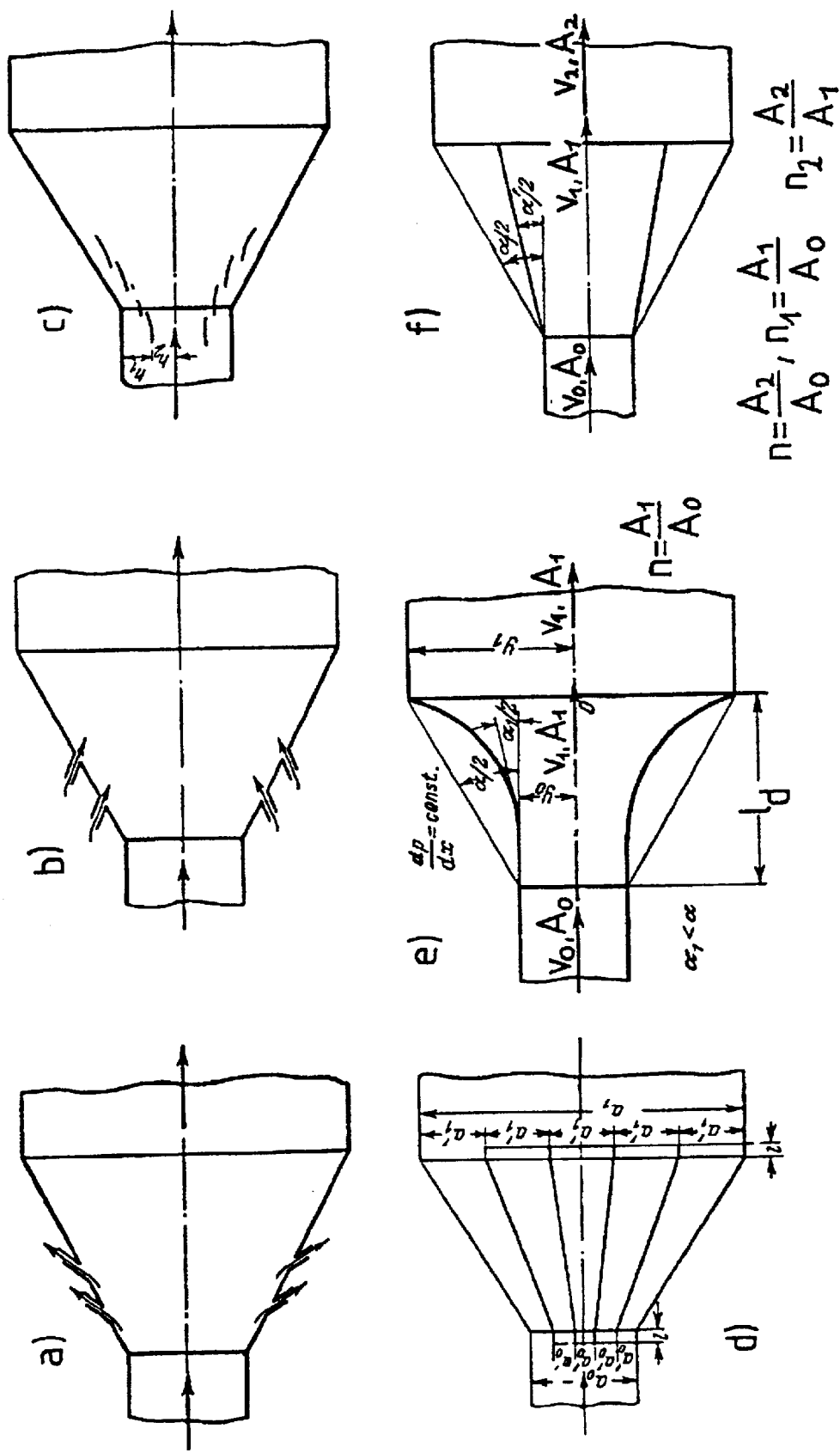
FIG. 28 Methods to reduce loss figure $\zeta$ of a transdiaphragm flow duct widening independent of the diffuser opening angle $\alpha$.
Figure 29:
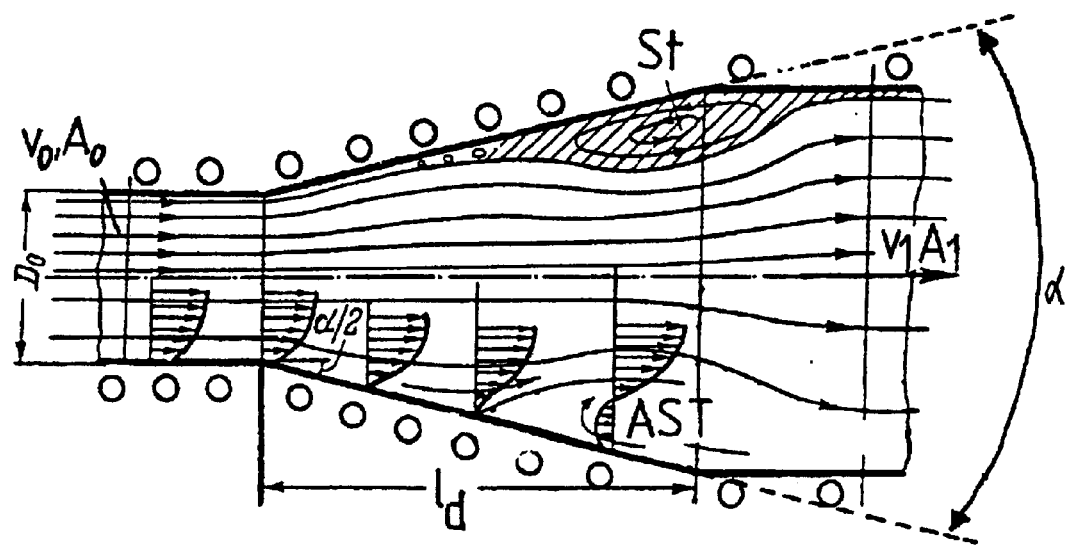
FIG. 29 Breakaway of the flow lines from the boundary layer of a diffuser and formation of turbulence.
Figure 31:
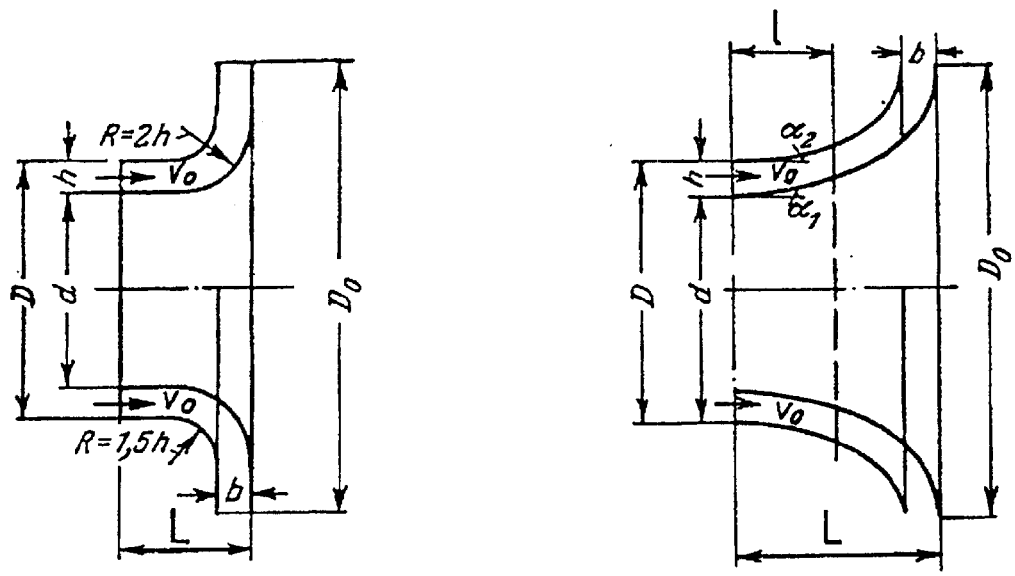
FIG. 31 Annular diffusers with axial and both axial and radial outflow of arbitrary dimensions.
Figure 32:
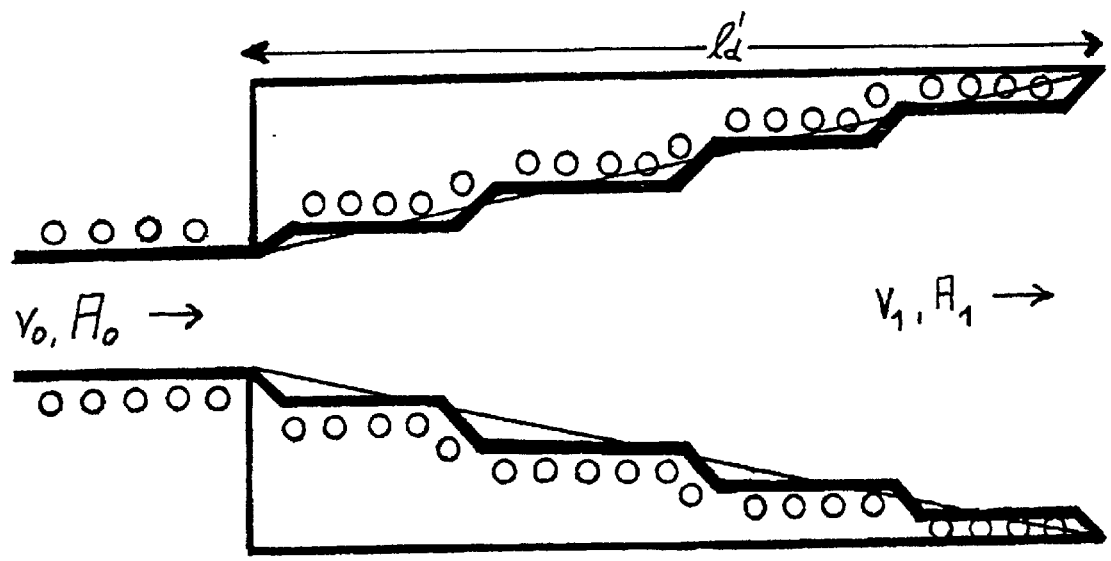
FIG. 32 "Diffuser staircase" with number $n_{Diff}$(opt) of a flow duct of arbitrary dimensions.
Figure 33:
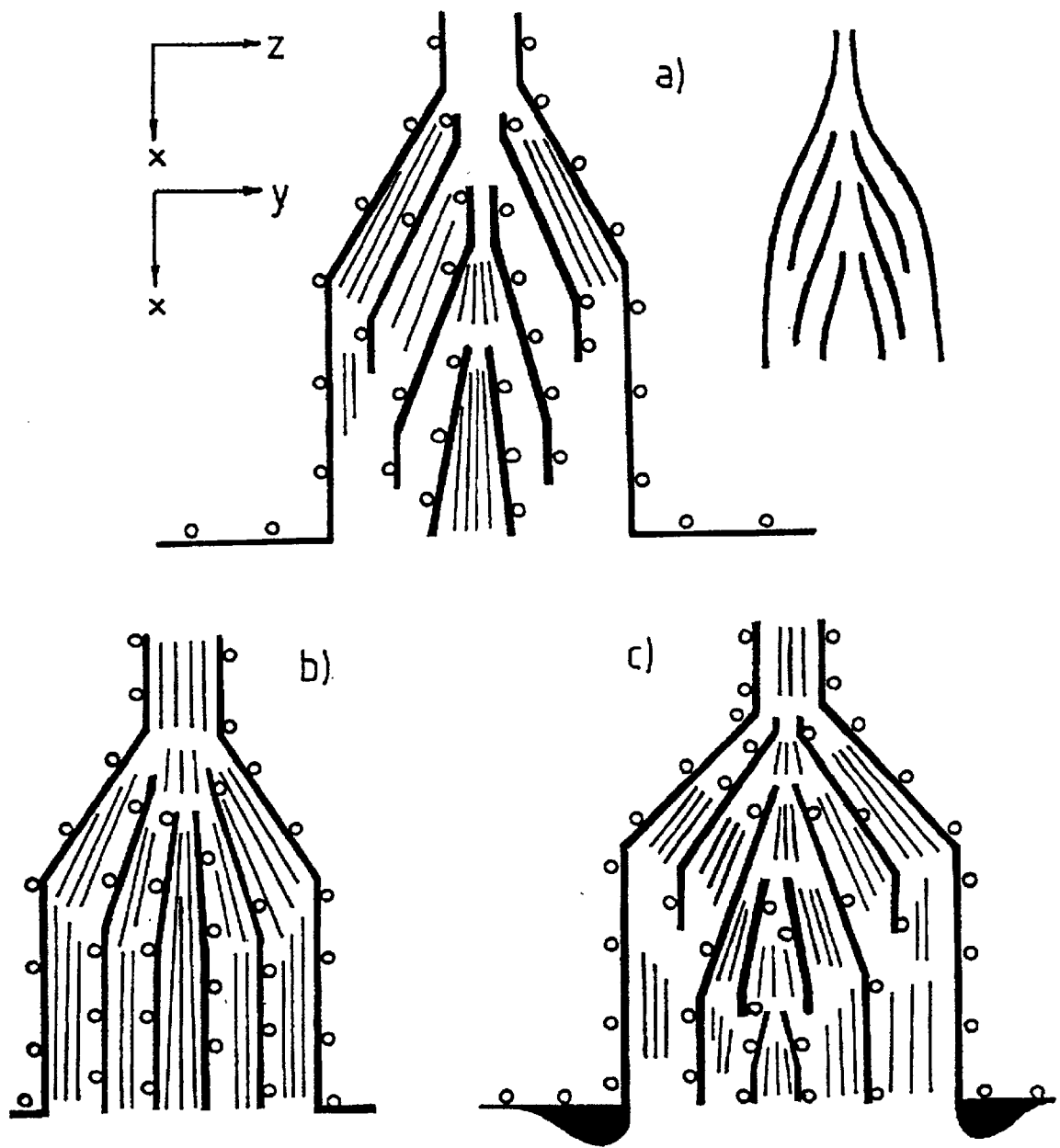
FIG. 33 Internested diffuser cones with heat exchangers (fine lines) of arbitrary dimensions.
Figure 34:
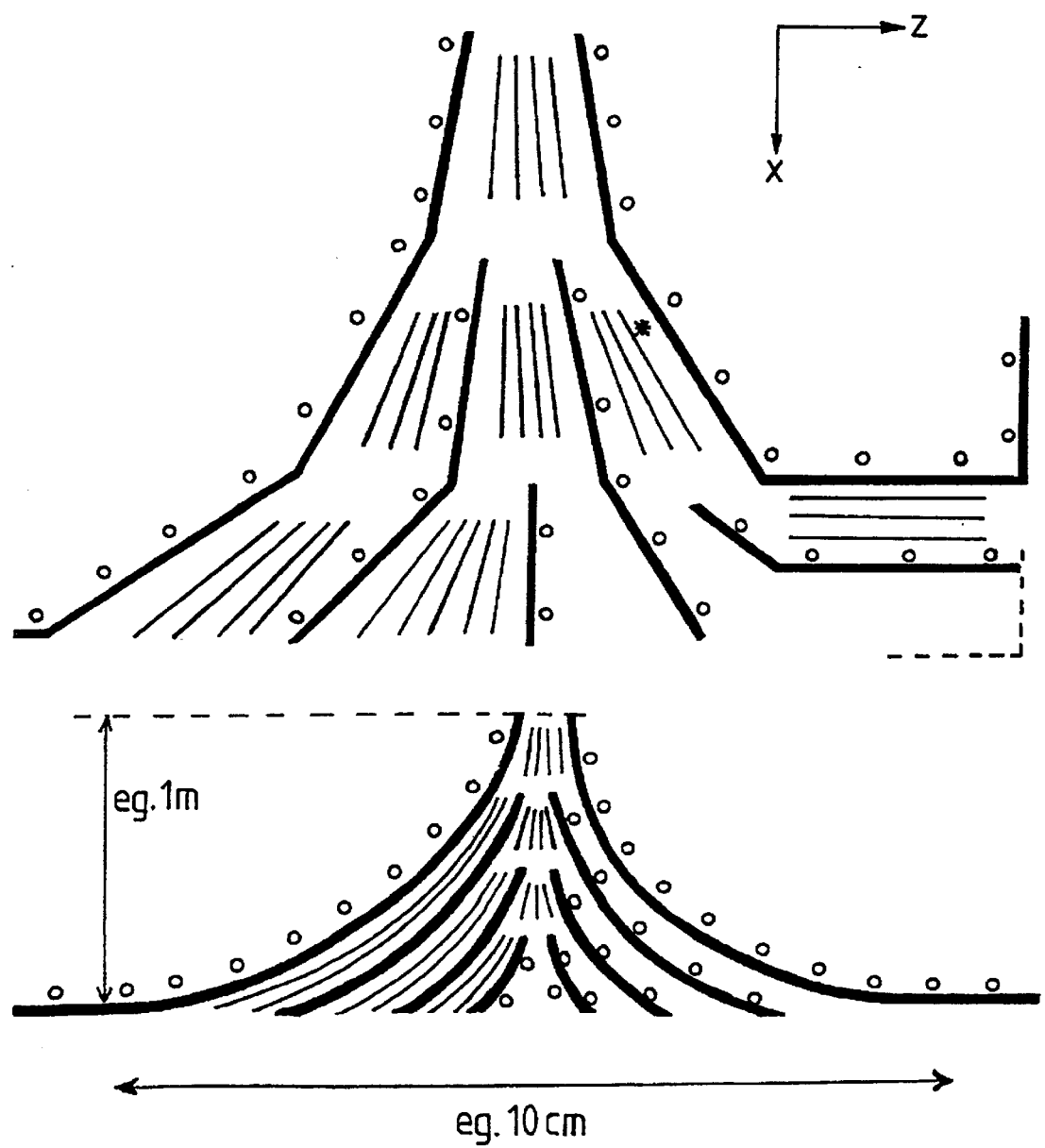
FIG. 34 Duplication of a flow duct by continuous flow duct widening, including widening of the flow cross sections within the radiators of the transduct heat exchangers (fine lines, cf. star).

5.10 As 5.1–5.6, but with an enlarged bend exit in relation to the bend entrance (eg. $b_1 > b_0$) and the number of guide blades $n_L$ is $$n_L = 2.13(S/t_1) - 1 \text{ and/or}$$

$$0.8*S/t_1 < n_L < 1.5*S/t_1$$

in which $S=(b_0^2+b_1^2)^{0.5}$ and/or 5.11 As 5.1–5.10, the guide blades in uniform distance $a=S/(n_L+1)$ and/or 5.12 As 5.1–5.11, but with a reduced number $n_L(\text{red}) < n_L$ in relation to the regular grid arrangement (cf. 5.11), the distances between the guide blades widening progressively relative to one another and the distance ratio $a_{n+1}/a_1$ preferably being in the range $1.99 < a_{n+1}/a_1 < 3.01$ and $a_1$ being the distance between the 1st guide blade and the inner bend of the bend and $a_{n+1}$ being the distance between the following guide blade and the inner bend (cf. FIGS. 26a and 26f) and/or 5.13 As 5.2–5.12, but thin (rounded) guide blades at $80° < \delta_L = \phi_1 < 125°$ (cf. FIG. 27 which is as FIGS. 26a–c and 26f, here showing thin guide blades having the angle $\delta_L = \phi_1$ and FIGS. 27b, 27c with parallel inner and outer wall in the bend) and/or 5.14 As 5.1–5.5 und 5.7–5.13, but with parallel outer walls of the bent flow duct regions and/oder 5.15 As 5.14, in which the ratio of the relative radius of the bent flow duct $r/D_H$ is:

for $A_0=A_1$ (or $b_0=b_1$)→$0.3<r/D_H<0.1$, for $A_0<A_1$ (or $b_0<b_1$)→$0.5<r/D_H<1.2$, and for $A_0>A_1$ (or $b_0>b_1$)→$0.1<r/D_H<0.5$ and/or 5.16 As 5.6, but preferably with 1–4 concentric guide blades which, if appropriate, are distributed over the cross section of the bent flow duct according to the relation Leitschaufeln, die ggfs.

$$r_i = 1.26 * r_{i-1} + 0.07 * b_0$$

in which $r_i$ and $r_{i-1}$ are the radii of curvature of the respective guide blade and $b_0$ is the entry width of the bent flow duct and/or 6. Flow ducts with any diffuser and/or diffusers as 3.–5., here with a circular and/or conical and/or pyramisal cross section having different and/or varying opening angles α (α/2) (cf. FIG. 28 showing methods, independent of the diffuser opening angle (ie. α), for reducing the loss figure ζ of a transdiaphragm flow duct widening), and/or diffusers with an abrupt transition (e.g. α=180°) as well as diffusers with a symmetrically and nonsymmetrically flattened (i.e. $0.05<a_0/b_0$ angular longitudinal section and/or with guide blades and/or with partitions for reducing and/or suppressing the breakaway of the flow from the boundary layer and/or terraced diffusers (i.e. having a combination of continuous opening, followed by abrupt opening (i.e. without α=180°, cf. FIG. 28) and/or diffusers with a transition from (rect)angular to circular flow duct cross sections, and vice versa, and/or 7. Diffusers according to point 6. of Technical Solutions in this chapter, but combined with at least one of the designs according to points 3.–5. of the Technical Solutions in this chapter and/or 8. Flow ducts with diffuser (combinations) as 6. or 7., the global loss figure of the diffuser, with the exception of diffusers having a curvilinear and terraced longitudinal section, being composed of $$\zeta_{Diff}^{global} = k_1 * \zeta_{Env} + \zeta_F$$
$$= k_1 * k_2 * fn(\alpha) * (1 - (A_0/A_1)^2) + fn(\lambda, \alpha, A_0/A_1)$$

in which $A_0$=the inflow cross section and $A_1$=the outflow cross section of the duffuser, α is the opening angle at 0°<α<180°, λ is as in Chapter 1, $k_1$=the coefficient for describing the flow boundary layer at the diffuser inlet (n.b. $k_1$=1.0 for homogeneous (flat) transverse speed distribution, depending, for example, on the designs according to points 4. and 5.of the Technical Solutions of this chapter, and $k_1$>1.0 for nonhomogeneous speed distribution, for example after flow through a long pipe having a parabolic transverse profile), $k_2$=the form factor for the diffuser, in which $k_2$=approx. 3.2 for conical diffusers and $k_2$=approx. 4.0 for pyramidal diffusers, and, in the case of the transition from (rect)angular to circular flow ducts (and vice versa), the opening angle a becomes equal to $α_E$, $α_E$ being equal to the equivalent opening angle as $fn(D_0, D_1, a_0, b_0, a_1, b_1)$ and the axial length $l_d$ of the corresponding diffuser) and/or 9. As 8., but a (bent or nonbent) flow duct precedes the diffuser in the direction of flow, has a relative length $l/D_H$ with values in the range of $0.01<l/D_H<1000$ and releases a symmetrical, but inhomogeneous and/or an asymmetric speed profile on inflow into the diffuser and/or 10. As 9., but with it $k_1$=fn ($v_{max}/v_0$), in which $v_{max}$=the maximum speed and $v_0$=the mean speed are on inflow into the diffuser (region) and the values $v_{max}/v_0$ extend over a range $1<V_{max}/v_0<4$ and give rise to $k_1$ values in the range $1 \leq k_1/\leq 10$ and the diffuser-outlet is provided with a flow grid/lattice for equalizing (homogenizing) the flow and/or 11. As at least one of points 3. to 10., but with homogenization of the speed profile in the flow boundary layers, i.e. minimization of the breakaway from flow boundary layers as a result of local turbulences (cf. FIG. 29) by the selection of the opening angle α, the longitudinal axial length ld and the form of the at least one diffuser and of correspondingly adapted walls of the at least one heat exchanger surrounded, where appropriate, by the diffuser, in which 11.1 the opening angle is in the range of 0°<α<180° in the case of an operative Re range of $10^0$ <Re<$10^9$, but preferably between 0°<α<30° and $5*10^2$<Re<$7*10^6$, and/or the critical cross section $A_T$ (if appropriate=$A_1$), at which the boundary layer begins to break away, is determined according to the relation $$A_T/A_0 = 1/(1-(1.95/(\alpha^{4/5} * Re^{0.2})))$$

in which $A_0$=inflow cross section, and/or 11.2 the opening a is in the range $0°<\alpha<10*[0.43*((\lambda/k_1) *((n_1+1)/(n_1-1)))]^{4/9}$ but is preferably around $\alpha_{opt}= [0.43*((\lambda/k_1)*((n_1+1)/(n_1-1)))]^{4/9}$ and $n_1=A_1/A_0$, and/or 12. As 11., but with suppressed and/or limited, i.e. controlled turbulence development on the inner wall (FIG. 29 showing breakaway of the flow lines from the boundary layer of a diffuser and formation of turbulence in the divergence region with a corresponding profile of the resulting local flow speed; St=flow vortex (turbulence); AS=breakaway of the flow (line)) in the case of opening angles α in the range of 0°<α<180°, the control methods comprising:

12.1 Locally particularly high superheating in the region of the diffuser walls for increasing speed in the boundary layer and/or 12.2 the insertion of following heat exchangers into the region of the diffuser extit for minimizing the consequential turbulences and/or 12.3 attracting the boundary layer by branching off small part flows in the diffuser directly into the next evaporation and/or mixing chamber (FIG. 28*a* showing method for reducing the loss figure ζ of a transdiaphragm flow duct widening by suction of a flow boundary layer) and/or 12.4 increasing the boundary layer speed and delaying its breakaway by sucking small part flows directly out of the preceding evaporation unit (FIG. 28*b* showing method for reducing the loss figure ζ of a transdiaphragm flow duct widening by blowing away a flow boundary layer) and/or 12.5 guide blades upstream and downstream of the diffuser inlet for dispersing the central flow, in particular for 90°<α<180° (cf. FIG. 28*c* showing method for reducing the loss figure ζ of a transdiaphragm flow duct widening by flow deflection by guide blades directly at the inflow), the duct width preferably narrowing between the guide blade and diffuser wall in staggered regions dependent on the position of the individual guide blade, but widening locally, the guide blades being bent only slightly, if appropriate constantly relative to one another, and not exceeding a maximum projected length of 20–25° of the diffuser diameter, and having an inclination relative to the flow which allows minimum loss figures, and/or 12.6 one to a maximum of 20 (superheated) partitions of the diffuser (cf. FIG. 28d showing method for reducing the loss figure ζ of a transdiaphragm flow duct widening by diffuser partitions), the number of partitions increasing superproportionally toward higher angles α, the distances $a_0$ and $a_1$ between the partitions both at the inlet and the outlet of the diffuser assuming constant values, and the partitions before entry into and after exit from the diffuser being lengthened by a value of at least $0.1a_0$ and $0.1a_1$ parallel to the diffuser axis, and/or 12.7 diffusers for α>20° with walls bent in the longitudinal direction, in such a way that the local pressure gradient dp/dx remains preferably constant within the diffuser, but at least the breakaway of the flow lines is reduced significantly in comparison with an angular diffuser longitudinal profile, and the continuously progressive widening of the diffuser radius y (see FIG. 28c showing curvilinearly bent diffuser), i.e. $\Delta y=y-y_0$, can be described by the function $$y=y_1/(1+((y_1/y_0)^4-1)*x/l_d)^{0.25}$$

and, for the corresponding diffuser with flattened dimensions (i.e. $a_0/b_0<1<a_0/b_0$), according to the function $$y=Y_1/(1+((y_1/y_0)^2-1)*x/l_d)^{0.5}$$

or both by a function related to the corresponding type, and/or the loss figure of the diffusers according to 12.7, with dp/dx=const. in the range of $0.1</=A_0/A_1<0.9$, can be described according to $$\zeta=k_4(1.43-1.3*A_0/A_1)*(1-A_0/A_1)^2$$

in which $k_4$ is a function of the relative diffuser length $l_d/D_H$, and/or 12.8 Terraced diffusers, of which the continuous widening in cross section from $A_0$ bis $A_1$ is concluded by an abrupt increase in cross section to $A_2$ (cf. FIG. 28f showing terraced diffusers), so that a breakaway occurs when the flow speed has already become relatively slow and/or the losses decrease by factors of between 1 to 3, and the coefficient $k_2$ for terraced diffusers is in the range of $3<k_2<7$, the minimum loss figures $\zeta_{min}$ for $A_2/A_0$ ratios of $1.5 \leq A_2/A_0 \leq 20$ in the case of relative lengths of $0.5 \leq l_d/D_H \leq 14$ move in the range $0.01<\zeta_{min}<0.5$, and the global loss figure is $\zeta=(1+s)*\zeta_{min}$, in which $\sigma=fn\ (A_0/A_1)$ and, for $1>A_0/A_1>0$ is in the range of $0<\sigma<0.5$, and/or the corresponding $\alpha_{opt}$ value are in the range $0.5°<\alpha_{opt}<40°$, and/or preferably the raltive lengths $l_d/D_H$ (or $l_d/a_0$) being significantly reduced at the expense of slightly increased $\zeta_{min}$ minimum values of about $1.1*\zeta_{min}$, and/or (see next page) and/or 12.9 Flattened and/or pyramidal and/or terraced diffusers, particularly in combination with ventilators (see further below), the diffuser installed downstream of the ventilator and the ventilators being connected by means of a flow duct of constant cross section, the diffusers themselves being flattened symmetrically of nonsymmetrically and preferably having an opening angle α>25° and, in the case of nonsymmetrical flattening, the oute wall being tiltable at an angle $\alpha'_1$ to the side of the ventilator, this angle preferable being in the range of $0°<\alpha'_1<10°$ (cf. FIG. 30 showing flattened diffusers with outer walls nonsymmetric (to the diffuser axis), following a centrifugal ventilator with a constant (out) flow duct width $b_0$; dimensions arbitrary), the axis of the flattened diffuser preferably having no further tilt angle relative to the axis of the ventilator, the corresponding flattened or pyramidal diffusers couple to a ventilator being characterized, where appropriate, by a flow inlet speed $v_{max}/v_0$=approx. 1.1 (cf. point 10.), and/or 12.10 annular diffusers, if appropriate shaped into a cone, which are mounted downstream of the outlet of an axial ventilator (compressor, turbomachine), the diffusers having, if appropriate, a (flow) core which widens or tapers a flow bottleneck relative to the diffuser, before the formation of either an axial and/or a radial outflow, of which the increase in cross section in relation to the annular inflow (cf. FIG. 31 showing annular diffusers with (on the left) axial and (on the right) both axial and radial outflow using arbitrary dimensions) can be described according to the relation $$A_1/A_0=2(b/h)*(D_d/D_0)/(1+d/D_0)$$

the solutions according to points 12.9 and 12.10 being, in particular, also relevant to those part regions of the process as a whole, the transdiaphragm material conveyance of which is driven by a pressure flow (see 12.9 and below), and/or 12.11 at least one of the cases according to 12.1–12.10, but combined with a lattice work, wire lattice, wire-like or lattice-like netting and/or a tissue-like, netting-like and/or framework-like preheater in the diffuser (outlet), in any event before the vapor flow is conducted into the next transdiaphragm diaphragm region and/or the next plant unit (e.g. evaporation and/or mixing chamber) (cf. point 2 of the Technical Solutions of this part), and/or 13. As at least one of the solutions according to 3. to 12., but with a number $n_{Diff}$ of discrete diffuser regions following succesively in series, for the formation of a "diffuser staircase" (as is illustrated in FIG. 32 which shows an alternative "diffuser staircase" with the number $n_{Diff.}$ (opt) (here 4) of a flow duct having a given length $l_d$, widening of cross section and opening angle $\delta_0$ relative to $n_{Diff}=1$, n.b. the ratio of the dimensions is selected arbitrarily and the diffusers may optionally be separated by flow ducts with and without heat exchangers; n.b. the diameter-to-length ratio in FIG. 32 is selected arbitrarily), the number of diffusers $n_{Diff}$(opt) used per unit length of the flow duct, for a given opening angle $\delta_0$, being optimized as regards the ratio of $F_{D,0}/F_{F,0}$ generated specifically by the flow duct, including heat exchangers, i.e. as regards the increase of $F_{D,0}$ achieved by heating and expansion, on the one hand, and as regards the increase of $F_{F,0}$ minimized by limiting the flow volumes (in the case of a constant wall surface), on the other hand (i.e. several small diffusers are better than one large diffuser with an abrupt transition), and the number of diffusers per flow duct being in the range of $1<n_{Diff}<100$, but preferably in the range of $1<n_{Diff}<5$ and/or 14. As 13., but with a flow duct arranged in any (i.e. nonbent and bent) plane $S_{3dim}(r,\Theta)$ (see point 16 of the Technical Solutions of this section) of the porous diaphragm, individual diffusers, diffuser staircases and flow duct regions and/or the entire flow flow duct being designed in bent form and permitting a relatively compact Diaphragm* design and therefore a compromise between high conveying flows (in all directions of flow within the porous diaphragm and not only in the dx direction), high dT/dx and an efficient design of the porous diaphragm, as well as special flow duct forms due to absolute lenghtening (cf. points 12 and 13.), the diffuser staircase representing in design terms, irrespective of the direction of translation of the trans diaphragm vapor flow, a useful basic element for compact Diaphragm* designs for the purpose of increasing the specific force:

$$F_{D,x}(A_T,\rho_T)=F_D(A_T,\rho_T)*\Delta l/\Delta x \qquad (56)$$

in which, here, $\Delta l$ is the total length of the transdiaphragm flow path within the three (x, y, z) directions of translation and the specific contact area per unit length of the transdiaphragm cross section in x-translation and consequently an increase of the $\delta\rho/\delta x$ term in equation (55) is maximized per flow duct, and/or 15. Internested successively lined-up diffusers (cones) (see FIG. 33 showing internested diffuser cones with a) a common peripheral (annular) duct, b) discrete outflow ducts and c) a combination of a) and b), while a) showing a continuous version, the discrete flow ducts being equipped with heat exchangers (fine lines); n.b. the ratio of the dimensions is arbitrary) and/or succesively duplicated diffuser (-like) flow ducts (see FIG. 34 showing duplication of a flow duct by (continuous) flow duct widening, including widening of the flow cross sections within the radiators of the transduct heat exchangers (fine lines, cf. star) according to one of the solutions in point 3.–12., which are or not equipped with heat exchangers and which optimize both the specific contact area per unit of length in x-translation and consequently the increase of the $\delta\rho/\delta x$ term in equation (55) and the (1-dimensional) fluid mechanics, particularly high pulse is required (e.g. in the central region) of the transdiaphragm flow of the diffuser (e.g. in the $B_j/C_k$ Diaphragm* type cf. FIRST PART of the invention), either the first diffuser (cone) having the largest flow diameter and also completely and/or partially enclosing the following cones (FIG. 33) and/or the first diffuser being divided into at least one further diffuser either once or more than once and thereby beginning about a corresponding separation of the transdiaphragm vapor flow (i.e. without return, cf. bifurcations) (cf. FIG. 34), in the first case (FIG. 33), enclosing a number $n_{con}$ of internested cones with succesively decreasing cross sections for a given transdiaphragm flow length $\Delta x$, which either guide the vapor (with the exception of the central flow along the axis of the flow duct) into a common peripheral (e.g. concentric) annular duct (FIG. 33a) or discharge it in a discrete annular duct, located further inside two respective adjacent (e.g. concentric) diffusers, at the same height as the peripheral flow duct, into the next evaporation unit (FIG. 33b), or result (FIG. 33c) in a combination of the solutions illustrated in FIG. 33a and b, and/or (where appropriate, concentric) annular flow ducts are used (cf. FIG. 33a,b), which, before outflow into the next plant unit, have either (i) a flow cross section continuously widening transdiaphragm, (ii) a constant cross section or (iii) a (peripheral) cross section continuously narrowing again, and the number $n_{con}$ extends in the range of $1<n_{con}<100$, preferable od $1<n_{con}<10$, (which additionaly accelerates the vapor flow discharged in the peripheral annular duct, even in the case of a widening overall cross section of the outer flow cone, as a result of its relative reduction in cross section. The corresponding $\delta A/\delta x$ term in equaition (25) must be added as a (positive) amount (!) (corresponding to the surfaces of a sine function alternating by y=0) to the total amount and incrteases the correponding contribution to $F_D$. If the pulse of the transdiaphragm flow has no decisive importance for the result in the next following evaporation unit, the widening of the . . . ) and transfer the total diffuser cone flow according to the solutions in FIGS. 33a–c directly into the next following evaporation chamber and/or in combination with the geometric elements, claimed in EP-Application 94111991.9, Aug. 1, 1994, and PCT Application PCT/EP95/02882 of Jul. 19, 1995, at the flow outlet (with $c_F$- (german: $c_W$-) coefficients <0.3 resulting in the case of flow around) and which help to avoid condensations and/or turbulences at the flow outlet of a corresponding (main) Diaphragm*, and/or (n.b. the multicone configuration results, in general, in a Diphragm* volume which is effectively better utilized for heating and expansion of the transdiaphragm vapor flow than the diffuser staircase)

16. Measures for lengthening the transdiaphragm diffuser (variant) and multicone (i.e. diffuser) configurations according to point 15., which increase the absolute heating (energy supply) and the resulting expansion of the (macroscopic) transdiaphragm conveying and/or mass flow per (diffuser) flow duct, specifically:

a) Deflection angle $0°<\alpha_x<180°$ between the at least one (diffuser) flow duct axis (of symmetry) and the x perpendicular to the Diaphragm* inflow side, the transdiaphragm diffuser axis (of symmetry) being nonbent and being coplanar in one of the three following translation planes:

a1) in the xy-translation plane of the corresponding (main) Diaphragm* and/or a2) in the xz-translation plane of the corresponding (main) Diaphragm*, and/or a3) in one of the possible translation planes in the xyz-translation space of the corresponding (main) Diaphragm*, which are either planar or curved (bent) and the curvature of which is formed from regular geometries (e.g. sphere (spherical cup), ellipse (elliptic cup) etc.) or from irregularly bent curves, and, in any case of the xyz-translation planes bent in space, encloses, for the (arbitrary) (diffuser) flow duct, the polar angle $\theta$ and the azimuth angle $\Phi$ between the inflow point on the inflow side of the Diaphragm* and the circumcircle of the flow duct carrier surface bent in the xyz-space, the corresponding bent (diffuser) flow duct xyz-carrier surface $S_{3dim}$ being defines according to $$S_{3dim}(r,\Theta)=\int[\int r(\Theta,\phi)^2 \sin\Theta d\Theta]d\phi \qquad (57)$$

Figure 35:
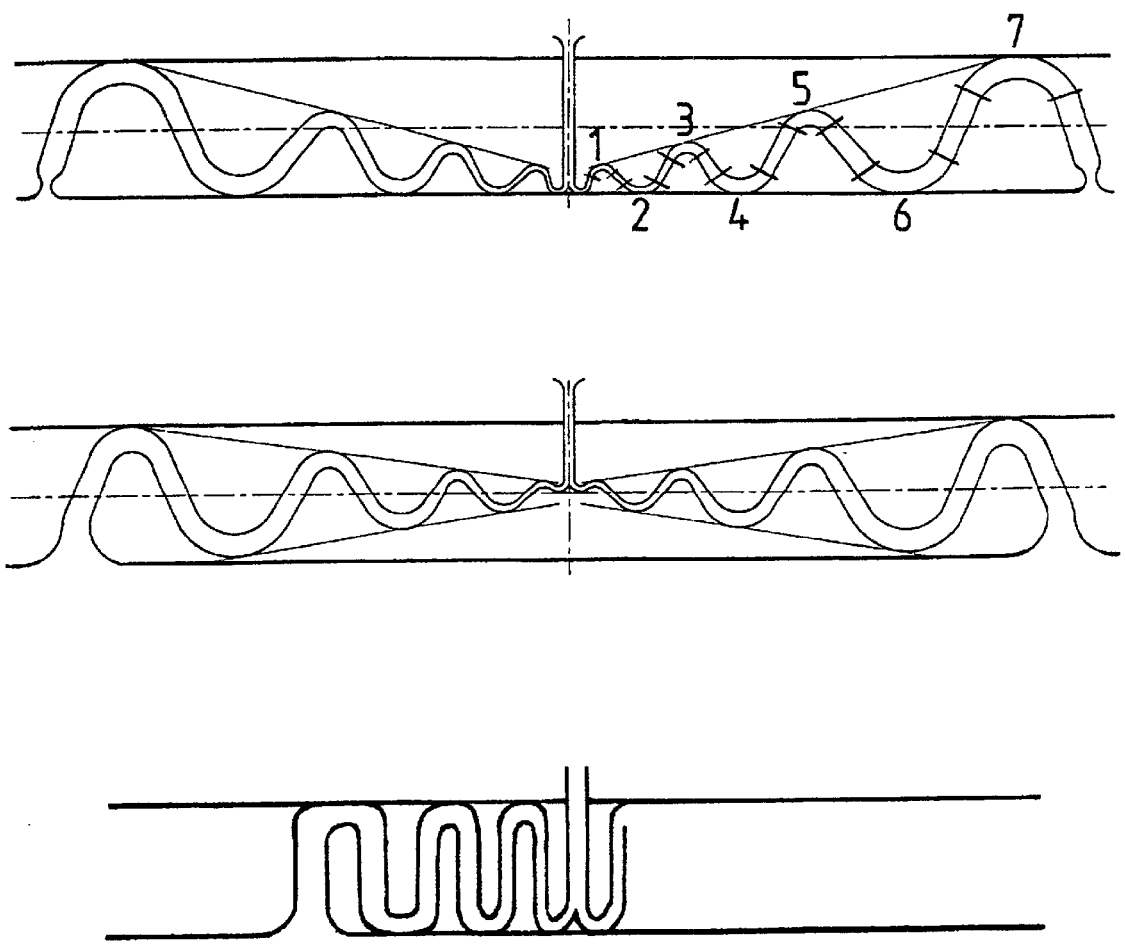
FIG. 35 Flow duct with bent duct segments, the bend orientation of which oscillates in the x/z-translation plane and, at the same time, has a continuous widening of the flow duct and terminates in a Laval nozzle outlet.
Figure 41:
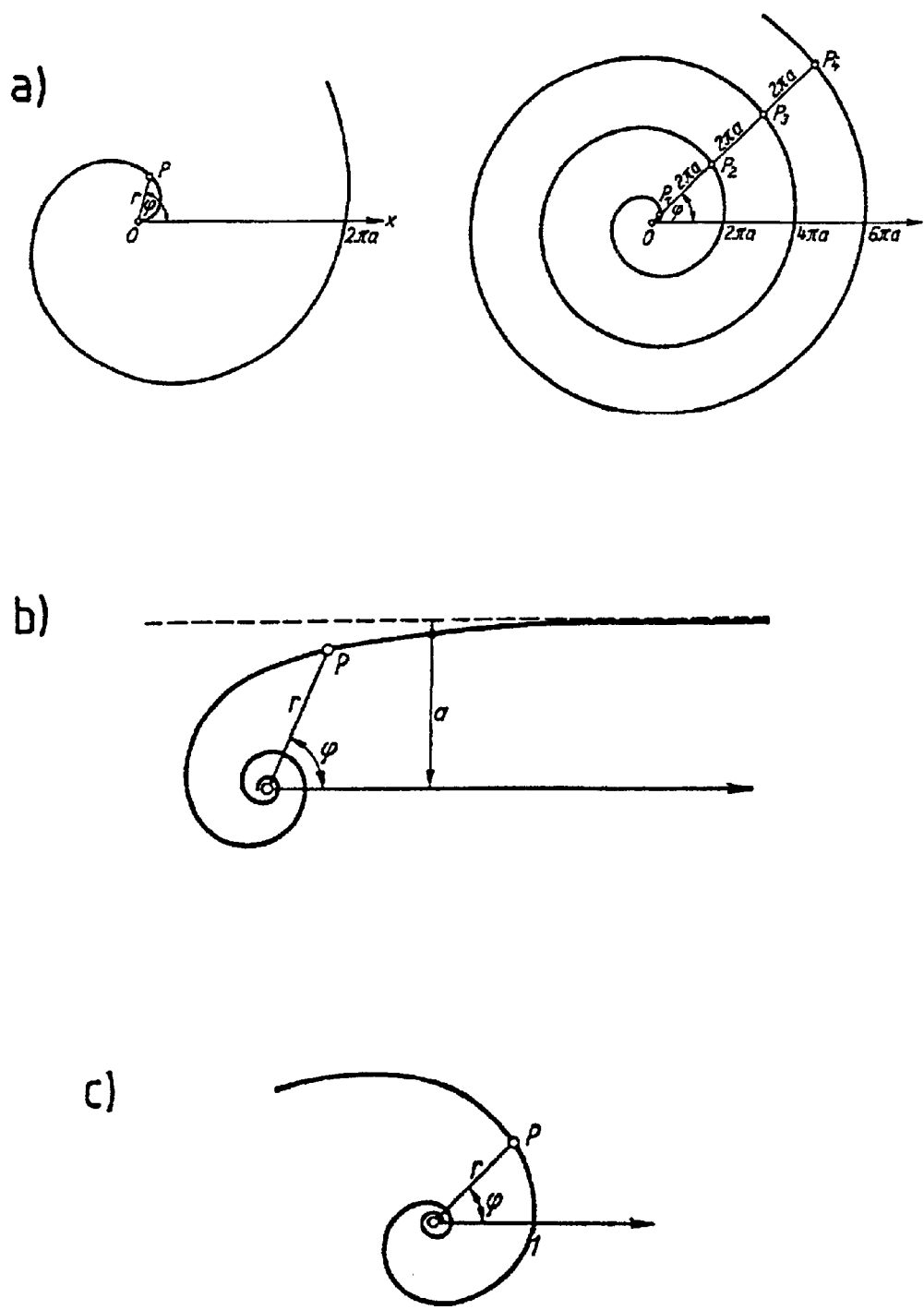
FIG. 41/continued, with perspective representation of a flow duct spiral and a meander-like flow duct.
Figure 42:
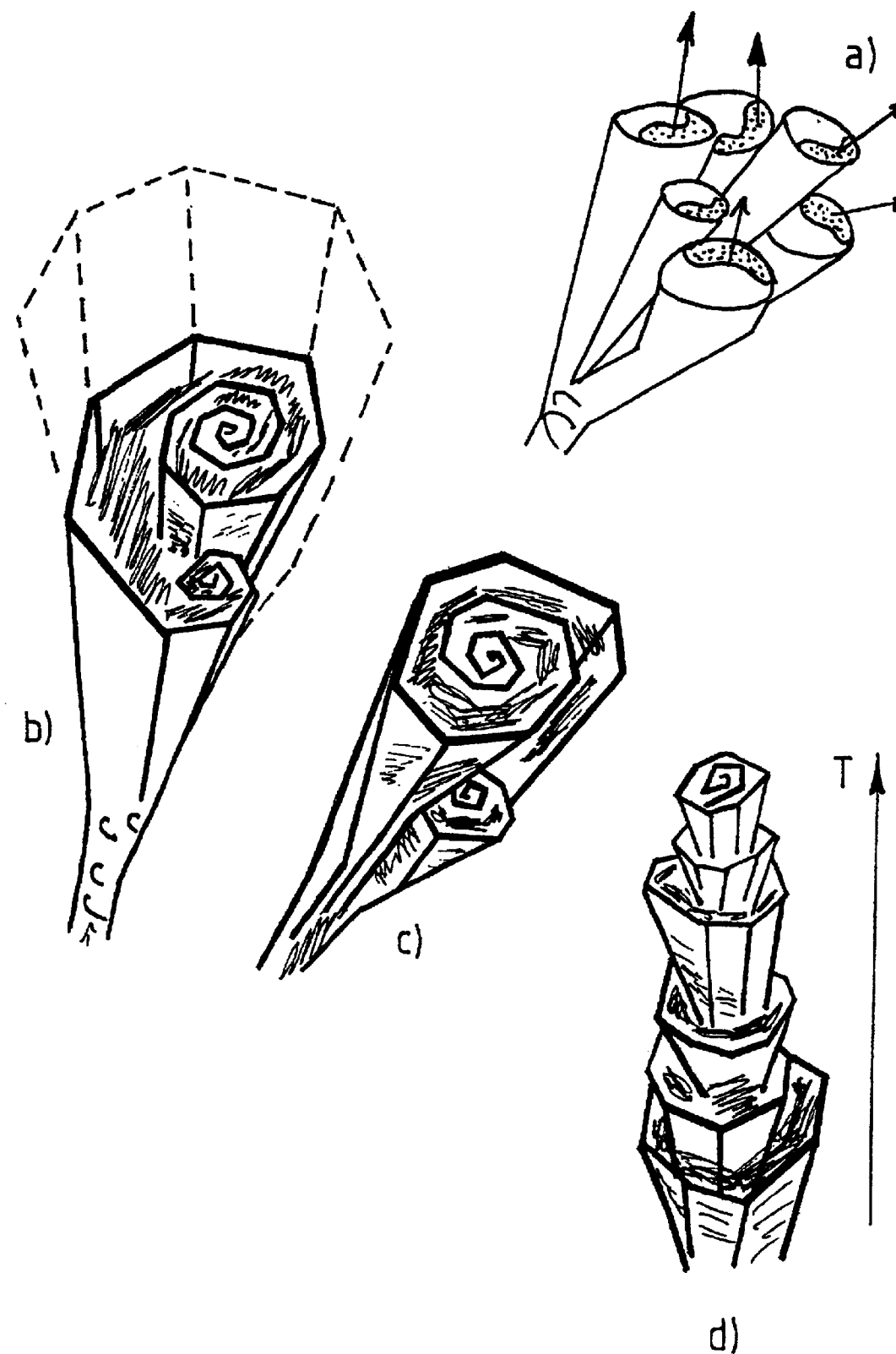
FIG. 42 Multiple flow cones for a superheated flow duct passing through each individual cone with different outflow heights, outflow angles, outflow orifice dimensions and outflow orifice forms.

If this arbitrary surface $S_{3dim}(r,\Theta)$ is considered from any position O at any point M within the transdiaphragm Diaphragm* volume, the dictance $\underline{OM}$ being fixed by the unit vector $\underline{u}$ having the amount r according to $$\underline{OM}=r(\Theta,\phi)*\underline{u}(\Theta,\phi) \qquad (58)$$

the differential $d(\underline{OM})=d\,[r(\Theta,\phi)*\underline{u}_o(\Theta,\phi)]$ yields the general description of the (diffuser) flow duct xyz-carrier surface $S_{3dim}$ according to $$d(OM) = (\delta r(\Theta,\phi)/\delta\Theta)d\Theta *\underline{u} + \qquad (59)$$
$$r(\Theta,\phi)*(\delta\underline{u}/\delta\Theta)d\Theta +$$
$$(\delta r(\Theta,\phi)/\delta\phi)d\phi *\underline{u} +$$
$$r(\Theta,\phi)*(\delta\underline{u}/\delta\phi)d\phi$$

and the fixed solid angle, at which this surface in the Diaphragm* is considered from position O, is defined as the sum of the vectors $\underline{u}/r^2$ $$\Omega = \int\int_\Sigma (\underline{u}/r^2)\, d\underline{S}$$

which pass all infinitesimally small surfaces $d\Sigma$ on $S_{3dim}$, and/or b) as a), but with discontinuous, i.e. kink-like change in orientation of the transdiaphragm flow duct with diffusers, the kinking being capable of being located both inside and outside a discrete diffuser or diffuser variant region and, in either of these cases, leading to a diffuser series lying
 b1) within the xy-translation plane and/or
 b2) within the xz-translation plane and/or
 b3) within the xyz-translation plane lying in space according to a3) and/or
 b4) within transdiaphragm translation planes of a main Diaphragm* which consist of any combination of translation planes a1, a2) and a3), and/or
c) as b), but the bend is continuous (round) and consists of
 c1) concentric and/or
 c2) parallel and/or
 c3) nonconcentric (e.g. diffuser) flow ducts having an (arbitrarily) bent axis of symmetry, the bend of the axis of symmetry being selected in such a way that either
  1) no additional turbulences occur as a function of the operative Re number as a result of the bend and/or
  2) a (more) turbulent flow occurs without causing any risk of transdiaphragm condensation and/or
  3) a vortex street occurs at the diffuser center, in such a way that peripheral convergences are reinforced and accelerated, and/or
 c4) nonconcentric (e.g. diffuser) flow ducts without a bent axis of symmetry and/or
 c5) any bends and/or bend combinations, and/or
d) as b) and/or c), but consisting of flow duct segments, (e.g. circle arcs, i.e. circularly curved pipe segments) which, in the case of at least one of their changes in orientation, oscillate in a direction opposite to that of the adjacent segments (cf. FIG. 35 showing flow duct with bent duct segments, the bend orientation of which oscillates in the x/z translation plane and, at the same time, has a continuous widening of the flow duct and terminates in a Laval nozzle outlet. Top: asymmetric; middle: symmetrical increase in the oscillation amplitude; bottom: meander-like with a constant oscillation amplitude) and/or
e) as a) to d), but close off the transdiaphragm (diffuser) flow duct region (in the direction of flow) by means of at least one nozzle, but at most by means of a number of nozzles corresponding to the number of diffusers, this at least one nozzle being preferably an ultrasonic of Laval nozzle (cf. chapter further below), and/or
f) (diffuser) flow duct arrangement within a (main) Diaphragm* for the separation of conventional evaporation chambers according to 16. a)–e), but with an optimized length ratio $l_{diff}/l_{nozzle}$ or $l_{wid}/l_{nar}$, whilst maintaining a compact design (cf. FIG. 36 is as for FIG. 35, here showing a Laval nozzle inlet and outlet and two different length ratios between the transdiaphragm flow duct (here with $\delta=0°$) and Laval nozzles, ie. $l_{wid}/l_{nar}$) with branching, but without backflow, cf. "bifurcation", next chapter), the length ratio or being in the range of $1.5 < l_{diff}/l_{nozzle}$ (or: $l_{wid}/l_{nar}$) $< 1000$, preferable in the range of $1.5 < l_{diff}/l_{nozzle}$ (or: $l_{wid}/l_{nar}$) $< 50$, and/or g) as a) to e), but, here, $\alpha_x$ is the outflow angle $\alpha_x$ on the backside of the corresponding (main) Diaphragm*, and/or 17. Spiral flow ducts with transdiaphragm structural parts according to at least one of points 1. to 16. of the Technical Solutions of this chapter, which represent a special case of (diffuser) flow ducts bent in space, since their direction of flow is not explicitly tied to any special surface on the xyz-translation space of a (main) Diaphragm*, and therefore allow a further form of better utilization of the xyz-translation space of a Diaphragm* for the heating, expansion and/or acceleration of large transdiaphragm vapor flows, but instead (the propagation direction of) spiral (diffuser) flow ducts are tied to any axis (where appropriate, axis of symmetry) in the xyz-translatioon space of a main Diaphragm* (i.e. in relation to the transdiaphragm space through which they pass), so that a corresponding (diffuser) spiral itself is advantageously characterized (see FIG. 37 showing arbitrary sectional plane E in a cone, touching two spheres, inscribed in the cone, at the points $F_1$ and $F_2$. $F_1$ and $F_2$ are the focal points at the resulting ellipse within the cone, the direction of flow in a spiral passing through the cone being identical only at corresponding focal points, but never in a straight line or plane) by a flow cone, widening in the direction of flow, as (idealized) outer limitation and, as a consequence of a wide variety of resulting flow outlets, is particularly suitable to be used for Diaphragm* backsides which are bent and adapted to the near-final contour product form, and/or 18. Flow worm and flow meander in the flow cone according to point 17. of the Technical Solutions, as a further basic Diaphragm* element and control stuctural part for transferring a controlled vapor quantity from one (conventional) vapor or deposition chamber into the next, the flow worm and flow meander being combined with at least one of the Technical Solutions of the chapter "Bends" and/or "Bifurcations" (see next chapter), and the flow cone being an ideal geometric structure which, like an (outer) casing, encompasses the transdiaphragm volume, in which is located the flow duct wound spirally or in a meander-like manner (and/or in a similar way, cf. point 19.3) in the xyz-translation space of a Diaphragm*, these flow ducts preferably being shaped to form a diffuser and heated, specifically heated preferably inductively and/or by the resistance-method and the diffuser angle amounting to $-60° < \alpha < 60°$, preferably $-10 < \alpha < 10°$, and the flow duct wound to form the flow worm and flow meander possessing, where appropriate, the following (geometric) characteristics: appropriate, the following (geometric) characteristics:

18.1 Flow duct with a continuous or (particularly in the case of a polygonal spiral, see below) pseudo-continuous widening of the spiral (or meander-like) projection of the profile of the axis of the flow duct, the vapor flow experiencing correspondingly continuous or pseudo-continuous heating and expansion in the direction of flow and therefore conforming to basic requirements of the Diaphragm* (cf. EP-Application 94111991.9, Aug. 1, 1994, and PCT Application PCT/EP95/02882 of Jul. 19, 1995) and being capable, in the vertical inner cross section having a flow routing wound in a worm-like manner, of assuming the profile illustrated in FIGS. 38 a–c (showing flow spiral with a worm-like propagation direction transdiaphragm and with 5 full roundings, here with an elliptic flow duct cross section in the horizontal and, optionally, a centered flow inlet (detail at top right), the tangent to the main vertex regions forming an inner cone with an opening angle α and an outer cone with an opening angle β, FIG. 38b in particular showing a flow spiral with a/b>1 and branches (bifurcations) which, if appropriate, are used for additional transdiaphragm flow ducts and FIG. 38c showing in particular a porous diaphragm with symmetrically arranged flow ducts according to FIG. 38a; nb. O=surface) the central axis of the transdiaphragm profile of the worm here being colinear with the x-perpendicular to the surface of the Diaphragm*, and, in the worm-like flow routing wound spirally in projection, allowing, in comparison with alternatives bounded by sharp bends, a relatively high control of dead flows and lower fluctuations in the (local) stationary flow speed, i.e. smaller deviations from the mean transdiaphragm flow speed, and being arranged in a matrix of symmetrically or asymmetrically arranged trans diaphragm flow ducts which, as a whole, make up a form of the porous diaphragm Diaphragm* which is arranged over the whole of or part of the cross section of the shaft of the evaporation and/or mixing chamber, into which or out of which the vapor flows, and/or 18.2 As 18.1, but with the following design variables of the flow worm in the flow cone:
 a) the angle between the x-perpendicular and the central axis of the flow cone σ, i.e. $α_{x,o}$, in which $0° \leq α_{x,o} < 90°$, and/or
 b) the form of the ideal outer casing which surrounds the transdiaphragm Diaphragm* volume through which the flow duct passes, including:
  b1) a superproportional and/or subproportional widening of the casing cross section in the out flow direction (FIGS. 39 a–d showing a) superproportional and b) subproportional cone widening and c), d) two of the possible resulting transdiaphragm (duct) volumes through which a flow spiral passes, e.g. in the form of a worm, (c): continuous widening of cross section, d): continuous widening and contraction of cross section).) or no widening (i.e. a cylinder) and/or
  b2) a vertical widening of at least one of the ideal casing cross sections in the outflow direction can be described according to a mathematical function or is similar to this (e.g. exponential, logarithmic, hyperbolic or parabolic or any polynomial, etc. cf. FIG. 39e) and/or
  b3) any vertical widening of the (ideal) casing cross section in the outflow direction and/or
  b4) transitions from a round to an angular outer (casing) and inner (flow duct itself, etc.) design for the purpose of more efficient space utilization of the Diaphragm* volume (cf. FIG. 39e showing a transition from a round to an angular outer cone of the volume, through which the transdiaphragm flow duct passes, in order to utilize the available space of the Diaphragm* efficiently; hatched area in 39e: closed; dotted area in 39e, right hand side: outlet of the worm shaped (meanderlike) flow duct), so that the vertical (casing, i.e. external) form of the flow cone is either a) round, or adapted b) to the polygonal and/or c) to the mixed form of movement of the flow duct and/or
  b5) any geometry of the outer circumference of the flow duct volume, in which the meander like and/or spiral or arbitrarilay shaped flow duct is located with $D_A/D_0 < l < D_A/D_0$ in the transdiaphragm Diaphragm* volume (cf. FIG. 39f showing transdiaphragm detail with an arbitrary, here vase-shaped volume for the transdiaphragm flow duct;) and /or
 c) rounded and/or angular flow cross sections and/or
 d) flow duct wall bent in parallel and/or concentrically and/or
 e) the inlet (cf. FIG. 38b) and/or transdiaphragm dimensions $D_H$ (at $0.01 \leq D_H < 100$), $a_0$, $b_0$ can assume a side ratio $a_0/b$ (ellipse: radius ratio a/2/b/2) for quadrangular and correspondingly rounded flow duct outer walls with the special cases a=b (i.e. quadratic flow cross section or circle), in which $0.1 < a/b < 1000$, but preferably $0.4 < a/b < 10$ (cf. FIG. 38a,b), and/or
 f) the number of (full) loops for the flow duct according to 18.1, this number ranging from 0.2 to 100, preferably to 10, and/or
 g) relating to the diffuser (-like) flow duct according to 18.1 wound in space, but with the following cross-sectional geometries:
  g1) triangular and/or quadrangular form (rounded: different radii of opposite main and secondary vertices of elliptic flow cross sections, radius ratios $b_{int}$ and $b_{ext}$ and changes in the radius ratios, cf. FIG. 40 showing a) flow duct cross section geometries relating to solution 18.2. g) of the Technical Solutions of the chapter "Transdiaphragm flow ducts . . . " with Lemniscate and Cassini curves in g4), and/or
  g2) symmetrical polygons (including symmetrically rounded polygons, FIG. 40) and/or
  g3) asymmetric polygons (including asymetrically and/or arbitrarily rounded polygons, FIG. 40), and/or
  g4) cross-sectional forms which can be described fully, but at least partly by a circle equation (e.g. center quation) and/or parabola equation (e.g. vertex equation) and/or ellipse equation (e.g. polar equation) and/or hyperbola equation and/or by a cone section in a general position and/or by any exponential and/or logarithmic and/or polynomial form and/or by any roulette and/or by a crank mechanism form of movement and/or by a spiral form (cf. above) and/or by a Cassini curve (e.g. lemniscate) and/or by harmonic oscillations and/or deviate by (microscopic) irregularities from these forms, without altering the corresponding (macroscopic) overall form (mean axis), or are characterized by any form, such as those resulting from the overlap of at least two of these basic cross-sectionional forms (cf. FIG. 40, first continuation showing cross sections and cross-sectional segments according to various mathematical functions and second continuations relating to the arbitrariness of flow duct cross section geometries (hatched areas)), and/or
 h) any inner angle a(x, y ,z), outer angle β(x, y, z), angular ratio α/β(x, y, z), including asymmetric variants with $ε_1$ unequal to $ε_2$ (FIG. 38b) and continuously and discontinuously changing quantities δα(x, y, z), δβ(x, y, z) and δγ(x, y, z) of the cone or of related ideal inner and outer casings (FIG. 39a) which are between 0° and 90° and/or
 i) the shortest distance between the inside diameters of the (ideal) spiral $l_1$, the $D_H$-values of which being 0.2 $D_H < l < 100$ $D_H$ (cf. FIG. 38a),
 j) the distance $l_ω$ between two flow stages, in which 0.2 $D_H < l_ω < 100$ $D_H$, variation of the distance $dl_ω$ between successive flow stages and variation of this variation, i.e. $\delta^2 l_\omega$ with subsequent stages (cf. FIG. 38a) and/or k) the (projected form of movement (of the axis) of the flow duct in the flow cone (or flow cylinder) describes any curve in space and preferably an (if appropriate, irregularly or angularly composed a) Archimedean, b) hyperbolic, c) logarithmic or d) arbitrarily combined and/or regular and/or irregular spiral (cf. FIGS. 41a–c and e showing forms of movement of the (central axis of the corresponding) transdiaphragm flow ducts in the flow cone, here projected onto the porous diaphragm surface with 41a an Archimedean spiral, 41b a hyperbolic and 41c a logarithmic spiral and 41e a perspective representation of a flow duct spiral and 41f (where appropriate, projection) of a meander-like flow duct) which either has a continuous, i.e. round contour or else is polygonal, specifically triangular, quadrangular, pentagonal, hexagonal, septagonal, octagonal, etc., or has a combination between continuously round and at least one of these polygonal and arbitrarily irregularly polygonal variants (cf. FIG. 42c showing multiple flow cone, a superheated flow duct passing through each individual cone, here with a lateral double spiral with a different outlet level) or a combination of at least two of these polygonal solutions. In the case of the angular, i.e. polygonal variants of the contour of the flow cone, the edge lengths for a given cone height can vary or have a constant length (cf. FIG. 41d showing projection PS of a hexagonal spiral for the form of transdiaphragm movement of the flow duct through its cone K), and/or l) angle of inclination $\omega$ of the flow duct in the flow cone, etc. (see below) relative to the surface of the Diaphragm*, which angle is defined by the factors under c)–j) (cf. FIG. 38c) and is in the range of $0° < \omega < 90°$, $\omega_{min}$ being fixed primarily by the ratios $\alpha/\beta$, $\alpha^{max}/\beta^{max}$, $\alpha/\beta$, $\alpha^{max}/\beta^{max}$, distance $l_\omega$, i.e. by the "internal" design, and $\omega_{max}$ being fixed primarily by the transdiaphragm state gradients dT/dx and dp/dx, i.e. "externally", and/or m) the reversal of all hitherto occurring versions into a nozzle form (rotation of the cone with respect to the inflow and outflow direction), as may be expedient in the case of transdiaphragm material conveyance driven locally by a pressure gradient, and/or n) position in space and nature of the inlet and outlet orifices, of which the relative variability (e.g. dimensions) increases with the angle $\alpha_{x,o}$ (cf. FIGS. 38 and 39e), and which can thereby assume the inlet and outlet cross sectional forms described under g) (different from the transdiaphragm cross section!), the vapor outlet of the flow cone consisting of an orifice which, relative to the flow inlet, is comparatively large (in the suction mode) or comparatively small (in the local pressure mode), in order, for example, to ensure a large area for the suction (local pressure) onset, i.e. suction (local pressure) effect of the suction (local pressure) flow, and this orifice, where appropriate, being larger (smaller) than the area which is predetermined by the cross section of the spiral flow duct and which optionally can assume the entire contour of the cone, but at least, depending on the oblique section, a part of this contour which is advantageous in terms of fluid mechanics (FIG. 39e), and/o o) guide blades according to 4. and 5. and/or according to 4. and 5. are used in the diffuser itself and/or 19. Variations of the flow worm, etc. in the flow cone according to point 18., for subsequent flow stages, selectively, (e.g. after a complete revolution $2\pi_{\omega=360°}$ of a worm turn or after any part of a revolution) parts of the inner and/or outer wall of the flow cone and/or of the flow duct disappearing and/or the diameter of the inner wall of the flow cone and/or of the flow duct increasing subproportionally to the corresponding quantities of the respective outer wall, in order to ensure branches of flow ducts, specifically 19.1 into the inner cone bounded by the angle a (cf. FIG. 38b), e.g. for the accelerated transdiaphragm (direct) conveyance of part of the vapor flow into a following plant unit, the inner space defined by a, da etc. being, where appropriate, lined with a real cone and/or, in addition, any flow ducts, etc. which increase the corresponding suction effect caused by underpressure from the following plant unit (pressure effect caused by overpressure in the following plant unit) and consequently the corresponding conveying flow (n.b. such an inner space without a lining is shown in FIG. 41e for illustration) and/or 19.2 into the outer space, bordered by the Diaphragm* surface and the outer casing, of the (extrapolated) flow cone (cf. FIG. 38b), e.g. for bifurcations see the following chapter) or, for (lengthened or shortened) material conveyance, into another, e.g. one of the following plant unit(s), via an additional flow duct of any kind and/or 19.3 for branching the inflow duct out into at least two (e.g. spiral or meander-like, cf. FIGS. 42a–d and/vs. 42f showing multiple flow cones, a super heated flow duct passing through each individual cone, a) laterally and with different outflow heights, outflow angles, outflow orifice dimensions and outflow orifice forms, b) lateral double spiral, if appropriate with a common diffuser outlet, c) lateral double spiral with a different outlet level and d) central (longitudinal) multiple cone, where appropriate a spiral flow duct passing through the internested individual cones (cf. FIG. 38b)) transdiaphragm flow ducts which then, where appropriate, produce either symmetrical (e.g. double) spirals (FIG. 42a) or (laterally) asymmetrically displaced cones (e.g. multiple spirals) of the same or similar form (FIG. 42b, c) and/or definite transdiaphragm volumes which are ideally formed by the corresponding flow duct extremities, the flow ducts being transferred depending on the local propulsion force and the Diaphragm* type, from a plurality of flow inlets into one main outlet or from one vapor flow inlet into a plurality of vapor flow outlets (cf. EP-Application 94111991.9, Aug. 1, 1994, and PCT Application PCT/EP95/02882 of Jul. 19, 1995.

19.4 internested cones of equal and/or different diameters for a given transdiaphragm Diaphragm* cross section for increasing the suction effect, along with reduced vapor heating (despite the heat exchangers possibly mounted in the cone), if appropriate flow duct contractions (nozzles) being provided selectively downstream of at least one of the cones for a better control of the flow, and the successively following cones having both smaller (FIG. 42d) and larger diameters, and/or 19.5 in any combination with contractions in cross section (nozzles) and/or bifurcations and/or flow bends (see next chapter) and/or (internal and/or external) geometric elements (cf. EP-Application 94111991.9, Aug. 1, 1994, and PCT Application PCT/EP95/02882 of Jul. 19, 1995), 20. Diaphragms* with any number of transdiaphragm flow ducts, which are constructed, where appropriate, from diffusers and/or nozzles according to points 1. to 19. and are composed of the following scenarios:

20.1 of any portions (of the Diaphragm*) having flow ducts designed symmetrically relative to at least one of the axes of symmetry possible in the xyz-translation space, or 20.2 of a completely symmetrical design in respect of at least one of the possible xyz-translation axes in the transdiaphragm Diaphragm* space or a 20.3 of an entirely random design.

21. Porous diaphragms according to at least one of solutions 1. to 20., such that, even at low flow speeds v and with low Re numbers, including a laminar flow, high dT/dx gradients are also achieved for large conveying flows and/or in the case of a compact Diaphragm* design.

3. Contractions of the flow duct cross section (nozzles and corresponding combinations)

Transdiaphragm flow duct contractions for (local) acceleration of the transdiaphragm vapor flow reduce, in general, the suction effect of the process as a whole and are therefore employed on the premise that the global suction effect and plant productivity remain maximized (cf. equations (25) and (26)). Consequently, (apart from local and regional exceptions such as, for example, pressure-operated and transdiaphragm material conveyance of individual evaporation chambers, such as, in particular, for magnesium and other relatively highly volatile matter, such as water, alkali (alkaline-earth) metals, etc.) flow duct contractions and/or (ultrasonic) nozzles, preferably in combination with other transdiaphragm Diaphragm* structural parts are used.

3.1 Diffuser (heat exchanger) nozzle combinations

Figure 43:
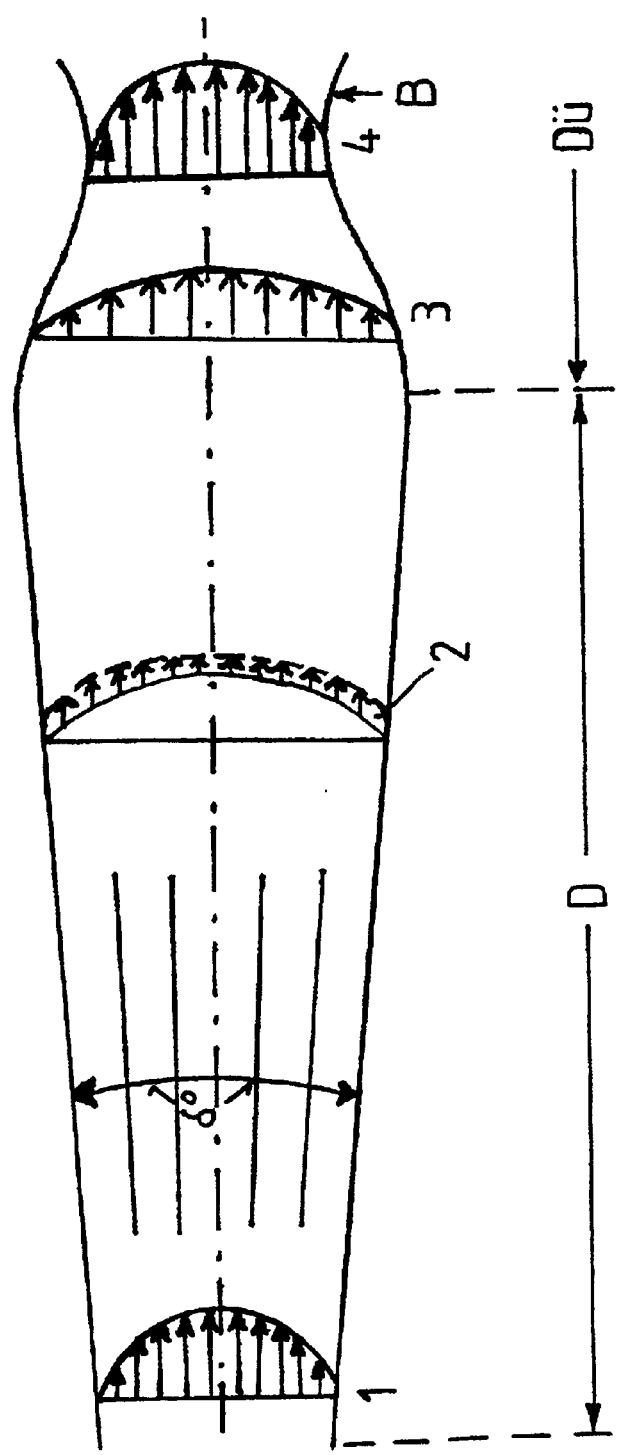
FIG. 43 Development of the profile of the flow speed in a flow duct.

Any flow leads to a reduction in speed particularly in the boundary layer of the flow volume. FIG. 43 shows the development of the profile of the flow speed in a flow duct which consists of a diffuser/nozzle combination and which is equipped with a heat exchanger in the diffuser region. Whilst the diffuser reduces the acceleration experienced by the vapor flow as a result of heating in the diffuser region and allows more efficient utilization of a given vacuum (cf. FIG. 21), the following nozzle, on balance, permits a higher vapor outflow speed in comparison with the speed before inflow into the diffuser; D=diffuser; Dü=nozzle; B=bifurcation; 2=heating effect on v-profile; 4=section for bifurcation. At the start of inflow, the diffuser brings about, in comparison with the cylindrical flow duct, an additional reduction of the flow speed, inter alia in the flow boundary layer. In this case, the diffuser angle is selected in such a way that a breakaway of the flow boundary layer, for example caused by local turbulences (outside the flow), is avoided. In comparison with a flow duct having a constant cross section, under these conditions and in the case of a given Re number at the inflow cross section (cf. FIG. 21), a diffuser reduces:

the initial flow duct length $l_j$, in which the transverse flow profile is unstable, and therefore also the contribution to the frictional resistance $F_F$ which occurs as a result of friction inside the flow (cf. FIG. 7b, and/or the contribution to the frictional resistance $F_F$ caused by friction between the pipe inner walls in the region of the diffuser and the flowing medium and/or laminar fraction with parabolic transverse (transduct) speed distribution relative to the turbulent fraction with exponential or logarithmic transverse speed distribution in the total flow and/or the range of existence of unstable stability of the laminar flow above the critical Re number.

Consequently, after a flow time $t_s$ or after a flow path $l_s$, under identical flow conditions (identical Re number, flow speed $v_0$ and cross section $A_0$ at the inflow point), a relative increase of $v_{max}$(diff) results in the diffuser flow, as compared with $v_{max}$(flow) of a flow in the (e.g. cylindrical) flow duct of constant flow cross section (see FIG. 44 showing stabilized speed distribution over the transverse cross section of a cylindrical flow duct after having passed the initial length $l_i$, here with (1) laminar and (2) molecular flow of a compressible gas). Accordingly, for the operative Re range, the diameter of the inflow orifice of the diffuser, $D_0$, must be selected so that $l_s$ and $l_i$ are (approximately) identical.

Altogether, a braking of the flow in the boundary layer takes place, in association with (relative) acceleration in the flow center. However, even at constant temperatures, the difference $\Delta v_{max}=v_{max}(\text{diff})-v_{max}(\text{flow})$ also leads in the (transverse) flow center of a diffuser to a relative increase in the local partial throughput $z^*\delta q_m$ in relation to the corresponding partial throughput in the center of a (conventional) concentric flow duct, whilst a relative speed reduction and resulting throughput reduction $-(1-z)\delta q_m=(z-1)\delta q_m$, not taken into account in equation (55), occur in the boundary layer of the diffuser. For given $q_m$ at the inflow cross section, this relative increase is an (instantaneous) relative increase of $F_P$ in the central diffuser region. Since $F_D=F_P-F_F$ and $F_D$ completes the term $F_F$, $z^*\delta q_m$ is an increase of $F_D$ which is of particular importance for following nozzles, e.g. during momentum transfer, in the course of vapor deposition, whereas it is relatively unimportant in the case of $A_i/B_j$ diaphragms.

Resistance-heated and/or induction-heated walls generate an (initially local) heating and expansion of the vapor (in the boundary layer) which bring about an increase in the speed and pulse in the boundary layer of the flow and which are propagated via this progressively in the transverse direction over the entire profile of the flow speed (cf. position 2, FIG. 43). The relation illustrated in FIG. 43 applies both to transdiaphragm flow ducts and to slots in transduct heat exchangers themselves. In this way, $v_{max}$(diff) and $\Delta v_{max}$ are increased in comparison with heated cylindrical vapor routings.

For the retention and/or significant increase of the transdiaphragm vapor flow pulse, the (if appropriate diffuser) flow duct is combined with a continuous contraction of the flow cross section. This contraction has the form of a nozzle, preferably an ultrasonic or Laval nozzle (form, cf. Technical Solutions in the Bifurcations chapter). The angle and form of the following flow duct contraction (nozzle) are selected in such a way that the speed gain $\Delta v_{max}$ is converted optimally into an increase of $F_D$.

3.2 Nozzle/bifurcation combinations with and without diffusers (cf. next chapter)

The corresponding combinations allow relatively high (exit) speeds of the transdiaphragm vapor flow and are required in transdiaphragm material conveyance between a $B_i$ evaporation unit and a $C_k$ deposition unit (cf FIRST PART), but also for building up a sufficient (dynamic) pressure for the successful branching-off and backflow of a part quantity of the vapor flow via bifurcations (cf. following chapters). In an unheated diffuser, the speed v decreases in the direction of flow in proportion to the opening angle δ (FIG. 43, position 2 vs 1). The opening angle and heating capacity are coordinated with one another in such a way that, on balance, as a result of continuous diffuser widening (with and without breakaway, i.e. turbulences and/or dead flows) between the flow boundary layer, the braking effect experiences relative acceleration on entry into the continuous nozzle contraction (position 3, FIG. 43), but, at the latest at the narrowest cross section (position 4), exceeds the speed at entry into the diffuser (position 1) over the entire profile in position 4, but at least in the boundary layer there, and consequently affords the preconditions for a pulse which
a) ensures a successful bifurcation flow back into the original (conventional) evaporation chamber which functions as a vapor reservoir,
b) is sufficient to ensure the functions of the nonbranched (bifurcation) vapor flow (e.g. either in the center of the flow duct or on the (if appropriate, selective and in a)-coordinated) regions of its periphery) for transdiaphragm material conveyance.

In a diffuser/nozzle combination, the diffuser assumes the role of preparing the relative (cf. without heating and nozzle) and absolute pulse increase (in the state superheated in relation to the vapor) in the case of minimized pumping capacity losses, and, in case a), this role makes an additional contribution to $F_D$ in equation (55) which is derived in the following chapter. The nozzles for conveying bifurcation backflows can consist both of ultrasonic and of Laval nozzles and are optionally also used without diffuser.

3.3 Structural-part "oscillations"

Absolute length and absolute contact area amount per absolute length and absolute contact area amount per diffuser are of great importance and are greater by a real multiple than the corresponding quantities of a coexisting nozzle, and the opening angle of a diffuser, d (i.e. $0°<\delta<180°$), is preferably smaller than the inflow angle e (i.e. $0°<\epsilon<180°$) of a following nozzle, and both variations in cross section are preferably continuous (cf. FIG. 43). On account of limited conditions of space in a given plant version, the dimensions of the transdiaphragm structural parts involved cannot be widened at will (n.b. the size ratios along the translation axes in the figures of this patent Application are selected arbitrarily). The structural-part combinations with nozzle are particularly important for efficient transdiaphragm heating of large vapor quantities using heat exchangers since they make recurring diffuser/nozzle combinations (i.e. oscillating transdiaphragm flow duct structural parts, and therefore the means for wide-ranging manipulations of $F_D$ and $F_p$ possible (cf. EP-Application 94111991.9, Aug. 1, 1994, and PCT Application PCT/EP95/02882 of Jul. 19, 1995 and equation (55)).

3.4 Pressure-driven material flows

Pressure-driven material flows are used either in part units of the entire process operated by suction flow, upstream of the mixing chamber, and/or in conjunction with transdiaphragm plasma guns for any units including the PD diaphragm, before deposition. Both ultrasonic nozzles and Laval nozzles are used for pressure-driven (transdiaphragm) material flows.

Technical solutions

In connection with the abovementioned process, therefore, the following technical details are employed:
1. Vapor deposition processes, the conveying quantity of which is controlled by a porous diaphragm Diaphragm* and in the transdiaphragm flow ducts of which ultrasonic nozzles are used ( . . . and in the at least one transdiaphragm flow duct of which at least one ultrasonic nozzle is used) and/or
2. Vapor deposition processes, as 1., the ultrasonic nozzles of which are characterized by a loss figure $\zeta_U$ in the range of 0.001 to 10.0, preferably in the range of 0.1 to 5.0.
4. Bifurcations and nozzles, in particular Laval nozzles In the abovementioned vapor deposition process, unless otherwise characterized (cf. ventilators, etc., SECOND PART of the invention, further below and/or for $F_D<F_F$ or $F_D=F_F$, see chapter 10, point (vi) of FIRST PART and chapter 2 of SECOND PART of the invention), a part quantity of the (transdiaphragm) vapor flow or flows is branched off from the transdiaphragm material conveyance via bifurcations and is returned into the associated evaporation chamber (if appropriate, plurality of evaporation chambers). In the abovementioned vapor deposition process, bifurcations are flow duct or flow pipe branches which are located either upstream of the porous diaphragm Diaphragm* (i.e. in the screen mode, see below) and/or inside it (i.e. in the depth filter mode, see below) and which, by utilizing the pulse force of the transdiaphragm vapor flow, are employed for the controlled (e.g. condensation-free) part-quantity return and therefore for building up the vapor reservoir and for transdiaphragm flow acceleration by pressure reduction (cf. EP-Application 94111991.9, Aug. 1, 1994, and PCT/EP95/02882 of Jul. 19, 1995 and FIG. 45 ff. of this Application).

In the abovementioned process, vapor deposition is characterized by transdiaphragm material conveyance with the branching-off of a part flow quantity. In this case, transdiaphragm material conveyance is controlled case, transdiaphragm material conveyance is controlled, where appropriate, by the branching-off of the part flow quantity. Dividing the transdiaphragm flow quantity into a (successful !) bifurcation backflow and into an evacuation flow allows the actual suction effect (which disappears again after the closing of the vapor sources, together with the emptying of the vapor reservoir, and/or of the apertures) and, together with transdiaphragm vapor heating, gives rise to the propulsion force for the speed variation and expansion of the gas/vapor during transdiaphragm passage. The control of the pulse forces is therefore dependent on the variation in the flow mass between the Diaphragm* inlet, i.e. on dm (corresponding to a flow resistance, see EP-Application 94111991.9, Aug. 1, 1994, and PCT/EP95/ 02882 of Jul. 19, 1995) and on $dm_D$ (i.e. the actual) vapor flow quantity (ditto) evacuated per (main) Diaphragm*, i.e.:

$$dm=dm_D+dm_B \quad (60)$$

and the corresponding volumes are $$V=(1-\alpha_B)V+\alpha_B V \quad (61),$$

in which $dm_B$ or $(\alpha_B V)$ are the vapor quantities or vapor volumes returned via the bifurcations for the buildup of the vapor reservoir and located in a quasi-infinite circular flow (n.b. a quasi-infinite circular flow is not necessarily associated with a dead flow which increases $F_F$.

State Equations for Material Conveyance Without a Transdiaphragm Temperature Gradient Transdiaphragm material conveyance therefore contains (in the operational state, i.e. in the state of a dynamic material conveyance equilibrium), between two adjacent (conventional) evaporation and/or mixing chambers or between an evaporation (and mixing) level and a deposition level, not only a variation in the flow speed ($\underline{v}_2-\underline{v}_1$) (cf. equation (36)) and/or in the density ($\rho_2-\rho_1$) as a result of a temperature increase and/or variation in cross section (cf. equations (54) and (55)), but also a variation in the flow speed ($v'_2-v'_1$) (and, if appropriate, in the density ($\rho'_2-\rho'_1$) as a result of a reduction of the conveyed quantity $q_{v,D}$ as a result of the branching-off of partial quantities via bifurcations and backflow ducts, $q_{v,\beta}$, which return the branched-off quantity into the (evaporation) chamber, from which the quantity $q_{v,i}$ flowing into the Diaphragm* comes.

Both terms on the right-hand side of the equation (44) therefore apply to the pulse in the flow duct having at least one such bifurcation, irrespective of whether the corresponding flow duct has a temperature or not and/or whether the corresponding flow duct has variations in cross section or not. In the unheated flow duct, equation (45) is simplified to (see next page):

$$v = q_v/A \tag{62}$$

in which $q_v = q_m/\rho = dm/dt \cdot 1/\rho$, i.e. $q_v$ is the throughput in e.g. [m³/s]. For the state equation of a vapor flow in the unheated flow duct with (controlled) branching-off of a part flow quantity, the first term on the right-hand side of equation (44) therefore yields:

$$m\delta v/\delta t = m * \delta v/\delta x * \delta x/\delta t \tag{63}$$
$$= m[\delta(q_{v,i}/A)/\delta x]v$$
$$= m[(1/A)*(\delta q_v/\delta x) - (q_v/A^2)*(\delta A/\delta x)]v$$

and this results, in a similar way to equation (48), in:

$$m\delta v/\delta t = [(\rho q_v/A)*(\delta q_v/\delta x) - (\rho q_v^2/A^2)*(\delta A/\delta x)]\Delta x \tag{64}$$

Equation (64) is valid from x=0 to x=$x_1$ and from x=$x_2$ to x=$X_3$ (cf. FIG. 45 showing diagrammatic Diaphragm* for deriving the state equation for the transdiaphragm branching-off of a part flow quantity via bifurcations). In section x=$x_1$ to x=$x_2$, a vapor volume $\alpha_B V$ is branched off via bifurcations from the (transdiaphragm) vapor flow and is returned into the original chamber. The bifurcation-characterizing part flow volume $\alpha_B V$ is dependent on the distance ($x_2$-$x_1$). According to FIG. 45, $$\int_{x1}^{x2} = (-\delta V/\delta x)dx \tag{65}$$
$$= (-\delta V/\delta x)\int_{x1}^{x2} dx$$
$$= -\delta V/\delta x(x_2 - x_1)$$
$$= \alpha_B V$$

Accordingly:

$$(\delta V/\delta x) = -\alpha_B V/(x_2-x_1) \tag{66}$$

and the second term on the right-hand side of equation (44) yields:

$$v\delta m/\delta t = v*\delta(\rho V)/\delta t = v*[\delta\rho/\delta x*\delta x/\delta t]*V + v\rho*[\delta V/\delta x*\delta x/\delta t] \tag{67}$$

Substitution with equations (46) and (62) results, in a similar way to the derivation of equation (48), in:

$$v\delta m/\delta t = (\delta\rho/\delta x)*v^2 V - [\alpha_B V/(x_2-x_1)]*v^2\rho \tag{68}$$
$$= [\delta\rho/\delta x - \alpha_B \rho/(x_2-x_1)]*(q_v/A)^2*A*\Delta x$$
$$= [(q_v^2/A)*\delta\rho/\delta x - (q_v^2/A)*\alpha_B\rho/(x_2-x_1)]*\Delta x$$

Together with equation (51), there results the state equation in the flow duct without a temperature gradient, but with a variation in cross section, i.e. from x=0 to x=$x_1$ and from x=$x_2$ to x=$x_3$:

$$-(P\delta A/\delta x + A\delta P/\delta x) = [(\rho q_v/A)*(\delta q_v/\delta x) - (\rho q_v^2/A^2)*(\delta A/\delta x)] \tag{69}$$

and in the corresponding flow duct with branching-off of the part flow quantity via a bifurcation (or bifurcations) and corresponding backflow ducts, i.e. from x=$x_1$ to x=$x_2$:

$$-(P\delta A/\delta x + A\delta P/\delta x) = [(\rho q_v/A)*(\delta Q_v/\delta x) - (\rho q_v^2/A^2)* \tag{70}$$
$$(\delta A/\delta x)] + [(q_v^2/A)*\delta\rho/\delta x -$$
$$(q_v^2/A)*\alpha_B\rho/(x_2-x_1)]$$

To obtain the operative pulse in a similar way to equation (53), the following applies in the flow duct without a temperature gradient, without a variation in cross section and without a bifurcation and bifurcation backflow (cf. above):

$$\Sigma F_0 = F_P - F_F \tag{71}$$
$$= \int_{x0}^{x3} [\rho q_v/A*(\delta q_v/\delta x)]dx$$

In contrast the equation of pulse preservation (cf. Diaphragm*, type 2, FIRST PART of the invention) adapted to the bifurcation problem applies, in the (if appropriate, heated) state without a temperature gradient, to the above-mentioned Diaphragm* which contains in its flow ducts not only the variations in cross section, but also bifurcations for branching off part flow quantities from the transdiaphragm material conveyance:

$$\Sigma F_0 = F_P - F_F - F_D \tag{72}$$
$$= \int_{x0}^{x3} [\rho q_v/A*(\delta q_v/\delta x) - (\rho q_v^2/A^2)*(\delta A/\delta x)]dx +$$
$$\int_{x1}^{x2} [(q_v^2/A)*\delta\rho/\delta x - (q_v^2/A)*\alpha_B\rho/(x_2-x_1)]dx$$

Accordingly, in the abovementioned vapor deposition process, the contribution to the force of a Diaphragm*, $F_D$, which comes about (as compared with the flow resistance) by a change of state as a result of a variation in cross section and in density during the branching off of a part flow quantity from the transdiaphragm flow duct (without temperature variation) and as a result of the reduction of the transdiaphragm flow quantity within the diaphragms as a result of the at least one bifurcation backflow, is given by the difference between the equations (71) and (72), i.e.

$$F_D(A_m, \rho_m, m) = F_D(A_m) + F_D(\rho_m, m) \tag{73}$$
$$= \int_{x0}^{x3} [(\rho q_v^2/A^2)*(\delta A/\delta x)]dx +$$
$$\int_{x1}^{x2} [q_v^2/A*(\alpha_B\rho/(x_2-x_1) - \delta\rho/\delta x)]dx$$

in which $F_D(\rho_m, m)$ is the contribution made by bifurcations, in which, in contrast to equation (55) and to the density $\rho$ (e.g. at the flow inlet), the density variation makes a negative contribution to $F_D$ which (requires, where appropriate, corresponding (construction) technical countermeasures (eg. partial heating of the transdiaphragm vapor flow and/or overheating (only) after bifurcation flow branching-off and/or suitable geometric elements etc. (cf. EP-Application 94111991.9, Aug. 1, 1994, and PCT Application PCT/EP95/02882 of Jul. 19, 1995).

It may be pointed out here that according to the Technical Solutions put forward in the preceding chapter for the (diffuser) flow ducts within a Diaphragm* and the resulting possibilities of combination with the Technical Solutions which include at least one bifurcation, the variables $\rho$, $q_v$ and A in equations (71)–(73) and all corresponding equations, but also the variables $\rho$, $q_m$ and A in equations (52)–(55) and all corresponding equations are functions of the translation axes x, y and z in a Diaphragm*, i. e. $\rho(x, y, z)$, $q_v(x, y, z)$, $q_m(x, y, z)$ and A, $(x, y, z)$.

Consequently, it is particularly useful for plant design to distinguish between the absolute contribution of $F_D$ ($A_m$, $\rho_m$, m) to the force of a Diaphragm* and its specific contribution $F_{D,x}(A_m, \rho_m, m)$ (cf. equation (56)) per relative operating length $\Delta x_{(op)}/x_3$, which, in an arbitrary position in space, becomes $\Delta l_{(op)}/x_3$, i.e.

$$F_{D,x}(A_m,\rho_m,m)=F_D(A_m,\rho_m,m)*\Delta l_{(op)}/x_3 \quad (74)$$

in which $$F_{D,x}=F_{D,x}(\rho_T,A_T)+F_{D,x}(A_m)+F_{D,x}(\rho_m,m) \quad (75)$$

Since the distance $\Delta l_{(op)}=(l_2-l_1)$ is restricted to a relatively small region of the transdiaphragm flow duct $l=(l_0-l_3)$, the proportion of the bifurcations, $F_D(\rho_m,m)$, in the specific total force of a Diaphragm*, $F_{D,x}$, may be very high. The following therefore applies to the case $F_D(\rho_T, A_T)=F_D(\rho_m,m)$ (see next page):

$$F_{D,x}(\rho_T,A_T)<F_{D,x}(\rho_m,m) \quad (76)$$

since $$F_{D,x}(\rho_T,A_T)<F_D(\rho_T,A_T)*x_3/(l_0-l_3) \quad (77)$$

and $$F_{D,x}(\rho_m,m)<F_D(\rho_m,m)*x_3/(l_2-l_1) \quad (78)$$

or for a plurality of bifurcations $n_B$ per flow duct $$F_{D,x}(\rho_m,m)<\Sigma F_D(\rho_m,m)*x_3/\Sigma(l_2-l_1)$$

Whilst the technical solutions for $F_D(\rho_T,A_T)$ via diffusers and/or diffuser-nozzle transitions favor the flow worm in the diffuser cone, optimizing the total force $F_D$ requires (design) technical solutions which possibly rule out or restrict the optimized solutions for $F_D$ $(\rho_T,A_T)$ and/or favor those solutions which require a compromise between $F_D$ $(\rho_T,A_T)$ and the further terms in equation (75) (cf. Technical Solutions in the preceding and following chapters). The proportion of $F_D(\rho_m,m)$ in $F_{D,x}$ is therefore potentially relatively high and, depending on the product (to be deposited) and product (to be deposited) and product form, requires suitable combinations of the claimed Diaphragm* elements and of the resulting ratio $F_D(r_m,m)/F_D(r_T,A_T)$ (cf. next chapter).

For arriving at the Diaphragm* design, all the quantities in equations (54), (55), (72) and (73) can be determined precisely by means of experiments or calculations. It may be pointed out that the gradient $\delta P/\delta x$ in equations (54) and (72) represents the local pressure gradient, for example between the inlet and the outlet of the transdiaphragm gas flow into the next following chamber and, in light of the large hydrodynamic pressure differences in relation to the environment, is not to be confused with the macroscopic pressure gradient dp/dx between two adjacent (conventional) chambers.

In a Diaphragm* with bifurcations and a corresponding backflow (cf. above), contrary to the conventional principle of momentum for flowing media, $F_D$ does not correspond to the difference between the integral exit and entry pulse force per Diaphragm* element, but only to the difference between the exit pulse force into the original chamber minus the entry pulse force into the flow duct. The bifurcation part flow forms a quasi-infinite circular flow for the buildup of dp/dx and of the resulting transdiaphragm suction force $F_{suc}$, as long as vapor follows up from the sources of a chamber. The continuous supply of pulse force into the (original) evaporation chamber via the bifurcation flows is an energy source which is taken into account in the temperature control of the corresponding chamber, including its sources. The corresponding temperature control also includes, for example for relatively high $\alpha_B$ values, the possibility of (if appropriate local) cooling. Since the throughput (conveying flow) through the Diaphragm* upstream of the deposition chamber controls the throughput of the process as a whole and requires a local suction gradient for accelerating the corresponding transdiaphragm vapor conveyance, the suction flow drives the process even when material conveyance is controlled from a part of the evaporation chambers without bifurcations (cf. further below).

The characteristic quantity which links the propulsion force of the process (i.e. the pumping speed S) to the Diaphragm* before deposition, as the structural part controlling the overall throughput rate $q_v$, is the throughput rate effectively discharged per flow duct $q_{v,D}$ (cf. Diaphragm*-type 2, FIRST PART of the invention). For the given $\Sigma$, F(S), T and a given Diaphragm* configuration, a constant value $q_{v,0,i}=q_{v,0,D}+n_B*q_{v,0,B}$ per flow duct is obtained. Thus, this value is set during the starting phase of the process, for a given pumping speed S, at different paths dT and $dm_B$ (e.g. by closing the apertures, dm becomes=to 0 and then also dmB becomes=to 0, see EP-Application 94111991.9, Aug. 1, 1994, and PCT Application PCT/EP95/02882 of Jul. 19, 1995) or, for a given Diaphragm* design $dm_B$, at different paths dS and dT (e.g., dT=0 for opening the evaporation sources after the setting of all the operating temperatures). It becomes possible for the effective throughput rate $q_{v,0,D}$ to be proportional to the pumping speed S, and genuine process control of a vapor deposition process becomes possible for the first time in this way.

For a given pumping speed, $q_{v,0,D}$ or $q_{v,D}$ is the higher, the lower $F_D$ is, and vice versa. Consequently, $F_D$ is uncoupled from the pumping speed S and the resulting exit pulse force of the evacuation part flow (cf. EP-Application 94111991.9, Aug. 1, 1994, and PCT Application PCT/EP95/02882 of Jul. 19, 1995). $q_{v,0,D}$ or $q_{v,D}$ is not an explicit constituent of FD in equations (72) and (73), i.e. the force $F_D$ of a bifurcation-controlled porous diaphragm corresponds to the total differential of the principle of momentum for flowing gases in the flow duct with the throughput rate $q_{v,0}$, but not the effective throughput rate $q_{v,0,D}$, as a variable. The physical factors contributing substantially to the force of the Diaphragm* are, therefore, here:

1. the difference in the pulse forces before entry into the bifurcation region or bifurcation regions and in the bifurcation flow thereafter, for which the propulsion force is given by the pressure gradient $(\delta p/\delta x)(S)$, the amount of which is controlled by the bifurcation parameters a, $(x_2-x_1)$, etc.
2. the resulting state difference $(v,p,\rho)$ between the gas quantity introduced into the flow duct and evacuated into the next following chamber and the resulting increment to 1.
3. the difference between the total difference in the pulse forces, resulting from 1. and 2., on the one hand, and the (hydrodynamic) pressure and speed losses as a result of friction, turbulences, etc., i.e. $F_{F,0}$), on the other hand.

The following detailed explanation of equations (71)–(73) proves this uncoupling of $F_D$ and $q_{v,D}$ and consequently of S. The equation already mentioned $$q_v = q_{v,i} = q_{v,D} + n_B * q_{v,B} = q'_v + n_B \alpha q_v \qquad (79)$$

and $$q_v = \int_{x0}^{x2} [\delta q_v / \delta x] dx \qquad (80)$$

$$= \int_{xz}^{x3} [\delta q_{v,D} / \delta x] dx + n_B * \int_{x2}^{x0} [\delta q_{v,B} / \delta x] dx$$

apply to a Diaphragm* which builds up the vapor reservoir in a (conventional) evaporation chamber by utilizing a, for example, symmetrical pair of bifurcations (with $n_B=2$) (cf. FIG. 45).

Substitution of equation (79) yields the state equation for transdiaphragm pulse preservation adapted to the bifurcation problem (cf. equation (72)):

$$\Sigma F_0 = F_P - F_F - F_D \qquad (81)$$

$$= \int_{x0}^{x2} [\rho q_{v,i}/A * (\delta q_{v,i}/\delta x) - (\rho q_{v,i}^2/A^2) * (\delta A/\delta x)] dx +$$

$$\int_{x1}^{x2} [q_{v,i}^2/A * (\delta\rho/\delta x - \alpha_B\rho/(x_2 - x_1))] dx$$

$$= \int_{x2}^{x3} [\rho q_{v,D}/A * (\delta q_{v,D}/\delta x) -$$

$$(\rho q_{v,D}^2/A^2) * (\delta A/\delta x)] dx +$$

$$n_B * \int_{x2}^{x0} [\rho q_{v,B}/A * (\delta q_{v,B}/\delta x) -$$

$$(\rho q_{v,B}^2/A^2) * (\delta A/\delta x)] dx$$

The following applies in a similar way to the conventional flow duct (cf. equation (71)):

$$q_v = \int_{x0}^{x2} [\delta q_{v,i}/\delta x] dx = \int_{x2}^{x3} [\delta q_{v,i}/\delta x] dx \qquad (82)$$

and the substitution of equation (82) in equation (71) yields:

$$\sum F_0 = F_P - F_F = \int_{x0}^{x3} [\rho q_v / A * (\delta q_v / \delta x)] dx \qquad (83)$$

$$= \int_{x0}^{x2} [\rho q_{v,i} / A * (\delta q_{v,i}/\delta x)] dx$$

$$= \int_{x2}^{x3} [\rho q_{v,i} / A * (\delta q_{v,i}/\delta x)] dx$$

The difference between equations (83) and (81) gives the precision of the force of a Diaphragm* with bifurcation-controlled transdiaphragm material conveyance $$F_D(A_m, \rho_m, m) = \int_{x1}^{x2} [q_{v,i}^2/A * (\alpha_B\rho/(x_2 - x_1) - \delta\rho/\delta x)] dx + \qquad (84)$$

$$\int_{x0}^{x2} [(\rho q_{v,i}^2/A^2) * (\delta A/\delta x)] dx$$

$$= + \int_{x2}^{x3} [\rho/A * [q_{v,D}(\delta q_{v,D}/\delta x) - q_{vi}(\delta q_{v,i}/\delta x)] -$$

$$(\rho q_{v,D}^2/A^2) * (\delta A/\delta x)] dx +$$

$$n_B * \int_{x2}^{x0} [\rho q_{v,B}/A * (\delta q_{v,B}/\delta x) -$$

$$(\rho q_{v,B}^2/A^2) * (\delta A/\delta x)] dx$$

It is obvious that the definition of $F_D(A_m, \rho_m, m) = fn(q_{v,D})$ also includes an apparent value $$\int_{x2}^{x3} [\rho/A * [-q_{v,i}(\delta q_{v,i}/\delta x)] dx$$

(cf. right-hand side of equation (81), which exists only because the other terms exist and which makes a contribution to $F_D(A_m,\rho_m,m)$ (in the nonstationary state), although $q_{v,i}$ does not occur in the evacuation flow (cf. turbulence developments at bifurcations, below).

In the stationary (and nonstationary) state, $q_{v,D}$ rises with a decrease in force $F_D(A_m,\rho_m,m)$ and a falling bifurcation flow pulse, etc. From a design point of view, the predominant part played by the factor $\alpha$, the absolute cross sections and the variations in cross section in the section $x_2 \rightarrow x_3$ (evaporation flow $q_{v,D}$) and $x_2 \rightarrow x_0$ (bifurcation flow $q_{v,B}$) is obvious, $\delta\rho$ being a Diaphragm*-specific variable with a critical influence on the resulting suction effect which drives the process as a whole and controls $q_v^{max}$. In the abovementioned process, the Diaphragms* are employed in such a way that falling $\delta\rho(S)$ values are compensated by rising throughputs $\Sigma q_{v,D}(S)$ and by rising flow speeds and operational fluctuations in the conveying flow can thereby be compensated.

For asymmetric bifurcations (and pairs of bifurcations, cf. next chapter), equation (79) changes to $$q_v = q_{v,i} + \sum_{\beta i=1}^{n\beta} (q_{v,D}(\beta_i) + q_{v,B}(\beta_i)) \qquad (85)$$

and equations (80)–(84) change correspondingly, here $\beta_i$ being the (control) variable of the number $n_\beta$ of bifurcations of a transdiaphragm flow duct and $1 < n_b < 00$ (cf. EP-Application 94111991.9, Aug. 1, 1994, and PCT Application PCT/EP95/02882 of Jul. 19, 1995). The two main bifurcations are those in which the (i) cross-sectional sums of the branching ducts are identical to the cross section of the basic flow influx (and efflux), i.e.

$$A_B + A_D = A_i$$

Figure 46:
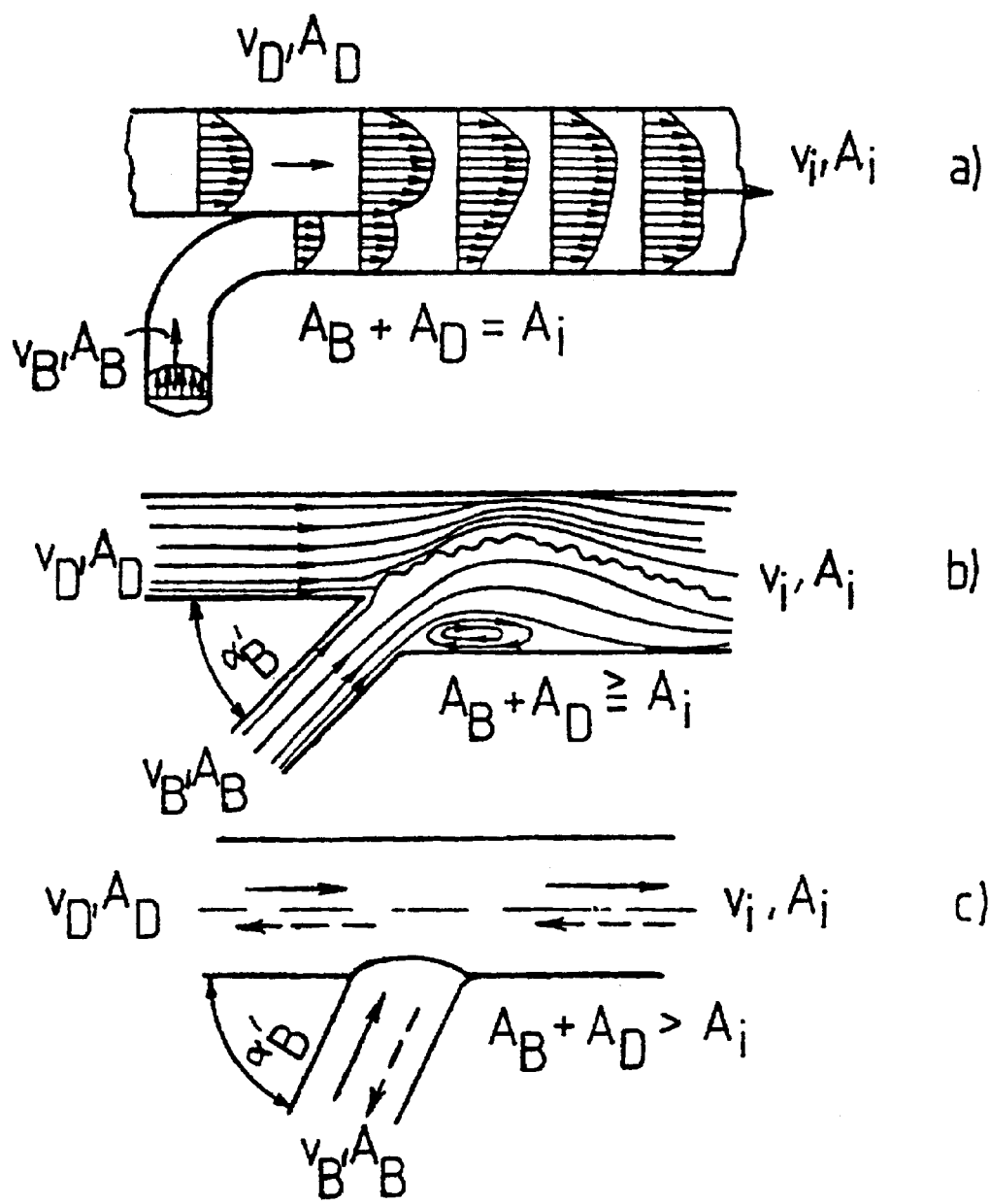
FIG. 46 Diagram of (a–c) the combining and c) the branching-off of a flow.
Figure 47:
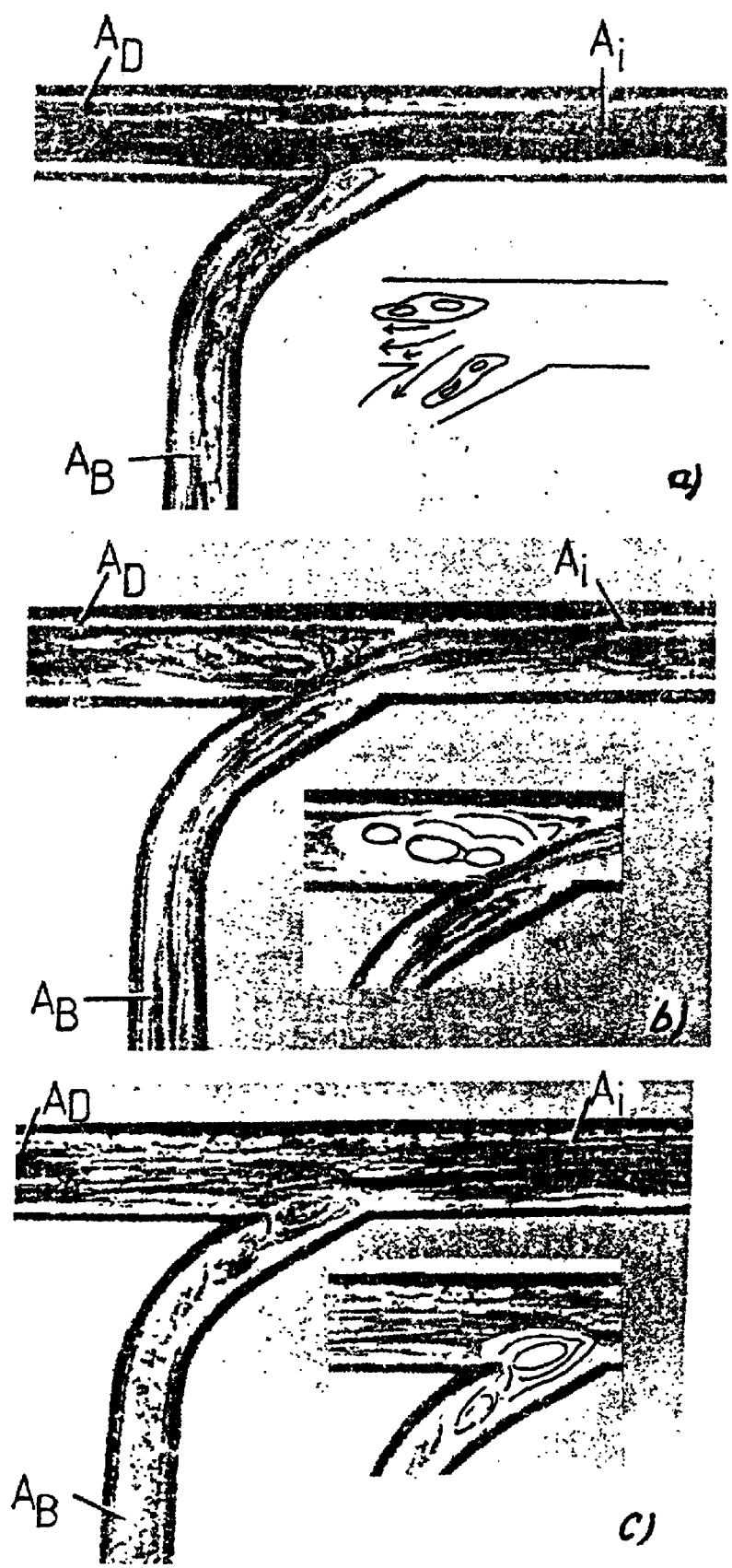
FIG. 47 Flow spectra at a bifurcation for the branching-off of a part flow quantity.
Figure 48:
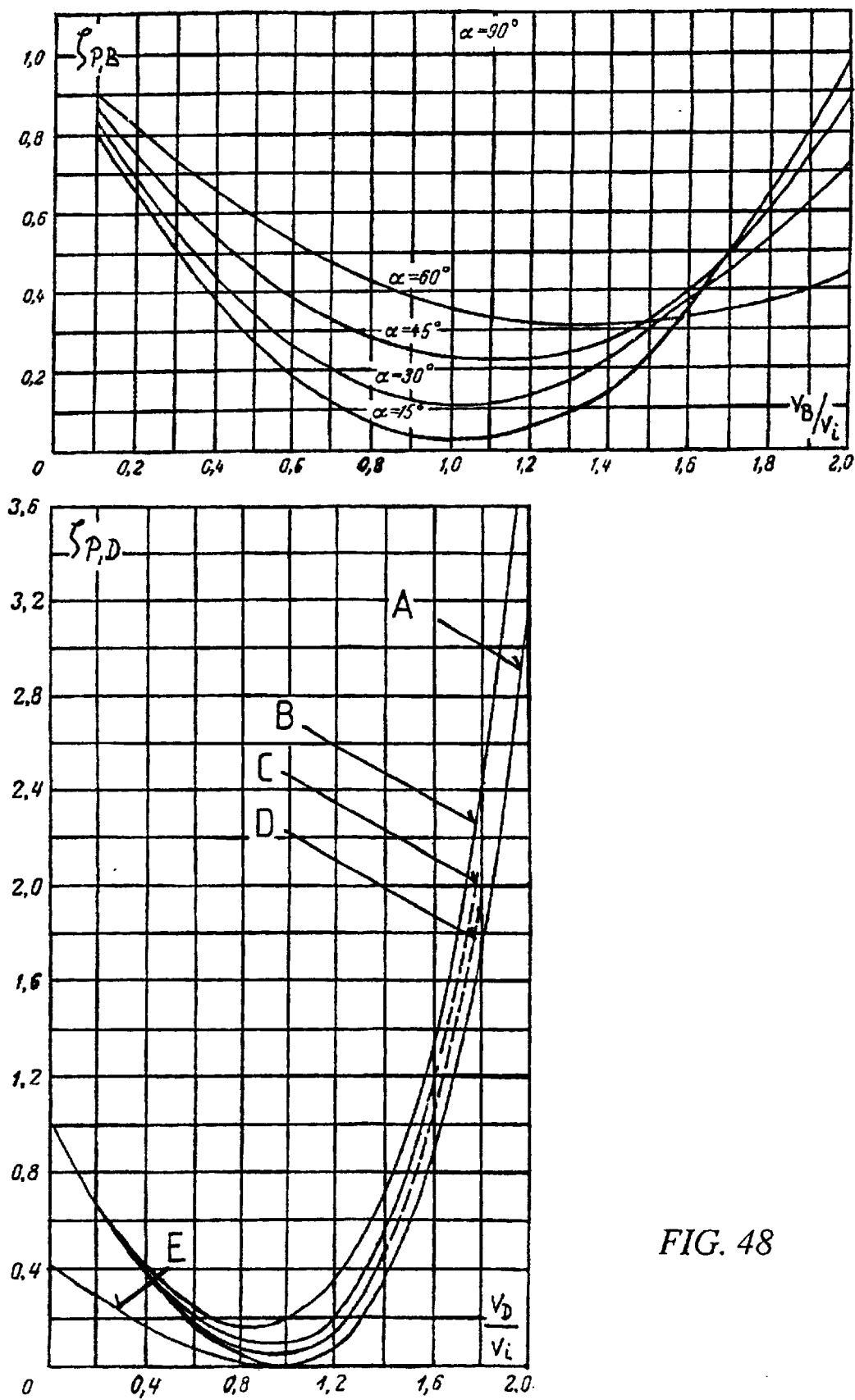
FIG. 48 Loss figures $\zeta_{P,B}$ and $\zeta_{P,D}$ as a function of the flow speed ratio $v_B/v_i$ and $v_D/v_i$ for the branching-off of a part flow quantity via bifurcations at different angles.
Figure 50:
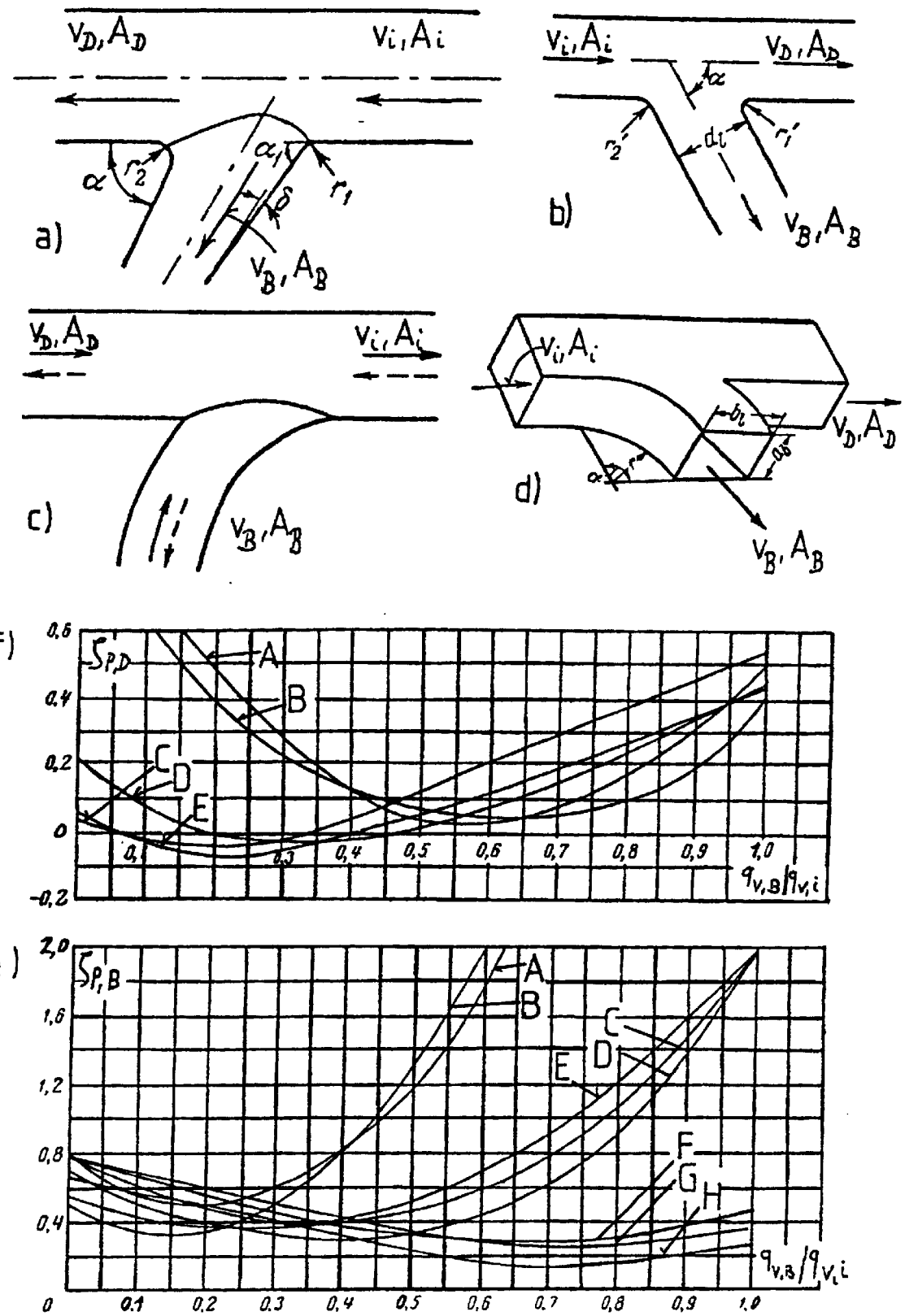
FIG. 50 Rounded bifurcation edges and/or bifurcation duct inlets and the resulting loss figures for e) the bifurcation duct and f) for the evacuation duct as a function of corresponding conveying quantity ratio.
Figure 51:
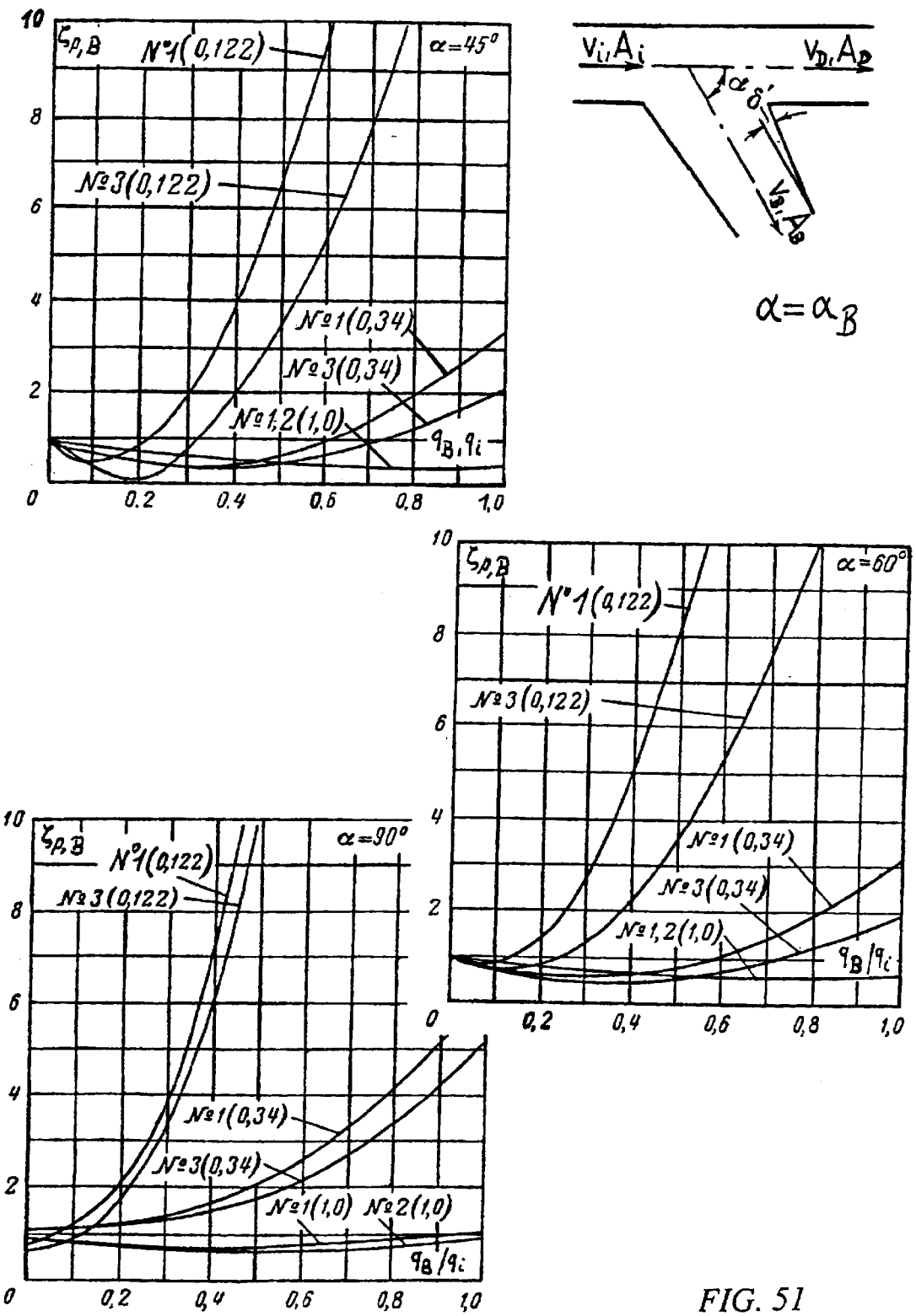
FIG. 51 Comparison of the effect of rounded bifurcation edges and bifurcation duct branches on the loss figure $\zeta_{P,B}$ for three angles $\alpha'_B$.
Figure 52:
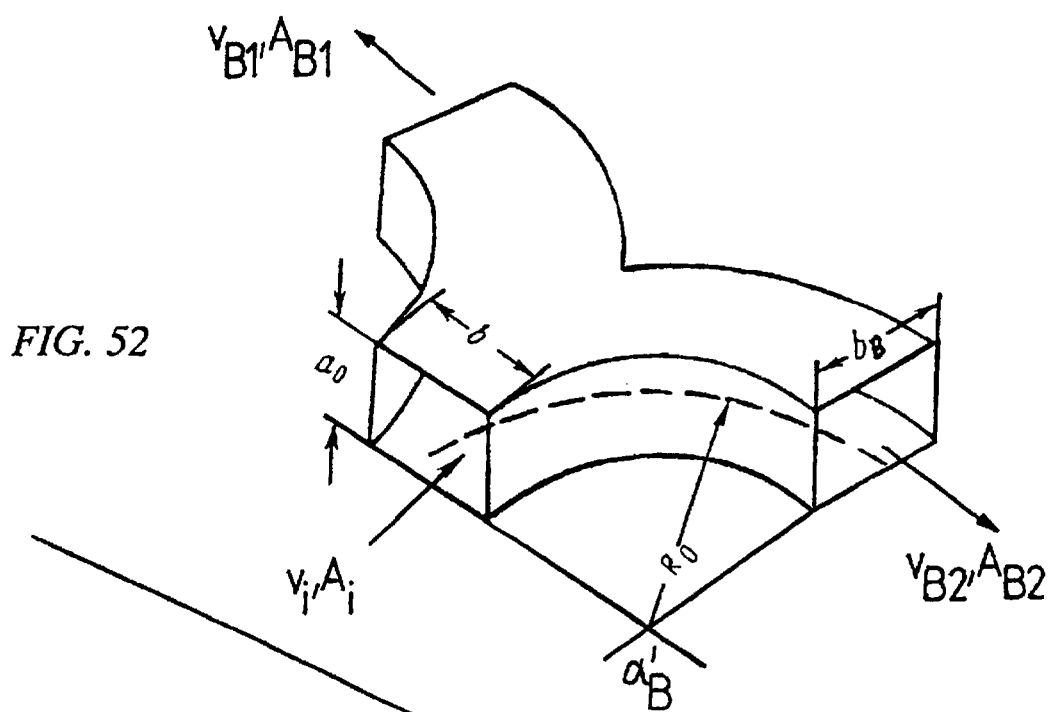
FIG. 52 Symmetrical dovetail with rectangular flow duct cross section.

(cf. FIG. 46 showing diagram of 46a–46c the combining and 46c the branching-off of a flow with 46a the same direction of flow of the two flows, 46b a particular angle $\alpha'_B$ obtained from the relation $A_B + A_D + A_i$, and 46c at an angle $A_B + A_D > A_i$, in which $A_D = A_i$ here for the opposite problem of the convergence of two flows), and (ii) those in which $$A_B + A_D > A_i$$

applies, in which $A_D = A_i$ (i.e. FIG. 46c). The operative loss figures are essentially a function of the branching angle directly at the bifurcation point, $\alpha'_B$, between the bifurcation backflow duct and transdiaphragm flow duct at the branch point (i.e. not the entire bend which is covered altogether by the bifurcation backflow duct), and the ratios of the corresponding flow speeds, i.e. $v_B/v_i$ and $v_D/v_i$, as well as the resulting(local) conveying flows $q_{v,B}/q_{v,i}$ and $q_{v,D}/q_{v,i}$. FIG. 47 shows flow spectra at a bifurcation for the branching-off of a part flow quantity with flow ratios at a bifurcation of the second type for $q_{v,B}<q_{v,i}$ (top), $q_{v,B} \geqq q_{v,i}$ (middle) and $q_{v,B}=0$ (bottom). For $q_{v,B}<q_{v,i}$, a dead flow (flow vortex) forms directly in front of the fork tip after the flow has entered the bifurcation backflow duct, said dead flow being, inter alia, a consequence of the diffuser effect (see above) at this point and the associated local pressure drop (i.e. positive pressure gradient). Breakaways of this vortex lead to nonstationary flow states, i.e. oscillations in $q_{v,B}$. For $q_{v,B}>q_{v,i}$, this vortex forms in the evacuation duct (middle of FIG. 47), with the possibility of nonstationary states at that particular point, whilst the vortex for $q_{v,B}=0$ is located approximately in the middle of the vortex position of the two preceding cases. The corresponding loss figures contain the shock influence as a result of diffuser widening, the bend losses in the bifurcation backflow duct (cf. next chapter) and, where appropriate, a residual value for the bifurcation backflow duct, said residual value occurring as a result of the increase in the flow energy in the evacuation flow due to introduction of part of the flow boundary layer into the bifurcation backflow duct. The loss figures of bifurcations $\zeta_B$ are therefore, as a rule, expressed as relative values in relation to the flow conditions in the inflow duct with $v_i$, $q_{v,i}$ and $A_i$:

$$\zeta_B = \zeta_{P,B} + \zeta_{P,D} + \zeta_{Erw} \tag{86}$$

the following applying to the bifurcation backflow:

$$\zeta_{P,B} = A'[1+(v_B^2/v_i^2)-2(v_B/v_i)\cos \alpha] - K'_B(v_B/v_i)^2 \tag{87}$$

or $$\zeta_{P,B} = A'\{1+[(q_{v,B}/q_{v,i})^*(A_i/A_B)]^2 - 2(q_{v,B}/q_{v,i})^*(A_i/A_B)\cos \alpha\} - K'_B(q_{v,B}/q_{v,i})^*(A_i/A_B)^2 \tag{88}$$

with $$K'_B = (1-2\mu/\mu^2)\sin^2\alpha$$

and and $\mu$=the flow contraction coefficient (for bifurcations of the type $A_D=A_i$, $K'_B=0$, and $A'=1$ for $v_B/v_i</=0.8$ and $A'=0.9$ for $v_B/v_i>0.8$ (n.b. $V_B$ is, here, the speed at the bifurcation point, not at the outlet of the backflow). For bifurcations of the type $A_B+A_D=A_i$, $K'_B$ is closely dependent on $\alpha$ and is 0.04 for $\alpha=15°$, 0.16 for $\alpha=-30°$, 0.36 for $\alpha=45°$, 0.64 for $\alpha=60°$ and 1 for $\alpha=90°$. In the evacuation flow duct, the loss figures in the case $A_B+A_D>A_i$ are calculated according to:

$$\zeta_{P,B}=0.4[1-(v_D^2/v_i^2)] \tag{89}$$

and, in the case $A_B+A_D=A_i$, are represented in FIG. 48 showing loss figures $\zeta_{P,B}$ and $\zeta_{P,D}$ as a function of the flow speed ratio $v_B/v_i$ and $v_D/v_i$ for the branching-off of a part flow quantity via bifurcations in the case of different flow rotation angles $\alpha'_B$ (=$\alpha$here), where A–D: $A_B+A_D=A_i$, A=15°<$\alpha$<60°all ratios $A_B/A_i$ and for $\alpha$=90° for $A_D/A_i$-ratios ranging from 0 to 0.4 and >0.8; B,C,D: all at $\alpha$=90° and B: $A_D/A_i$=0.5; C: $A_D/A_i$=0.6; D: $A_D/A_i$=0.7; E: 15<$\alpha$<90° for $A_B+A_D>A_i$). Furthermore, for Re numbers >10$^4$, the loss figure:

$$\zeta_{Erw} = \phi_{Diff}[1-(A_0/A_1)^2]^*(1-(q_{v,B}/q_{v,i})^2*(A_i/A_B)^2 + \zeta_F \tag{90}$$

must be added to $\zeta_{P,D}$, $A_0$ and $A_1$ being the cross sections of the corresponding diffuser (see above), $\phi_{diff}$ being the corresponding shock coefficient (see FIG. 49 showing loss figures $\zeta_{wid}$ and $\zeta_F$ (cf. Equation (90) for a), b) conical and c), d) rectangular diffusers as a function of the diffuser angle $\alpha$, here $\zeta_{wid}$ being obtained from the relation $\zeta_{wid}=\phi_{diff}$ $(1-A_0/A_1)^2$ and $\phi_{diff}=k^*tg(\alpha/2)^*tg(\alpha/2)$ constant k is for 49a, 49b with homogeneous inflow: 3.3 in the reference interval 0° to 40° and for 49c, 49d 4.0 in the reference interval 0° to 25°, 49e flattened diffusers with f)h) for k=3.2. Reference interval of the formula for $\phi_{diff}$ in the range of 0° to 25°. 49f gives the values for the side ratio $a_0/b_0=0.5$, 49g for $a_0/b_0=1.0$ and 49h for $a_0/b_0=1.5$; $D_H$=circumference) and $\zeta_F$ being the friction loss figure (see below). Since $\zeta_B$ is independent of the ratio $A_B/A_I$ and $A_D/A_i$, the corresponding coefficients are given as a function of the ratio $v_B/v_i$ and $v_D/v_i$ as well as $q_{v,B}/q_{v,i}$ and $q_{v,BD}/q_{v,i}$. Rounding the bifurcation edges (FIG. 50 showing rounded bifurcation edges and/or bifurcation duct inlets with 50d $r/b_1=1$ and $\alpha'_B=90°$ and the resulting loss figures for 50e the bifurcation duct (ie. $\zeta_{P,B}$) and 50f for the evacuation duct (ie. $\zeta_{P,D}$) as a function of the conveying quantity ratio $q_{v,B}/q_{v,i}$ and FIG. 94/PCT Application) leads to a sharp reduction in $\zeta_D$, since the corresponding vortices are reduced, particularly when these are associated with a bifurcation backflow duct which tapers in a nozzle-like manner and/or is bent (rounded) (FIG. 51 showing a comparison of the effect of rounded bifurcation edges (cf. FIG. 50) and bifurcation duct branches tapering in the manner of an (ultrasonic) nozzle, ie. contracting (case No. 3) on the loss figure $\zeta_{P,B}$ for $\alpha'_B=45°$, 60° and 90° (n.b. cases No. 1 and No. 2 correspond to the situation shown in FIG. 50b)), since both the flow speed directly at the branch, the effect of the angle of rotation $\alpha'_{B,1}$ and the resulting flow vortices are reduced by means of these measures. These measures are initiated in dovetail-like bifurcations (FIG. 52 showing symmetrical dovetail with $\alpha'=90°$, here a rectangular flow duct cross section), as in the solutions e.g. from EP 94111991.9, FIG. 40, and PCT/EP95/02882 of Jul. 19, 1995, FIG. 94.

Technical Solutions

The following is employed in connection with the abovementioned vapor conveyance and deposition process:

1. General Bifurcation Properties

Solutions:

1. Bifurcations for the abovementioned porous diaphragm Diaphragm*, characterized in that the cross-sectional area ratios are in the range from $0.05^*A_i<(A_B+A_D)</=50^*A_i$, preferably $0.1^*A_i<(A_B+A_D)</=10^*A_i$ and/or the ratios of the corresponding hydraulic ratios are in the range from $0.05^*A_i<(A_B+A_D)\leqq 50^*A_i$, preferably $0.1^*A_i<(A_B+A_D)\leqq 10^*A_i$ and/or the ratios of the corresponding hydraulic diameters are $0.05^*D_{H,i}<(D_{H,B}+D_{H,D})\leqq 50^*D_{H,i}$, preferably $0.1^*D_{H,i}<(D_{H,B}+D_{H,D})\leqq 10\ D_{H,i}$ and/or 2. Bifurcations according to 1., characterized in that the flow rotation angle at the bifurcation point is in the range of $0.1°<\alpha'_B\leqq 90°$, preferably in the range of $0.5°<\alpha'_B\leqq 60°$, and/or 3. Bifurcations according to 1. and/or 2., further characterized in that the ratios of the conveying flow quantities are $0.01<q_{v,B}/q_{v,i}\leqq 1.0$, preferably in the range of $0.1<q_{v,B}/q_{v,i}\leqq 0.8$, and the corresponding loss figures $\zeta_{P,B}$ are in the range of −10 to +110, and/or 4. Bifurcations according to one or more of solutions 1. to 3., further characterized in that the ratios of the conveying flow quantities are $0.01<q_{v,D}/q_{v,i}\leqq 1.0$, preferably in the range of $0.1<q_{v,D}/q_{v,i}\leqq 0.8$, and the corresponding loss figures $\zeta_{P,D}$ are in the range of −100 to +10, and/or 5. Bifurcations according to one or more of solutions 1. to 4., further characterized in that the relative bend radius at the bifurcation point having the diameter $d_B$ is in the range of $0.01<r'_B/d'_B\leqq 50$, preferably in the range of $0.1<r'_B/d'_B\leqq 10$ and/or 6. Bifurcations according to one or more of solutions 1. to 5., further characterized in that the bifurcation nozzle angle $\delta'_B = \alpha'_B - \alpha'_{B,1}$ is in the range of 0.01° to 30°, preferably in the range of 0.1° to 15°, and/or 7. Bifurcations according to one or more of solutions 1. to 6., further characterized in that the flow ducts of of the bifurcation have concentric cross sections, and/or 8. Bifurcations according to one or more of solutions 1. to 7., further characterized in that the flow ducts of the bifurcation have rectangular cross sections.

Figure 53:
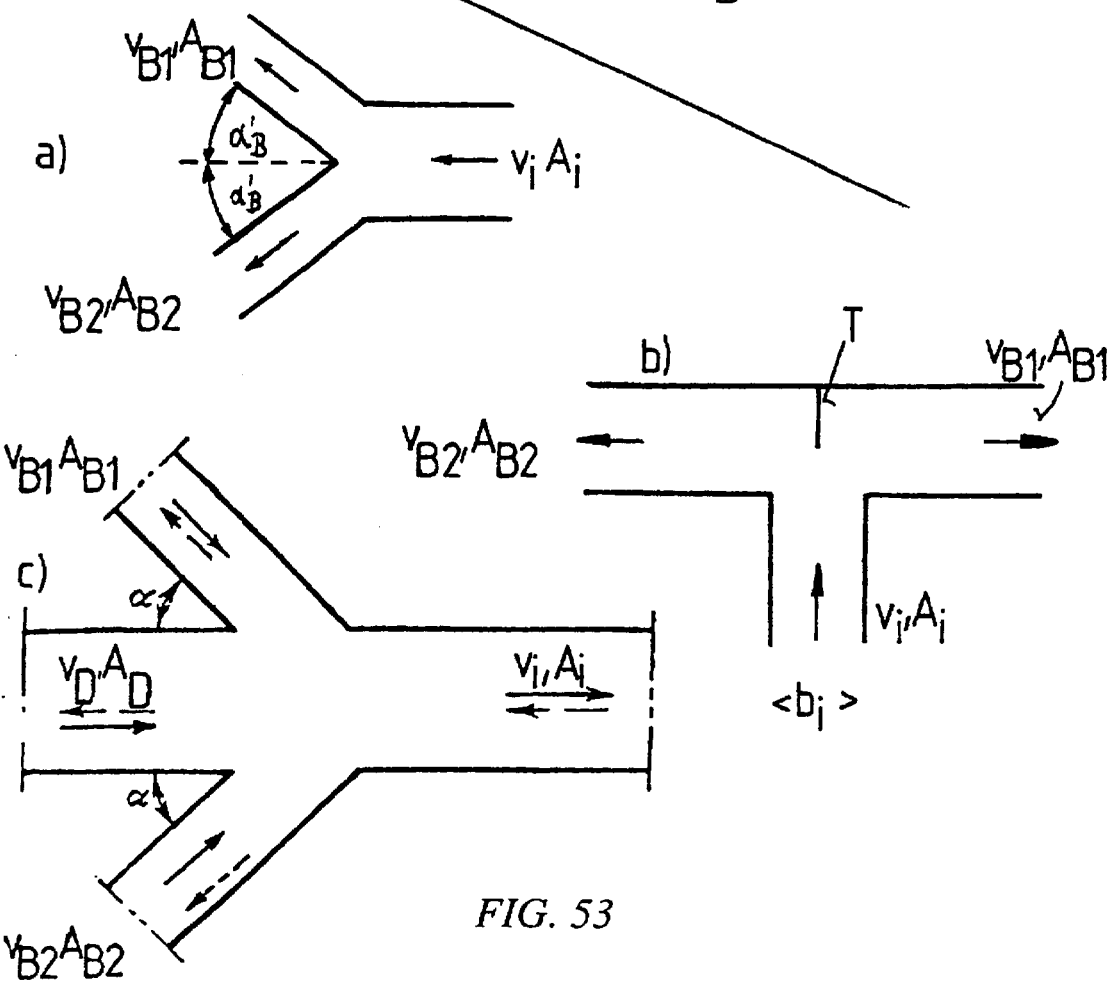
FIG. 53 a) V-shaped, b) T-shaped and c) multiple bifurcation with → combining and ← separation of the flows.

Referred is also to FIG. 53 showing 53a V-shaped, 53b T-shaped and 53c multiple bifurcation with $n'_B = 2$, the latter with $\alpha'_B = 30°$ and→combining and←separation of the flows (n.b. 53b shows the situation, indicated in FIG. 17, of a meander-like cooling duct.

Figure 54:
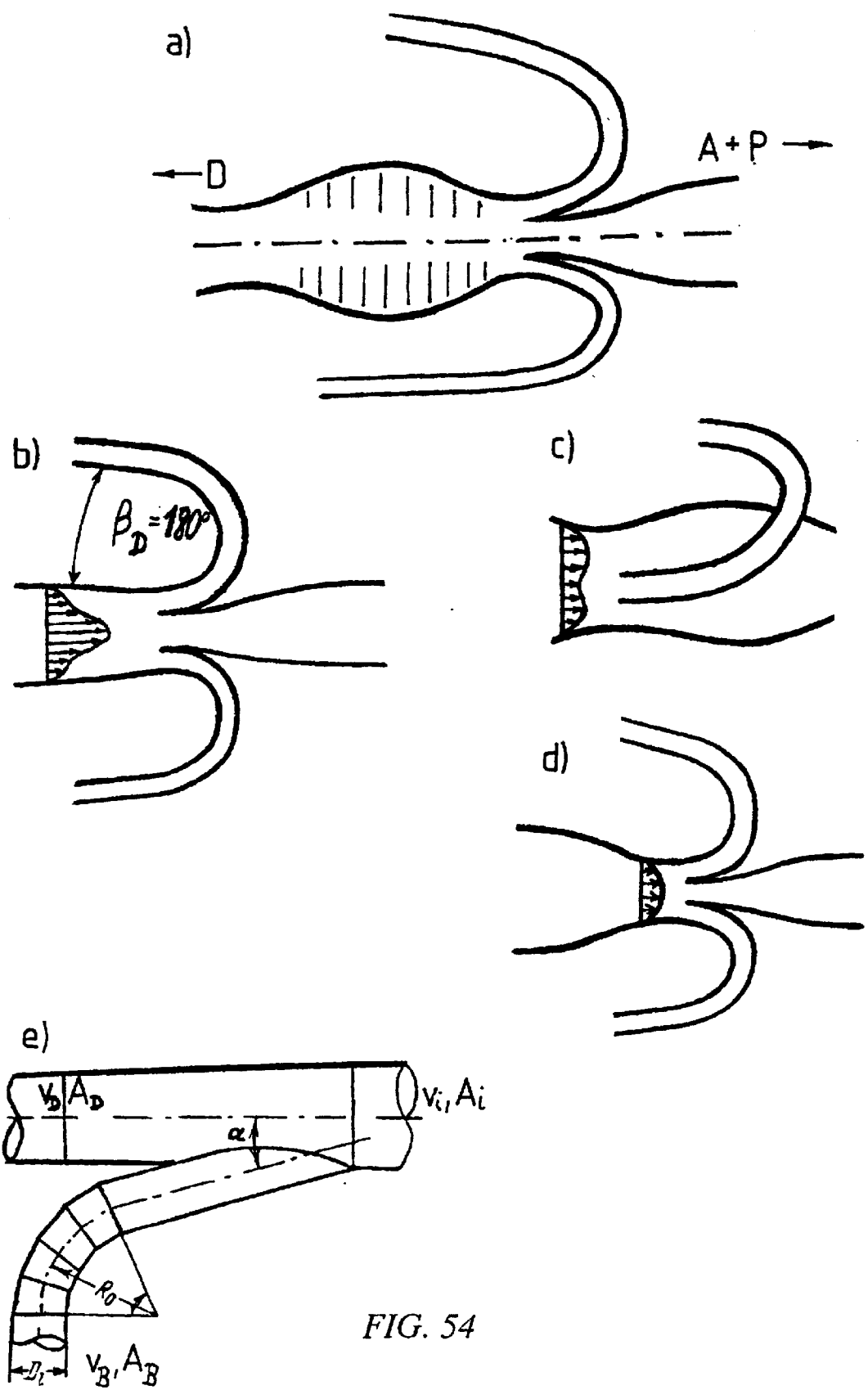
FIG. 54 Flow profiles before the entry of the flow into a bifurcation with b), c) suction flow mode as a result of the shadings shown in a) and d) pressure flow mode.

2. Optimum utilization of the pulse force of flowing media in the flow duct becomes possible for the purpose of the abovementioned vapor deposition process by adapted nozzle transition. FIG. 54 showing flow profiles before the entry of the flow into a bifurcation with 54b, 54c in the suction flow mode as a result of the shadings shown in 54a (hatched area, A+P: direction to deposition and pump; D: direction to vapor source) and 54d in the pressure flow mode. $\beta_D$: integral deflection angle of the bifurcation backflow relative to the transdiaphragm (central) flow. 54e: segmental design (see next section).

Solution:

13. Bifurcation structural parts for the abovementioned diaphragm according to one or more of solutions 1. to 12., for the local promotion of the suction effect and the control possibilities via the bifurcation backflow, characterized further by improved transdiaphragm fluid mechanics in comparison with the conventional flow duct, such that bifurcations for the vapor backflow are combined with design measures and structural parts, such as geometric elements with CF coefficients of 0.01 to 0.5 (see EP-Application 94111991.9, Aug. 1, 1994, and PCT Application PCT/EP95/02882 of Jul. 19, 1995), with diffusers (see EP-Application 94111991.9, Aug. 1, 1994, and PCT Application PCT/EP95/02882 of Jul. 19, 1995 and above), diffuser/nozzle combinations (see EP-Application 94111991.9, Aug. 1, 1994, and PCT Application PCT/EP95/02882 of Jul. 19, 1995 and above and following chapters and FIG. 54e), ultrasonic and Laval nozzles (see following chapters and FIG. 54e) and, for example, bends (see following chapters and FIG. 54e) or bent diffusers (see above and following chapters and FIG. 54e) and bent diffuser/nozzle combinations (see above and following chapters and FIG. 54e).

3. Bifurcations and Nozzles (in the Conventional Flow Duct)

Variations in cross section with or without negligible temperature gradients for promoting the bifurcation backflow are achieved, inter alia, by means of nozzles in the trandiaphragm flow duct upstream of bifurcations. Irrespective of the type of nozzle form used, the contraction of the flow cross section leads to an increase in the flow speed and consequently in the corresponding hydrodynamic (dynamic) pressure. Consequently, for a given orifice diameter (e.g. $(x_2 - x_1)$ or $d_B$ or $d_B = x_2 - x_1$) of a bifurcation backflow duct, the backflow pressure $p_B$ and the pressure ratio $p_B/p_I$ ($p_I$: total pressure on inflow into the transdiaphragm flow duct) and therefore the (partial) force of a Diaphragm*, $F_D(\rho_m, A_m, m)$ increase. Contractions in cross section in the transdiaphragm flow duct for promoting a bifurcation backflow are therefore a fundamental structural element of a Diaphragm*, in order to achieve a transdiaphragm pressure gradient in the case of negligible heat exchange with (and temperature effects in) the transdiaphragm flow. Since a transdiaphragm pressure gradient upstream of the vapor deposition chamber is necessary for controlling the process as a whole, bifurcations and consequently transdiaphragm flow duct contractions are a basic integral part of the abovementioned vapor deposition process.

If no further measures other than nozzles are carried out in order to optimize transdiaphragm fluid mechanics (e.g. heating, such that a negative temperature gradient is built up, use of diffusers, etc. cf. above),the form and type of the nozzle used for promoting the bifurcation backflow are particularly important. In this case, the selection of the nozzle form depends primarily on the propulsion force operative locally in the bifurcation region, i.e. on the way in which the propulsion force of the process as a whole takes effect for transdiaphragm material conveyance in the bifurcation region.

Solution:

14. Bifurcations according to one or more of solutions 1. to 13., further characterized in that for vapor conveyance in the region of the bifurcations, in the case of pressure flow drive, the bifurcations are fitted into an ultrasonic nozzle or into an ultrasonic nozzle-like nozzle form (FIG. 55a showing nozzle and backflow duct variations for combination with bifurcations used in the abovementioned process, here laval nozzle with characteristic quantities), in the case of vapor conveyance and its acceleration by means of a suction flow, i.e. drive ("suction"), by vacuum in the target chamber, said bifurcations are fitted into Laval nozzles or Laval nozzle-like duct sections (cf. EP-Application 94111991.9, Aug. 1, 1994, and PCT Application PCT/EP95/02882 of Jul. 19, 1995) for the purpose of contracting the flow cross section (FIG. 55b showing nozzle and backflow duct variations for combination with bifurcations used in the abovementioned process, here ultrasonic nozzle with characteristic quantities), specifically in the region of the Laval nozzle cross section (FIG. 55c showing correspondingly preferred bifurcation type) (cf. next section), in which $0.01 < d_1/d_2 < 100$ and $0.1 < l_1/l_2 < 10$ (cf. FIG. 55a) for Laval nozzles and $1.1 < d_1/d_{2 < 100}$ and $0.3 < 1/d_2 < 10$ for ultrasonic nozzles (cf. FIG. 55b).

The continuous widening of the nozzle cross section on the suction side of the Laval nozzle increasesthe suction effect on the transdiaphragm vapor flow before passage through the Laval nozzle cross section of diameter $d_1$ in relation to comparable vapor flows before leaving the ultrasonic nozzle outlet having the same diameter $d_u$ (i.e. $d_1 = d_u$), since, in a similar way to the flow conditions in a diffuser, discontinuous widenings in cross section having a non-rounded transition from the (concentric) flow duct into the diffuser region with an opening angle $\delta$ (e.g. particularly in the case of high $\delta$ values, such as in the case of $90° < \delta < 36°$) are associated with greater turbulences than in the case of a continuous transition from the (concentric) flow duct into a diffuser having the same opening angle (cf. FIG. 56 showing effect of the rounding of a flow duct edge on the development of flow vortices (turbulences, see SW) for $\delta_1 = \delta_2$, $Re_1 = Re_2$, $d_0(1) = d_0(2)$, $v_1 = v_2$.). In view of this, a freestanding outlet of the ultrasonic nozzle, i.e. a nozzle end without transition into another form or into another element of the transdiaphragm flow duct (cf. FIG. 55b), forms an opening angle of 360° and therefore a potential source of high turbulence development (flow vortices) which diminishes the suction effect, because the flow is greatly disturbed downstream of the orifice, but at all events, under comparable flow conditions, is reduced to a greater extent than when a Laval nozzle outlet is used.

Solution:
15. Bifurcations according to one or more of solutions 1. to 14., further characterized in that the preferred location of the at least one bifurcation backflow duct within the Laval nozzle is in the region of the Laval nozzle cross section having the diameter of $d_1$ or is in relatively close proximity thereto (FIG. 55d correspondingly preferred bifurcation type), and the preferred location of the at least one bifurcation backflow duct in the ultrasonic nozzle is located, where appropriate, directly at the outlet (having the diameter du, see above) or in its immediate vicinity (FIG. 55e front view of the inflow sides for ultrasonic nozzle with 2 bifurcations), the design possibilities of the bifurcation backflow duct comprise branches at segments of the cylindrical nozzle circumference which can be located opposite one another, in the case of pairs of bifurcations (cf. EP-Application 94111991.9, Aug. 1, 1994, and PCT Application PCT/EP95/02882 of Jul. 19, 1995), symmetrically (FIG. 55f showing Laval nozzle with 3 symmetrically arranged bifurcations) and, in the case of more than two bifurcations per cross section, symmetrically or asymmetrically (FIG. 55g 4 asymmetrically arranged bifurcations with secant lengths $s_1<s_2<s_3<s_4$,) in relation to the central nozzle axis, or all the segments are closed to form an annular bifurcation (on inflow) which then, in an allround backflow or annular duct, returns the bifurcation flow into the original chamber (FIG. 55h showing any nozzle with a continuous annular backflow duct from the bifurcation as far as the backflow outflow; $D_0$=diaphragm surface; $d_1$=see c); $d_1$=entry diameter; RAK=backflow duct exit slit), this allround backflow or annular duct being capable of narrowing and/or widening into annular duct segments via further bifurcations and thereby of manipulating the backflow speed and the outflow pressure $p_B$, for the coarse and fine adjustment of which apertures are, where appropriate, employed (cf. FIG. 55i showing front view of the inflow sides whilst the annular backflow duct contracts (as a whole) toward the backflow outflow; BR=bifurcation ring; KVE=duct taper ring element)

4. Nozzle Selection

The fundamental difference between (i) a Diaphragm* that contains only of nonbranched flow ducts (e.g. diffusers, diffuser/nozzle combinations, bends, bend combinations, etc., cf. above and following chapters) and (ii) a Diaphragm* with whatever type of bifurcations is in the degrees of freedom of the propulsion forces operative locally per transdiaphragm flow duct. Transdiaphragm material conveyance in the Diaphragm* of type (i) is driven preferably either a) only by a (transdiaphragm) pressure flow or b) only by a (transdiaphragm) suction flow. By contrast, transdiaphragm material conveyance in Diaphragms* with bifurcations (i.e. type (ii)) obtained by the branching-off of a part flow can be accompanied by a local propulsion force change, without the flow speed at the same time being reduced significantly. A propulsion force change without the branching-off of a part flow, but, for example as a result of friction, in contrast involves significant flow regions in the transdiaphragm flow duct with a flow speed toward 0 and contradicts the premises of the abovementioned vapor deposition process. It may be pointed out once again that transdiaphragm material conveyance driven locally by pressure does not contradict the maxim of the process as a whole, i.e. material conveyance, dependent on the pumping speed and driven by the suction flow, from the evaporation source as far as deposition, since, after the intermixing of all thecomponents has been concluded in a plant unit asssigned, where appropriate, specially for this (cf. EP-Application 94111991.9, Aug. 1, 1994, and PCT Application PCT/EP95/02882 of Jul. 19, 1995 and chapter 10, point (vi) in FIRST PART of the invention), i.e. before deposition, transdiaphragm material conveyance is controlled by a suction flow and this suction flow remains speed-determining for the process as a whole, even when the transdiaphragm material conveyance of individual components, for example into the mixing chamber, is driven by a pressure flow (for example, by overpressure in the case of evaporating components having high vapor pressures, such as Mg). This aspect is particularly important for selecting the type of respective flow duct outlets (for example, trumpet-like outlets, a variant of the Laval nozzle outlets, cf. EP-Application 94111991.9, Aug. 1, 1994, and PCT Application PCT/EP95/02882 of Jul. 19, 1995) a transdiaphragm flow duct, in which the vapor flow is accelerated, (for example, for the purpose of branching off via a bifurcation) (cf. further above and next chapters).

Solution:
16. Bifurcations according to one or more of solutions 1. to 15., further characterized in that the transdiaphragm pressure flow of individual evaporation units possesses, per flow duct, a series of ultrasonic nozzles of the number 1 $</=n_U<20$ which in each case close off a specific section (e.g. diffuser, see FIG. 57a showing combination of three diffusers "D" with two ultrasonic nozzles "Ü" as transdiaphragm flow duct variants, n.b. dimension ratios chosen arbitrarily (as in all the other illustrations)) of the flow duct, whilst, in the case of a transdiaphragm suction flow, a corresponding series of Laval nozzles of the number $1<n_L<20$ is obtained and the individual segments of the flow ducts assume the form of a thrust tube (see FIG. 57b showing combination of three diffusers "D" with two Laval nozzles "L" as transdiaphragm flow duct variants, n.b. dimension ratios chosen arbitrarily (as in all the other illustrations)), as in the preceding FIGS., the number of nozzles and the characteristic relative dimensions, for example in FIG. 57 including the direction of the central flow axis, being selected arbitrarily and there being understandably the possibility of also combining both nozzle forms in a nonbranched transdiaphragm flow duct, and it being possible to use within and/or at the end of pressure-driven transdiaphragm material conveyance (i.e. flow duct) a Laval nozzle, of which the advantage in terms of fluid mechanics over an ultrasonic nozzle under the same flow conditions remains, however, restricted to a (local) braking of the transdiaphragm flow before entry into the next diaphragm unit or plant unit, whereas the use of an ultrasonic nozzle in transdiaphragm material conveyance driven by suction flow (i) diminishes the suction effect on account of the development, described further above, of turbulences in comparison with a flow duct having corresponding Laval nozzles (or a corresponding Laval nozzle-type) outlet) and consequently (ii) the specific productivity contribution of the corresponding flow duct to the Diaphragm* under the same flow conditions.

By contrast, the branching-off of transdiaphragm part flow quantities via bifurcations allows:

1. possibilities of variation in the transdiaphragm nozzle combination, diffuser/nozzle combinations, etc. (cf. further below) and the resulting locally operative propulsion forces for transdiaphragm material conveyance in the flow duct (where appropriate central in the case of multisided bifurcations) and consequently
2. additional possibilities for manipulating the resulting vapor states and vapor deposition conditions in the following vapor units, including the state conditions of the bifurcation backflow itself, and therefore the (where appropriate, nonstationary) regulating quantities of corresponding evaporation chambers and their evaporation sources.

For successful bifurcation backflow, the total pressure in the central flow duct upstream of the branch (for example, on entry into the (if appropriate, central) flow duct, $p_I$) must be higher than the pressure of the bifurcation backflow on inflow into the original evaporation chamber, $p_B$, i.e.

$$p_I > p_B$$

(cf. EP-Application 94111991.9, Aug. 1, 1994, and PCT Application PCT/EP95/02882 of Jul. 19, 1995), but it is also necessary to ensure that the bifurcation backflow pressure $p_B$ is higher than the pressure inside the evaporation chamber $p_{int}$.

Solution:

17. Bifurcations according to one or more of solutions 1. to 16., further characterized in that the diffuser end and/or the outlet of the bifurcation backflow ducts has either a Laval nozzle, an ultrasonic nozzle or one of their variants, depending on the necessary force $F_D$ and the transdiaphragm state gradients required (cf. FIG. 58 which is as FIG. 57, but showing combination with bifurcations, as in EP-Application 94111991.9, Aug. 1, 1994, and PCT Application PCT/EP95/02882 of Jul. 19, 1995, and also showing an indication of a transdiaphragm flow region driven by pressure flow (D) and by suction flow (S)).

By contrast, neither pressure nor suction alone necessarily control material conveyance in the corresponding transdiaphragm (central) duct.

Solution:

18. Bifurcations according to one or more of solutions 1. to 17., further characterized in that there are possibilities for combining ultrasonic and Laval nozzles downstream of the respective diffuser regions of a transdiaphragm flow duct with bifurcations (cf. FIG. 58), the transdiaphragm central duct is designed in such a way that, in the case of optimized process routing, the vapor flow is pressure-driven here as far as the 2nd pair of bifurcations (i.e. after inflow, i.e. in the outflow direction) or as far as the 2nd allround bifurcation duct (cf. FIGS. 55h and 55i) and the suction effect from the next following unit of the vapor deposition process (for example, the mixing and/or high-temperature chamber) is at the Laval cross section level with the 2nd pair of bifurcations, and, even if macroscopic material conveyance in the abovementioned vapor deposition process is driven by the pumping speed of a given pumping system, a transdiaphragm suction effect does not necessarily control the (local, i.e, individual) bifurcation backflow, even if, as a rule, such an effect contributes to this, and the contribution of the suction effect to the bifurcation backf low lapses completely when transdiaphragm material conveyance is fully pressure-driven (for example, in the case of drive with a plasma gun), whereas it is maximized when the suction effect extends into the original evaporation and/or mixing chamber.

5. External Laval Nozzle Inlets With and Without Bifurcations, External Bifurcations In a similar way to separating diaphragms, the Diaphragms* for controlling the abovementioned vapor deposition process with a selectivity equal to 1 or near to 1 can also be subdivided into two overriding classifications, i.e. into "screen" (filter) Diaphragms and "depth" (filter) Diaphragms In EP-Application 94111991.9, Aug. 1, 1994, and PCT Application PCT/EP95/02882 of Jul. 19, 1995, this overriding distinction is made, in particular, for the geometric elements for controlling turbulent flow (with high $c_F$ coefficients for the screen mode) and directional flow (with very low $c_F$ coefficients for the depth filter mode) and for correspondingly changing the nature of the flow emphases. Just as, in the case of screen filters of chemical separating diaphragms, particles are retained on the surface with specific, i.e. constant (isotropic screen filter) or varying (anisotropic screen filter) pore sizes, the specific, i.e. high $c_F$ coefficients of the geometric elements at the mean distance h in front of the surface of a Diaphragm* prevent a specific (vapor) mass from flowing into the "deeper" region of the Diaphragm*, but without material separation taking place. Diaphragms* with geometric elements having high $c_F$ coefficients at the mean distance h in front of the transdiaphragm flow inlet therefore correspond to the asymmetric screen filters of chemical separation layer diaphragms. By contrast, if the inflow of a specific vapor mass into the next following unit of the abovementioned vapor deposition process is impeded within the transdiaphragm Diaphragm* region (for example, by "series" flow resistances, if appropriate with a resulting differential reservoir, cf. EP-Application 94111991.9, Aug. 1, 1994, and PCT Application PCT/EP95/ 02882 of Jul. 19, 1995), the Diaphragm* corresponds to the depth filters of chemical separating diaphragms, in which the separating operation takes place in the depth of the filter material. It is therefore obvious that, in order to build up a reservoir and obtain a high reservoir buildup capacity $F_D$, the corresponding Diaphragms* preferably have both this screen mode function and this depth filter function (cf. FIGS. 38–40 of EP Application 94111991.9).

Figure 59:
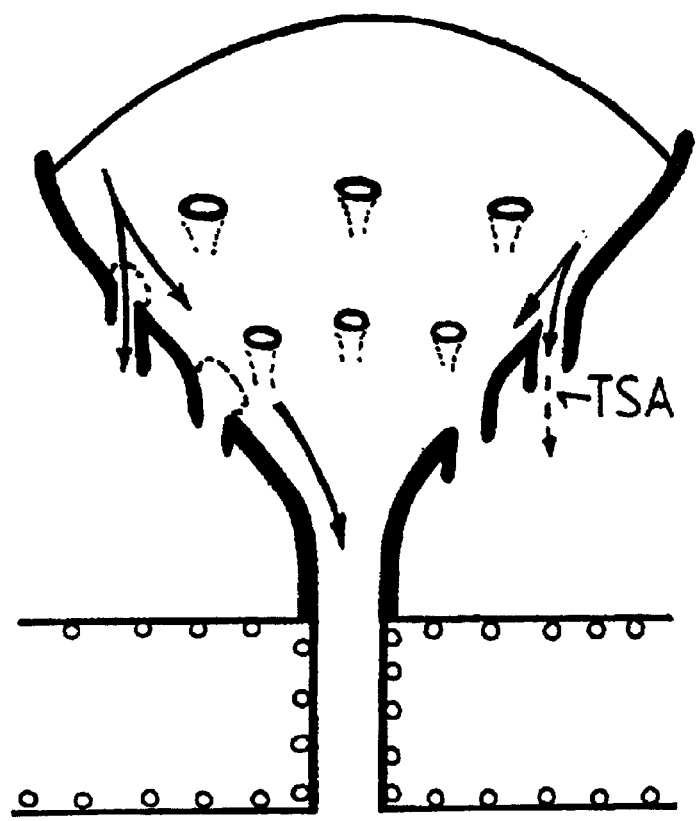
FIG. 59 Vertical section through a screen-like external bifurcation funnel upstream of a Diaphragm*.

Solution:

19. Bifurcations according to one or more of solutions 1. to 18., are further characterized in that, for optimizing the Diaphragm* functions, diffusers, diffuser/nozzle combinations, Laval nozzles, bends and bent flow duct sections and, (the possibly associated) bifurcations are used both in the screen filter mode and in the depth filter mode, as FIG. 38d in EP-Application 94111991.9, Aug. 1, 1994 shows a bifurcation in the screen filter mode, and it is basically true that the heating effect for the transdiaphragm vapor flow in the screen filter region can be relatively ignored or lapses, whereas, in the "depth filter mode", it achieves a relatively (more) significant effect. Diffusers and diffuser/nozzle combinations (see next paragraph) are therefore preferably used in the "depth" of the transdiaphragm Diaphragm* volume. By contrast, "external" bifurcations, as in FIG. 38d of EP-Application 94111991.9, Aug. 1, 1994, 1995, i.e. bifurcations before inflow into the transdiaphragm, i.e. shortest cross section of a Diaphragm*, are used particularly under those surface conditions in which the suction effect extends from a plant unit beyond the (shortest) Diaphragm* cross section into the corresponding evaporation or mixing chamber (cf. above), i.e. particularly in the case of the relatively low transdiaphragm dp/dx gradients, such as may occur, for example, before deposition, corresponding solutions comprise screen-like (i.e. perforated) flow plates, tapering to a funnel shape into the transdiaphragm flow duct, at a distance h upstream of the flow inlet (FIG. 59 showing vertical section through a screen-like (i.e. "external") bifurcation funnel upstream of any Diaphragm* (porous diaphragm); TSA=part flow branch), each of these bores makes it possible, even before transdiaphragm inflow, to branch off a part flow quantity, in such a way that part of the corresponding flow can flow back again into (where appropriate, the original regions or any positions of)/the evaporation chamber, the bores therefore representing "external" bifurcations in respect of the shortest cross section of the Diaphragm* which separates the vapor in the two chambers from one another, and the "external" bifurcations, i.e. bifurcations in the screen mode, possess greater freedoms in selectivity $S_k$ and are also used for controlling the concentration of the transdiaphragm vapor mixture, in which a possible "graft flow" is taken into account (see next section), the geometry of the structural part on the inflow side can assume a U-shape or be flat (FIG. 60a, b showing alternative "external" bifurcations), and preferably assumes the form of the inflow side of a Laval nozzle (cf. FIGS. 62c, d and 63c,d in EP-Application 94111991.9, Aug. 1, 1994) which projects from the actual, i.e. "deeper" Diaphragm* region into the evaporator unit preceding in the direction of flow, the absence of "external" bifurcations convert the inlet into a geometric element having a relatively low $c_F$ coefficient at the flow inlet, which is completed by geometric elements with a high $c_F$ coefficient at a greater distance >h (EP-Application 94111991.9, Aug. 1, 1994, and PCT Application PCT/EP95/02882 of Jul. 19, 1995), and these solutions show (comprise) possible overlaps of the hitherto occurring basic elements for the optimization of the final Diaphragm* design.

6. Bifurcations for Vapor Mixtures

The selectivity of bifurcations for controlling the transdiaphragm material conveyance of vapor mixtures does not have to be equal to 1 or near to 1 in order to control the concentration of the final product.

Solution:

20. Bifurcations according to one or more of solutions 1. to 19., further characterized in that bifurcations are used for branching off a vapor mixture from transdiaphragm vapor conveyance over a wide selectivity range of $0.1<D_k<1.0$, but preferably over a range of $0.5<S_k<1.0$, i.e. the concentration of the vapor flow discharged transdiaphragm deviates from the concentration in the vapor chamber (the reservoir), a constant bifurcation flow concentration dependent on the difference between the bifurcation orifice diameter ($d_{BO}$) and/or bifurcation duct diameter ($d_{BK}$), on the one hand, and the mean free path length of the at least one vaporous component, on the other hand, then controlling, together with the vapor flows from the at least two vapor sources and the form of the external geometric element (e.g. Laval nozzle inlet, etc.), the concentration of the vapor mixture inside the corresponding evaporation unit, corresponding bifurcations being used preferably "externally", so that no change of concentration takes place in the transdiaphragm "depth" of the corresponding Diaphragm* (i.e. the shortest distance between two chambers), with the result that better control and suppression of possible condensation, particularly in the case of low $S_k$ values, is achieved and not only does the corresponding risk of condensation remain localized externally, but is directly reduced internally thereby, the flow resistance surfaces of the Diaphragm* then serve as (part of superheated) collecting surfaces for condensed droplets, from which the droplets can evaporate back into the chamber interior (FIG. 61 showing external Laval nozzle with 61a interception device and excess heating for bifurcation-induced condensation products on a porous diaphragm Diaphragm*, as distinguished from 61b external Laval nozzles with following "internal", i.e. transdiaphragm bifurcations; L Laval nozzle; BgK= bifurcation flow, if appropriate with condensation; h=height h; BSoK=bifurcation flow without condensat; LDA =Laval nozzle outlet; BoPR: pair of bifurcations or annular bifurcation duct), in this case the function of the overall Diaphragm* deviates from that of a pure mass filter, but the purpose remains the same, namely that of eliminating all condensation disturbing the process as a whole=uncontrollable, hence suppressing transdiaphragm condensations which "stick shut" the basic structural control part of the process, namely the Diaphragm* itself, by condensation, e.g. via a graft flow, and which these disturbances obviously include, and to that extent the external bifurcations used as a separating part diaphragm and having, where appropriate, an external graft flow are used preferably for the control of condensation (e.g. condensation-critical alloys of a given alloy system), but also for controlling their concentration itself during transdiaphragm material conveyance and are assisted in this function by apertures in the external bifurcation bores.

7. Combinations of Three Structural parts

7.1 Bifurcations after (superheated) diffuser/nozzle transitions

Figure 62:
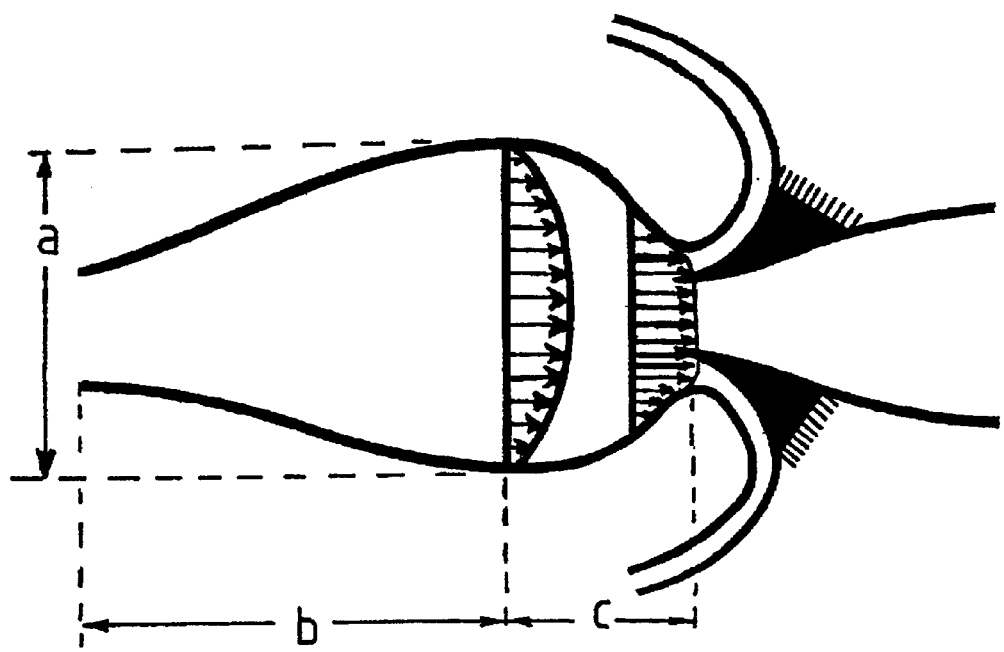
FIG. 62 Transition diffuser/nozzlebifurcation.
Figure 63:
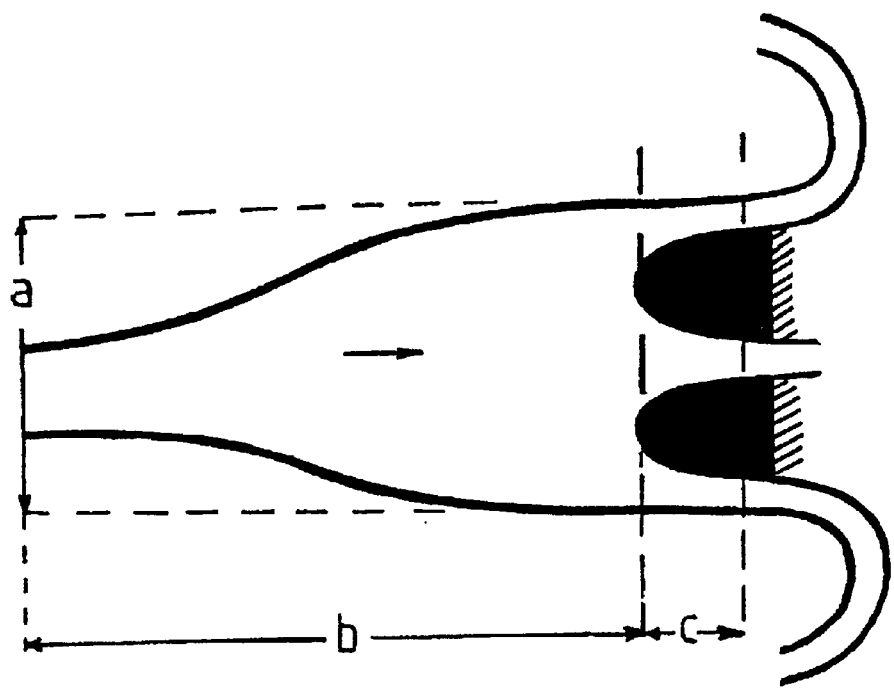
FIG. 63 Alternative bifurcation bringing about a nozzle-like contraction in cross section.
Figure 64:
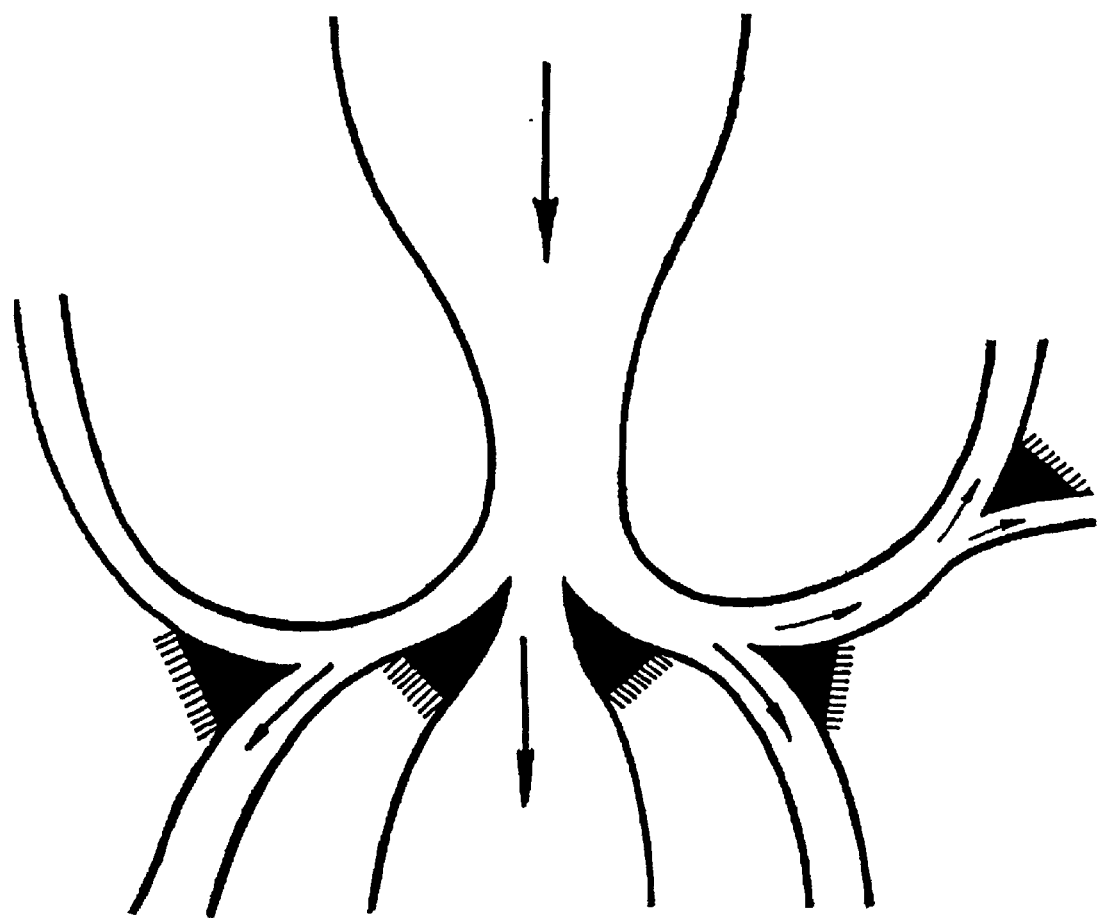
FIG. 64 Bifurcations in the bifurcation backf low duct.
Figure 65:
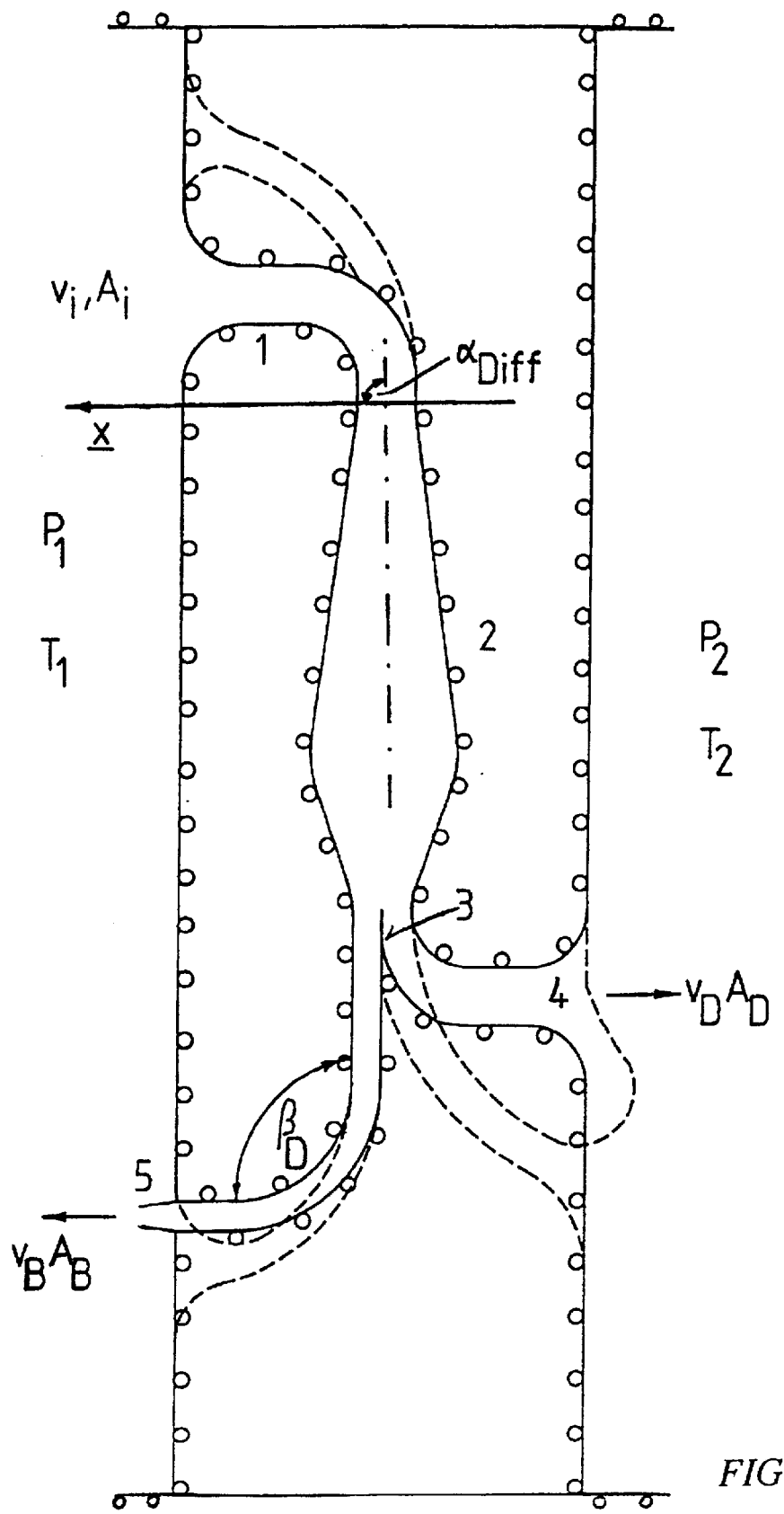
FIG. 65 Four-part Diaphragm* element with $\alpha_{diff}=90°$ and alternative flow inlets and outlets.
Figure 66:
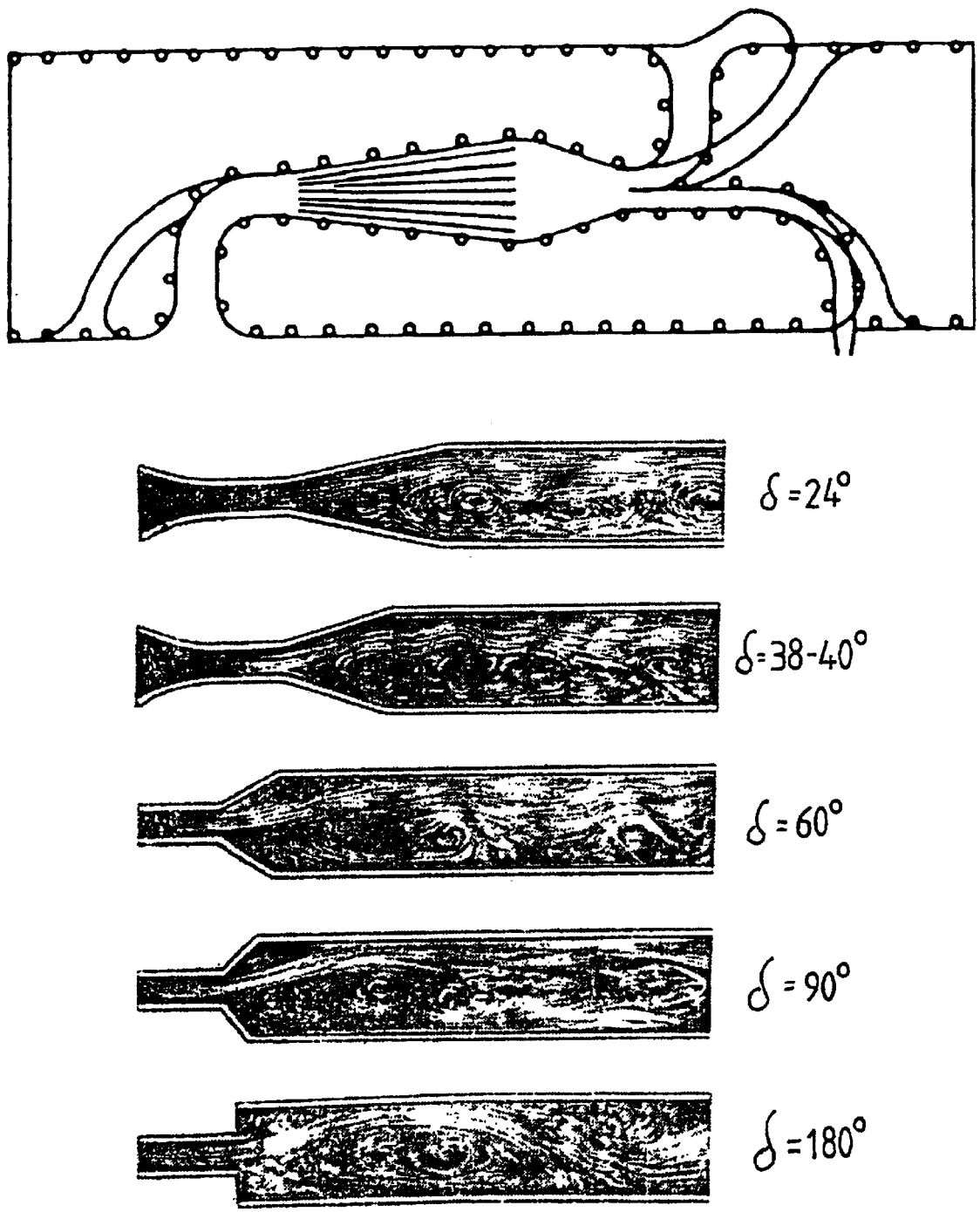
FIG. 66 As FIG. 65, here with heat exchangers arranged in a diffuser-like manner in the diffuser region to contribute to suppression of the development of flow vortices.
Figure 67:
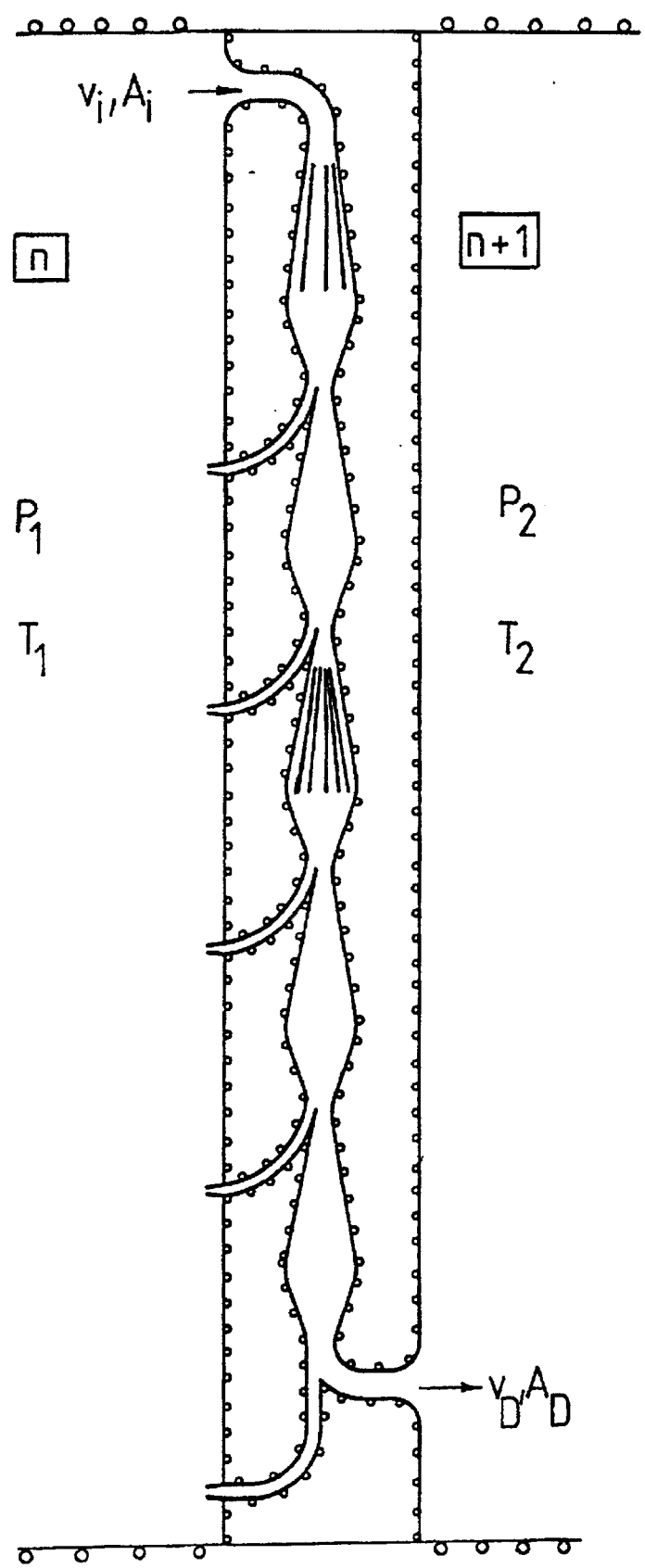
FIG. 67 As FIGS. 65 and 66, here with 5 four-part elements mounted in series.

In the pressure flow mode, the flow ratios during the branching-off of part flow quantities are relatively simple. The ratio of the flow quantity branched off per unit time via a bifurcation (or pair of bifurcations, etc.) to the part flow quantity transferred (i.e. "forced") continuously per unit time from the pressure flow corresponds to the distribution of the speed, i.e. to the speed profile in the nozzle, such as they emerge from the projection of the flow cross sections upstream of the bifurcation duct/bifurcation ducts and upstream of the e.g. central duct (cf. FIG. 62 showing transition diffuser/nozzle bifurcation with length ratios (n.b. arbitrary in the drawing) a=0.2 to 50 cm, b=2300 cm and c=0.5 to 50 cm). Temperature increase, expansion and resulting acceleration are achieved in a particularly maintenance-friendly way by the use of superheated diffuser/heat exchanger/nozzle transitions and/or plasma guns. However, in that part of the abovementioned vapor deposition process which is driven by pressure flow, they are, where appropriate, necessary conditions for $p_I > p_B$, i.e. for making it possible for a part flow quantity at $p_B$ to flow back into the (original) reservoir (n.b. p is here, the sum of hydrostatic and hydrodynamic pressure).

Irrespective of the local propulsion force, downstream of the superheated diffuser/nozzle transition the bifurcation backflow contributes to both terms $F_D(p\rho_T, A_T)$ and $F_D(\rho_m, A_m, m)$ of $F_D$. If superheated diffuser/nozzle transitions are used for bifurcation backflows, the importance of the locally effective propulsion forcesfor transdiaphragm vapor flow and of the resulting and/or employed nozzle type and form (i.e. variant) becomes correspondingly relative. If appropriate, the bifurcation backflow duct walls are also superheated and/or subjected to separate temperature control. The more significant contribution to transdiaphragm vapor heating as a result of transdiaphragm flow duct superheating, including diffuser/nozzle and possible bifurcation duct superheating, is preferably achieved upstream of the bifurcation inflow. Superheating is carried out preferably by resistance heating or by induction.

Figure 68:
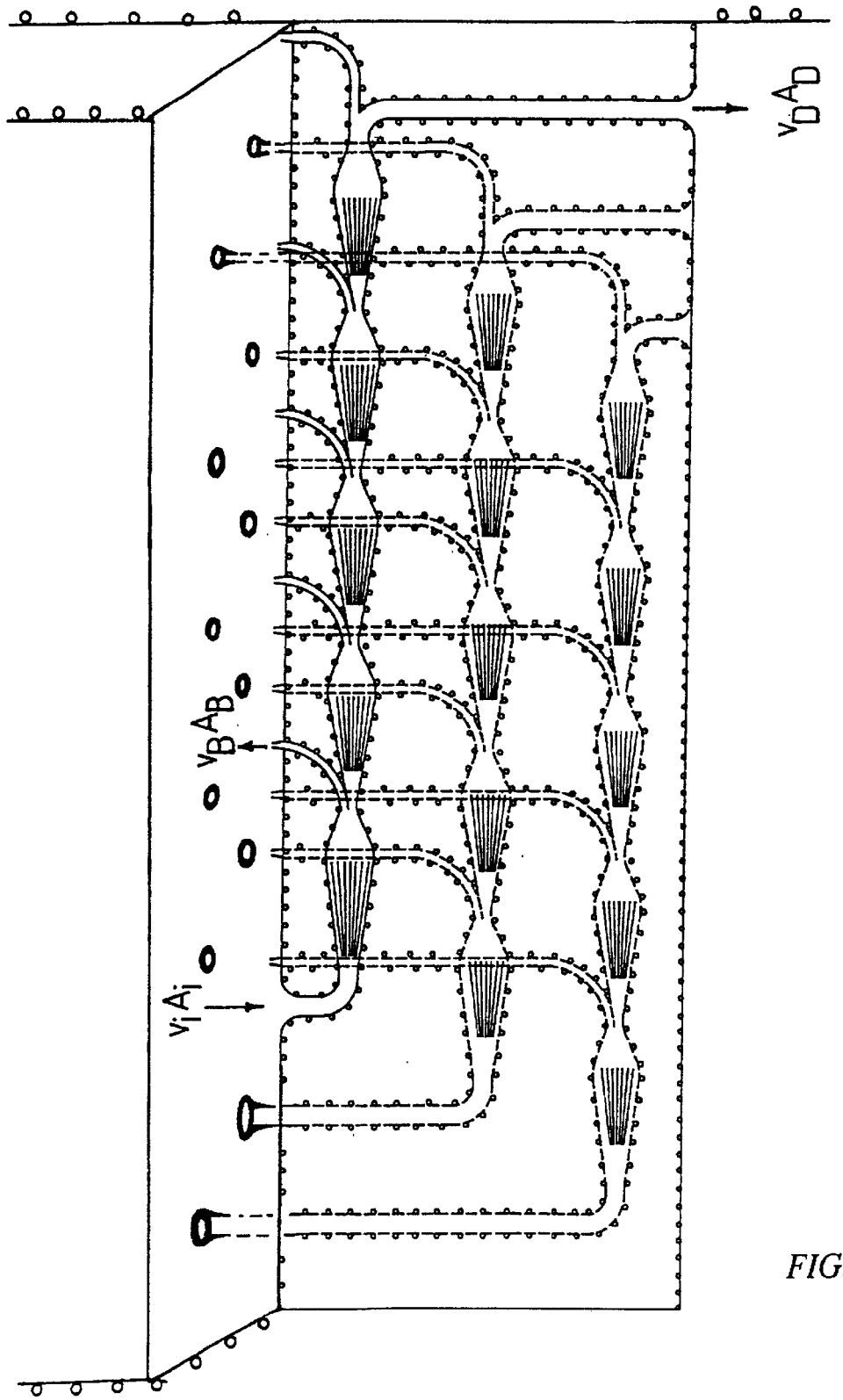
FIG. 68 As FIG. 67, here with three lined-up four-part lines of a Diaphragm* and a non-communicating transdiaphragm flow ducts.
Figure 69:
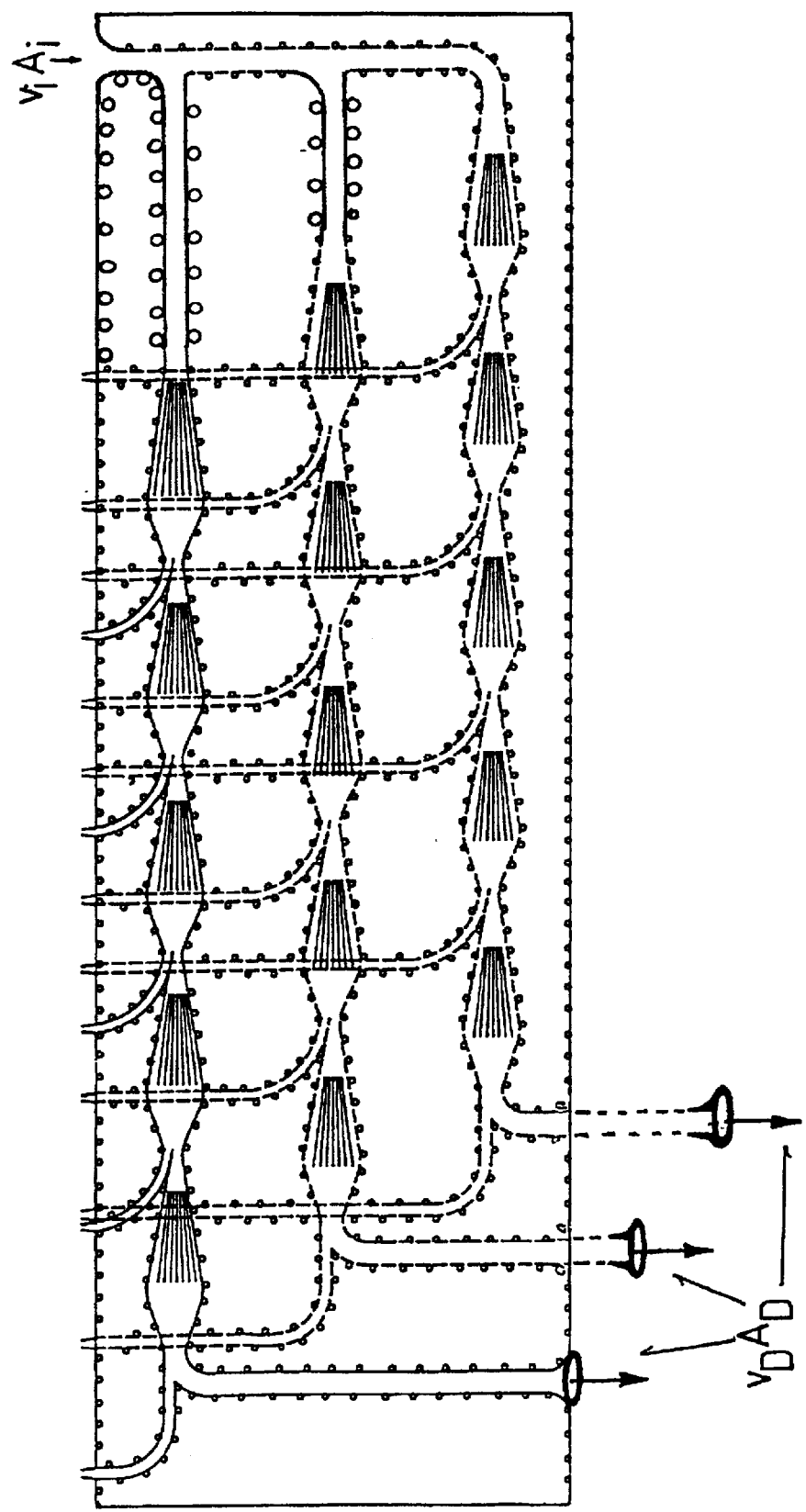
FIG. 69 As FIG. 68, here with 3 communicating 4-part lines of a Diaphragm*.

Solution:

21. Bifurcations according to one or more of solutions 1. to 20., further characterized in that, in the nozzle region, the increase in the flow speed of a vapor after it passes through a superheated diffuser/heat exchanger and/or diffuser/heat exchange/nozzle transition and/or plasma guns is particularly high in the pipe wall boundary layer and, in comparison with the solutions consisting of a conventional flow duct and nozzle (cf. point 3 ff.), the heated (i.e. superheated) diffuser/nozzle transition increases selectively, i.e. superproportionally, the pulse force in the boundary layer of the diaphragm vapor flow and consequently its directionality in spite of heating, superheating $$T_{diffuser} > T_{vapor} + \Delta T$$

together with these solutions ensures, downstream of the-nozzle inlet, an improved branching-off of part flow quantities via the at least one bifurcation duct back into the original evaporation chamber, where $\Delta T=fn(Re(S), F_D(S))$, dp/dx, dT/dx.

7.2 Bifurcations in diffuser/nozzle transitions (pseudo-combination of three structural parts)

A significant acceleration effect by diffusers alone is transferred to the bifurcation backflow only when the bifurcations themselves convert the bifurcation region into a nozzle region by contraction in cross section (FIG. 63 showing alternative bifurcation incorporation, such that incorporation itself brings about a nozzle-like contraction in cross section. a, b and c as in FIG. 62). Since the transdiaphragm acceleration of the vapor flow is a precondition for the bifurcation backflow and for $p_I>p_B$ (see above), the following is solution:

Solution:

22. Bifurcations according to one or more of solutions 1. to 21., further characterized in that plant solutions, in which the bifurcation zone coincides with the continuous contraction in cross section, i.e. the bifurcation itself provides a quasi-nozzle (situation), as shown in FIG. 63, preferably explore the bifurcations shown in FIG. 62 (and in FIGS. 36 and 37 of EP-Application 94111991.9, Aug. 1, 1994, and PCT Application PCT/EP95/02882 of Jul. 19, 1995), after the diffuser/nozzle transition for the abovementioned process, when the use of bifurcations is not obligatory, as in the case of relatively low transdiaphragm state gradients (e.g. dp/dx and/or dT/dx) or else also in the case of very high flow speeds, but the bifurcation flow itself can then, if appropriate, be further subdivided into a part which is transferred in the same way as the main flow into the next following chamber and into a part which is returned into the original chambers (FIG. 64 showing bifurcations in the bifurcation backflow duct, particularly suitable for $q_{v,B}>>q_{v,D}$.).

8. Comnbinations of structural parts

Basically, bifurcations can be used in combination with all diffusers and diffuser/nozzle combinations which were put forward in the section "Technical Solutions" in Chapters 1.–3. A principle for reducing the suction-flow-related shading of the bifurcation flow pulse is to design the bifurcations in terms of fluid mechanics in such a way that the suction flow at the Diaphragm* outlet does not "look into" the preceding evaporation and/or mixing chamber (cf. next chapter). Instead, high state gradients dp/dx and dT/dx without a change of concentration also necessitate branches of the transdiaphragm material conveyance, in order to offer bifurcation types which are preferred over a wide Re number range which allow an improved control of the pressure of the bifurcation backflow outlet, $p_B$, in comparison with non-branched transdiaphragm material conveyance.

Solution:

23. Bifurcations according to one or more of solutions 1. to 22., further characterized in that, for an improved orientation and transdiaphragm position of the bifurcations in a Diaphragm*, flow bends are used and, where appropriate, combinations of four structural parts, for increasing the specific Diaphragm* force $F_{D,x}(\rho_m,A_m,m)$ and $F_{D,x}(\rho_T/A_T)$, in this case the bifurcations according to solutions, as in solution 22., being preferably used between (or in, cf. next chapter) flow bends or between bent flow ducts (ditto), (cf. FIG. 65 showing four-part Diaphragm* element with $\alpha_{diff}=90°$ and alternative flow inlets and outlets (represented by broken lines), here for the suction mode with two possibilities for the outlet of the bifurcation backflow duct; 1: Bend 2: Diffuser 3: Bifurcation 4: Laval nozzle 5: Ultrasonic nozzle; and FIG. 66 as for FIG. 65, but with heat exchangers arranged in a diffuser-like manner in the diffuser region (on the left), which, inter alia, contribute to suppressing flow vortices (on the right) in the case of an inhomogeneous inflow into the diffuser region), and, if the central axis of the diffuser region is nonbent, said axis forms an angle of $0.1°<\alpha_{diff}<360°$, preferably $30°<\alpha_{diff}<120°$, with the x-perpendicular, this applying, in the case of bent diffusers and/or heat exchangers and/or bent diffuser/heat exchanger/nozzle transitions, to the angle açdiff between the direction of inflow into the bifurcation and the x-perpendicular to the inflow side of the Diaphragm*, in which $0.1°<\alpha'_{diff}<360°$, and the (simplest) basic form is characterized in FIGS. 65 and 66 by three bend types or by three types of bent flow ducts, namely:

1. transdiaphragm bend inlet (i.e. at the transdiaphragm flow inlet) and/or
2. transdiaphragm bend outlet (i.e at the transdiaphragm flow outlet) and/or
3. the bifurcation backflow duct, and, in the case of the diffuser flow duct (and all other nonbranched flows for the increase of $F_{D,x}(\rho_T,A_T)$, with this combination of four structural parts and the combinations of structural parts which are put forward in the next following sections, an improved utilization of the Diaphragm* volume is achieved for increasing the total specific force $F_{D,X}$, in this case the solutions in FIGS. 67 to 69 (showing a $n_4=5$ four-part elements mounted in series (FIG. 67, as for FIGS. 65 and 66) and FIG. 68, which is as FIG. 67, here with three lined-up four-part lines of a PD Diaphragm* and a 3-in-3 solution (not communicating transdiaphragm, cf. text, nb. broken lines stand for spatially offset) and FIG. 69 which is as FIG. 68, here with a 1-in-3 solution, ie. 3 communicating 4-part lines of a PD Diaphragm*) are preferably used for the transdiaphragm suction flow and are included in the diverse functions of bent flow ducts in addition to the accelerated branching-off of a part flow (see also the next sections), including selective flow boundary layer acceleration, and, on the other hand, also better utilization of a given Diaphragm* dimension (volume) for more efficient fulfillment of these aims, i.e. increased heating and/or acceleration of the (trans) diaphragm vapor flow and, where appropriate, a resulting increase in the pressure ratio $p_I/p_B$ of a given flow duct cross section, but in any event an increase in the transdiaphragm throughput in the case of transdiaphragm state gradients dp/dx and dT/dx predetermined by the product.

Solution:

24. Bifurcations according to one or more of solutions) 1. to 23., further characterized in that the (quasi-endless line shown in FIG. 67, where the number $1<n_4</=20$, here=5 illustrated, combination of four individual structural parts allows, above all, short bifurcation backflow ducts with small backflow angles $\beta_D$ (cf. FIG. 65) as well as relatively reduced turbulence development under given flow conditions (Re number etc., cf. next sections) and relatively high specific force $F_{D,x}$, the corresponding loss of transdiaphragm flow throughput in comparison with a correspondingly large number of transdiaphragm flow ducts filling the same Diaphragm* volume in the case of $\alpha_{diff}=0$ is partially compensated by layering such (quasi-endless) lines one above the other in tiers (cf. FIG. 68 with a 3-in-3 solution) and an $n_{in}$-in $n_{out}$ solution with $n_{in}<n_{out}$, in which $n_{in}$=the number of inflow ducts and $n_{out}$=the number of outflow ducts, increases the corresponding, i.e. specific conveying flow (cf.bottom), in that the outflow ducts are either guided out of one another before heating or, as a result of the overlap of the outlet suction flows, generate an additional drag effect relative to one another in comparison with the 3-in-3 solution (cf. FIG. 68, bottom and chapter 10, point (vi) of FIRST PART of the invention), in such a way that, conversely, with $n_{in}>n_{out}$, after outlet from the diffuser regions a plurality of such "lines" lead into a single outflow duct designed especially for maximizing the suction effect (not shown here).

5. Flow bends/bent flow ducts with and without bifurcations and with and without transdiaphragm T-gradients Flow bends (relatively large flow deflection angles δ, relatively small bend radii at $R_0/D_H \leq 1.5$, see below) and/or bent flow ducts (relatively small flow deflection angles δ, relatively large bend radii, at $R_0/D_H \geq 1.5$, see below) are eminently suitable for the control of $F_F$ without bifurcations and/or $F_D$ with and without bifurcations and/or diffusers and/or diffuser/nozzle transitions and/or nozzles and for the control of both, i.e. $F_F$ and $F_D$. Previous bifurcations (cf. above and EP-Application 94111991.9, Aug. 1, 1994, and PCT Application PCT/EP95/02882 of Jul. 19, 1995) were mounted outside bent flow duct regions and outside flow bends. These include bifurcations mounted symmetrically (e.g. FIG. 58) and asymmetrically (FIGS. 66–69) at the edge (cf. FIGS. 54*a,b,d* and 55*g*) or in the middle (cf. FIG. 54*c*) of a flow duct (including diffusers and nozzles). Whilst the symmetrical bifurcations are followed by relatively long bifurcation backflow ducts, the asymmetric bifurcations considered hitherto have a relatively reduced flow pulse in the transdiaphragm vapor flow as a result of the lengthening of the transdiaphragm flow duct. The flow conditions must therefore be improved, and this applies particularly to the bifurcation backf low duct.

For optimizing the orientation of the Diaphragm* and its transdiaphragm and external structural parts, therefore, the flow conditions in the bend of a transdiaphragm flow duct itself are used. Bends are subdivided into (i) those with a parallel inner ($r_{in}$) and outer ($r_{out}$) radius:

$$r_{out}=r_{in}=\text{const. (i.e. round)} \qquad (91),$$

including the special case of the kinked bend (i.e. abrupt bend) with:

$$r_{out}=r_{in}=0 \text{ (i.e. angular)} \qquad (92),$$

and into (ii) those with concentric outer and inner walls, i.e. with an outer radius which is larger by the diameter of the bend $d_k$ than the inner radius $$r_{out}=r_{in}+d_K \qquad (93),$$

the inflow cross section being identical to the outflow cross section and, in the present case, $d_K$ being equal to or similar to the (adjacent) flow duct (pipe) diameter $d_D$.

Figure 70:
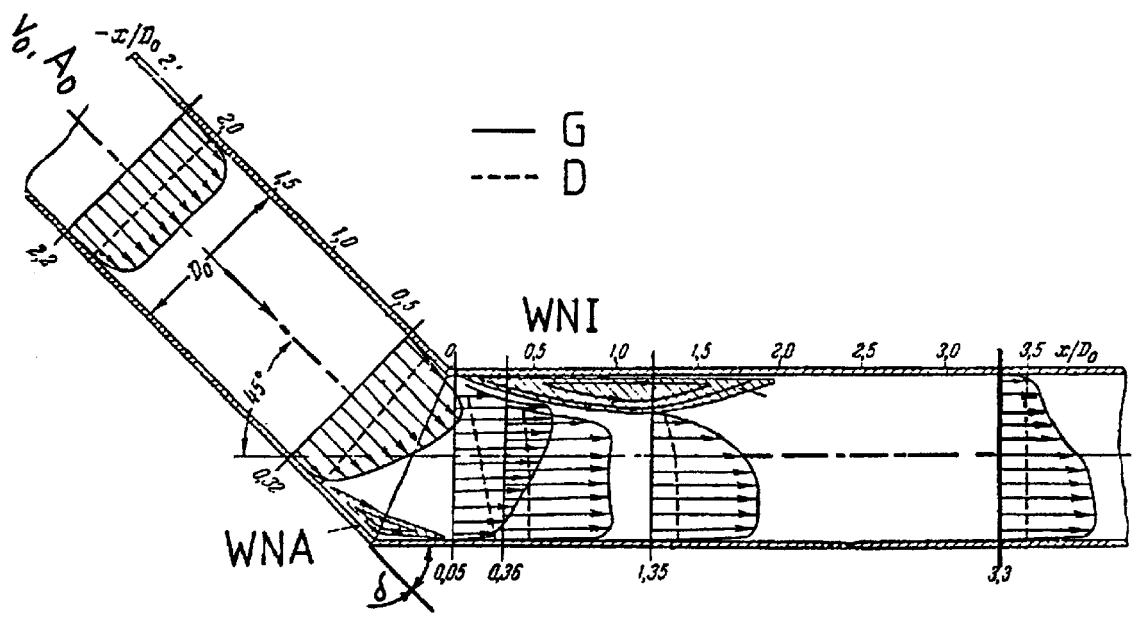
FIG. 70 Variation in the profiles for speed and pressure of a bend flow in bend region and in bend outlet.
Figure 72:
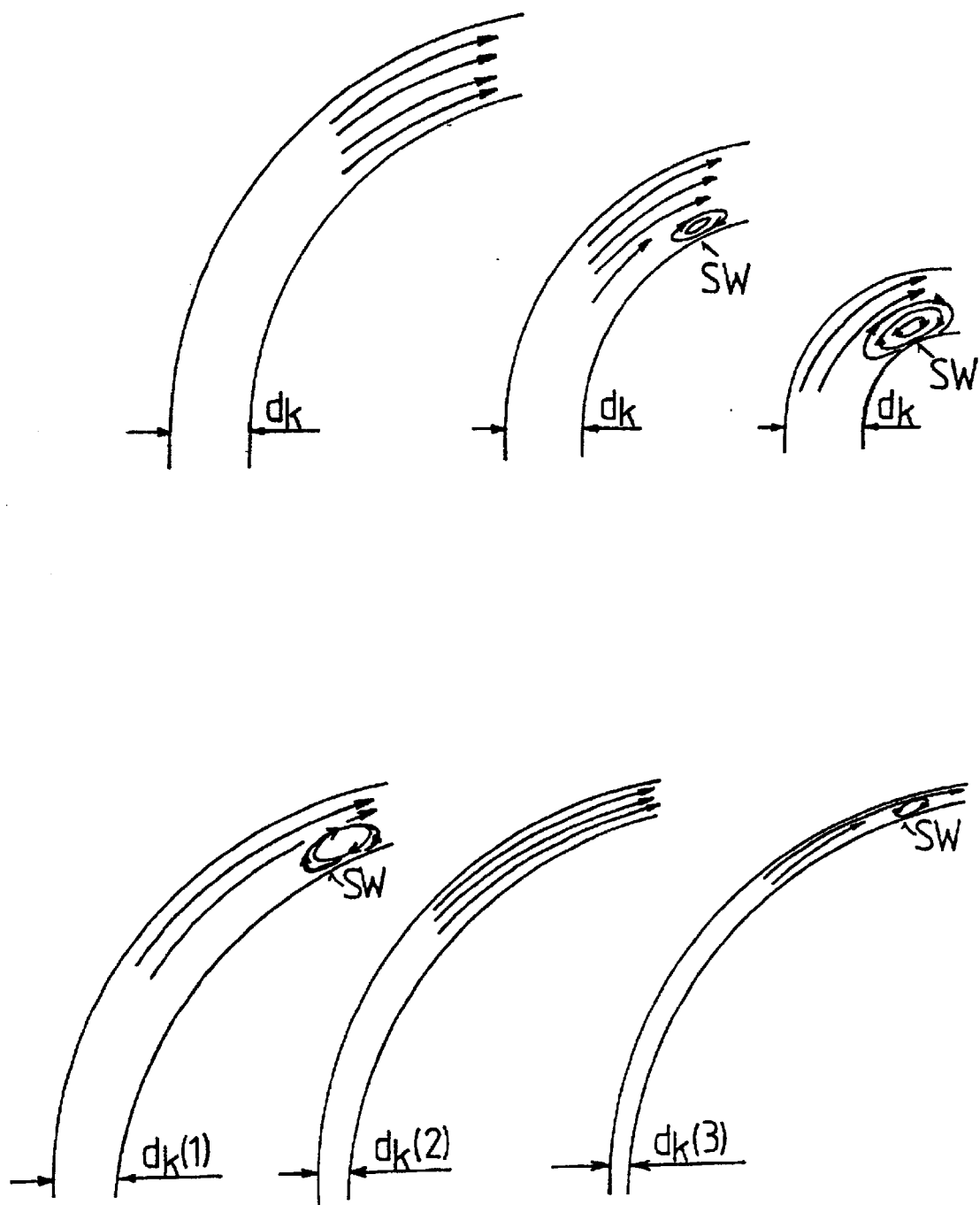
FIG. 72 Occurrence of flow vortices at constant Re number and (top) decreasing mean bend radius and (bottom) varying bend diameters.

Due to the change in direction of the flow in a bent flow duct or flow bend, centrifugal forces steer the (primary, i.e. parallel, cf. below) flow lines away from the central flow axis toward the outer wall of the flow duct, in conjunction with an increase in the pressure on the outer wall and a lowering of the pressure on the inner wall (FIG. 72 showing occurrence of flow vortices SW in the case of a constant Re number: (top with Re=const., $d_k=2r_k$=const. and $R_3>R_2>R_1$) as a consequence of the decreasing mean bend radius, (bottom with R=const. and $r_k(1)<r_k(2)<r_k(3)$ and Re(1)<Re(2)<Re(3)) as a consequence of varying bend diameters with a flow speed too slow (on the right) and too high (on the left) to avoid flow vortices). Correspondingly, the flow speed on the outer wall upstream of the bend falls, whilst, on the inner wall upstream of the bend, it first rises in comparison with the mean flow speed (FIG. 70 showing variation in the profiles for speed and pressure of a bend flow in the bend region and in the following bend outlet; WNA=vortex zone in the vicinity of the outer wall; WNI=vortex zone in the vicinity of the inner wall; G=speed profile; D=pressure profile). This causes the flow lines on the outer wall to run apart (diverge) and those on the inner wall to run together (converge) correspondingly. After the flow has passed the bend, the flow ratios are reversed, i.e. divergence and speed lowering on the inner wall and convergence and speed increase on the outer wall.

Figure 71:
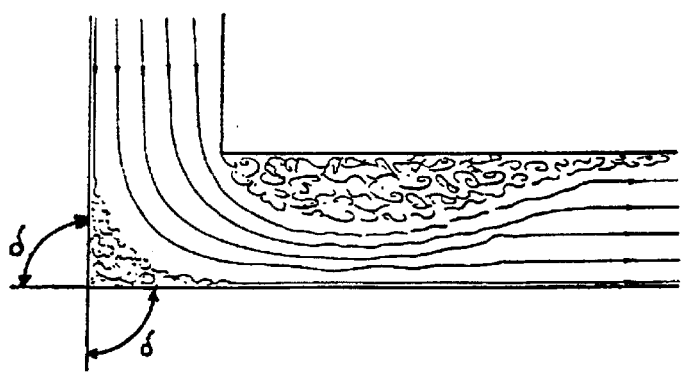
FIG. 71 Flow behavior with flow lines and flow vortices in a rectangular bend.

The divergence phenomenon leads to the breakaway of the flow lines on both inner walls of the flow duct (FIGS. 70 and 71, FIG. 71 showing flow behavior with flow lines and flow vortices in a rectangular bend (ie. bend angle δ=90°). The breakaway of the flow lines on the inner wall reinforces the tendency of the flow lines to converge in the direction of the outer wall of the bend, etc., this tendency being brought about by the centrifugal forces, even without breakaway. This results in flow vortices (so-called dead flows) which spread over a relatively wide region of the following (outflow region of the bend, i.e.) flow duct and, at the same time, considerably narrow the cross section of the basic flow.

These dead flows occurring on the inner wall downstream of the bend (or, for $r_{in}>0$, at the end of the bend) have a high dependence on the Re number. The turbulences also include a macroscopic relative flow in the opposite direction to the (basic) flow. For Re=const., the turbulences increase with a decreasing bend radius rin (FIG. 72). By contrast, for $r_{in}$=const., an optimal $d_K$ (Re) range is obtained: in the case of (too) large diameters $d_K$, dead flows occur as a result of friction with the wall of the bend, whereas, in the case of (too) small diameters $d_K$, they occur as a result of (too) high flow speeds and resulting Re numbers, i.e.:

$$Re>Re_{crit}=(v_{crit}*d_K)/2\nu=2q_{m,crit}/(\pi d_K \eta) \qquad (94)$$

in this case $q_{m,crit}$ being in [kg/s] (cf. FIG. 72). Whilst dead flows only occur under specific flow conditions, dictated by the bend and the operative propulsion forces, at the end of/downstream of the bend, convergence of the (preferably laminar) flow lines (e.g. compressible gases and vapors) takes place on the opposite side of the (potential) dead flows, i.e. on the inside of the outer bend, on account of the centrifugal forces taking effect in the bend flow, even when no dead flow occurs on the inner bend (cf. above). For a given Re number, the dead flow and the coexisting convergence per flow duct and consequently the speed and pulse in the converging flow increases with an increasing angle δ, whereas the effective flow cross section $A_{eff}$ is reduced correspondingly.

Loss Figures

It is the state of the art to consider the effect of a bend, etc. solely in terms of the increase of frictional resistance, i.e. $F_{F,0}$. The speed, pulse and energy losses caused in the bent flow ducts and duct regions by friction and bend singularities are usually described by the global loss figure ζ which is defined as $$\zeta=\zeta_F+\zeta_M \qquad (95),$$

in which $\zeta_F$ is the loss figure caused by friction in the bend along its length l, i.e.

$$\zeta_F = \lambda l/D_H \tag{96}$$

with λ=pipe resistance figure (see first section of this 2nd part of the invention) discussed as a function of the operative Re number and relative roughness $\underline{\Delta} = \Delta/D_H$), $D_H$=the hydraulic diameter (see below), and the bend length l along the bend axis being given according to:

$$l/D_H = \pi(\delta°/180°)*(r/D_H) = 0.0175(r/D_H)\delta \tag{97},$$

in which ($rD_H$)=radius of the relative bend, so that substitution of equation (97) in equation (96) yields for $\zeta_F$:

$$\zeta_F = 0.00175\lambda(r/D_H)\delta \tag{98}$$

$\zeta_M$ is, in relation to $\zeta_F$, the loss figure caused by singularities and, in the abovementioned process, is the decisive loss figure. $\zeta_M$ is dependent on the further details of the technical design of the bend. The designs and details of bent flow ducts and flow bends of the porous diaphragm Diaphragm* are summarized in the following section in "Technical Solutions".

Consequently, on account of the sum of local turbulences, bends mounted in succession effectively result, in the first place, in a relative series resistance (cf. EP-Application 94111991.9, Aug. 1, 1994, and PCT Application PCT/EP95/02882 of Jul. 19, 1995), as compared with the nonbent flow duct which, although making a contribution to the porous diaphragm Diaphragm*, does not (in view of the potential cause of condensation) make the optimal contribution whereas this (i.e. the effect of a bend on $F_{D,0}$, has hitherto been ignored. However, an efficient design of the porous diaphragm Diaphragm* is characterized in that an increase in the pumping speed S and in the resulting vacuum has an insignificant effect resulting in a variation of $F_{D,0}$ (and of the resulting gradient dp/dx) and in the operative functional range, in the case of a specific increase in $F_D(S)$, leads to a relative reduction of $F_{F,0}$. Discontinuities and other sources of turbulences in the flow ducts are used to minimize $F_{F,0}$ and maximize $F_{D,0}$. In the abovementioned process, therefore, the loss figure $\zeta_M$ and the resulting contribution to $F_{F,0}$ play an important part in building up a reservoir without condensation. Design measures for increasing $F_{D,0}$ consequently also include local increases of $F_{F,0}$, for example by means of special flow resistances (cf. EP-Application 94111991.9, Aug. 1, 1994, and PCT Application PCT/EP95/02882 of Jul. 19, 1995 and below), since they can simultaneously increase $F_{D,0}$ and effectively reduce the relative effect of the flow resistance per flow duct $F_{F,0}$ (cf. above).

The locations of the flow lines which converge as a result of the bending of a flow duct and the change in direction of a flow are preeminently suitable for branching off a bifurcation path flow in the abovementioned porous iaphragm Diaphragm*. The ratio of $F_D/F_F$ of a bifurcation-controlled porous diaphragm Diaphragm* is determined by the ratio of the pressure varied by centrifugal forces and of the dead flow generated by singularities (see above). Since dead flows occur in the bend particularly when $d_K$ is relatively high in comparison with $r_{in}$, i.e. when the ratio $d_K/r_{in}$ is relatively high, dead flows occur particularly on kinked inner bends (i.e. with $r_{in}$=0). FIG. 70 also shows the variation in the speed and pressure profile in a rectilinear bend kinked at the angle δ=45° on the inner and outer wall. For the condition $r_{in} = r_{out} = 0$, the local speed increase $\delta v(d_K) = v_k^{max} - v_D^{max}$ (with $v_k^{max}$=speed maximum in the bend, $v_D^{max}$=speed maximum in the nonbent Diaphragm* flow duct) is, for a given Re number at the bend inlet, primarily a function of the bend angle δ and, with increasing δ values, the zone of the dead flow, including the associated hydrodynamic pressure loss (hydrostatic pressure rise), increases (cf. FIG. 71 vs FIG. 70) (n.b. in the solutions, e.g. in sections 8 and 9 of the preceding chapter, δ=0). If the angle (in the center) of the bend is δ=90°, the region of the flow vortices which occur as a result of the breakaway of the flow from the inner wall already covers half of thecorresponding duct width (FIG. 70).

Transdiaphragm flow resistances, which are generated by dead flows and by other turbulences (for example, vortex streets, i.e. different from turbulent flow), are taken into account in the state equations (54), (72) and (81) by the substitution of $A = A_{eff}(\delta)$ and $\rho = \rho_{eff}(\delta)$, $A_{eff}(\delta)$ and $\rho_{eff}(\delta)$ being the resulting effective quantities of the diaphragm flow under the influence of dead flows and turbulences, i.e. $F_D(\rho_{m,eff}, A_{m,eff}, m)$ and $F_D(\rho_{T,eff}, A_{T,eff})$ (n.b. it must be noted that turbulences and dead flows in the diffuser are not necessarily associated with a convergence of the flow lines in the basic flow). The resulting sum on the right-hand side of equations (55), (73) and (84) gives the final force of the Diaphragm* having flow ducts which, however otherwise designed, are bent. The implicit part of the state equations together with the hitherto occurring derivations of the principle of pulse preservation is therefore sufficient also to take into account the transdiaphragm changes in state which are induced by bent flow ducts and/or flow bends.

Technical Solutions

In connection with the abovementioned vapor conveyance and deposition process the following solutions are employed:

1. General Bend Properties: Roundings

Figure 73:
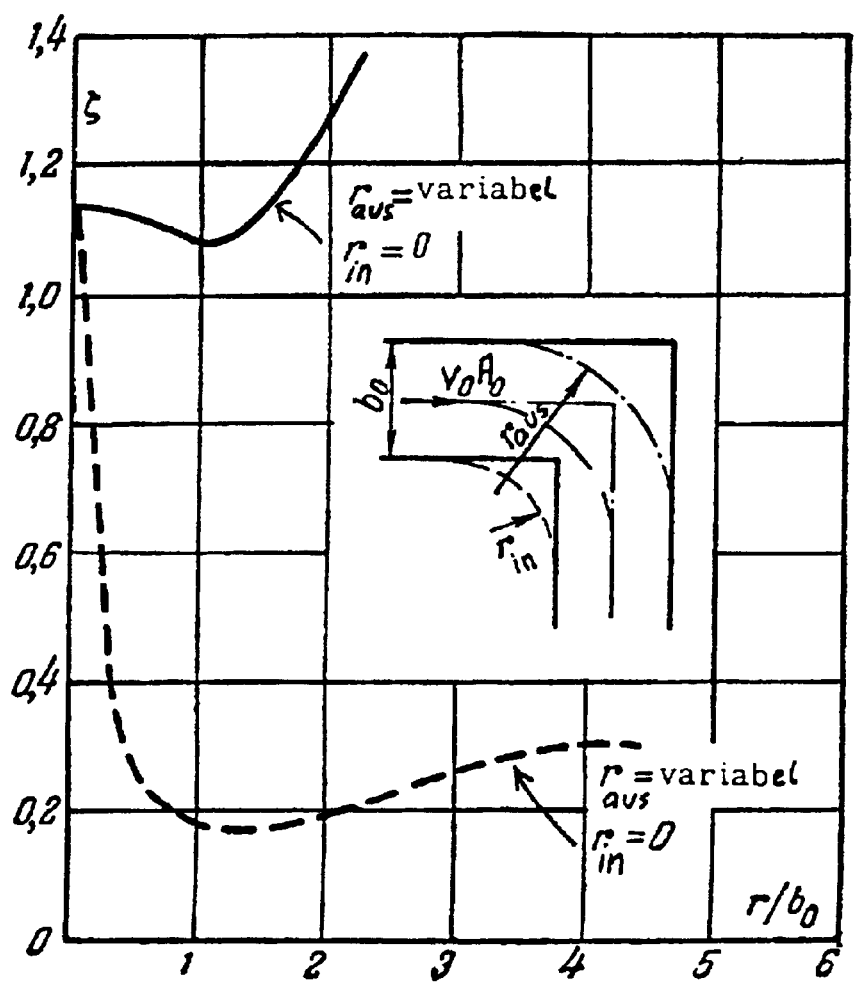
FIG. 73 Wall variations of a bend and effect on the relation between the loss figure in the bend and the relative radius $r/b_0$ of the bend.

Since, in the case of an abrupt change in the direction of flow, i.e.the duct wall (r=0, r=radius of (any) bend), the vortices on the inner wall are particularly strong, roundings of the inner wall (i.e. $r_{in}$>0) reduce the loss figure ζ particularly sharply (cf. FIG. 73 showing diagram of wall variations of a bend and effect on the relation between the loss figure in the bend and the relative radius $r/b_0$ of the bend, n.b. $r_0 = r_{in}$, $r_1 = r_{out}$). By contrast, reducing an isolated rounding of the outer wall (alone) does not lead to any significant reduction in the loss figure, but, in the case of a rising ratio $r/d_K$, even (on account of the resulting reduction in cross section) to a pronounced increase in the loss figure ζ (FIG. 73).

Solutions:

1. Bend for the abovementioned porous diaphragm Diaphragm*, characterized in that the (minimum) loss figures occur in the case of inner wall roundings of around $1.2 < r_{in}/d_K < 1.5$, whilst, for $r_{in}/d_K > 1.5$, the loss figure ζ even for an inner wall rounding, rises again on account of the speed losses and the resulting renewed increase in the flow line breakaways (at the bend inlet), exclusive roundings of the bend outer wall are therefore less expedient, although exclusive roundings of the inner wall are used over a wide range of $0.1 < r_{in}/d_K < 5$ and higher, but preferably in the range of $0.5 < r_{in}/d_K < 3$, the optimal loss figures are achieved for roundings of the outer and inner wall, the minimum loss figures of the bend with parallel outer walls occur inthe case of $$r_{out}/d_K = r_{in}/d_K + 0.6 \tag{99},$$

whilst the minimum loss figures for a concentric (i.e. "normal") bend come about in the case of $$r_{out}/d_K = r_{in}/d_K + 1 \tag{100},$$

and, in light of easier manufacture, the concentric bends according to equation (100) are used for preference as "optimal" bends.

2. Flow Bend Variants

The flow and flow bends of the porous diaphragm Diaphragm* are clearly defined by the following 5 control variables, i.e. by:
1. The Re number, $Re=v_0 D_H/v$, with $v_0$=entry flow speed, $D_H$=hydraulic pipe diameter, $v$=kinematic viscosity=$\eta/\rho$ with $\eta$=dynamic viscosity
2. The relative roughness $\underline{\Delta}=\Delta/D_H$ (often also: k/D), in which $\Delta$ (or k)=mean height of surface roughness.
3. Relative bend radius $r/D_H$ (regularly round, i.e. continuously bent) or $R_0/D_H$ (mean radius of a dis continuously bent bend, cf. point 3.)
4. The flow deflection angle $\delta$ (often also $\delta°$)
5. The ratio between the inflow and the outflow cross section, i.e. $A_0/A_A$ (for the corresponding circular flow cross sections, the ratio of the diameters $D_0/D_A$.

Solutions:
2. Bend for the abovementioned porous diaphragm Diaphragm*, as for solution 1., further characterized in that the operative Re range of $10^0$ to $10^9$ is used, $v$ is given by the material (vapor), $v_0$ is given, inter alia, by $F_D, F_P$ and $F_F$, $\Delta$ (or k) and the resulting $\lambda$(Re) values were already fixed under "Technical Solutions" in the chapter on surface quality D and the resulting pipe resistance figure l, and the influence of the cross-sectional ratio is discussed further below, then the variables 1.–3. are dependent on the hydraulic diameter $D_H=D_0$ (for circular bend cross sections having the (inlet) diameter $D_0$) or $D_H=4\, A_0/U$ (for any bend cross sections having the circumference U) and/or through $D_H=(2\,a_0 b_0)/(a_0+b_0)$ (for rectangular cross sections having the (inlet) width $b_0$ and (inlet) height $a_0$, cf. FIG. 74 showing concentric and right angled bends (cf. equation (93) and $A_0=A_1$), here for $\delta=90°$ and 74a $0.5<R_0/D_H\leq1.5$, 74b $R_0/D_H>1.5$ and 74c $R_0/D_H>>1.5$, 74d abrupt bend ($r/D_H=0$) with a reduction or enlargement of the flow cross section, 74e as 74d, but without a variation in cross section, but with a round wall or with a recess, 74f rounded bend of rectangular cross section with a reduced or enlarged flow exit cross section, and 74g as 74f, but without a variation in cross section, but with a round wall), the loss figure of a characteristic length of a flow duct of the porous diaphragm Diaphragm* and the contribution of this length to $F_{F,0}$ is therefore a function of the design variables D, $r/D_H$ (or $R_0/D_H$), (as long as this has not been noted otherwise, cf. eg. point 14.2 of Technical Solutions for diffusers etc.), and the flow deflection angle $\delta$, so that the relative height of transversally rectangular flow cross sections $a_0/b_0$. Diaphragm* the flow bends which are used in the porous diaphragm preferably comprise the following variants and solutions are employed:

1. Bends with concentric walls (cf. equation (93) and FIGS. 74a–c), a flow deflection angle $0°<\delta<360°$, preferably $0°<\delta<180°$, but, in the case of rectangular flow cross sections having a relative height of $0.001<a_0/b_0<1000$, preferably $0.05<a_0/b_0<20$ and/or
2. As 1., but with a relative bend radius of $0.5<R_0/D_H\leq1.5$ and/or $R_0/D_H<0.55$ and/or
3. As 2., but with a technically smooth inner wall ($\Delta=0$) and loss figures of $0<\zeta_M\leq3.0$ and/or
4. As 2., but with a technically smooth inner wall ($\Delta>0$) and loss figures of $0<\zeta_M\leq6.0$ and/or
5. As 1., but with a relative bend radius $R_0/D_H>1.5$ (cf. 74b) and/or
6. As 5., but with a technically smooth inner wall ($\Delta=0$) and loss figures of $0<\zeta_M\leq2.2$, and/or
7. As 5., but with a technically smooth inner wall ($\Delta>0$) and loss figures of $0<\zeta_M\leq4.5$ and/or
8. Any flow routings and flow ducts with concentric and parallel flow walls and any flow deflection angles $\delta$ and relative heights $a_0/b_0$, as under 1., but with a relative bend radius $R_0/D_H>>1.5$ (cf. FIG. 74c) and/or
9. As 8., but with a technical bend radius of $0.5\leq R_0/D_H\leq200$, and/or
10. As 9., the specific Re numbers preferably being in the range of $10^2\leq Re\leq10^9$ (cf. above), and/or
11. As 10., the preferred pipe resistance figures $\lambda$ being in the range of $0.001<\zeta\leq0.4$, and/or
12. Bend with abrupt bending (i.e. $r/D_H=0$) (cf. equation (92)) and any flow deflection angles $0°<\delta<360°$, preferably $0°<\delta<180°$ (cf. FIG. 74d,e), and/or
13. As 12., but with concentric bend entry and exit cross sections (i.e. $D_0=D_A=D_H$), and/or
14. As 12., but with a rectangular flow cross section with a relative height of $0.001<a_0/b_0<1000$, but preferably $0.05<a_0/b_0<20$ and/or,
15. As 12., but with any form of flow cross section (cf. point 14.2 c–f of Technical Solutions in the chapter on diffusers, nozzles etc.), and/or
16. As 13.–15., but with a widening or contraction of the outflow cross section $A_A$ in comparison with the inflow cross section $A_0$ (cf. FIGS. 74d–g), and/or
17. As 14., but with a ratio of the inflow width to the outflow width, $b_0/b_A$, which varies between $0.05<b_0/b_A<20$, but preferably between $0.3<b_0/b_A<3.0$ (cf. FIGS. 74d,e), and/or with a ratio of the inflow width to the outflow width, $a_0/a_A$, which varies between $0.05<a_0/a_A<20$, but preferably between $0.3<a_0/a_A<3.0$, and/or
18. As 15. and 16., but with a ratio of the inflow cross section to the outflow cross section, $A_0/A_A$, which varies between $0.01<A_0/A_A<100$, but preferably between $0.1<A_0/A_A<10$, and/or
19. As 12.–18., but with technically smooth inner walls ($\Delta=0$) and global loss figures of $0<\zeta<8$ and/or
20. As 12.–18., but with technically rough inner walls ($\Delta>0$) and global loss figures of $0<\zeta<16$, and/or
21. As 12.–20., but equipped with a recess of any form in the bend center (cf. FIG. 74c), and/or
22. Bend with rounded inner and/or outer bending and any flow deflection angles $0°<\delta<180°$ (cf. FIG. 74f), the inner and outer walls being parallel and/or nonconcentric to one another, and/or
23. As 22., but with concentric bend inlet and outlet cross sections, in which $D_0=D_A=D_H$, and/or
24. As 22., but with a rectangular flow cross section according to item 14., and/or
25. As 22., but with cross-sectional forms, size ratios, surface properties, resulting loss figures and bends as under 15.–21., and/or
26. As 25., but with a relative radius of $0.01<r/b_{nar}<100$ and/or a relative roughness of $0<\Delta/b_{nar}\leq0.015$, $b_{nar}$ being the smaller width of the two quantities $b_0$ and $b_A$, and/or $0.01<r/a_{nar}<100$ and/or a relative roughness of $0<\Delta/a_{nar}\leq0.015$, $a_{nar}$ being the smaller width of the two quantities $a_0$ and $a_A$, and/or
27. Rounded bend, as 22., but with a relative bending in the range of $0.05\leq r/D_0\leq0.55$ and/or $r/D_0>0.55$ and/or $r/D_0>>0.55$, and/or
28. As 27., but with $r_{in}=r_{out}=r$ (cf. FIG. 74g), and/or
29. As 27. and 28., but with the characteristics according to 23.–26., and/or 30. As points 1.–19., but with a locally operative Δ value in the range of 0<Δ<100, the maximum values of which are achieved by the controlled introduction of local irregularities on the surface of the flow duct inner wall, and/or 3. Production Variations The manufacture of the partly complex flow ducts is easier if the latter are assembled from individual pieces (flow duct strips) (cf. FIG. 75 showing in 75a 90°-bend with a rounded inner and a tapering outer wall and rectangular flow cross section, and 75b as 75a, but the inner wall in the strip design and bend in the strip design at various mounting/butting angles, as indicated, in which δ=45° for 75c, δ=60° for 75d and 75e and δ=90° for 75f to 75j, and with a varying number of intermediate pieces having $l_0$, ie. $n_{ST}$=1 to 3, and bend with 75k kink on the inner wall in the case of a concentric wall as a whole, 75l wavy parallel wall with δ'=45, 75m as 75l, but a corresponding double bend with an intermediate piece of length $l_0$=⅝ $D_0$ ($D_0$=diameter at flow entry and exit) and 75n as 75l, but δ=90° without intermediate piece). This is advantageous particularly when the wall duct curves of the flow ducts are produced from weldable materials and/or large duct diameters are required and/or (PVD/CVD) coatings are (have to be) carried out. This relates to the solutions according to points 1.–30. in the (preceding) section No. 2 of the Technical Solutions of this chapter, but with a difference that parts of the inner and/or outer wall of the flow bend or of the bent flow duct are assembled (e.g. welded) from bent (i.e. curved) and nonbent strips. This can be demonstrated in the simplest way by reference to a rectangular flow cross section. FIG. 75a shows bends with rounded inner walls and an outer wall which, by the use of an (inserted) nonbent intermediate piece, locally halves the angle δ of the direction of flow and thereby reduces the corresponding loss figures $\zeta_M$ in the bend center, although $r/D_H$ locally remains=0. FIG. 75b shows the same operation on the inner wall, the difference from FIG. 75a being that $n_{St}$=2 strips are used in the bend and the mean local angle $\underline{\delta}_{loc}$ is reduced according to:

$$\underline{\delta}_{loc}=\delta/(n_{ST}+1) \quad (101),$$

in which the individual local angle $\delta_{loc}$ of part of the bend center either is identical to $\underline{\delta}_{loc}$ (cf. FIGS. 75c–e) or may deviate (sometimes even considerably) from $\underline{\delta}_{loc}$ (FIG. 75f). Whilst the strip method of construction reduces the loss figure $\zeta_M$ (presupposing constant or approximately constant Δ values), the relative mean bend radius $R_0/D_H$ is optimized by the length $l_0$ (on the axis) of the (individual) bends themselves. For a given bend $R_0/D_H$ and a given flow deflection angle δ, the loss figure $\zeta_M$ falls with a rising number $n_{St}$ of inserted bend strips (cf. FIGS. 75g–j), $n_{St}$=1–3 in FIG. 75c–j, whilst, in the case of a given number $n_{St}$=const., $R_0/D_H$ is directly proportional to the length $l_0$ of the inserted bend strips and $l_0/D_H$ therefore represents a characteristic production quantity for flow bends and bent flow ducts by the strip method of construction.

Solutions:

3. Bend for the abovementioned porous diaphragm Diaphragm*, as according to one or more of solutions 1. and 2., further characterized in that the outer and inner walls of the bends and bent ducts either are assembled parallel to one another (FIGS. 75c–j) and/or contain concentrically formed individual strips, the concentrically assembled regions either are curved (stretched) or contain (e.g. on the inner bend) kinked bend regions (FIG. 75k), and parallel-assembled and concentric forms of construction are made easier by the use of kinked bend regions which, if appropriate, are kinked in a wave-like manner on the outer and/or inner wall, may overlap with one another, have a high number ($n_{St}$+1) of joins and/or kinks per unit length of a bend and produce symmetrically composed forms which coincide with the U-bends discussed further below (cf. FIG. 75l–n), at the same time the kinks increasing the loss figure ζ on account of joins remaining on the inner wall, and a compromise of the solutions illustrated in FIG. 75 therefore being sought in conformity with the requirements, the number $n_{St,K}$ according to FIG. 75 or correspondingly assembled flow bends (i.e. characteristic individual bends) consisting of $n_{St,K}$=$n_{St}$+2 individual parts, i.e. including the associated inflow and outflow parts, the flow bends which are used in the porous diaphragm Diaphragm* and therefore comprise, in addition to the flow ducts produced by the conventional casting, shaping and assembling methods, the following production features:

1. Flow bend according to points (i.e. solutions) Nos. 1.–30. in the (preceding) section No. 2 of this chapter, but with any number $n_{St}$, but at least two curved and/or planar bend regions on the inner and/or outer wall which either are assembled (separately, e.g. by welding, riveting, etc.) and/or are contrasted from the adjacent bend regions by a kink and/or rabbet and/or groove, without being separated from them, and/or
2. Flow bend according to points (i.e. solutions) Nos 12.–30. in the (preceding) section No. 2 of this chapter, but with an arbitrarily rounded inner wall (inner wall regions) and an outer wall which is composed of any number $n_{St}$, but at least of two curved and/or planar bend regions, as under point 1 in this section, and at any (e.g. obtuse) angles 180°–$\delta_{loc}$ with $r_{out,loc}/D_H$=0, and/or
3. As 2. in this section, but with 0.01≦$r_{in}/D_H$≦100, preferably 0.1≦$r_{in}/D_H$<10 and/or
4. As 2., but with an inner and outer wall which are both composed of any number $n_{St}$, but at least of two curved and/or planar bend regions, as under point 1 in this section, at any angles 0°≦$\delta_{loc}$≦90° with $r_{in,loc}/D_H$=$r_{out,loc}/D_H$=0, and/or
5. As 4. in this section, but with 0.01≦$r_{in}/D_H$≦100, preferably 0.1≦$r_{in}/D_H$≦10, and/or with 0.01≦$r_{out}/D_H$≦100, preferably 0.1≦$r_{out}/D_H$≦10, and/or
6. As 4., but with arbitrarily rounded outer walls (outer wall regions), and/or
7. As 6. in this section, but with 0.01≦$r_{out}/D_H$≦100, preferably 0.1≦$r_{out}/D_H$≦10, and/or
8. As 4. to 7. in this section, but with 1<$n_{St}$<300 composed bend strips according to FIG. 75, and/or
9. As 4. to 8. (in this section), but with arbitrarily changing angles $\delta_{loc}$, and/or
10. As points 1.–9. (in this section), but with 0.01≦$R_0/D_H$≦100, preferably 0.05≦$R_0/D_H$≦20, and/or
11. As 10., but with a bend strip length on the corresponding strip axis, $l_0$, in the range of 000.1*$D_H$≦$l_0$≦1000*$D_H$, preferably in the range of 0.1*$D_H$≦$l_0$≦10*$D_H$, and/or
12. As 10. and/or 11., but with a mean bend radius $R_0$ in the range of 000.1*$D_H$≦$R_0$≦$l_0$≦1000*$D_H$, preferably in the range of 0.01*$D_H$≦$l_0$≦100*$D_H$, and/or
13. As points 1.–30. in the (preceding) section No. 2 and as points 1.–12. in this section, but with loss figures $\zeta_M$ in the range of 0<$\zeta_M$<100, preferably in the range of 0.05<$\zeta_M$<20, and/or
14. As points 1.–30. in the (preceding) section No. 2 and as points 1.–13. in this section, but all the bend regions are heated preferably inductively orby the resistance method, and/or 15. As 14., produced from steels and/or high-melting transition elements (such as, for example, W, Ta, Nb, including their alloys), superalloys, intermetallic compounds (TiAl, NiAl, etc.), either uncoated or as a core with a ceramic (e.g. PVD and/or CVD) layer or a ceramic as an uncoated or (e.g. PVD and/or CVD-)coated core, oxides (e.g. MgO, ZrO, BeO etc.), carbides (e.g. WC, $Ta_xC_y$ (e.g. $Ta_2C$), SiC, etc.), nitrides (e.g. BN), Be being used as core or layer materials.

Figure 76:
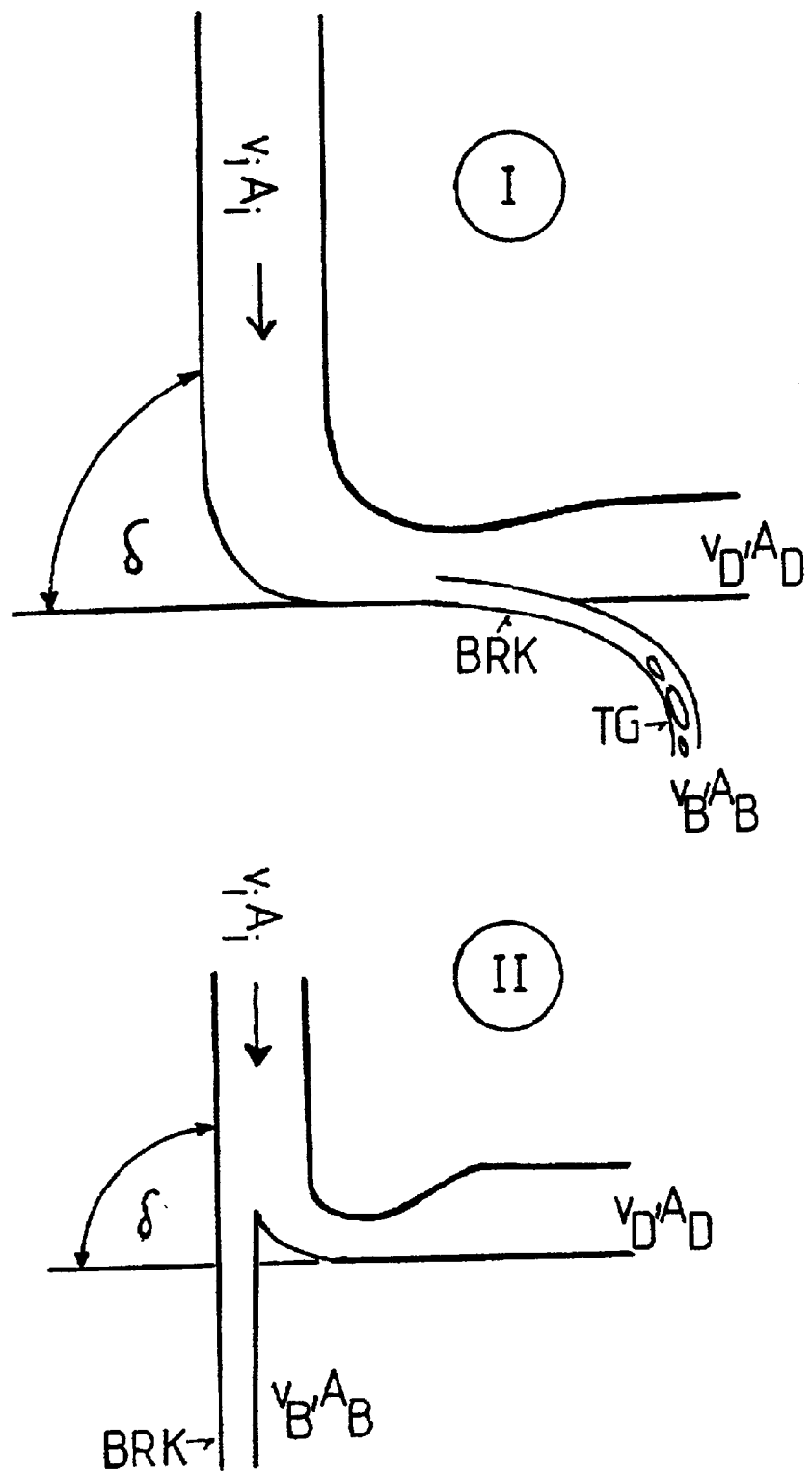
FIG. 76 Basic solutions for bifurcations on the flow bend.

4. Bifurcations in and on the flow bend of the transdiaphragm (i.e. central, see below) flow duct The trend of the flow, speed and pressure profile, as shown, results in two basic solutions, illustrated in FIG. 76 (showing basic solutions for bifurcations on the flow bend. I: relatively high flow speed and turbulence formation in the bifurcation backflow duct; II: the reverse, BRK=bifurcation duct; TG=turbulence risk; BRK=bifurcation duct) for branching off a bifurcation flow in or on the bend, whilst maximizing $F_D(p_B)$ and minimizing $F_{F,0}$. The local (FIG. 76a) pulse forces or pulse and centrifugal forces (FIG. 76b) are used for branching off for the purpose of the buildup of $p_B$, i.e. partial flow quantity:

$$dI_0 = (1 - \alpha_B)dI_D + \alpha_{Bd}I_B \qquad (102)$$

$$= (1 - \alpha_B)I_D + \alpha_B((\cos\delta_n + k_z(\delta)) * I_D) \qquad (103)$$

where $k_Z$ is an empirical function of ($\delta$) and $p_B$=fn (cos $\delta_n$, $I_D$, $k_Z(\delta)$). The centrifugal forces compensate the shadings in the suction flow (cf. FIGS. 54a–c) and thefriction losses as a result of bent flow duct regions (cf. Sections 8. and 9. of this chapter).

Solutions:

4. Bend for the abovementioned porous diaphragm Diaphragm*, as according to one or more of solutions 1. to 3., further characterized in that the geometry of the bend on the inside and outside is adapted to the profile of (potential) dead flows, in such a way that the effective dead flows are minimized and the fraction of $F_{F,0}$ which is caused by singularities tends toward zero in the bend, in order to initiate the branching-off of a bifurcation flow in or on the bend, whilst maximizing $F_D(p_B)$, according to FIG. 76, in this case solution I being characterized by relatively high flow speeds on the orifice side of the bifurcation backflow duct, but also by relatively high friction losses on the corresponding inner walls, whereas solution II is distinguished by relatively low flow speeds on the corresponding orifice, but also by low losses in the bifurcation flow duct, in both cases the dead flow is eliminated on the outside, in solution II the dead flow on the outer wall being virtually "overrun" by the bifurcation flow, whilst, in case I, additional friction on the inner wall and a risk of dead flows in the bifurcation flow duct are generated, and, according to the invention, it is claimed, irrespective of the individual (if appropriate, subordinate) advantages, that bifurcations are mounted over a wide region along the outer wall between the solutions presented in I and II, and, moreover, outside this preferred region in the bend center at the locations of the outer wall which extend by a maximum of five times the diameter of the bend flow, dK, beyond the region of the branches presented in solutions I and II (cf. FIG. 76c).

5. Optimization of Position/Orientation

Solutions:

5. Bend for the abovementioned porous diaphragm Diaphragm*, as according to one or more of solutions 1. to 4., further characterized in that a series of "single" and a "single-pair" bifurcation solutions, modified in comparison with EP-Application 94111991.9, Aug. 1, 1994, and PCT Application PCT/EP95/02882 of Jul. 19, 1995, with explicit inflow angles between the surface perpendicular and the transdiaphragm inflow direction are used according to FIG. 77 showing diagrams of controlled arrangements of transdiaphragm flow bends in the porous diaphragm Diaphragm* and resulting angle scenarios: a) symmetrical porous diaphragm with $\alpha_{x,1}=\alpha_{x,2}$, b) symmetrical porous diaphragm with $\alpha_{x,1}=\alpha_{x,2}=0°$, c) asymmetric porous diaphragm with $\alpha_{x,1}$ unequal to $\alpha_{x,2}$, d) symmetrical transdiaphragm flow duct ($\delta_1=\delta_2$), e) asymmetric transdiaphragm flow duct ($\delta_1=2*\delta_2$) and symmetrically arranged bifurcation backflow ducts (ie. $\beta_{D,1}=\beta_{D,2}$) and f) asymmetric central and bifurcation ducts for reinforcing $p_B=p_{B1}+p_{B2}$ and g) PD for $\delta_1=\beta_{D,1}=90°$, in the case of symmetrical porous diaphragms (here the symmetry being related to the transdiaphragm cross section, in which the x-perpendicular to the Diaphragm* surface lies in the cross-sectional plane under consideration and either the y-axis or z-axis or any axis in the x/y/z-translation space being the axis of symmetry) the angle $\beta_x$ is obtained between the inflow and outflow direction of the flow duct and the Diaphragm* is 0° to 90°, and surface the angle $\alpha_x$ between the x-perpendicular and the corresponding flow direction is $\alpha_x=90°-\beta_x$ (cf. FIG. 77a), and the angles $\alpha_x$ and $\beta_x$ are, here, quantities fixed by the flow deflection angle $\delta$ and the axes of symmetry of a transdiaphragm flow duct (cf. FIG. 77a), so that, when, before entry into (or after exit from) the adjacent bend region, the flow duct is at any angle to the (end) surface of a symmetrical Diaphragm*, the variation in the corresponding directions of flow is $\Delta\alpha_x=-\Delta\beta_x$ (cf. FIG. 77a), and the first (and last) flow deflection angle $\delta_1$ ($\delta_{nK}$) becomes (the $\Delta$ indicates, here, the law abiding relationship for any angle variations with respect to the relationship illustrated in FIG. 77a):

$$\delta 1 = \delta_{nK} = \delta + \Delta\alpha_x = \delta - \Delta\beta_x \qquad (104)$$

in which $\delta$ is the (constant or variable transdiaphragm) flow deflection angle of the bends of number $n_K$ in the main Diaphragm*, and these (like $\delta_1$ itself) can assume any values between $-180°<\delta<180°$ (cf. FIG. 77b), and the following applies to the special case $n_K=1$ $$\delta 1 = \delta + 2\Delta\alpha_x = \delta - 2\Delta\beta_x \qquad (105)$$

and the solutions comprise: the diagram, shown in FIG. 77a, of a "single-pair" solution with $\alpha_x>0$ and $\delta=\delta_1>\alpha_{x1}$ and $\alpha_{x1}=\alpha_{x2}$, which represents a syimnetrical flow duct or a detail of a corresponding Diaphragm*, the special case $\Delta\alpha_x=-\alpha_x=-\Delta\beta_x$ shown in FIG. 77b, so that the angle $\alpha_x$ between the x-perpendicular and the corresponding inflow direction is 0°, and the case in FIG. 77c in which, by contrast, $\delta=\delta_1<\alpha_{x1}$ (i.e. asymmetric), the "single-pair" solution shown diagrammatically in FIG. 77d, with $\delta_1=\delta_2$ and $\alpha_x=0$, by contrast, in FIG. 77e, with $\delta_1=2\alpha_x$ and $\delta_1=2*\delta_2$, and the "single-pair" solution shown in FIG. 77f in which the two bifurcation flows combine, before entering the original (conventional) evaporation chamber, to form a single bifurcation flow for the reinforcement of $p_B=p_{B1}+p_{B2}$.

6. Bifurcation Backflow Ducts and Overall Bending

The form (e.g. bend radius and length) of the bifurcation backflow ducts and the angle $\beta_D$ between the bifurcation in the case of flow branching-off and the direction of the bifurcation flow in the case of backflow into the original reservoir of the conventional evaporation chamber are particularly important for the control of $F_D(p_B)$. An oblique bifurcation outflow direction into the original chamber is often sufficient. The graphic solutions in EP-Application 94111991.9, Aug. 1, 1994, and PCT Application PCT/EP95/02882 of Jul. 19, 1995 (cf. the corresponding FIGS. 36 and 37) show relatively high angles $\beta_D$, whilst the transdiaphragm pulse is controlled by diffuser/nozzle transitions and varying angles for the purpose of reducing the suction effect shadings. Preferably relatively high $\delta$-values and relatively low $\beta_D$-values are required for high $F_D$ values.

This maxim results, however, in design constraints. The solutions in FIGS. 77c–f involve in various ways a reduction in the internal and external friction in bifurcation (back) flow and bifurcation bend, such that following angles $\beta_{D,i}$ (i>1) between the direction of flow before entry into the bifurcation bend and after exit are smaller in comparison with $\beta_{D,1}$, but, instead (with the exception of the solutions in FIG. 77f) have to allow for a longer flow path (duct). Finally, FIG. 77g shows a solution for high $v_{crit}$ (cf. equation (93)), in which $\alpha_x=0$, but the macroscopic (architectural) angle between two adjacent (conventional) chambers is equal to 90° because $\delta_1=\beta_{D,1}$, since, here, $\gamma_1=\delta_1=90°$ (see FIRST PART of the invention for $\gamma_1$, etc.). The solution in FIG. 77g has the advantage of a relatively small angle sum/$\Sigma$</, ie.

$$/\Sigma</=\Sigma/\alpha_{x,i}/+\Sigma/\delta_{D,i}/+\Sigma/\beta_{D,i}/ \quad (106)$$

Since, according to point 1.2. of the Technical Solutions of this section, $d_K$=preferably about $d_z$ ($d_z$=diameter or characteristic length of the central flow duct) and, according to equation (94), $d_z$ is dictated by $v_{crit}$, and $d_K$ and $d_z$ consequently control $q_{v,D,crit}$ and the effectively resulting conveying flow $q_v^{eff}$ of the process as a whole, the angle sum according to equation (106) is proportional to the energy losses of the diaphragm vapor flows of a porous diaphragm Diaphragm* as a result of internal frictional forces of the (preferably laminar) flow (cf. FIG. 70) and external friction due to an increase in the wall areas per transdiaphragm flow duct. As shown above, because of the necessary and sufficient materials, these losses may possibly be considerable, and an optimization of the angle sum/$\Sigma$</ is therefore an explicit constituent of the abovementioned process.

Figure 58:
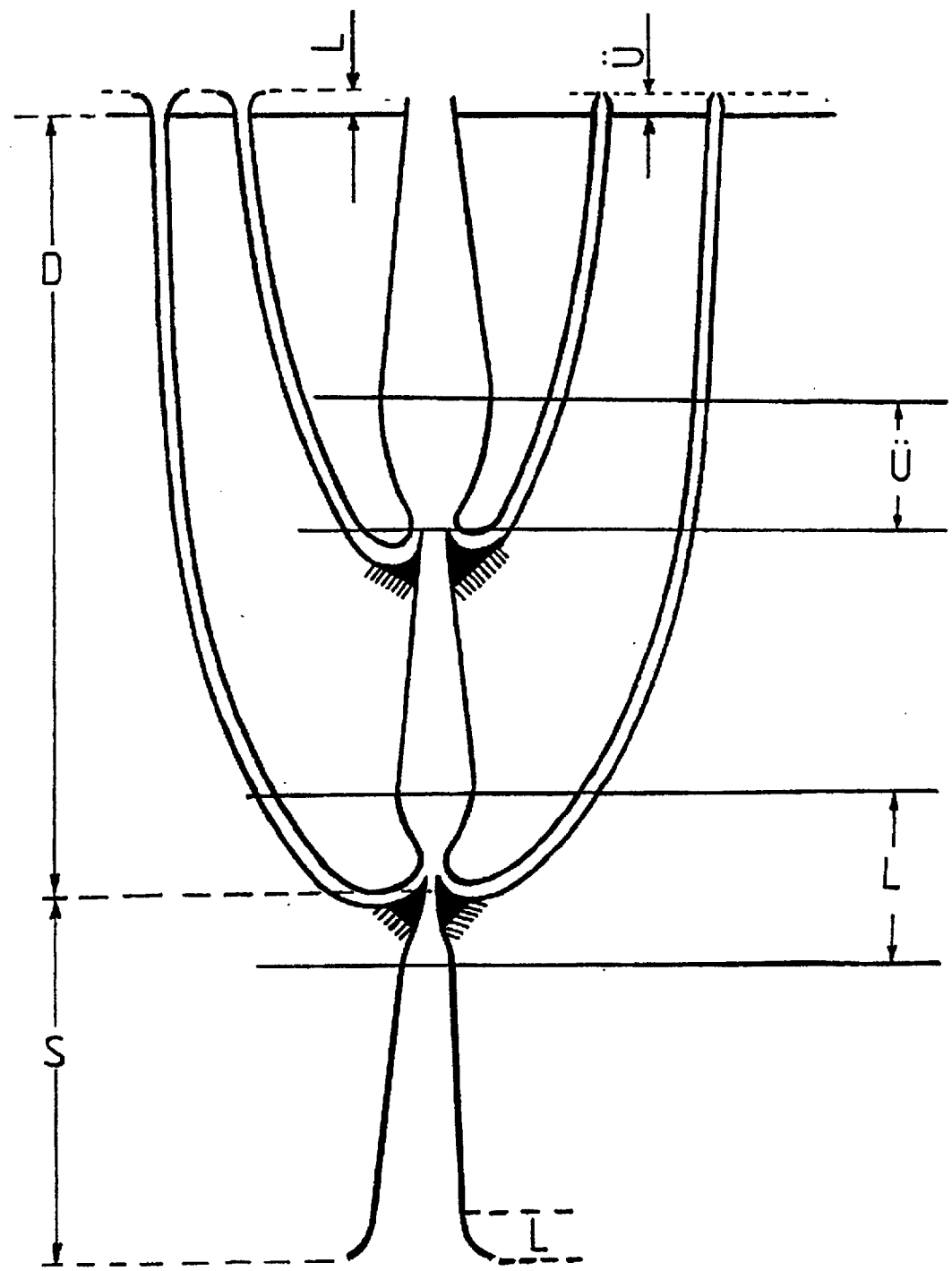
FIG. 58 As FIG. 57, here combined with bifurcations, and an indication of a transdiaphragm flow region driven by pressure flow (D) and by suction flow (S).

If the evaporation chambers are opposite one another at an angle $\gamma_1=\gamma_2=180°$ (cf. FIRST PART and FIG. 78a showing in 78a–78c the dilemma of the $\gamma=180°$—type of porous diaphragm to obtain small $\beta_D$—angles and which are possible only with relatively long bifurcation backflow ducts and/or very small $d_B$-diameters, since a suction effect otherwise occurs in the bifurcation backflow duct) and the resulting relatively small $p_B$-values. 78d to 78f show diagrammatically transdiaphragm flow ducts with bifurcations which, as a result of $\gamma<180°$, allow correspondingly reduced angle sums/$\Sigma$</.), under otherwise constant flow conditions either $F_{F,0}$ is relatively high or $p_B$ is relatively low on account of the relatively high (internal and external, ie. the) nonsingular friction of the diaphragm flows. FIGS. 58 and 78b show diagrammatically that, for $\gamma=180°$, relatively small angles $\beta$ require relatively long bifurcation tubes and/or nozzle diameters $d_B$ at the outlet of the bifurcation flow (FIG. 78c) and/or allow only very low pressures $p_B$ if the situation where the suction flow takes effect into the bifurcation backflow duct is to be avoided. By contrast, an elegant control of $p_B$ is permitted by Diaphragms* with an acute angle $\gamma$, ie. Diaphragms*, in which the x-perpendiculars to the front side and backside intersect at an angle which is identical or approximately identical to the architectural angle $\gamma$ (cf. FIRST PART and FIGS. 78d,e. Smaller angles $\gamma$ allow smaller angles $\beta_D\rightarrow 0$ and/or smaller angle sums /$\Sigma$</ and therefore better utilization of the transdiaphragm centrifugal forces. In FIG. 78d, $\alpha_{x,1}+\alpha_{x,n}$ is about (180°–$\gamma$), n=2, $\delta=0°$ and $\beta=80°$, whereas, in FIG. 78e, $\alpha_{x,1}=90°-\gamma/2$, $\delta_1=\delta_{12}=\gamma$, and $\beta=2\gamma$. A suitable choice of the macroscopic architectural angles $\gamma_1$, $\gamma_2$, etc. (cf. FIG. 78f) is therefore coupled directly to the resulting force of a (main) Diaphragm* and the resulting reduction in the risk of transdiaphragm condensation.

Solution:

6. Bend for the abovementioned porous diaphragm Diaphragm*, as according to one or more of solutions 1. to 5., further characterized in that the angles $\gamma$ of the two surfaces of a porous diaphragm Diaphragm* are opposite one another at an angle of 10° to 180°, the bifurcation backflow angles $\beta_{D,i}$ are in the range of 5° to 180° and/or the angle sum /$\Sigma$</ assumes values of between 20° and 360°.

7. Double Vortex and Excess Heating Capacity

Figure 79:
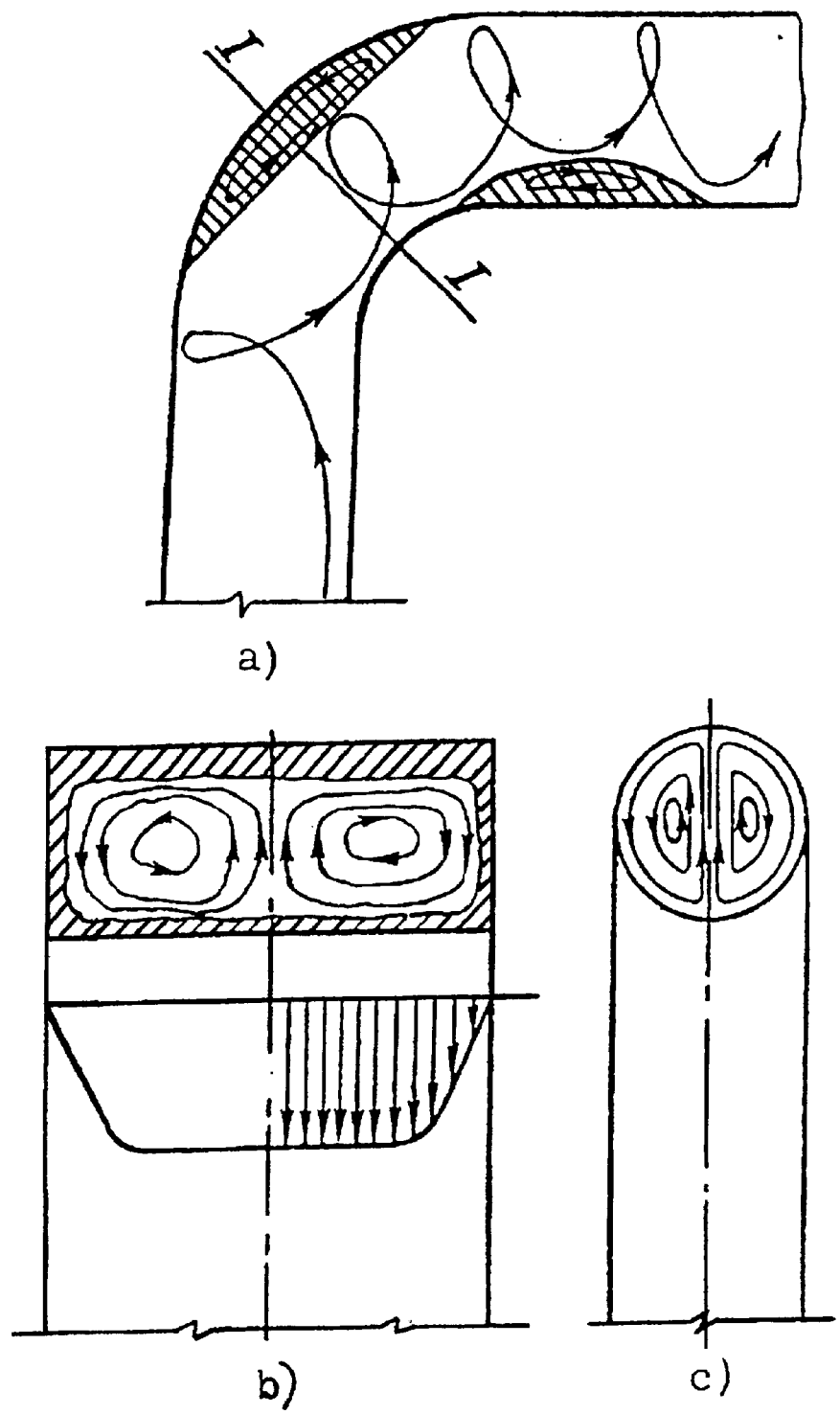
FIG. 79 Secondary vortex in flow bend at a) longitudinal section, b) transverse section in rectangular duct cross section and c) transverse section in circular duct cross section.

The occurrence of centrifugal forces and a flow boundary layer in the vicinity of the flow duct inner walls gives rise to a secondary flow shortly before, in the bent part of and after the flow, said secondary flow being superposed in the form of a double rotation on the main direction of flow parallel to the duct walls (see FIG. 79 showing secondary vortex (often: double vortex) in the (flow) bend 79a longitudinal section; 79b transverse section in the duct of rectangular cross section; 79c transverse section in the circular duct cross section). The secondary flow gives the flow lines, but at least part of the flow lines, a helical form and results in dead flows even when the roundings of a flow bend completely eliminates the vortices and dead flows as a result of convergence and divergence and as a result of the breakaway of parallel flow lines (cf. above) (FIG. 79). Since, as shown in this chapter, bent flow ducts and/or flow bends are employed even when no bifurcations are used for branching off a part flow quantity, the formation of corresponding secondary vortices and the resulting condensation possibilities is counteracted by:

Solution:

7. Bend for the abovementioned porous diaphragm Diaphragm*, as according to one or more of solutions 1. to 6., further characterized in that a sufficient partial excess heating capacity counteracts both on the outer wall in the bend and in the region of the inner wall downstream of the bend (FIG. 79), the partial excess heating capacity at these locations of bent flow ducts of the porous diaphragm Diaphragm* is superposed on transdiaphragm superheating for the provision of a transdiaphragm temperature gradient and is preferably supplied by induction or resistance heating.

8. Composite Flow bends, Flow duct Forms

The control of the ratio of $F_{F,0}$, caused by dead flows etc. (ie. flow vortices turbulences, vortex {streets} in the flow bend without a T variation, ie. caused by the bend of a flow duct), to form $F_0$, built up through flow convergences (which, although being caused by the dead flow, etc., are branched off via bifurcations and returned via backflow ducts) and through the resulting bifurcation backflows, is increased considerably by combining characteristic individual bends=fn ($\delta,\lambda$, etc., see above and further below) to form composite bends.

Figure 82:
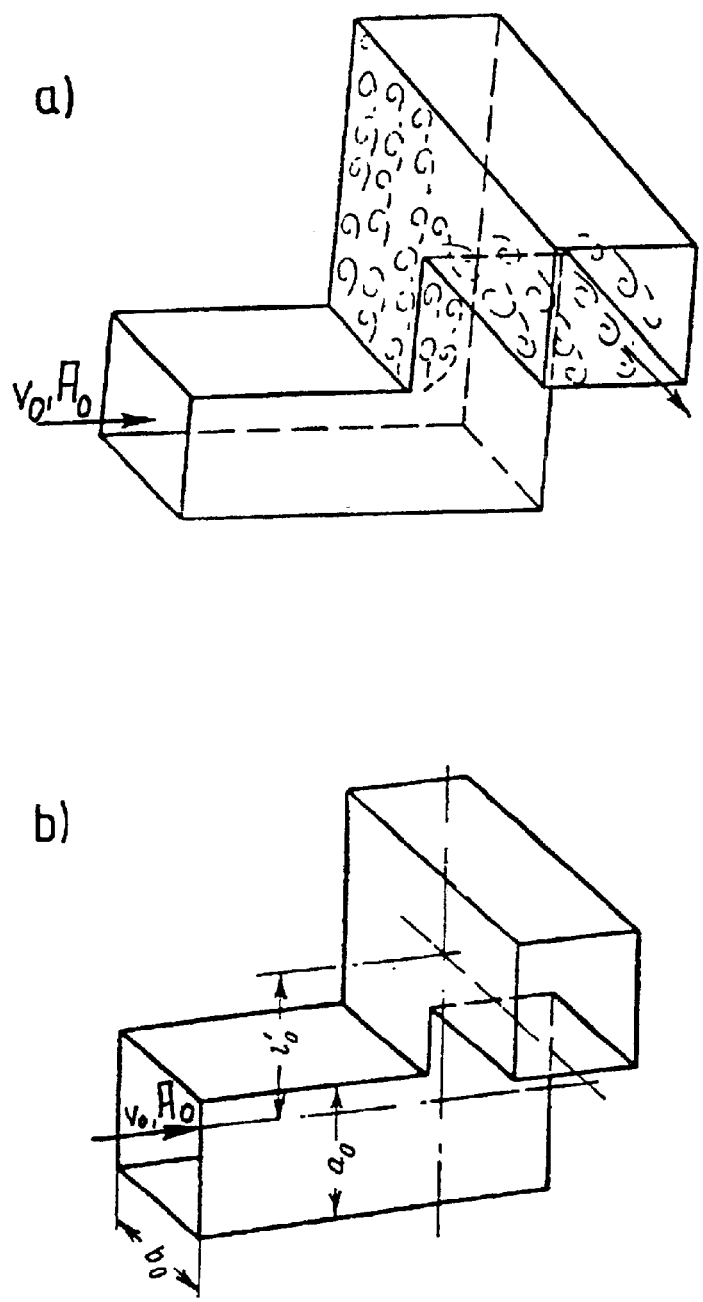
FIG. 82 Double bend with $\delta_1=\delta_2=90°$ in two different planes with $\delta(2)=90°$ and $l'_0/d_K=1$, where $l'_0$=intermediate piece of the corresponding individual bends.
Figure 83:
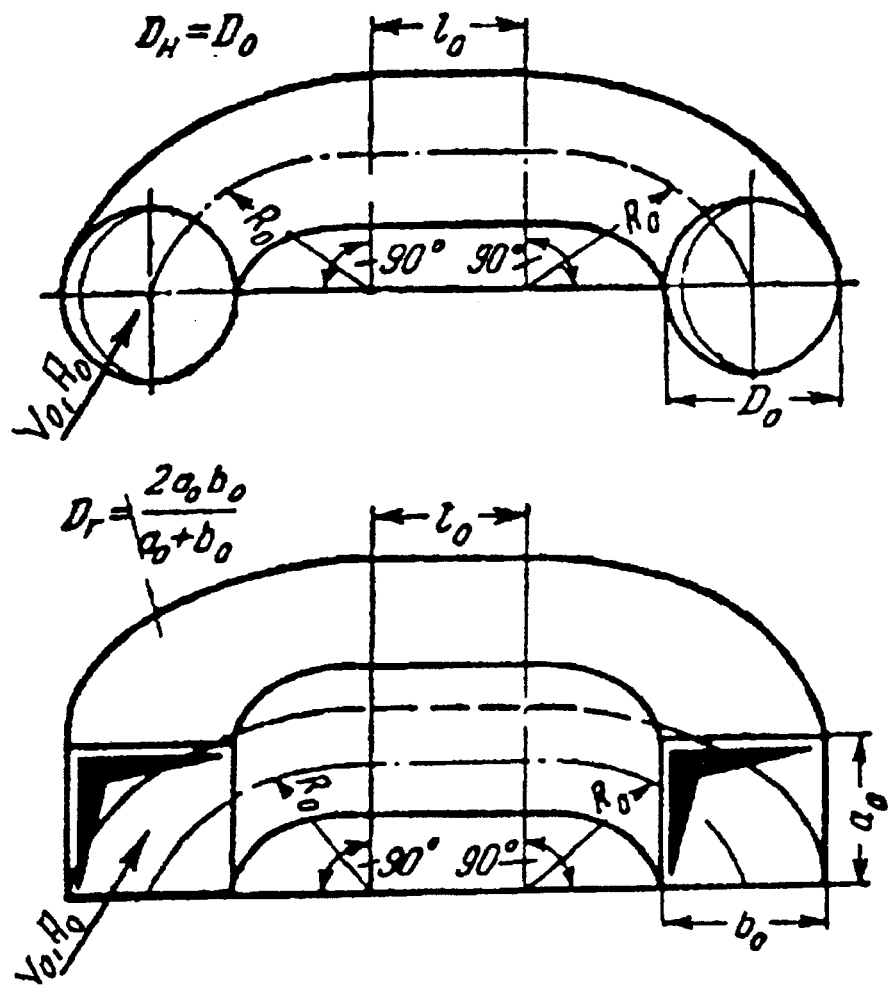
FIG. 83 Double bend, as in FIG. 74, here U-shape with intermediate piece $l_0$, $\delta_1=\delta_2=90°$ and $R_0/D_H=0.5$.
Figure 85:
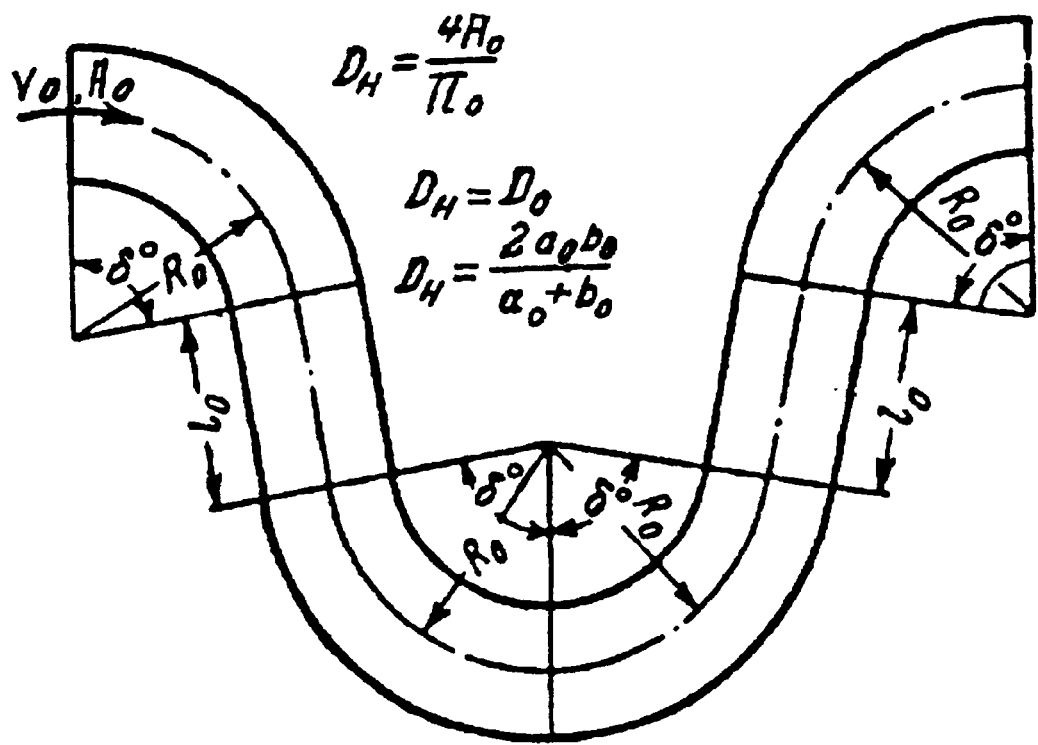
FIG. 85 U-bend designed with sinusoidal periodicity as a result of oppositely (ie. $+\delta/-\delta$) oscillating bend angles after passage through the intermediate piece of length $l_0$.

Solutions:

8. Bend for the abovementioned porous diaphragm Diaphragm*, as according to one or more of solutions: 1. to 7., further characterized in that the resulting bend combinations are used as $\Pi$-bends (see FIG. 80 showing flow spectrum in the P-bend with 80a $l_0/d_K$=approx. 0, 80b $l_0/d_K$=4.5 and 80c $l_0/d_K$=1. $l_0$=intermediate piece of the two associated individual bends of diameter $d_K$.) and/or Z-bends (see FIG. 81 showing Z-bend with flow spectrum (top), $l'_0/d_K=1.5$ (middle), both variants with $\delta=90°$, i.e. $\delta_1=\delta_2=90°$ and with (bottom) $\delta_1=\delta_2=30°$ and c) $l_0/d_K=$approx. 0.8), the diameters being $d(\Pi)_1=d(\Pi)_2$ and $d(Z)_1=d(Z)_2$ or $d(\Pi)_1>d(\Pi)_2$ and $d(Z)_1>d(Z)_2$ or $d(\Pi)_1<d(\Pi)_2$ and $d(Z)_1<d(Z)_2$, both, ie. $\Pi$ and z-bends, in a single, but arbitrary translation plane of the xyz-translation space of the Diaphragm* or a double bend, formed in each case from a $\Pi$-bend and a Z-bend according to the above $\delta_1$ and $\delta_2$-conditions, in two arbitrary translation planes of the xyz-translation space (see FIG. 82 showing double bend with $\delta_1=\delta_2=90°$ in two different planes with $\delta(2)=90°$ and $l'_0/d_K=1$, and $l'_0=$intermediate piece of the corresponding individual bends), the angle between the two arbitrary translation planes being capable of amounting to $0°<\delta(2)<360°$ (ie. $90°<\delta(2)<90°$ for the two bend sides), and all the resulting forms of the corresponding (rounded) U and ʃ (or S,) bends (mentioned hereafter only as ʃ-bends) (see FIG. 83 showing double bend, as in FIG. 74, here U-shape with intermediate piece $l_0$, $\delta_1=\delta_2=90°$ and $R_0/D_H \geq 0.5$ and FIG. 84 which is as FIG. 83, but in ʃ-shape with 84a in one and 84b in two flow planes, here $\delta_1=\delta_2=90°$ and $\delta(2)=90°$ after passage through the intermediate piece of length $l_0$.) and those composite bends, in which the number of characteristic individual bends, $n_{Cr}$, exceeds 2, ie. $n_{Cr}>2$, and the bend direction oscillates from concave to convex or from convex to concave according to any ncr (see FIG. 85 showing U-bend designed with sinusoidal periodicity as a result of oppositely (ie. $+\delta/\delta$) oscillating bend angles after passage through the intermediate piece of length $l_0$), often referred to as "sine bend") or does not oscillate, forming, in the last case, a, where appropriate, angular spiral in the xyz-translation space of the Diaphragm*, if no (otherwise bent or nonbent) connecting pieces connect with the combined bend segments, ie. the characteristic individual bends, and/or 9. Bend for the abovementioned porous diaphragm Diaphragm*, as according to one or more of solutions 1. to 8., further characterized in that, moreover, individual flow bends shaped into a trigonometric and cyclometric periodicity form (sine, cosine, tangent, cotangent, arcsin, arccos, arctan and arccot) and into a hyperbolic and/or area function, bent (transdiaphragm) flow ducts and/or (transdiaphragm) flow duct segments and flow bends combined into a circular, parabolic (eg. cubic, semicubic) and/or elliptic-function form and/or into any exponential and/or logarithmic function and/or correspondingly bent resulting flow ducts and/or duct segments are used and/or combined flow bends, flow duct segments and transdiaphragm.flow ducts composed into a roulette (cycloids, epicycloids, hypercycloids, both stretched ($c<r_K$), conventional ($c=r_K$) and/or intertwined ($c>r_K$), c being the circle center and $r_K$ being the circle radius here), into a circle involute, into crank mechanism-like movement curves, into harmonic vibrations (with superposition in any vibration direction), into spirals (Archimedean spirals, hyperbolic spirals, logarithmic spirals, any spiral) and/or into lemniscates or into any related form of these curves are used, all hitherto occurring characteristic, ie. individual flowbends being capable of being combined with one another, the possible combinations of the hitherto listed flow ducts and/or composite flow duct segments (or structural elements) having:
a) angular (ie. r=0) and or rounded bends with a bend angle of $0.01°<\delta<360°$ b) and/or any angles $\delta_1$, $\delta_2$ etc. between the combined segments,
c) and/or any angles $\delta(2)$ in any planes of the xyz translation space of a porous diaphragm Diaphragm*
d) and/or nonbent, concentric or nonconcentric intermediate and connecting duct segments (or else not)
(cf. FIGS. 86–90) and/or randomly designed transdiaphragm flow ducts or part ducts are used, the random course of which can be described by equation (59), as seen from any point within the xyz-translation space of a porous diaphragm Diaphragm* and/or 10. Bends and/or flow duct forms for the abovementioned porous diaphragm Diaphragm*, as according to one or more of solutions 1. to 9., further characterized in that the flow bends which are composed for the porous diaphragm Diaphragm* into a $\Pi$-, Z-, U-, ʃ- and/or concavely/convexly, etc. oscillating double bend comprise (unless noted otherwise, cf. eg. section 12. of this chapter) the following characteristic individual bends (and solutions, for better orientation, if appropriate with reference to the relevant section of this chapter):

1. Concentric and/or rectangular and/or arbitrarily angled double bends, composed of individual bends according to at least one of points 1.–8. in section 2 of the Technical Solutions of this chapter, and/or
2. Double bends, composed of individual bends with $r/D_H=0$ according to at least one of points 12.–21. in section 2 of the Technical Solutions of this chapter, and/or
3. Double bends, composed of individual bends with parallel and/or nonconcentric outer walls according to at least one of points 22.–30. in section 2 of the Technical Solutions of this chapter, and/or
4. Concentric and/or rectangular and/or arbitrarily angled double bends of $\Pi$- and U-shape with any $\delta$-angles per individual bend (cf. FIG. 83) in at least one of the possible designs according to at least one of points 1.–11. in section 2 of the Technical Solutions of this chapter, but here with a global loss figure which is determined according to the equation:

$$\zeta_D = A\zeta' = \zeta_{M,D} + \zeta_{F,D} \quad (107),$$

in which, here, the subscript D stands for the double bend and $\zeta'$ stands for the loss figure of the characteristic individual bend (see above), and the following applies to $\zeta_F$ (cf. equation (98)):

$$\zeta_{F,D} = [l_0/D_H + 0.035 R_0/D_H d]\lambda \quad (108),$$

so that the following is obtained for $\zeta_{M,D}$:

$$\zeta_{M,D} = \zeta_D - \zeta_{F,D} = A\zeta' - \zeta_{F,D} \quad (109),$$

in this case the values for A (for $l_0/D_H=0$) ranging from 1.0 to 3.0 (for $l_0/D_H \geq 1.0$), but preferably from 1.4 (for $l_0/D_H=0$) to 2.0 (for $l_0/D_H \geq 1.0$), so as to result, for $\Pi$- and U-bends with a technically smooth and rough inner wall in the porous diaphragm Diaphragm* of the abovementioned process, in a $\zeta_M$-value in the range of $0<\zeta_M<200$ (cf. section 3.), but preferably a range of $0<\zeta_M<10$ (cf. section 2.), and/or 5. Concentric and/or rectangular and/or arbitrarily angled double bends of Z and/or ʃ-shape in any plane (cf. FIG. 84a) with any $\delta$-angle per individual bend (cf. FIG. 74) according to at least one of the possible points 1.–11. in section 2 of the Technical Solutions of this chapter, their loss figure $\zeta_{M,D}$ being defined as in point 4. of this section (cf. equation (109)), but the coupling factor A extending from 6 (eg. for $l_0/D_H=0$) to 3 (eg. for $l_0/D_H \geq 1.0$), preferably from 3 (eg. for $l_0/D_H=0$) to 2 (e.g., for $l_0/D_H \geq 1.0$), and this resulting, for corresponding Z and ʃ-bends with a technically smooth and/or rough inner wall in the porous diaphragm Diaphragm*, in a global $\zeta_M$-value range of $0<\zeta_M<30$, but preferably a global $\zeta_M$-value range of $0<\zeta_M<20$, and/or 6. As point 5. (in this section), but for concentric and/or rectangular and/or arbitrarily angled double bends of Z- and/or ʃ-shape in any two (cf. FIG. 84b) planes with any dangles per individual bend (cf. FIG. 74) according to at least one of the possible points 1.–11. in section 2 of the Technical Solutions of this chapter, in which case the angle δ(2) between the two planes can assume any values $-180°<\delta(2)<+180°$, but the coupling factor A for the loss figure $\zeta_{M,D}$ extends from 5 (eg. for $l_0/D_H=0$) to 3 (eg. for $l_0/D_H \geq 1.0$), preferably from 2.5 (eg. for $l_0/D_H=0$) to 2 (e.g. for $l_0/D_H \geq 1.0$) and this results, for corresponding Z- and ʃ-bends with a technically smooth and/or rough inner wall in the porous diaphragm Diaphragm*, in a global $\zeta_M$-value range of $0<\zeta_M<25$, but preferably a global $\zeta_M$-value range of $0<\zeta_M<15$, and/or 7. Two concentric and/or rectangular and/or arbitrarily angled double bend series oscillating concavely/convexly or convexly/concavely (CC), if appropriate oscillating according to a trigonometric or related function, in any one (cf. FIG. 85) or in any two planes at any δ-angles per individual bend inat least one of the designs according to points 1.–11. in section 2 of the Technical Solutions of this chapter, the angle δ(2) between the any two planes being capable of assuming any values $-180°<\delta(2)<180°$, and their loss figure $\zeta_{M,D}$ being defined as in point 4 of this section (cf. equation (109)) with the difference that equation (108) now yields:

$$\zeta_{F,KK}=2*[l_0/D_H+0.035R_0/D_H\delta]\lambda \qquad (110),$$

and, in a similar way, the corresponding global A and $\zeta_M$-value ranges are obtained according to points 4. to 6. in this section, ie. are additionally increased by the factor 2, and/or 8. As 4. (in this section), but in at least one of the possible designs according to points 12.–21. in section 2 of the Technical Solutions of this chapter and with a loss figure value range of $0<\zeta_M<30$ (smooth inner walls) and $0<\zeta_M<55$ (rough inner walls), and/or 9. As 5., but in at least one of the possible designs according to points 12.–21. in section 2 of the Technical Solutions of this chapter and with a loss figure value range of $0<\zeta_M<45$ (smooth inner walls) and $0<\zeta_M<110$ (rough inner walls), and/or 10. As 6., between at least one of the possible designs according to points 12.–21. in section 2 of the Technical Solutions of this chapter and with a loss figure value range of $0<\zeta_M<40$ (smooth inner walls) and $0<\zeta_M<95$ (rough inner walls), and/or 11. As 7., between at least one of the possible designs according to points 12.–21. in section 2 of the Technical Solutions of this chapter and with a loss figure as according to point 4 (in this section No. 8), the difference being that the corresponding A, $\zeta_{M,D}$ and $\zeta_{F,D}$-values are obtained according to points 8.–10. and are increased additionally by the factor 2, and/or 12. As 4., but in at least one of the possible designs according to points 22.–30. in section 2 of the Technical Solutions of this chapter, and/or 13. As 5., but in at least one of the possible designs according to points 22.–30. in section 2 of the Technical Solutions of this chapter, and/or 14. As 6., but in at least one of the possible designs according to points 22.–30. in section 2 of the Technical Solutions of this chapter, and/or 15. As 7., but in at least one of the possible designs according to points 22.–30. in section 2 of the Technical Solutions of this chapter, and/or 16. Double bend according to the solutions in points 1. 15. of this section, but with a specific length $l_0$ (or $l'_0$) of the respective intermediate piece between the individual bends in question, specifically with intermediate pieces having at least one of the following relative lengths (cf. FIGS. 85 and 86)

Figure 86:
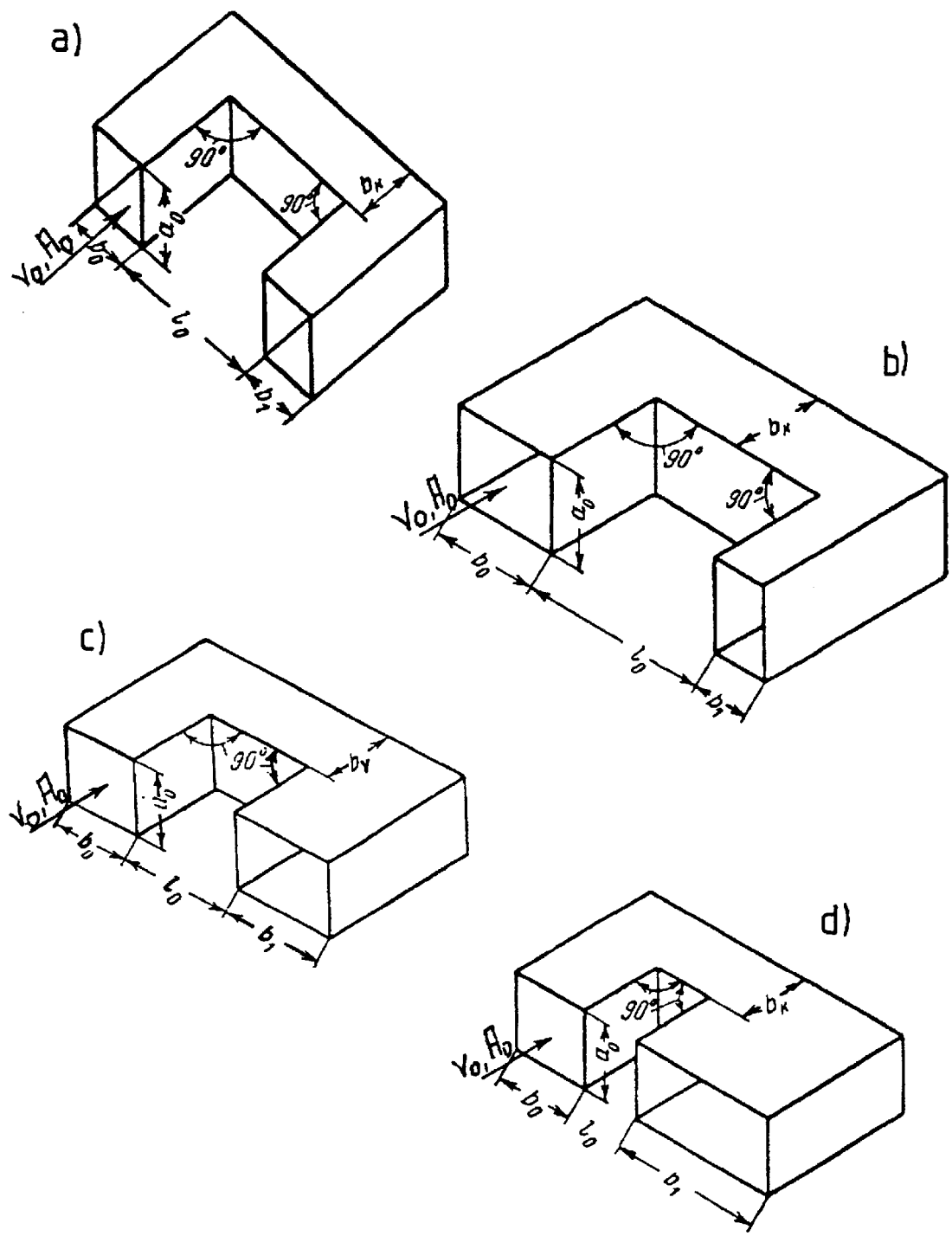
FIG. 86 Π-Bend with $2\delta=180°$ with a) identical and b)–d) varying inlet and outlet flow cross sections $A_0$ and $A_1$.
Figure 87:
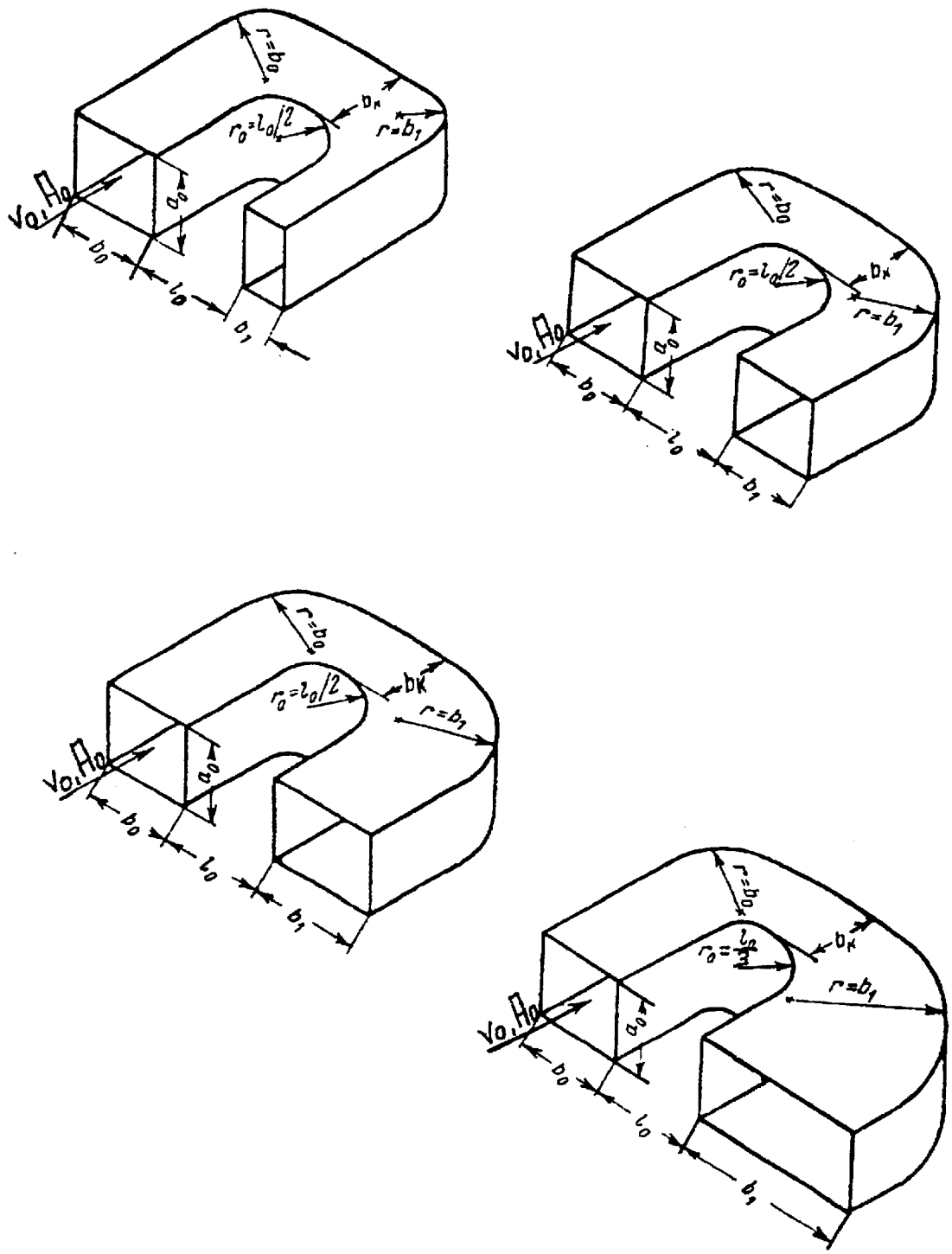
FIG. 87 As for FIG. 86, here U-bends but with b) identical flow cross section $A_0$ and $A_1$.
Figure 90:
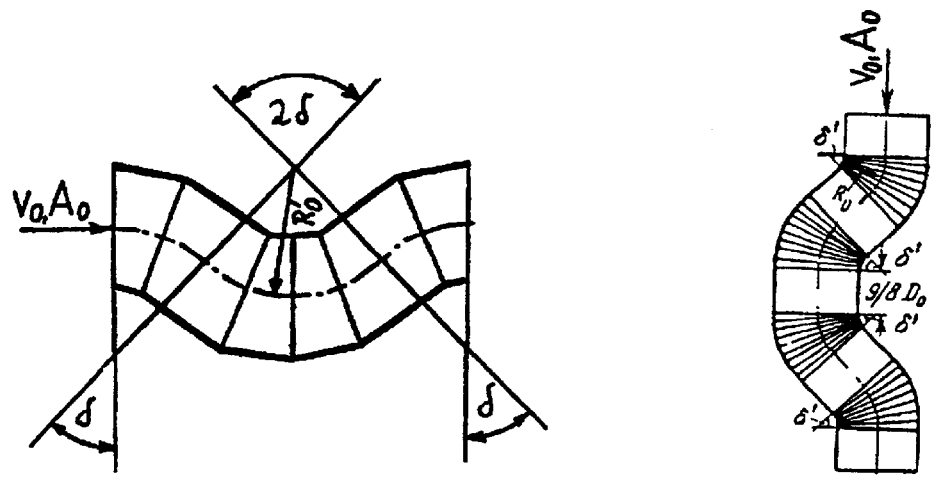

16.1 in the range of $0 \leq l_0 \leq 1000*D_H$, preferably in the range of $0.1*D_H \leq l_0 \leq 10*D_H$, in which $D_H$ is the hydraulic diameter at the inlet of the first individual bend and/or at the outlet of the last individual bend of the respective double bend (series), and/or the largest and/or the smallest hydraulic diameter of the respective double bend (series), and/or 16.2 in the range of $0 \leq l_0 \leq 1000*d_k$, preferably in the range of $0.1*d_k \leq l_0 \leq 10*d_k$, in which $d_k$ is the concentric diameter at the inlet of the first individual bend and/or at the outlet of the last individual bend of the respective double bend (series) and/or the largest and/or the smallest concentric diameter of the respective double bend (series), and/or 16.3 in the range of $0 \leq l_0 \leq 1000*b_0$, preferably in the range of $0.1*b_0 \leq l_0 \leq 10*b_0$, in which $b_0$ is the width at the inlet of the first individual bend and/or at the inlet of the last individual bend of the respective double bend (series), and/or the largest and/or the smallest width of the respective double bend (series), and/or 16,4, as 16.3., but of $0 \leq l_0 \leq 1000*a_0$, preferably in the range of $0.1*a_0 \leq l_0 \leq 10*a_0$, in which $a_0$ represents the corresponding heights, and/or 16.5, as 16.3., but of $0 \leq l_0 \leq 1000 A_0$, preferably in the range of $0.1*A_0 \leq l_0 \leq 10*A_0$, in which $A_0$ represents the corresponding areas, and/or 16.6 in the range of $0 \leq l_0 \leq 1000 * b_A$, preferably in the range of $0.1*b_A \leq l_0 \leq 10*b_A$, in which $b_A$ is the width at the outlet of the first individual bend and/or at the outlet of the last individual bend of the respective double bend (series) and/or the largest and/or the smallest width of the respective double bend (series), and/or 16.7, as 16.6, but of $0 \leq l_0 \leq 1000 * a_A$, preferably in the range of $0.1*a_A \leq l_0 \leq 10*a_A$, in which $a_A$ represents the corresponding heights and/or 16.8, as 16.6, but of $0 \leq l_0 \leq 1000 * A_A$, preferably in the range of $0.1*A_A \leq l_0 \leq 10*A_A$, in which $A_A$ represents the corresponding areas, and/or 17. As point 16. (in this section), but $l'_0$ instead of $l_0$, and/or 18. As points 16. and 17. (in this section), but $D_{H,K}$ instead of $D_H$, $d_{K,K}$ instead of $d_K$, $b_{0,K}$ instead of $b_0$, $a_{0,K}$ instead of $a_0$, $A_{0,K}$ instead of $A_0$, $b_{A,K}$ instead of $b_A$, $a_{A,K}$ instead of $a_A$ and $A_{A,K}$ instead of $A_A$, the quantities characterized here by the subscript K relating to the same or one of the adjacent intermediate pieces having the length $l_0$ (or $l'_0$) between two individual bends, and/or 19. As 18., the quantities characterized here by the subscript K relating in each case to the lowest value of the same or one of the adjacent intermediate pieces having the length $l_0$ (or $l'_0$) between two individual bends, and/or 20. As 18., the quantities characterized here by the subscript K relating in each case to the highest value of the same or one of the adjacent intermediate pieces having the length $l_0$ (or $l'_0$) between two individual bends, and/or 21. As one of the possible designs according to points 16.–20., but the intermediate pieces having the length $l_0$ (or $l'_0$) have any contractions and/or widenings within the intermediate piece itself, and/or 22. As point 21. (in this section), but the contractions and/or widenings are achieved by means of rounded or non-rounded surfaces of intermediate pieces, and/or
23. Double bend according to the solutions in points 1.–22. of this section, ie. Π-, Z-, U-, ʃ-shaped and/or concavely/convexly, etc. oscillating double bends, but with specific inner and outer radii $r(1)_{in}$ and $r(1)_{out}$ in each case of the first and of the second individual bend $r(2)_{in}$ and $r(2)_{out}$ in a rounded bend version and with the corresponding values $R_0(1)$, $R_0(2)$ as well as a specific global value Ro of the respective double bend (cf. FIG. 86 showing Π-Bend with $2\delta=180°$ with 86a identical and 86b–86d varying inlet and outlet flow cross sections $A_0$ and $A_1$, in which 86b $A_1/A_0=b_1/b_0=0.5$, 86c $A_1/A_0=b_1/b_0=1.4$ and 86d $A_1/A_0=b_1/b_0=2.0$.), in which:

23.1 the ratio of $r(1)_{in}/b_0$ is in the range of $0.001<r(1)_{in}/b_0<1000$, preferably in the range of $0.1<r(1)_{in}/b_0<10$, and/or 23.2 the ratio of $r(1)_{out}/b_0$ is in the range of $0.001<r(1)_{out}/b_0<1000$, preferably in the range of $0.1<r(1)_{out}/b_0<10$, and/or 23.3 as 23.1, but for $r(2)_{in}/b_A$, and/or 23.4 as 23.2, but for $r(2)_{out}/b_A$, and/or 23.5 the ratio of $R_0(1)/b_0$ is in the range of $0.001<R_0(1)/b_0<1000$, preferably in the range of $0.1<R_0(1)/b_0<10$, and/or 23.6 as 23.5, but for $R_0(2)/b_A$, and/or 23.7 as 23.1–23.5, but, instead of $b_0$ and $b_A$, the shortest width $b_K$ of the intermediate piece having the length $l_0$ (or $l'_0$), and/or 23.8.as 23.1–23.7, but, instead of the widths $b_0$, $b_A$ and $b_K$, the corresponding heights, hydraulic and/or concentric diameters and areas (cf. point 18. of the Technical Solutions in this section No. 8) and/or 23.9 the ratio of $R_0/l_0$ is in the range of $0.001<R_0/l_0<1000$, preferably in the range of $0.1<R_0/l_0<10$, and/or 23.10 as 23.9, but $l'_0$ here instead of $l_0$, and/or 23.11 The ratio of the radii $r_1/r_2$ both for the inner and for the outer wall is in the range of $0.001<r_1/r_2<1000$, preferably $0.1<r_1/r_2<10$, and/or 24. Technical Solutions according to points 1.–23. in this section No. 8, but in at least one of the possible Technical Solutions No. 1.–15. of section No. 3 of the Technical Solutions of this chapter (cf. FIGS. 87–90, showing in FIG. 87 (as for FIG. 86), but U-bends, here 86b with identical flow cross section $A_0$ and $A_1$, whilst 86a $A_1/A_0=b_1/b_0=0.5$, 86c $A_1/A_0=b_1/b_0=1.4$ and 86d $A_1/A_0=b_1/b_0=2.0$ as well as 86a, 86c and 86d $r_0=b_0$ and $r_1=b_1$, and in FIG. 88 S-Bend with 88a strip design with $R_0/D_H=1$ and without intermediate piece and 88b, 88c wavy overall walls with $R_0/D_H=0.7$ and $l_0=9/8\ D_0$, all the walls being parallel, n.b. δ' in 88b being 45° and in FIG. 89, as in FIG. 88 but in two flow planes, in each of the 4 cases δ(2) amounting to 90° and in FIG. 90 U-Bend in sinusoidal periodicity, as FIG. 85, but in a design according to FIGS. 88 and 89), and/or 25. as 24. (in this section), but with respective value ranges of the possible loss figures $\zeta_M$ which are increased in relation to point 24. by the factor 2 to 5.

9. Composite Flow Bends and Flow Duct Forms With Bifurcations (I)

Figure 91:
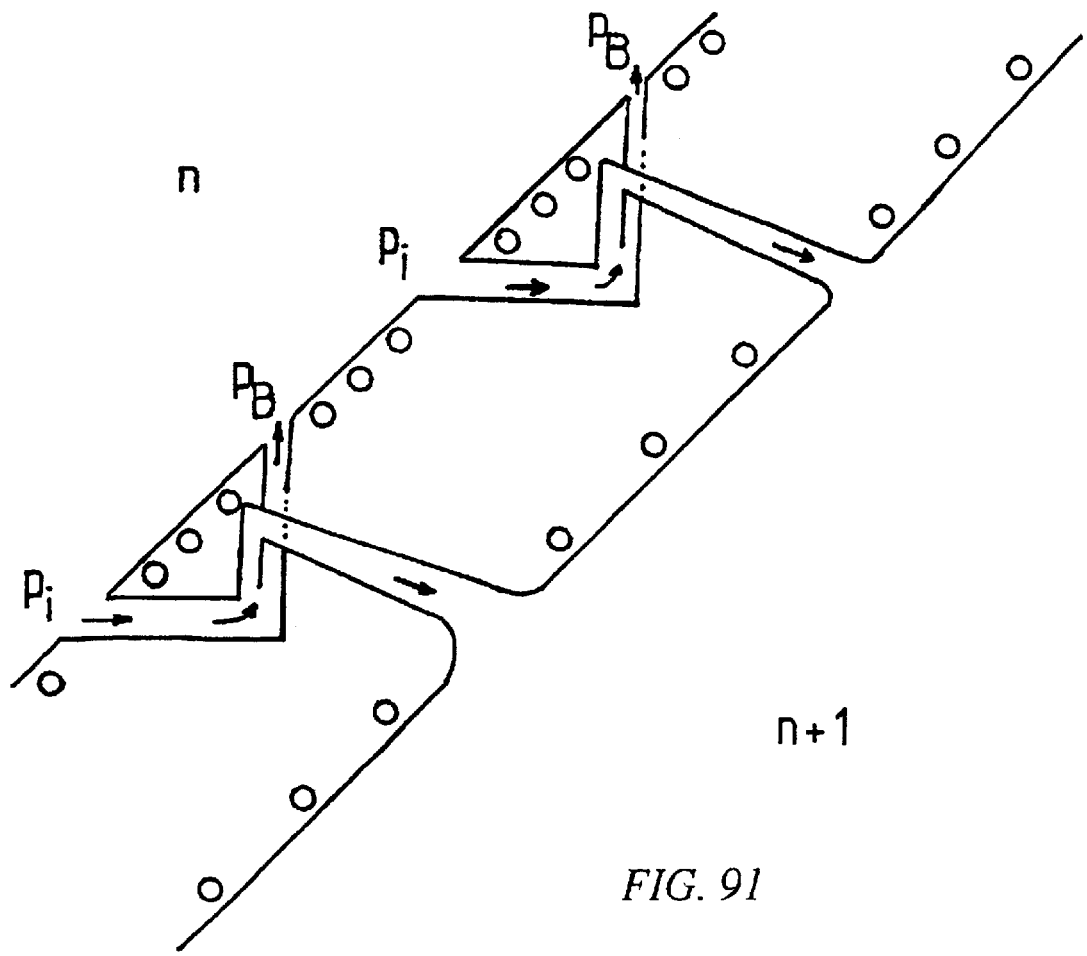
FIG. 91 Use of Z-bends for a thin-walled porous diaphragm as a result of a highly efficient bifurcation variant in the intermediate piece $l'_0$ (cf.
Figure 92:
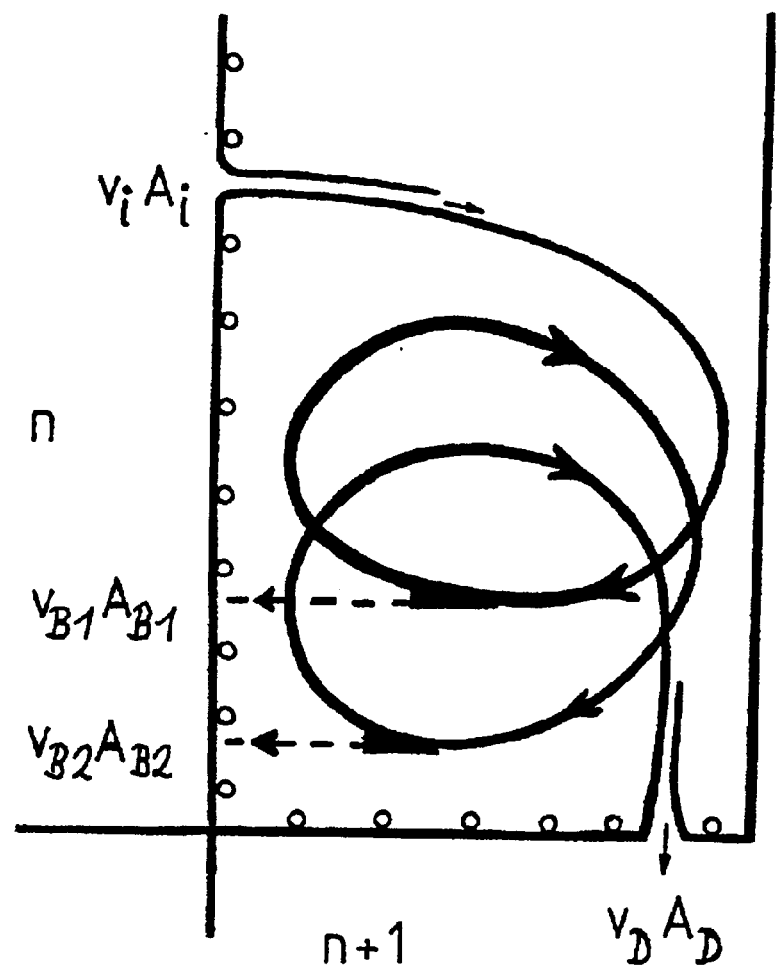
FIG. 92 Diagrammatic representation of minimum $\beta_D$-angles–>0 without feedback of the corresponding suction effect as a result of a transdiaphragm flow duct spiral (bifurcation backflow ducts represented by broken lines).

Solutions:

11. Bends and/or flow duct forms for the abovementioned porous diaphragm Diaphragm*, as according to one or more of solutions 1. to 10., further characterized in that these are also used in combination with randomly designed transdiaphragm flow ducts and/or part ducts consisting of all hitherto mentioned bend variants and/or resulting flow duct segments (ie. with 0<r<oo, cf. points 1. 4.) and with all nonrandom bend and/or flow duct segments mentioned in solution 9 (ie. with 0<r<oo, cf. points 1. 4.) for transdiaphragm material conveyance, and/or 11.1 Bends and/or flow duct forms for the abovementioned porous diaphragm Diaphragm*, as according to one or more of solutions 1. to 11., further characterized in that local turbulences and/or convergences of flow conditions provide a preferred heating, if appropriate cooling of the transdiaphragm vapor flow and/or a branching-off of part flow quantities via bifurcations and bifurcation backflow ducts, and all hitherto mentioned flow ducts, including flow duct spirals and meander-like flow ducts with a symmetrically and/or asymmetrically shaped outer circumference and/or to form (integral) parts thereof comprise at least one Π- (and/or U-) and/or Z- (and/or ʃ-) shape, and any (eg. trigonometric) periodicity and function forms of a flow duct consist of the two successive individual bends composed to form Π-, U- Z- and/or ʃ-, bifurcations are mounted in the region between two corresponding and/or downstream of corresponding Π- and/or Z-bends in the region of high flow convergences and return the bifurcation backflow via bifurcation backflow ducts to the front side, ie. the inflow side of the Diaphragm*, such inflow-side bifurcations and/or bifurcation backflow ducts arepreferably characterized by small angles $\beta_D$ (cf. FIGS. 80ff. and FIG. 91 showing use of Z-bends for a thin-walled porous diaphragm as a result of a highly efficient bifurcation variant in the intermediate piece $l'_0$ (cf. FIG. 4a) and/or 11.2 Bends and/or flow duct forms for the abovementioned porous diaphragm Diaphragm*, as according to one or more of solutions 1. to 11.1., further characterized in that the axis of symmetry or reference axis of the outer circumference of spiral- and/or meander-like flow ducts and flow duct integral parts lies in an x, y and/or z and/or y/z, x/z and/or x/y and or x/y/ztranslation direction, in such a way that small branch-off angles $\beta_D$ occur without a coupling effect between dp/dx and the resulting suction effect in the central flow, on the one hand, and the suction effect and bifurcation flow, on the other hand, specifically also for γ=180° (cf. FIG. 92 showing diagrammatic representation of minimum $\beta_D$-angles→0 without feedback of the corresponding suction effect as a result of the use of a transdiaphragm flow duct spiral. Bifurcation backflow ducts represented by broken lines).

10. Composite Flow Bends and Flow Duct Forms With Bifurcations (II)

Π-, U-, Z- and ʃ-shaped double bends are elementary structural parts of the more complex transdiaphragm flow duct combination, since they (i) combine the direction of the transdiaphragm vapor flow backward and forward, consequently (ii) control by local manipulation each of the orientations of the vapor flow which are possible in the transdiaphragm xyztranslation space and (iii) by this manipulation with the use of bifurcations allow perfect control of $F_F$, $F_D$ and of the transdiaphragm condensation which otherwise results, since the bifurcations also reduce the opposite vortices. A double bend, (or a corresponding variant/derivative as a consequence of varying amounts of the angles $\delta_1$ and $\delta_2$ and/or δ(2) or as a consequence of varying roundings, intermediate pieces, intermediate piece and end piece lengths, cf. above and further below) is characterized in terms of the essential features of its internal flow profile, for example, by the relative distance $l_0/d_K$ (or $l_0/b_0$, etc., cf. last section of the Technical Solutions of this chapter), $l_0$ being the length of the intermediate piece which separates the individual bends of the respective double bend from one another.

In the backward modification, both (abrupt) Π- and (rounded) U-bends are used. FIG. 80 shows 3 to form a Π-bend with $l_0/d_K$=approx. 0, $l_0/d_K$=4.5 and $l_0/d_K$=1 as well as the resulting flow ratios for a constant (ie. given) Re number and $\delta(=\delta_1=\delta_2)=90°$.

Solutions:

12. Bends and/or flow duct forms for the abovementioned porous diaphragm Diaphragm*, as according to one or more of solutions 1. to 11.2., further characterized in that for $l_0/d_K$=approx. 0, the flow executes a local rotation through 180° and the breakaway of the flow from the inner wall after the rotation of the flow through 180° is particularly intensive and $F_{F,0}$ achieves a local maximum value here, the preferred region for bifurcation branches is on the outside of the outflow region (outflow part duct) of the Π-bend (position xxxxx, FIG. 80*a*), but the overall solution, ie. the optimized integration of all the claimed process options over the present invention decides on the operative $F_{D,0}/F_{F,0}$ ratio, and a fairly accurate doubling of the bend-local individual $F_{F,0}$-values is achieved by composing two individual bends to form one Π-bend, in that the double bends are connected by means of an intermediate piece of the length $l_0/d_K$=4.5 or greater, and, under these conditions, two equally preferred regions occur locally for the location of the bifurcations (cf. position xxxxx, FIG. 80*b*, cf. FIGS. 70 and 71), for an intermediate value range $l_0/d_K$ of the order of magnitude of $l_0/d_K$= approx. 1 the flow, after passing through the first bend, does not succeed in spreading out again before it enters the second bend, and, for this reason, under the condition $l_0/d_K$=approx. 1, the flow forms a continuous curve and, in the outflow duct region, breakaways of the flow from the walls, in particular from the inner wall, for example as a result of turbulences, are virtually absent (FIG. 80*c*), bend-local minimum $F_{F,0}$-values are therefore obtained for a Π-bend with $l_0/d_K$=approx. 1 and the preferred bifurcation region is located exactly in the middle of the intermediate piece having the length $l_0$, the flow conditions in Ubends are similar to the flow conditions (shown here) in Π-bends, but the relative pulse losses by $F_{F,0}$ in a U-bend are lower, as compared with a similar Π-bend, and, depending on the operative Re number, with a varying δ the location of the maximum dead flow, turbulence and convergence and therefore the location of the optimal branching-off of a part flow quantity via a bifurcation are displaced within the Π- or U-bend region, and, for this reason, Π- and U-bends are used in the abovementioned porous diaphragm Diaphragm* over a wide range, ie. $0.001 < l_0/d_K < 1000$, but preferably (if only for reasons of efficient space utilization) in a range of $0.1 < l_0/d_K < 10$.

11. Composite Flow Bends, Flow Duct Forms and Bifurcations (III)

By contrast, Z- and ʃ- (shaped) flow double bends are used for forward modification (reciprocally to the flow conditions in Π- and/or U-(like) double bends). FIG. 81*a* shows a Z-bend with $l'_0/d_K$=1, ie. when the second bend is mounted in the vicinity of the maximum turbulence of the first bend. In contrast to the Π- and/or U-bends, the breakaways of the flow from the inner walls (of the intermediate piece and of the outflow duct) are then at maximum, for $l'_0/d_K$=in the neighborhood of 1, as a result of the turbulence/vortex development there, and consequently both the local contribution to $F_{F,0}$ and the convergence necessary for building up $p_B$ reach a maximum value here.

Figure 93:
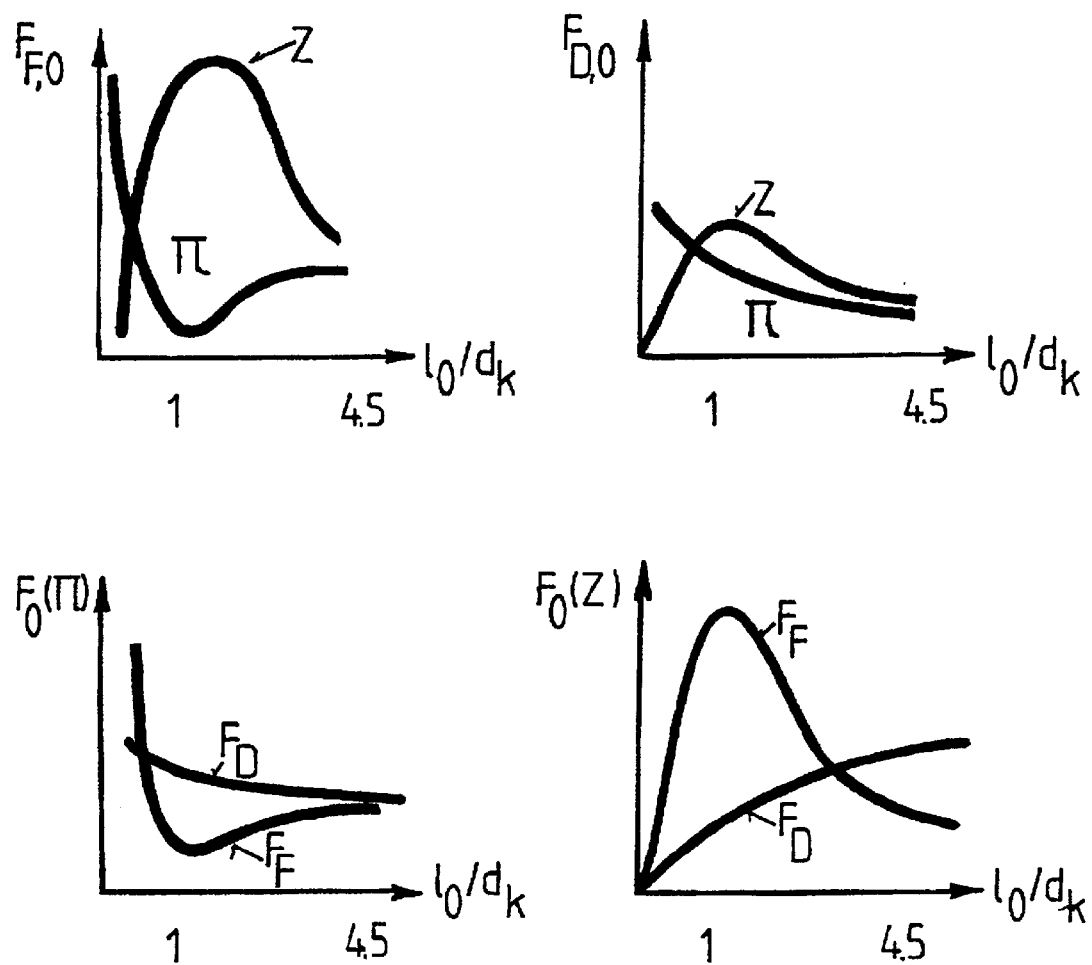
FIG. 93 Semi-quantitative summary of $\zeta$, resulting $F_{F,0}$ values and the potential yield of resulting flow convergences for the buildup of $F_{D,0}$ via bifurcations in Π-shaped and Z-shaped double bends.

Solutions:

13. Bends and/or flow duct forms for the abovementioned porous diaphragm Diaphragm*, as according to one or more of solutions 1. to 12., further characterized in that the preferred region for bifurcations in Z- and ʃ-bends with $l'_0/d_K$=approx. 1 (ie. in the region of 1) is on the outside of the outflow duct (as in the case of Π- and U-bends with $l_0/d_K$=approx. 0), whereas, for $l'_0/d_K$= (approx.) 0, it is minimal and does not permit any specific solution for branching off a part flow quantity via bifurcations, for higher values, ie. $l'_0/d_K > 0$, in the Z- and/or ʃ-bend, the bifurcation possibilities are shifted increasingly into the intermediate piece of length $l'_0$ at the expense of the bifurcation (back)flow branched off by outflow part duct branches, whilst the potential for the increase of $F_{D,0}$ falls absolutely, but, depending on the overall solution, rises relatively (to $F_{F,0}$) (cf. FIG. 93 showing semi-quantitative summary of ζ, resulting $F_{F,0}$-values and the potential yield of resulting flow convergences for the buildup of $F_{D,0}$ via bifurcations in Π-shaped and Z-shaped double bends), since $F_{F,0}$ also decreases as a result of decreasing flow vortices/flow convergences, and consequently, according to the qualitative summary of the $F_{F,0}$ and $F_{D,0}$-values as a function of $l'_0/d_K$ in FIG. 93, the Z- and ʃ-bends are therefore used in the porous diaphragm Diaphragm* over a wide value range $l'_0/d_K$, ie. $0.001 < l'_1/d_K < 1000$, but preferably, (particularly for reasons of transdiaphragm condensation control) in the range of $0.1 < l'_0/d_K < 50$.

12. Composite Flow Bends and Flow Duct Forms With Bifurcations (IV)

Deviations from the "pure" backward (i.e. Π- and U-) and forward modifications (ie. Z- and ʃ-modification) involve displacing the 2nd double bend part, i.e. the respective outflow duct, into a 2nd plane, in such a way that an overlap of the Π-variant with the Z-variant (and/or of the U-variant with the ʃ-variant) for the case $\delta(2)=90°$ or $\delta(2)=-90°$ becomes possible. The convergences of the basic flow which coexist with the turbulences shown in FIG. 82 are located a) on the outside of the intermediate piece having the length $l'_0$ and on the outside of the outflow portion. 2-plane solutions of the Π- and U-bends show a reduced minimum, whilst 2-plane solutions of the Z- and Π-bends have a reduced maximum in the local contribution to $F_{F,0}$, before they approach, at higher $l'_0/d_K$-values, the limit-value contribution which is given by double the contribution of two corresponding individual bends.

Solutions

14. Bends and/or flow duct forms for the abovementioned porous diaphragm Diaphragm*, as according to one or more of solutions 1. to 13., further characterized in that 2-plane solutions of the elementary double bends are used in the porous diaphragm Diaphragm*, preferably in the forward modification, since they shorten the length of the intermediate piece, $l'_0$, for optimizing the local contribution to the ratio $F_{F,0}/F_{D,0}$, hence reduce the overall value of $F_{F,0}$ superproportionally to the overall value of $F_{D,0}$, whereas, in the backward modification (ie. Π- and U-bends), they contribute to the increase of transdiaphragm state gradients, and/or 14.1 Bends and/or flow duct forms for the abovementioned porous diaphragm Diaphragm*, as according to one or more of solutions 1. to 14., further characterized in that 2-plane solutions of the Π- and U- and of the Z- and ∫-shaped double bends are used over a wide δ(2) range, ie. −180°<δ(2)<180°, preferably −90°<δ(2)<90° (on both sides), and the range of operative relative lengths extends over $0.001 < l'_0/d_K < 1000$, and/or, in a similar way to solution I in FIG. 76, the preferred region for bifurcations in 2-plane solutions of the Π-, U-, Z- and ∫-bends having a given length $l'_0/d_K$ is in the bend of the 2nd bend, in so far as the amount of the angle δ(2) is relatively high, or, in the case of low δ(2)-values, ie. in so far as the δ(2) contribution is relatively low, for example on the outer wall of the intermediate piece and on the double-bend outflow part duct, the actual preference for the bifurcation location depends on the relative length $l'_0/d_K$ used for the intermediate piece or intermediate pieces (cf. FIGS. 80–90), and/or 14.2 Bends and/or flow duct forms for the abovementioned porous diaphragm Diaphragm*, as according to one or more of solutions 1. to 14.1, further characterized in that, for $l'_0/d_K$=approx. 1, the location for bifurcation part flow branches is preferably on the outside of the intermediate piece of 2-plane double bends, since this is already the case for Π- and U-bends in one plane, whereas, for Z- and ∫-shaped double bends in 2 planes, the location of the preferred bifurcation part flow branch, with an increasing amount of the angle δ(2), is displaced to a decreasing part of the outer wall (opposite, as seen from the inflow) of the corresponding outflow duct and to an increasing part of the side wall, and/or, for all solutions, bifurcations in nonconcentric flow ducts are used both on the outer wall and on the side wall regions of the outflow duct for branching off a part flow quantity, and the choice of the preferred side wall depends on the ratio $F_F/F_D$ required.

13. Diffuser Bends, Bent Diffusers

A reduction of the (local contribution to the) $F_{F,0}$ value is achieved, furthermore, by a variation, continuous in contrast to the bend with parallel outer walls, of the ratio of the outflow cross section $A_A$ to the inflow cross section $A_0$ into a bent flow duct region, as is the case for diffusers (cf. FIG. 28ff.) and nozzles. For $A_A/A_0 > 1$, the formation of turbulences increases, but, in the case of a constant conveying and/or mass flow ($Q_{v,0}$ and/or $Q_{m,0}$), the corresponding flow speed also decreases and, in turn, compensates the pressure losses by means of speed losses. Below a given limit $D_A/D_0$, the reduction of the $F/_{F,0}$ value as a result of speed reduction is greater than the increase of $F/_{F,0}$ due to the widening of the flow cross section and resulting (additional) turbulences. Within a limited range $D_A/D_0(d)$, therefore, the global losses $F_F$ can be reduced, ie. the ratio $F_D/F_F$ increased by a variation of the bend cross section.

Solutions:

15. Bends and/or flow duct forms for the abovementioned porous diaphragm Diaphragm*, as according to one or more of solutions 1. to 14.2, further characterized in that the minimal losses for δ=90° with r=0 are achieved in the case of a ratio of the diffuser cross sections of $1.19 < D_A/D_0(δ=90°) < 2.01$, whereas, in rounded parallel and concentric flow bends (ie. r>0), the optimal $D_A/D_0$-value is about 1.0 or even <1.0, and, depending on the bend angle of a diffuser and/or diffuser/nozzle solution, for the purpose of optimizing the flow conditions, for example for the efficient branching-off of a bifurcation flow, continuous variations in cross section are carried out over a very wide range, ie. for deflections of −180°<δ<+180°, preferably −90°<δ<+90°, variations in cross section in the range of $0.05 < D_A/D_0$ (−90°<δ<+90°)<100, but preferably in the range of $0.5 < D_A/D_0$ (−180°<δ<+180°)<10 (cf. diffuser solutions), and, in this case, the production methods of section No. 3 of the Technical Solutions of this chapter are preferably used.

Whereas the loss figures ζ in bent flow regions for $D_A/D_0 > 1$ remain relatively constant in a specific range, the variations in the loss figure ζ for $D_A/D_0 < 1$ and for $D_A/D_0 >> 1$ are of great importance, and, since the side ratio (rounded: ellipse and/or circle radius ratio) of the flow duct, a/b or $a_0/b_0$, is of great importance for $F_{F,0}$ and $F_F$ and for the resulting ratio $F_F/F_D$ (a ($a_0$) being the height of the flow duct, cf. above) and, for rising values $a_0/b_0 > 1$, $F_F$ and $F_F/F_D$ decrease, whilst $F_F$ and $F_F/F_D$ increase for falling values ie. $a_0/b_0 < 1$ (cf. 2 diffuser types in point 14.2 of the Technical Solutions for diffusers), the following are used:

Solution:

15.1 Bends and/or flow duct forms for the abovementioned porous diaphragm Diaphragm*, as according to one or more of solutions 1. to 15., further characterized in that the flow worm in the (idealized) flow cone is used not only for reasons of better space utilization (cf. above), but also for controlled local (if appropriate, discontinuous) modifications in cross section (eg. via nozzles), with and without the branching-off of a part flow via bifurcations, for the purpose of manipulating wide ranges of the $F_D/F_F$ ratio.

14. Transdiaphragm Bifurcation Scenarios/planar

Figure 94:
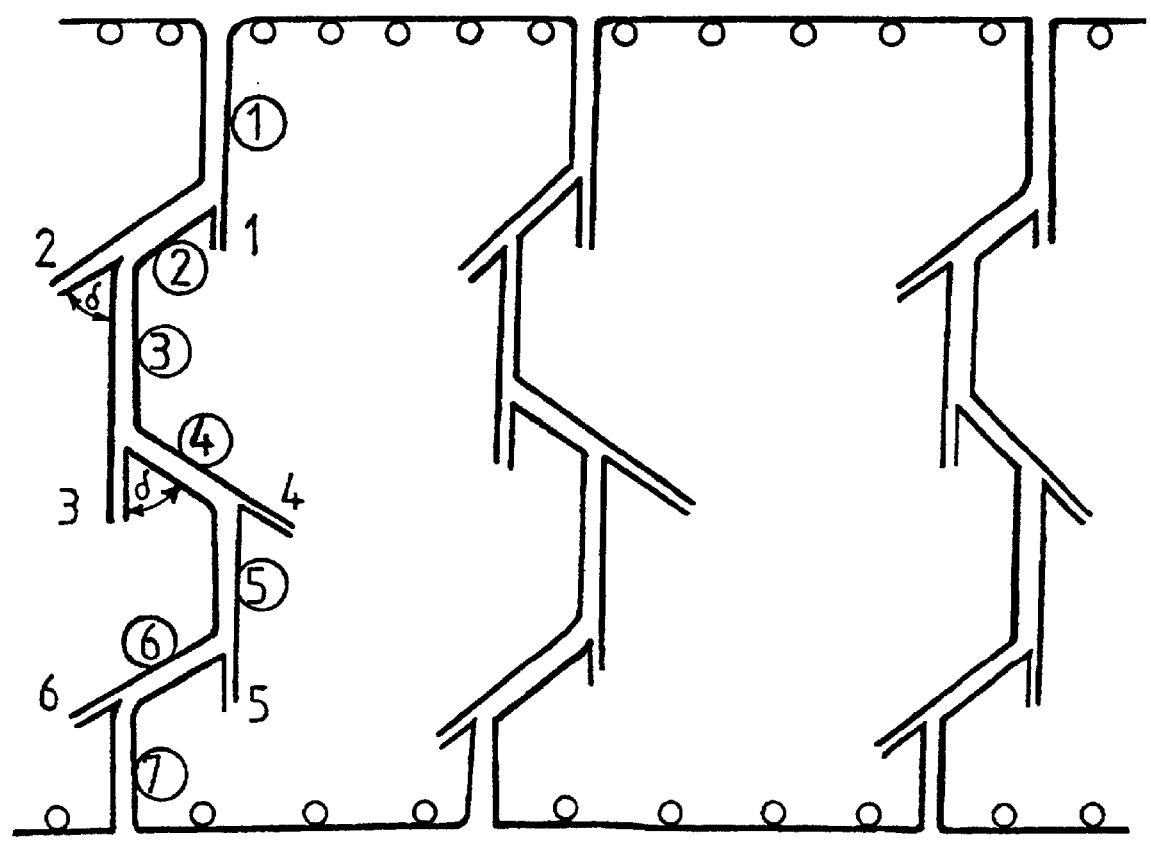
FIG. 94 Diagram of a symmetrical Diaphragm* with high bifurcation density as a result of mounting in series per transdiaphragm flow duct (cf.
Figure 95:
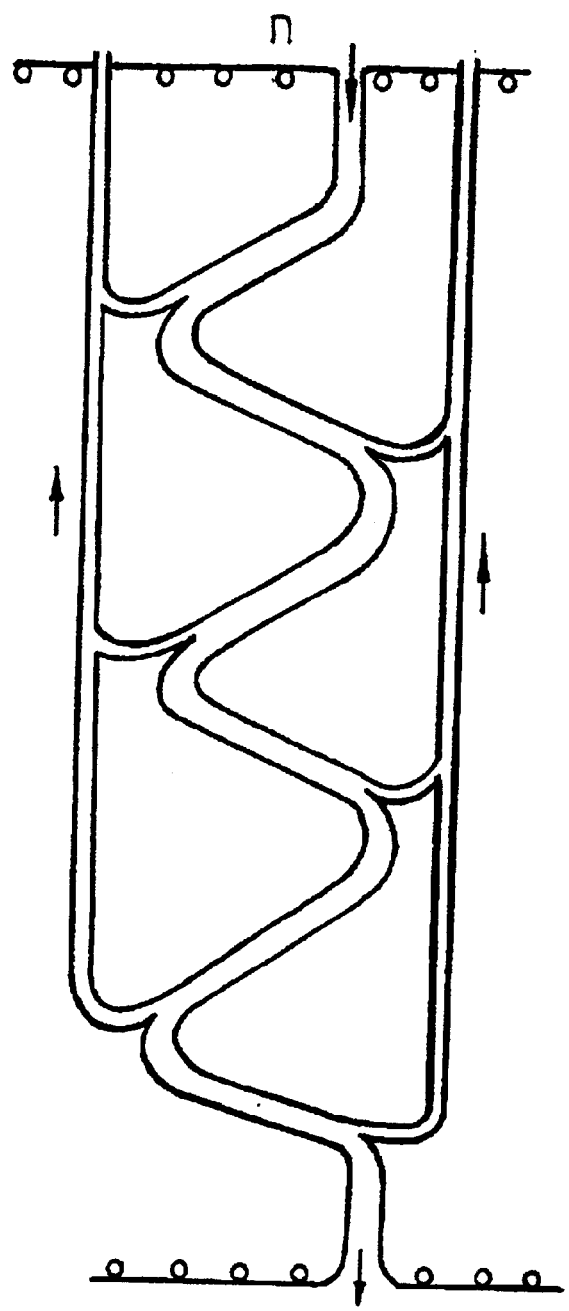
FIG. 95 As FIG. 94, here with a high bifurcation backflow duct density and consequently relatively high $F_{F,0}$ values.
Figure 96:
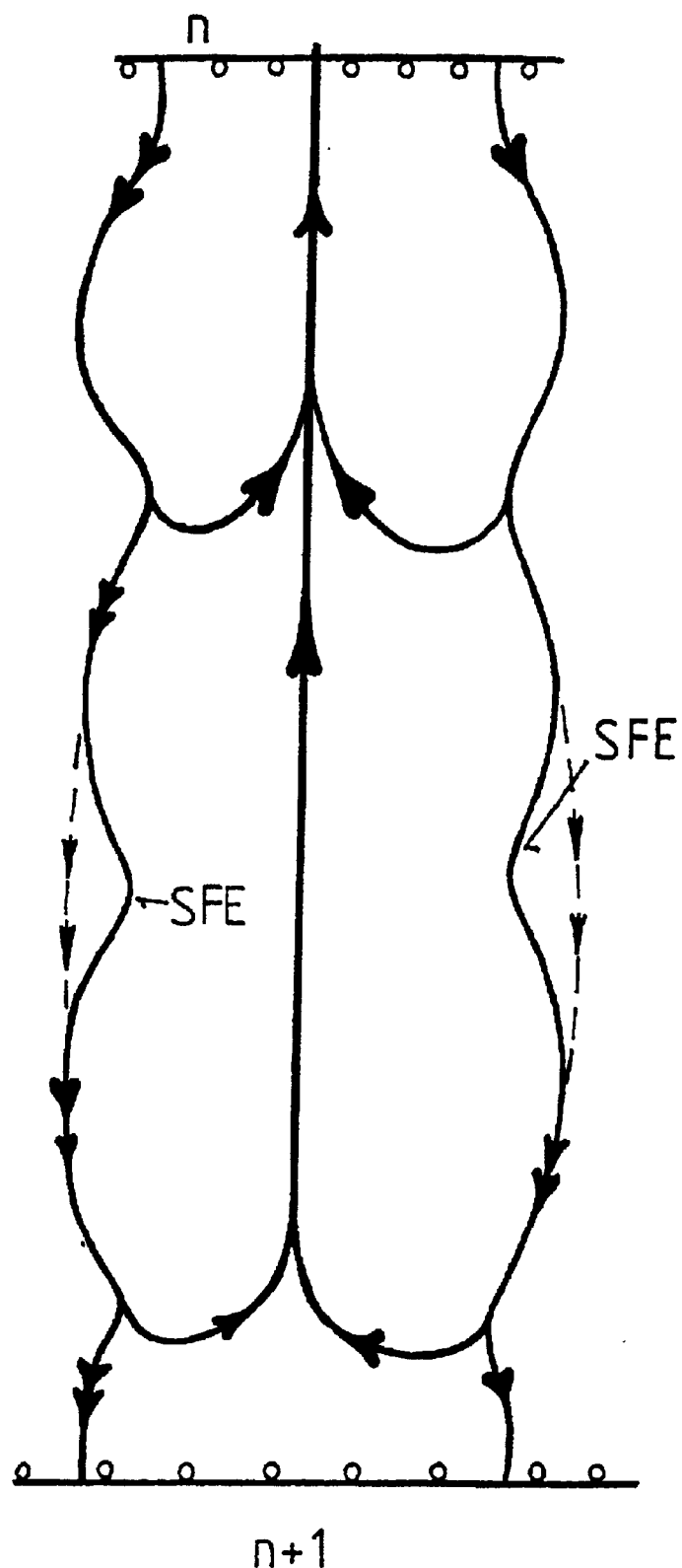
FIG. 96 Selective branching-off from the transdiaphragm vapor flow and bifurcation backflow duct for 2 transdiaphragm (central) ducts.

For increasing the Diaphragm* force of a transdiaphragm (for example, where appropriate, central between the bifurcations) flow duct $F_{D,0}$ and for the relative increase and decrease of the ratio $F_{D,0}/F_{F,0}$, the number $\Sigma n_{K,S}$ (subscript K: control variable for bends, S: flow duct) of bends, with and optionally without bifurcations, amounted successively in series along the transdiaphragm (central) duct. FIG. 94 shows a diagram of a symmetrical porous diaphragm with high bifurcation density as a result of mounting in series per transdiaphragm flow duct (cf. FIG. 77b and 77e, FIG. 95 is as for FIG. 94, here with a high bifurcation backflow duct density and consequently relatively high $F_{F,0}$-values and FIG. 96 shows selective branching-off from the transdiaphragm vapor flow and bifurcation backflow duct for 2 transdiaphragm (central) ducts, i.e. the bends are used selectively for the increase of transdiaphragm vortices (cf. slit for $F_{F,0}$ increase) and/or bifurcations. FIGS. 94–96 show diagrammatically some design solutions for the increase of $F_{D,0}$ and $F_{F,0}$ and for the relative variation of the corresponding ratio $F_{D,0}/F_{F,0}$. A relative increase of $F_{D,0}$ by mounting bend bifurcations in series is ensured only when, for each bifurcation, the associated (internal and external) frictional force between the (associated) at least two (three . . . etc.) bends and/or between the first bifurcation and the flow inlet and/or between the last bifurcation and the flow outlet of the transdiaphragm (if appropriate, central) duct (cf. FIG. 95) is lower than the corresponding $F_{D,0}$-value, ie.

$$F_{D,0}(\Delta\Sigma n_{K,S}) > \Sigma F_{F,0}(\Delta\Sigma n_{K,S}) \tag{111}$$

Conversely, for a relative decrease of $F_{D,0}$ the following applies accordingly:

$$F_{D,0}(\Delta\Sigma n_{K,S}) < \Sigma F_{F,0}(\Delta\Sigma n_{K,S}) \tag{112}$$

Since the mass of the transdiaphragm (central) flow decreases at an increasing distance from the (central) flow inlet, the relative contribution of successive bifurcations to the buildup of $p_B$ is limited, even in the case of high heating and/or acceleration of the (trans)diaphragm flow, so that, beyond a number $n_{K_s}$(crit), (in)equation (111) is no longer true and is replaced by (in)equation (112). Any diffuser and/or nozzle solutions instead of ordinary flow duct segments broaden the repertoire of these solutions, without restricting the basic validity of inequations (111) and (112). Solutions:

16. Bends and/or flow duct forms for the abovementioned porous diaphragm Diaphragm, as according to one or more of solutions 1. to 15.1, further characterized in that the design variables for the manipulation of $n_{K,s}$(crit)>0 or $n_{K,s}$(crit)=0 are the periodic distance $\lambda_W$ between two bifurcations and its corresponding change $d\lambda_W$ and resulting (eg. periodic) changes $\delta d\lambda_W$ of the changes themselves, ie. in the overall transdiaphragm run and/or consist, further of the (local) surface quality $\lambda$ (see further below) and of the variation in the bend angles $\Delta\delta$ and, in a similar way, $\delta\Delta d$, and the diameters of the bifurcation and (trans)diaphragm flow ducts, $d_B$ and $d_D$, and the state variables for the manipulation of $n_{K,S}$(crit)>0 or $n_{K,S}$(crit)=0 are obtained from equations (54), (72) and (81), the internal friction is thus reduced progressively by means of decreasing angles $\delta_1 > \delta_2 > \delta_3$ ... of the transdiaphragm (central) flow, and, for relatively high dT/dx and dp/dx gradients, relatively large angles $\delta_i$ and a progressive increase is employed in the successive angles $\delta_1 < \delta_2 < \delta_3$ etc., the transdiaphragm interaction $\delta\Delta d$ of the angles $\delta$ embraces values of between 0° and 360°, but preferably between 0° and 90°, especially when $\Pi$- and Z-bends or bends with trigonometric periodicity (eg. sine bends) are used, whilst $\delta\lambda_W$ of successive bifurcations is in the range of $0.1 \lambda_W < d\lambda_W < 10 \lambda_W$, and/or 16.1 Bends and/or flow duct forms for the abovementioned porous diaphragm Diaphragm*, as according to one or more of solutions 1. to 16., further characterized in that the limitation, resulting from mounting the bends in series, of the ratio $F_{D,0}/F_{F,0}$ as a result of a) wall friction and b) internal friction (eg. as a result of turbulences, etc. in the central and bifurcation flow) is overcome by lining up a sufficient number $\Sigma n_{S,P}$ (subscript S: control variable for the flow duct, P: parallel) of transdiaphragm (if appropriate, central) ducts to form a matrix (cf. FIGS. 94–96), which ducts are arranged either symmetrically or asymmetrically in the z-/y-plane of the Diaphragm* and assume the arrangement, shown in FIG. 94, of the transdiaphragm flow ducts, which, as compared with FIG. 95, under otherwise constant flow conditions allows relatively high transdiaphragm flow speeds and relatively low $F_{F,0}$-values (as a result of relatively low internal friction due to flow deflection $\delta$) in the central flow duct, whilst the flow conditions in the Diaphragm* in FIG. 95 generate relatively high $F_{F,0}$-values and, likewise, the selective bifurcations, shown in FIG. 96, of bends mounted in series are used, two adjacent transdiaphragm flow ducts supplying a common (central) bifurcation backflow duct, and the total resistance $F_{F,0}$ corresponding approximately to the resistance $F_{F,0}$ of $\delta$ individual bends, whereas the $F_{D,0}$-value corresponds only to two individual bends and is therefore preferably used for large transdiaphragm changes in state at high and low speeds v, and the number of such flow ducts per diaphragm is between $2 < \Sigma n_{S,P} < 1000$.

15. Symmetry

The transdiaphragm flow duct scenarios with bifurcations, bifurcation backflow ducts, bends and bend variants are combined with points 1. to 16. of the Technical Solutions of the last chapter but one and with points 1. to 9. of the Technical Solutions of the last chapter and either contain 12.1 transdiaphragm symmetry fractions or 12.2 are completely symmetrical or 12.3 are completely random and/or asymmetric.

The states of symmetry include both all (i) macroscopic and all (ii) microscopic axes of symmetry possible transdiaphragm in the xyztranslation space of a Diaphragm*.

Figure 97:
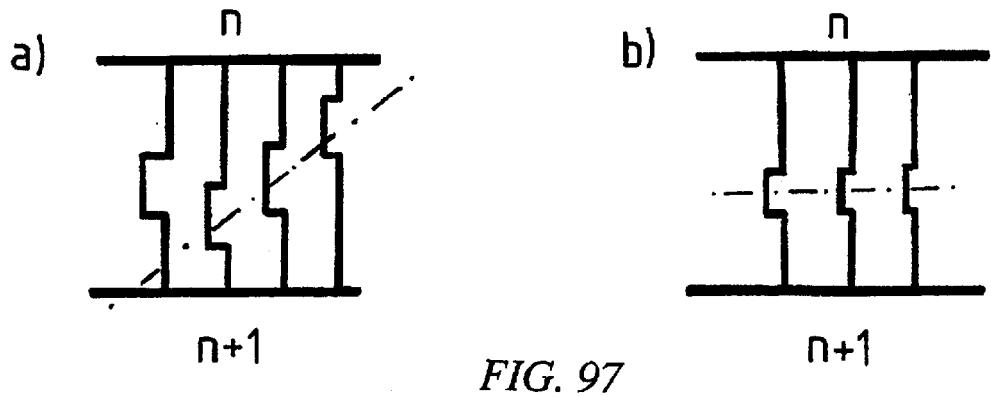
FIG. 97 Parallel-offset flow ducts: a) offset non-parallel to the diaphragm surface, b) offset parallel to the Diaphragm* surface.
Figure 98:
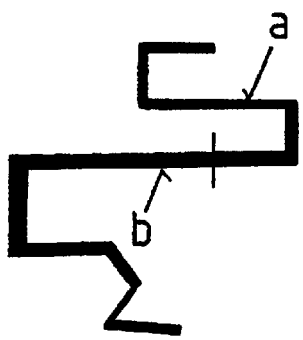
FIG. 98 Flow duct with symmetrical part a) and unsymmetrical part b).
Figure 99:
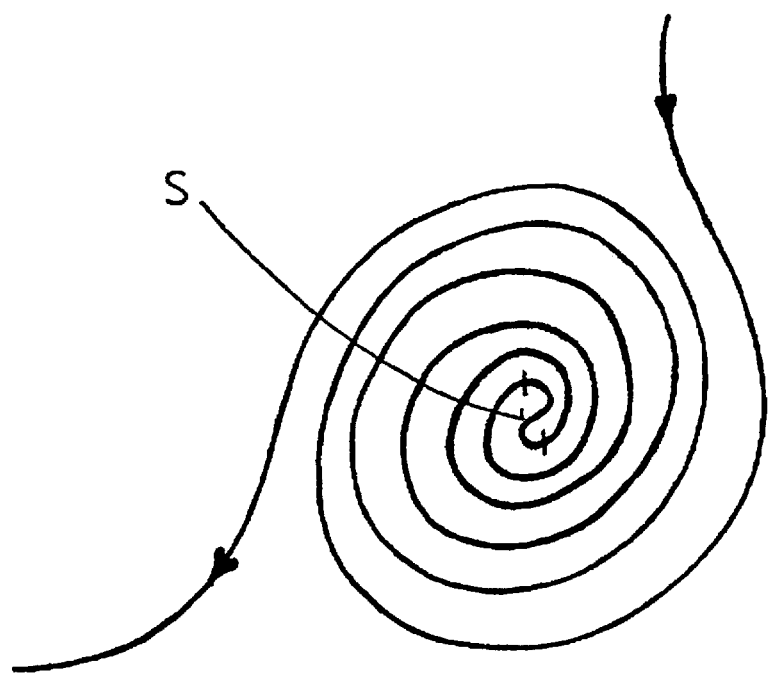
FIG. 99 Labyrinthine flow path with S-bend in the center: only the S-bend has a symmetrical part.

Solutions:

17. Bends and/or flow duct forms as for the abovementioned porous diaphragm Diaphragm*, as according to one or more of solutions 1. to 16.1, further characterized in that (to (i)), parallel-offset and nonparallel-offset individual transdiaphragm ducts (FIG. 97 showing parallel-offset flow ducts with 97a offset non-parallel to the diaphragm surface and 97b offset parallel to the diaphragm surface) or parts of individual transdiaphragm ducts are produced for macroscopic symmetry, for example by means of external diffusor/nozzle transitions and/or at least one of the claimed Diaphragm* structural parts both in the screen mode and/or, by means of internal diffusor/nozzle transitions, in the depth filter mode and/or at least one of the claimed Diaphragm* structural parts, preferably no separation of chemical components from one another during transdiaphragm material conveyance being carried out in the depth filter mode, and the critical dimensions being greater than the MFP and/or 17.1 Bends and/or flow duct forms for the abovementioned porous diaphragm Diaphragm*, as according to one or more of solutions 1. to 17., further characterized in that at least one microscopic (and/or macroscopic) diaphragm symmetry is produced by the amalgamation and/or overlapping of the claimed basic Diaphragm* structural parts (elements) to form a single transdiaphragm functional structural part (element), and/or the lining-up of $\Pi$- and/or Z-bends result in meander-like flow ducts with macroscopic symmetry fractions (FIG. 98 showing flow duct with 98a symmetrical and 98b unsymmetrical part), in this case the Laval nozzle represents the amalgamation of two bends having any, but the same bend section and therefore represents, preferably for a plant combination with bifurcations, a special case of microscopic symmetry in the abovementioned vapor deposition process, and/or 17.2 Bends and/or flow duct forms for the abovementioned porous diaphragm Diaphragm*, as according to one or more of solutions 1. to 17.1, further characterized in that the state of complete randomness and/or asymmetry of trans diaphragm flow ducts, including complete randomness in the variation of the amounts of the bend angles $\delta$ succeeding one another per flow duct and of the branching angles $\beta_D$ of the, if appropriate, associated bifurcation backflow ducts is used and/or this variation relates to all the directions of propagation of a transdiaphragm flow duct which are possible in the three-dimensional xyz-translation space of a Diaphragm* and/or use is made of transdiaphragm flow ducts with a labyrinthine flow path, in which the above and any bends are used for the change in direction of the transdiaphragm flow (FIG. 99 showing labyrinthine flow path with S-bend in the center: only the S-bend has a symmetrical part).

Conclusions

Nowhere else are the solidification distances shorter than in PVD. The sublimation operation involves the buildup of individual atoms and atom cascades with infinitely small latent heat amounts which tend toward zero. Whilst the PVD cooling rates are about 2 to 6 orders of magnitude higher than the cooling rates of those RSP methods by which technically relevant constitutional effects can be achieved for lightweight materials, such as Mg, the corresponding operative heat gradations are about 8 to 12 orders of magnitude lower with PVD than in the case of RSP. Recalescence occurring after initial subcooling does not take place virtually at all and, as early as at this juncture, allows a qualitative estimation of the permissible productivity increases of current PVD methods for solid structural parts and mass production, without thereby putting at risk the desired leaps in the properties of new high-performance materials. For along the perpendicular to the solidification front, rapid solidification from the melt is always a discontinuous process, whereas, from the vapor phase, it is a continuous growth process. Any child knows proof of the opposite in a similar case: the cooling effect of a condensed substance, such as ether or gasoline on the skin disappears only when the substance itself has disappeared.

PVD is therefore the continuation of RSP by more effective means, and many useful PM/RSP achievements of recent years can be improved by means of PVD, many possible developments with PVD can be extrapolated from experience with RSP and real technological leaps can be expected.

Moreover, the purifying distillation effect is a free addition to PVD processes, being a particularly important property of those materials on which not only stringent load-bearing requirements are placed (strength, rigidity), but in particular, high expectations in terms of their lifetime over a wide range of properties (resistance to fatigue, corrosion, creeping) are placed, as, for example, in aeronautics. It is a free addition which, furthermore, also offers improved process control of nucleation and has hitherto remained completely unused, not just in phase selection for materials of semiconductor technology. The process constitutes an industrial variant of clean-room technology and processes in one processing step.

In physical terms, PVD isolates the property-controlling processing step and limits phase transformation during aggregation change to the individual atom. Consequently, a universal leap in comparison with conventional composite materials is performed: the property-constituting connecting forces between the components are displaced from usually disturbing or unsatisfactory phase boundaries to the intra-atomic binding forces and electron properties of the translation lattice and of related arrangements of elementary particles, without taking much account of the precepts of thermal dynamic equilibrium. Characteristic orders of magnitude of structural features are displaced out of the mm range into the Angstrom range. This is on what some of the technological leaps deviating from the mixing rule are based. At the same time, the many possibilities of variation of the composite materials are not restricted or trimmed, but broadened to a greater degree. Just a basic material, such as magnesium, makes it possible, via PVD, to have $10^{36}$ completely new alloy systems and, if the alloy chemistry already applied is included, more than $10^{100}$ new alloy systems. Thus, αMg mixed crystals oversaturated with refractory atoms could surpass any form of increase in the modulus of elasticity via the mixing rule, and that would have serious consequences for general processing and final use.

Historic Superlatives

Nanocrystalline materials viable for the first time. Solid structural parts from the vapor phase viable for the first time.

Ultrapure alloys viable for the first time.

Passive magnesium viable for the first time.

Explosion in the variety of viable materials in the field of structural materials, in particular light metals, of high-performance materials, but also of functional materials (semiconductor technology: solar silicon) etc..

The present patent Application constitutes a milestone and is a step toward a completely new development. The low vapor pressure of Mg has hitherto always been considered by materials experts as a natural and therefore incontrovertible obstacle to the further development of Mg alloys. With it being accepted as such an obstacle, only secondary obstacles resulting from it are still perceived to be the actual development problems. Instead, PVD for Mg is not simply one of the possible alternatives, but is the key technology itself which makes use of these obstacles to conventional Mg processing to its own advantage. The low vapor pressure predestines Mg for processing via the vapor phase and, at the same time, unites altogether 9 development directions and individual technologies in a single processing step:

1. Higher purity in comparison with the relatively expensive melt-metallurgic (IM) "high purity" (HP) technology.
2. Total recycling and alloy production in one step, but without the risk of Re-contamination which arises in melt-metallurgic recycling.
3. Universal alloying possibilities, even without resorting to expensive alloy chemistry of conventionally produced Mg high-performance alloys.
4. Ultrahomogeneous structures without the restrictions of rapid solidification (RSP, limited structure homogeneity and alloying possibilities, hence limited R & D efficiency, depreciation problems and relatively expensive).
5. Surface protection measures as a result of the natural passivation of Mg by means of points 2.–4. not necessary and, for the first time, the possibility of overcoming the problem of galvanic contact corrosion.
6. Superior properties in comparison with and therefore the replacement of inadequate Mg—Li alloys.
7. Higher corrosion resistance, ductility, strength and modulus of elasticity in comparison with current light metal composite materials (MMC's), even without reinforcement, but without dispensing with reinforcement.
8. Avoidance of the disadvantages of powder metallurgy (PM) technology, but without ruling out its advantages.
9. Development possibilities for an improved 2nd generation of MMC's by linking to Mechanical Alloying (cf. PCT Application PCT/EP95/02882 of Jul. 19, 1995).

Literature

1a. Th. König et al., H. C. Starck GmbH & Co KG, D-38642 Goslar, German Patent DE 4214720, Nov. 11, 1993.

1b. F. Hehmann, F. W. Hugo, F. Müller and M. Raschke, German Patent Application No. P 44063334, Mar. 1, 1994, made by Leybold Durferrit GmbH, Hanau 2. D. S. Rickerby and A. Matthews, *Advanced Surface Coatings—A Handbook of Surface Engineerings,* Blackie & Son Ltd, Glasgow G64 2NZ, 1991.

3. D. C. Boyd, R. T. Haasch, D. R. Mantell, R. K. Schulze, J. F. Evans and W. L. Gladfelter, *Chem. Mater.* 1 (1989), p. 119.

4. F. W. Baker, R. L. Kozarek and G. J. Hildeman. Proc. "*Second Int. Conf. on Spray Forming*", Swansea, Sep. 13–15, 1993, edt. J. V. Wood, Woodhead Publishing Ltd, Cambridge CB1 6AH, UK, p. 395.

5. S. K. Das, D. Raybould, R. L. Bye and C. F. Chang, U.S. Pat. No. 4,718,475, January 1988.

6. F. Hehmann, EP Application 94111991.9, Aug. 1, 1994, and PCT Application PCT/EP95/02882 of Jul. 19, 1995.

7. Sh. Tanaka, Japanese Patent JP-A 02,125866, May 14, 1990.

8. R. Nimmagadda and R. F. Bunshah, *J. Vac. Sci. Technology* 8 (6), 1971, pp. VM86–VM94.
9. F. Hehmann and H. Jones, Rapid Solidification of Magnesium Alloys: *Recent Developments and Future Avenues, in 'Rapid Solidification Technology'*, eds. T. S. Sudarshan and T. S. Srivatsan, Technomic Publishing Co., Inc., Lancaster, Basle, 1993, pp. 441–487.
10. G. Neite, K. Kubota, K. Higashi and F. Hehmann, "*Mg Based Alloys*", in "*Structure and Properties of Nonferrous Alloys*", ed. K. H. Matucha, Vol. 8 of Encyclopedia "Materials Science and Technology", eds. R. W. Cahn, P. Haasen and E. J. Krämer, VCH Weinheim, P.O. Box 10 11 61, D-6940 Weinheim, RFA, to be published in 1995.
11. R. E. Maringer and C. E. Molby, J. Vac. Sci. Technol. 11, 1974, pp. 1067–1071, U.S. Pat. No. 3,522,836 (1970) and 3,605,852 (1971).
12. T. Gaspar, L. E. Hadermann, Y. Sahai, W. A. T. Clark and J. V. Wood, *Proc. Symp. J. Mat. Res. Soc.* meeting, Boston, Mass., December 1985.
13. T. A. Gaspar, U.S. Pat. No. 4,705,095, 1987.
14. L. E. Hackmann, S. Dickson, D. L. Dunlop and M. E. Handshey, U.S. Pat. No. 4,813,472, 1989.

What is claimed is:

1. A diaphragm comprising an inflow side and a backside and at least one transdiaphragm flow duct from said inflow side to said backside,
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet, wherein said flow face and said backside are designed to separate two chambers and said flow duct exit orifice or flow duct outlet comprises one or more of the following:
   a rounding of a flow duct edge in an outflow direction;
   a geometrical or streamline element for a flow-shaping, wherein said geometrical or streamline element has a low flow resistance coefficient $c_F$;
   a continuous cross section widening in the manner of a trumpet or of a Laval nozzle outlet; and/or
   a diffuser with a curved longitudinal section,
   wherein the transdiaphragm flow duct comprises:
   an inflow duct from $x_0$ to $x_2$, wherein $x_0$ is at said flow face and $x_2$ is at a bifurcation outlet, and an evacuation duct from $x_2$ to $x_3$, wherein $x_2$ is at said bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$.

2. A diaphragm comprising an inflow side and a backside and at least one transdiaphragm flow duct from said inflow side to said backside.
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet, wherein said flow face and said backside are designed to separate two chambers,
   and the transdiaphragm flow duct comprises an axis of symmetry and is designed to guide a flow at an angle $\alpha_x > 0°$ between said axis of symmetry and a perpendicular angle on said inflow side, wherein said angle is explicit inflow angle $\alpha_{x,1}$ between said perpendicular angle on said flow face and a transdiaphragm flow direction or an angle $\alpha_{x,2}$ between a perpendicular angle on said back side surface and a flow duct axis in outflow direction,
   wherein the transdiaphragm flow duct comprises:
   an inflow duct from $x_0$ to $x_2$, wherein $x_0$ is at said flow face and $x_2$ is at a bifurcation outlet, and an evacuation duct from $x_2$ to $x_3$, wherein $x_2$ is at said bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$.

3. A diaphragm comprising an inflow side and a backside and at least one transdiaphragm flow duct from said inflow side to said backside,
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiapbragm flow duct and a flow duct exit orifice or flow duct outlet, wherein said flow face and said backside are designed to separate two chambers, and the transdiaphragm flow duct comprises:
   an inflow duct from $x_0$ to $x_2$, wherein $x_0$ is at said flow face and $x_2$ is at a bifurcation outlet, and an evacuation duct from $x_2$ to $x_3$, wherein $x_2$ is at said bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$.

4. A diaphragm comprising an inflow side and a backside and at least one transdiaphragm flow duct from said inflow side to said backside,
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiapbragm flow duct and a flow duct exit orifice or flow duct outlet, wherein said flow face and said backside are designed to separate two chambers and said flow duct exit orifice or flow duct outlet comprises one or more of the following:

a rounding of a flow duct edge in an outflow direction;
a geometrical or streamline element for a flow-shaping, wherein said geometrical or streamline element has a low flow resistance coefficient $c_F$;
a continuous cross section widening in the manner of a trumpet or of a Laval nozzle outlet; and/or
a diffuser with a curved longitudinal section,
wherein the transdiaphragm flow duct comprises:
an inflow duct from $x_0$ to $x_2$, wherein $x_0$ is at said flow face and $x_2$ is at a bifurcation outlet, and an evacuation duct from $x_2$ to $x_3$, wherein $x_2$ is at said bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$,
wherein the transdiaphragm flow duct comprises one or more of the following:
a symmetrical pair of bifurcations;
a plurality of bifurcations $n_B$ per flow duct;
at least two symmetrically arranged bifurcations per transdiaphragm flow duct cross-section, wherein each of the symmetrically arranged bifurcations comprises a flow duct branch located between said inflow duct and said evacuation duct and a bifurcation backflow duct branching off from each of the symmetrically arranged bifurcations, wherein the bifurcation backflow duct leads to a bifurcation back flow outlet in said flow face;
an annular backflow duct;
a rounded bifurcation edge; and/or
a rounded bifurcation backflow duct inlet;
said bifurcation back flow outlet is selected from the group consisting of nozzle, ultrasonic nozzle and Laval nozzle.

5. A diaphragm comprising an inflow side and a backside and at least one transdiaphragm flow duct from said inflow side to said backside,
wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet, wherein said flow face and said backside are designed to separate two chambers,
and the transdiapbragm flow duct comprises an axis of symmetry and is designed to guide a flow at an angle $\alpha_x > 0°$ between said axis of symmetry and a perpendicular angle on said inflow side, wherein said angle is explicit inflow angle $\alpha_{x,1}$ between said perpendicular angle on said flow face and a transdiaphragm flow direction or an angle $\alpha_{x,2}$ between a perpendicular angle on said back side surface and a flow duct axis in outflow direction,
wherein the transdiaphragm flow duct comprises:
an inflow duct from $x_0$ to $x_2$, wherein $x_0$ is at said flow face and $x_2$ is at a bifurcation outlet, and evacuation duct from $x_2$ to $x_3$, wherein $x_2$ is bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$,
wherein the transdiaphragm flow duct comprises one or more of the following:
a symmetrical pair of bifurcations;
a plurality of bifurcations $n_B$ per flow duct;
at least two symmetrically arranged bifurcations per transdiaphragm flow duct cross-section, wherein each of the symmetrically arranged bifurcations comprises a flow duct branch located between said inflow duct and said evacuation duct and a bifurcation backflow duct branching off from each of the symmetrically arranged bifurcations, wherein the bifurcation backflow duct leads to a bifurcation back flow outlet in said flow face;
an annular backflow duct;
a rounded bifurcation edge; and/or
a rounded bifurcation backflow duct inlet;
said bifurcation back flow outlet is selected from the group consisting of nozzle, ultrasonic nozzle and Laval nozzle.

6. The diaphragm according to a claim of claims 1 to 5, wherein said flow inlet comprises one or more of the following:
a Laval nozzle inlet or a relatively low flow resistance coefficient $c_F$;
a perforated flow plate, tapering to a funnel shape into said transdiaphragm flow duct; and/or
a perforated flow plate, tapering to a funnel shape into said transdiaphragm flow duct, and comprising a U-shape or a flat shape or a Laval nozzle form,
wherein said Laval nozzle inlet, said perforated plate and said tapering to a funnel shape comprise an additional surface, wherein said additional surface is independent on said flow face and leads to said transdiaphragm flow duct.

7. A diaphragm comprising an inflow side and a backside and at least one transdiaphragm flow duct from said inflow side to said backside,
wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet, wherein said flow face and said backside are designed to separate two chambers,
and the transdiaphragm flow duct comprises:
an axis of symmetry and is designed to guide a flow at an angle $\alpha_x > 0°$ between said axis of symmetry and a perpendicular angle on said inflow side, wherein said angle is explicit inflow angle $\alpha_{x,2}$ between said perpendicular angle on said flow face and a transdiaphragm flow direction or an angle $\alpha_{x,2}$ between a perpendicular angle on said back side surface and a flow duct axis in outflow direction, and
an inflow duct from $x_0$ to $x_2$, wherein $x_0$ is at said flow face and $x_2$ is at a bifurcation outlet, and an evacuation duct from $x_2$ to $x_3$, wherein $x_2$ is at said bifurcation outlet and $x_3$ is at said flow duct exit orifice or flow duct outlet, and at least one bifurcation per transdiaphragm flow duct cross-section comprising a flow duct branch from $x_1$ to $x_2$, wherein said flow duct branch comprises a location between said inflow duct and said evacuation duct and $x_1$ is at a bifurcation inlet and $x_2$ is at said bifurcation outlet, and a bifurcation backflow duct branching off from the bifurcation, wherein the bifurcation backflow duct leads to a bifurcation backflow outlet in said flow face at $x_0$.

8. A diaphragm comprising an inflow side and a backside and at least one transdiaphragm flow duct from said inflow side to said backside,
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet, wherein said flow face and said backside are designed to separate two chambers,
   and the transdiaphragm flow duct comprises:
   A. a diffusor;
   B. at least one profiled guide blade in a flow bend;
   C. at least one rounded guide blade in a flow bend;
   D. a diffuser comprising a diffuser inlet and at least one guide blade which is located upstream of said diffuser inlet;
   E. a diffuser comprising a diffuser inlet and at least one guide blade which is located downstream of said diffuser inlet;
   F. a heat exchanger;
   G. a bent diffusor;
   H. at least two internested successively lined-up diffuser cones;
   I. a spiral flow duct bent in an xyz-translation space of said diaphragm;
   J. a flow worm or a flow meander in a flow cone of said diaphragm, wherein said flow cone is an xyz-carrier surface; and
   K. a continuous or pseudo-continuous widening having a worm-like wounded transdiaphragm flow routing and a flow duct axis with a spiral projection or with a meander projection.

9. The diaphragm according to any of claims 1–5, 7 and 8, wherein said high melting refractory metal is selected from the group consisting of a tungsten metal, a tantalum metal, a niobium metal, a zirconium metal and a titanium metal and said high melting refractory alloy is selected from the group consisting of a tungsten alloy, a tantalum alloy, a niobium alloy, a zirconium alloy, a titanium alloy and a chromium alloy and a $Cu_{1-x}Ta_x$ alloy.

10. The diaphragm according to any of claims 1–5, 7 and 8, wherein said intermetallic material is selected from the group consisting of a Cr-based and containing intermetallic alloy and refractory material, a Nb-based and -containing intermetallic alloy and refractory material, a Ta-based and -containing interinetallic alloy and refractory material, a Ti-based and -containing,intermetallic alloy and refractory material, a Zr-based and -containing intermetallic alloy and refractory material, a W-based intermetallic alloy and refractory material, a Nb-based intermetallic alloy and refractory material, a high-density $MoSi_2$, TiNi and an aluminide.

11. The diaphragm according to claim 10, wherein said aluminide is selected from the group consisting of TiAl, FeAl and Nb-Al.

12. The diaphragm according to any of claims 1–5, 7 and 8, wherein said melting refractory metal or said high melting refractory alloy or said steel or said intermetallic or said aluminide or said superalloy comprises an uncoated diaphragm material, a diaphragm core material with a ceramic layer, a diaphragm core material with an uncoated ceramic core and a diaphragm core material with a coated ceramic core.

13. The diaphragm according to any of claims 1–5, 7 and 8, wherein said oxide is selected from the group consisting of MgO, ZrO, $CrO_2$, BeO, $Al_2O_3$, SiO, $TiO_2$ and yttria.

14. The diaphragm according to any of claims 1–5, 7 and 8, wherein said carbide is selected from the group consisting of $W_xC_y$, WC, $W_2C$, $Ta_xC_y$, $Ta_2C$, TaC, SiC, VC, $B_4C$, $Cr_3C_2$, TiC, ZrC, NbC, $V_2C$, $Cr_{23}C_6$, $Cr_7C_3$, $Mo_2C$, MoC, $Mn_3C$ and $Fe_3C$.

15. The diaphragm according to any of claims 1–5, 7 and 8, wherein said nitride is selected from the group consisting of BN, TiN, AlN and $Si_3Ni_4$.

16. The diaphragm according to any of claims 1–5, 7 and 8, wherein said boride is selected from the group consisting of $CrB_2$, $TiB_2$ and $Ni_xB_y$.

17. The diaphragm according to any of claims 1–5, 7 and 8, wherein said commercial hard material is selected from the group consisting of Syalon with 90% $Si_3N_4$, sintered corundum, wherein corundum with 99.7% $Al_2O_3$, commercial tungsten carbides with 96% WC+3% Co, nitrated Fe-Al alloys, and nitrated steels.

18. The diaphragm according to any of claims 1–5, 7 and 8, wherein said nanocrystalline oxide is selected from the group consisting of $KNbO_3$, TiCN, TiC-MgO composite material, SiAlON, MgO, ZrO, CrO2, BeO, $Al_2O_3$, SiO, $TiO_2$, yttria, a carbide selected from the group consisting of $W_xC_y$, WC, $W_2C$, $Ta_xC_y$, $Ta_2C$, TaC, SiC, VC, $B_4C$, $Cr_3C_2$, TiC, ZrC, NbC, $V_2C$, $Cr_{23}C_6$, $Cr_7C_3$, $Mo_2C$, MoC, $Mn_3C$ and $Fe_3C$.

19. The diaphragm according to any of claims 1–5, 7 and 8, wherein said diaphragm comprises further a protective coating selected from the group consisting of ceramic coating, PVD-coating and CVD-coating.

20. The diaphragm according to any of claims 1–5, 7 and 8, wherein said lining or said diaphragm part comprises a layer selected from the group consisting of BN-, TiN- and a $W_xC_y$ and WC and $W_2C$ and $Ta_xC_y$ and $Ta_2C$ and TaC-layer.

21. A diaphragm comprising an inflow side and a backside and at least one transdiaphragm flow duct from said inflow side to said backside,
   wherein said inflow side comprises a flow face and an orifice cross section of an inlet orifice of the transdiaphragm flow duct and has a relatively low area ratio of said orifice cross section compared to said flow face and said backside comprises a backside surface comprising a flow outlet of the transdiaphragm flow duct and a flow duct exit orifice or flow duct outlet,
   wherein said flow face and said backside are designed to separate two chambers, and said flow duct exit orifice or flow duct outlet comprises one or more of the following:
   a rounding of a flow duct edge in an outflow direction;
   a geometrical or streamline element for a flow-shaping, wherein said geometrical or streamline element has a low flow resistance coefficient $c_F$;
   a continuous cross section widening in the manner of a trumpet or of a Laval nozzle outlet; and/or a diffuser with a curved longitudinal section; and
wherein said flow inlet comprises one or more of the following:
- a Laval nozzle inlet or a relatively low flow resistance coefficient $c_F$;
- a perforated flow plate, tapering to a funnel shape into said transdiaphragm flow duct; and/or
- a perforated flow plate, tapering to a funnel shape into said transdiaphragm flow duct, and comprising a U-shape or a flat shape or a Laval nozzle form, wherein said Laval nozzle inlet, said perforated plate and said tapering to a funnel shape comprise an additional surface, wherein said additional surface is independent on said flow face and leads to said transdiaphragm flow duct.

22. The diaphragm according to any of claims 1–5, 7, 8, 6 and 21, wherein said backside comprises further one or more of the following:
- a low flow resistance coefficient $c_F$ having a value <0.3;
- an independent heatability by an induction or resistance heating method;
- a total area $A_{PD}$ comprising an insulated or insulating part surface $A_{cold}$ and a tolerance surface $A_{hot}$, wherein said tolerance surface borders said flow outlet;
- an insulated or insulating part surface comprising one or more of the following:
  - a material having a low emissivity;
  - a gradient material; and/or
  - an independent cooling;
- the transdiaphragm flow duct comprising an outflow or outlet orifice and having an outflow cross section, wherein the transdiaphragm flow duct or said outflow cross section has a cross sectional form selected from the group consisting of cylindrical or circle, parabola, ellipse, hyperbola, continuously round, triangular, quadrangular, pentagonal, hexagonal, septagonal, octagonal, polygonal, or a combination thereof;
- a relatively large outflow cross-section of the flow duct compared to a corresponding orifice cross section of the flow duct on said inflow side;
- a relatively small outflow cross-section of the flow duct compared to a corresponding orifice cross section of the flow duct on said inflow side;
- an area ratio between the transdiaphragm flow duct and said backside surface, wherein said area ratio has a value in a range from 0.05 to 80%.

23. The diaphragm according to any of claims 1–5, 7, 8, and 21, wherein said backside comprises further one or more of the following:
- a plurality of the transdiaphragm flow duct;
- a plurality of said inlet orifice leading into one main outlet of the transdiaphragm flow duct, wherein the one main outlet is on said backside;
- said inlet orifice leading into a plurality of flow outlets of the transdiaphragm flow duct, wherein said plurality of flow outlets is on said backside;
- a plurality of flow outlets of the transdiaphragm flow duct, wherein said plurality of flow outlets is on said backside and comprises different outflow heights or different outflow angles or different outflow orifice dimensions or different outlow orifice forms;
- a symmetrically arranged plurality of the transdiaphragm flow duct;
- a closable aperture or a closable valve in said transdiaphragm flow duct;
- an independent heatability by an induction or resistance heating method; and/or
- a locally heatable part or flow duct.

24. The diaphragm according to any of claims 1–5, 7, 8, and 21, wherein said backside comprises further one or more of the following:
- a flow bend or a bent flow duct;
- a manufacturing from at least two individual pieces;
- a manufacturing comprising a casting for a an individual transdiaphragm flow duct part and an assembling of at least two individual parts of said diaphragm by using a diaphragm material;
- a manufacturing comprising a shaping by using a diaphragm material;
- a manufacturing comprising assembling of at least two individual pieces;
- a manufacturing comprising assembling selected from welding and riveting;
- an individual part assembled by using a kink, rabbet or groove or a combination of said kink, rabbet or groove;
- a diaphragm material selected from the group consisting of a superalloy, a steel, a hardened chromium steel, a stainless Cr-Ni-steel, a high melting refractory metal, a high melting refractory alloy and an intermetallic material for a casting, a shaping and an assembling; and/or
- a diaphragm material selected from the group consisting of an intermetallic material, an oxide, a nitride, a boride, a silicide, Be, graphite, a carbon-carbon composite material, a commercial hard material, a plurality of ceramic material components and a nanocrystalline oxide, wherein said diaphragm material is used as a diaphragm core material or as a diaphragm layer material, wherein said diaphragm layer material is evaporated onto a lining or a diaphragm part by a PVD method or by a CVD method, wherein said diaphragm material is used for a manufacturing selected from the group consisting of shaping and assembling of at least two individual parts of said diaphragm.

* * * * *